US006996440B2

(12) United States Patent
Maenishi et al.

(10) Patent No.: US 6,996,440 B2
(45) Date of Patent: Feb. 7, 2006

(54) METHOD FOR OPTIMIZATION OF AN ORDER OF COMPONENT MOUNTING, APPARATUS USING THE SAME, AND MOUNTER

(75) Inventors: Yasuhiro Maenishi, Koufu (JP); Ikuo Yoshida, Koufu (JP); Masamichi Morimoto, Koufu (JP); Toshiki Kindo, Yokohama (JP); Takehiko Shida, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 38 days.

(21) Appl. No.: 10/343,736

(22) PCT Filed: Aug. 2, 2001

(86) PCT No.: PCT/JP01/06679

§ 371 (c)(1), (2), (4) Date: Sep. 17, 2003

(87) PCT Pub. No.: WO02/13590

PCT Pub. Date: Feb. 14, 2002

(65) Prior Publication Data

US 2004/0073322 A1 Apr. 15, 2004

(30) Foreign Application Priority Data

Aug. 4, 2000 (JP) ............................ 2000-237681
Nov. 30, 2000 (JP) ............................ 2000-366311
May 17, 2001 (JP) ............................ 2001-147566

(51) Int. Cl.
*G06F 19/00* (2006.01)

(52) U.S. Cl. ............................ 700/28; 700/29; 700/96; 29/740

(58) Field of Classification Search .................. 700/29, 700/96, 213, 28; 29/743, 740, 832, 564, 29/33; 294/64.1
See application file for complete search history.

(56) References Cited

U.S. PATENT DOCUMENTS 4,610,083 A * 9/1986 Campisi et al. ............... 29/832
4,706,187 A * 11/1987 Arai et al. .................... 700/86
5,224,325 A 7/1993 Takahashi et al.
5,313,401 A * 5/1994 Kasai et al. ................ 700/160
5,402,564 A 4/1995 Tsukasaki et al.

(Continued)

FOREIGN PATENT DOCUMENTS

EP 0 312 116 4/1989

(Continued)

*Primary Examiner*—Leo Picard
*Assistant Examiner*—Michael D. Masinick
(74) *Attorney, Agent, or Firm*—Wenderoth, Lind & Ponack, L.L.P.

(57) ABSTRACT

The following processing is performed when a line gang pickup head can simultaneously pick up a maximum of n (here, 4) components. First, groupings of components of the same type, out of all of the components to be optimized, are set as component tapes and the component tapes are arranged descending order of the number of components to produce a component histogram (406*a*). Next, a partial histogram (400), which is part of the component histogram (406*a*), is taken from the component histogram (406*a*), and is arranged at two-dimensional coordinates where a horizontal axis (the Z-axis) represents an arrangement of component cassettes and a vertical axis represents a number of pickup operations by the line gang pickup head. After this, the component tapes are lined up, by arranging the partial histograms (401*a* and 401*b*), so as to produce a diagram (406*b*) whose width (number of components) in the horizontal axis is n (=4).

15 Claims, 157 Drawing Sheets

U.S. PATENT DOCUMENTS

| | | | | |
|---|---|---|---|---|
| 5,862,586 | A | 1/1999 | Kimura | |
| 6,000,123 | A * | 12/1999 | Munezane et al. | 29/740 |
| 6,006,425 | A | 12/1999 | Fukukura et al. | |
| 6,009,352 | A | 12/1999 | Suzuki et al. | |
| 6,729,018 | B1 * | 5/2004 | Takano et al. | 29/743 |

FOREIGN PATENT DOCUMENTS

| | | |
|---|---|---|
| EP | 0727924 | 8/1996 |
| EP | 1 081 998 | 3/2001 |
| JP | 64-005100 | 1/1989 |
| JP | 64-047100 | 2/1989 |
| JP | 01 089500 | 4/1989 |
| JP | 04-111728 | 4/1992 |
| JP | 04 348830 | 12/1992 |
| JP | 05-003398 | 1/1993 |
| JP | 05 104364 | 4/1993 |
| JP | 05-129795 | 5/1993 |
| JP | 05-181517 | 7/1993 |
| JP | 05-298283 | 11/1993 |
| JP | 06-326493 | 11/1994 |
| JP | 07-022774 | 1/1995 |
| JP | 07-297593 | 11/1995 |
| JP | 08-222898 | 8/1996 |
| JP | 08-236991 | 9/1996 |
| JP | 09-008492 | 1/1997 |
| JP | 09-051198 | 2/1997 |
| JP | 09-181489 | 7/1997 |
| JP | 09-292905 | 11/1997 |
| JP | 09-312494 | 12/1997 |
| JP | 10-041700 | 2/1998 |
| JP | 10-079596 | 3/1998 |
| JP | 10-163678 | 6/1998 |
| JP | 10-209681 | 8/1998 |
| JP | 10-209697 | 8/1998 |
| JP | 10-268922 | 10/1998 |
| JP | 10 284882 | 10/1998 |
| JP | 10-284882 | 10/1998 |
| JP | 10-326996 | 12/1998 |
| JP | 10-326999 | 12/1998 |
| JP | 10-335892 | 12/1998 |
| JP | 11-040990 | 2/1999 |
| JP | 11-163596 | 6/1999 |
| JP | 11-175581 | 7/1999 |
| JP | 11-177281 | 7/1999 |
| JP | 11-330790 | 11/1999 |
| JP | 2000 124672 | 4/2000 |
| JP | 2000-124676 | 4/2000 |
| JP | 2000-183587 | 6/2000 |
| JP | 2000-261190 | 9/2000 |
| JP | 2000-312094 | 11/2000 |
| WO | 97 48263 | 12/1997 |

* cited by examiner

| | | A | | | | | B | | | | | C | | | | | D | | | | | | |
|---|---|---|---|---|---|---|---|---|---|---|---|---|---|---|---|---|---|---|---|---|---|---|---|
| | | Z1 | | | Z48 | | Z49 | | | Z96 | | Z97 | | | Z144 | | Z145 | | | Z192 | | | |
| COMPONENT CASSETTES | TAPE WIDTH | Z1 | Z3 | Z45 | Z47 | NO OF TAPES | Z49 | Z51 | Z93 | Z95 | NO. OF TAPES | Z97 | Z99 | Z141 | Z143 | NO. OF TAPES | Z145 | Z147 | Z189 | Z191 | NO. OF TAPES | NO. OF Z POSITIONS | OCCUPIED CONSECUTIVE POSITIONS |
| | 8(DOUBLE) | ○ | ○ | ○ | ○ | 48 | ○ | ○ | ○ | ○ | 48 | ○ | ○ | ○ | ○ | 48 | ○ | ○ | ○ | ○ | 48 | 192 | 1 |
| | 8(SINGLE) | ○ | ○ | ○ | ○ | 24 | ○ | ○ | ○ | ○ | 24 | ○ | ○ | ○ | ○ | 24 | ○ | ○ | ○ | ○ | 24 | 96 | 1 |
| | 12 | ○ | ○ | ○ | ○ | 24 | ○ | ○ | ○ | ○ | 24 | ○ | ○ | ○ | ○ | 24 | ○ | ○ | ○ | ○ | 24 | 96 | 1 |
| | 16 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| | 24 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| | 32 | ○ | ○ | ○ | ○ | 12 | ○ | ○ | ○ | ○ | 12 | ○ | ○ | ○ | ○ | 12 | ○ | ○ | ○ | ○ | 12 | 48 | 2 |
| | 44 | – | ○ | ○ | – | 8 | – | ○ | ○ | – | 8 | – | ○ | ○ | – | 8 | – | ○ | ○ | – | 8 | 32 | 3 |
| | 56 | – | ○ | ○ | – | 6 | – | ○ | ○ | – | 6 | – | ○ | ○ | – | 6 | – | ○ | ○ | – | 6 | 24 | 4 |
| | 72 | – | ○ | ○ | – | 6 | – | ○ | ○ | – | 6 | – | ○ | ○ | – | 6 | – | ○ | ○ | – | 6 | 24 | 4 |

| 10 NOZZLE HEADS | INNER SIDE | Z1 Z2 | Z3 Z4 | Z5 Z6 | Z7 Z8 | Z9 Z10 | Z11 Z12 | Z13 Z14 | Z15 Z16 | Z17 Z18 | Z19 ~ Z86 | Z87 Z88 | Z89 Z90 | Z91 Z92 | Z93 Z94 | Z95 Z96 |
|---|---|---|---|---|---|---|---|---|---|---|---|---|---|---|---|---|
| | OUTER SIDE | Z97 Z98 | Z99 Z100 | Z101 Z102 | Z103 Z104 | Z105 Z106 | Z107 Z108 | Z109 Z110 | Z111 Z112 | Z113 Z114 | Z115 ~ Z182 | Z183 Z184 | Z185 Z186 | Z187 Z188 | Z189 Z190 | Z191 Z192 |
| HEADS (NOZZLES) | H1 | ○ | ○ | ○ | ○ | ○ | ○ | ○ | ○ | ○ | ○ | — | — | — | — | — |
| | H2 | — | ○ | ○ | ○ | ○ | ○ | ○ | ○ | ○ | ○ | ○ | — | — | — | — |
| | H3 | — | — | ○ | ○ | ○ | ○ | ○ | ○ | ○ | ○ | ○ | ○ | — | — | — |
| | H4 | — | — | — | ○ | ○ | ○ | ○ | ○ | ○ | ○ | ○ | ○ | ○ | — | — |
| | H5 | — | — | — | — | ○ | ○ | ○ | ○ | ○ | ○ | ○ | ○ | ○ | ○ | — |
| | H6 | — | — | — | — | — | ○ | ○ | ○ | ○ | ○ | ○ | ○ | ○ | ○ | ○ |
| | H7 | — | — | — | — | — | — | ○ | ○ | ○ | ○ | ○ | ○ | ○ | ○ | ○ |
| | H8 | — | — | — | — | — | — | — | ○ | ○ | ○ | ○ | ○ | ○ | ○ | ○ |
| | H9 | — | — | — | — | — | — | — | — | ○ | ○ | ○ | ○ | ○ | ○ | ○ |
| | H10 | — | — | — | — | — | — | — | — | — | ○ | ○ | ○ | ○ | ○ | ○ |

○ : PICKING UP POSSIBLE
— : PICKING UP IMPOSSIBLE

MOUNTING POINTS pi=(COMPONENT TYPE Ci, X COORDINATE Xi, Y COORDINATE Yi, CONTROL DATA Φi)

NC DATA IS A LIST OF MOUNTING POINTS pi $$\text{NC DATA} = \begin{pmatrix} p1 \\ p2 \\ p3 \\ \cdot \\ \cdot \\ \cdot \\ pN \end{pmatrix} = \begin{pmatrix} c1, x1, y1, \phi 1 \\ c2, x2, y2, \phi 2 \\ c3, x3, y3, \phi 3 \\ \cdot \\ \cdot \\ \cdot \\ cN, xN, yN, \phi N \end{pmatrix}$$

FIG. 11
307b
| COMPONENT NAME | APPEARANCE | COMPONENT SIZE(mm) X | Y | L | 2-D RECOGNITION METHOD | NOZZLE | TACT TIME (s) | SPEED XY |
|---|---|---|---|---|---|---|---|---|
| 0603CR |  | 0.6 | 0.3 | 0.25 | REFLECTION | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR |  | 2.8 | 2.8 | 1.1 | | | 0.11 | |
| 6TR | 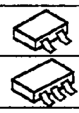 | 4.3 | 4.5 | 1.5 | | CYLINDRICAL TIP | | |
| 1TIP |  | 2.0 | φ1.0 | – | | | | |
| 2TIP | | 3.6 | φ1.4 | – | | | | |
| 1CAP |  | 3.8 | 1.9 | 1.6 | | S | | |
| 2CAP | | 4.7 | 2.6 | 2.1 | | | | |
| 3CAP | | 6.0 | 3.2 | 2.5 | | M | 0.13 | 2 |
| 4CAP | | 7.3 | 4.3 | 2.8 | | | | |
| SCAP |  | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL |  | 4.5 | 3.8 | 1.6-2.4 | | M | | |
| 2VOL | 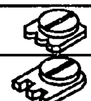 | 3.7 | 3.0 | 1.6 | | | | |
| 3VOL |  | 4.8 | 4.0 | 3.0 | | | | |

| UNIT ID | HEAD INFORMATION | NOZZLE INFORMATION | CASSETTE INFORMATION | TRAY INFORMATION |
|---|---|---|---|---|
| 110 | 10 NOZZLE HEADS | SX,SA,··· | 96 | 8 LEVELS |
| 120 | 10 NOZZLE HEADS | NONE | 96 | NONE |
| 210 | 4 NOZZLE HEADS | S,M,··· | 48 | NONE |
| | | | | |

FIG. 15A

| COMPONENT GROUP | COMPONENT THICKNESS(Tmm) | NOZZLE | SUPPLY METHOD |
|---|---|---|---|
| G [1] | 0<T≦0.25 | SX | CASSETTE |
| G [2] | 0.25<T≦0.3 | SX | CASSETTE |
| G [3] | 0.3<T≦0.35 | SA | CASSETTE |
| G [4] | 0.35<T≦0.4 | SA | CASSETTE |
| G [5] | 0.5<T≦4 | S | CASSETTE |
| G [6] | 0<T≦4 | – | – |
| G [7] | 0<T≦4 | – | – |
| G [8] | 4<T≦25 | – | – |
| G [9] | 4<T≦25 | – | – |

FIG. 15B

| COMPONENT TYPE | k1 | k2 | k3 | | kM |
|---|---|---|---|---|---|
| NO. OF COMPONENTS | h1 | h2 | h3 | | hM |

| TASK GROUP NUMBER i | NUMBER OF COMPONENT TYPES M(i) | Gorder[i] | block[i] | Corder[i][j] | | | | | |
|---|---|---|---|---|---|---|---|---|---|
| | | | | j=1 | 2 | 3 | 4 | 5 | 6 |
| 1 | 3 | 4 | RIGHT | 1 | 3 | 2 | | | |
| 2 | 6 | 1 | RIGHT | 5 | 3 | 2 | 6 | 1 | 4 |
| 3 | 4 | 3 | LEFT | 2 | 1 | 4 | 3 | | |
| 4 | 3 | 2 | LEFT | 3 | 2 | 1 | | | |

TASK GROUP 2 WITH THE Corder[i]=1 ARRANGED

461

| ... | 31 | 33 | 35 | 37 | 39 | 41 | 43 | 45 | 47 | Z NUMBER | 49 | 51 | 53 | 55 | 57 | 59 | 61 | 63 | 65 | 67 | ... |
|---|---|---|---|---|---|---|---|---|---|---|---|---|---|---|---|---|---|---|---|---|---|
| | | | | | | | | | | COMPONENT TYPE NUMBER j | 5 | 3 | 2 | 6 | 1 | 4 | | | | | |
| | | | | | | | | | | TASK GROUP NUMBER i | 2 | | | | | | | | | | |

TASK GROUP 4 WITH THE Corder[i]=2 ARRANGED

462

| ... | 31 | 33 | 35 | 37 | 39 | 41 | 43 | 45 | 47 | Z NUMBER | 49 | 51 | 53 | 55 | 57 | 59 | 61 | 63 | 65 | 67 | |
|---|---|---|---|---|---|---|---|---|---|---|---|---|---|---|---|---|---|---|---|---|---|
| | | | | | | | 3 | 2 | 1 | COMPONENT TYPE NUMBER j | 5 | 3 | 2 | 6 | 1 | 4 | | | | | |
| | | | | | | | 4 | | | TASK GROUP NUMBER i | 2 | | | | | | | | | | |

TASK GROUP 3 WITH THE Corder[i]=3 ARRANGED

463

| ... | 31 | 33 | 35 | 37 | 39 | 41 | 43 | 45 | 47 | Z NUMBER | 49 | 51 | 53 | 55 | 57 | 59 | 61 | 63 | 65 | 67 | |
|---|---|---|---|---|---|---|---|---|---|---|---|---|---|---|---|---|---|---|---|---|---|
| | | | 2 | 1 | 4 | 3 | 3 | 2 | 1 | COMPONENT TYPE NUMBER j | 5 | 3 | 2 | 6 | 1 | 4 | | | | | |
| | | | 3 | | | | 4 | | | TASK GROUP NUMBER i | 2 | | | | | | | | | | |

TASK GROUP 1 WITH THE Corder[i]=4 ARRANGED

464

| ... | 31 | 33 | 35 | 37 | 39 | 41 | 43 | 45 | 47 | Z NUMBER | 49 | 51 | 53 | 55 | 57 | 59 | 61 | 63 | 65 | 67 | |
|---|---|---|---|---|---|---|---|---|---|---|---|---|---|---|---|---|---|---|---|---|---|
| | | | 2 | 1 | 4 | 3 | 3 | 2 | 1 | COMPONENT TYPE NUMBER j | 5 | 3 | 2 | 6 | 1 | 4 | 1 | 3 | 2 | | |
| | | | 3 | | | | 4 | | | TASK GROUP NUMBER i | 2 | | | | | | 1 | | | | |

- THICK BROKEN LINES SHOW THE BOUNDARY LINES OF THE LL-RESTRICTION
- THICK DOTTED LINES SHOW THE BOUNDARY LINES OF THE XL-RESTRICTION 526
526
526
525e
525f
525g

INITIAL STATE PRODUCED BY THE GREEDY METHOD

STATE AFTER INTERSECTION DISENTANGLEMENT

INITIAL STATE PRODUCED BY THE GREEDY METHOD

OPTIMAL SOLUTION AFTER INTERSECTION DISENTANGLEMENT (EXAMPLE)

| NOZZLE NUMBER | NUMBEROF COMPONENTS |
|---|---|
| 1 | 1 |
| 2 | 5 |
| 3 | 11 |
| 4 | 21 |
| 5 | 29 |

| NOZZLE SHAPE CODE | NOZZLE TYPE | PRESENT NO. | MAX NO. |
|---|---|---|---|
| SX | 1 | 0 | 20 |
| SA | 2 | 0 | 20 |
| S | 3 | 10 | 20 |
| M | 4 | 5 | 20 |
| ML | 5 | 1 | 20 |
| L | 6 | 1 | 20 |
| SL | 7 | 0 | 0 |
| MELF | 8 | 0 | 10 |
| TRANS-M | 9 | 0 | 0 |
| CN-S | 10 | 0 | 2 |
| CN-M | 11 | 0 | 3 |
| CN-SM | 12 | 0 | 0 |
| CN-R1 | 13 | 0 | 0 |
| CN-R2 | 14 | 0 | 0 |
| CN-R3 | 15 | 0 | 0 |

FIG. 123
NO. OF TASKS
→COMPONENT TAPE NUMBERS
← NO. OF NOZZLE STROKES
608

FIG. 128

| | | | |
|---|---|---|---|
| TOTAL NUMBER OF COMPONENT TAPES BELONGING TO THE PRESENT COMPONENT GROUPS<br><br>N | FIXED | Na | NUMBER OF COMPONENT TAPES BELONGING TO GROUP A: NUMBER OF COMPONENT TAPES PAIRED OFF WITH COMPONENT TAPES FROM THE SAME COMPONENT GROUPS |
| | | Nb | NUMBER OF COMPONENT TAPES BELONGING TO GROUP B: NUMBER OF COMPONENT TAPES THAT ARE PAIRED OFF WITH COMPONENT TAPES FROM DIFFERENT COMPONENT GROUPS THAT HAVE LOWER COMPONENT GROUP NUMBERS |
| | | Nc | NUMBER OF COMPONENT TAPES BELONGING TO GROUP C: NUMBER OF COMPONENT TAPES THAT ARE PAIRED OFF WITH COMPONENT TAPES FROM DIFFERENT COMPONENT GROUPS THAT HAVE HIGHER COMPONENT GROUP NUMBERS |
| | | Nd | NUMBER OF COMPONENT TAPES BELONGING TO GROUP D: NUMBER OF COMPONENT TAPES THAT CANNOT BE PAIRED OFF WITH ANOTHER COMPONENT TAPE |
| | NON-FIXED | N−Na−Nb−Nc−Nd | NUMBER OF COMPONENT TAPES THAT CAN BE FREELY ARRANGED |

FIG. 129A
FIG. 129B
| CLASSIFICATION | GROUP | COMPONENT TAPE |
|---|---|---|
| FIXED | A | a, c, k, w |
| | B | h, m |
| | C | v |
| | D | f, o, s |
| NON-FIXED | — | b, d, e, g, i, j, l, n, p, q, r, s, t, u, x, y, z |
FIG. 129C
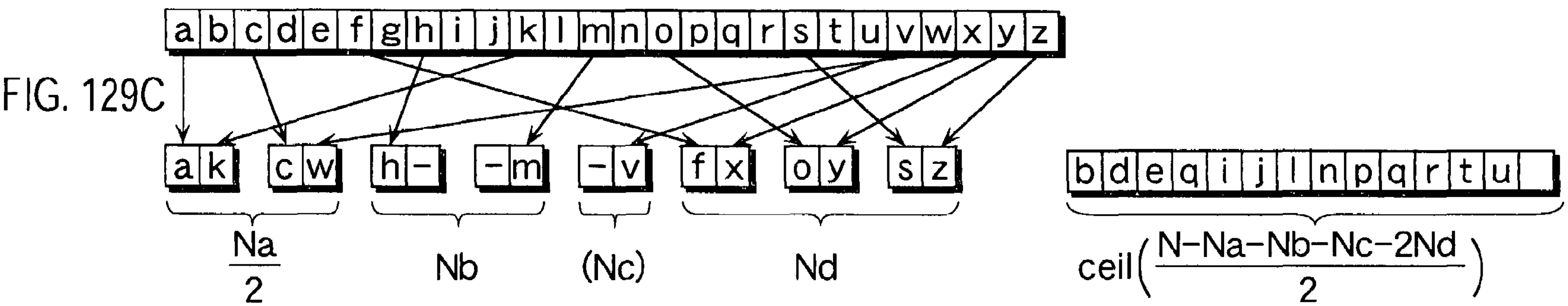
FIG. 129D
$$\frac{4}{2} + 2 + 3 + \mathrm{ceil}\left(\frac{26-4-2-1-6}{2}\right)$$
$$=14$$

FIG. 141A

| NC DATA | COMPONENT TAPES | | | | | NO. OF SUBSTRATES |
|---|---|---|---|---|---|---|
| | A | B | C | D | E | |
| NC DATA 1 | 14(2) | 4(4) | 15(1) | 3(5) | 5(3) | 15 |
| NC DATA 2 | 6(2) | 4(3) | 10(1) | 0(4) | 0(4) | 30 |
| NC DATA 3 | 15(1) | 6(3) | 7(2) | 4(4) | 1(5) | 5 |
| AVERAGE RANKING | 1.7 | 3.4 | 1.3 | 4.3 | 4.0 | |
| TOTAL NO. OF COMPONENTS | 35 | 14 | 32 | 7 | 6 | |

( ) : RANKING

FIG. 141B

| | INITIAL Z ARRANGEMENT |
|---|---|
| RANKING | C A B E D |
| TOTAL NO. OF COMPONENTS | A C B D E |
| NO. OF SUBSTRATES | C A B D E |

NOZZLE PATTERNS

NOZZLE PATTERNS

NOZZLE PATTERNS

NOZZLE PATTERNS

FIG.154A

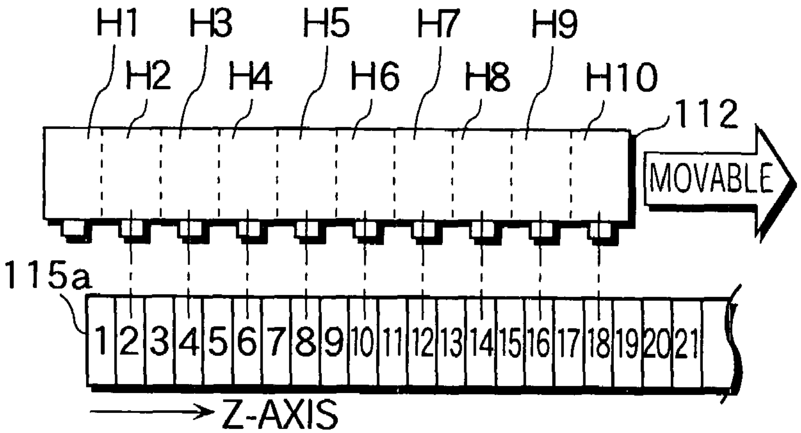

FIG.154B

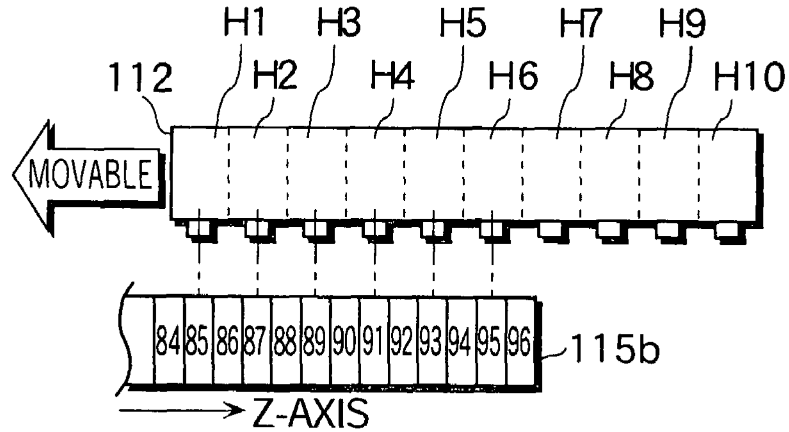

FIG.154C

| HEAD NO. | Z No. (A BLOCK) | | | | | | | | | | | | | | | | | | Z No. (B BLOCK) | | | | | | | | | | | |
|---|---|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18~48 | 49~85 | 86 | 87 | 88 | 89 | 90 | 91 | 92 | 93 | 94 | 95 | 96 |
| H1 | ○ | ○ | ○ | ○ | ○ | ○ | ○ | ○ | ○ | ○ | ○ | ○ | ○ | ○ | ○ | ○ | ○ | ○ | ○ | × | × | × | × | × | × | × | × | × | × | × |
| H2 | × | ○ | ○ | ○ | ○ | ○ | ○ | ○ | ○ | ○ | ○ | ○ | ○ | ○ | ○ | ○ | ○ | ○ | ○ | ○ | ○ | × | × | × | × | × | × | × | × | × |
| H3 | × | × | × | ○ | ○ | ○ | ○ | ○ | ○ | ○ | ○ | ○ | ○ | ○ | ○ | ○ | ○ | ○ | ○ | ○ | ○ | ○ | ○ | × | × | × | × | × | × | × |
| H4 | × | × | × | × | × | ○ | ○ | ○ | ○ | ○ | ○ | ○ | ○ | ○ | ○ | ○ | ○ | ○ | ○ | ○ | ○ | ○ | ○ | ○ | ○ | × | × | × | × | × |
| H5 | × | × | × | × | × | × | × | ○ | ○ | ○ | ○ | ○ | ○ | ○ | ○ | ○ | ○ | ○ | ○ | ○ | ○ | ○ | ○ | ○ | ○ | ○ | ○ | × | × | × |
| H6 | × | × | × | × | × | × | × | × | × | ○ | ○ | ○ | ○ | ○ | ○ | ○ | ○ | ○ | ○ | ○ | ○ | ○ | ○ | ○ | ○ | ○ | ○ | ○ | ○ | × |
| H7 | × | × | × | × | × | × | × | × | × | × | × | ○ | ○ | ○ | ○ | ○ | ○ | ○ | ○ | ○ | ○ | ○ | ○ | ○ | ○ | ○ | ○ | ○ | ○ | ○ |
| H8 | × | × | × | × | × | × | × | × | × | × | × | × | × | ○ | ○ | ○ | ○ | ○ | ○ | ○ | ○ | ○ | ○ | ○ | ○ | ○ | ○ | ○ | ○ | ○ |
| H9 | × | × | × | × | × | × | × | × | × | × | × | × | × | × | × | ○ | ○ | ○ | ○ | ○ | ○ | ○ | ○ | ○ | ○ | ○ | ○ | ○ | ○ | ○ |
| H10 | × | × | × | × | × | × | × | × | × | × | × | × | × | × | × | × | × | ○ | ○ | ○ | ○ | ○ | ○ | ○ | ○ | ○ | ○ | ○ | ○ | ○ |

FIG. 156

| | HEAD NUMBERS | | | | | | | | | |
|---|---|---|---|---|---|---|---|---|---|---|
| | 1 | 2 | 3 | 4 | 5 | 6 | 7 | 8 | 9 | 10 |
| NOZZLE PATTERN 1 | ● | ● | ● | ● | ● | ● | — | — | — | — |
| NOZZLE PATTERN 2 | — | — | — | — | ● | ● | ● | ● | ● | ● |

METHOD FOR OPTIMIZATION OF AN ORDER OF COMPONENT MOUNTING, APPARATUS USING THE SAME, AND MOUNTER

TECHNICAL FIELD

The present invention relates to a method for determining the optimal order in which a mounter is to mount electronic components onto a substrate, such as a printed circuit board. In particular, the invention relates to the optimization of the order of component mounting for a mounter equipped with a head unit that picks up a plurality of components and mounts them onto a substrate.

BACKGROUND ART

The order in which a mounter mounts electronic components on a printed circuit board or other substrate is conventionally optimized to minimize the tact time, which is to say, the time taken by mounting. As part of such optimization, it is necessary to optimize beforehand the order in which the various component feeders containing the components to be mounted are arranged within the mounter.

One example of such technology is the method for optimizing an order of component mounting disclosed by Japanese Laid-Open Patent Application H05-104364. This method is made up of a number of steps. In a first step, a number of component feeders are sorted into groups based on the mounting speeds of the components, and feeders containing components that are mounted at few positions on a substrate are paired off with feeders in the same group that contain components that are mounted at many positions, thereby evening out the total number of components mounted by each pair of feeders. In the second step, the order of the feeders is determined by arranging the feeder groups in order of mounting speed and arranging the feeders in each group in the pairs determined in the first step. Finally, in the third step, an optimization process is performed with only the mounting order of components as a parameter.

The above method avoids the need to perform a complex optimization of two parameters, namely the order of feeders and the mounting order of components, and can be completed in a short time since optimization is performed for a single parameter.

However, the above conventional optimization method has a premise that the head unit picks up only one component at a time from a component feeder during mounting. The method cannot be used by a mounter equipped with an advanced head unit (sometimes called a "line gang pickup head") that picks up a number of components (such as ten components) and then mounts them on a substrate.

The recent explosion in demand for electronic appliances such as mobile phones and notebook computers has been accompanied by the development of mounters equipped with high-productivity line gang pickup heads that pick up many components and mount them on substrates. This has resulted in demands for a new optimization method for the order of component mounting for use by such advanced mounters.

SUMMARY OF THE INVENTION

In view of the stated problem, it is a first object of the present invention to provide (a) an optimizing method for an order of component mounting used by a highly productive mounter, which is to say, an order of component mounting that enables components to be mounted with increased productivity, as well as (b) an optimizing apparatus that uses this method, and (c) a mounter that mounts components according to a method that has been optimized by this method.

As a more specific example, the invention has an object of providing a method, etc., for optimizing an order of component mounting for a mounter that is equipped with a line gang pickup head which picks up a plurality of components and mounts the components on a substrate.

The stated first object can be realized by an optimizing method that optimizes, using a computer, a component mounting order in which a production line composed of at least one mounter mounts a plurality of components on a substrate, the optimizing method including: a classifying step for classifying the plurality of components into component groups by setting groupings of components whose heights are equal or within a predetermined range as the component groups; and a sorting step for determining a mounting order for each component group so that components belonging to component groups of low components are mounted on the substrate first.

As a result of using the above method, components are mounted in order starting with the groups of low components. This avoids problems that occur when high components are mounted on a substrate first, such problems including restrictions on the movement of the line gang pickup head that result in increases in mounting time, and collisions between components that have been picked up by the line gang pickup head and components that have already been mounted on the substrate. This also makes fine pitch mounting (where components are mounted at high speed at extremely close positions on a substrate) possible, and increases the quality of mounting.

The stated first object can also be realized by an optimizing method that optimizes, using a computer, a component mounting order in which a mounter equipped with a first stage and second stage mounts a plurality of components on a substrate, the first and second stage being independent and each including a mounting head that picks up a maximum of n components, n being no less than 2, from an arrangement of component cassettes that store components, and mounts the components on a substrate, the optimizing method assigning component cassettes to the first stage and second stage so as to even out a load of the stages during mounting and including: an initial assigning step for assigning, according to predetermined rules, each of the plurality of components to one of the first and second stages, and for specifying a plurality of mountains, a mountain being a plurality of related component tapes, a component tape being a group of components of a same type, for the assigned components so as to maximize the number of times the mounting heads can pick up n components, and a rearranging step for changing, by reassigning components between the first and second stages in units of component tapes or mountains, a pattern in which components have been assigned to the first and second stages in the initial assigning step so as to make load levels of the first and second stages approximately equal, the load level of a stage showing a magnitude of processing required to mount all of the components assigned to the stage.

As a result of using the above method, when components are successively mounting by a production line that is composed of two or more independent mounters, the processing loads of each stage can be balanced, thereby increasing the pipeline efficiency of the production line and reducing the overall mounting time for components.

The stated first object can also be realized by an optimizing method for optimizing, using a computer, a component mounting order in which a mounter mounts a plurality of components on a substrate, the optimizing method including: a classifying step for classifying the plurality of components into a small component group and a general component group, based on heights of components; a small component optimizing step for optimizing, using a first algorithm, a mounting order for components belonging to the small component group; and a general component optimizing step for optimizing, using a second algorithm that differs from the first algorithm, a mounting order for components belonging to the general component group.

The above method takes advantage of the characteristics of the components mounted onto a majority of circuit boards, such as those found in mobile phones. For such circuit boards, a great many (such as 90%) of the components are small components called "chip components", such as resistors, with the few (such as 10%) remaining components being larger, irregularly shaped components, such as connectors, that are called general components. As a result, the above method can achieve a high optimization level relative to the time required for optimization.

As a specific example, an algorithm that performs optimization at high-speed by forming pickup patterns in which ten tasks are simultaneously picked up may be used for small parts. A flexible algorithm that finds an optimal mounting order by switching between potential mounting orders with a mounting time of each task as an evaluation function may be used for general parts, however By doing so, the overall optimization level can be raised.

The stated first object can also be realized by an optimizing method that optimizes, using a computer, a component mounting order in which a mounter mounts a plurality of components on a substrate, the mounter including a mounting head that picks up a maximum of n components, n being no less than 2, from an arrangement of component cassettes for a case where component tapes are held in the component cassettes, a component tape being a group of components of a same type and the optimizing method optimizing an arrangement of the components tapes in the component cassettes, the optimizing method including: a histogram generating step for generating a component histogram in which the plurality of components to be mounted are shown in units of component tapes that have been arranged in descending order of a number of components to be mounted for each component tape; and a diagram generating step (1) for taking partial histograms, which are each a part of the generated component histogram, (2) for arranging the partial histograms at two-dimensional coordinates where an arrangement of component cassettes is shown by a horizontal axis and a number of pickup operations by the mounting head is shown by a vertical axis, so that the partial histograms arranged in two dimensions form a diagram, the diagram being generated so that for as many rows in the diagram as possible, a number of components on the row is n or an integer multiple of n, and (3) for setting an arrangement of component tapes corresponding to the generated diagram as an optimal arrangement of component tapes.

When the above method is used, the width of a diagram formed from a component histogram showing the optimized arrangement of component tapes is close to n (the number of components that can be picked up by the line gang pickup head) or an integer multiple of n. As a result, the line gang pickup head can often pick up n components in a single nozzle stroke, so that mounting can be completed for all of the components with a low number of nozzle strokes.

The stated first object can also be realized by an optimizing method that optimizes, using a computer, a component mounting order in which a mounter mounts a plurality of components on a substrate, the mounter including a mounting head that picks up a maximum of n components, n being no less than 2, from an arrangement of component cassettes for a case where component tapes are held in the component cassettes, a component tape being a group of components of a same type and the optimizing method optimizing an arrangement of the components tapes in the component cassettes, the optimizing method including: a histogram generating step for generating a component histogram in which the plurality of components to be mounted are shown in units of component tapes that have been arranged in descending order of a number of components to be mounted for each component tape; a cutting down step for repeatedly removing pickup patterns, each of which is a series of n consecutive components aligned in a horizontal direction, from the generated component histogram so that component tapes with few components to be mounted are taken first, the cutting down step ending when no more pickup patterns of n components can be taken; a core crush processing step for reshaping a remaining part of the component histogram after the cutting down step has been performed with an aim of producing a diagram which is n-components wide; and a combining step for arranging all of the components removed during the cutting down step and the components in the reshaped part of the component histogram at corresponding positions on a horizontal axis, combining the arranged components to produce an updated component histogram, and setting an arrangement of component tapes corresponding to the updated component histogram as an optimized arrangement for the component tapes.

Performing the cutting down process in this way has the following advantages over a task group method that generates tasks where n components can be simultaneously picked up (or in other words, task groups) by finding sets of n component tapes with the same number of components to be mounted and simultaneously mounting one component from each of the n component tapes.

Firstly, in the cutting down process, the component histogram is divided in units of component tapes and the resulting divisions can be assigned to the front and rear stages, so that compared to the task group method, components can be moved in smaller units, thereby reducing the frequency with which gaps appear on the Z-axis (i.e., in component supplying units) and facilitating adjustments to the balance of the front and rear stages.

Secondly, in the task group method, components are divided within task groups, and the resulting component tapes are arranged into component cassettes, while in the cutting down process, components are only divided for the core cassette tapes, resulting in a lower number of divisions being produced. This suppresses the number of component cassettes required to hold component tapes that are generated by the division of components.

The stated first object can also be realized by an optimizing method that optimizes, using a computer, a component mounting order for a mounter, the mounter being equipped with a mounting head that picks up components from an arrangement of component cassettes that store components and mounts the components on a substrate, the optimizing method including: an initializing step for generating an initial state that is a first state to be used, a state being one out of all potential mounting orders for all of the components in the component mounting order; a state changing step for generating a second state by provisionally changing the first state; a judging step for judging whether both (1) the mounter can mount all of the components according to a mounting order that corresponds to the generated second state, and (2) the mounter takes less time when all of the components are mounted according to the second state than when all of the components are mounted according to the first state; and a repeated control step for optimizing the mounting order of the components by setting the second state as a new first state when a judging step judges that the mounter can mount all of the components and that less time is taken when the components are mounted according to the second state, and then having the state changing step and the judging step repeatedly performed so that the first state is updated.

As a result, a global minimum in a distribution of tact times plotted against states can definitely be found as the optimal solution.

Here, in the state changing step, all of the possible states may be classified into a plurality of groups, and the second state may be generated so that a probability of containing the state generated as the second state is equal for each of the plurality of groups.

In the above method, an optimal solution is found by incorporating both a local search and a global search. This avoids the undesired result of the method finding a solution that is locally optimal but not globally optimal.

The stated first object can also be realized by an optimizing method that optimizes, using a computer, a component mounting order for a mounter equipped with a mounting head that picks up a maximum of n components, n being no less than 2, from an arrangement of component cassettes that hold the components and mounts the components on a substrate, the optimizing method determining an arrangement of tasks where a task is a set of components that are mounted in one iteration of a repeated series of operations in which the mounting head picks up, transports, and mounts components, wherein the mounting head can be equipped with a maximum of n interchangeable nozzles for picking up components, the components to be mounted include at least two types of components that are picked up using different types of nozzle, and the optimizing method includes: a histogram generating step for generating, for a case where groups of components of the same type are treated as single component tapes and for each nozzle type required by the components to be mounted, a two-dimensional histogram in which a horizontal axis represents an arrangement of component tapes and a vertical axis represents a number of components to be mounted, the component tapes in each histogram for each nozzle type being arranged in descending order of the number of components to be mounted, and for arranging the generated histograms on a horizontal axis; and a task generating step for repeatedly scanning the generated histograms on the horizontal axis, removing components to generate tasks, and arranging the generated tasks in order, until all of the components in the arranged histograms have been removed.

Even when performing optimization for general components that need to be picked up using different types of nozzles, the initial state for the search of an optimal mounting order is not a randomly selected mounting order, but a mounting order that increases (using "appropriation") the numbers of components picked up in single nozzle strokes by the line gang pickup head, in the same way as with small components.

The stated first object can also be realized by an optimizing method that optimizes, using a computer, a component mounting order for a mounter equipped with a mounting head that picks up components from an arrangement of component cassettes that hold the components and mounts the components on a substrate, for a case where groups of components of the same type are treated as component tapes and the optimizing method optimizes an arrangement of component tapes that are held in the component cassettes while respecting restrictions that require certain component tapes to be arranged at certain positions, the optimizing method including: a provisional optimizing step for optimizing, in units of component tapes, an arrangement of all the components to be mounted without considering the restrictions; and a changing step for changing the arrangement of component tapes produced by the provisional optimizing step so that the arrangement respects the restrictions.

With the above method, at a first stage, components are optimized on the assumption that are not subject to a fixed arrangement, so that a same optimization algorithm is used regardless of whether or not a fixed arrangement is present for components. This means that a single algorithm can be used regardless whatever fixed arrangement is present.

In this algorithm that handles a fixed arrangement, an ideal arrangement of component tapes for the case where optimization is performed in the absence of a fixed arrangement is broken down to deal with restrictions due to the presence of the fixed arrangement. This makes it possible for a user to compare the mounting time for the ideal arrangement of component tapes with the mounting time for the arrangement where this is a fixed arrangement of component tapes.

As a result, users can be provided with information that allows them to compare the advantage of the ease of equipment maintenance when a fixed arrangement is used with the advantage of a shorter mounting time when mounting time is not used, and so to reconsider the tradeoff involved when a fixed arrangement is used.

The stated first object can also be realized by an optimizing method that optimizes, using a computer, a component mounting order for a mounter equipped with a mounting head that picks up components from an arrangement of component cassettes that hold the components and mounts the components on a substrate, the optimizing method including: a task group generating step for generating task groups that are arrangements of tasks, a task being a set of components that are mounted in one iteration of a repeated series of operations in which the mounting head picks up, transports, and mounts components; and a task interchanging step for changing an order of tasks within each task group so as to minimize a time required to mount all components each task group, and setting a mounting order of components corresponding to a resulting order of tasks as an optimal component mounting order.

The above method reduces the distance moved by the line gang pickup head when returning from a mounting of components in one task to pick up components in a next task. This reduces the total mounting time for all the task groups.

The stated first object can also be realized by an optimizing method that optimizes, using a computer, a component mounting order for a mounter equipped with a mounting head that picks up a maximum of n components, n being no less than 2, from an arrangement of component cassettes that hold the components and mounts the components on a substrate, the optimizing method including: a task group generating step for generating task groups that are arrangements of tasks, a task being a set of components that are mounted in one iteration of a repeated series of operations in which the mounting head picks up, transports, and mounts components; and a task interchanging step for changing, within each task group, a mounting order of components so as to minimize a time required to mount all components composing the task group, without changing a combination of component types in each task.

Here, the task interchanging step may include: a detecting step for detecting, for a case where for each task, straight lines are drawn between mounting points on the substrate of adjacent components that are picked up, whether there is an intersection between straight lines that belong to two different tasks that are composed of combinations of the same component types; and an interchanging step for interchanging, when the detecting step has detected an intersection, components of the same component type between the two tasks to eliminate the detected intersection.

As a result, inefficient mounting paths that are used to mount components in tasks can be eliminated, so that the overall distance moved during the mounting of components can be reduced. This in turn reduces the overall mounting time of each task group.

The stated first object can also be realized by an optimizing method that optimizes, using a computer, a component mounting order for a mounter equipped with a mounting head that (1) picks up a maximum of n components, n being no less than 2, from an arrangement of component cassettes including double cassettes that are capable of holding two types of components, and (2) mounts the components on a substrate, the optimizing method respecting a restriction that requires the two types of components held in a double cassette to be tape-held components with a same feed pitch, and optimizing an arrangement of component tapes for a case where components are arranged in component cassettes in units of component tapes, a component tape being a group of components of a same type, the optimizing method including: a first optimizing step for determining, for all components that use a first feed pitch, an order of component tapes that maximizes a number of times the mounting head can pick up n components; a first folding step for cutting the determined order of components at a central position into a former half and latter half and combining the former half and latter half with component tapes belonging to the former and latter halves in alternating positions; a second optimizing step for determining, for all components that use a second feed pitch, an order of component tapes that maximizes a number of times the mounting head can pick up n components; a second folding step for cutting the determined order of components at a central position into a former half and latter half and combining the former half and latter half with component tapes belonging to the former and latter halves in alternating positions; and a combining step for combining an arrangement of component tapes produced by the first folding step with an arrangement of component tapes produced by the second folding step and setting a result of combining as an optimal arrangement of component tapes.

With the above method, an arrangement of component tapes is determined so as to maximize a number of times that a line gang pickup head can simultaneously pick up n components, while maintaining the pairs of component tapes with the same feed pitches. This method optimizes the order of component mounting, even for a mounter that users double cassettes.

The stated first object can also be realized by an optimizing method that optimizes, using a computer, a component mounting order for a mounter equipped with a mounting head that has n nozzles, n being no less than 2, and so can pick up a maximum of n components from an arrangement of component cassettes that hold the components and mount the components on a substrate, the optimizing method optimizing an arrangement of component tapes that are held in the component cassettes in units of component tapes, a component tape being a group of components of a same type, while respecting a restriction whereby only m nozzles out the n nozzles can mount components in a specific region of the substrate, the optimizing method including: a component histogram generating step for arranging, in units of component tapes, components that are not arranged in the specific region in descending order of a number of components to be mounted to produce a first component histogram and for arranging, in units of component tapes, components that are arranged in the specific region in descending order of a number of components to be mounted to produce a second component histogram; a cutting down step for repeatedly removing pickup patterns composed of n consecutive components in a horizontal direction from each of the first and second component histograms in order so that components in component tapes with few components to be mounted are removed first, until no more pickup patterns can be removed, and arranging the pickup patterns at corresponding positions on a first coordinate axis and a second coordinate axis; a core crush processing step for arranging, at corresponding positions on the first and second coordinate axes, component tapes in the first and second component histograms after the cutting down step, with an aim of producing a diagram which is n-components wide; and a combining step for combining the component histograms arranged on the first and second coordinate axes by the core crush processing step and setting an arrangement of component tapes that corresponds to a component histogram that results from the combining as the optimal arrangement of component tapes.

As a further possibility, the stated first object can also be realized by an optimizing method that optimizes, using a computer, a component mounting order in which a mounter equipped with a first stage and second stage mounts a plurality of components on a substrate, the first and second stage being independent and each including a mounting head that picks up components from an arrangement of component cassettes that store components and mounts the components on a substrate, the optimizing method assigning component cassettes to the first stage and second stage while respecting a restriction whereby only one of the first and second stages is able to mount components in a specific region of the substrate, the optimizing method including: a first assigning step for specifying, for all the components in the mounting order to be optimized, component tapes, a component tape being a group of components of a same type, that include components that can only be mounted by the first stage, and assigning the specified component tapes to the first stage; a second assigning step for specifying, for all the components in the mounting order to be optimized, component tapes that include components that can only be mounted by the second stage, and assigning the specified component tapes to the second stage; and a dividing step for assigning component tapes, for all the components in the mounting order to be optimized, that were not assigned by either the first assigning step or the second assigning step to one of the first and second stages.

The order of component mounting can be optimized for a case when there are restrictions on the mounting operation performed by the line gang pickup head when mounting components on a substrate, such as an LL-sized substrate, is longer than normal in the transportation direction, or a case when there are restrictions on the mounting operation performed by the line gang pickup head when mounting components on a substrate, such as an XL-sized substrate, is longer than normal in a direction perpendicular to the transportation direction.

The stated first object can also be realized by an optimizing method that optimizes, using a computer, a component mounting order for a mounter equipped with a mounting head that picks up a maximum of n components, n being no less than 2, from an arrangement of component cassettes that hold the components and mounts the components on a substrate, the optimizing method optimizing an arrangement of component tapes that are held in the component cassettes in units of component tapes, a component tape being a group of components of a same type, the optimizing method including: a sorting step for arranging, in units of component tapes, the plurality of components to be mounted on a first coordinate axis in descending order of a number of components; and an interchanging step for repeatedly removing component tapes in descending order of components from an arrangement on the first coordinate axis produced in the sorting step and arranging the component tapes on a second coordinate axis that corresponds to an arrangement of component cassettes, wherein the interchanging step (1) arranges a first component tape removed from the arrangement on the first coordinate axis on the second coordinate axis, (2) arranges each of a second to an mth component tape removed from the arrangement on the first coordinate axis on the second coordinate axis at a position that alternates between a start and an end of an arrangement of preceding component tapes on the second coordinate axis, and (3) arranges each component tape from an m+1th component tape onwards on the second coordinate axis at an end of an arrangement of preceding component tapes on the second coordinate axis.

With the above method, the component tapes are interchanged to produce a component histogram in the shape of a triangle that has one side steeper than another side. This processing produces, without dividing component tapes (and increasing the total number of component tapes required), a component histogram that is close to an ideal form resulting from optimization through a core crush process. When there is a restriction in the number of component tapes that can be used or limited free space in the component supplying units, components can be arranged in a manner that enables the components to be mounted with a low number of tasks.

The stated first object can also be realized by an optimizing method that optimizes, using a computer, a component mounting order for a mounter equipped with a mounting head that picks up a maximum of n components, n being no less than 2, from an arrangement of component cassettes that hold the components and mounts the components on a substrate, the optimizing method optimizing, for a case where there are a plurality of sets of NC (Numeric Control) data corresponding to a plurality of different substrates, an arrangement of component tapes that are held in the component cassettes in units of component tapes, a component tape being a group of components of a same type, the optimizing method including: a detecting step for detecting, from all the sets of NC data, each NC data group, an NC data group being a plurality of sets of NC data that have a predetermined resemblance, including a characteristic whereby sets of NC data contain matching types of components; a combining step for combining all sets of NC data in each NC data group to produce a new set of NC data for each NC data group; and an arrangement determining step for determining an optimal arrangement of component tapes for each set of NC data after the combining step, the sets of NC data being arranged in descending order of a number of substrates to be manufactured for each set of NC data, wherein when the arrangement determining step determines an arrangement of component tapes for each set of NC data, matching component tapes that have already been arranged for a previous set of NC data-are not arranged again.

With the above method, it is possible to optimize an arrangement of component tapes that is used by two or more sets of NC data. If the component supplying units of mounters are constructed in accordance with an arrangement of component tapes determined by this method, it is no longer necessary to change the arrangement of component cassettes set in the component supplying units when switching between the types of substrate being produced by the mounters.

BRIEF DESCRIPTION OF THE DRAWINGS

FIG. 10 shows an example of the mounting point data shown in FIG. 9.

FIG. 11 shows an example of the component library shown in FIG. 9.

FIG. 12 shows an example of the mounter information shown in FIG. 9.

FIG. 15A shows the component groups that are generated by the component group generating part, while FIG. 15B shows one example of a component table generated in the component group generating process performed by the component group generating part.

FIG. 37 shows one example of the intermediate representations used by the general component optimizing part 316*b*, and how these are converted to an arrangement on the Z-axis.

FIG. 84A shows the "return" operation performed when there are a plurality of mounting points for the same component feeder, while

FIG. 107A is a table showing the types of component to be mounted (the number of the nozzle that can be used) and the number of components to be mounted for each type. FIG. 107B is a component histogram showing the operation performed.

FIG. 120 is used to illustrate the optimization level of the optimization algorithm shown in FIG. 118, and is a component histogram in which the component tapes have been arranged simply in descending order (from right to left) of the number of components to be mounted.

FIG. 121 shows nozzle stroke number patterns produced when the component histogram shown in FIG. 120 is subjected to the cut down process.

FIG. 122 shows a component histogram produced by rearranging the component histogram in accordance with the procedure shown in FIG. 118.

FIG. 123 shows the nozzle stroke number patterns produced when the component histogram shown in FIG. 122 is subjected to the cut down process.

FIG. 124 is a flowchart that shows the procedure which assigns mountains to the left block and the right block.

FIGS. 125A to 125D show the processing performed in the flowchart shown in FIG. 124.

FIGS. 126A to 126D show another example of the processing performed in the flowchart shown in FIG. 124.

FIG. 127 is a flowchart showing the procedure used by an algorithm that estimates the number of double-cassette feeders used.

FIG. 128 shows the division of the component tapes belonging to a component group.

FIGS. 129A to 129D show an example calculation of the required number of double-cassette feeders.

FIG. 130 is a flowchart showing the procedure used by an optimization algorithm that optimizes the arrangement in the Z-axis while considering the fixed pairings of double-cassette feeders.

FIGS. 131A and 131B show the processing performed in step S660 of FIG. 130.

Figure 130:
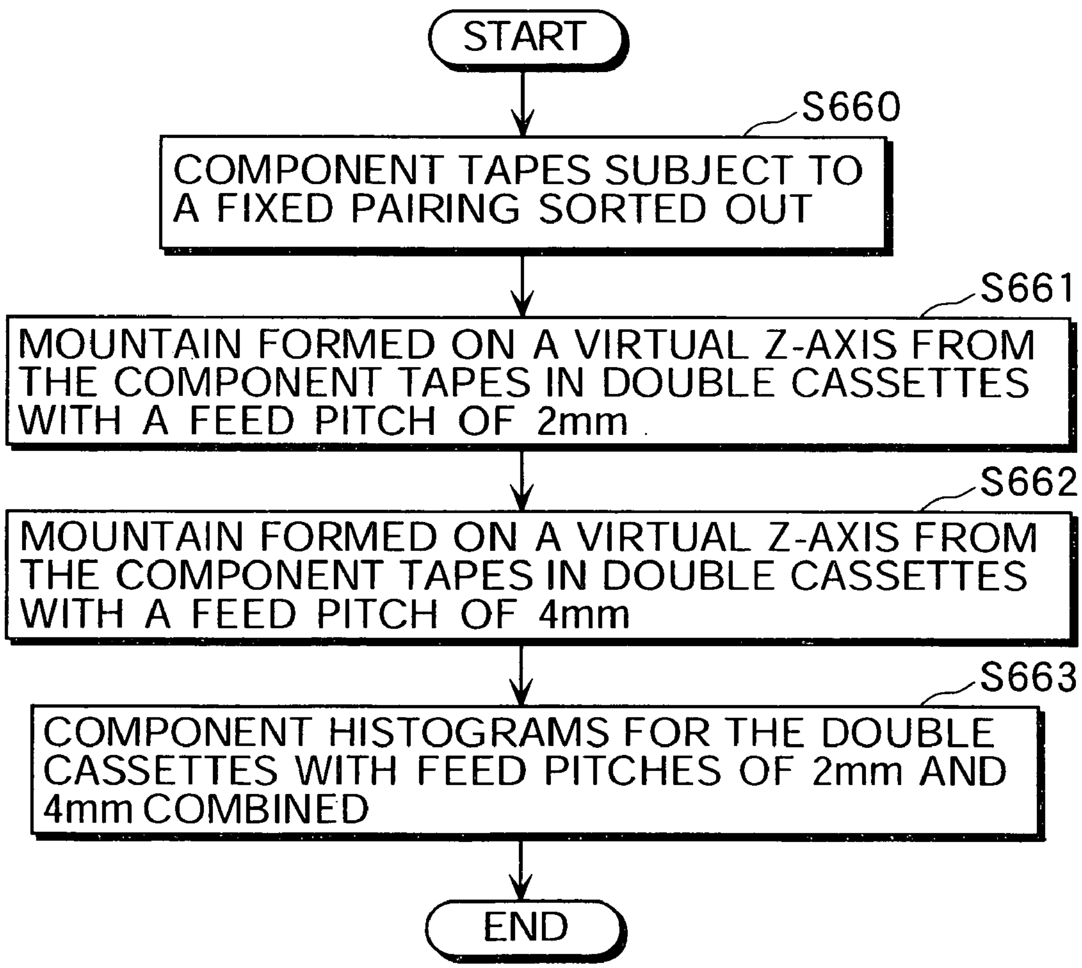
Figure 132A:
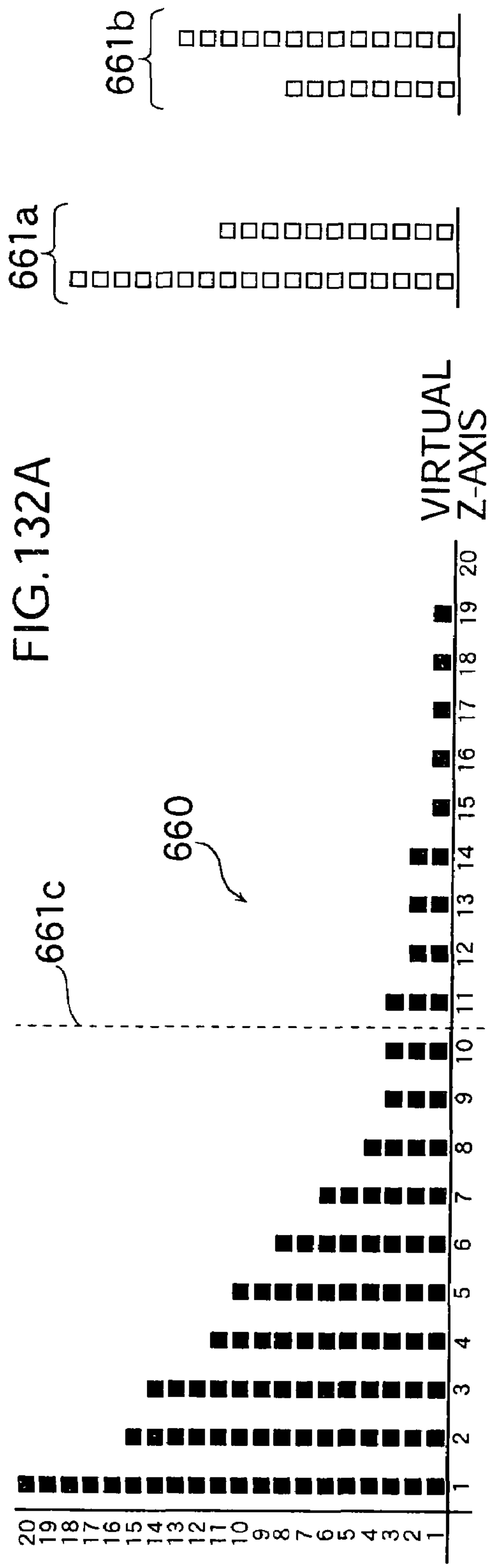
Figure 132B:
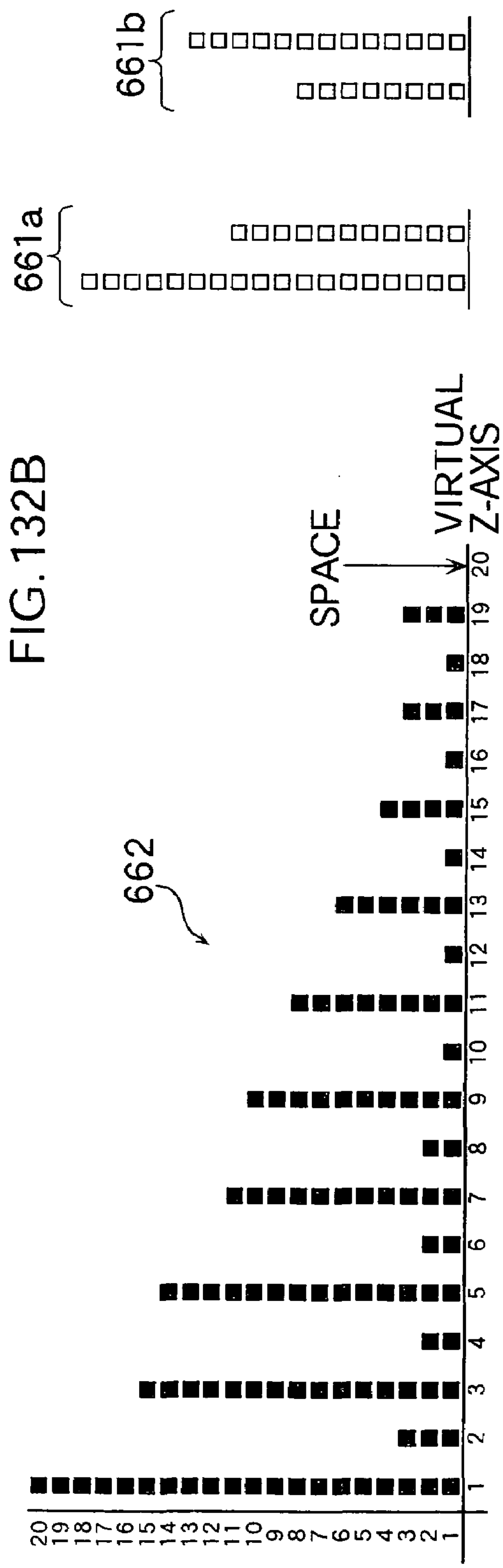

FIGS. 132A and 132B show the processing performed in step S661 of FIG. 130.

Figure 133A:
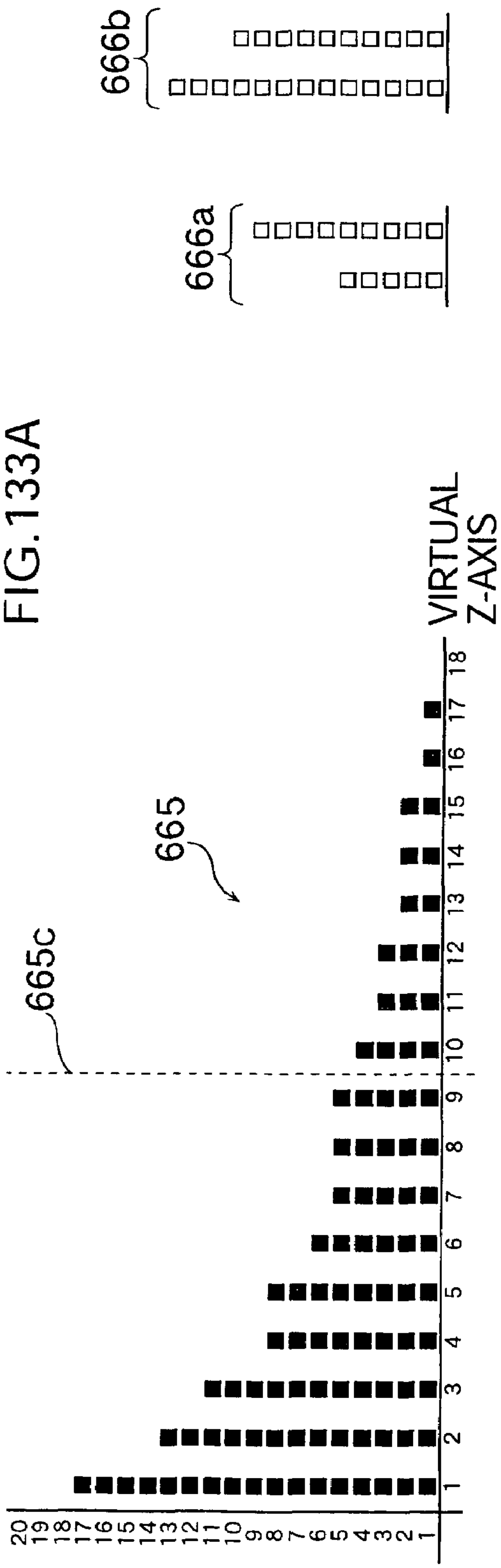
Figure 133B:
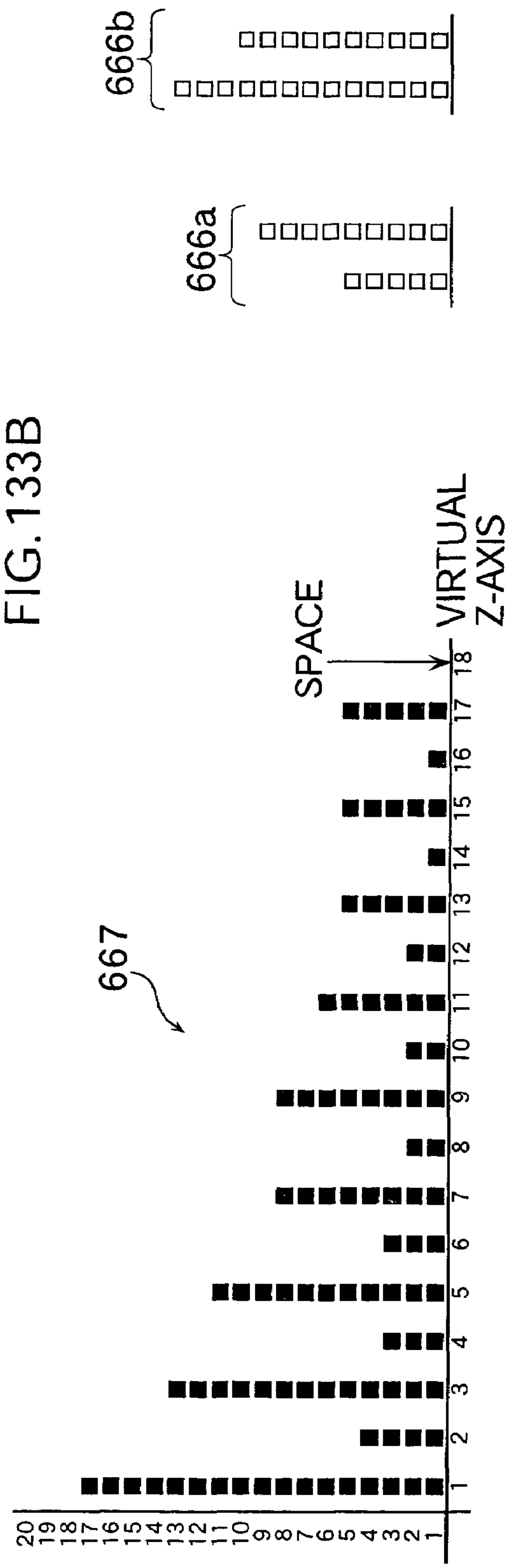

FIGS. 133A and 133B show the processing performed in step S662 of FIG. 130.

Figure 134A:
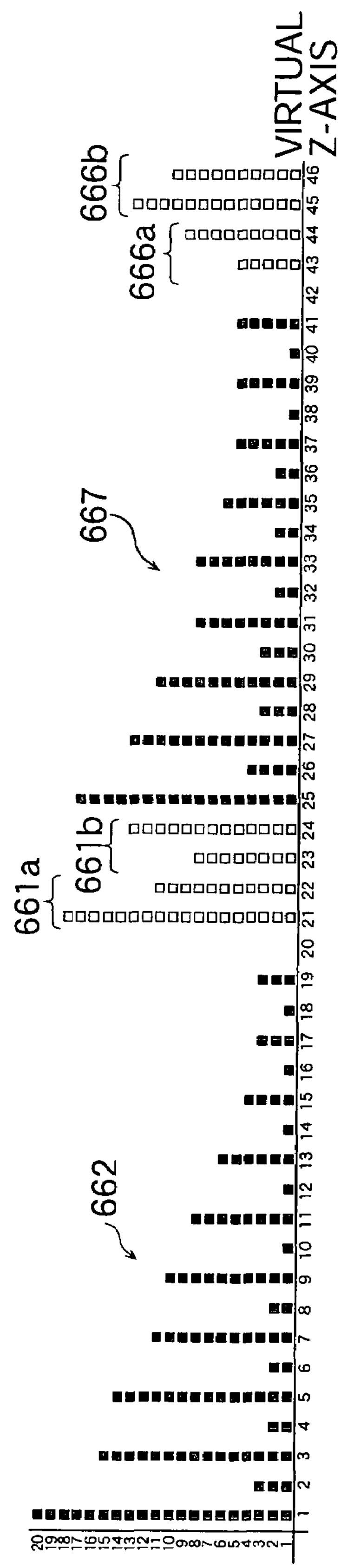
Figure 134B:
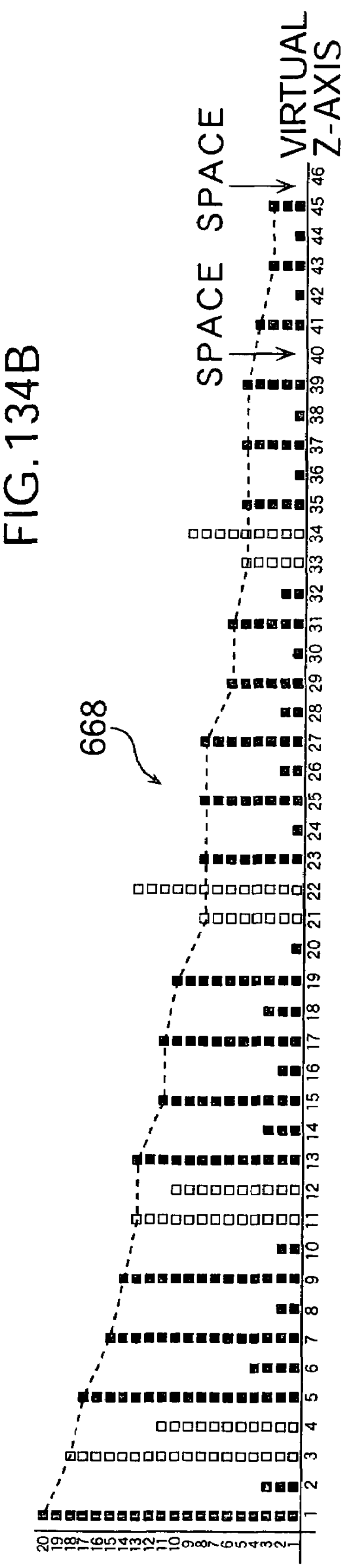

FIGS. 134A and 134B show the processing performed in step S664 of FIG. 130.

Figure 135:
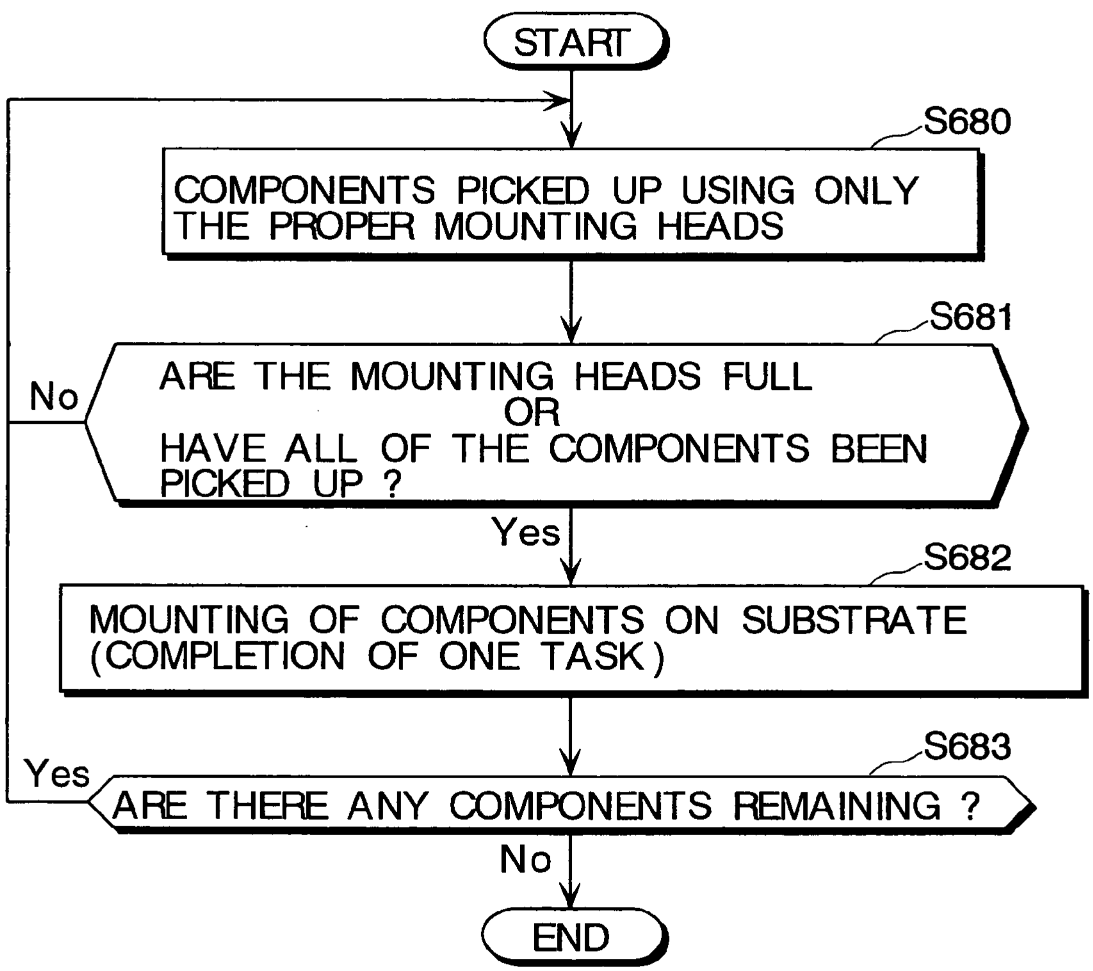

FIG. 135 is a flowchart showing the procedure used by an optimization algorithm that considers the presence of a defective head.

Figure 136:
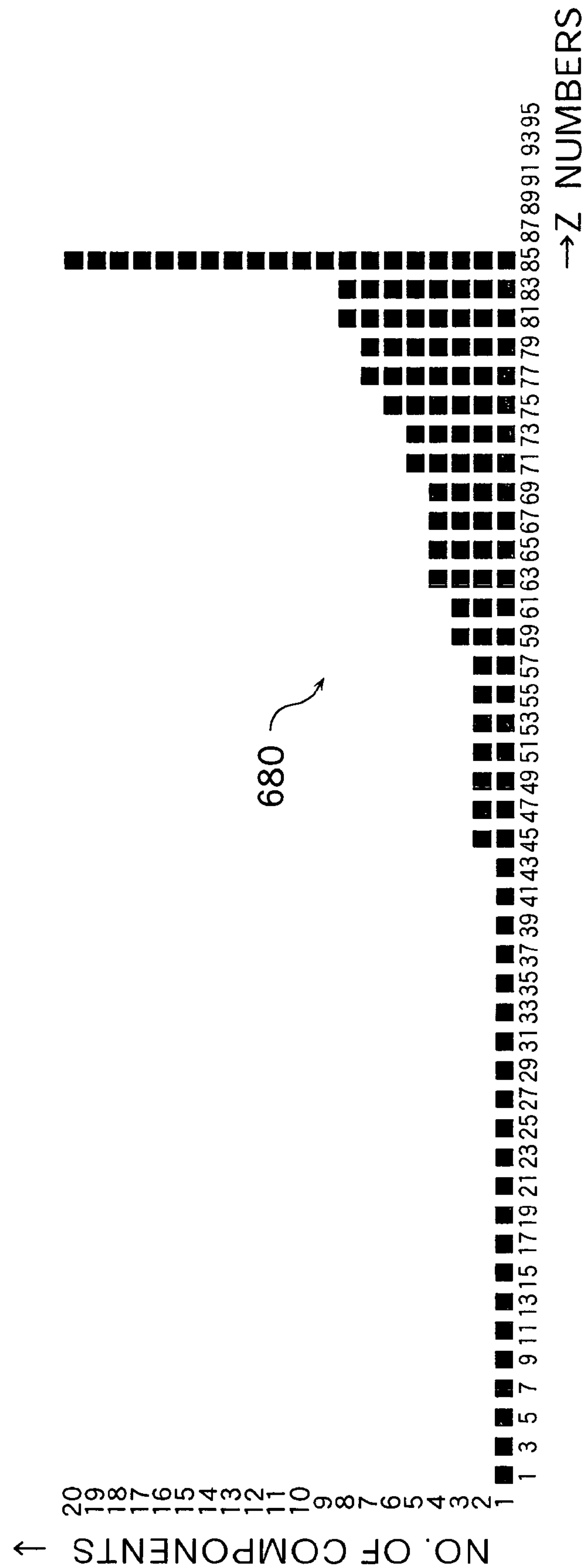

FIG. 136 compares the pickup patterns for the case where there is a defective head and the case when there is no defective head, and the corresponding component histogram.

Figure 137:
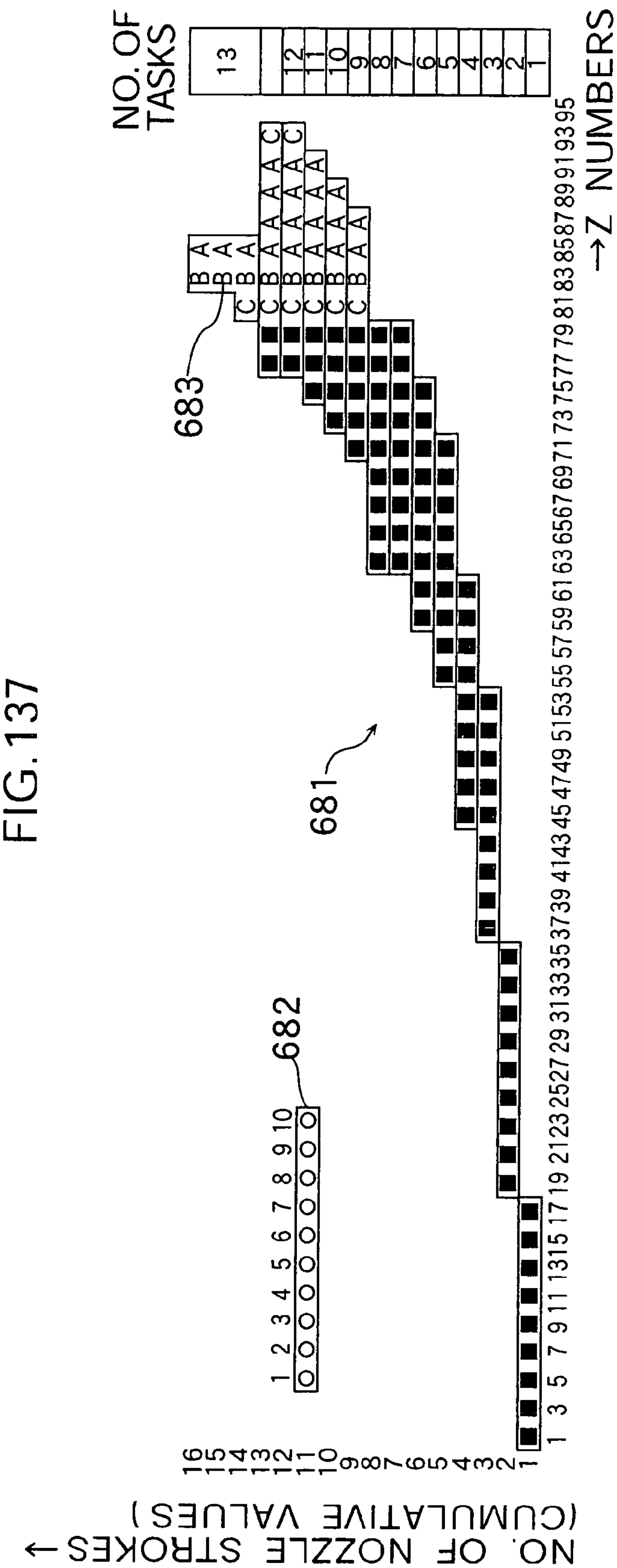

FIG. 137 shows the pickup patterns (produced by the cut down process and core process) corresponding to the component histogram shown in FIG. 136 for the case when there is no defective head.

Figure 138:
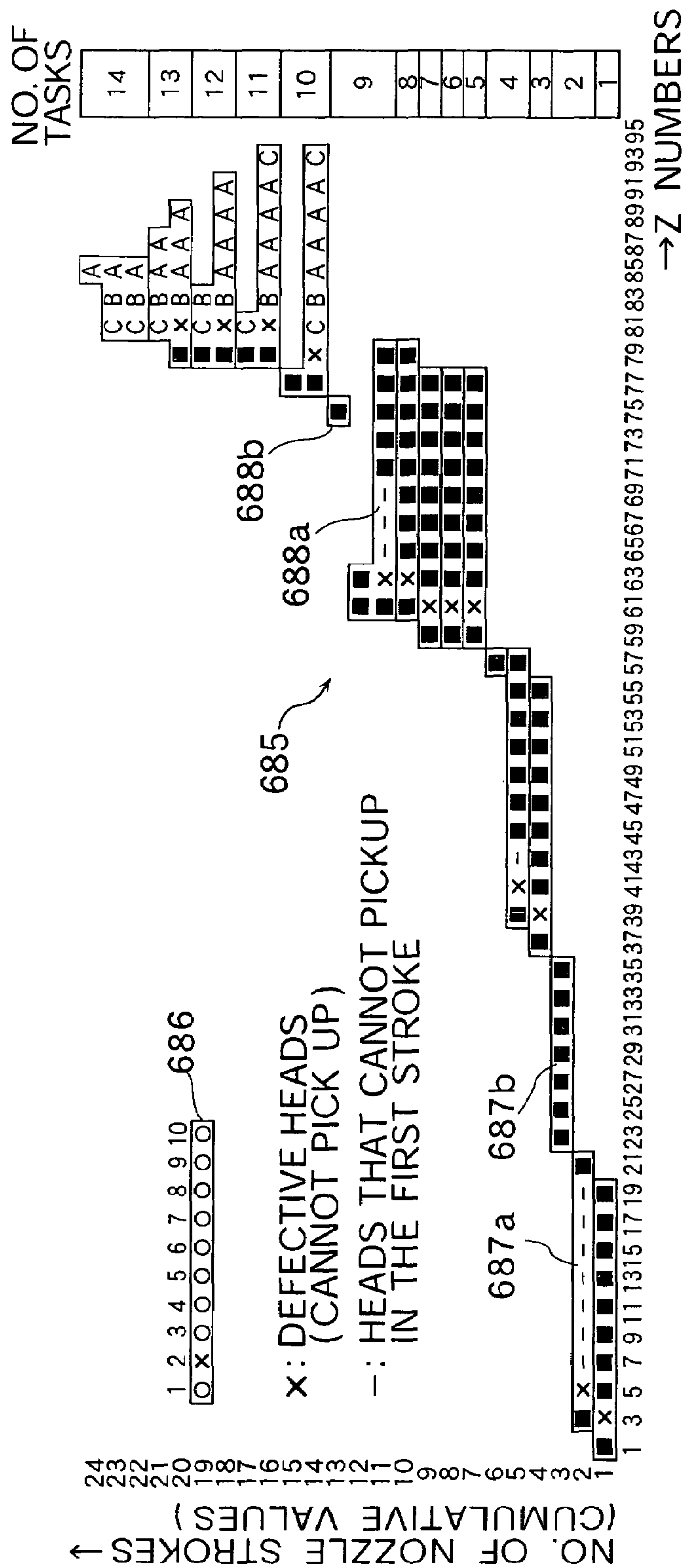

FIG. 138 shows the pickup patterns corresponding to the component histogram shown in FIG. 136 for the case when mounting head number 2 is a defective head.

Figure 139:
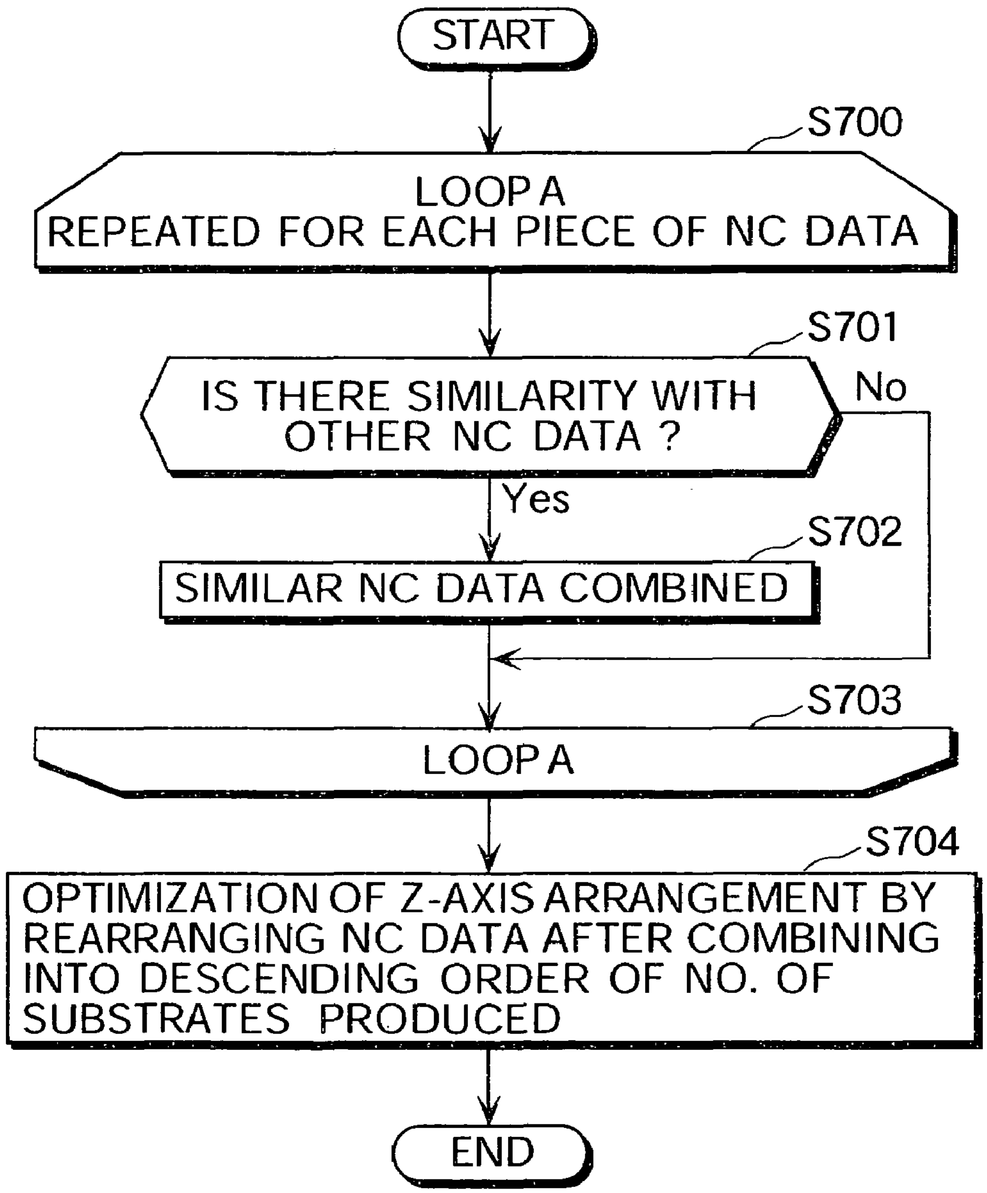

FIG. 139 is a-flowchart showing the entire procedure used when simultaneously optimizing a plurality of sets of NC data.

Figure 140:
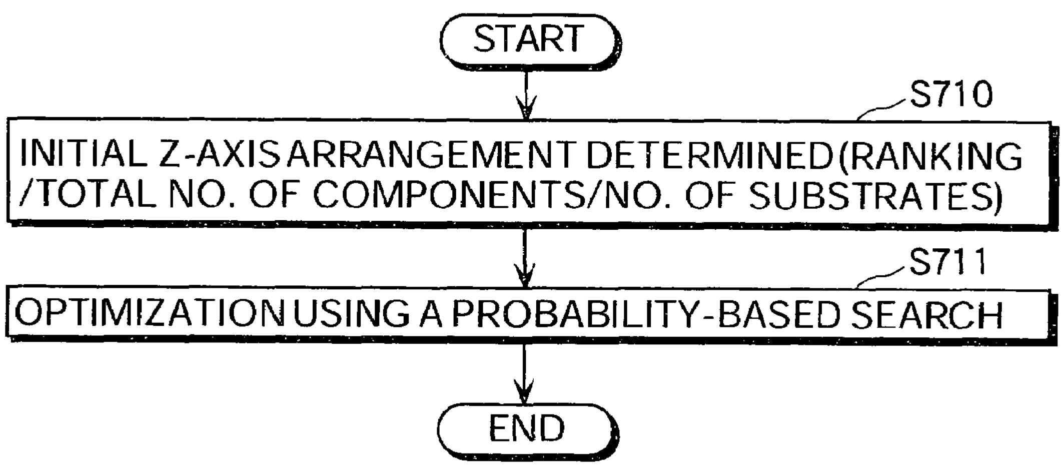

FIG. 140 is a flowchart showing the entire procedure used when optimizing the Z arrangement for a plurality of sets of NC data.

FIGS. 141A and 141B show a specific example that illustrates the three methods that determine the initial Z-axis arrangement.

Figure 142:
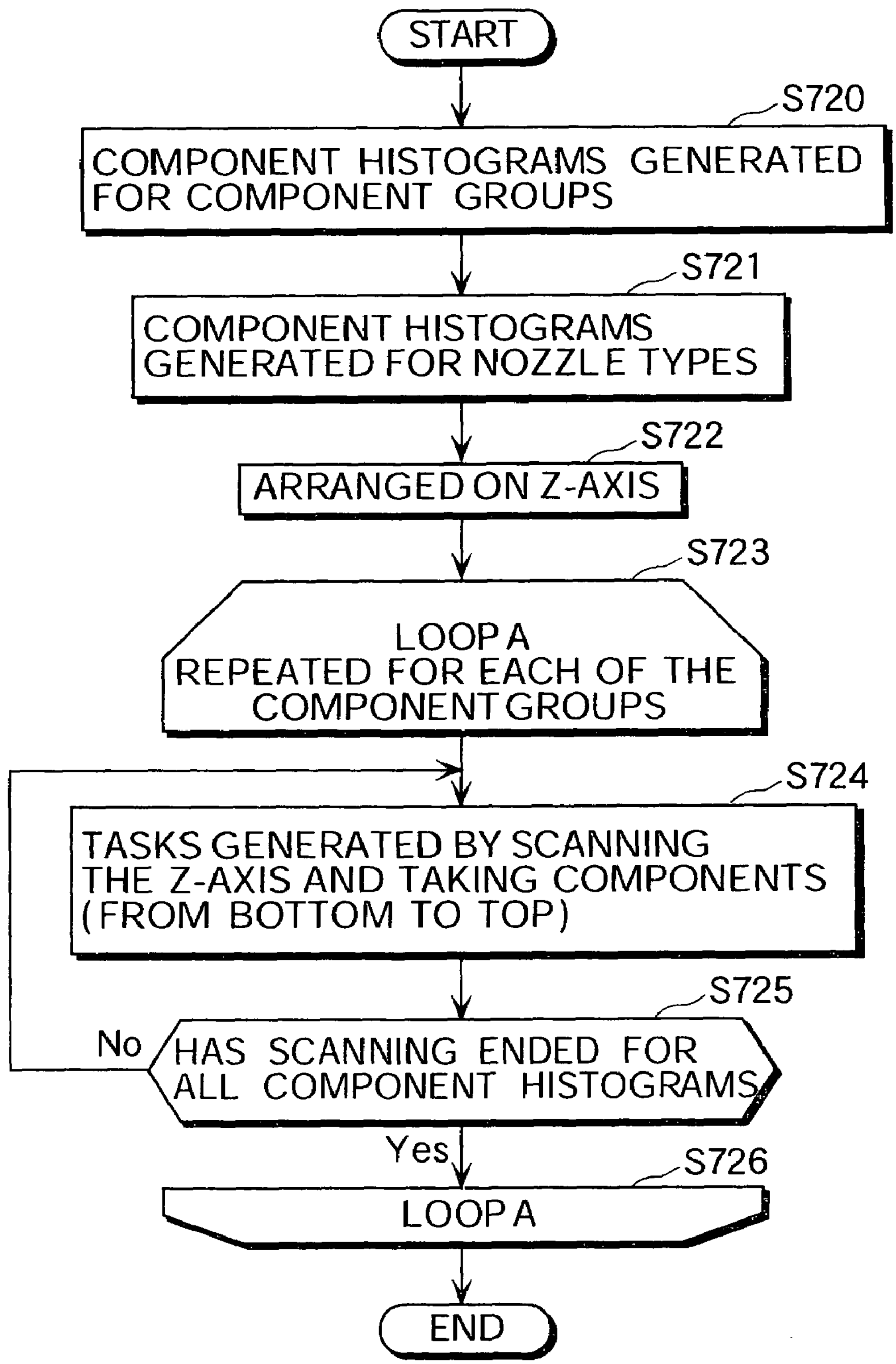

FIG. 142 is a flowchart showing the procedure for the algorithm that generates initial tasks according to the "appropriation" method.

Figure 143A:
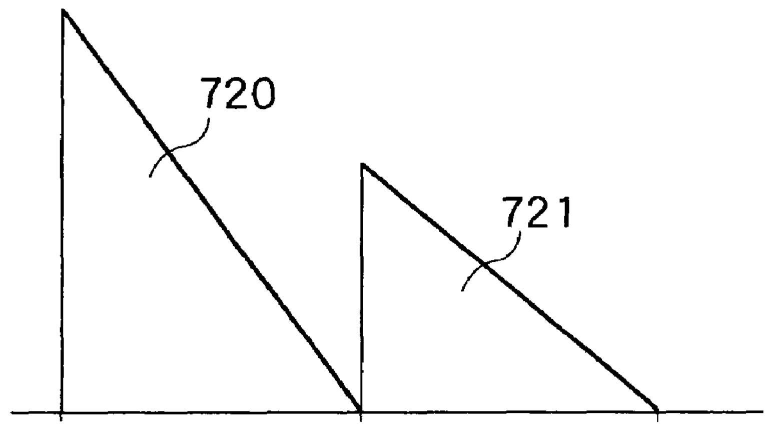
Figure 143B:
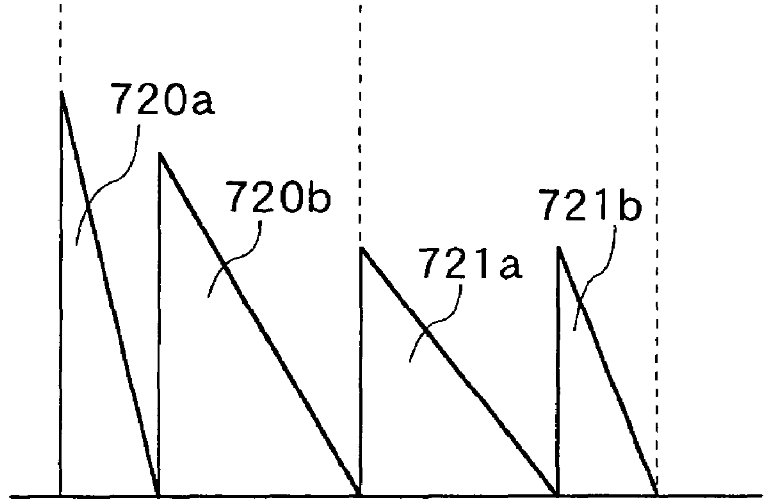
Figure 143C:
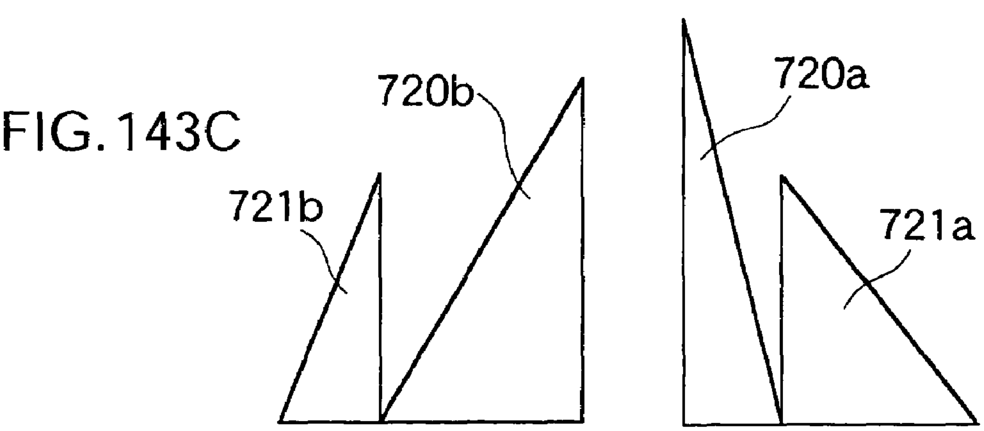

FIGS. 143A to 143C show a specific example of the operation in the former half (S720 to S722) of the processing in the flowchart shown in FIG. 142.

FIGS. 144A to 144E show a specific example of the operation in the latter half (S723 to S726) of the processing in the flowchart shown in FIG. 142.

Figure 145:
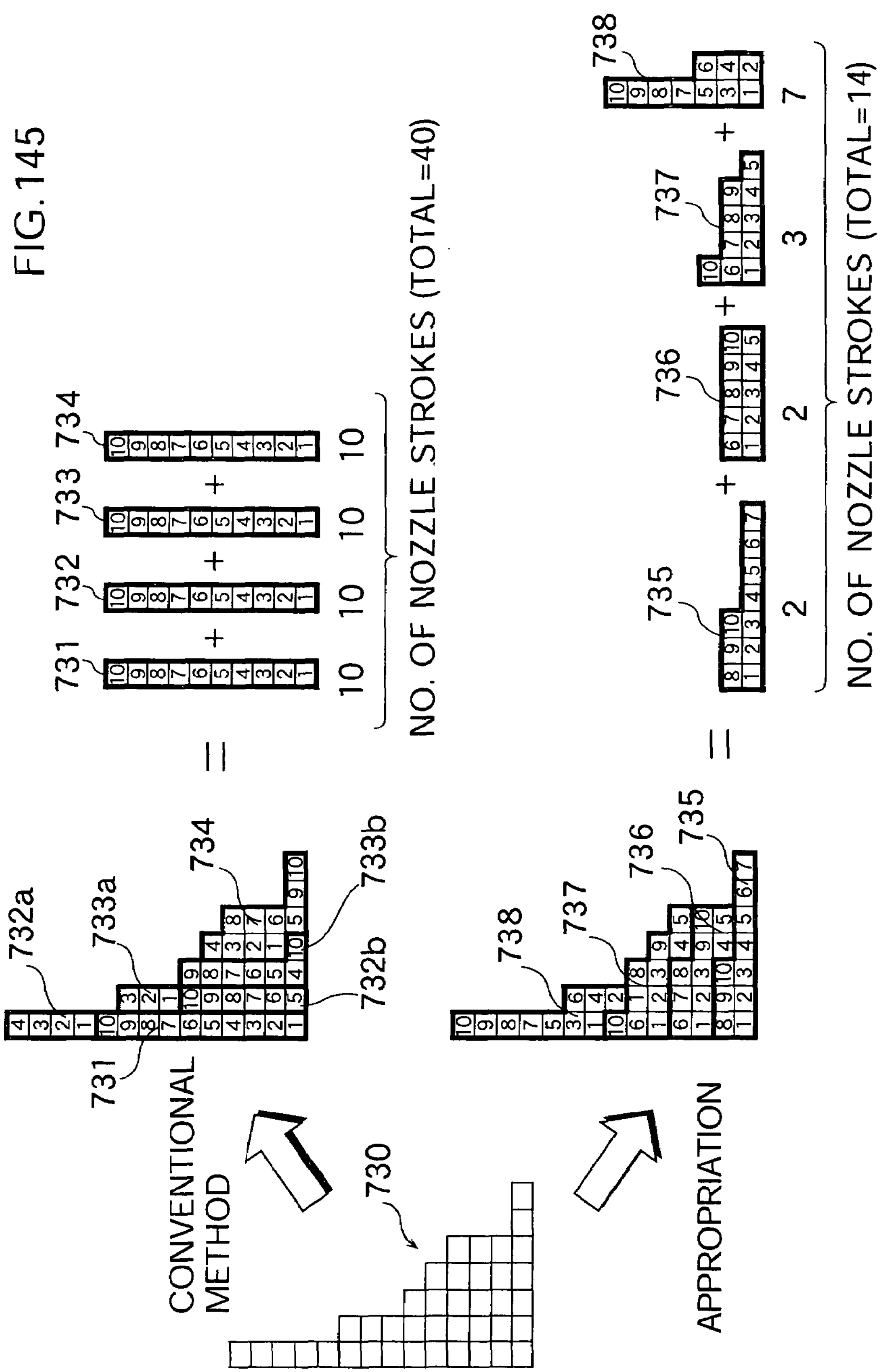

FIG. 145 shows the effect of optimization according to the "appropriation" method.

Figure 146:
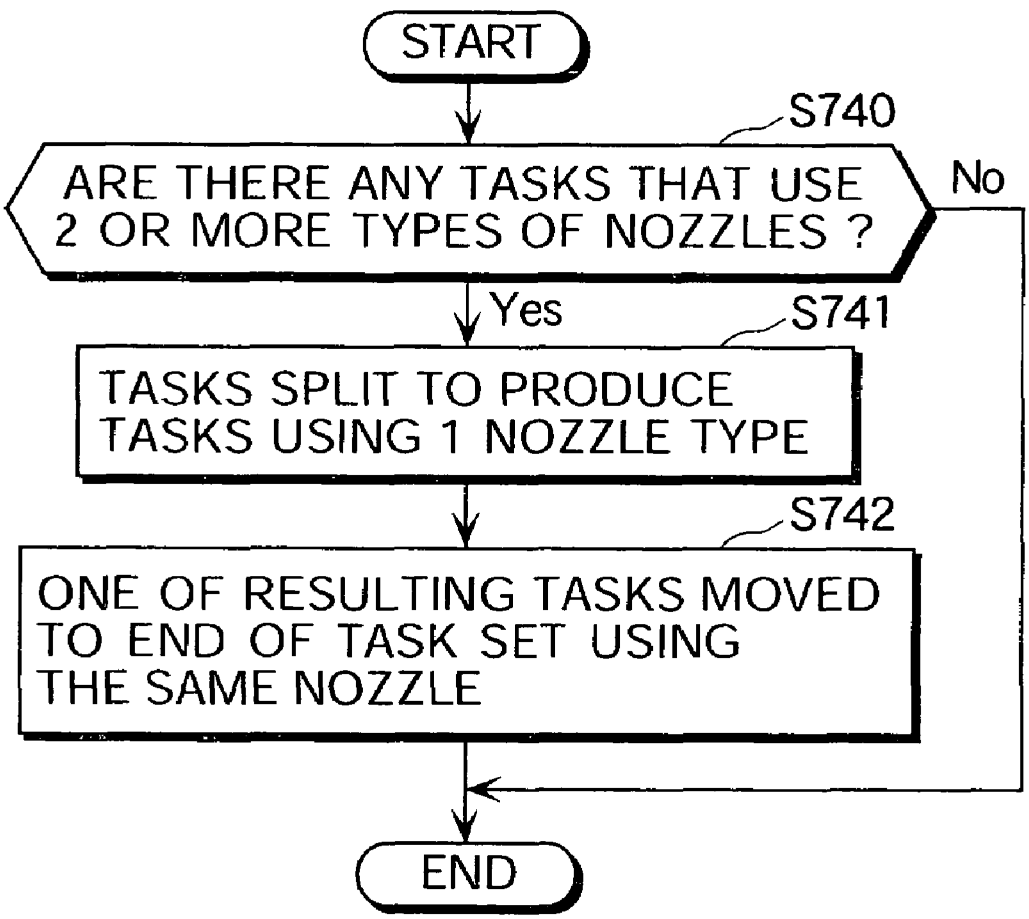

FIG. 146 is a flowchart showing the procedure used by an optimization algorithm for nozzle interchanges that uses "task division".

FIGS. 147A to 147D show a specific example of the operation performed by the processing in the flowchart shown in the FIG. 146.

Figure 148:
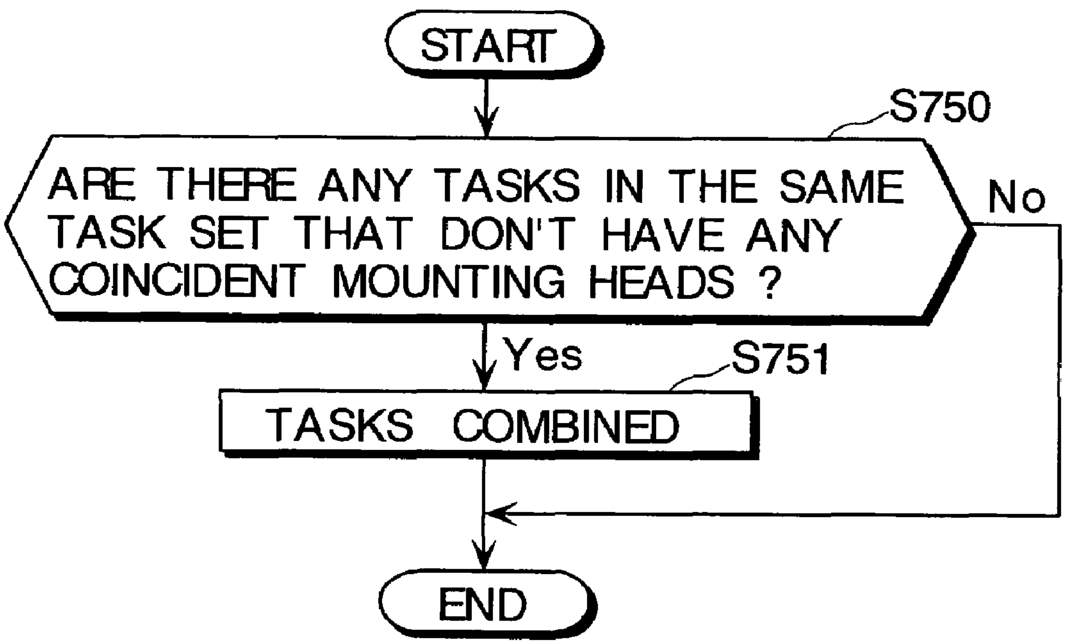

FIG. 148 is a flowchart showing the procedure used by an optimization algorithm that uses "task combining".

Figure 149A:
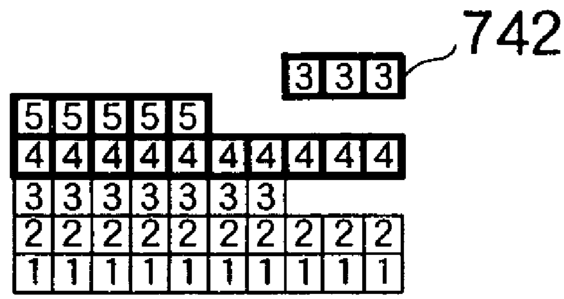
Figure 149B:
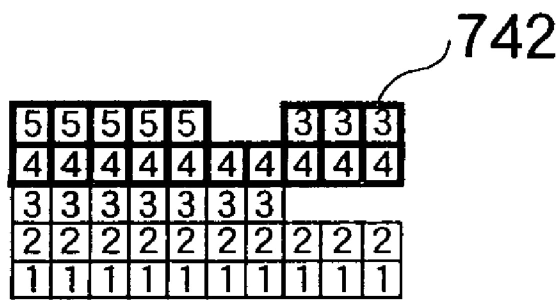
Figure 149C:
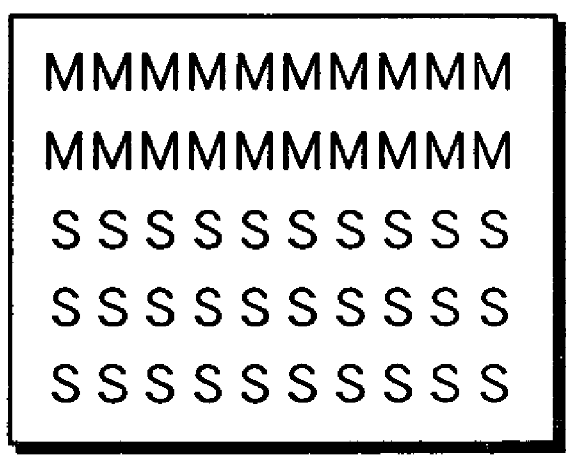

FIGS. 149A to 149C show a specific example of the operation performed by the processing in the flowchart shown in the FIG. 148.

Figure 150:
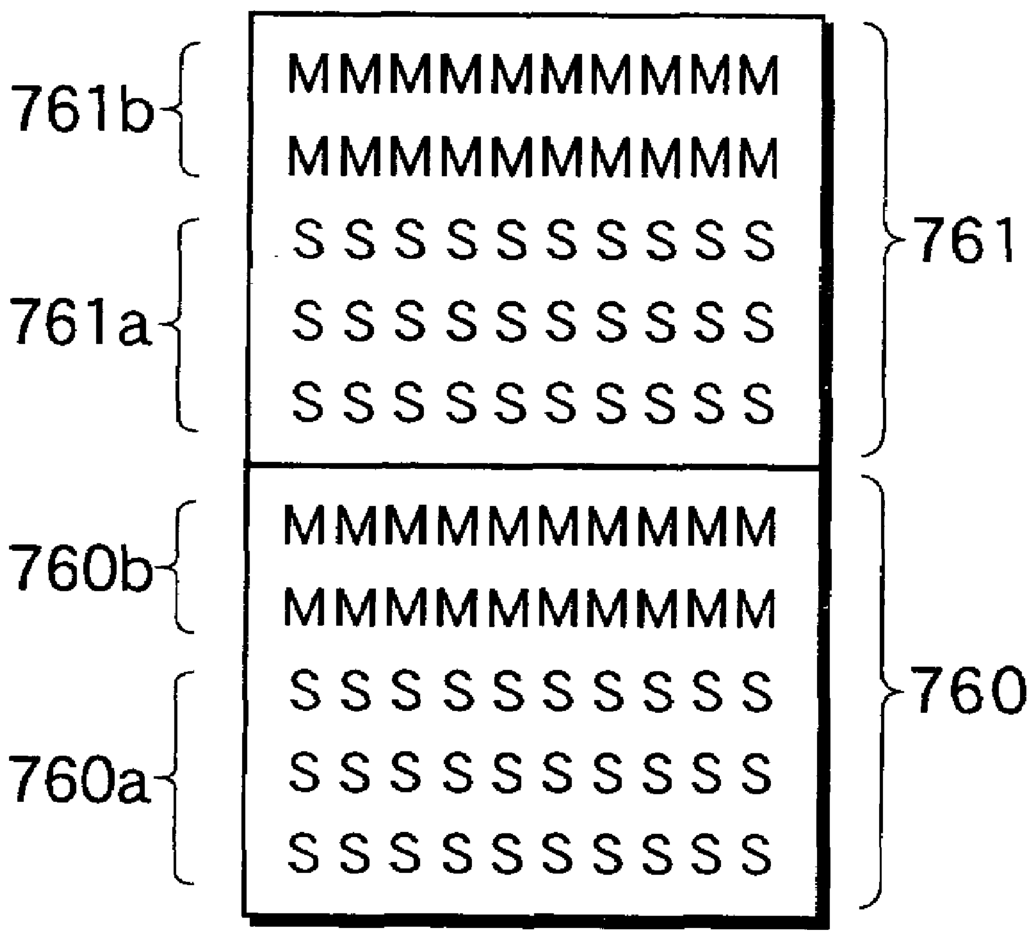

FIG. 150 shows a nozzle pattern before optimization is performed according to "task interchanging".

Figure 151:
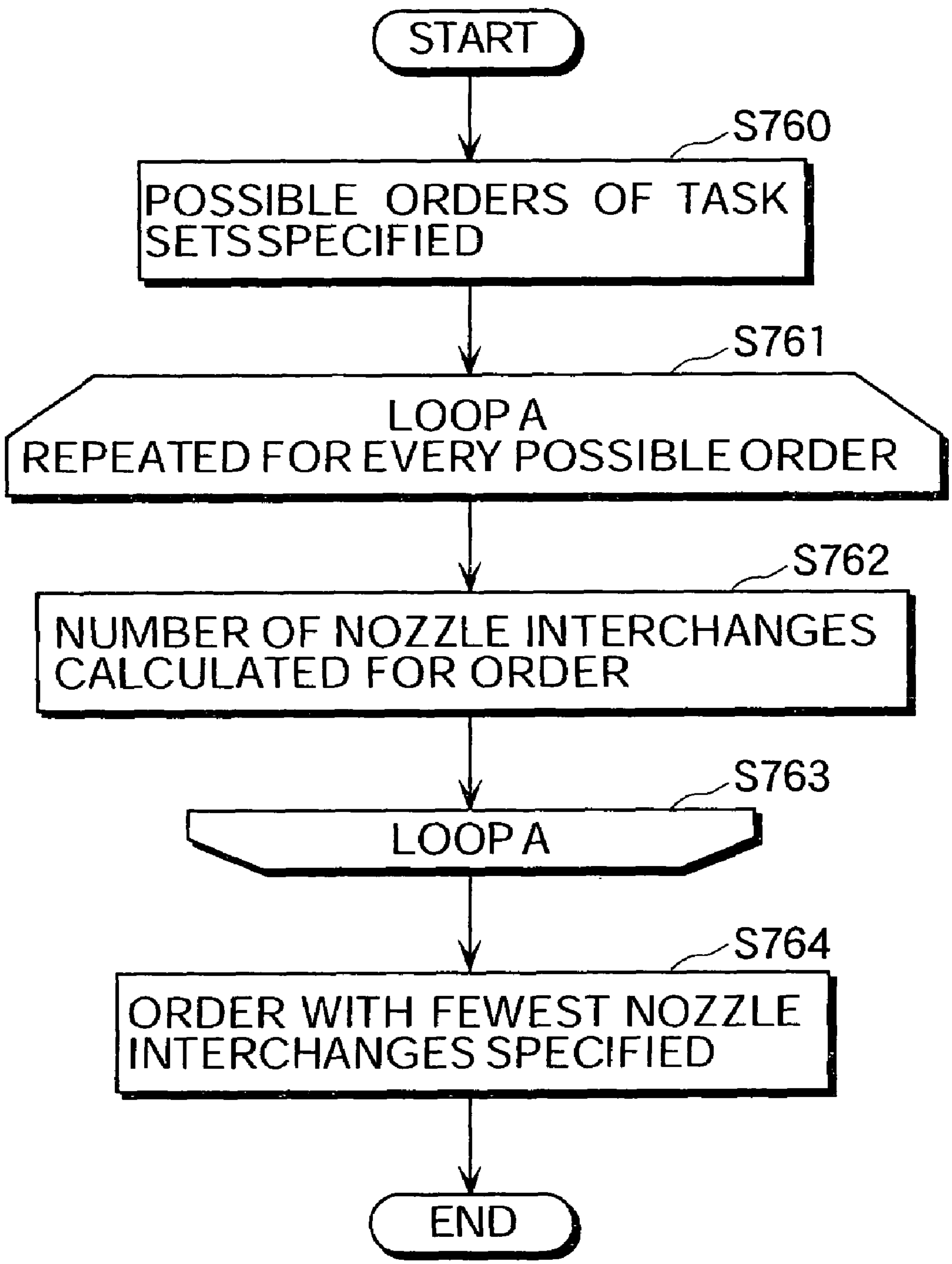

FIG. 151 is a flowchart showing the procedure used by an optimization algorithm that uses "task interchanging".

Figure 152:
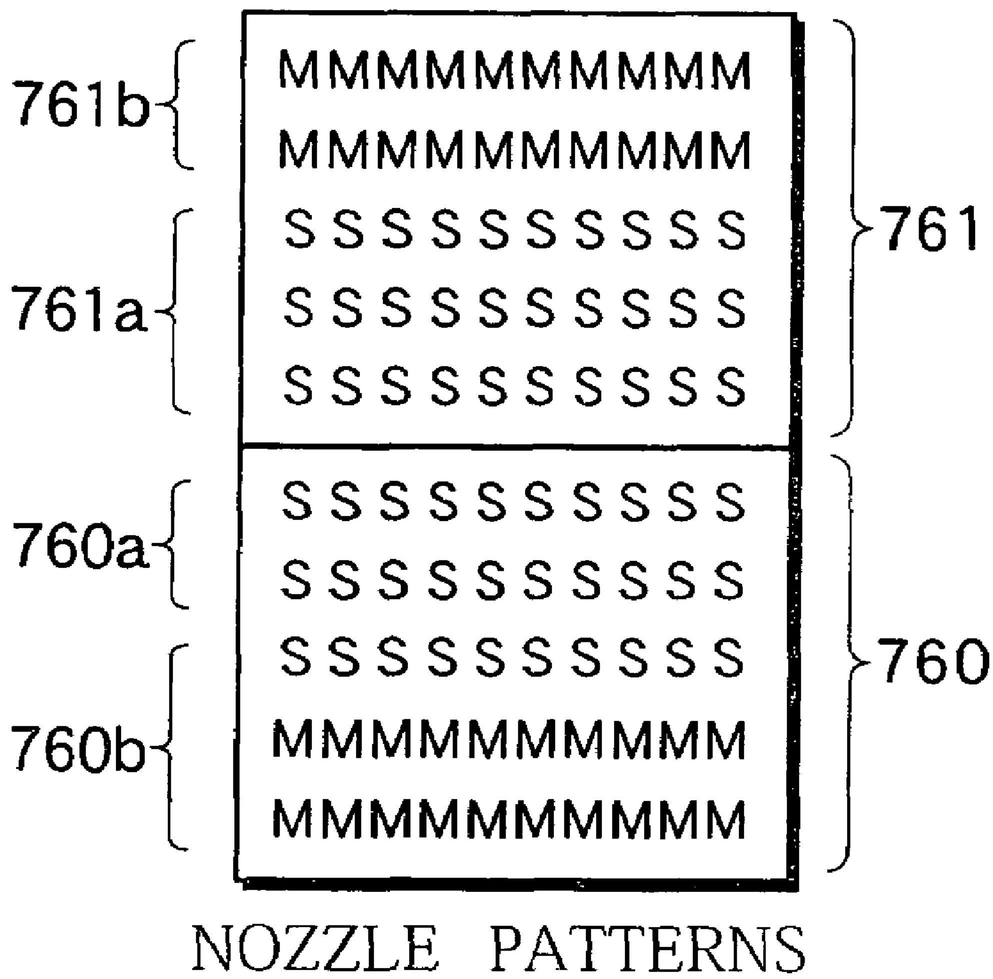

FIG. 152 shows examples of the nozzle patterns obtained by optimization that uses "task interchanging".

Figure 153:
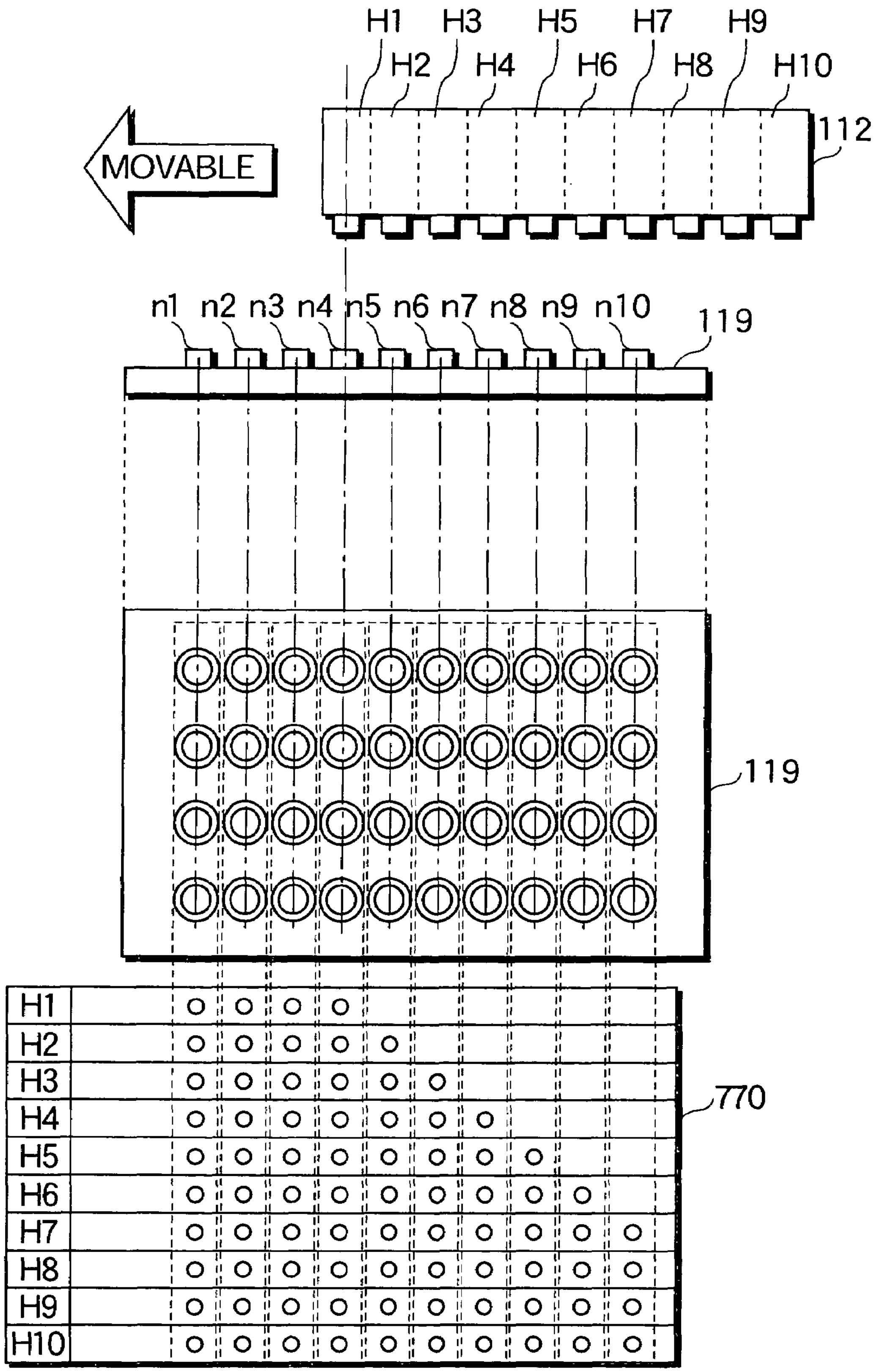

FIG. 153 shows the restrictions on nozzle interchanges due to the movable range of the line gang pickup head above the nozzle station.

FIGS. 154A to 154C show the restrictions on component pickup due to the movable range of the line gang pickup head over the component supplying units.

Figure 155:
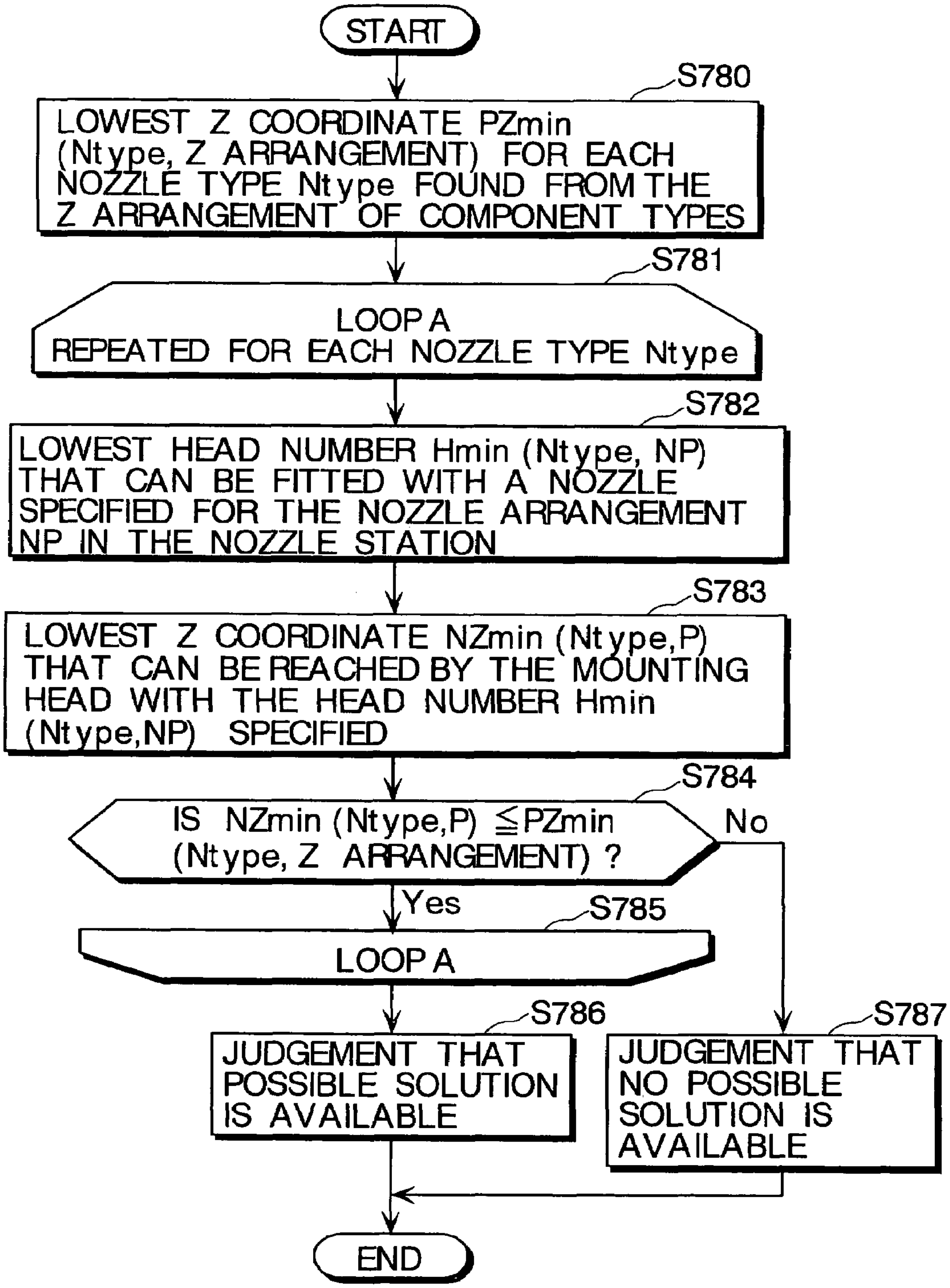

FIG. 155 is a flowchart showing the procedure used when confirming whether mounting is possible for a given nozzle arrangement in the nozzle station.

FIG. 156 shows an example of two nozzle patterns for the case when the number of used nozzles is six.

Figure 157:
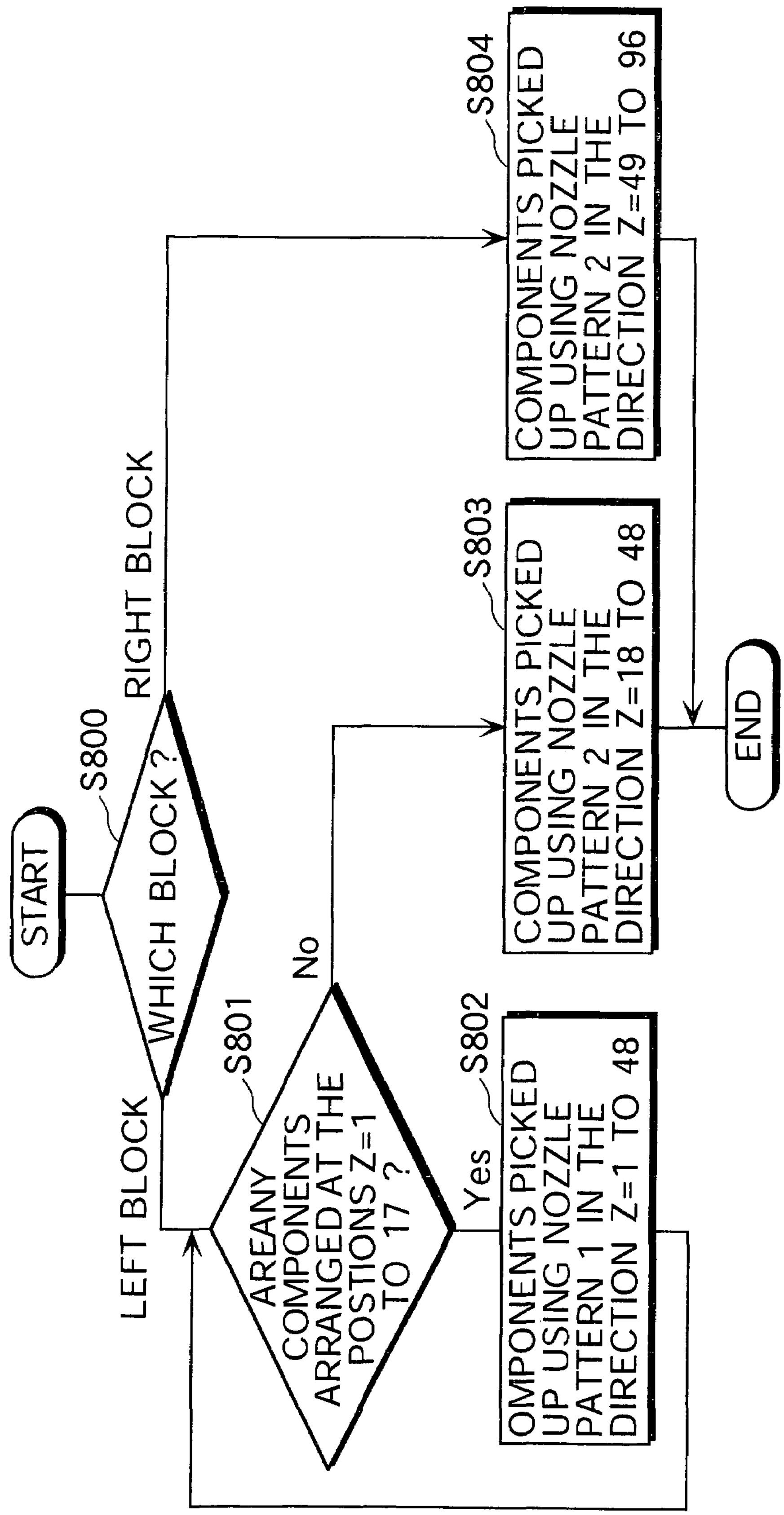

FIG. 157 is a flowchart showing the timing for interchanging the nozzles that pick up components using the nozzle patterns shown in FIG. 156.

DETAILED DESCRIPTION THE INVENTION

The following describes an embodiment of the present invention with reference to the attached drawings. The meanings of the technical terms used in this specification are given as the terms appear in the text and in the "Glossary" section at the end of this specification.

Sections

1 Mounting System
- 1.1 Construction of the Mounter
- 1.2 Restrictions for the Mounter
  - 1.2.1 Line Gang Pickup Head
  - 1.2.2 Component Recognizing Camera
  - 1.2.3 Component Supplying Units
  - 1.2.4 Component Feeders
  - 1.2.5 Other Restrictions
- 1.3 Optimization Apparatus
  - 1.3.1 Hardware Construction of the Optimization Apparatus
  - 1.3.2 Software Construction of the Optimization Apparatus 2 Operation of the Optimization Apparatus (Overview)
- 2.1 Generation Of Component Groups
- 2.2 Tact Time Balancing Process
- 2.3 Optimization For Small Components
- 2.4 Task Group Generation Method
- 2.5 Cut Down Process
- 2.6 Random Selection (The "Greedy Method")
- 2.7 Intersection Disentanglement
- 2.8 Return Optimization
- 2.9 Optimization For General Components 3 Operation of the Optimization Apparatus (Details)
- 3.1 Cut Down Procedure
  - 3.1.1 Overview Of The Task Group Generation Method
  - 3.1.2 Problems With The Task Group Generation Method
  - 3.1.3 Cut Down Procedure
  - 3.1.4 Optimization For Small Components According To The Cut Down Procedure
  - 3.1.5 Individual Processes 3.2 Intersection Disentanglement
3.2.1 Overview Of The Greedy Method
3.2.2 Problems With The Greedy Method
3.2.3 Intersection Disentanglement
3.2.4 Related Individual Processes
3.3 Return Optimization
3.3.1 Evaluation of the Component Mounting Operation
3.3.2 Necessity of Optimizing the Return Process
3.3.3 Return Optimization
3.3.4 Related Individual Processes
3.4 Fixed Arrangement Processing
3.4.1 Overview
3.4.2 Related Individual Processes
3.5 Dealing with LL-sized Substrates
3.5.1 Overview
3.5.2 Interchanging Component Tapes On The Z-Axis
3.5.3 Changes To The Pickup Method
3.5.4 Related Individual Processes
3.6 Dealing With XL-Sized Substrates
3.6.1 Overview
3.6.2 Related Individual Processes
3.7 Estimated Tact Time Balancing Process
3.7.1 Overview
3.7.2 Levels On Which Balance Adjusting Is Performed
3.7.3 Related Individual Processes
3.8 Tact Time Balancing Process
3.8.1 Overview
3.8.2 Levels On Which Balance Adjusting Is Performed
3.8.3 Related Individual Processes
3.9 Details Of The Separate Processes Performed By The Optimization Apparatus
3.9.1 Cut Down Procedure
3.9.2 Division Of The Cassettes Using A Parallelogram
3.9.3 Division Of The Cassettes Using A Rectangle
3.9.4 Core Crush Process For A Given Number Of Cassettes
3.9.5 Task Generation Process for Small Components
3.9.6 Intersection Disentanglement
3.9.7 Return Optimization
3.9.8 Entire Flow (Starting From The Histogram)
3.9.9 Arrangement Of Fixed Components And Mountains Within A Cassette Block
3.9.10 Fixed Arrangement: Judging Whether A Fixed Position Is Usable
3.9.11 Fixed Arrangement Of Double Cassettes
3.9.12 LL Restrictions: Changes To The Pickup Method (1)
3.9.13 LL Restrictions: Changes to the Pickup Method (2)
3.9.14 LL Restrictions: Interchanging Component Tapes On The Z-Axis (1)
3.9.15 LL Restrictions: Interchanging Component Tapes On The Z-Axis (2)
3.9.16 Processing To Handle XL-Sized Substrates (XL Restrictions)
3.9.17 Estimated Tact Time Balance Adjusting Process (In Units Of Mountains).
3.9.18 Estimated Tact Time Balance Adjusting Process (In Units Of Component Tapes)
3.9.19 Processing Moving A Mountain From The Front Stage 110 To The Rear Stage 120
3.9.20 Processing Moving A Component Tape From The Front Stage 110 To The Rear Stage 120
3.9.21 Processing Moving Mounting Points From The Front Stage 110 To The Rear Stage 120
3.9.22 Swapping Performed When Adjusting The Tact Time Balance
3.9.23 Cut Down Procedure Performed For Double Cassettes
3.9.24 Nozzle Interchanging Algorithm
3.10 Example Screen Displays
3.10.1 Main Screen
3.10.2 Open Screen
3.10.3 Optimization Details Screen
3.10.4 Set No. Of Cassettes Screen
3.10.5 Set Component Division Numbers Screen
3.10.6 Set No. Of Nozzles Screen
3.10.7 Select Nozzle Station Screen
3.10.8 Options Screen
3.10.9 Z-Axis Information Screen
3.10.10 Nozzle Station Information Screen
4 Operation Of The Optimization Apparatus (Application)
4.1 Optimization Of Small Components
4.1.1 Optimization Of The Z-Axis Arrangement Without Dividing Components
4.1.2 Optimization Through Assigning To The Left And Right Block
4.1.3 Estimating The Number Of Double-Cassette Feeders
4.1.4 Fixing The Pairs Of Component Tapes For Double-Cassette Feeders
4.1.5 Optimization Algorithm For The Case Where There Is A Defective Head
4.2 Simultaneous Optimization Of Several Sets Of NC Data
4.3 Optimization For General Components (Introduction Of The Rule Base)
4.3.1 Appropriation
4.3.2 Task Division
4.3.3 Task Combining
4.3.4 Task Interchanging
4.4 Optimization With Respect To The Nozzle Restrictions
4.4.1 Procedure Performed When The Arrangement Of Nozzles In The Nozzle Station Is Fixed
4.4.2 Optimization For Small Components When Less Than 10 Nozzles Are Used
5 Glossary Sections with the above headings are given in order below.

1 Mounting System

Figure 1:
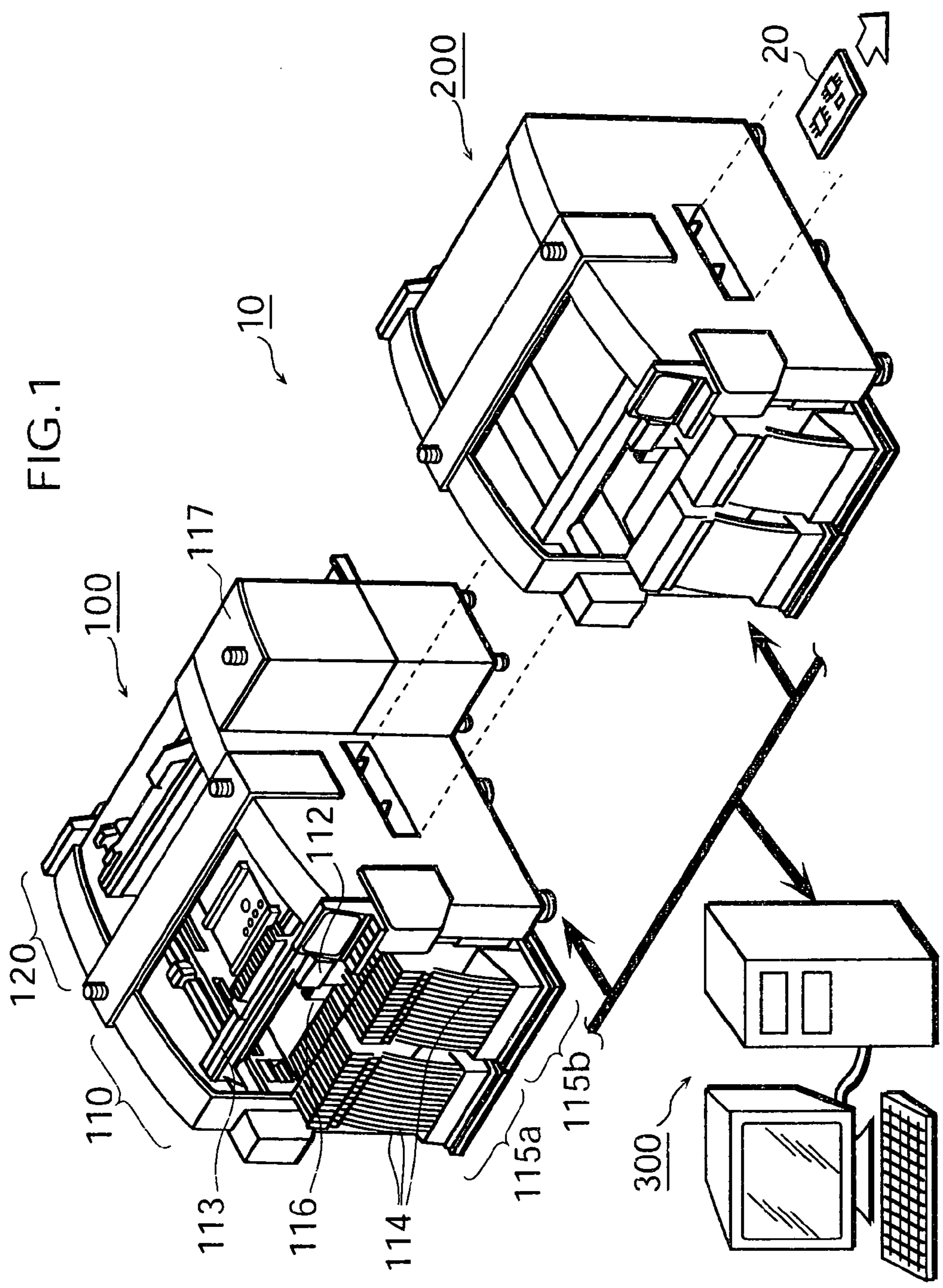
FIG. 1 shows the entire construction of a mounting system 10 according to the present invention.

FIG. 1 shows the entire construction of a mounting system 10 according to the present invention. As shown in the drawing, the mounting system 10 is composed of a plurality (here, two) of mounters 100 and 200 and an optimization apparatus 300. The mounters 100 and 200 form a production line where electronic components are mounted onto a circuit board 20 that is transported downstream. The optimization apparatus 300 optimizes the mounting order of the required electronic components at the start of production, for example, based on information in a variety of databases, and sets and controls the mounters 100 and 200 having provided them with the NC data produced by the optimization.

The mounter 100 is equipped with two stages (a front stage 110 and a rear stage 120) that operate simultaneously and independently of one another, or in concert, or even alternately. Each of these stages 110 and 120 is a perpendicular robotic mounting stage and includes two component supplying units 115*a* and 115*b*, a line gang pickup head 112, an XY robot 113, a component recognizing camera 116, and a tray supplying unit 117. The component supplying units 115*a* and 115*b* are each made up of an array of up to 48 component feeders 114 that store component tapes. The line gang pickup head 112 has 10 pickup nozzles (hereafter simply "nozzles") that can pick up a maximum of 10 components from the component feeders 114 and mount them onto the circuit board 20. The XY robot 113 moves the line gang pickup head 112. The component recognizing camera 116 investigates the picked-up state of the components that have been picked up by the line gang pickup head 112 in two or three dimensions. The tray supplying unit 117 supplies tray components.

In this specification, the expression "component tape" refers to a tape (a carrier tape) in which a number of the same type of components have been arranged, with such tape being supplied from a reel (a supply reel) or the like around which the tape has been wound. Component tapes are usually used to supply relatively small components called "chip components" to a mounter. However, during the optimization process, a "component tape" refers to data that specifies a group of components of the same type that are assumed to have been arranged on a virtual tape[)]. In the process called "component division", a group of components of the same type (that would potentially be arranged on a single component tape) are divided between a plurality of component tapes.

Note that components supplied by a component tape are sometimes called "taped components".

In more detail, the mounter 100 is a mounting device that includes the functions of both a mounting device commonly called a high-speed mounter and a mounting device called a multi-function mounter. A high-speed mounter is a device that is capable of mounting electronic components that are 10 $mm^2$ or smaller in around 0.1 seconds, while a multi-function mounter is a device that can mount large electronic components that are 10 $mm^2$ or larger, irregularly shaped components like switches and connectors, and IC components like QFP (Quad Flat Package) or BGA (Ball Grid Array) components.

In short, the mounter 100 is designed so as to be able to mount almost all types of electronic components from 0.6 mm by 0.3 mm chip resistors to 200 mm connectors, with a production line being formed by arranging the required number of mounters 100 in a line.

1.1 Construction of the Mounter

Figure 2:
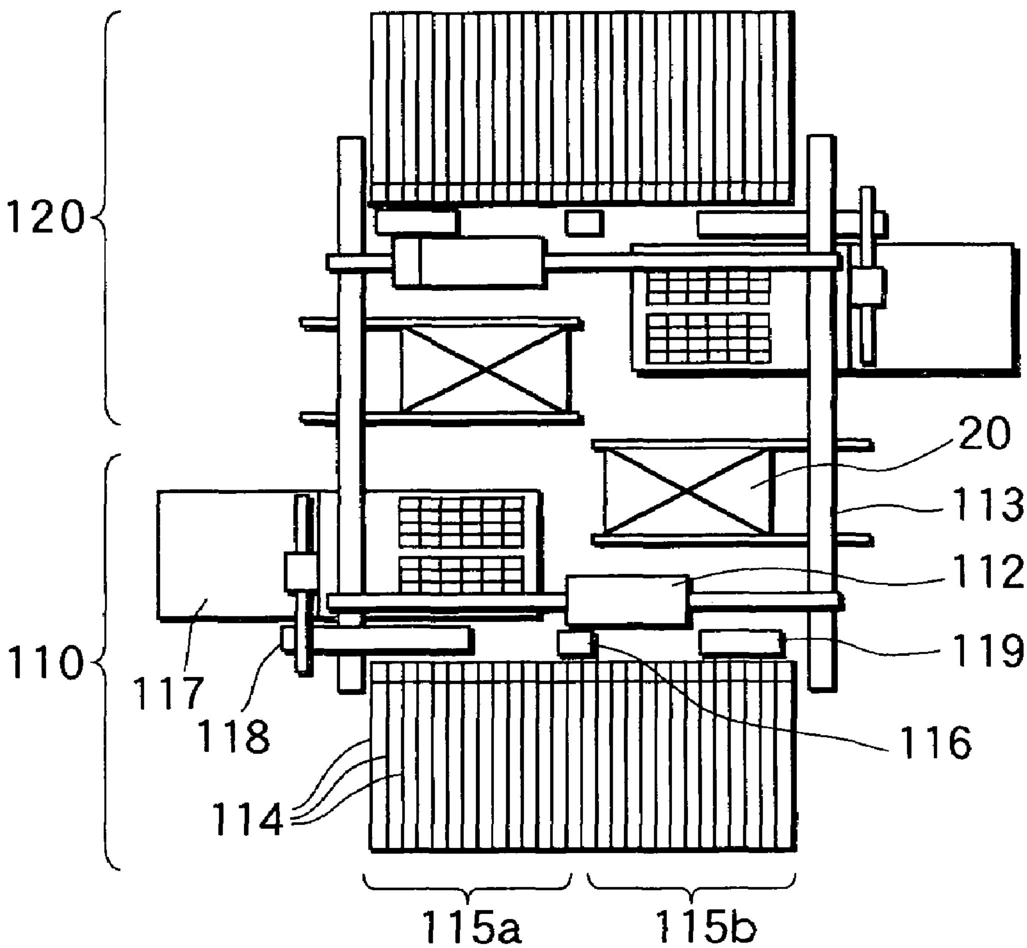
FIG. 2 is an overhead view showing the overall construction of a mounter used in the present component mounting system.

FIG. 2 is an overhead view showing the overall construction of the mounter 100 whose order of component mounting is optimized by the present invention.

A shuttle conveyor 118 is a moving table (a collection conveyor) on which a component taken from the tray supplying unit 117 is placed and which is moved to a predetermined position where the line gang pickup head 112 can pick up components from the shuttle conveyor 118. A nozzle station 119 is a table on which interchangeable nozzles corresponding to various sizes of components are positioned.

The component supplying units 115*a* and 115*b* included in each stage 110 and 120 are provided on the left and right sides of the component recognizing camera 116. The line gang pickup head 112 picks up components from the component supplying unit 115*a* or 115*b*, passes by the component recognizing camera 116, and then repeats an operation whereby the line gang pickup head 112 moves to a mounting point on the circuit board 20 and mounts one of the picked-up components.

In this specification, one iteration of the repeated series of processes where the line gang pickup head 112 picks up, transports, and mounts components and the group of components handled in such iteration are both referred to as a "task". As one example, when the line gang pickup head 112 has ten nozzles, the maximum number of components that can be mounted by a single task is ten. It should also be noted that a "pickup operation" refers to all of the operations performed from when the head starts to pick up components to when the line gang pickup head 112 transports the components. In this specification, a pickup operation refers not only to when ten components are picked up by to the line gang pickup head 112 with a single nozzle stroke (a raising and lowering of the line gang pickup head 112), but also when ten components are picked using several nozzle strokes.

Figure 3:
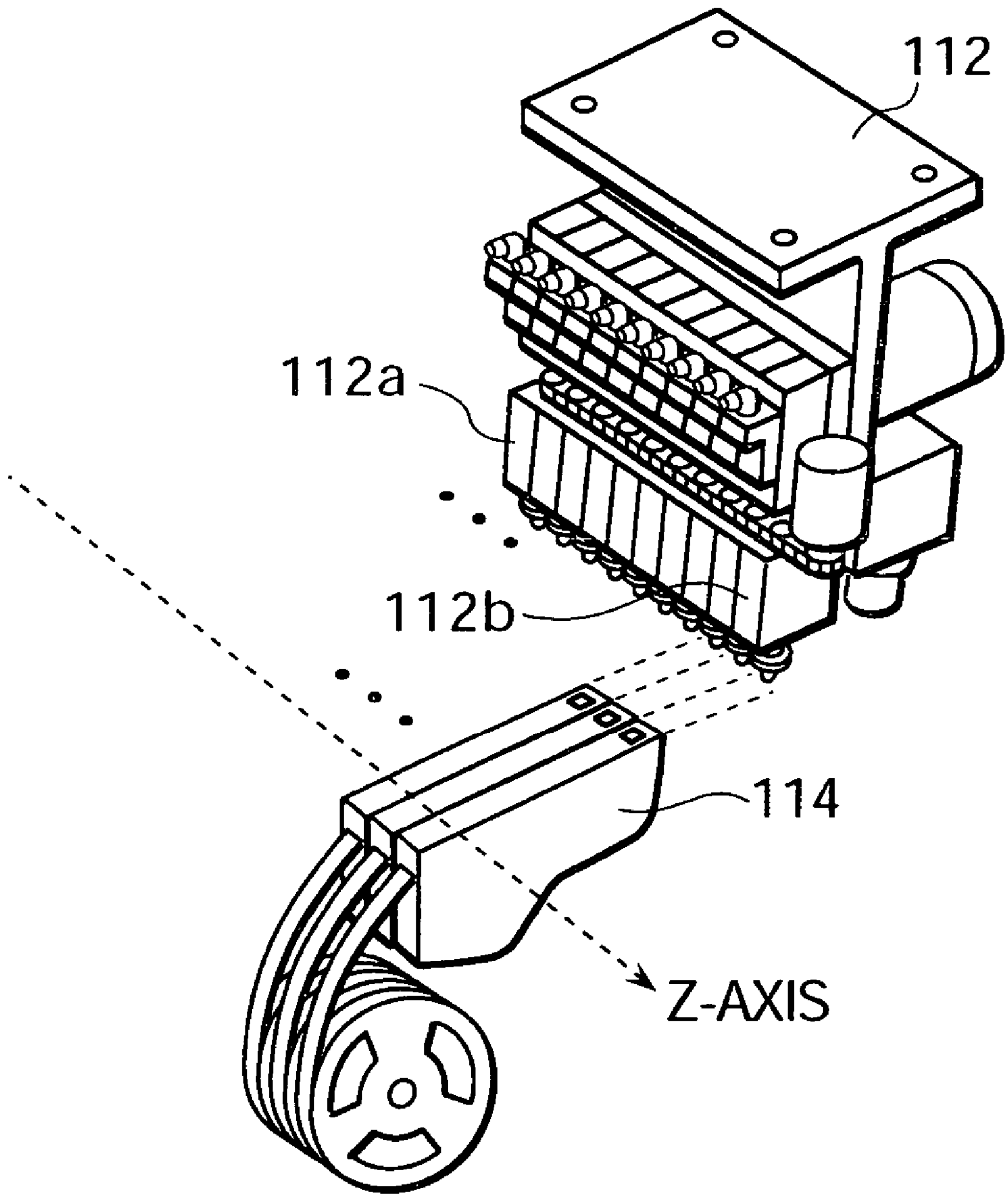
FIG. 3 is a depiction of the positional relationship between the line gang pickup head of a mounter and the component feeders.

FIG. 3 is a depiction of the positional relationship between the line gang pickup head 112 and the component feeders 114. The line gang pickup head 112 uses a method referred to as "gang pickup" and can be equipped with a maximum often pickup nozzles 112*a*–112*b*. When thus equipped, a maximum of ten components can be simultaneously picked up from the component feeders 114 in a single nozzle stroke (one raising and lowering of the line gang pickup head 112).

Note that only one component tape is loaded into a "single cassette" component feeder 114, while two component tapes with the same feed pitch (2 mm or 4 mm) are loaded into a "double cassette" component feeder 114. The position of each component feeder 114 (or component tape) in a component supplying unit 115*a* or 115*b* is indicated using a value in the Z-axis or a position on the Z-axis, with consecutive values being assigned to positions starting with the leftmost position in the component supplying unit 115*a* as position "1". As a result, the determination of mounting order for taped components amounts to the determination of the ordering (i.e., positioning on the Z-axis) of components (or component tapes, or component feeders 114 in which the component tapes have been loaded).

Figures 4A, 4B:
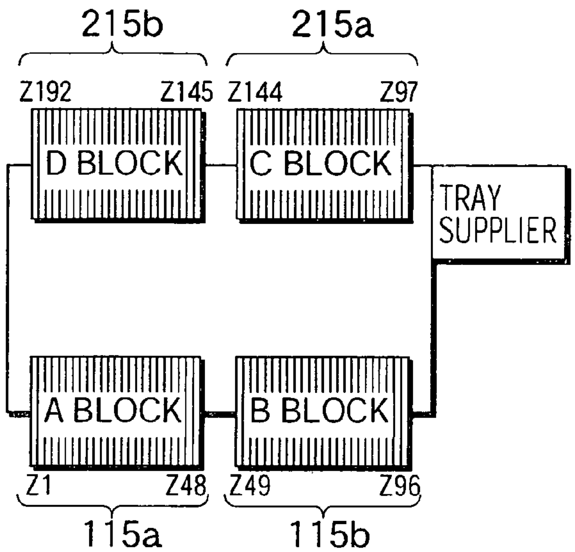
FIG. 4A shows one example of the specific construction of the four component supplying units within the two stages provided in the present mounter.
FIG. 4B is a table showing the number of component feeders and their positions on the Z-axis.

FIG. 4A shows one example of the specific construction of the component supplying units 115*a* and 115*b* and 215*a* and 215*b* within the stages 110 and 120, respectively. FIG. 4B is a table showing the number of component feeders 114 and their positions on the Z-axis.

As shown in FIG. 4A, the component supplying units 115*a*, 115*b*, 215*a*, and 215*b* are each capable of storing a maximum of 48 component tapes, with the positions in these component supplying units being respectively numbered Z1 to Z48, Z49 to Z96, Z97 to Z144, and Z145 to Z192. As shown in FIG. 4B, by using double cassette feeders that can store two 8 mm-wide component tapes, each component supplying unit (A block to D block) can supply a maximum of 48 types of components. The wider the component tapes (component feeders) used in a component supplying unit, the lower the number of feeders that can be loaded into a single block.

Note that in this specification, the leftmost component supplying units 115*a* and 215*a* (Block A and Block C) in each stage are referred to as the "left blocks", while the leftmost rightmost component supplying units 115*b* and 215*b* (Block B and Block D) in each stage are referred to as the "right blocks".

Figures 5A, 5B:
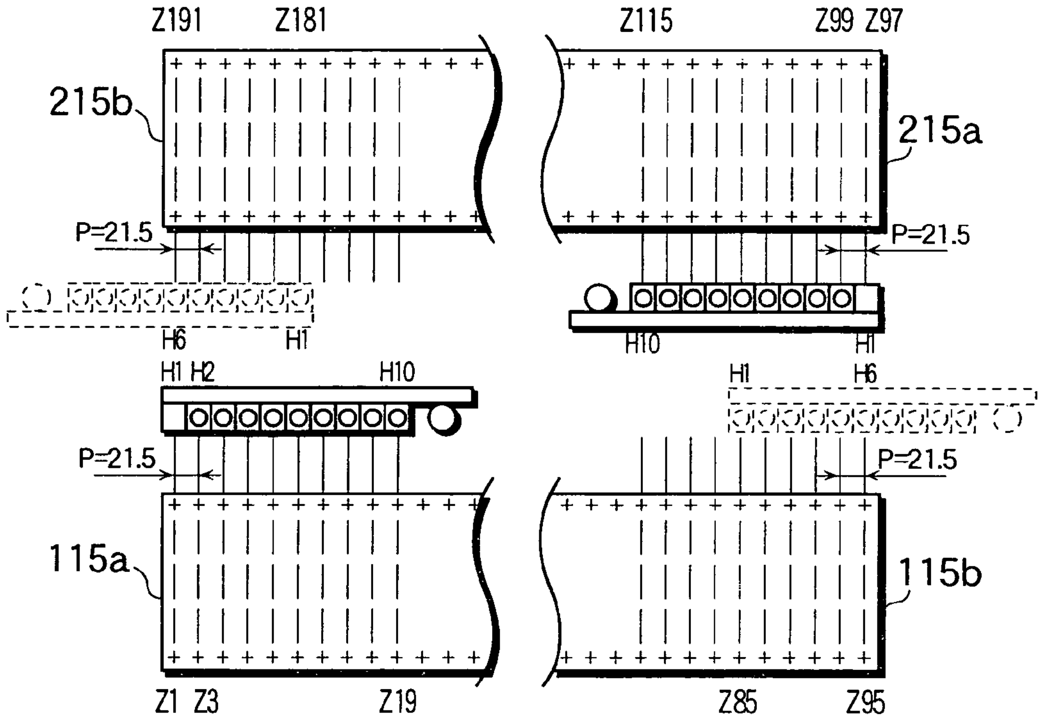
FIGS. 5A and 5B are a drawing and table showing examples of the positions in the Z-axis of component supplying units where components can be picked up by a line gang pickup head with ten nozzles.
Figure 6A:
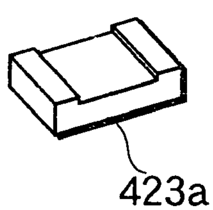
FIGS. 6A to 6D show various chip-shaped electronic components to be mounted.
Figure 6B:
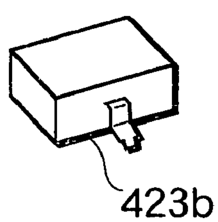
Figure 6C:
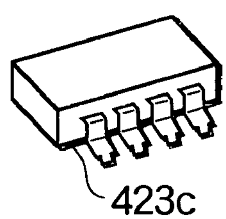
Figure 6D:
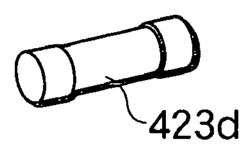

FIGS. 5A and 5B are a drawing and table showing examples of the positions in the Z-axis of component supplying units where components can be picked up by a line gang pickup head with ten nozzles. Note that the values given as H1 to H10 in these drawings represent the positions of the ten nozzle heads.

The intervals between the nozzle heads are equivalent to the width (21.5 mm) of one double-cassette feeder, so that the Z numbers of the components that can be picked up in a single nozzle stroke are two numbers apart (i.e., either all odd or all even). Due to the restrictions on the movement of a line gang pickup head with ten nozzles in the Z-axis, there are cases where certain nozzles are incapable of picking up components positioned near the ends of the component supplying units. Such cases are indicated by the "-" marks in FIG. 5B.

Figure 7:
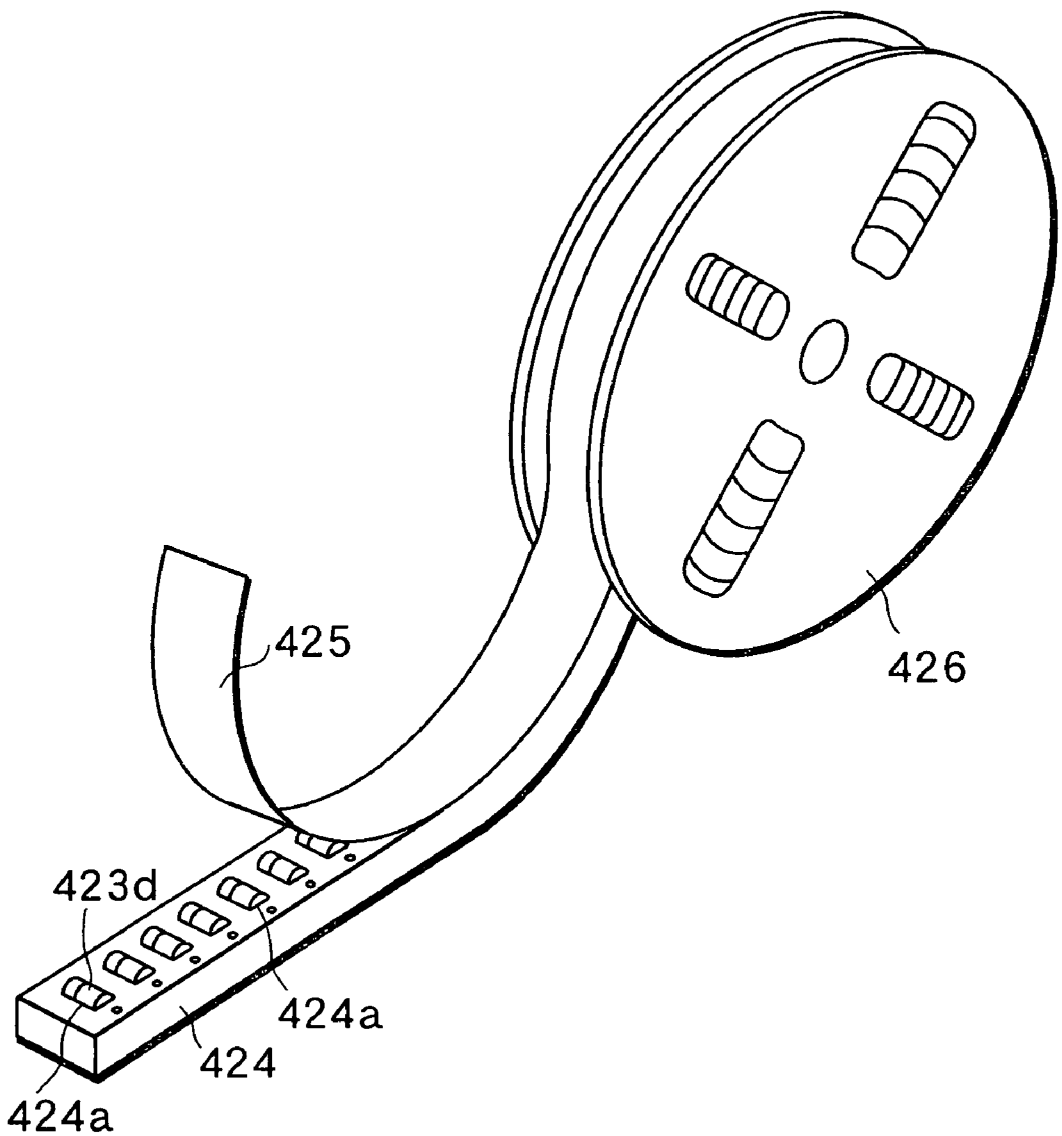
FIG. 7 shows one example of a carrier tape that holds components and the supply reel for this carrier tape.
Figure 8:
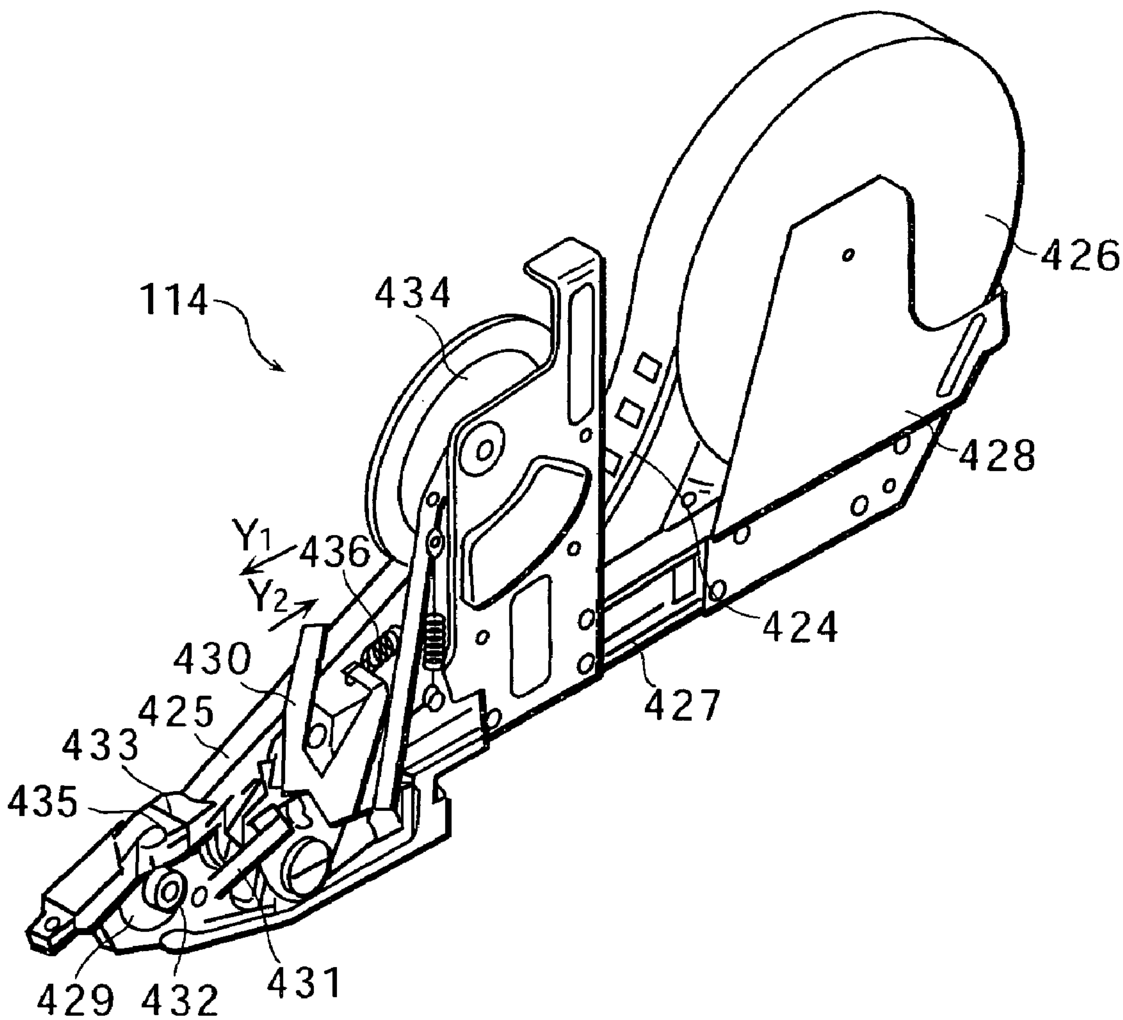
FIG. 8 shows a component feeder in which taped electronic components have been loaded.

The following describes the construction of a component feeder 114 in detail, with reference to FIGS. 6 to 8.

FIGS. 6A to 6D show various chip-shaped electronic components 423*a* to 423*d*. As shown in FIG. 7, components 423*d* are placed into storage spaces 424*a* that are successively formed in a carrier tape 424 and are encapsulated by applying a cover tape 425 over the carrier tape 424. A predetermined length of this carrier tape 424 is wound around the supply reel 426, and the result is supplied to users as a component tape.

Taped components such as electronic component 423*d* are used having first been loaded into a component feeder 114, such as that shown in FIG. 8. In FIG. 8, the supply reel 426 is attached to reel side plates 428 so as to be freely rotatable, with the reel side plates 428 engaging a main frame 427. Carrier tape 424 that has been pulled off the supply reel 426 is guided by a feed roller 429. An automatic electronic component mounting apparatus (not illustrated) in which this electronic component supplying apparatus has been fitted operates as follows. Movement of a feed lever (not illustrated) also fitted in the apparatus causes a feed lever 430 of the electronic component supplying apparatus to move in the direction shown as $Y_1$ in FIG. 8. This movement is transmitted via a link 431 and results in a ratchet 432 rotating by a predetermined angle. The feed roller 429 is disposed so as to move in conjuncture with the ratchet 432, and so moves by a fixed pitch, such as a feed pitch of 2 mm or 4 mm.

The cover tape 425 is peeled off by a cover tape separating unit 433 that is positioned before the feed roller 429 (towards the supply reel 426). The separated cover tape 425 is wound around a cover tape collecting reel 434 and the carrier tape 424 from which the cover tape 425 has been removed is transported to the electronic component removing unit 435. At the same time as the carrier tape 424 is fed by the feed roller 429, the electronic component removing unit 435 opens in conjunction with the movement of the ratchet 432, and a vacuum suction head (not illustrated) picks up a chip-shaped electronic component 423*d* using suction, thereby removing it from a storage space 424*a*. After this, the pressing force applied by the feed lever of the apparatus is removed and the force applied by a tension spring 436 causes the feed lever 430 to move in the direction shown as $Y_2$ in FIG. 8. As a result, the feed lever 430 returns to its original position.

The above series of operations is repeated and the spent carrier tape 424 is discharged to the outside of the electronic component supplying apparatus. A cutter (not illustrated) operates in conjunction with the operation of the electronic component supplying apparatus and cuts the spent tape into small pieces for disposal.

It should be noted that when a component feeder 114 is a double cassette-type that can store two carrier tapes 424, it is assumed that it is only possible to supply the two carrier tapes 424 with the same feed pitch.

The characteristic operations of the mounter 100 are as follows.

(1) Nozzle Interchanging

When a nozzle that is required for the next mounting operation is not present on the line gang pickup head 112, the line gang pickup head 112 is moved to the nozzle station 119 where nozzle interchanging is performed. The types of nozzles available depend on the sizes of the components to be picked up by the line gang pickup head 112. As one example, "type S", "type M", and "type L" nozzles may be provided.

(2) Component Pickup

The line gang pickup head 112 moves to the component supplying units 115*a* and 115*b* and picks up electronic components using suction. When ten components cannot be simultaneously picked up, the line gang pickup head 112 may be repositioned and may make several nozzle strokes to pick up a maximum of ten electronic components.

(3) Recognition Scan

The line gang pickup head 112 moves past the component recognizing camera 116 at a predetermined speed. The component recognizing camera 116 forms images of all of the electronic components that have been picked up by the line gang pickup head 112 and detects whether the components have been picked up at the correct positions.

(4) Component Mounting

Electronic components are successively mounted on the circuit board 20.

The above operations (1) to (4) are repeated, thereby mounting all of the required electronic components onto the circuit board 20. The operations (2) to (4) form the main operation of the mounter 100 when mounting components and correspond to a "task". This means that a maximum of ten electronic components can be mounted on a substrate in a single task.

1.2 Restrictions for the Mounter

The object when optimizing the order of mounting for components is to maximize the number of substrates that can be processed by the mounter 100 per unit time. As can be understood from the functional and operational characteristics of the mounter 100 that are mentioned above, a favorable optimization method (optimization algorithm) is one that selects ten electronic components that can be efficiently mounted onto a substrate, simultaneously picks up all ten from a component supplying unit, and then successively mounts the electronic components using the shortest possible route. The order of component mounting determined by such an optimization algorithm will ideally result in ten times the productivity of the case where a mounter is only equipped with one nozzle.

However, due to factors such as device construction, cost, and operability, every mounter is subject to certain restrictions regarding the order in which components can be mounted. More realistically, the optimization of the order of component mounting is therefore the maximization of the number of substrates that can be processed by the mounter per unit time, subject to various restrictions.

The following describes the main restrictions to which the mounter 100 is subject. Note that these restrictions are also described in detail later in this specification where separate optimization algorithms are being discussed.

1.2.1 Line Gang Pickup Head

The line gang pickup head 112 has ten mounting heads that can independently pick up and mount electronic components arranged in a line. A maximum of ten pickup nozzles can be attached, so that a maximum of ten components can be picked up in a single nozzle stroke by the line gang pickup head 112.

Each of the heads (a part capable of picking up one component) that compose the line gang pickup head 112 is referred to in this specification as a "mounting head" or simply as a "head".

The ten mounting heads that form the line gang pickup head 112 are arranged in a straight line, which places a restriction on the movable range of the line gang pickup head 112, both when picking up components and when mounting components. In more detail, as shown in FIG. 5B, there are restrictions as to which mounting heads are able to access components that are located at either end of a component supplying unit (which is to say, near the left end of the left component supplying unit 115*a* and near the right end of the right component supplying unit 115*b*).

When mounting electronic components onto a substrate, there are also restrictions on the movable range of the line gang pickup head 112. Such restrictions arise, for example, when mounting components on a "LL" or "XL" substrate (described later) that are longer or wider than a normal substrate.

1.2.2 Component Recognizing Camera

As the component recognizing camera 116, the mounter 100 is equipped with a 2D camera that forms two-dimensional images and a 3D camera that can also detect height. As the 2D camera, a 2DS camera and 2DL camera are provided for use, depending on the size of the area to be photographed. The 2DS camera is capable of photographing a small area at high speed, and is characterized by having maximum field of 60 mm by 220 mm. The 3D camera is used to detect in three dimensions whether any of the leads of an IC component are bent.

The recognition scanning speed used when photographing electronic components differs depending on the camera being used. When components that are photographed by the 2DS camera and components that are photographed by the 3D camera are present in the same task, recognition scanning needs to be performed at the scanning speed of each camera, making two scanning operations necessary.

1.2.3 Component Supplying Units

Electronic components may be packaged in the form of a component tape, where components are held by a tape, or in the form of a tray in the form of a plate whose area is partitioned in keeping with the dimensions of components.

The supply of taped components is performed by the component supplying units 115*a* and 115*b*, while the supply of tray components is performed by the tray supplying unit 117.

The taping of electronic components is standardized, and tapes with widths of 8 mm to 72 mm are available for different-sized components. By setting components that are held by a tape (or in other words, a "component tape") in a component feeder (a "tape feeder unit") with a suitable width for the tape width, electronic components can be reliably and consecutively obtained from the tape.

The component supplying units in which component feeders are set are designed so that component tapes with a width of up to 12 mm can be loaded with no gaps at a pitch of 21.5 mm. When the width of the tape is 16 mm or above, tapes need to be set leaving an appropriate gap that depends on the width of the tape. In order to pick up a plurality of electronic components simultaneously (i.e., in a single nozzle stroke for the line gang pickup head 112), the mounting heads and component feeders should be aligned with the same pitch. When each component is supplied using a tape that is 12 mm wide or narrower, ten components can be simultaneously picked up by the line gang pickup head 112.

Note that the two component supplying units (the left block 115*a* and right block 115*b*) that compose each component supplying unit are each capable of holding a maximum of 48 tapes that are 12 mm wide or narrower.

1.2.4 Component Feeders

Component feeders can be single-cassette feeders that only hold one component tape or double-cassette feeders that hold a maximum of two cassettes. The two component tapes that are placed in the same double-cassette feeder need to have the same feed pitch (2 mm or 4 mm).

1.2.5 Other Restrictions

In addition to the above restrictions that arise due to the construction of the mounter 100, the mounter 100 is also subject to the following operation restrictions that arise due to the production facility in which the mounter 100 is being used.

(1) Fixed Arrangements

As one example, in order to reduce the amount of labor required to replace component tapes, there are cases where a particular component tape (or the component feeder that holds this component tape) is set at a fixed position (a position on the Z-axis) within a component supplying unit.

(2) Restrictions on Resources

There are cases where the number of component tapes that are provided for the same type of components, the number of feeders used to hold component tapes, the number of double-cassette feeders, and the number of nozzles (of each type) are subject to certain restrictions.

1.3 Optimization Apparatus

When informed of the article to be produced (the substrate and the components to be mounted upon it) and the production machinery (the mounters and stages with their limited resources), the optimization apparatus 300 determines the order of component mounting that enables the finished substrate to be produced in the shortest possible time to raise the number of substrates that can be produced per unit time.

In more detail, in order to minimize the amount of time spent mounting components on each substrate, a computer decides at what positions in what mounter (stage) the component feeders loaded with component tapes should be set, in what order the line gang pickup head of each mounter (stage) should pick up the highest possible numbers of components as possible from the component feeders, and in what order and at which positions (mounting points) the picked-up components should be mounted on a substrate. The computer makes this decision by finding an optimal solution.

When doing so, the optimization apparatus needs to satisfy the aforementioned restrictions present with the mounters (stages) being used.

1.3.1 Hardware Construction of the Optimization Apparatus

The optimization apparatus 300 is realized by having a standard computer system such as a personal computer execute an optimization program embodying the present invention. When not connected to an actual mounter 100, the optimization apparatus 300 can also function as a stand-alone simulator (an optimization tool for the order of component mounting).

Figure 9:
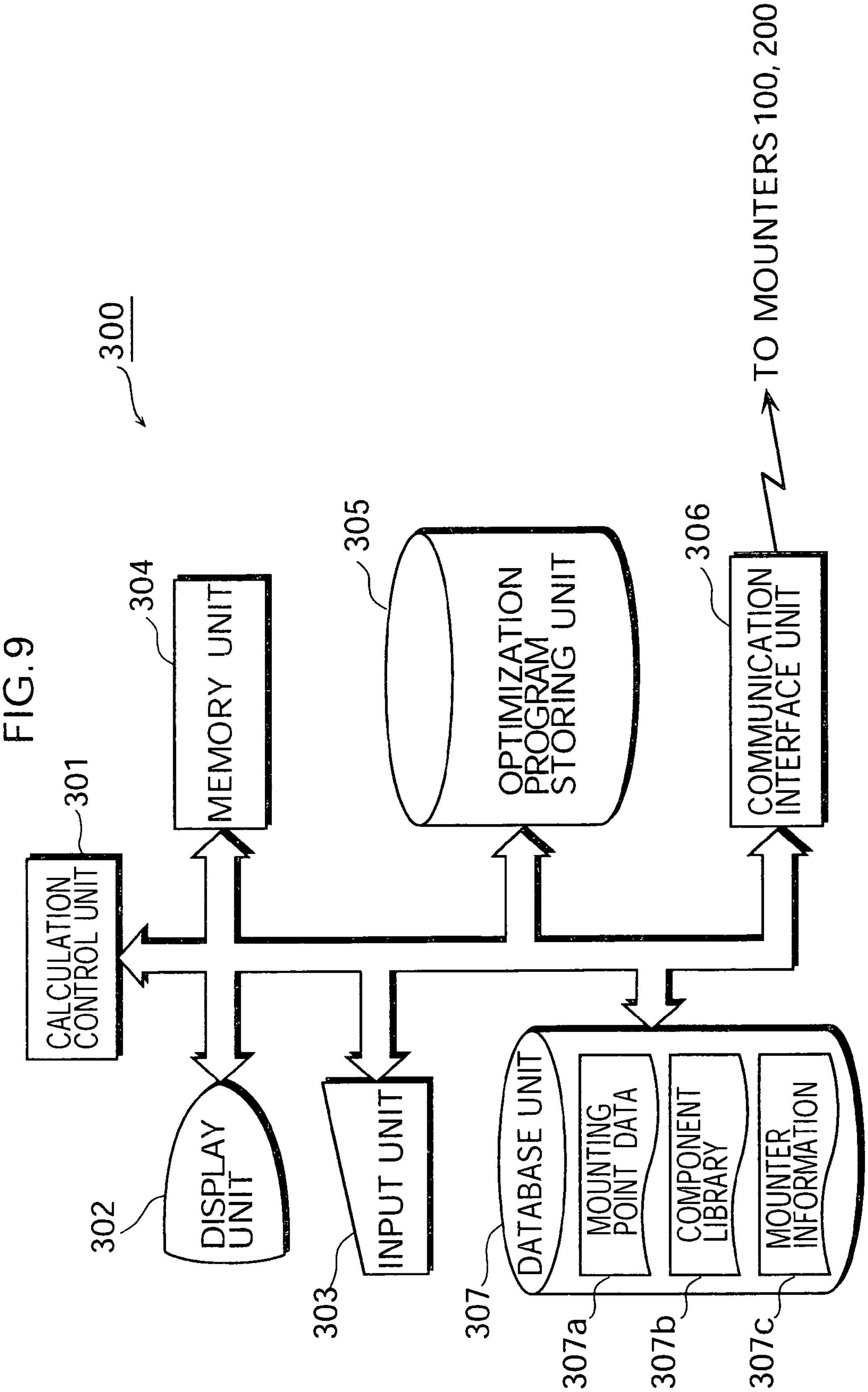
FIG. 9 is a block diagram showing the hardware construction of an optimization apparatus.

FIG. 9 is a block diagram showing the hardware construction of the optimization apparatus 300 that was shown in FIG. 1. In order to minimize the line tact time (the highest tact time out of the individual tact times of the stages forming the production line) for the mounting of components on a substrate, the optimization apparatus 300 determines which components should be mounted by each stage and the mounting order of components for each stage, based on information for all of the components that is provided by a component mounting CAD (Computer-Aided Design) apparatus or the like. By doing so, the optimization apparatus 300 produces optimal NC data. As shown in FIG. 9, the optimization apparatus 300 includes a calculation control unit 301, a display unit 302, an input unit 303, a memory unit 304, an optimization program storing unit 305, a communication interface unit 306, and a database unit 307.

It should be noted that in this specification, the expression "tact time" refers to the total time required to mount components.

The calculation control unit 301 is a CPU (Central Processing Unit), a numeric processor, or the like. In accordance with instructions from the user, the calculation control unit 301 loads the required programs from the optimization program storing unit 305 into the memory unit 304 and executes them. In accordance with the execution result, the calculation control unit 301 controls the components numbered 302 to 307.

The display unit 302 is a CRT (Cathode Ray Tube), a LCD (Liquid Crystal Display), or the like, while the input unit 303 is an input device such as a keyboard or a mouse. These components are controlled by the calculation control unit 301 and are used to allow user interaction with the optimization apparatus 300. A specific user interface is described later using examples of screen displays.

The communication interface unit 306 is a LAN (Local Area Network) adapter or the like, and is used to allow the optimization apparatus 300 to communicate with the mounters 100 and 200.

The memory unit 304 is a RAM (Random Access Memory) or the like that provides a work area for the calculation control unit 301. The optimization program storing unit 305 is a hard disk drive or the like storing a variety of optimization programs that realize the functions of the optimization apparatus 300.

The database unit 307 is a hard disk drive or the like storing input data (mounting point data 307*a*, a component library 307*b*, and mounter information 307*c*) that is used in the optimization process performed by the optimization apparatus 300 and mounting point data and other data generated by the optimization process.

FIGS. 10 to 12 show examples of the mounting point data 307*a*, the component library 307*b*, and the mounter information 307*c*, respectively.

The mounting point data 307*a* is a collection of information showing the mounting points of all of the components to be mounted. As shown in FIG. 10, one mounting point pi is made up of a component type ci, an X coordinate xi, a Y coordinate yi, and control data fi. In the present case, the expression "component type" refers to the name of a component in the component library 307*b* shown in FIG. 11, the "X coordinate" and "Y coordinate" are the coordinates of the mounting point (coordinates that indicate a specific position on a substrate), and "control data" is control information (such as the type of pickup nozzle that can be used and the maximum speed at which the line gang pickup head 112 should move) relating to the mounting of the component. It should be noted that the "NC data" that is to be finally produced is an ordered list of mounting points that results in the shortest line tact time.

The component library 307*b* is a library in which specific information for the various component types that can be handled by the mounters 100 and 200 is gathered together As shown in FIG. 11, each entry in the component library 307*b* includes the component size, tact time (tact time for each component type subject to certain conditions), and other restriction information (such as the type of pickup nozzle that can be used, the recognition method to be used by the component recognizing camera 116, and the maximum speed at which the line gang pickup head 112 should move). It should be noted that in FIG. 11, the external appearance of components of various types have also been shown for reference purposes.

The mounter information 307*c* is information showing the constructions of each of the stages forming the production line and the restrictions to which these stages are subject. As shown in FIG. 12, the mounter information 307*c* is made up of information such as head information relating to the type of line gang pickup head, nozzle information relating to the types of nozzles that can be attached to the line gang pickup head, feeder information relating to the maximum number of component feeders 114, and tray information relating to the number of levels on which trays are stored in the tray supplying unit 117.

The information described above is categorized as follows. The categories used are equipment option data (for each stage), resource data (the number of feeders that can be fitted in each stage and the number of nozzles in each stage), nozzle station arrangement data (for each station equipped with a nozzle station), initial nozzle pattern data (for each stage), and Z-axis arrangement data (for each stage). It is assumed that at least 10 nozzles of each type, such as SX, SA, and S, are available as resources.

1.3.2 Software Construction of the Optimization Apparatus

One characteristic of the optimization programs stored in the optimization program storing unit 305 is that electronic components are classified into "small components" and "general components" and that different optimization algorithms are used for each of these classifications.

Up to a thousand or so electronic components may be mounted onto a single substrate, though around 90% of these are chip components with sides that are 3.3 $mm^2$ or smaller Hereafter, such components are referred to as "small components". Small components include resistors and capacitors, with component sizes being limited to certain sizes. All taped components are held in tapes that are 8 mm wide, with a maximum of ten components being simultaneously picked up. As one example, all small components should fulfill the following requirements.

Component area is 3.3 $mm^2$ or smaller.

The height of components is 4.0 mm or less.

Components can be photographed using the 2DS component recognizing camera.

The component tape holding the components is 8 mm wide.

The remaining 10% of components are irregularly shaped components such as connectors and ICs. Hereafter, large components that do not fulfill the requirements for small components are referred to as "general components". Since some of these components are supplied via trays or require special nozzles, these components have many parameters that need to be considered during optimization.

As a result, the algorithm used for small components has the objects of generating the highest number of tasks that simultaneously pick up ten components and of executing the optimization process at high speed. On the other hand, to raise the optimization level, a highly flexible algorithm is used for general components, which works out the optimal mounting order while switching between states (possible mounting orders) with the mounting time of each task as an evaluation function.

Figure 13:
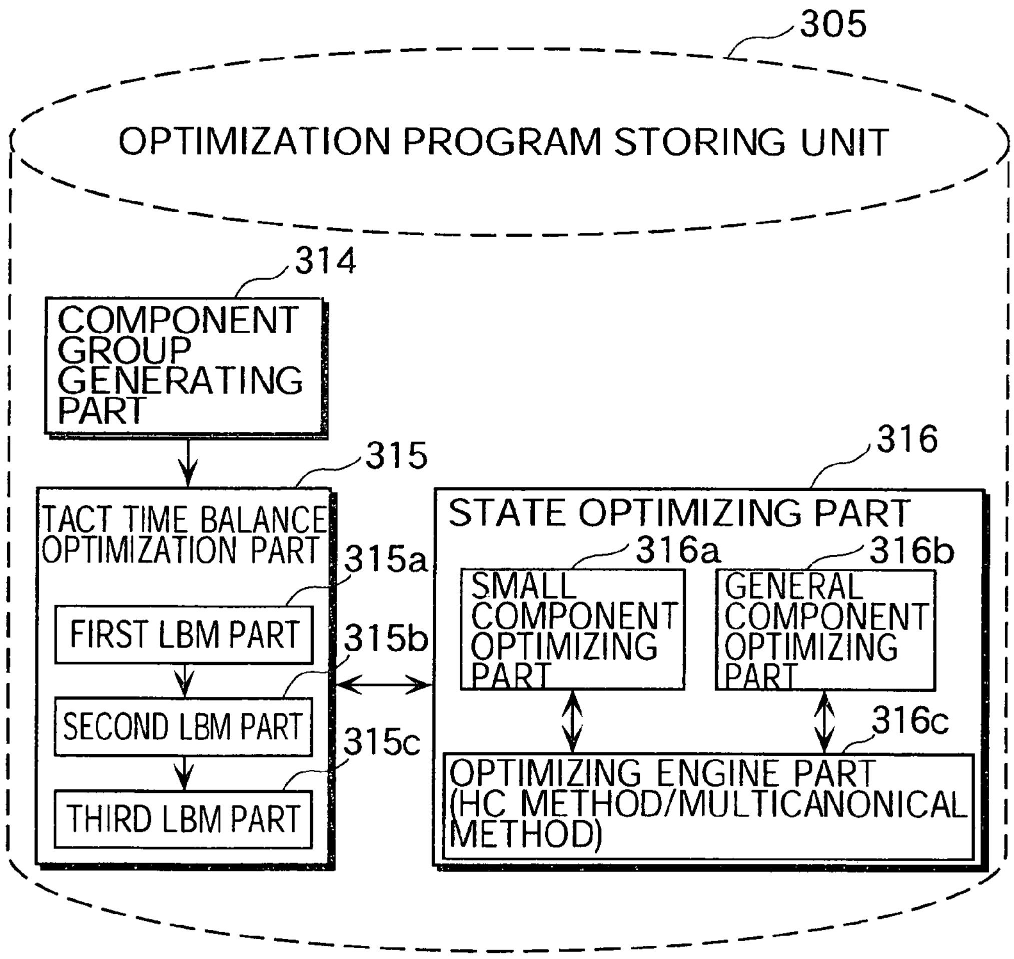
FIG. 13 is a functional block diagram showing the construction of the optimization apparatus.

FIG. 13 is a functional block diagram showing the optimization program stored in the optimization program storing unit 305 shown in FIG. 9. The structure of this optimization program can be roughly classified into a component group generating part 314, a tact time balance optimization part 315, and a state optimizing part 316. It should be noted that though not illustrated, the optimization program also includes a GUI (Graphical User Interface) to allow user interaction.

The component group generating part 314 sorts all of the components to be mounted as specified by the mounting point data 307*a* stored in the database unit 307 into a number of component groups (for example, nine groups) depending on component thickness. In more detail, by referring to all of the component types shown in the mounting point data 307*a*, the component group generating part 314 generates a component table showing the number of components to be mounted for each component type, before referring to the component sizes given in the component library 307*b* and associating each component type with one of a plurality of component groups. After this, the component group generating part 314 informs the tact time balance optimization part 315 of the result of this classification (the component types and number of components belonging to each component group).

Based on the information on the component groups received from the component group generating part 314, the tact time balance optimization part 315 optimizes the tact time balance (or in other words, evens out the tact time for each stage) so as to minimize the tact time, while ensuring that components are mounted in order starting from component groups where component thickness is low. To do so, the tact time balance optimization part 315 has three functional modules (namely, a first LBM part 315*a*, a second LBM part 315*b*, and a third LBM part 315*c*) that operate in conjunction with the state optimizing part 316.

It should be noted that the reason that components are mounted with preference to components in component groups where component thickness is low is that this allows for smooth movement of the line gang pickup head 112 when mounting components on a substrate, and increases the quality of the mounting.

The first LBM part 315*a* performs a rough allocation of the plurality of component groups indicated by the component group generating part 314 in task groups so that the tact time of each stage is approximately equal. In other words, the first LBM part 315*a* optimizes the tact time balance by performing a rough adjustment. Here, the expression "task group" refers to a collection of tasks, and matches the range of the component groups for which optimization may be performed by rearranging the order of mounting of components.

The second LBM part 315*b* minimizes the line tact time by moving the task groups for each stage, which were allocated by the first LBM part 315*a*, between stages. In other words, the second LBM part 315*b* optimizes the tact time balance by performing a fine adjustment.

The third LBM part 315*c* optimizes the tact time balance in the same way as the second LBM part 315*b* for individual component types (component tapes) within the state (i.e., the allocation of task groups) that has been optimized by the second LBM part 315*b*.

The state optimizing part 316 determines, for each of the plurality of component groups generated by the component group generating part 314, which component groups should compose each task group and the optimized state (the value on the Z-axis of each component tape, the order of mounting for the components (mounting points) in each component tape) for each of the resulting task groups. The state optimizing part 316 is composed of a small component optimizing part 316*a*, a general component optimizing part 316*b*, and an optimizing engine part 316*c*. The small component optimizing part 316*a* performs optimization for small components (components belonging to five of the nine component groups, for example). The general component optimizing part 316*b* performs optimization for general components (components belonging to the remaining four of the nine component groups, for example). The optimizing engine part 316*c* performs computation that is common to the optimization performed by the small component optimizing part 316*a* and the general component optimizing part 316*b*. It should be noted that the expression "state" here refers to one order of mounting that can be potentially used for components or component types (component tapes).

It should be noted that the small component optimizing part 316*a* determines the task groups and optimizes a state using a simple algorithm that is suited to high-speed operation, while the general component optimizing part 316*b* optimizes a state using a complex, intelligent algorithm. This is because in most cases, the total number of small components to be mounted on the substrate used in a mobile phone or the like is much larger than the number of general components (a ratio of 9:1, for example). The overall result of using separate algorithms for the two types of components is that a more optimal solution can be found in a shorter time.

Based on the parameters provided by the small component optimizing part 316*a* and the general component optimizing part 316*b*, the optimizing engine part 316*c* executes optimization processing using a heuristic but fixed algorithm (a "hill-climbing method") and optimization processing using an algorithm (a "multicanonical simulation") that is probability-based but finds a globally optimal solution.

Figure 14:
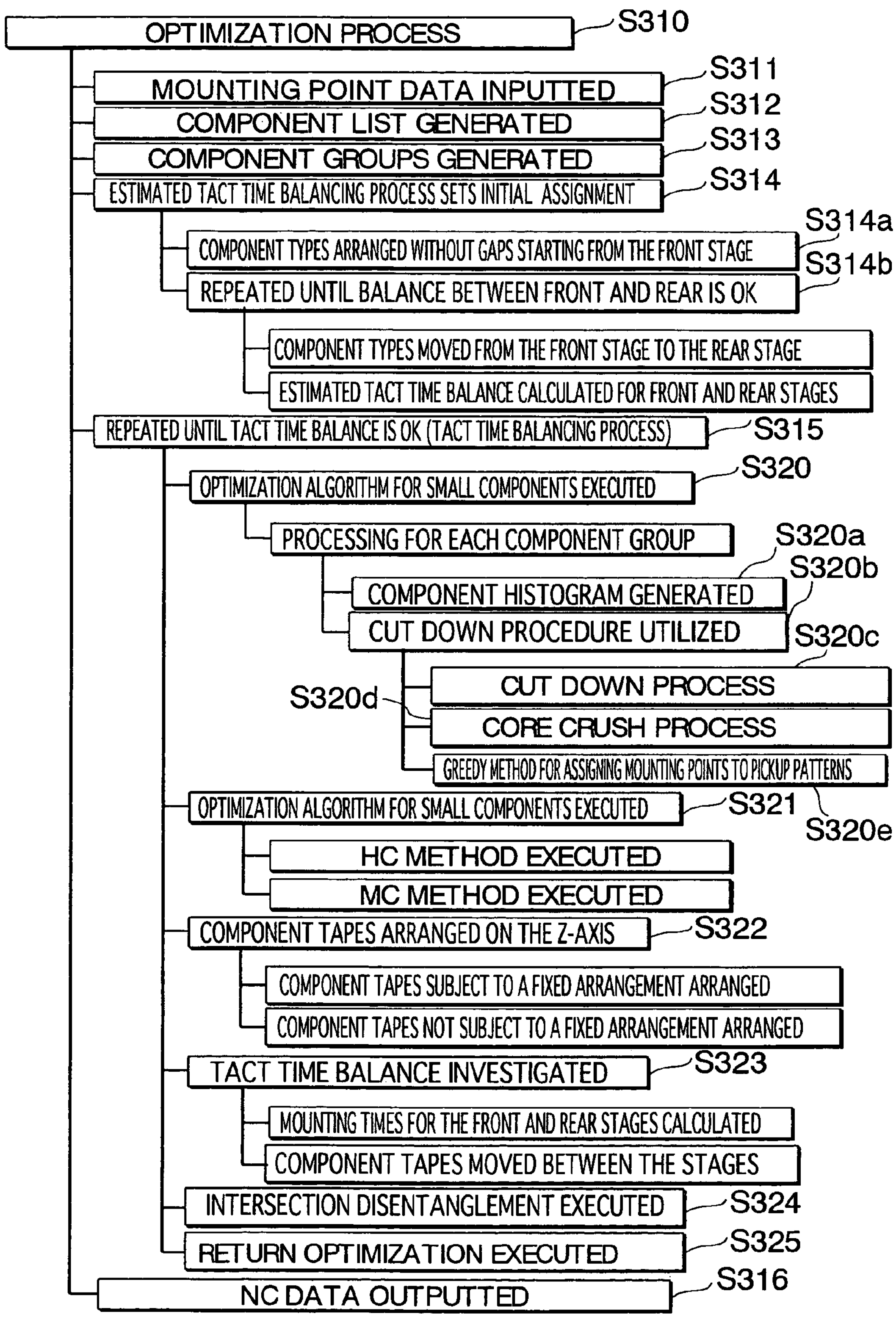
FIG. 14 shows the functional modules that compose the optimization program shown in FIG. 9.

FIG. 14 is a simplified flowchart showing the processing flow when the calculation control unit 301 executes the optimization program stored in the optimization program storing unit 305 shown in FIG. 9. This drawing shows the representative processes performed by the functional blocks shown in FIG. 13, and is therefore a flowchart for the main processing performed by the optimization apparatus 300.

The program is fundamentally executed in order from the upper steps (processes shown in rectangular boxes) to the lower steps. Note that in FIG. 14, a hierarchical display method is used where processes on upper levels are realized by processes (or the repetition of processes) shown on lower levels.

As shown in FIG. 14, the entire optimization process S310 is composed of six main steps S311 to S316.

(1) Loading of the Mounting Point Data (S311)

First all of the mounting point data 307*a* is loaded into the memory unit 304 from the database unit 307. Related data (the component library 307*b*, the mounter information 307*c*) is also loaded as necessary.

(2) Generation of the Component List (S312)

Information on the components to be mounted (the component library 307*b*) is linked to the mounting point data 307*a*, so that by loading all of the mounting point data 307*a*, it is possible to generate a component list that shows how many components are mounted for each component type.

(3) Generation of Component Groups (S313)

Next, component groups are generated from the component list. Here, the expression "component groups" refers to a classification of the components in the component list based on size, with the classifications of "small components" and "general components" being used. As one example, small components may be further classified into the following three component groups.

| |
|---|
| G1: components that are 0.6 mm by 0.3 mm |
| G2: components that are 1.0 mm by 0.5 mm |
| G3: components that are 1.6 mm by 0.8 mm or larger |

(4) Initial Allocation to Front And Rear Stages (S314)

A standard mounting time for each electronic component is determined, and component types (component tapes) are allocated to the front and rear stages 110 and 120 so as to even out the total standard mounting time for all of the components allocated to each stage. It should be noted that once components have been allocated to either the front or rear stages 110 or 120, component tapes are allocated to either the left or right block in units of component groups or the like.

(5) Tact Time Balancing Process (S315)

The optimization process for small components and the optimization process for general components are successively performed (S320, S321). After this, component tapes are assigned to the component supplying units 115*a* and 115*b* having considered any fixed arrangements for components (S322). Next, the total mounting times for the front and rear stages 110 and 120 are calculated, and if the balance between the stages is poor, components are moved between the front and rear stages 110 and 120 (S323) and the optimization processes for small components and general components are repeated. Also, optimization that considers the locations of mounting points (the positions on the substrate at which components are to be mounted), which is to say, optimization through intersection disentanglement (described later) (S324) and optimization through return optimization (S325) are performed.

It should be noted that the flowchart in FIG. 14 shows the procedure used when the optimization for small components (in step S320) is performed by a cut down procedure, a representative method selected from a plurality of possible methods.

(6) Output of Optimization Results (S316)

The following data is outputted once all of the processes described above have been completed.

An order of mounting for electronic components and task composition

Layout of the component supplying units 115*a* and 115*b* (arrangement of component tapes)

State of resource usage for feeders, nozzles, etc.

Estimated mounting time for each of the front and rear stages 110 and 120.

The steps described above correspond to the functional blocks shown in FIG. 13 as follows. Steps S311 to S313 are mainly performed by the component group generating part 314, while step S314 is mainly performed by the first LBM part 315*a* and the second LBM part 315*b* of the tact time balance optimization part 315. Step S315 is mainly performed by the third LBM part 315*c* of the tact time balance optimization part 315 and the state optimizing part 316, while step S316 is mainly performed by the tact time balance optimization part 315 and a user interface part that is not illustrated.

The processing performed in these steps is explained in detail in the "Operation of the Optimization Apparatus (Overview)", "Operation of the Optimization Apparatus (Details)" and "Operation of the Optimization Apparatus (Application)" sections that appear later in this specification.

It should be noted that in the abbreviation "HC method" given in the drawings refers to the "hill-climbing method", which is a heuristic but fixed algorithm that finds an optimal solution, while the abbreviation "MC method" refers to a "multicanonical simulation" that is probability-based algorithm that finds a globally optimal solution.

In more detail, the optimization of an order of component mounting is a process that finds a mounting order, out of a finite number of possible mounting orders, that satisfies certain conditions (the "restrictions" mentioned above) and results in the shortest mounting time.

The hill-climbing method ("HC method") refers to problem solving method that finds a local solution. First, a potential solution that satisfies the required conditions is selected, this is then subject to a predetermined way of modification (in this example, changing the mounting order), and the modified form is then adopted provided the conditions are satisfied and an improvement (in the present example, a reduction in mounting time) is observed. This processing is repeated until modifications do not result in further improvements.

The multicanonical method ("MC method") refers to problem solving method that finds a global solution. First, a potential solution that satisfies the required conditions is selected, this is then subject to a variety of unbiased modifications while continuing to observe the conditions. The probability for further improvements (decreases in entropy) is evaluated for each kind of modification and the modification with the highest probability for improvement is used. This procedure is repeated until modifications do not result in further improvements.

Note that the hill-climbing method and multi-canonical method both make a provisional modification to a previous solution in a greedy manner and adopt the modified solution if the conditions are still satisfied and there is an improvement over the previous solution. In this sense, both methods are ways of implementing the "greedy method" referred to in this specification.

The optimization apparatus 300 optimizes the order of component mounting through computation performed by a computer based on dedicated software. This means that in this specification, the "movement" of objects, such as components, tasks, task groups, component feeders, and component tapes, by the optimization apparatus refers to a rewriting of the data, such as the data showing this mounting order of components, stored in a storage apparatus such as a memory or a hard disk drive.

2 Operation of the Optimization Apparatus (Overview)

The following describes the fundamental operation of the optimization apparatus 300 in the mounting system 10 constructed as described above.

2.1 Generation of Component Groups

The component group generating part 314 classifies all of the components to be mounted, as specified by the mounting point data 307*a* stored in the database unit 307, into the nine component groups G[1] to G[9] shown in FIG. 15A based on the thicknesses of the components. This process corresponds to step S313 shown in FIG. 14.

In more detail, the component group generating part 314 refers to all of the component types shown in the mounting point data 307*a* and generates a component table, such as that shown in FIG. 15B, that shows how many components are to be mounted for each component type. By referring to the components sizes given in the component library 307*b*, the component group generating part 314 then associates each component type with one of the nine component groups G[1] to G[9]. The component group generating part 314 then informs the tact time balance optimization part 315 of the result of this classification (which is to say, which component types belong to each component group, and the number of components in each group).

2.2 Tact Time Balancing Process

Figure 16:
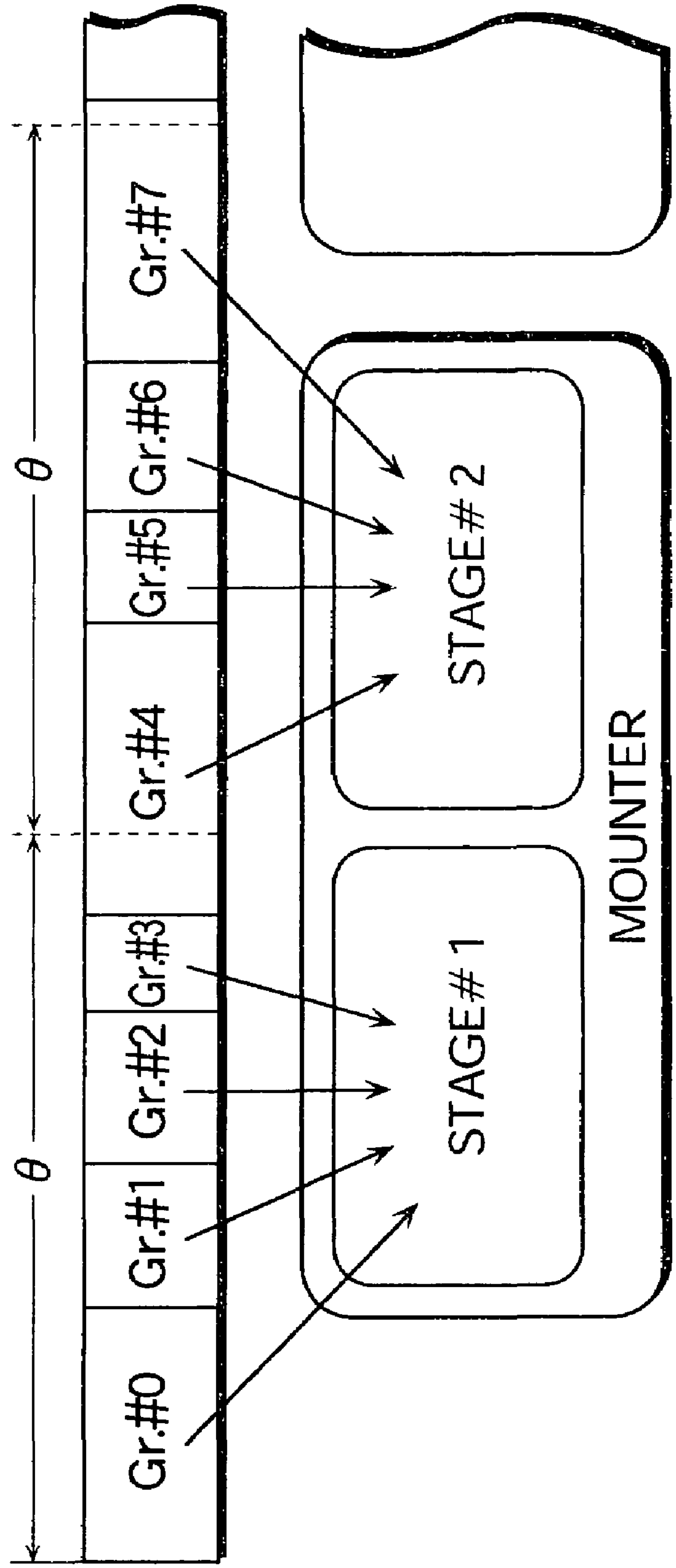
FIG. 16 shows the processing whereby the first LBM part 315*a* of the tact time balance optimization part allocates task groups to stages.

FIG. 16 shows the processing whereby the first LBM part 315*a* of the tact time balance optimization part 315 allocates task groups to stages. This process corresponds to step S314*a* shown in FIG. 14.

The first LBM part 315*a* lists all of the task groups in order with component groups containing thin components at the front, before allocating task groups in order from the front of this list to stages starting from the upstream stages, in a manner that makes the tact time of each stage as close as possible to the value θ given in the equation below.

$$\theta = (\text{total tact time for all component groups})/\text{total number of stages } N$$

It should be noted that the total tact time for all component groups is found by referring to the mounting point data 307*a* and the component library 307*b*, while the total number of stages N is found by referring to the mounter information 307*c*.

Figure 17:
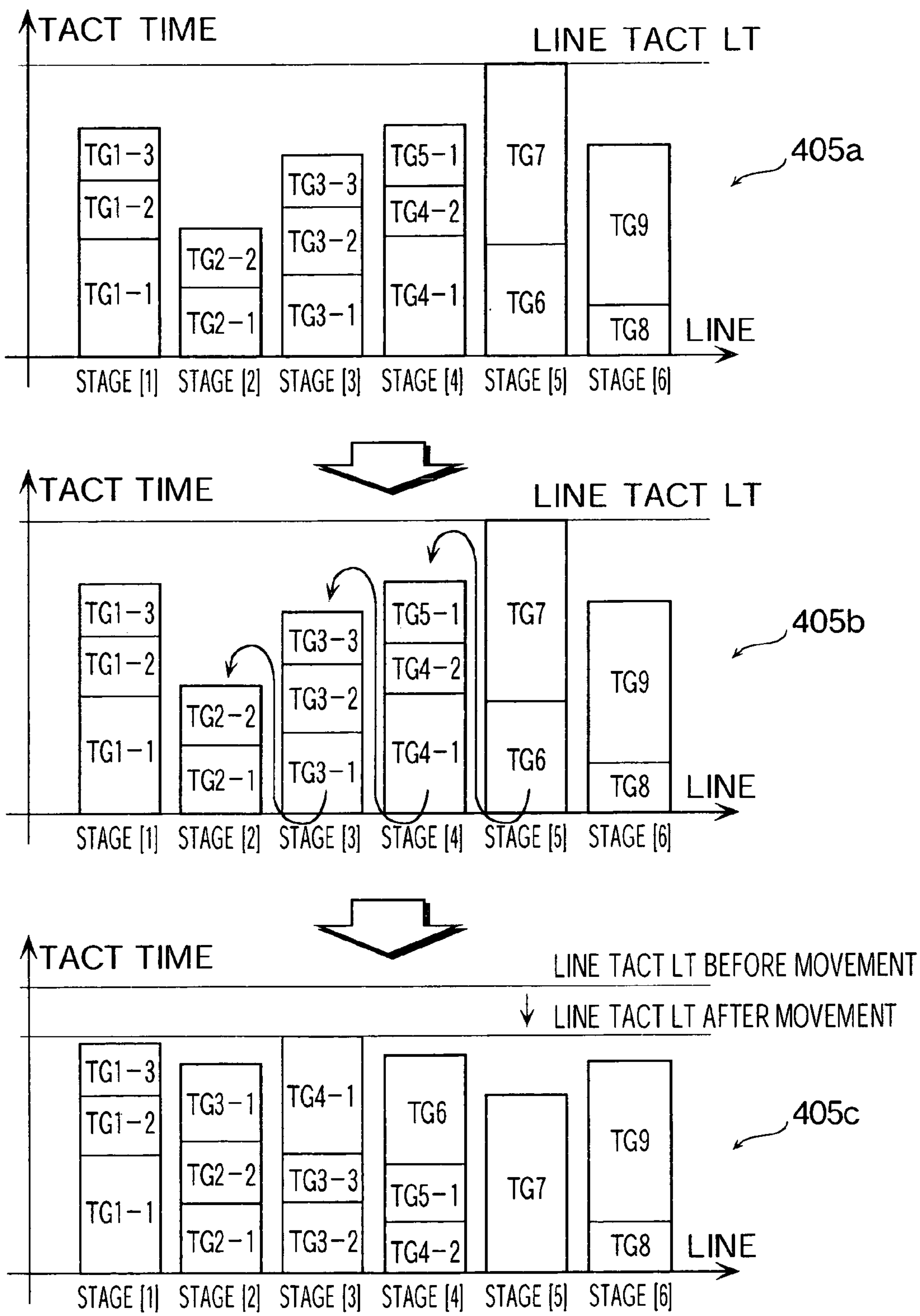
FIG. 17 shows the distribution of tact times before the estimated tact time balancing process performed by the second LBM part of the tact time balance optimization part, the movement of task groups performed by the optimization, and the distribution of tact times after the optimization.

FIG. 17 shows the optimization (the movement of task groups) of the tact time balance by the second LBM part 315*b*. The upper graph 405*a* shows the distribution of tact time before optimization is performed, which is to say, the condition after task groups have been allocated to the stages. The middle graph 405*b* shows the movement of task groups performed by the optimization, while the lower graph 405*c* shows the distribution of tact time after optimization has been performed. This process corresponds to step S314*b* shown in FIG. 14.

In the distributions of tact time shown in FIG. 17, the vertical axis shows the length of the tact time, while the horizontal axis shows the stages (in the illustrated example, six) that compose the production line in order from upstream to downstream. Each task group is shown as a block that is labeled “TGn-m” and has a height that is proportional to the length of its tact time. In these labels, the variable “n” has a value between 1 and 9 showing the number of the component group belonging to that task group, while the variable “m” is used to identify the various groups produced by dividing the same task group.

It should be noted that when a plurality of task groups are allocated to the same stage, the stage mounts the components belonging to the component groups for thin components first. However, when there are a plurality of task groups for the same component group, it is assumed that this restriction on the mounting order is not enforced. As one example, stage [3] may mount the components in the order TG3-3->TG3-1->TG3-2.

Figure 18:
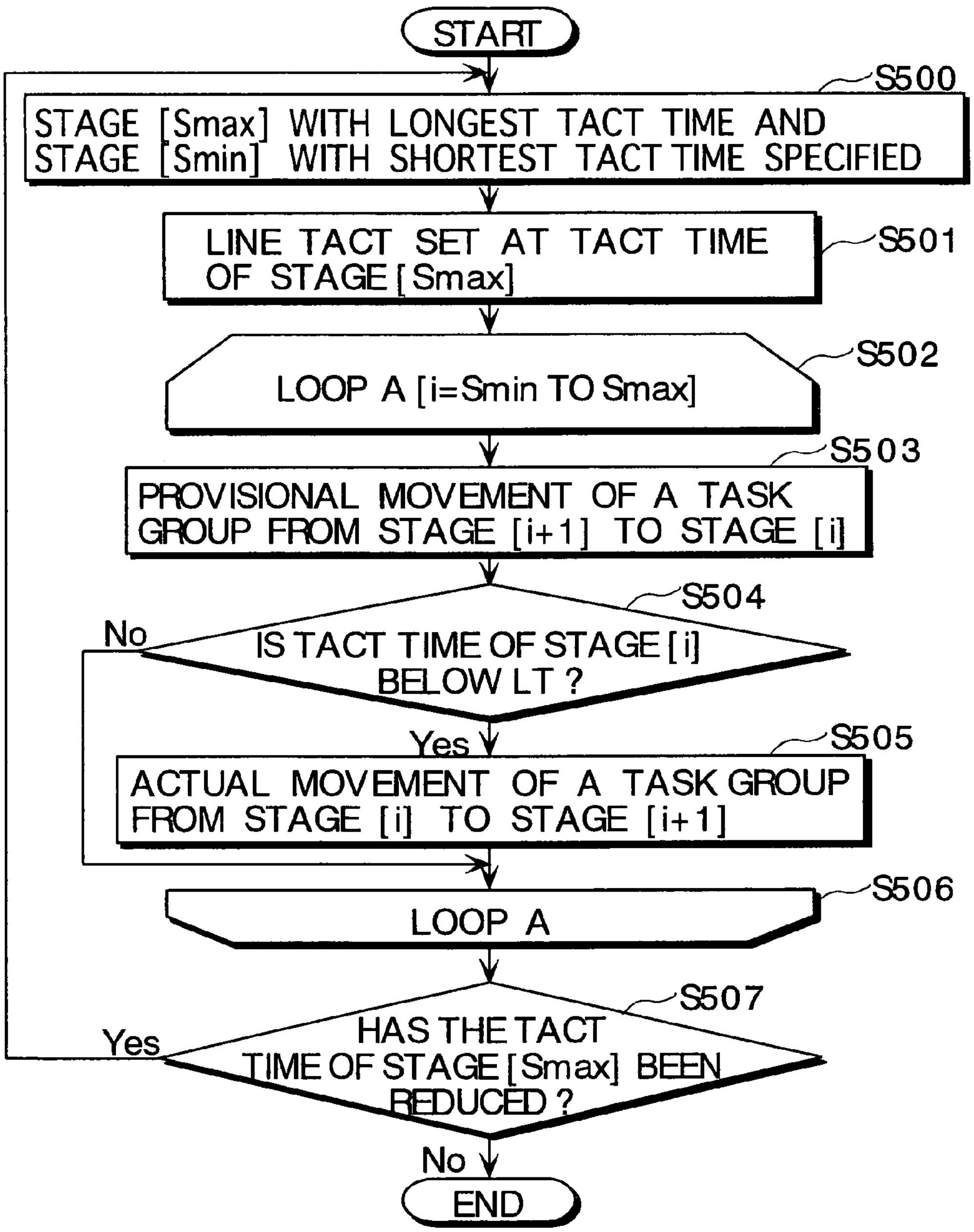
FIG. 18 is a flowchart for the optimization process for the tact time balance performed by the second LBM part of the tact time balance optimization part.

FIG. 18 is a flowchart for the optimization process for the tact time balance performed by the second LBM part 315*b*. This corresponds to the processing shown in FIG. 17.

The second LBM part 315*b* first refers to the initial state (the allocation of task groups) shown by the graph 405*a* that is generated by the first LBM part 315*a* and specifies the stage with the longest tact time “Smax” and the stage with the shortest tact time “Smin” (5500). In the example illustrated in FIG. 17, the second LBM part 315*b* specifies S[5] as Smax and S[2] as Smin.

After this, the second LBM part 315*b* stores the tact time of the stage Smax as the line tact time LT (S501). In the present example, the second LBM part 315*b* store the tact time of S[5] as LT.

Next, the second LBM part 315*b* moves movable task groups between pairs of adjacent stages in order for each stage [i] between the stage [Smin] and the stage [Smax-1] (S502 to S507).

In other words, the second LBM part 315*b* provisionally moves one task group from the stage [i+1] to the stage [i] (S503), and then confirms whether the tact time of the stage [i] is below the line tact time LT (S504).

Only when it has been confirmed that the tact time of the stage [i] is below the line tact time LT, the second LBM part 315*b* actually moves the task group (S505). As a result, the tact times of the stages [i] and [i+1 are updated. In the illustrated example, the task group TG3-1 is moved from stage [3] to stage [2]. It should be noted that when selecting the task groups as candidates to be moved, task groups to which component groups for thin components belong are given priority.

When the movement of task groups has been repeated for all stages from [Smin] to [Smax-1] (S502 to S506), the second LBM part 315*b* confirms whether the tact time of stage [Smax] has been reduced, which is to say, the second LBM part 315*b* judges whether one or more task groups has been moved from stage [Smax] to [Smax-1] (S507).

On confirming that the tact time of stage [Smax] has been reduced, the second LBM part 315*b* judges whether optimization can still be performed, in which case the same kind of optimization (S500 to S507) is repeated. When this is not the case, the second LBM part 315*b* judges that further optimization is difficult and terminates the processing (S507).

It should be noted that when there are a number of task groups that may be moved, some freedom may be exercised when choosing the task group to be moved, so that it is assumed that several ways of moving task groups are attempted within the allowed computation time.

By trying different ways of moving task groups between the stage with the shortest tact time and the stage with the longest tact time, the longest tact time (the line tact time) can be reduced, thereby optimizing the tact time balance for the production line.

When the optimization described above has been completed, the tact time balance for the state (i.e. allocation of task groups) that has been optimized by the second LBM part 315*b* is optimized in units of component types (component tapes) using the same procedure as the second LBM part 315*b*.

This is to say, while the second LBM part 315*b* moves task groups between adjacent stages (S503, S505), the third LBM part 315*c* moves the component types (component tapes) that compose each task group between adjacent stages. As a result, the third LBM part 315*c* can make a finer adjustment of the differences in tact time between two stages than the second LBM part 315*b*, thereby making more precise optimization possible. This in turn makes further reductions in the line tact time LT possible.

2.3 Optimization For Small Components

Figure 19:
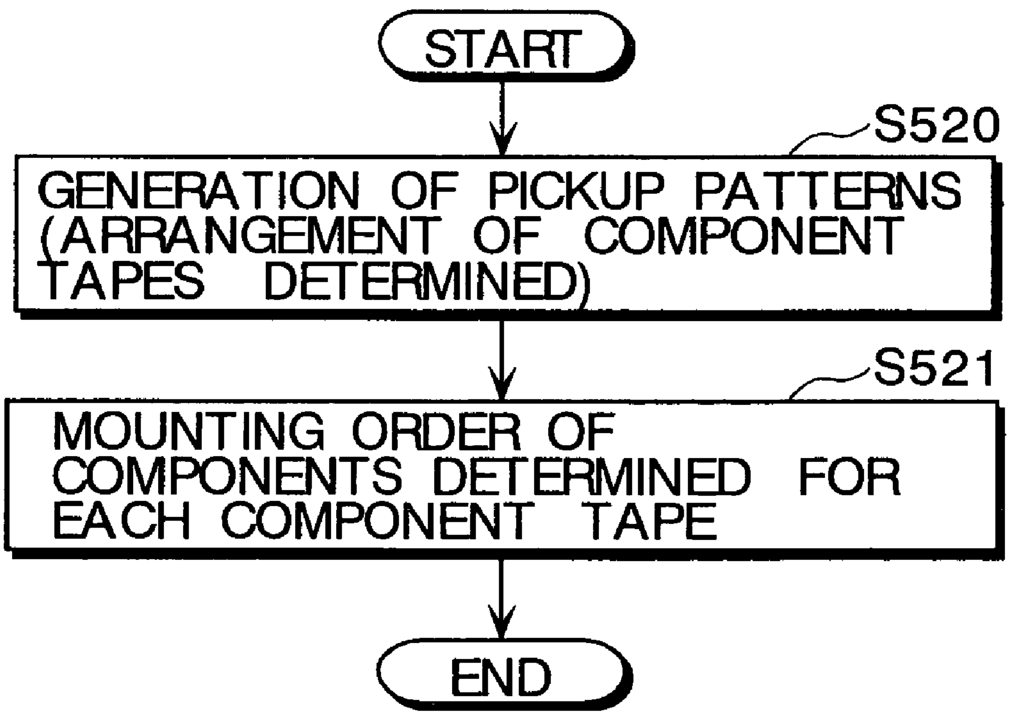
FIG. 19 is a flowchart showing a simplification of the optimization of the order of mounting for small components performed by the small component optimizing part of the state optimizing part.

FIG. 19 is a flowchart showing a simplification of the optimization process performed by the small component optimizing part 316*a* of the state optimizing part 316 for the order of mounting for small components. This optimization is fundamentally composed of two steps.

The small component optimizing part 316*a* first generates pickup patterns for all of the components to be mounted (S520). By doing so, the small component optimizing part 316*a* determines the arrangement of the component types (component tapes), which is to say, the order (Z-axis positions) of the component feeders 114.

Figure 20:
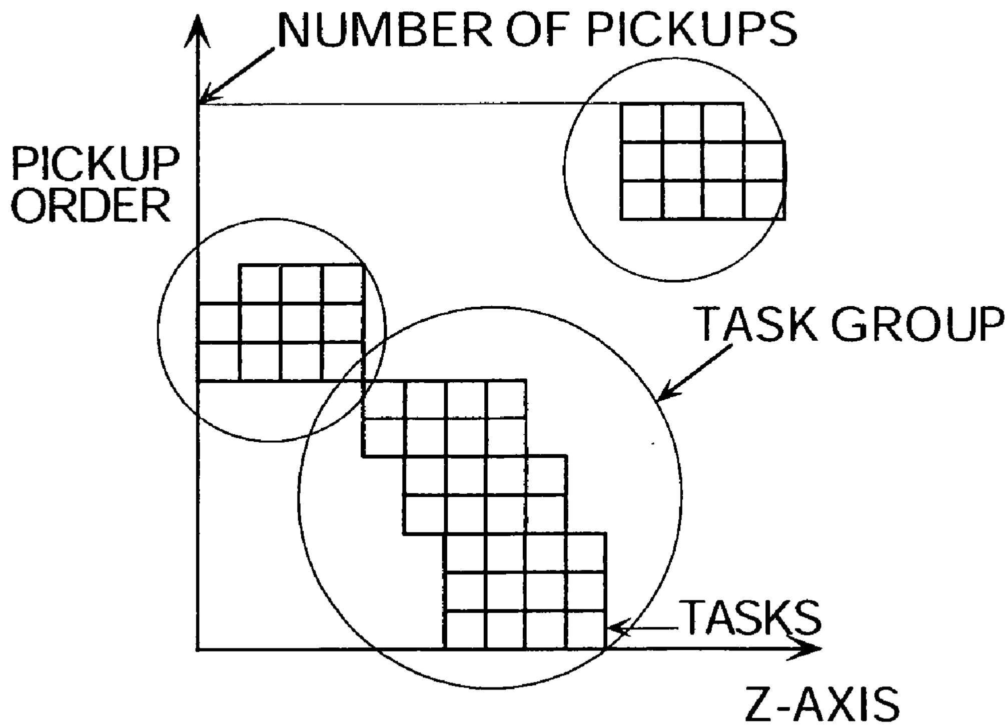
FIG. 20 is used to explain the pickup patterns.

The expression "pickup pattern" refers in this specification to a two-dimensional diagram such as that shown in FIG. 20. In this drawing, the vertical axis represents the order in which components are picked up by the line gang pickup head 112, the horizontal axis represents the arrangement (in the Z-axis) of the component feeders 114 (component tapes), and one or more groups of components that are simultaneously picked up by the line gang pickup head 112 are shown. The individual components (mounting points) that can be handled by the pickup operation are shown by the small boxes (squares).

It should be noted that in FIG. 20, the pickup pattern is shown for the case where the line gang pickup head 112 has four nozzle heads to simplify the explanation. Up to four boxes arranged in a horizontal line correspond to one mounting operation (pickup, transporting, and mounting) or, in other words, one task. Each set of tasks that has been circled corresponds to a task group. As a result, a total of three separate task groups are shown in FIG. 20.

The generation of this kind of pickup pattern is performed by setting the relative positioning of the component tapes so that the line gang pickup head can simultaneously pick up as many components as possible. Putting this another way, this corresponds to dividing all of the component tapes among a plurality of separate arranged groups (task groups).

As shown in FIG. 19, the small component optimizing part 316*a* next determines the order of mounting for the components on each component tape in each task group (i.e., a group of component tapes whose order has been fixed) produced in step S520 so as to minimize the total tact time of each task group (S521). Even when components are taken from the same component feeder 114, the distance from the preceding mounting point in the same task differs depending on which mounting point was handled previously, so that this optimization corresponds to a minimization of the distance traveled (mounting time taken) by the line gang pickup head 112 during mounting.

2.4 Task Group Generation Method

Task group generation is a first specific algorithm for generating the pickup patterns in FIG. 19.

Figure 21:
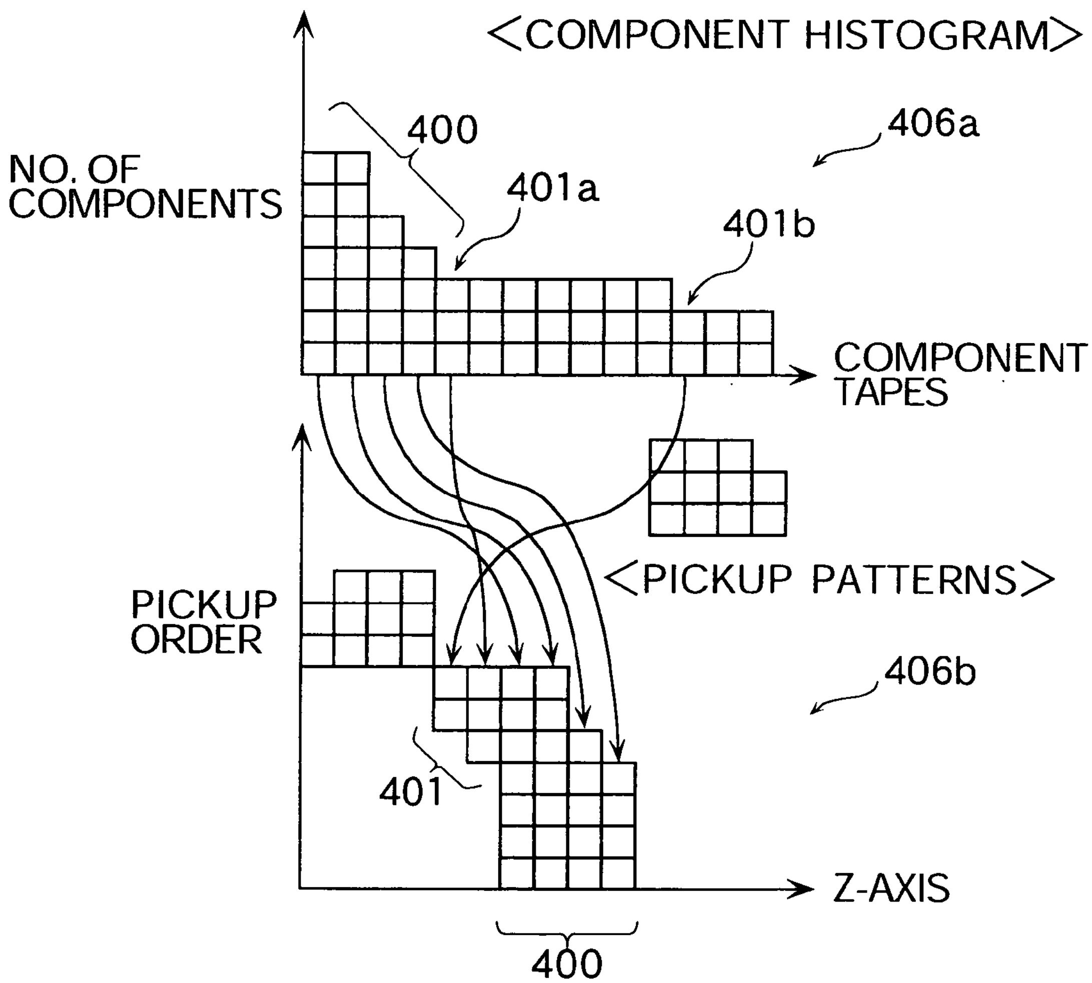
FIG. 21 shows the component histogram for components for which the task group generation method generates pickup patterns and the pickup patterns generated from this component histogram.

With this method, the generation of task groups is repeatedly performed for a number of component types within a predetermined range (here, twice the number of pickup nozzles or less). This method is fundamentally composed of two main steps, a first step and a second step. FIG. 21 shows this first and second step. In FIG. 21, a component histogram 406*a* is produced by sorting component tapes into descending order for the number of components to be mounted, while a diagram 406*b* shows the pickup pattern generated by the first step and second step.

First Step

In this step, the former half of the process for generating one task group is performed. In other words, a component histogram is produced by arranging the component tapes in descending order of the number of components to be mounted along the Z-axis from left to right. This is achieved by the following substeps:

(i) Out of the component tapes that have yet to be ordered, a component tape with the highest number of components to be mounted (the "number 1 component tape") is placed on the Z-axis.

(ii) The component tape with the second highest number of components to be mounted (the "number 2 component tape") is placed on the right side of the number 1 component tape.

(iii) The component tape with the third highest number of components to be mounted (the "number 3 component tape") is placed on the right side of the number 2 component tape.

(iv) This process is repeated for a number of iterations equal to the number of nozzles L (in the present example, four) on the line gang pickup head 112.

As a result, four component tapes 400 are taken from the component histogram 406*a* and are arranged at the position 400 indicated in the diagram 406*b*.

Second Step

This step arranges the content of the component histogram in the diagram produced by the processing in the former half so that tasks where the number of simultaneously picked up components is less than L become tasks where the number of simultaneously picked up components is L. This is achieved by the following substeps:

(i) The number of mounted components for the number L component tape is subtracted from the number of mounted components for the number 1 component tape.

(ii) A component tape (the "number L+1 component tape") that has a number of mounted components which is no greater than the subtraction result and is closest to the subtraction result is selected and is placed on the left side of the number 1 component tape.

(iii) The number of mounted components for the number (L−1) component tape is subtracted from the number of mounted components for the number 2 component tape.

(iv) A component tape that has a number of mounted components which is no greater than the second subtraction result and is closest to the second subtraction result is selected and is placed on the left side of the number (L+1) component tape.

(v) This process is repeated for (L−1) iterations.

As a result, two component tapes 401*a* and 401*b* are taken from the component histogram 406*a* and are placed in the positions numbered 401 in the diagram 406*b*. In this way, the component tapes 400 and the component tapes 401 form a complete pickup pattern. This processing therefore determines the relative Z values for the component tapes in a task group formed of six component tapes.

The generation of task groups by the above first and second steps is repeated until there are no component tapes yet to be processed.

Figure 22:
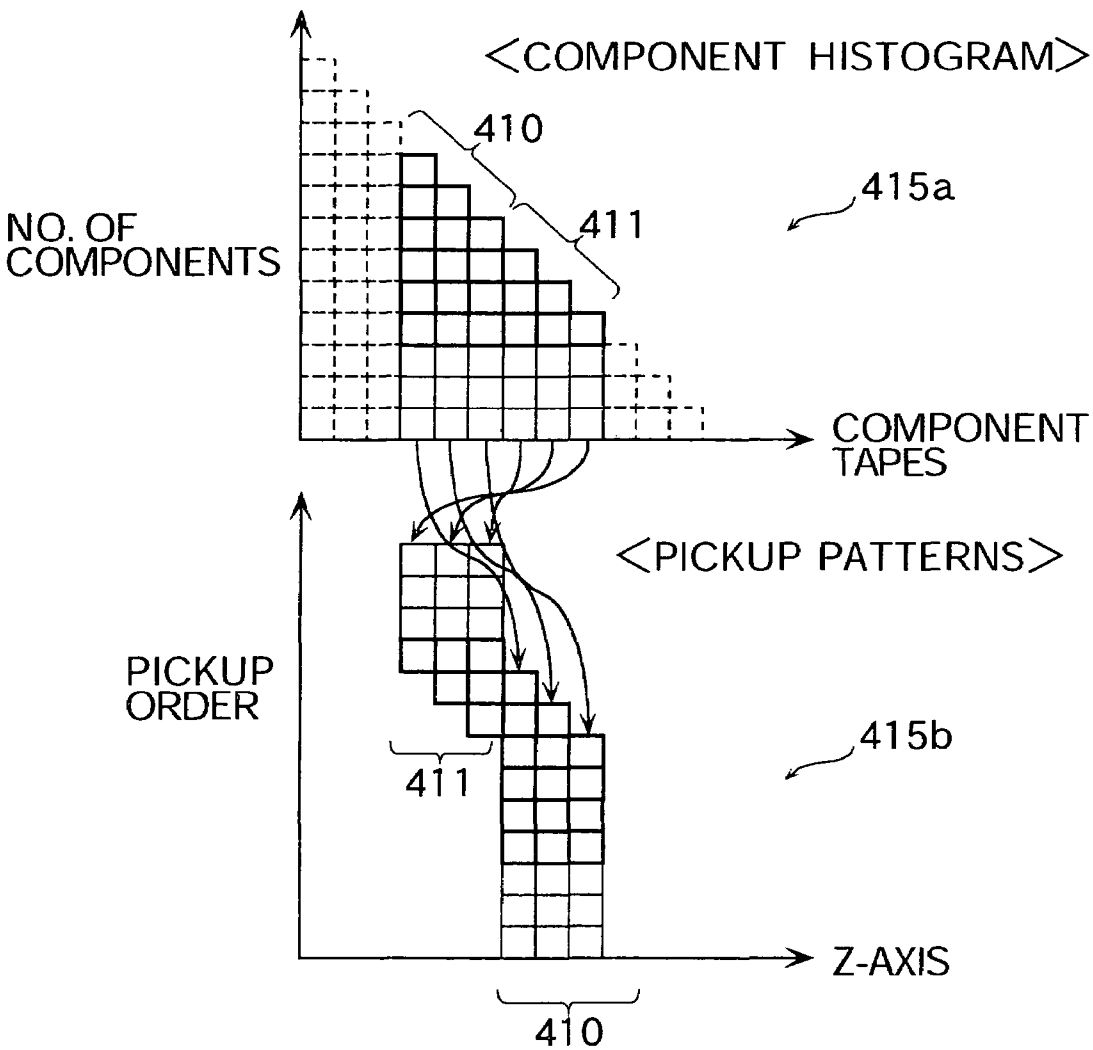
FIG. 22 shows the unarranged part of the component histogram, and the pickup patterns that are generated from this unarranged part of the component histogram.

When in the second step, there are no remaining component tapes that fulfill the specified conditions, the following three steps (the third to fifth steps) are executed in place of the first and second steps. These third to fifth steps are described below with reference to FIG. 22. In FIG. 22, a component histogram 415*a* shows all of the components (the components enclosed by the solid lines) in the component histogram 406*a* that are yet to be arranged, while a diagram 415*b* shows the pickup pattern generated by the third to fifth steps.

Third Step

This step forms a component histogram by arranging components in the component histogram 406*a* that are yet to be arranged. This is achieved by the following substeps:

(i) Out of the component tapes yet to be arranged, the component tape with the lowest number of components to be mounted is found; and (ii) A value equal to the lowest number minus one is subtracted from the number of components to be mounted for each component tape yet to be arranged.

The results of the above subtraction, which are numbers of components to be mounted for component tapes that are yet to be arranged, are shown surrounded by thick solid line as component histogram 415*a*. After this, the fourth and fifth steps are performed using the numbers of components in this component histogram 415*a*.

Fourth Step

The fourth step corresponds to the first step described above and is achieved by the following substeps:

(i) Out of the component tapes that have yet to be ordered, a component tape with the highest number of components to be mounted (the "number 1 component tape") is placed on the Z-axis;

(ii) The component tape with the second highest number of components to be mounted (the "number 2 component tape") is placed on the right side of the number 1 component tape;

(iii) The component tape with the third highest number of components to be mounted (the "number 3 component tape") is placed on the right side of the number 2 component tape; and (iv) This process is repeated for a number of iterations equal to the number of nozzles L (in the present example, three) on the line gang pickup head 112.

As a result, three component tapes 410 are taken from the component histogram 415*a* and are arranged at the position 410 indicated in the diagram 415*b*.

Fifth Step

The fifth step corresponds to the second step described above and is achieved by the following substeps:

(i) The number of mounted components for the number L component tape minus one is subtracted from the number of mounted components for the number 1 component tape.

(ii) A component tape (the "number L+1 component tape") that has a number of mounted components which is no greater than the subtraction result and is closest to the subtraction result is selected and is placed on the left side of the number 1 component tape.

(iii) The number of mounted components for the number L component tape is subtracted from the number of mounted components for the number (L+1) component tape.

(iv) A component tape that has a number of mounted components which is no greater than the second subtraction result and is closest to the second subtraction result is selected and is placed on the left side of the number (L+1) component tape.

(v) This process is repeated for L iterations.

As a result, three component tapes 411 are taken from the component histogram 415*a* and are placed in the positions numbered 411 in the diagram 415*b*. In this way, the component tapes 410 and the component tapes 411 form a complete pickup pattern. This processing (1) generates task groups made up of components that can be simultaneously picked up using the component tapes that were left after the execution of the first and second steps, which is to say, component tapes where there is little difference in the numbers of components to be mounted, and (2) determines the relative positions of the component tapes on the Z-axis.

2.5 Cut Down Process

The cut down process is a second specific algorithm that is used for the generation of pickup patterns (S520) in FIG. 19. This process corresponds to steps S320*a* to S320*d* in FIG. 14.

This process uses a component histogram where component tapes are arranged in descending order of the number of components to be mounted along the Z-axis, and utilizes the above pickup pattern generating method only where it is not possible for the line gang pickup head to simultaneously pick up the maximum (L) number of components. This method is also made up of two main steps, a first step and a second step.

First Step

In this step, tasks composed of L consecutive components are repeatedly removed ("cut down") from the component histogram.

Figure 23:
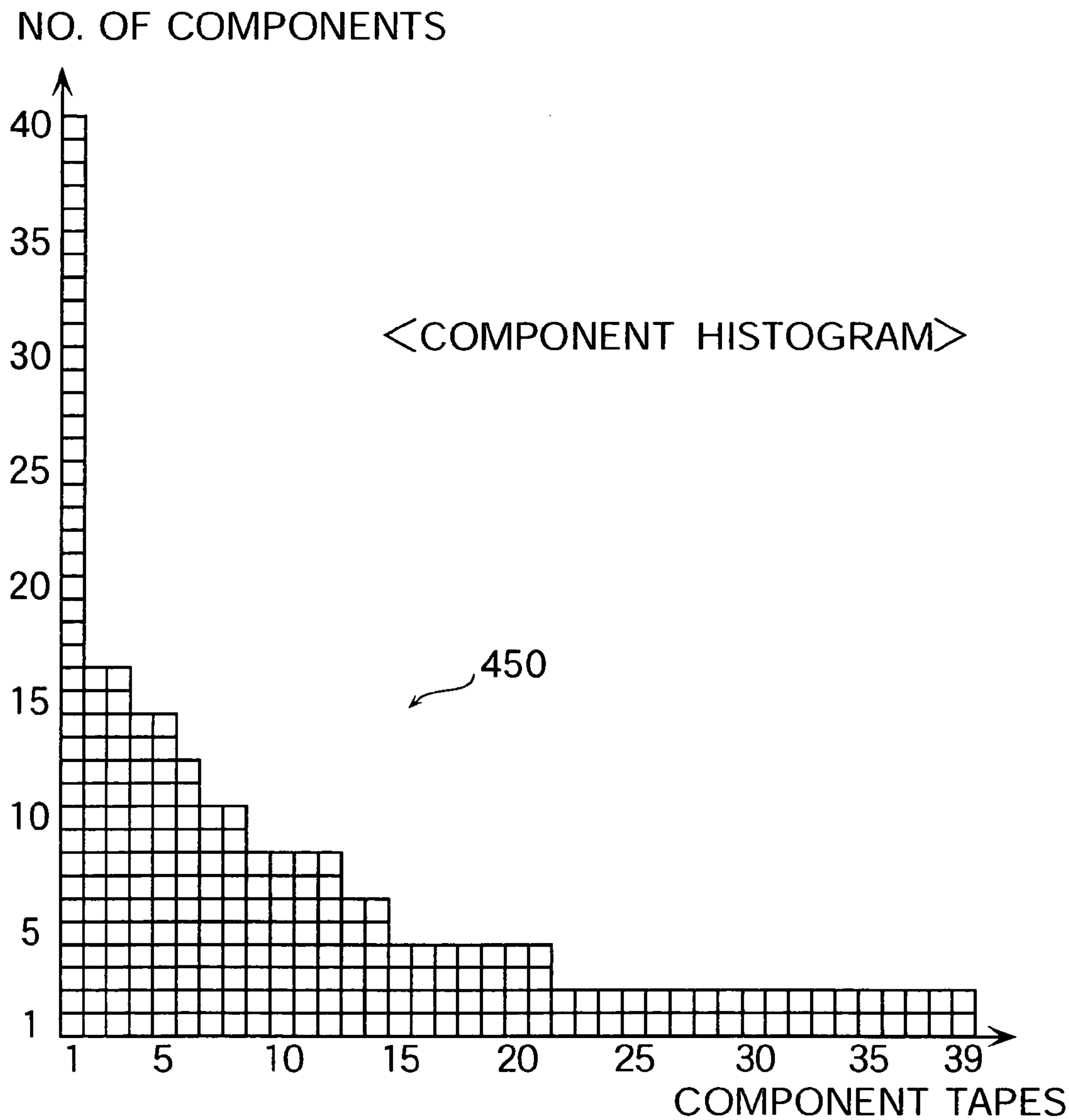
FIG. 23 shows a component histogram for all of the components for which pickup patterns are generated by the cut down procedure.
Figure 24:
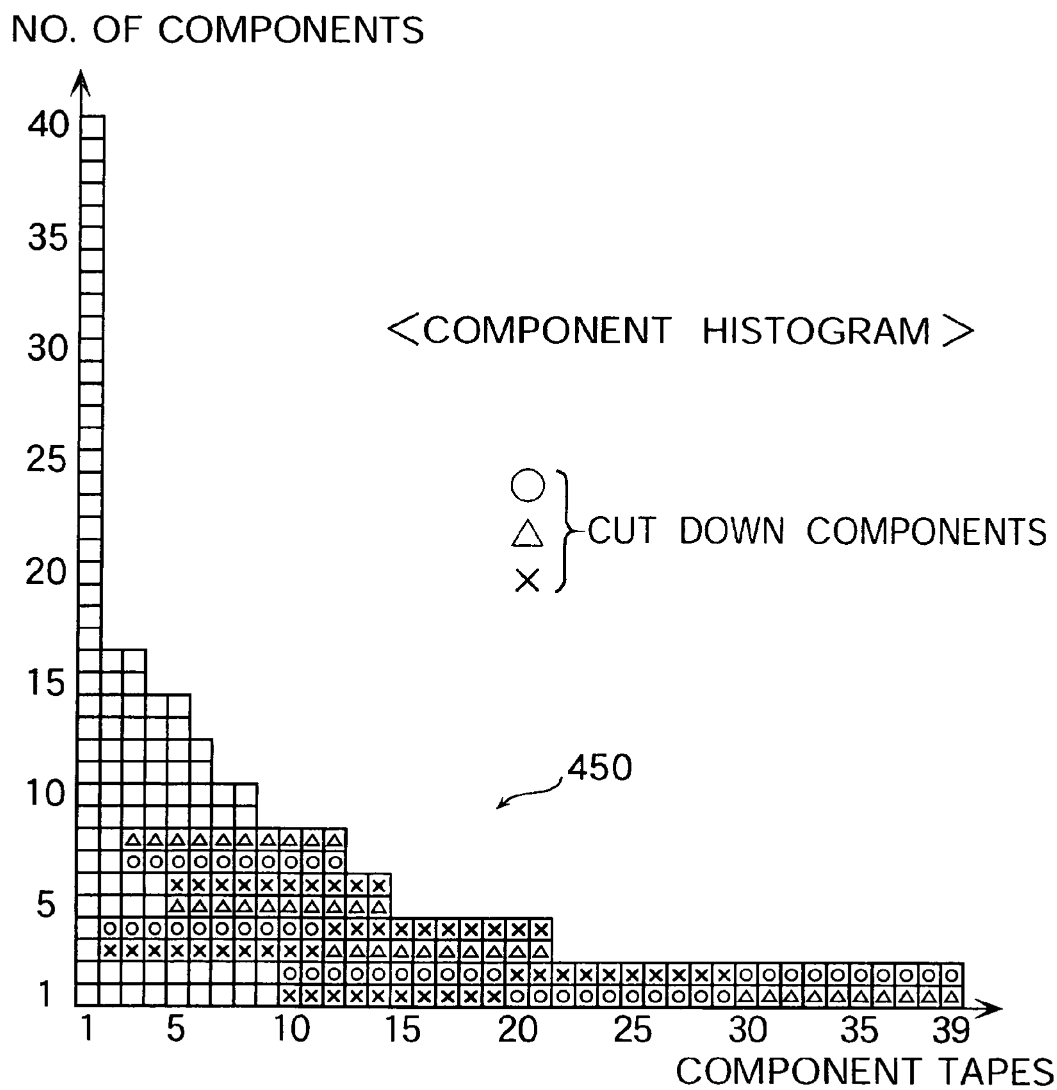
FIG. 24 shows how ten consecutive components are removed at a time (i.e., "cut down") from the component histogram shown in FIG. 23.

FIGS. 23 and 24 show the operation performed in the first step of the present cut down process. FIG. 23 shows a component histogram 450 in which component tapes for all of the components to be mounted have been arranged in descending order of the number of components to be mounted. FIG. 24 shows how L (in the illustrated example, ten) consecutive components are removed at a time (i.e., "cut down") from the component histogram 450 in FIG. 23. The processing shown in FIGS. 23 and 24 corresponds to steps S320*a*, S320*b* in FIG. 14.

Cutting down is performed by removing L consecutive components (shown by the sets of ten consecutive circles, triangles or crosses in FIG. 24) from the right side of the component histogram so that component tapes with few components to be mounted are removed first. This is repeated until it is no longer possible to take a remove of L consecutive components.

Second Step

This step generates a diagram from a component histogram made up of the components that remain after cutting down has been performed. This diagram is made in accordance with the task group generating method described earlier.

Figure 25:
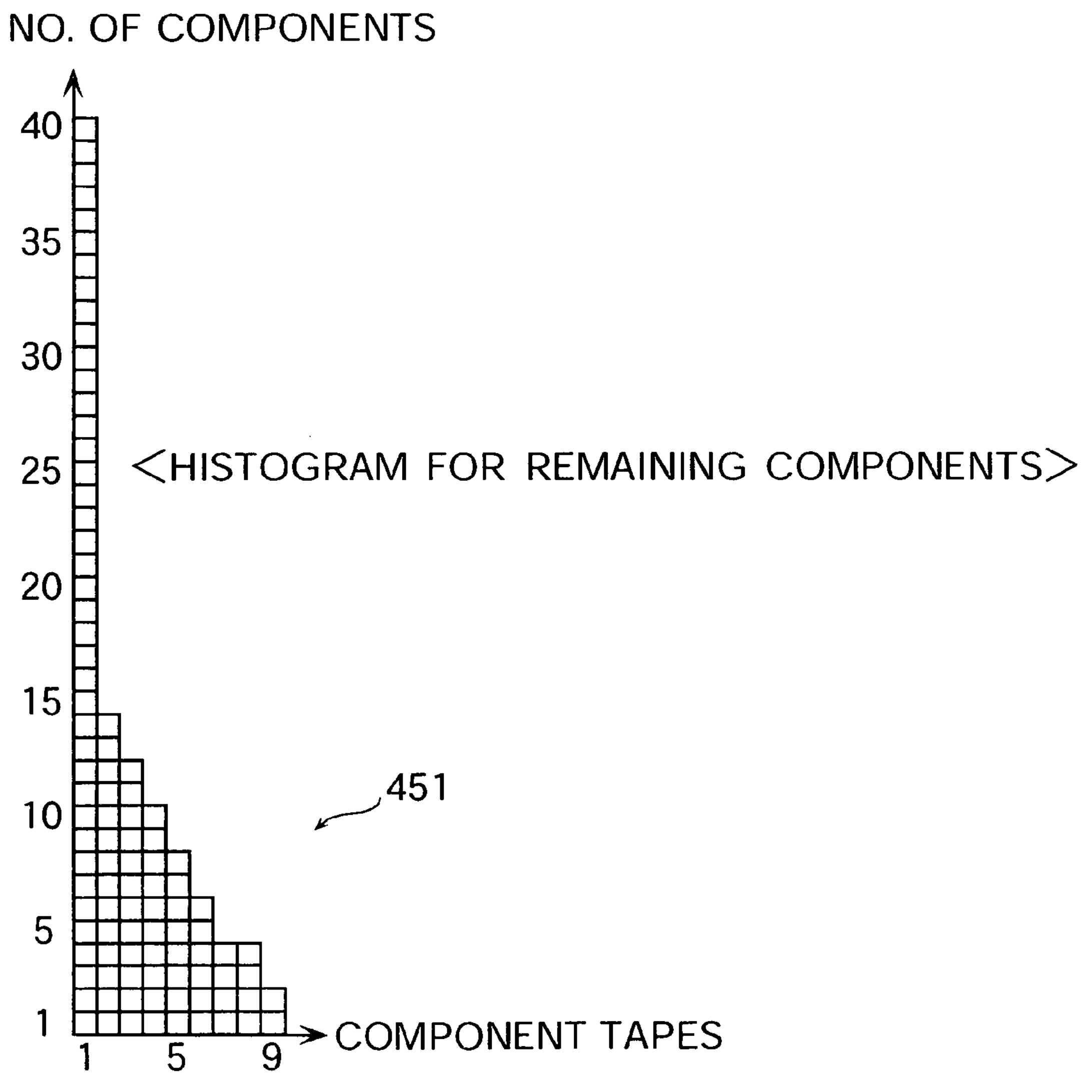
FIG. 25 shows a component histogram for the components that are left over after cut down process shown in FIG. 24.
Figure 26:
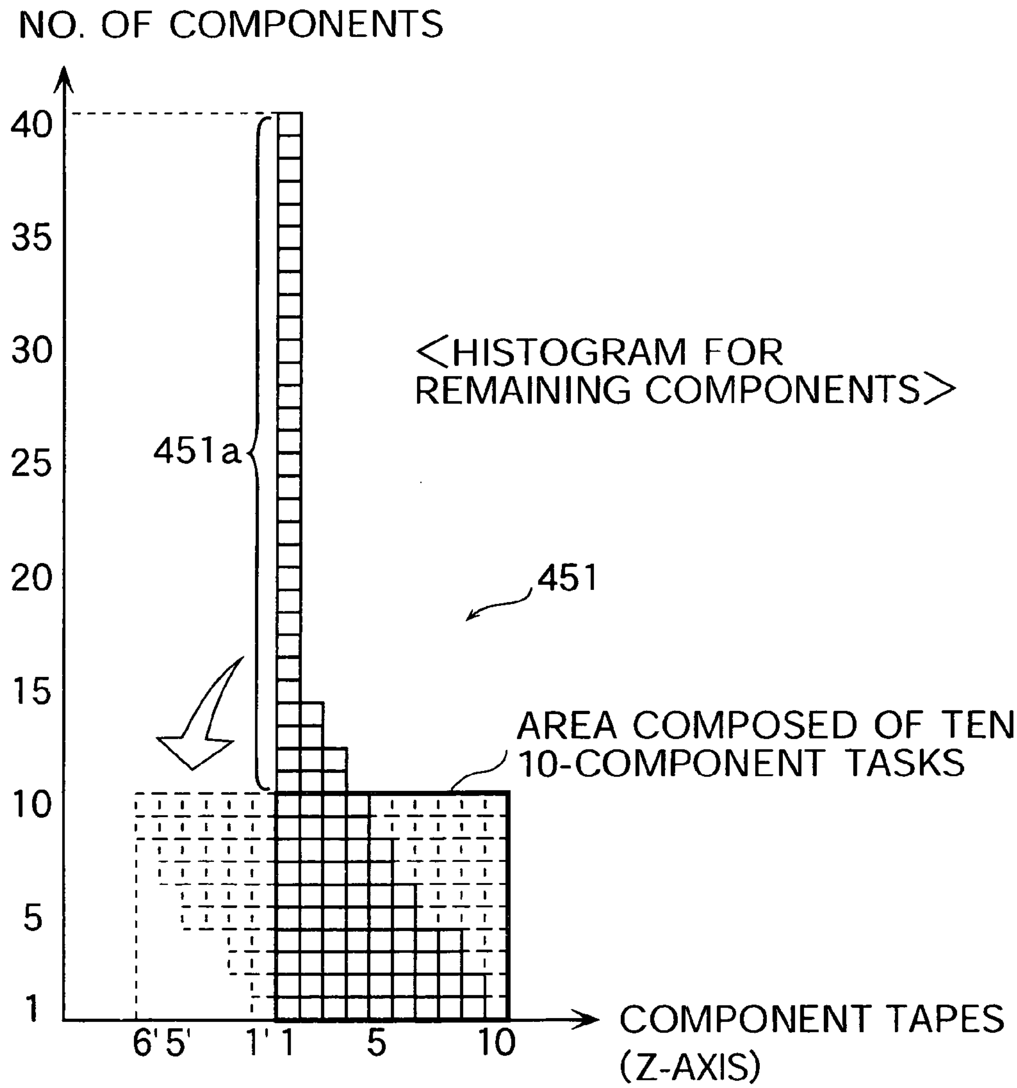
FIG. 26 shows how a diagram is generated from the component histogram shown in FIG. 25 in accordance with the task group generating method.

FIGS. 25 and 26 show how the second step of the cut down process works. FIG. 25 shows a reconstructed component histogram 451 produced by arranging the component tapes, which are left over after the first step of the cut down process has been performed, in descending order of the number of components to be mounted. FIG. 26 shows how a diagram is generated from the reconstructed component histogram 451 in accordance with the task group generating method described earlier. The processing shown in FIGS. 25 and 26 corresponds to step S320*d* in FIG. 14.

It should be noted that due to the processing in the first step of the cut down process, the width (i.e., the number of component tapes) of the reconstructed component histogram 451 is definitely (L−1) or below.

In more detail, the processing in the second step is composed of the following substeps.

(i) The component histogram 451 shown in FIG. 25 is generated for the components left after the cutting down in the first step, and the total number of components to be mounted (in the illustrated example, 100) is calculated.

(ii) The calculated total number of components is divided by L (in the illustrated example, 10) and pickup patterns are generated with the object of setting the number of tasks equal to the result of the division (in the illustrated example, 10).

(iii) The above object is achieved as follows. As shown in FIG. 26, component tapes for which the number of components to be mounted exceeds the calculated number of tasks (10) are identified and the excess number of components 451a (or divided parts of this excess number) are taken and used to supplement the left side of the component histogram 451.

Figure 27:
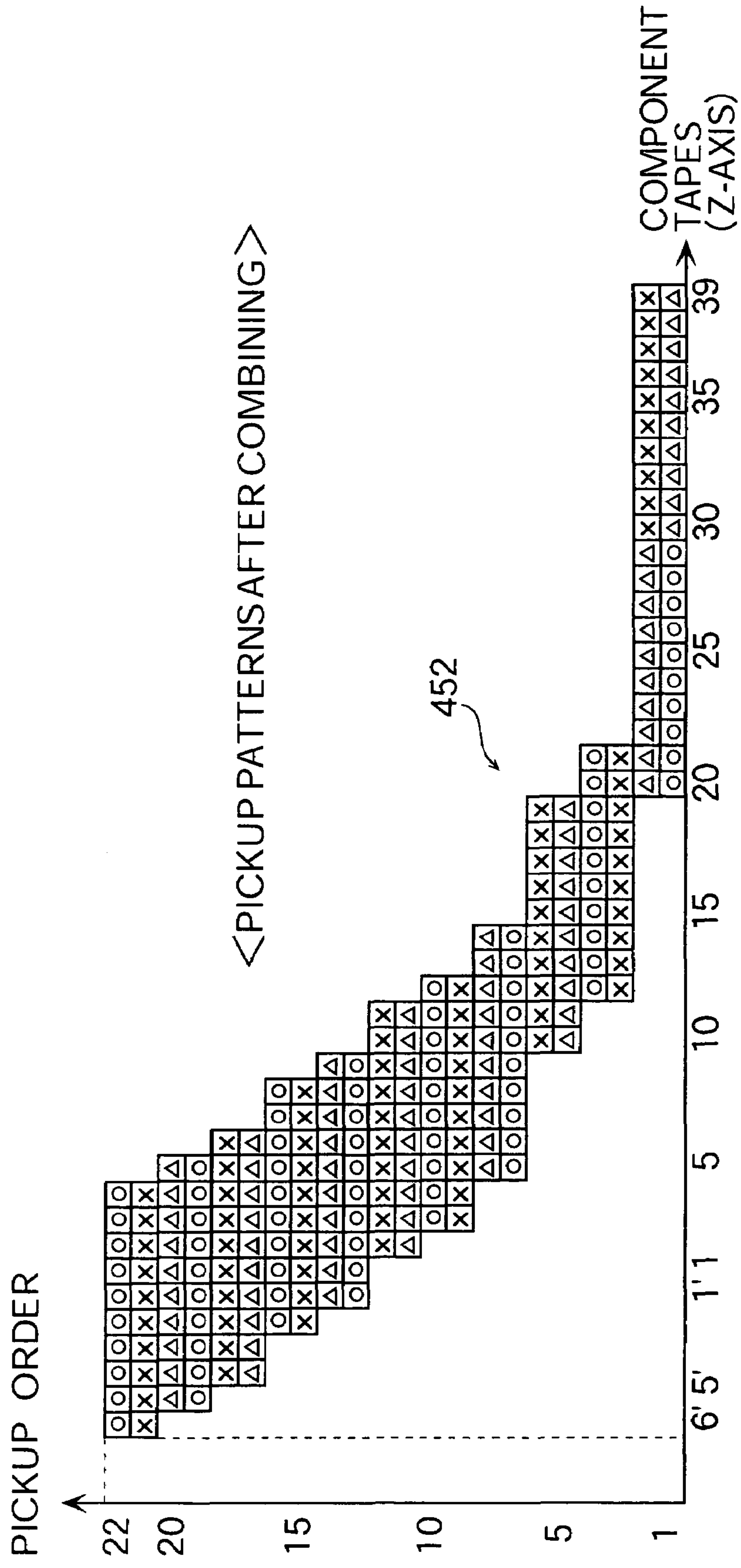
FIG. 27 shows the pickup patterns for component tapes whose positions on the Z-axis have been determined by the cut down procedure.

FIG. 27 shows the pickup patterns 452 for component tapes whose positions on the Z-axis have been determined by the first and second steps of the cut down process described above. As shown in FIG. 27, all the components form tasks containing the maximum number (10) of components, so that mounting can be performed with the highest possible pickup efficiency.

Figure 28:
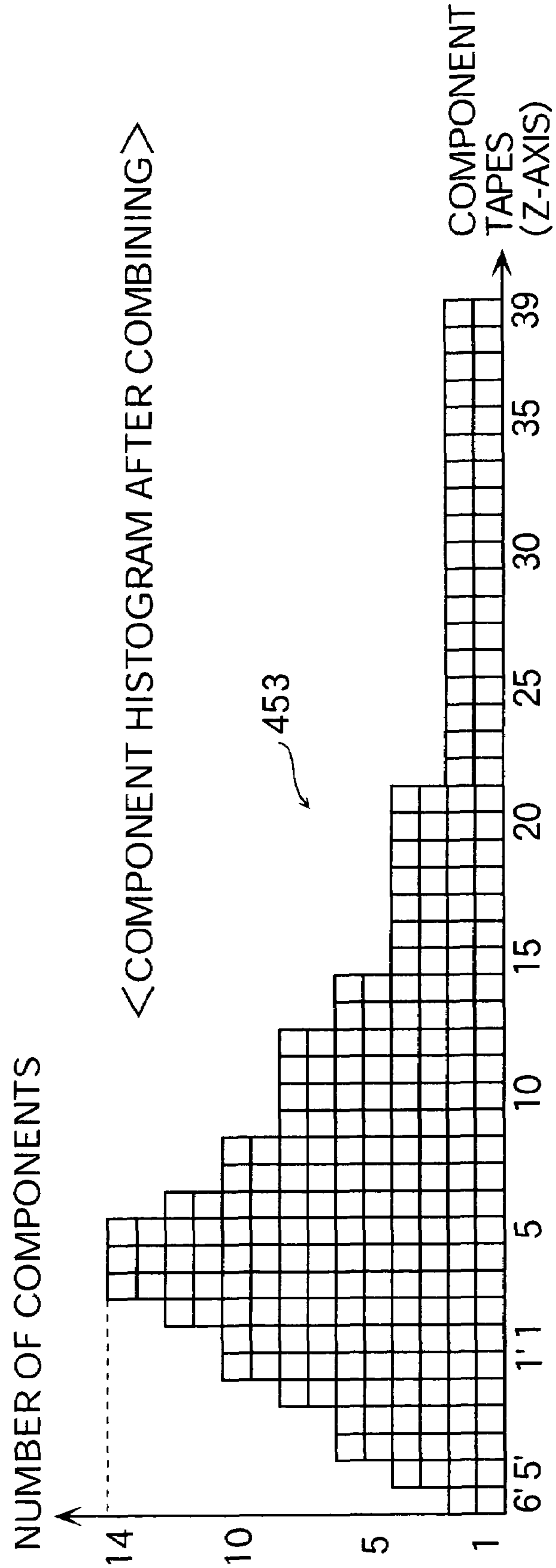
FIG. 28 shows a component histogram (constructed without changing the Z-axis) corresponding to the pickup patterns shown in FIG. 27.

FIG. 28 shows a component histogram 453 corresponding to the pickup patterns 452 shown in FIG. 27. This component histogram 453 is reconstructed without changing the positions in the Z-axis.

As can be seen from the component histogram 453, the cut down process maintains the tendency for component tapes with large numbers of components to be arranged to the left. This means that cut down process determines an arrangement of components having considered the movement paths taken by the line gang pickup head 112. These movement paths are such that after picking up components from the right block 115b, the line gang pickup head 112 definitely passes in front of the 2D camera that is arranged to the left of the right block 115b. By minimizing the total distance moved by the line gang pickup head 112, the cut down process produces an arrangement of components that reduces the total tact time.

It should be noted that processing that is symmetrical in the Z-axis may be performed for the left block 115a. In other words, component tapes can be arranged in ascending order of components to be mounted and then tasks can be cut down using the procedure described above.

2.6 Random Selection (The "Greedy Method")

Random selection is a first example of a specific algorithm for the optimization the mounting order shown as S521 in FIG. 19. This process corresponds to step S320e in FIG. 14.

In this method, the following process is repeated. In short, two randomly selected mounting points in the same task group are interchanged if this results in a reduction in the total tact time.

Figure 29:
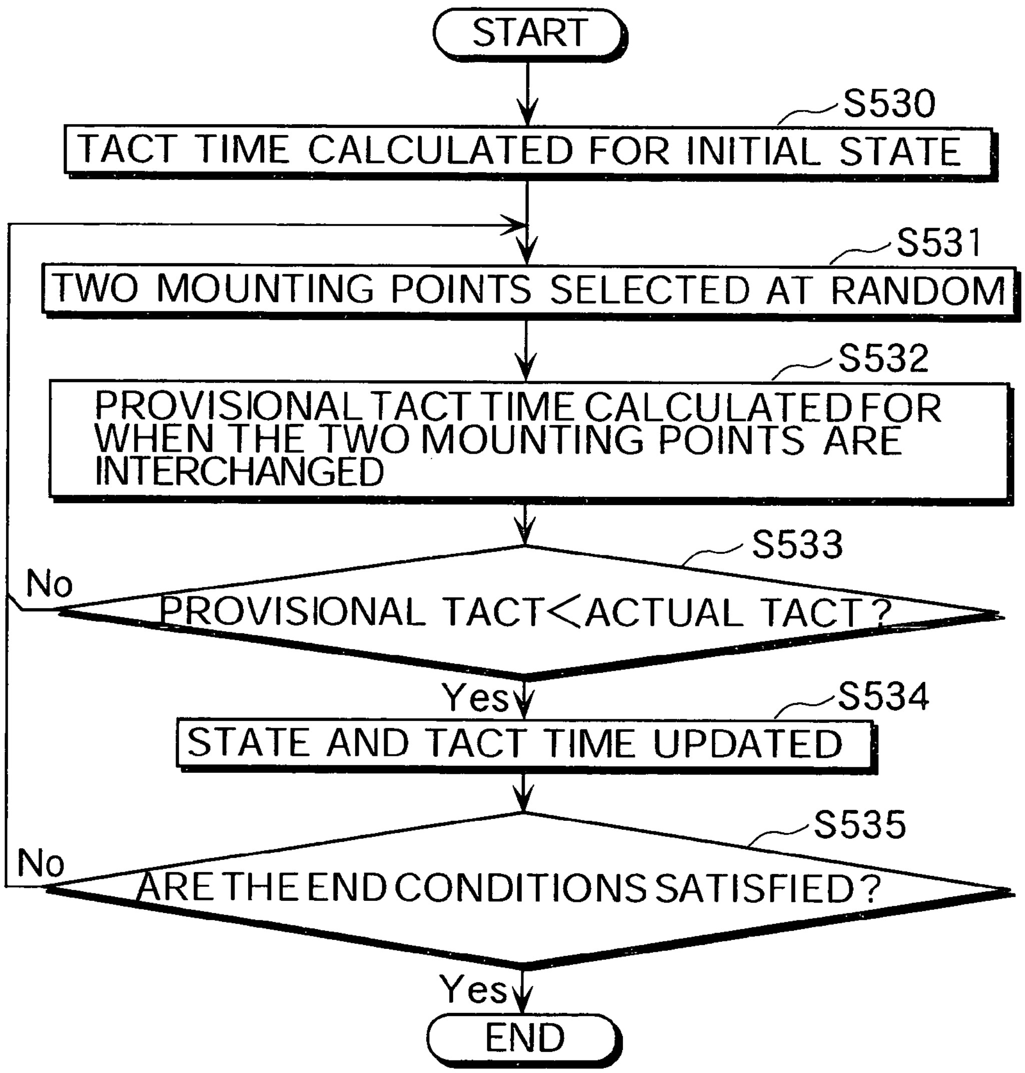
FIG. 29 is a flowchart for the procedure used when optimizing the order of mounting for components according to random selection.
Figure 30:
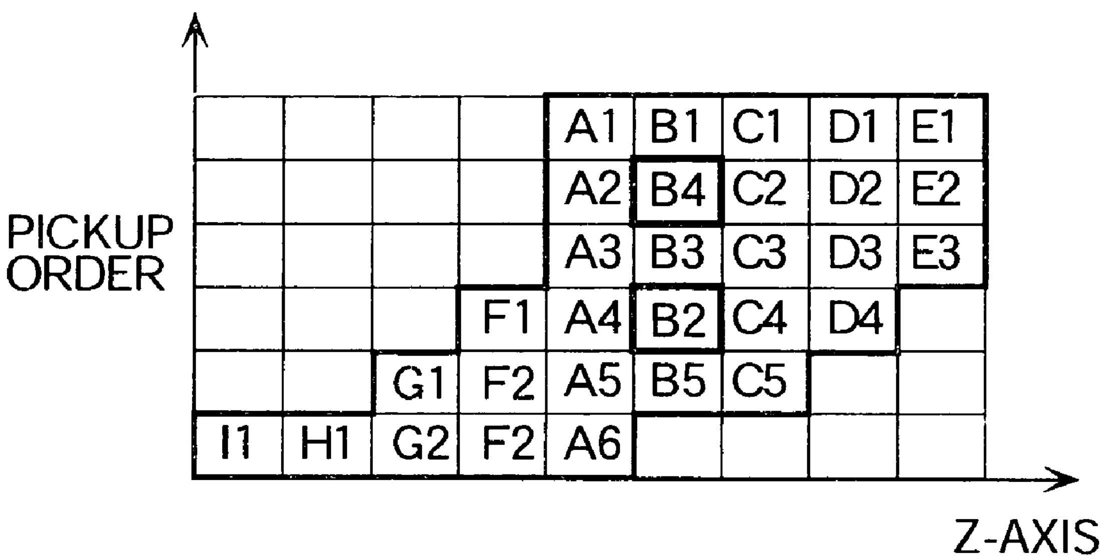
FIG. 30 shows how two mounting points are interchanged according to random selection.

FIG. 29 is a flowchart for the procedure used when optimizing the order of mounting for components according to random selection. FIG. 30 shows how two mounting points are interchanged according to random selection.

First, the small component optimizing part 316a calculates the total tact time for the initial state (S530). Here, this state is a pattern where the mounting order for all components (mounting points) forming one task group has been decided. The total tact time for one state is determined from the information 307a to 307c stored in the database unit 307.

Next, two mounting points are selected at random from all of the mounting points (S531), and the total tact time (provisional tact time) is calculated for the case where the two selected mounting points are interchanged in the mounting order (S532). FIG. 30 shows an example where the mounting points B2 and B4 are interchanged.

The small component optimizing part 316a then judges whether the calculated provisional tact time is shorter than the total tact time for the present state (S533).

When the provisional tact time is shorter, the small component optimizing part 316a interchanges the selected mounting points (S534). In other words, the state and total tact time are updated and stored for the case where the selected mounting points have been interchanged. Then, it is judged whether the end conditions (whether the total tact time is below a target tact time set in advance by the user or whether the processing has been performed for set period of time) are satisfied at this point (S535), and if so, the processing is terminated.

On the other hand, when the interchanging of the two selected mounting points does not result in a reduction in the total tact time (S533:No) and the end conditions are not satisfied (S535:No), the above processing (S531 to S533 or S535) is repeated until the end conditions are satisfied. This means that random selection can optimize the order of component mounting, with the reduction in the tact time achieved for each task group depending on the length of processing time used.

2.7 Intersection Disentanglement

Intersection disentanglement is a second example of a specific algorithm for the optimization the mounting order shown as S521 in FIG. 19. This process corresponds to step S324 in FIG. 14.

Instead of selecting two mounting points to be interchanged at random, this method selects two mounting points to be interchanged according to predetermined conditions, which is to say, mounting points where there is an intersection between paths produced by linking the mounting points of each task using straight lines, in order to remove the intersection.

Figure 31:
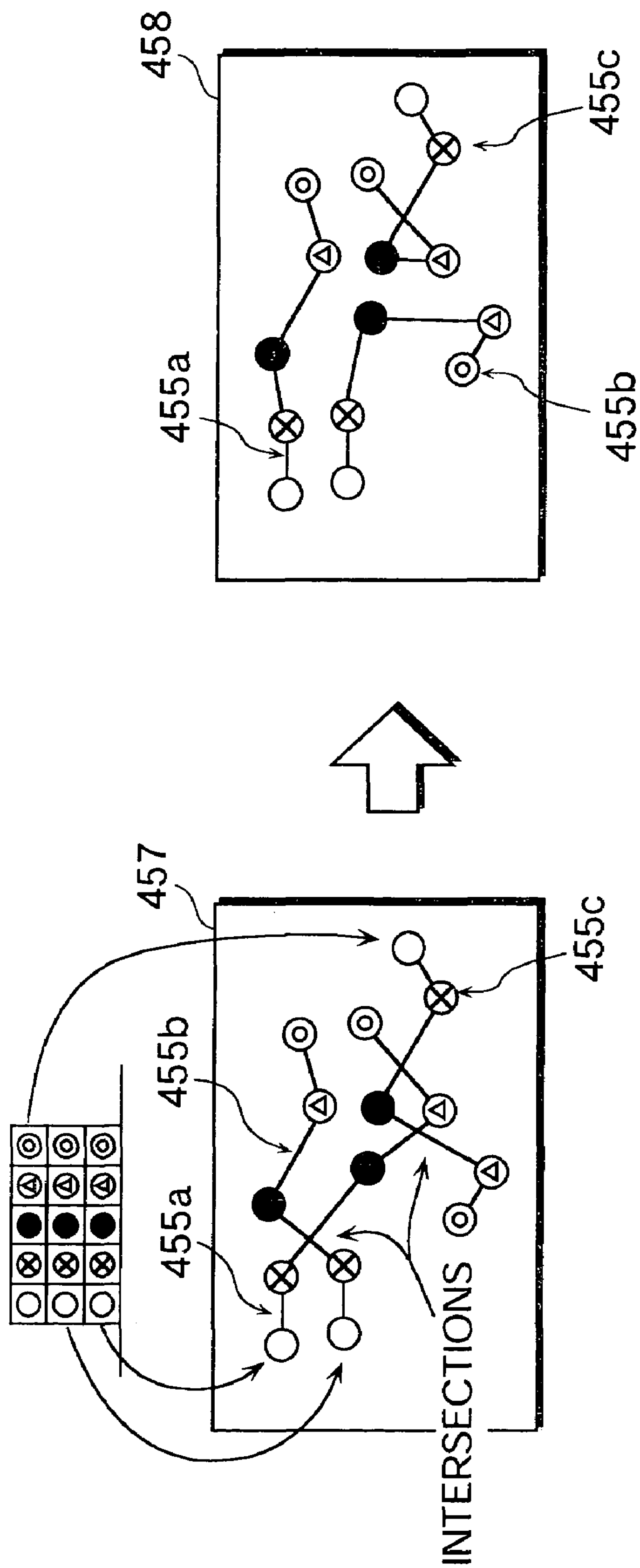
FIG. 31 shows the optimization of the mounting order of components due to intersection disentanglement

FIG. 31 shows three tasks 455a to 455a that are each composed of five mounting points and the optimization of the mounting order of components due to intersection disentanglement. Diagram 457 shows the mounting order (the distribution of the paths for each task) before the intersections between paths are removed, while diagram 458 shows the mounting order after the intersections between paths have been removed. Note that in these diagrams, mounting points for the same component type (component tape) are shown using the same round symbol.

First, the small component optimizing part 316a refers to the mounting point data 307a in the database unit 307 and specifies all of the intersections in the initial state. Here, lines are drawn to join two mounting points that belong to the same task and are consecutively moved to by the line gang pickup head, with the expression "intersection" referring to intersections between lines that belong to different tasks subject to the condition that the component types (component tapes) used at the mounting points at the ends of both intersecting lines are the same.

Next, the small component optimizing part 316a updates the way in which the lines are connected so as to successively eliminate all of the specified intersections. It should be noted that no change is made to the component types of the components located at each end of the lines by the elimination of the intersections, so that there is only one way of redrawing the connecting lines and this redrawing does not change in the order of component types composing each task.

By performing intersection disentanglement in this way, unnecessary movement of the line gang pickup head 112 during tasks is avoided. In other words, the order of mounting for components is determined so as to suppress unnecessary increases in tact time due to excessive movement of the line gang pickup head 112 between successive mounting points.

2.8 Return Optimization

Return optimization is a third example of a specific algorithm for the optimization the mounting order shown as S521 in FIG. 19. This process corresponds to step S325 in FIG. 14.

This method focuses, for one task group, on the return path which the line gang pickup head 112 takes after completing the mounting of the components in one task in order to pick up the components for the next task, and aims to optimize the order of tasks that compose the same task group.

Figure 32:
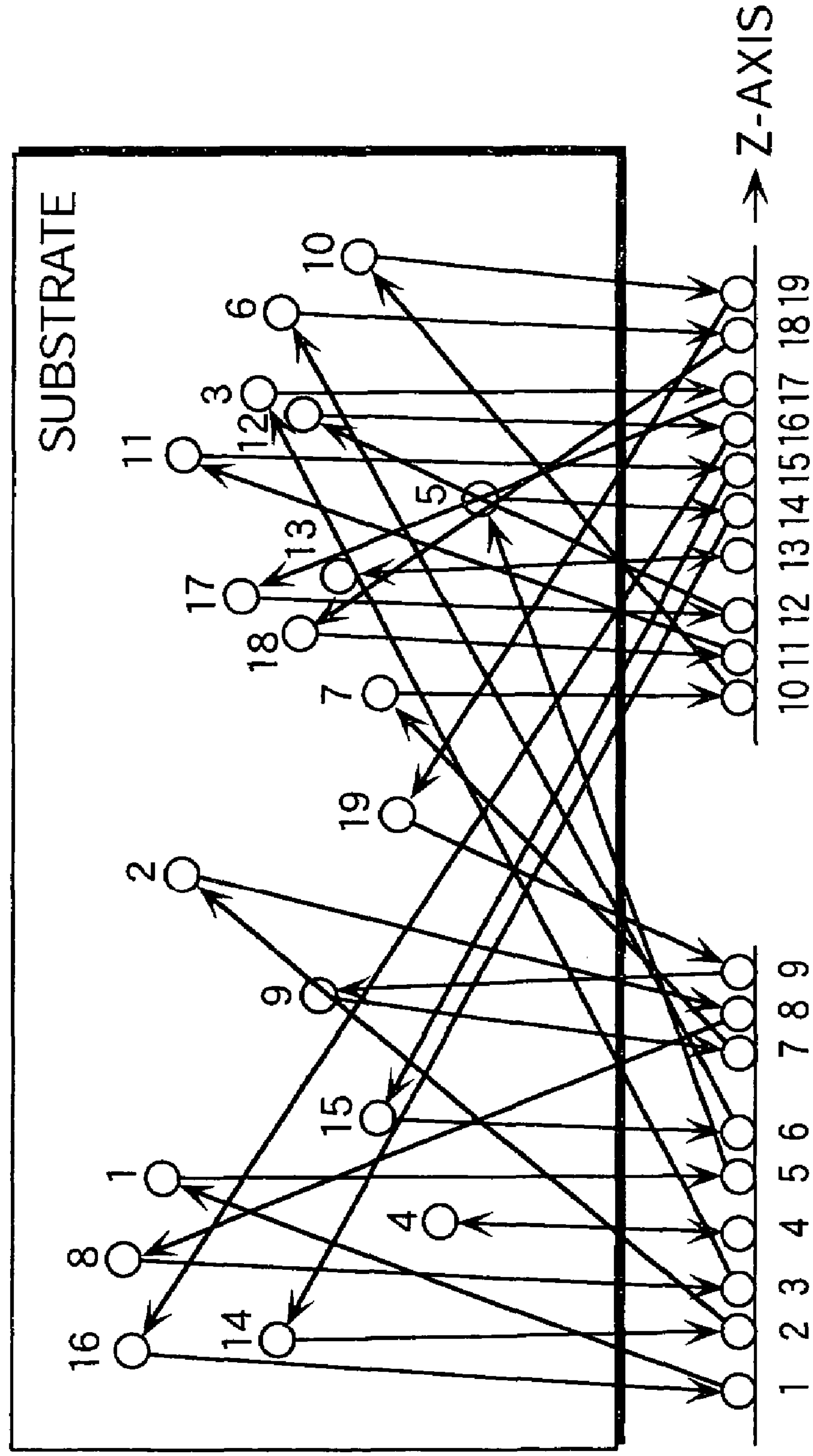
FIG. 32 shows the return paths for the line gang pickup head that are generated when optimizing the order of tasks using the return optimization method.

FIG. 32 shows the procedure used to optimize the order of tasks using this return optimization method. In FIG. 32, the movement paths (mounting paths) taken by the line gang pickup head 112 when moving between the substrate and the component supplying units are shown using arrows for the case when ten tasks are arranged along the Z-axis in each of the component supplying units 115*a* and 115*b*.

The circles in FIG. 32 show representative positions for the line gang pickup head 112. The circles drawn on the substrate show the position (final mounting point) of the line gang pickup head 112 just after the mounting of the final component in a task, while the circles drawn on the Z-axis show the positions (hereafter "pickup points") of the line gang pickup head 112 when picking up the first component in each of the twenty tasks. Note that numbers have been appended to the circles to identify the different pickup points (tasks).

First Step

This step traces the mounting paths according to the following rules.

(i) The line gang pickup head 112 should return from the final mounting point of each task to the closest pickup point, or in other words, the length of the return path should be minimized.

(ii) Mounting points are successively drawn with the first pickup point as the departure point. It should be noted that that one pickup point corresponds to one task, so that the final mounting point can be clearly specified for each pickup point. In FIG. 32 mounting paths joining the pickup points and final mounting points are drawn in the order 1, 5, 14, 2, 8, 3, 17, 12, 16, 1.

(iii) When the line gang pickup head returns to the first pickup point (pickup point number 1), the order produced thusfar is stored as a shortest looped partial path.

(iv) Next, a pickup point that is not included in a previous shortest looped partial path is found. In the example in FIG. 32, pickup point number 4 is found.

(v) The processing returns to step (ii) and the procedure is repeated thereafter until no pickup points remain. In FIG. 32, five shortest looped partial paths are found In this way, the first step finds an order of pickup points, which is to say, an order of tasks, that minimizes the total return path of the line gang pickup head 112 for the case where mounting commences for a specified pickup point.

Second Step

Next, the second step determines, for each of the shortest looped partial paths found in the first step, from which pickup point the shortest looped partial path should start. In more detail, in order to minimize the return path taken by the line gang pickup head 112 when moving to a next shortest looped partial path after mounting components at all of the mounting points in one shortest looped partial path, the second step determines the first pickup point to be used for each shortest looped partial path and the order in which the shortest looped partial paths are to be used.

In this way, return optimization determines the execution order of all of the tasks forming one task group so as to minimize the return path taken by the line gang pickup head 112 between consecutive tasks.

Figure 33:
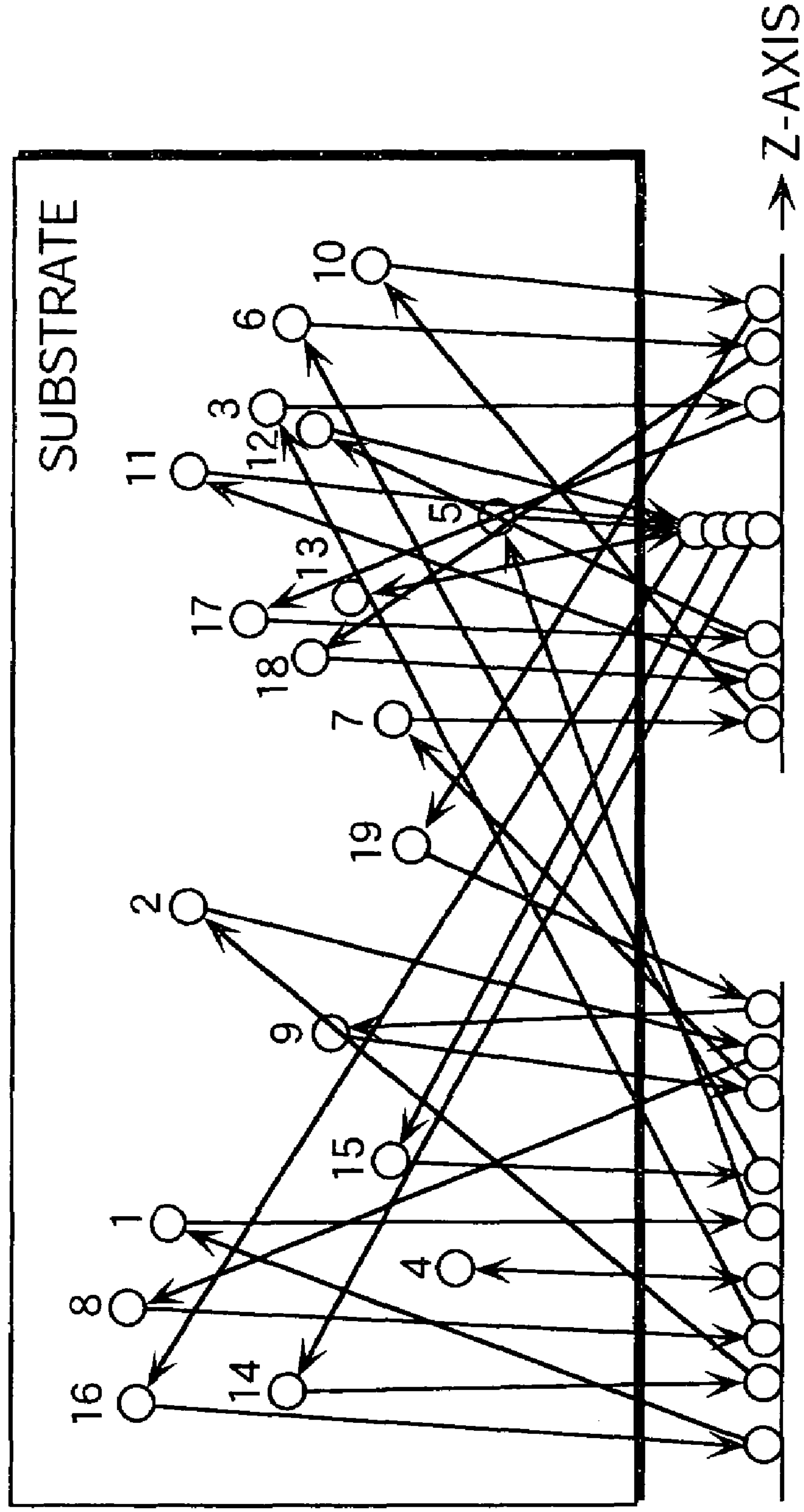
FIG. 33 shows the return paths for the line gang pickup head that are generated when a plurality of pickup patterns include the same position.

It should be noted that while FIG. 32 shows the mounting paths for a task group where the twenty pickup points are all at different positions, it is also possible to perform optimization for task groups where a plurality of pickup points are coincident, as shown in FIG. 33. In such cases, a degree of freedom can be exercised when selecting the final mounting point corresponding to a number of coincident pickup points. As a result, the total tact time for the task group is calculated for different selection patterns, and final mounting point for the selection pattern that minimizes the total tact time can be selected when generating the shortest looped partial paths.

Performing random selection and intersection disentanglement as described above optimizes the mounting order within tasks and optimizes the mounting order for all tasks, without affecting the tasks themselves. Performing return optimization optimizes the order of tasks after all of the tasks have been fixed (which is to say, after the composition of each task has been determined).

2.9 Optimization for General Components

For general components, there is a great variety in component sizes, nozzles used, component recognizing camera used, and supply method (tape, tray, etc.), so that various different components can be combined when generating tasks. Here, a method that efficiently changes the state of tasks while looking for the optimal state is used. This process corresponds to step S321 in FIG. 14.

The evaluation index used for optimization is mounting time, so that a mounting time simulator that can correctly simulate the operation time required by the mounter 100 is provided. The optimization algorithm used for general components is as follows.

(1) Setting of Loop Iterations

Since it is not realistic to evaluate every possible way of mounting components, end conditions are set in advance for the processing. In the present case, the optimization processing is made to end when no reduction in mounting time is achieved for a predetermined number of iterations of a loop.

(2) Generation of an Initial State

First, an initial state is generated for all of the general components. In the initial state, all of the mounting points of general components are sorted into task units, and provided all of the restrictions to which the mounter 100 is subject are satisfied, any state may be used.

(3) Varying the State

The state of tasks is varied to find the optimal state. The following are examples of methods that can be used to vary the state of tasks.

- Interchanging mounting points that are present in different tasks
- Interchanging the mounting order of two mounting points in the same task
- Interchanging two component tapes Here, in order to vary the state of tasks flexibly, it is also possible to interchange tasks with empty mounting points. In this case, the movement of a mounting point from one task to another task that is not full can also be regarded as the interchanging of mounting points between tasks. By repeating such processes, the number of tasks can be reduced.

The decision as to whether to accept the changes been made to the state is made according to whether a reduction has been achieved in the mounting time. However, if changes that result in a reduction in the mounting time are always accepted, there is the risk of being caught in a local minimum. Because of this, states where there is an increase in the mounting time are also accepted with a given probability.

The following describes the processing for the optimization of general components in detail.

Figure 34A:
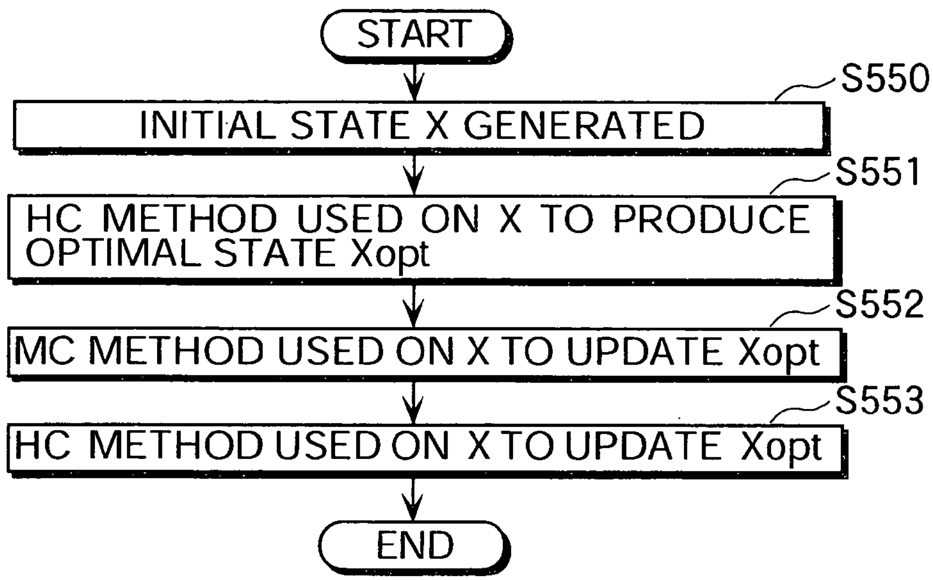
FIG. 34A is a flowchart showing the procedure used when the general component optimizing part optimizes the mounting order of general components.
Figure 34B:
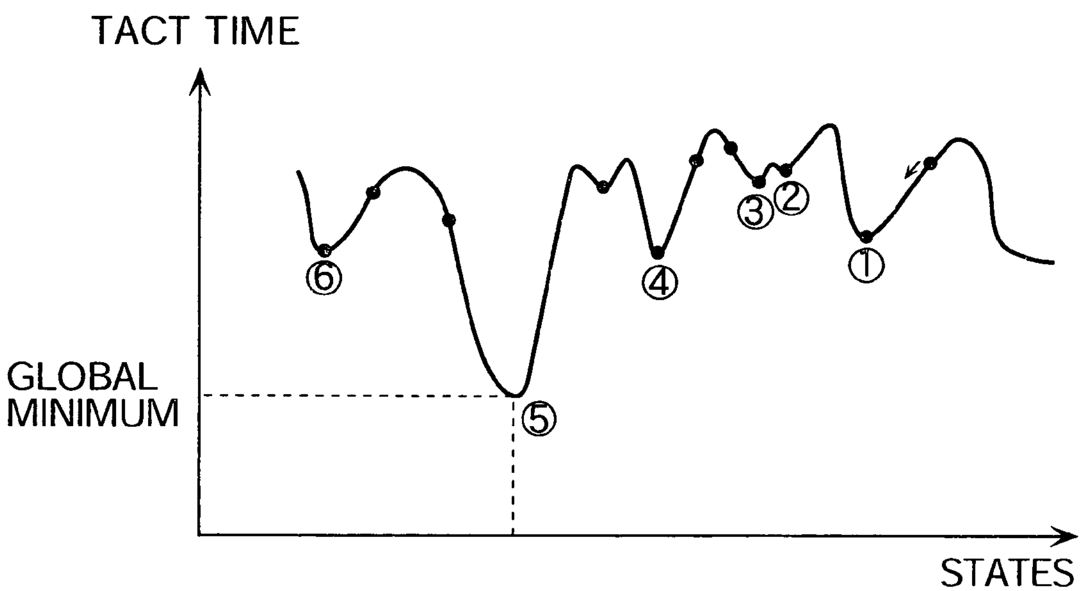
FIG. 34B shows the relationship between states and tact times to illustrate the approach used by this optimization to find the optimal solution.

FIG. 34A is a flowchart showing the procedure used when the general component optimizing part 316*b* optimizes the mounting order of general components. FIG. 34B is used to show the approach used by this procedure to find the optimal solution and illustrates the tact times for the various states that can be used.

As shown in FIG. 34A, the general component optimizing part 316*b* first generates an initial state X for all of the components belonging to the component groups G[6] to G[9] (the general components) (S550). After this, the general component optimizing part 316*b* has the optimizing engine part 316*c* perform optimization on the initial state X according to the hill climbing method, resulting in the calculation of the optimized state Xopt (S551). Next, the general component optimizing part 316*b* has the optimizing engine part 316*c* perform optimization on the initial state X according to the multicanonical method to update the optimized state Xopt calculated in step S551 (S552). Finally, the general component optimizing part 316*b* has the optimizing engine part 316*c* perform optimization on the updated optimized state Xopt according to the hill climbing method to further update the optimized state Xopt calculated in step S552 (S553).

In this way, optimization according to the multicanonical method that searches for an optimal solution from a global viewpoint (S552) is performed at a midpoint of the execution of optimization according to the hill climbing method that definitely finds a locally optimal solution (S551, S553). As a result, cases where the search for the optimal state ends with a state that is optimal on a local level but sub-optimal on a global level (state ① shown in FIG. 34B, for example) can be avoided, enabling a state that is optimal on a global level (state ⑤ in FIG. 34B) to be found.

Figure 35:
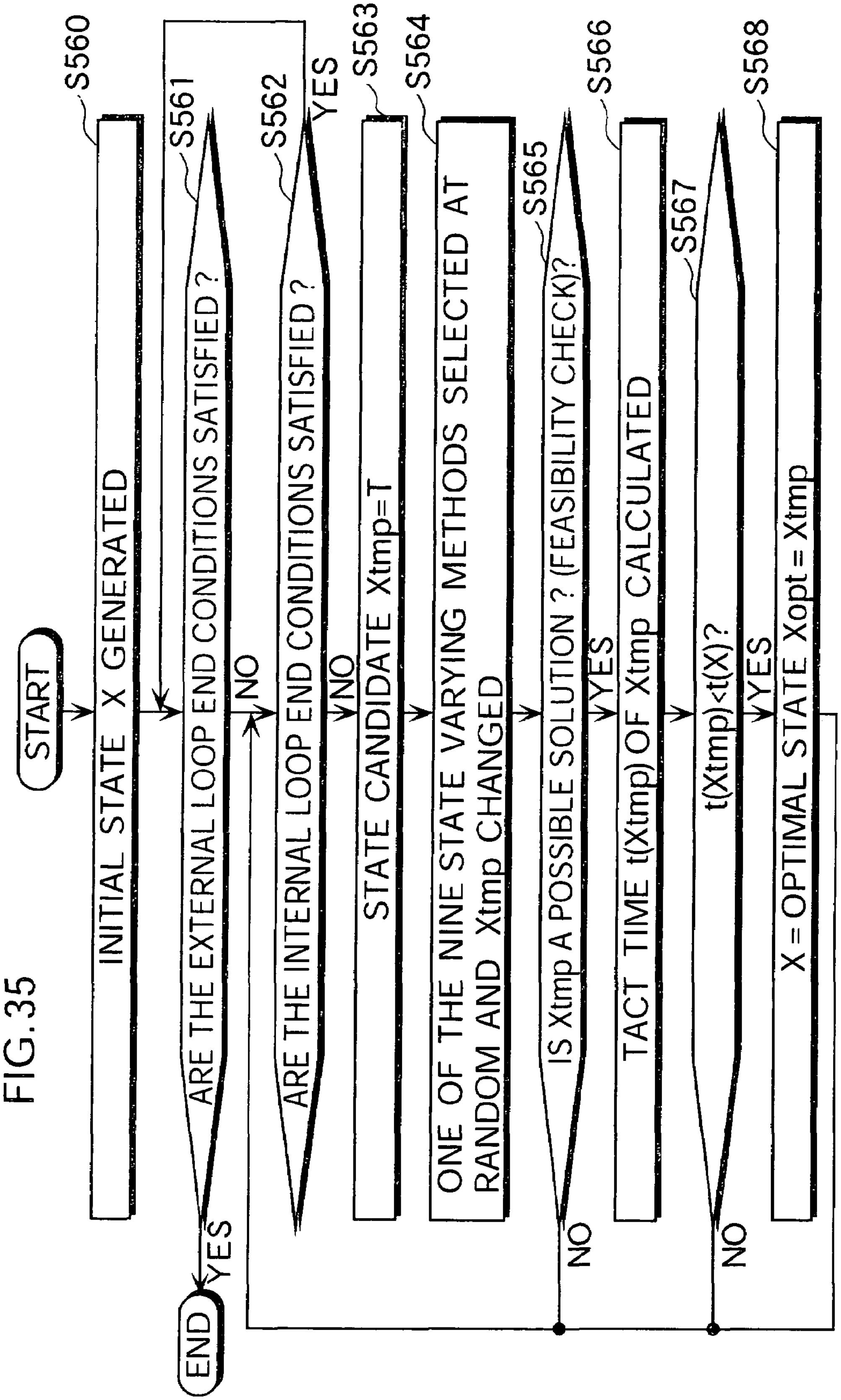
FIG. 35 is a flowchart showing the detailed procedure used when performing optimization according to the hill-climbing method (steps S551, S553) shown in FIG. 34A.

FIG. 35 is a flowchart showing the detailed procedure used when performing optimization according to the hill-climbing method shown in FIG. 34A. In detail, the optimizing engine part 316*c* is provided with a notification of the initial state X and the end conditions. After generating this initial state X (S560), the optimizing engine part 316*c* repeatedly performs the inner loop (S562 to S568) until the outer loop end conditions are satisfied (S561). Here, the expression "outer loop end conditions" refers to conditions for ensuring that the optimal solution is indeed optimal, with these conditions changing every type of parameter that can affect the state. The expression "inner loop end conditions" refers to conditions that change one type of parameter within a predetermined range.

During the inner loop, the optimizing engine part 316*c* first generates the state candidate Xtmp using a state variation selected by the general component optimizing part 316*b* out of nine types of state variation (described later) (S563, S564). When this state candidate Xtmp has feasibility (i.e., can potentially be used) (S565) and has a tact time that is shorter than the immediately preceding state (S566, S567), the optimizing engine part 316*c* updates the state and tact time using this state candidate Xtmp and its tact time (S568).

In this way, the inner loop definitely finds states that are optimal on a local level.

Figure 36:
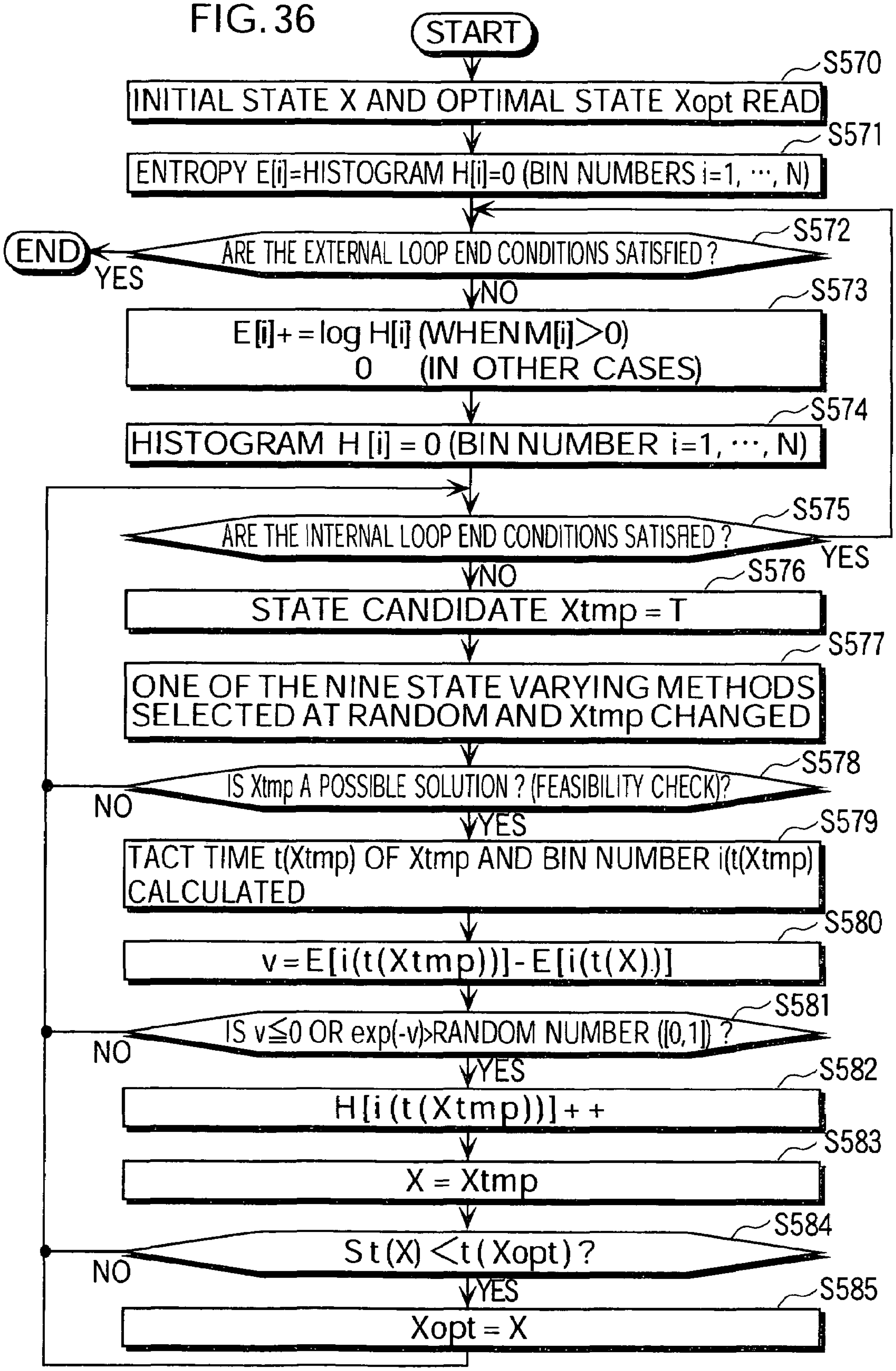
FIG. 36 is a flowchart showing the detailed procedure used when performing optimization according to the multi-canonical method (step S552) shown in FIG. 34A.

FIG. 36 is a flowchart showing the detailed procedure used when performing optimization according to the multicanonical method shown in FIG. 34A. In FIG. 36, a "bin number" is a number showing a section ("bin") produced by equaling dividing the horizontal axis shown in FIG. 34B (all of the possible states) by N. Histogram H[i] meanwhile is a variable storing the total number of times a state candidate Xtmp belonging to the bin with the bin number [i] been selected (S576,S577) and it has been judged that the state candidate Xtmp is feasible (S578) and reduces entropy (S579 to S581).

As can be understood by comparing the flowchart in FIG. 36 with the flowchart for the hill-climbing method that is shown in FIG. 35, the two methods are similar in repeating a series of processes where a state candidate Xtmp is generated from the initial state X and then it is judged whether this state candidate Xtmp should be accepted. The difference between the methods lies in the method used to judge whether the state candidate Xtmp should be accepted. In the hill-climbing method shown in FIG. 35, a definite judgement is made to accept the state candidate Xtmp if its tact time is lower than the tact time of the state X. However, in the multicanonical method shown in FIG. 36, the entropy exhibited by the tact time is examined and a probability-based judgement is made whether to accept the state candidate (S580 to S582).

The following describes the intermediate representations used by the general component optimizing part 316*b* in order to explain the nine state variations and concept of "feasibility" used in the flowcharts shown in FIGS. 35 and 36. To facilitate optimization, the general component optimizing part 316*b* introduces the following three expressions as intermediate representations of the arrangement of the Z-axis, and uses these representations to store the state and provide information to the optimizing engine part 316*c*.

(i) Gorder[i] (i=1, . . . , L)

This variable indicates the order of priority used when arranging the inputted L component groups (the task groups TG[i] (i=1, . . . , L)) along the Z-axis, and takes the priority order numbers 1 to L as values. When i!=j, Gorder[i] !=GorderU].

(ii) block[i](i=1, . . . , L)

This variable indicates whether the task groups TG[i] (i=1, . . . , L) should be arranged into the left or right Z block (the component supplying unit 115*a* or 115*b*), and takes a symbol indicating left or right.

(iii) Corder[i][j](i=1, . . . , L, j=1, . . . , M[i])

This variable indicates the order in which the component tape j (=1, . . . , M[i]) belonging to the task group TG[i] (i=1, . . . , L) should be arranged along the Z-axis, and takes the order numbers 1 to M[i]. When j!=k, Corder[i][j] !=Corder[i][k]. Note that when Corder[i][j]<Corder[i][k], the relationship "Z number of component tape j<Z number of component tape k" is valid.

FIG. 37 shows one example of the intermediate representations used by the general component optimizing part 316*b*. Table 460 shows a specific example of the intermediate representations used by the general component optimizing part 316*b*, while tables 461 to 464 show the meanings (conversions into arrangements along the Z-axis) of the intermediate representations shown in table 460. These arrangements along the Z-axis representing the intermediate representations shown in table 460 are specified by performing the specific conversion described below.

First, the task group TG[2] where Gorder[i]=1, which is to say, the task group with the highest priority when determining the arrangement along the Z-axis, is arranged (table 461). The variable block[2] is set at "right" for TG[2], so that TG[2] is positioned at the leftmost position of the right block next to the component recognizing camera 116. Here, the total M[i=2] is equal to six for TG[2], meaning that component feeders 114 holding six component tapes j(i=1, . . . , 6) are arranged at the leftmost position of the right block next to the component recognizing camera 116 with the component feeder 114 for the component tape with the lowest Corder[i=2][j] value being positioned furthest to the left.

Next, the task group TG[4] where Gorder[i]=2 is arranged (table 462). The variable block[4] is set at "left" for TG[4], so that TG[4] is positioned at the rightmost position of the left block next to the component recognizing camera 116. Here, the total M[i=4] is equal to three for TG[4], meaning that component feeders 114 holding three component tapes j(i=1, . . . , 3) are arranged at the rightmost position next to the component recognizing camera 116, with the component feeder 114 for the component tape with the lowest Corder [i=2][j] value being positioned furthest to the right.

In the same way, TG[3] for whom Gorder[i]=3 and TG[1] for whom Gorder[i]=4 can be arranged in this order (tables 463 and 464).

The following describes the nine state variations that can be selected (step S564 in FIG. 35, step S577 in FIG. 36) by the general component optimizing part 316*b*. The nine state variations are as follows.

(1) Two mounting points are selected at random from the same general components group, and the task numbers and head numbers (positions of the pickup nozzles 112*a* and 112*b* on the line gang pickup head 112) of these mounting points are interchanged.

(2) Two mounting points are selected at random from the same task and the mounting orders of these mounting points are interchanged.

(3) Two task groups (two general components groups) are selected at random and the Gorder values of these groups are interchanged.

(4) One task group (one general components group) is selected at random and the block value of this group is changed (i.e., switched to either "left" or "right").

(5) Two component tapes in the same task group are selected at random and the Corder values of these component tapes are interchanged.

(6) A number of component tapes with consecutive Corder values are selected at random from the same task group and are shifted.

(7) A number of component tapes with consecutive Corder values are selected at random from the same task group and the Corder values are changed so as to arrange these component tapes along the Z-axis in accordance with the average X coordinate values of the mounting points for the component tapes.

(8) One task is selected at random and the head numbers are changed based on the Z numbers of the mounting points of this task.

(9) The transport mode for tray components that can be shuttled is changed at random (between direct mode and shuttle mode).

In this specification, the expression "transport mode for tray components" refers to the method used when supplying tray components using an elevator provided in the tray supplying unit 117 that has a plurality of levels. The supplying of components amounts to the movement of them to a position where they can be picked up by the line gang pickup head 112. "Direct mode" is a method where the trays in which components are stored are directly presented to the line gang pickup head 112 one at a time, while "shuttle mode" is a method where a shuttle conveyor 118 makes a round trip to collect components from a plurality of trays and present a row of components to the line gang pickup head 112. Various kinds of information about these transport modes is included in the mounter information 307*c*, with the transport mode used affecting the time required to move the required components to the required positions.

The general component optimizing part 316*b* checks whether a state is feasible (in step S565 in FIG. 35 or in step S578 in FIG. 36) as follows. When a state simultaneously satisfies all six of the following conditions, the general component optimizing part 316*b* regards the state Xtmp as a feasible solution.

(1) For each task, the Z numbers of the mounting points supplied using direct mode need to be on the same level in the tray supplying unit 117. This means that direct mode is intended for use only when the components that are simultaneously supplied are located on the same level.

(2) There needs to be no interference between the pickup points of the components composing each task. In other words, cases are avoided where there is the risk, due to the shapes of the components, of adjacent components that are simultaneously picked up coming into contact.

(3) In each task, it must be possible to pick up the components required for all mounting points (i.e., the pairings of head numbers for mounting points and Z numbers must be appropriate). This condition takes into consideration the restriction that not every pickup nozzle provided on the line gang pickup head 112 is able to move to every position in the 96 component feeders 114.

(4) In each task, it must be possible to mount components at the mounting points (the pairings of head numbers for mounting points and coordinates must be appropriate). This condition takes into consideration the restriction that not every pickup nozzle provided on the line gang pickup head 112 is able to move to every possible position on a substrate.

(5) The pickup nozzles in the nozzle station 119 must be arranged in a manner that makes the pickup nozzle patterns for every task in every task group possible. In other words, this condition takes into consideration the restrictions regarding the positions and numbers of replacement pickup nozzles that can be arranged in the nozzle station 119.

(6) The nozzles on the line gang pickup head 112 and components arranged along the Z-axis need to have the same pitch. In other words, it is confirmed that the components (or component feeders) to be simultaneously picked up by the line gang pickup head 112 are properly arranged along the Z-axis.

In this way, instead of performing just a local optimization, the general component optimizing part 316*b* performs an optimization that includes a probability-based search (steps S550 to S553 in FIG. 34A), thereby avoiding undesirable cases where a local minimum is found as the optimal solution.

3 Operation of the Optimization Apparatus (Details)

The following describes the operation of the optimization apparatus 300 in more detail. This explanation focuses on the detailed content of the various algorithms mentioned earlier and describes how they operate under various restrictions.

3.1 Cut Down Procedure

The cutting down process (steps S320*a* to 320*d* in FIG. 14) is an algorithm that makes up for the drawbacks with the task group generation method described earlier The following describes the cut down procedure in detail while clarifying the problems with the task group generation method.

3.1.1 Overview of the Task Group Generation Method

Figure 38:
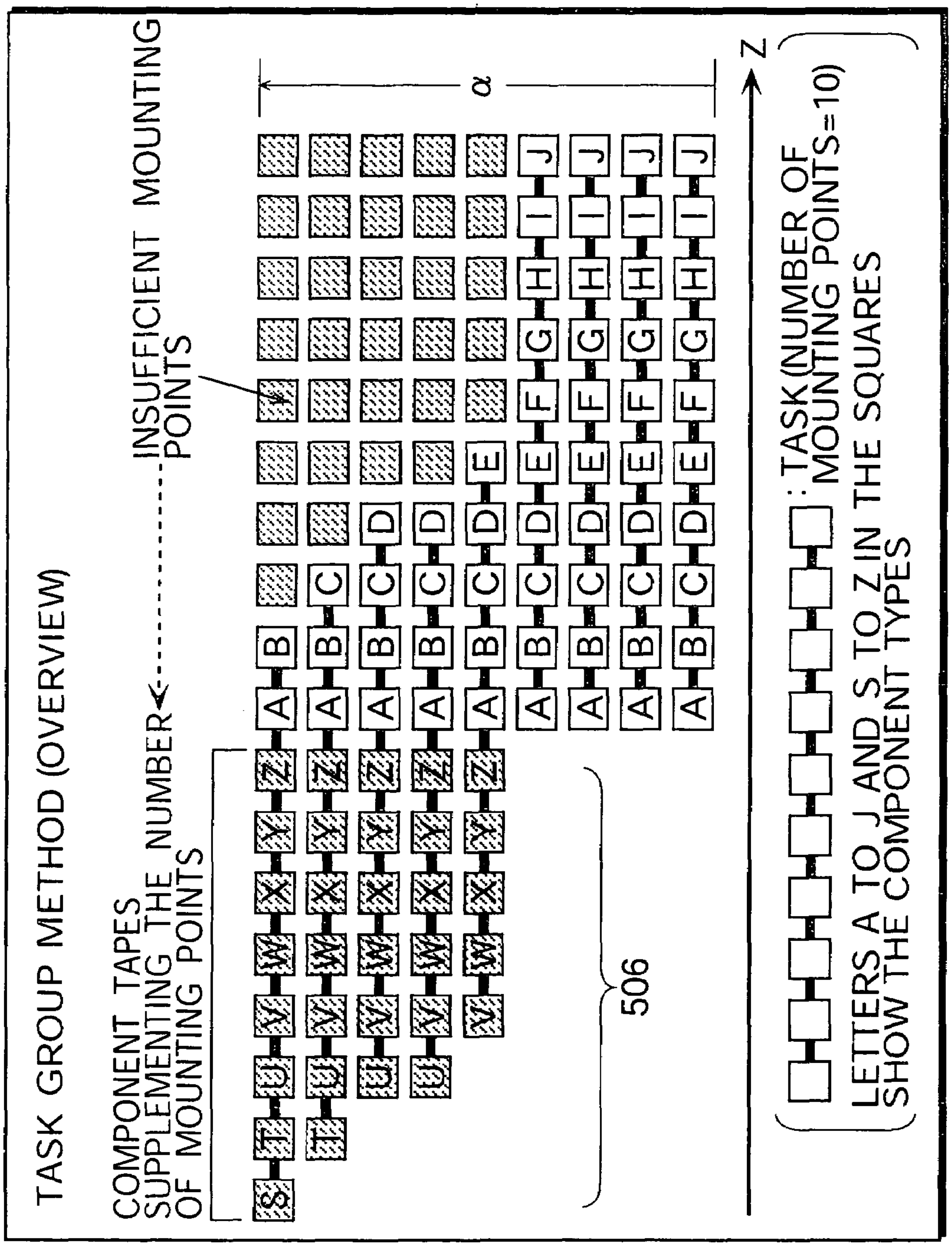
FIG. 38 is a component histogram for explaining the concept of optimization using the "task group method".

The fundamental principles of the algorithm used for optimizing small components as part of the task group generation method are as follows. As shown in FIG. 38, when the nozzles provided on the head is "n" the algorithm attempts to form, for all of the components to be mounted, groups of n component tapes that have the same number of components to be mounted, and to have one component simultaneously taken from each of these n component tapes so as to form tasks where n components are simultaneously picked up. With the mounters used in the present embodiment, "n" has the value "10" (or "4").

FIG. 38 is a component histogram that is used to explain the task group generation method. The horizontal axis of FIG. 38 shows the Z-axis (along which component feeders (i.e., component types) are arranged), while the vertical axis shows the total number of components to be mounter for each component type.

However, since in reality not all component tapes have the same number of components to be mounted, the above algorithm divides the component tapes to produce component tapes that have the same number of components to be mounted.

When there are still differences between n component tapes in the number of components to be mounted (the components A to J in FIG. 38, for example), component tapes that supplement the number of components to be mounted and remove such differences are produced and arranged next to the n component tapes. A maximum of (n−1) of such component tapes may be arranged in this way (see the left section 506 in FIG. 38).

The group of n to n+(n−1) component tapes produced in this way is set as a "task group". This name is chosen as components taken from these component tapes form a number of tasks.

Usually, a plurality of task groups are formed. The number of task groups depends on total number of component types, but in some cases, only one task group is formed.

The arrangement of component feeders along the Z-axis is performed in units of task groups.

3.1.2 Problems with the Task Group Generation Method

The task group generation method has the following problems.

(1) Since component feeders are arranged along the Z-axis in units of task groups, it is not possible to arrange a task group unless there are at least 10 empty positions on the Z-axis. As a result, unused positions end up being left along the Z-axis.

(2) Little freedom can be exercised when arranging task groups, and since it is difficult to move component types (component tapes and component feeders) between the front stage 110 and the rear stage 120, it is difficult to adjust the balance of the mounting times of the front stage 110 and rear stage 120.

(3) When a component tape is divided during the production of a task group, each component tape created by the division uses another component feeder. When the total number of task groups is considered, there is a tendency for such division to make a large number of component feeders necessary.

These problems arise due the number of component tapes composing each task group (between 10 and 19 when the line gang pickup head 112 has ten nozzle heads) being of the same order as the number of component tapes that can be arranged along the Z-axis (48 when single-cassette feeders are used and 96 when double-cassette feeders are used).

As a result, little freedom can be exercised when arranging task groups along the Z-axis. As one example, if the maximum number of component tapes that can be arranged along the Z-axis is around ten times the number of component tapes composing a task group, it is believed that there will be fewer restrictions on the freedom with components can be arranged.

3.1.3 Cut Down Procedure

The cut down procedure is composed of three processes, namely the "component histogram generation process" (step S320*a* in FIG. 14), the "cut down process" (step S320*c* in FIG. 14), and the "core crush process" (step S320*d* in FIG. 14). These processes were conceived in view of the problems with the task group generation method. Note that in the following explanation, the number of nozzles on the line gang pickup head 112 is assumed to be "n".

(1) Component Histogram Generation Process (Step S320*a* in FIG. 14)

The component histogram generation process generates a histogram (a "component histogram") in which component tapes are arranged in descending order of the number of components to be mounted, with the presence of such a component histogram being a prerequisite for the cut down process.

In the task group generation method, component tapes are sorted into a number of groups called "task groups". In the cut down procedure, however, the component tapes are arranged into a single group called a "component histogram".

The component histogram is divided into units of component tapes. The resulting component tapes can be arranged in either the front stage 110 or the rear stage 120, so that components can be moved between the front stage 110 and rear stage 120 in smaller units than in the task group generation method.

(2) Cut Down Process (Step S320*c* in FIG. 14)

The cut down process generates a pickup pattern from the component histogram. The fundamental operation of the cut down process is the removal of one component from each of n component tapes on the side of the component histogram where the remaining number of components to be mounted is small to form pickup patterns where n components are simultaneously picked up.

As a result of the cut down process, there are some component tapes with components that are yet to be picked up. These component tapes are called "core component tapes". In the same way, the feeders holding core component tapes are called "core feeders".

The number of core component tapes is always (n−1), regardless of the number of component tapes that compose the initial component histogram.

The advantage of the cut down process is that the problem of dividing potentially all of the component tapes composing the generated tasks in which n components are simultaneously picked up is reduced to the problem of having to divide only the core component tapes to generate tasks in which n components are simultaneously picked up.

The parts of the component histogram that are not the core component tapes have already been used to form tasks in which n components are simultaneously picked up, so that only the core component tapes have to be divided to form tasks in which n components are simultaneously picked up. This process is called the "core crush process".

(3) Core Crush Process (Step S320*d* in FIG. 14)

The core crush process is an extension of the concept of the task group generation method of producing component tapes to make up for shortfalls in the number of mounting points. In this way, tasks in which n components are simultaneously picked up are generated.

Since there are between one and (n−1) core component tapes, the number of component tapes with shortfalls in the number of mounting points is between (n−1) and one.

In the task group generation method, supplementing component tapes are required for each group. On the other hand, in the cut down procedure, there is only one group of component tapes, so that (n−1) supplementary component tapes are required at most. As a result, fewer feeders are used than with the task group generation method.

In the task group generation method, when each component tape has been divided into its maximum number of divisions, the component tape with the highest number of components to be mounted is found. The number of pickup patterns (in which n components are simultaneously picked up) generated by the task group generation method is equal to this highest number of components On the other hand, the core crush process finds the total number of components in the core component tapes, divides this number by n, and uses this value when estimating the number of pickup patterns in which n components are simultaneously picked up.

3.1.4 Optimization for Small Components According to the Cut Down Procedure

The following describes the optimization performed for small components by the cut down procedure with the advantages described above.

Figure 39:
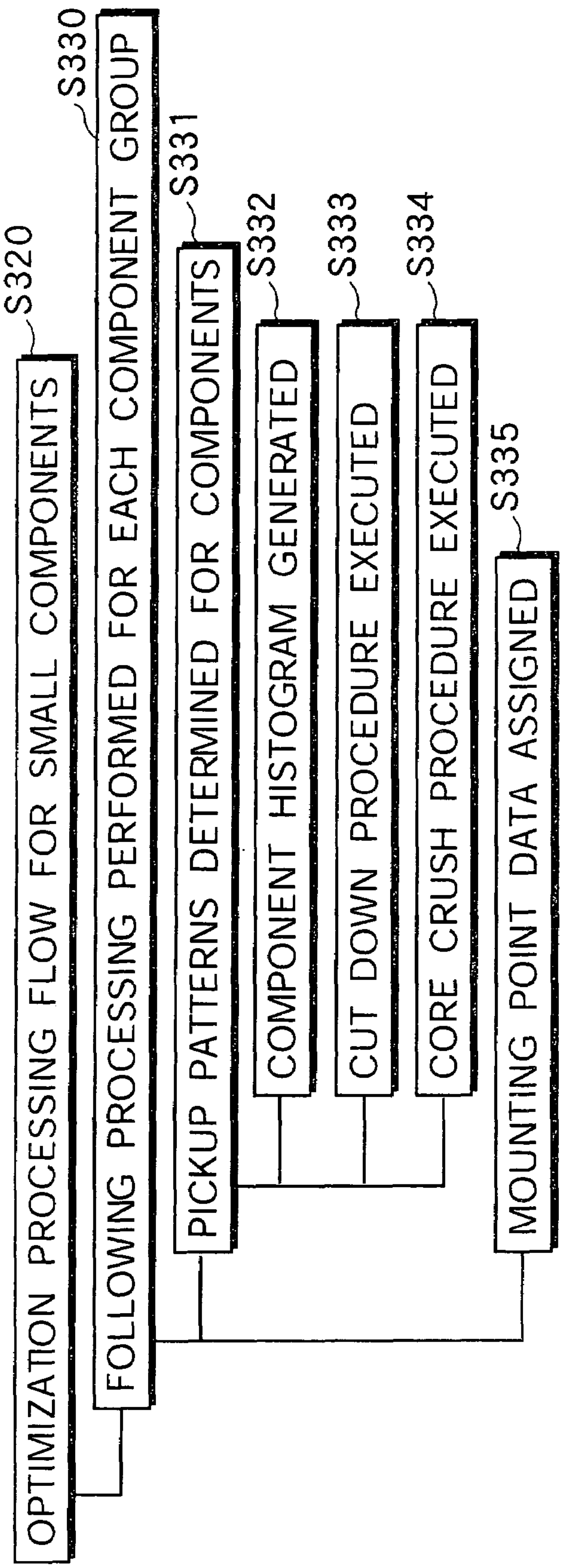
FIG. 39 is a flowchart showing the optimization processing for small components.

FIG. 39 is a flowchart showing the optimization process (corresponding to step S320 in FIG. 14) achieved for small components by the cut down procedure. Objectives of the optimization performed for small components include the minimization of the number of nozzle strokes by the line gang pickup head 112 when picking up components and the minimization of the distance moved by the line gang pickup head 112 when mounting components. In other words, this process determines pickup patterns formed of the maximum of ten simultaneously picked up components (S331) and assigns the mounting data in a manner that minimizes the distance moved by the line gang pickup head 112 (S335)

(1) Determination of the Pickup Patterns (S331 in FIG. 39)

To determine the pickup patterns, the order of the component tapes and the order in which components are picked up by the line gang pickup head 112 need to be determined. In other words, it is necessary to determine the order in which the component tapes should be set in the component supplying units 115*a* and 115*b* and the order in which the line gang pickup head 112 should pick up components from the component tapes set in this way.

(i) Generation of a Component Histogram (S332 in FIG. 39)

Figure 40A:
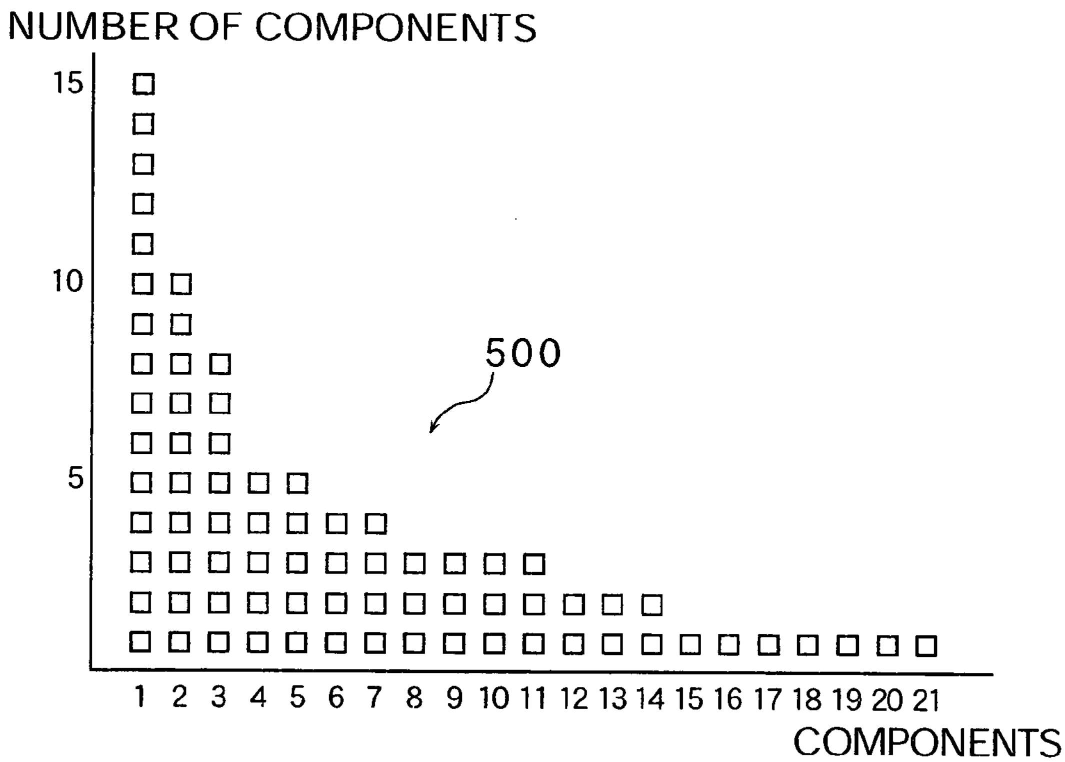
FIG. 40A shows a component histogram in which there are 21 component tapes.

The electronic components are sorted into component types and a component histogram is generated. The horizontal axis represents the order (Z-axis arrangement) of the component tapes, so that the component histogram is a table showing in which of the component supplying units 115*a* and 115*b* the components have been set. Small components are enclosed in 8 mm tapes, so that ten components can be simultaneously picked up. By looking along the Z-axis of the component histogram, it is easy to judge which components can be simultaneously picked up. FIG. 40A shows a component histogram 500 in which there are 21 component tapes, the lowest number of components to be mounted for any of the tapes is 1, and the highest number of components to be mounted is 15.

(ii) Cut Down Process (S333 in FIG. 39)

Figure 40B:
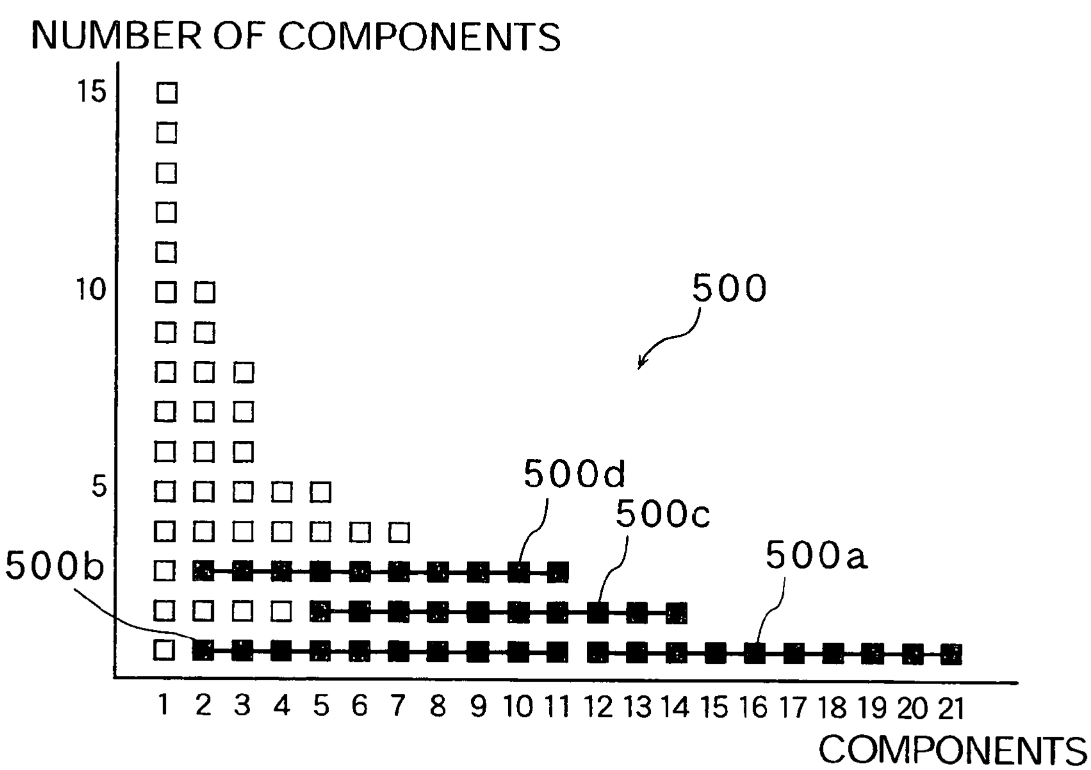
FIG. 40B shows how the cut down procedure is performed on this component histogram.

In the component histogram 500 shown in FIG. 40A, sets of ten consecutive components are found starting from the right side where component tapes with few components to be mounted have been arranged. This process cuts down a set of 10 components from the component histogram 500 starting with the component tapes with few components to be mounted, and so is referred to as the "cut down process". As shown in FIG. 40B, this cut down process generates four tasks 500*a* to 500*d* in which 10 components are simultaneously picked up.

(iii) Core Crush Process (S334 in FIG. 39)

Figure 41:
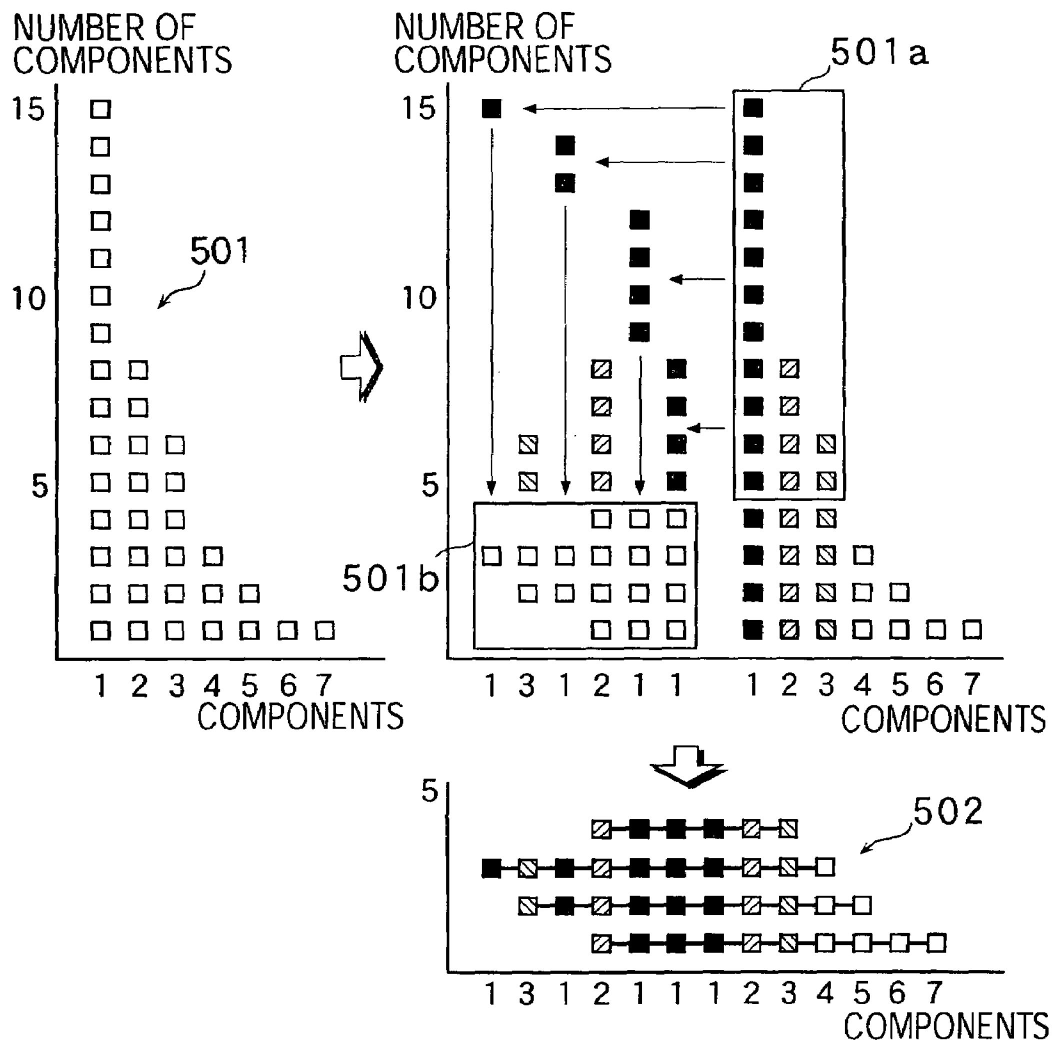
FIG. 41 is a component histogram showing how the core crush process is performed.

When the four tasks 500*a* to 500*d* in which 10 components are simultaneously picked up (shown in FIG. 40B) are removed from the component histogram 500, a component histogram 501 with a narrow bottom is produced, as shown in FIG. 41. This remaining component histogram 501 is referred to as the "core". Since the width of the core 501 in the Z-axis is less than 10, it is not possible to generate a task in which 10 components are simultaneously picked up with the core 501 in this state. For this reason, the "core crush process" is performed to crush the core 501 and generate tasks in which 10 components are simultaneously picked up.

First, the number of components composing the core 501 is counted and the target is set. A total of 36 components are present in the component histogram 501 shown in FIG. 41, so that a decision is taken to produce three tasks in which 10 components are simultaneously picked up and one task in which 6 components are simultaneously picked up.

In order to be able to cut down tasks in which 10 components are simultaneously picked up from the core shown in FIG. 41, the lowest level in the core 501 needs three more components, the second lowest level needs five more components, and the third lowest level needs six more components. Once a total of 36 components have been cut down from the core 501, the pattern 501*b* in FIG. 41 is completed. By assigning components to the pattern 501*b*, the tasks set as the target can be generated. The number of components included in the pattern 501*b* is equal to the number of components present in the pattern 501*a* that is situated on the fifth level upwards of the original component histogram. This means that by dividing the components in the pattern 501*a* in units of component tapes, pattern 501*b* can be filled in the vertical direction.

As shown in FIG. 41, 11 components are left for component number 1 in the pattern 501*a*. These components are divided into 4+4+2+1 vertical sections that are inserted in that order into the pattern 501*b*. The remaining components for component numbers 2 and 3 are not divided and are inserted into the pattern 501*b* to complete the core crush process.

Figure 42:
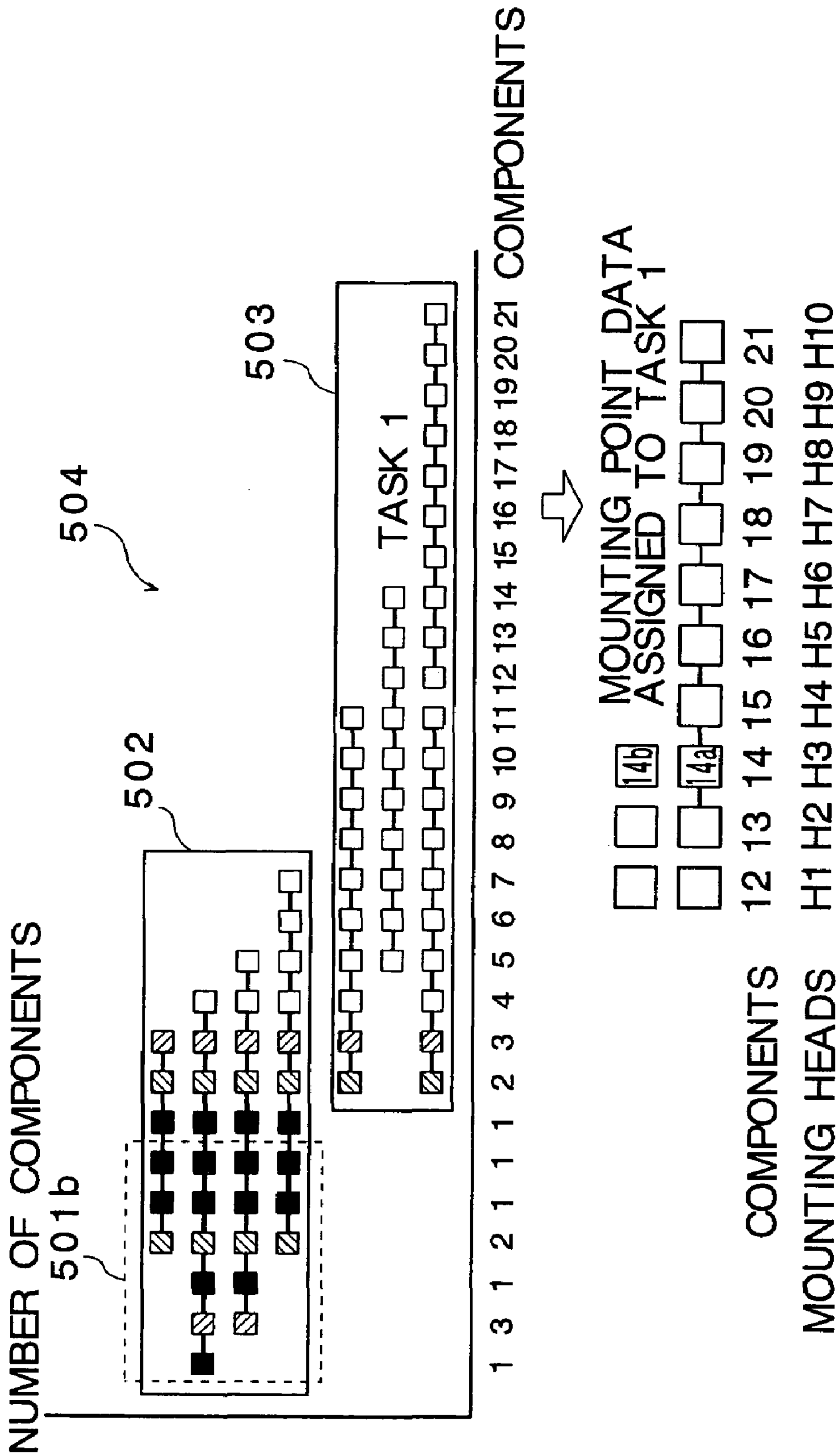
FIG. 42 is a component histogram showing the state after the cut down process and core crush process have been performed.

When both the cut down process and the core crush process are performed, the component histogram is transformed to the component histogram 504 shown in FIG. 42. The component histogram 504 includes both tasks 503 that were generated by the cut down process and tasks 502 that were generated by the core crush process. This component histogram 504 corresponds to an ideal pickup pattern, with all the components being efficiently picked up by seven tasks in which 10 components are simultaneously picked up and one task in which task 6 components are simultaneously picked up.

(2) Allocation of Mounting Point Data (S335 in FIG. 39)

The allocation of mounting point data starts from the task with the lowest number of components to be mounted. In the component histogram 504 shown in FIG. 42, the allocation of mounting points starts with the task including component number 21 of which only one component is to be mounted. In task 1, only one component is to be mounted for each of the seven components, component number 15 to component number 21, so that the data present in the mounting point data can be assigned without amendment. Two components are to be mounted for component number 14, giving rise to the problem of which of the two pieces of mounting point data should be selected. In this case, the piece of mounting point data that minimizes the movement of the line gang pickup head 112 after the mounting of the already decided component 15 is selected.

However, since component number 15 is picked up using the mounting head H4 and component number 14 is picked up using the mounting head H3, a mounting point needs to be selected with consideration to the offset between the mounting heads H4 and H3. This is also the case when selecting the mounting point for component number 13. As one example, if the mounting point data for component 14*a* is selected out of the component numbers 14*a* and 14*b*, the mounting point for component 13 is selected having calculated the distance from the mounting point for component number 14*a*. The same process is repeated once more to select one of the mounting points of component number 12, thereby determining all of the mounting points for one task.

3.1.5 Individual Processes

The cut down procedure is a process for generating tasks (proper pickup patterns) from component types in the component groups that have been classified as small components.

The details for this process are given in the following sections of this specification.

Cut Down Procedure

Task Generation Process for Small Components 3.2 Intersection Disentanglement

Intersection disentanglement is an algorithm that makes up for the drawbacks with the greedy method described earlier This process corresponds to step S324 in FIG. 14.

The following describes the intersection disentanglement method in detail while clarifying the problems with the greedy method.

3.2.1 Overview of the Greedy Method

When allocating mounting points to tasks, mounting points are selected from the component types so as to minimize the distance between the mounting points at which components are mounted by the nozzles. When calculating the distance, the nozzle pitch (i.e., distance between nozzles) is considered.

The mounting point selection method used is the greedy method. This process corresponds to step S320*e* in FIG. 14.

In the greedy method, even if the distance between mounting points for a given task has been minimized, no attention is paid to the distances between mounting points of other tasks, so that when all tasks are considered, the present choice of mounting points may not be optimal.

3.2.2 Problems with the Greedy Method

Figure 43:
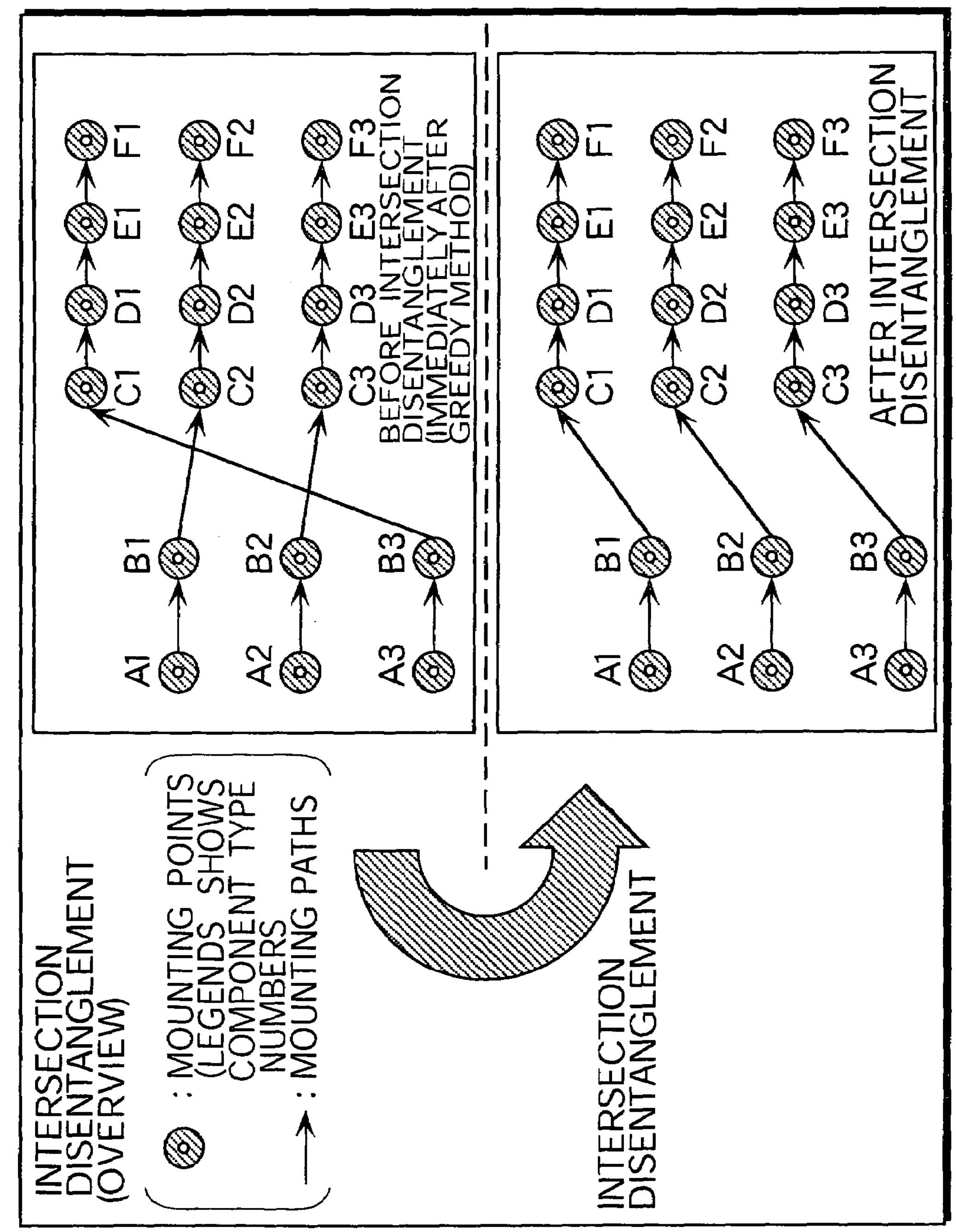
FIG. 43 shows some mounting paths in order to illustrate the concept of optimization through intersection disentanglement.

When mounting points are assigned to pickup patterns using the greedy method, there is the problem that in some cases, mounting paths such as those that shown in the upper part of FIG. 43 (a drawing in which the mounting points forming each task have been arranged in accordance with their positions on a substrate and linked by lines in order of mounting) are selected.

FIG. 43 shows a case where there are three tasks each with five mounting points. In FIG. 43, the circles represent the mounting points, while the arrows show the mounting path (order of mounting). The legends appended to the mounting points show the component types. As one example, the legends A1, A2, and A3 show the three mounting points for the component type A. Mounting points linked by arrows drawn using the same style compose one task.

First, in the "before intersection disentanglement" state at the top of FIG. 43, the mounting point for the component type B1 is selected as the closest mounting point to the mounting point for the component type A1, and the mounting point for the component type C2, not the mounting point for the component type C1, is selected as the closest mounting point to the mounting point for the component type B1. This is because in the greedy method, the closest mounting point is selected as the next mounting point at which mounting is to be performed.

When the greedy method is repeatedly used to select mounting points, the line linking the mounting point for the component type B3 with the mounting point for the component type C1 ends up crossing the paths that link other mounting points, as shown in the "before intersection disentanglement" state at the top of FIG. 43.

3.2.3 Intersection Disentanglement

If a human were to decide the mounting paths, it is likely that he or she would choose link the mounting points in a manner where the mounting paths do not intersect, like in the "after intersection disentanglement state" shown at the bottom of FIG. 43.

Because of this, after mounting points have been selected using the greedy method, processing that find intersections between mounting paths and eliminates such intersections should be performed. Such processing is called "intersection disentanglement".

If intersection disentanglement is performed, the "after intersection disentanglement state" shown at the bottom of FIG. 43 is produced. When compared to the state before intersection disentanglement, a reduction in the total length of the mounting paths can be expected.

In more detail, by interchanging the selection of two of the mounting points for the component types B1 to B3 in the example in FIG. 43, the mounting paths are reconstructed, and by repeating this process, tasks with shorter mounting paths can be produced.

It should be noted that in reality, it is also necessary to consider the intervals between nozzles. The above example was conceived merely to illustrate the concept of intersection disentanglement, and so does not take this into account. Intersection disentanglement is described in detail as part of the explanation of the individual processes given below.

3.2.4 Related Individual Processes

Intersection disentanglement finds intersections between mounting paths that are present after mounting points have been selected using the greedy method and eliminates such intersections. Compared to the state before intersection disentanglement of the mounting paths, a reduction in the total length of the mounting paths can be expected.

The details of this process are given in the following section. Intersection Disentanglement 3.3 Return Optimization The following describes the "return optimization method" in detail, while clarifying its conceptual processes. This process corresponds to step S325 in FIG. 14.

3.3.1 Evaluation of the Component Mounting Operation

Figure 44:
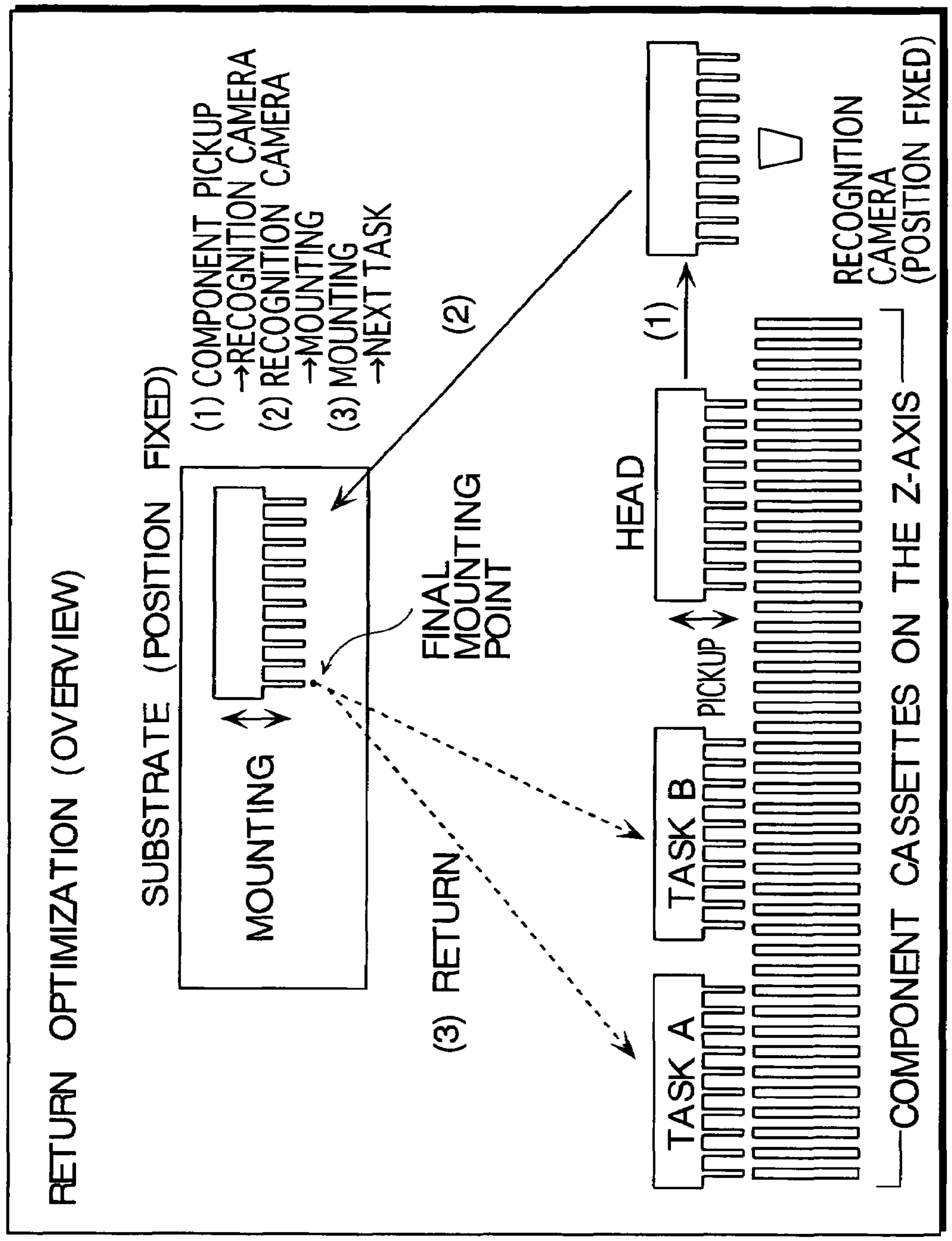
FIG. 44 shows the movement of the line gang pickup head in order to explain the concept of return optimization.

As shown in FIG. 44, the operation for mounting components can be divided on a macro level into the following three processes.

(1) Component Pickup→Component Recognizing Camera (2) Recognition→Component Mounting (3) Component Mounting→Next Component Pickup . . . (Return)

3.3.2 Necessity of Optimizing the Return Process

Process (1) given above is optimized by arranging component tapes with many components to be mounted at positions on the Z-axis that are close to the component recognizing camera.

In process (2), the distance does not change significantly, so that optimization is not performed. This is because the positions of the component recognizing camera and the substrate are fixed, the movement of the line gang pickup head above the substrate during mounting is relatively small compared to the length of the Z-axis, and all of the mounting points are thought to be present near the center of the substrate.

However, optimization is performed for the return process (3) even though the distance moved is around the same as the distance moved for process (2). By optimizing this process, reductions in mounting time are expected.

3.3.3 Return Optimization

The following describes an optimization algorithm for use in the "return" process (process (3)) mentioned above.

The basic concept behind this optimization algorithm is to find a task, out of the tasks that are yet to be mounted, whose position on the Z-axis minimizes the return distance of the line gang pickup head from the coordinates of the final mounting point in a present task, and to set this task as the next task to be mounted. As one example, in FIG. 44, task B is closer to the final mounting point than task A, so that task B is selected as the next task to be mounted.

3.3.4 Related Individual Processes

The operation for mounting components can be divided on a macro level into the following three processes.

(1) Component Pickup→Component Recognizing Camera (2) Recognition→Component Mounting (3) Component Mounting→Next Component Pickup . . . (Return)

The return optimization method optimizes the distance moved by the line gang pickup head in process (3), and so is expected to result in a reduction in the mounting time.

The details of this process are given in the following section.

Return Optimization Method 3.4 Fixed Arrangement Processing 3.4.1 Overview

In some cases, the user indicates Z numbers for arranging a plurality of component types. Such numbers indicate the order of component types along the Z-axis, and so are called "fixed arrangements".

On the other hand, the arrangement of component tapes along the Z-axis is subject to optimization by the optimization algorithm, so that it is necessary to use an optimization algorithm that considers the fixed arrangements indicated by the user.

It should be noted that a great variation in the fixed arrangements indicated by users is likely.

Even if it is possible to predict a number of fixed arrangements when devising an algorithm and to produce an optimization algorithm that can manage such fixed arrangements, such optimization algorithm may not be able to manage other fixed arrangements. This is because there is the tendency for algorithms to become specialized for the predicted fixed arrangements, so that there is the risk of such algorithms having no effect when confronted with other fixed arrangements.

Even if the algorithms are reconstructed so as to be able to handle other fixed arrangements, this involves adding algorithms for exception processing, which lowers the readability of a program and makes maintenance problematic.

Figure 45:
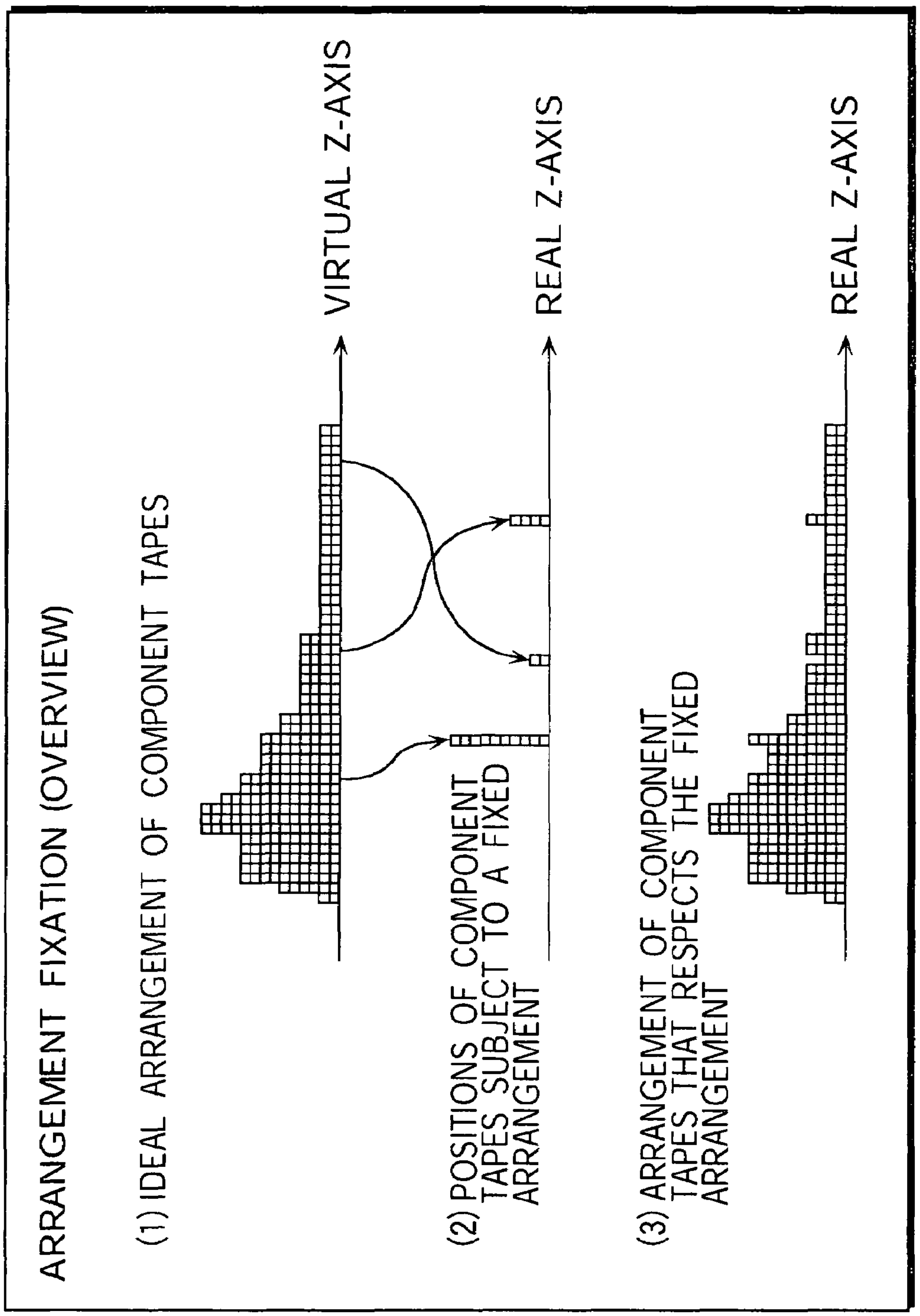
FIG. 45 is a component histogram showing the concept of optimization in the presence of a restriction due to a fixed arrangement.

The best method of dealing with this problem is described below, with reference to FIG. 45. FIG. 45 is a component histogram showing the optimization that is performed when the presence of a fixed arrangement provides a restriction on the optimization that can be performed.

(1) A virtual Z-axis is produced, and the arrangement of component types along the virtual Z-axis is performed without considering the fixed arrangement.

(2) The component tapes are moved from the virtual Z-axis to a real Z-axis. When doing so, the fixed arrangement is respected, so that component tapes whose positions are determined by the fixed arrangement are placed first.

(3) Next, the component tapes whose positions are not determined by the fixed arrangement are moved from the virtual Z-axis to the real Z-axis. When doing so, the component tapes whose positions are not determined by the fixed arrangement are arranged in order in the positions not occupied by the component tapes arranged according to the fixed arrangement.

Finally, the cut down process is performed on the component tapes arranged along the Z-axis to produce pickup patterns.

By operating in this way, a single algorithm can be used to manage whatever fixed arrangement is specified by the user.

This algorithm that can handle fixed arrangements copes with the fixed arrangement specified by the user by altering an ideal arrangement of component tapes that has been generated by an algorithm that operates in the absence of a fixed arrangement.

As a result, the mounting times can be compared for the case when an ideal arrangement of component tapes is used and the case where a fixed arrangement of component tapes is present.

This presents the user with information that allows the user to compare the advantage of being able to easily change the device setup when a fixed arrangement is used with the shorter mounting time that is achieved when no fixed arrangement is used. As a result, the user can reevaluate the tradeoff that occurs when using a fixed arrangement.

3.4.2 Related Individual Processes

By setting a fixed arrangement, the user specifies the Z numbers for arranging a plurality of component tapes. The arrangement of component tapes along the Z-axis is subject to optimization by an optimization algorithm, so that the optimization algorithm needs to consider the fixed arrangement specified by the user.

The algorithm used when there is a fixed arrangement copes with the fixed arrangement by altering the ideal arrangement of component tapes which is generated by the algorithm used when there is no fixed arrangement.

This process is explained in detail in the following sections.

Entire Flow (starting from the histogram)

Fixed Arrangement in the Feeder Block and Arrangement of "Peaks"

Fixed Arrangement: Judgement whether Fixed Position is Available

Fixed Arrangement of Double-Cassette Feeders

Fixed Arrangement of Double-Cassette Feeders (Supplementary Explanation)

3.5 Dealing with LL-sized Substrates 3.5.1 Overview

Figure 46:
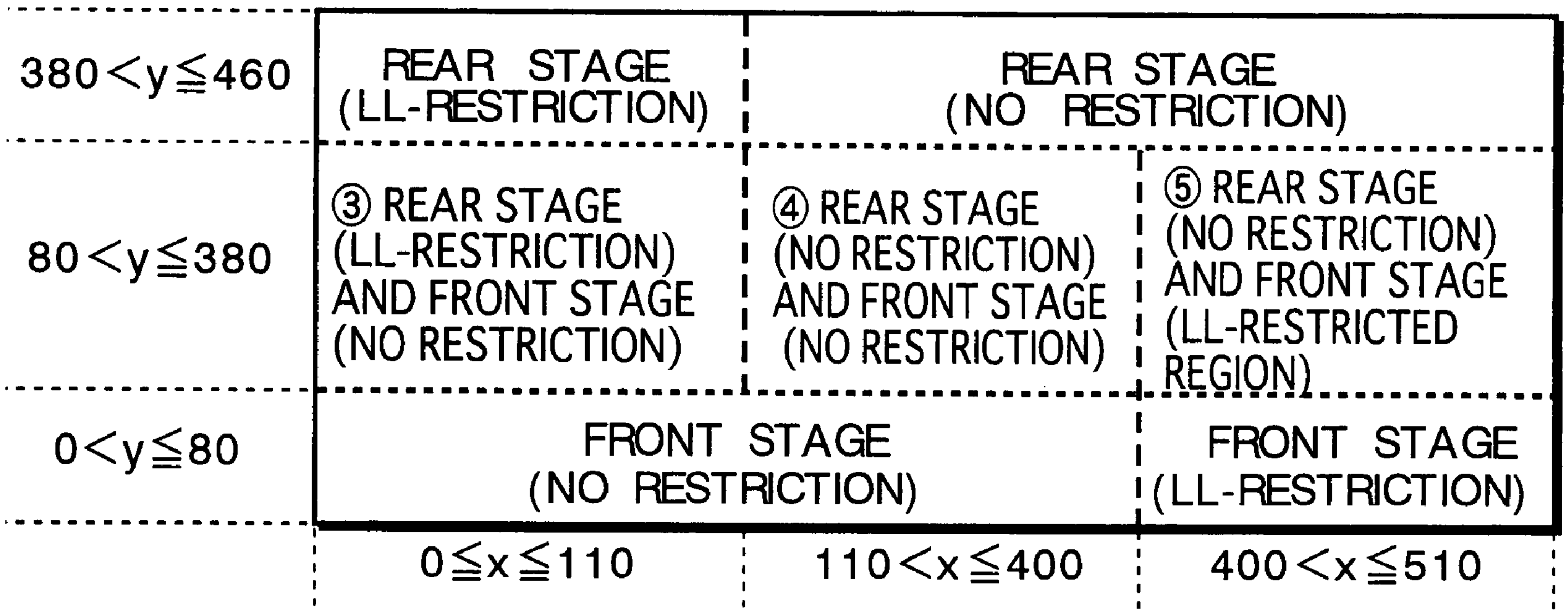
FIG. 46 shows the restricted regions on an LL-sized substrate and an XL-based substrate, based on the limitation on the movement of the line gang pickup head when mounting components.

LL-sized substrates are substrates whose size in the transportation direction is larger than ordinary substrates that have no limitation on the mounting region. As shown in FIG. 46, LL-sized substrates have a mounting region (the "LL-restricted region") where components can be mounted only by special heads (nozzles).

These special heads are only capable of picking up components from component tapes (feeders) that are located within a certain range of Z numbers.

Figure 47:
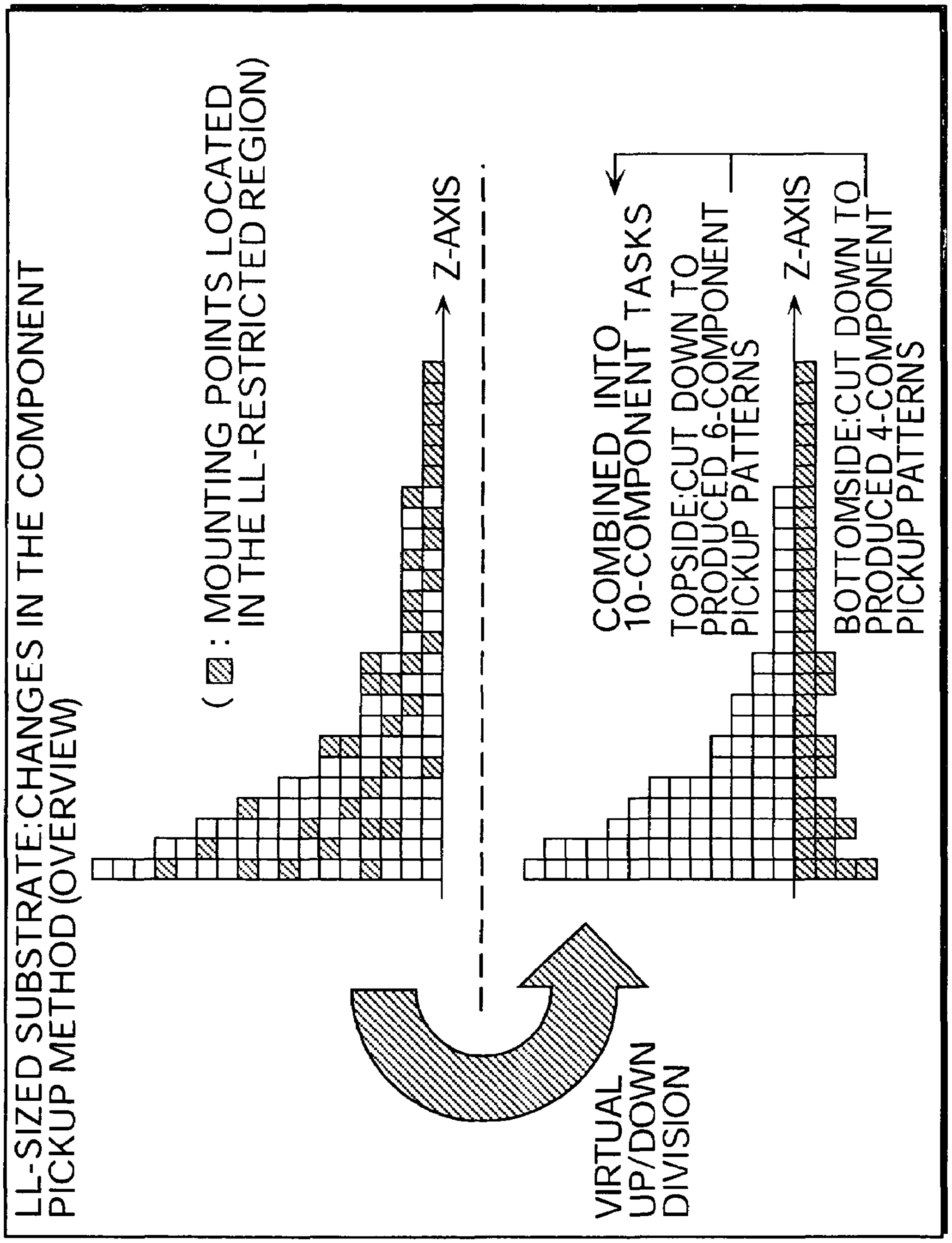
FIG. 47 is a component histogram that is used to illustrate the concept of optimization for LL-sized substrates.

These restrictions for LL-sized substrates are managed by using the following two methods, as shown in FIG. 47.

(1) Interchanging the positions of component tapes along the Z-axis (2) Changing the pickup method Process (1) arranges the component tapes that include components to be mounted at mounting points in the LL-restricted region within the range on Z numbers where components can be picked up by the heads that are capable of mounting components in the LL-restricted region. When component tapes have been arranged at all of the Z numbers on the Z-axis, this is achieved by interchanging component tapes.

Process (2) virtually divides the component histogram including mounting points that are located in the LL-restricted region into the following two component histograms.

A component histogram that is composed of mounting points that are located in the LL-restricted region A component histogram that is composed of mounting points that are not located in the LL-restricted region After this, during mounting the component histograms are separately cut down for the heads that can be used for mounting. The results of the cut down process are then combined and set as a single task.

3.5.2 Interchanging Component Tapes on the Z-Axis (1) Heads 1 to 6 cannot mount components in the LL-restricted region (2) Heads 7 to 10 can mount components in the LL-restricted region (3) Due to the restrictions on mounter construction, each head is only capable of picking up components from a limited range of Z positions.

(4) If component tapes with mounting points present in the LL-restricted region are located at any of the positions Z=1 to 11, these component tapes are exchanged with component tapes that are located at positions Z=12 or higher and do not have any mounting points in the LL-restricted region.

3.5.3 Changes to the Pickup Method (1) The mounting points at each Z position are sorted into "mounting points in the LL-restricted region" and "mounting points that are not in the LL-restricted region".

(2) The heads are divided into two groups, heads 1 to 6 and heads 7 to 10, and these groups are treated as if they compose a two separate line gang pickup heads.

(3) The cut down process is performed using six heads for the mounting points of the component tapes with no mounting points in the LL-restricted region to generate tasks composed of six mounting points.

(4) The cut down process is performed using four heads for the mounting points of the component tapes with mounting points in the LL-restricted region to generate tasks composed of four mounting points.

(5) The 6-mounting-point-tasks and 4-mounting-point-tasks are combined to produce 10-mounting-point tasks 3.5.4 Related Individual Processes In order to handle LL-size substrates, it is necessary to change the pickup method and interchange component tapes along the Z-axis. To do so, two algorithms are provided.

The details of this process are described in the following sections.

LL Restrictions: Changes to the Pickup Method (1)

In order to handle LL-size substrates, component tapes are divided into component tapes with mounting points in the LL-restricted region and component tapes with no mounting points in the LL-restricted region. Components with mounting points in the LL-restricted region are picked up using heads 7 to 10, while components with no mounting points in the LL-restricted region are picked up using heads 1 to 6.

Components are picked up in order starting with component tapes arranged at the side of the mountain. When dealing with the left block, the processing proceeds from an area on the Z-axis with higher Z numbers than the Z numbers from which heads 1 to 6 pick up components, which is to say, in a direction moving towards the component recognizing camera. This is also the case for the right block.

LL Restrictions: Changes to the Pickup Method (2)

Component tapes that do not have mounting points located in the LL-restricted region are handled as follows. Components are successively picked up using heads 1 to 6 in order starting from the component tapes at the side of the mountain. After this, the same processing is performed for component tapes that have mounting points located in the LL-restricted region, so that with components are successively picked up using heads 1 to 6 in order starting from the component tapes at the side of the mountain Unlike the processing in "LL Restrictions: Changes to the Pickup Method (2)", components are not necessarily picked up in a direction that moves towards the component recognizing camera.

LL Restrictions: Interchanging of Component Tapes in the Z-Axis (1)

A search is performed to find component tapes, out of the component tapes arranged at Z numbers 1 to 11, that have mounting points with X coordinates that are higher than 400 mm, and these component tapes are interchanged with component tapes that do not have mounting points with X coordinates that are higher than 400 mm.

LL Restrictions: Interchanging of Component Tapes in the Z-Axis (2)

This processing deals with the X coordinates of mounting points with more precision that the "LL Restrictions: Interchanging of Component Tapes in the Z-Axis (1)" process described above.

3.6 Dealing with XL-Sized Substrates 3.6.1 Overview

XL-sized substrates are substrates whose size in the direction perpendicular to the transportation direction is larger than ordinary substrates that have no limitation on the mounting region. As shown in FIG. 46, XL-sized substrates have a mounting region (the "XL-restricted region") where components can be mounted only by a certain stage out of the front stage 110 and the rear stage 120. FIG. 46 shows the restricted regions (regions that cannot be reached by certain heads, making mounting by such heads impossible) on substrates of these special sizes (XL and LL).

XL-sized substrates are composed of the following three mounting regions.

- a region where only the front stage 110 can mount components
- a region where only the rear stage 120 can mount components
- a region where the front stage 110 and the rear stage 120 can mount components In the same way as an LL-sized substrate, there is also a region where components can be only be mounted by certain heads (nozzles).

The restrictions shown in FIG. 46 for XL-sized substrates are managed by using the following methods.

(1) Assigning component tapes to the front stage 110 or rear stage 120 based on the coordinates of mounting points.

(2) Dividing component tapes based on the coordinates of mounting points.

(3) Making an initial assignment using the region where both the front stage 110 and the rear stage 120 can mount components.

(4) Avoiding the LL restrictions

This processing is described in detail later as part of the related individual processes.

3.6.2 Related Individual Processes

XL-sized substrates are handled by determining which of the front stage 110 and the rear stage 120 is capable of mounting a component at each mounting point and then assigning each mounting point to the front stage 110 or the rear stage 120 accordingly.

The restrictions for XL-sized substrates include the restrictions for LL-sized substrates, so that the processing performed for XL-sized substrates includes the processing performed for LL-sized substrates.

The details for this processing are given in the following section of this specification.

XL Restrictions 3.7 Estimated Tact Time Balancing Process 3.7.1 Overview

The estimated tact time balancing process is a process that adjusts, in the initial allocation, the balance between the front stage 110 and the rear stage 120 with the tact time level as an index.

3.7.2 Levels on Which Balance Adjusting is Performed

The balance between the front stage 110 and rear stage 120 is adjusted by moving components between the stages. This moving of components is performed on the following two levels.

(1) In units of "mountains"

(2) In units of component tapes

In this specification a "mountain" refers to a group of component tapes that is generated as a result of optimization. This expression refers to group of component tapes that are arranged in a predetermined order, or to a component histogram that corresponds to such group of component tapes.

The estimated tact time balancing process and the tact time balancing process differ as to the level for the movement of components between the stages.

Estimated Tact Time Balancing Process: mountains, component tapes

Tact Time Balancing Process: mountains, component tapes, mounting points

In the calculation of the estimated tact time level used by the estimated tact time balancing process, the accuracy of values for the estimated tact time level of tasks composed of general components is poor. As a result, the estimated tact time balancing process is judged as being ineffective at moving components between stages in small units, so that the movement of components in units of mounting points is not performed.

The details for this processing are given in the related individual processes section below.

3.7.3 Related Individual Processes

The "estimated tact time balancing process" is a process that adjusts the balance between the front stage 110 and the rear stage 120. This process needs to be performed when allocating component tapes to the front stage 110 and the rear stage 120.

First, component tapes are arranged starting with the front stage 110, with component tapes that cannot be arranged in the front stage 110 being arranged in the rear stage 120.

The resulting state is treated as the initial state, and the estimated tact time balance for the front stage 110 and rear stage 120 is calculated. After this, component tapes that are arranged in the front stage 110 are moved in order to the rear stage 120 until the estimated tact time balance is within tolerance ("OK").

It should be noted that the estimated tact time for each stage is calculated as described in the "Operation of the Optimization Apparatus (Overview)" section of this specification.

The details for this processing are given in the following related individual processes sections.

Adjustment of the Estimated Tact Time Balance (in Mountain Units)

Adjustment of the Estimated Tact Time Balance (in Component Tape Units)

3.8 Tact Time Balancing Process 3.8.1 Overview

The tact time balancing process is a process that adjusts, after tasks have been generated, the balance between the front stage 110 and the rear stage 120 with mounting time as an index. This process corresponds to step S323 in FIG. 14. The tact time balancing process and the estimated tact time balancing process are similar operations and the difference between them lies in the index used for the balancing.

3.8.2 Levels on Which Balance Adjusting is Performed

The balance between the front stage 110 and rear stage 120 is adjusted by moving components between the stages. This moving of components is performed on the following three levels.

(1) In units of "mountains"

(2) In units of component tapes (3) In units of mounting points

The tact time balancing process differs from the estimated tact time balancing process in that is able to move components between the stages in units of mounting points.

3.8.3 Related Individual Processes

The "tact time balancing process" is a process that adjusts the balance between the front stage 110 and the rear stage 120. After tasks have been generated for the front stage 110 and the rear stage 120, a tact time simulator calculates the mounting time for each stage, and the tact time balance between the front stage 110 and the rear stage 120 is adjusted by moving components from the stage with the longer mounting time to the stage with the shorter mounting time. While a different index is used for measuring the balance, this process resembles the estimated tact time balancing process described earlier.

The details for this processing are given in the following related individual processes sections.

Movement of a Mountain from the Front stage 110 to the Rear stage 120

Movement of a Component tape from the Front stage 110 to the Rear stage 120

Movement of a Mounting Point from the Front stage 110 to the Rear stage 120

Swapping in The Tact Time Balancing Process 3.9 Details of the Separate Processes Performed by the Optimization Apparatus 3.9.1 Cut Down Procedure Tasks are generated using the following method.

Figure 48:
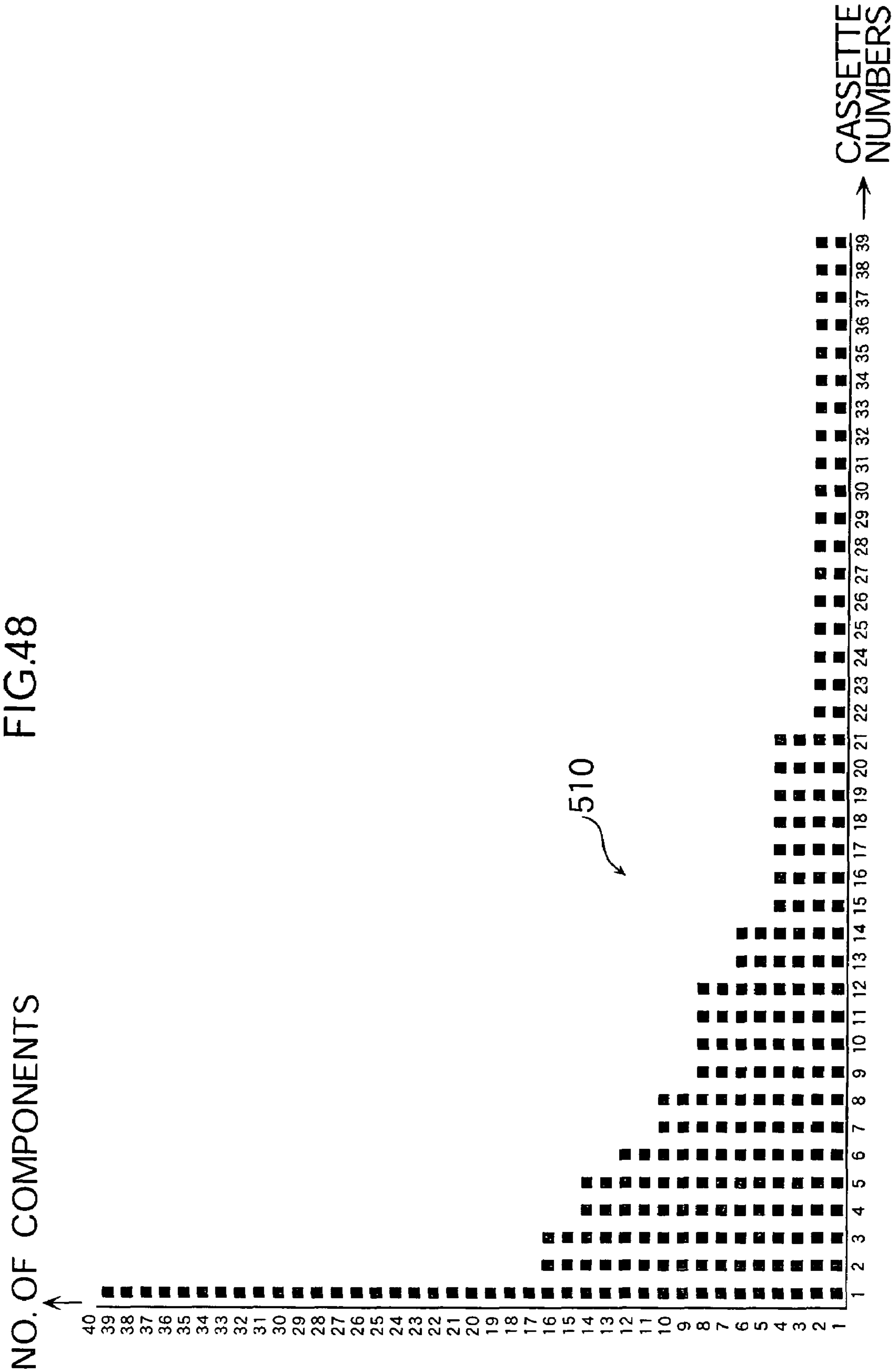
FIG. 48 is a component histogram that is used to illustrate step (1) of optimization according to the cut down procedure.

(1) A component histogram 510 is generated (FIG. 48).

Figure 49:
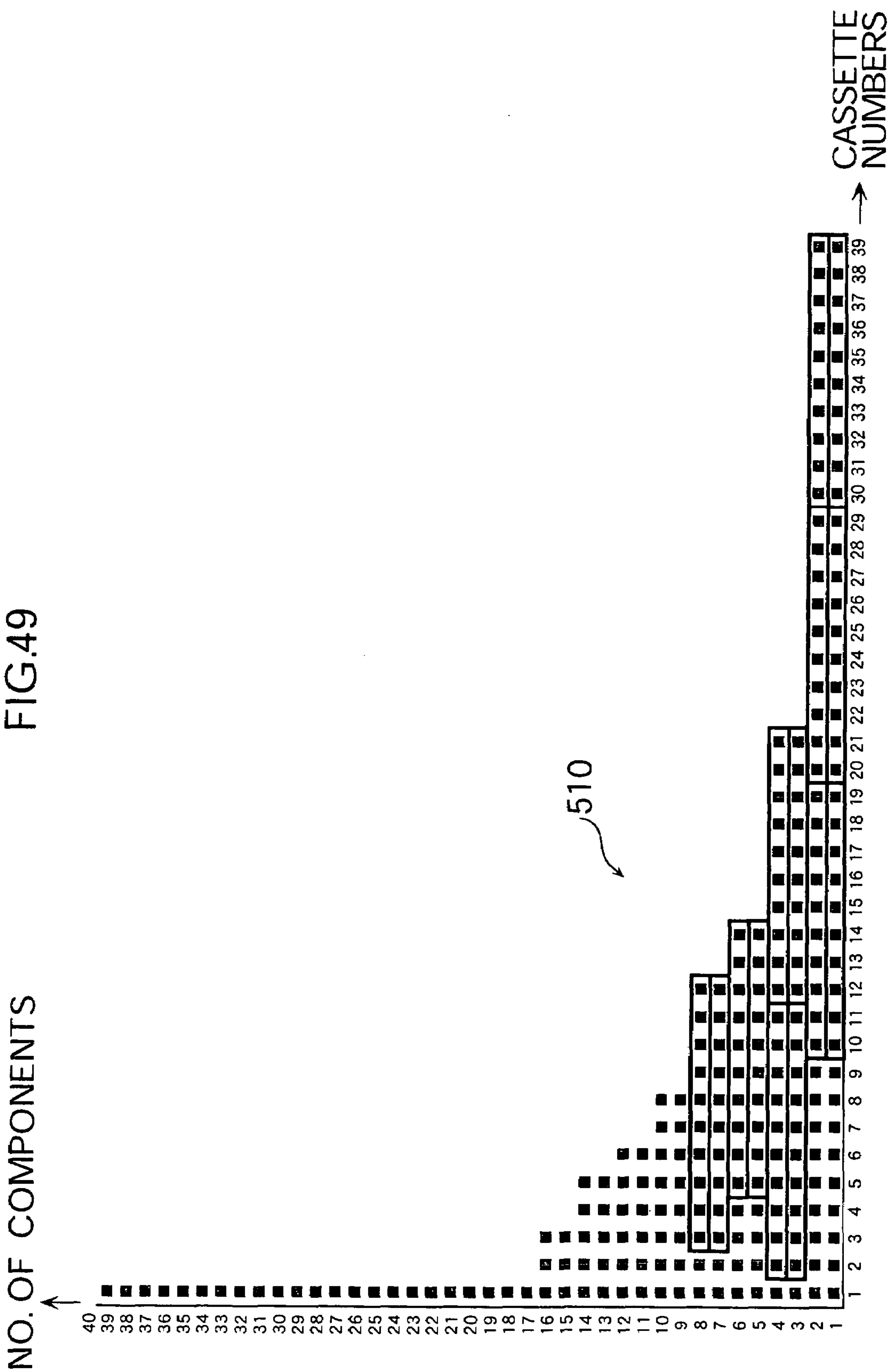
FIG. 49 is a component histogram that is used to illustrate step (2) of the same procedure.

(2) The cut down process is performed on the component histogram 510 to leave a core part (FIG. 49).

In FIG. 49, the mounting points surrounded by the rectangular boxes are pickup patterns in which 10 components are simultaneously picked up.

Figure 50A:
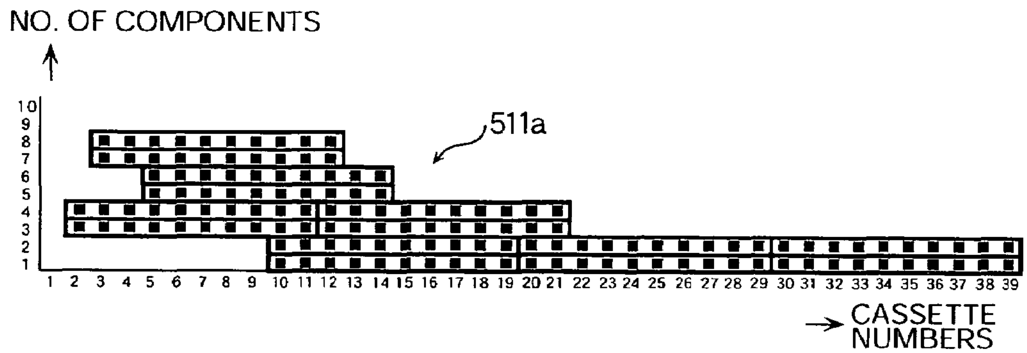
FIG. 50 is a component histogram that is used to illustrate step (3) of the same procedure.
Figure 50B:
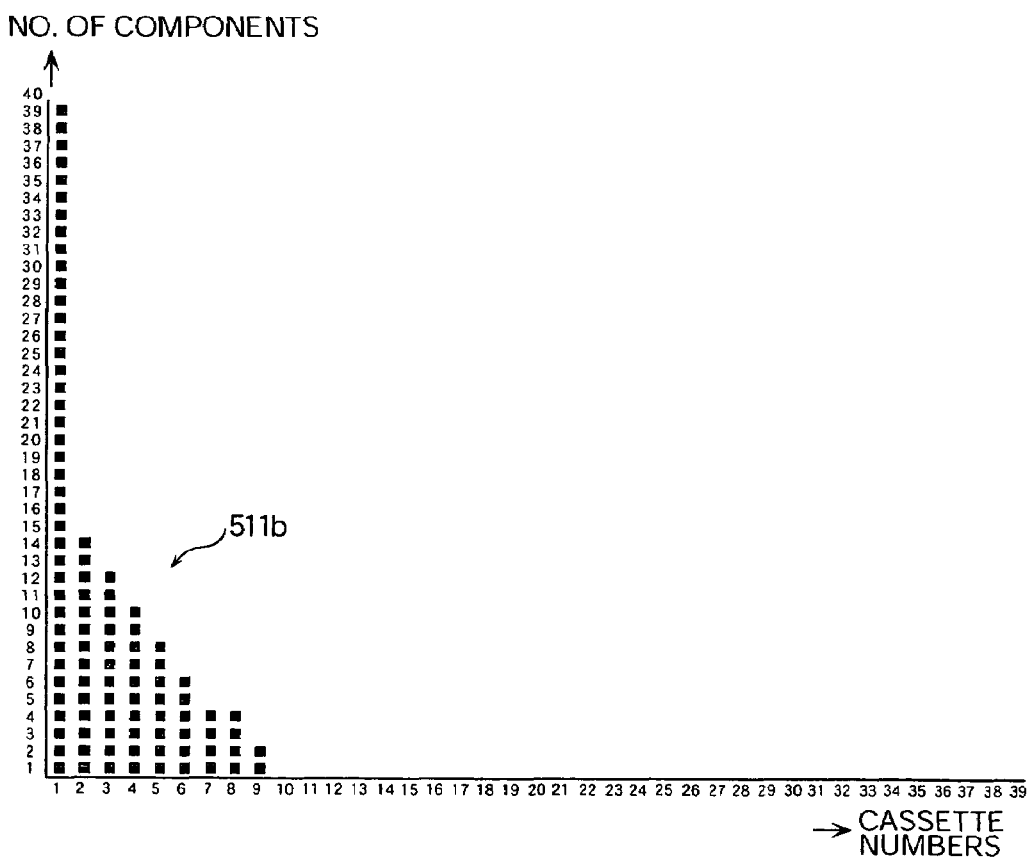

(3) The component histogram 510 is separated into cut down part 511*a* (see FIG. 50A) and the core part 511*b* (see FIG. 50B).

Figure 51:
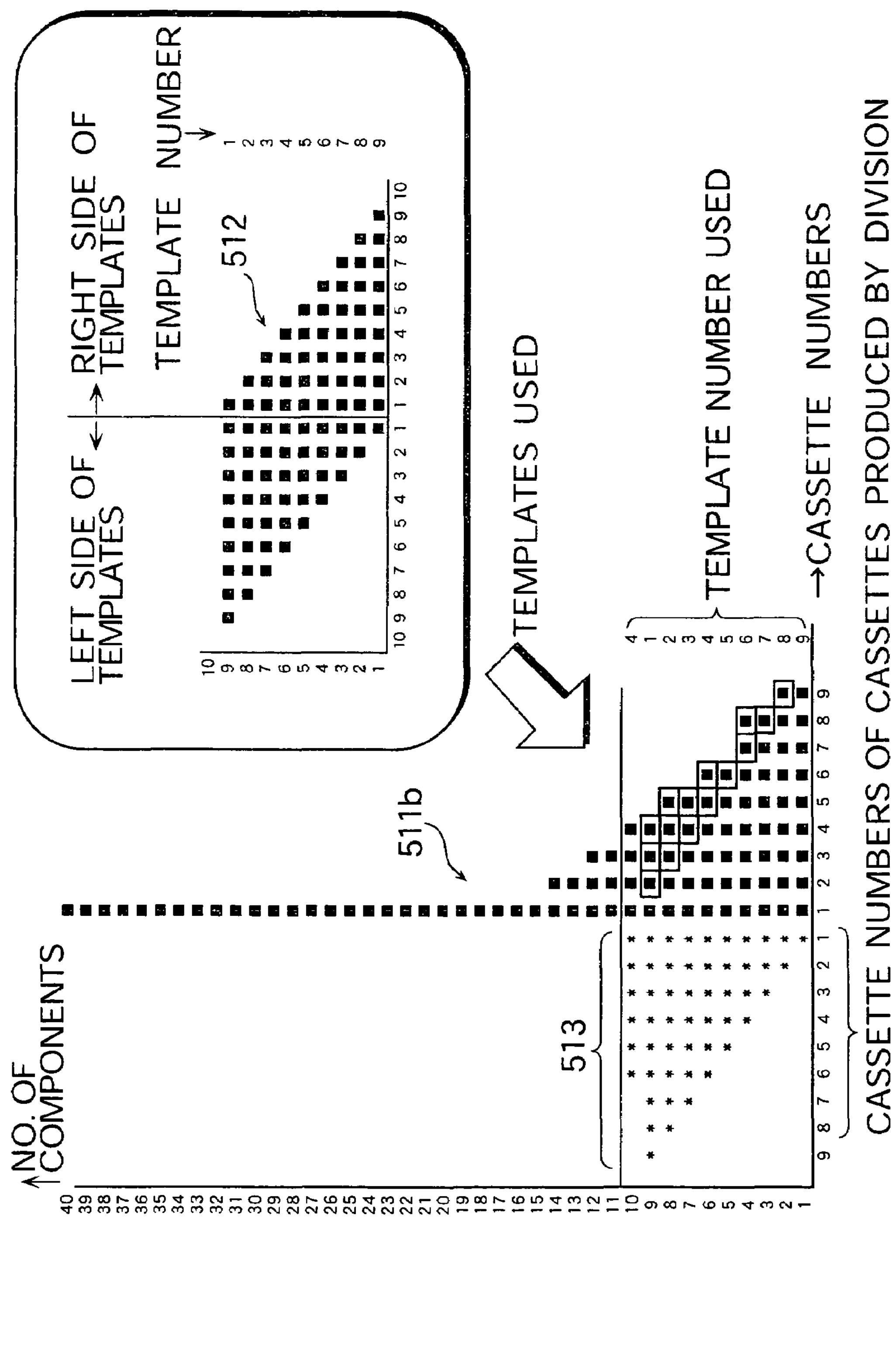
FIG. 51 is a component histogram that is used to illustrate step (4) of the same procedure.

(4) The core part 511*b* is allocated to a template 512 (see FIG. 51).

In FIG. 51, the black squares (mounting points) surrounded by rectangular frames are the mounting points that are not covered by the template. These mounting points are used to supplement the left side 513 (the positions indicated using asterisks) of the template 512.

Figure 52:
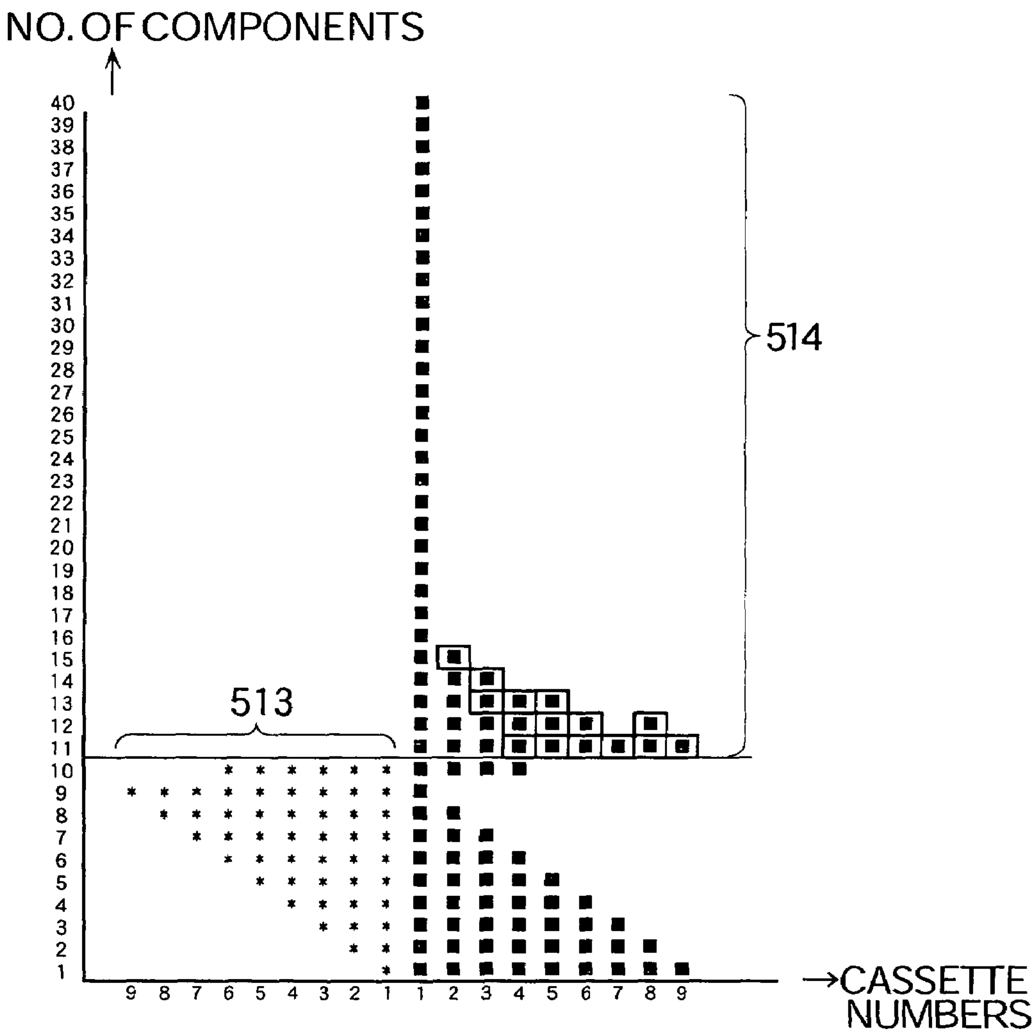
FIG. 52 is a component histogram that is used to illustrate step (5) of the same procedure.

(5) The mounting points 514 for supplementing the left side of the template 512 are determined (see FIG. 52).

Figure 53:
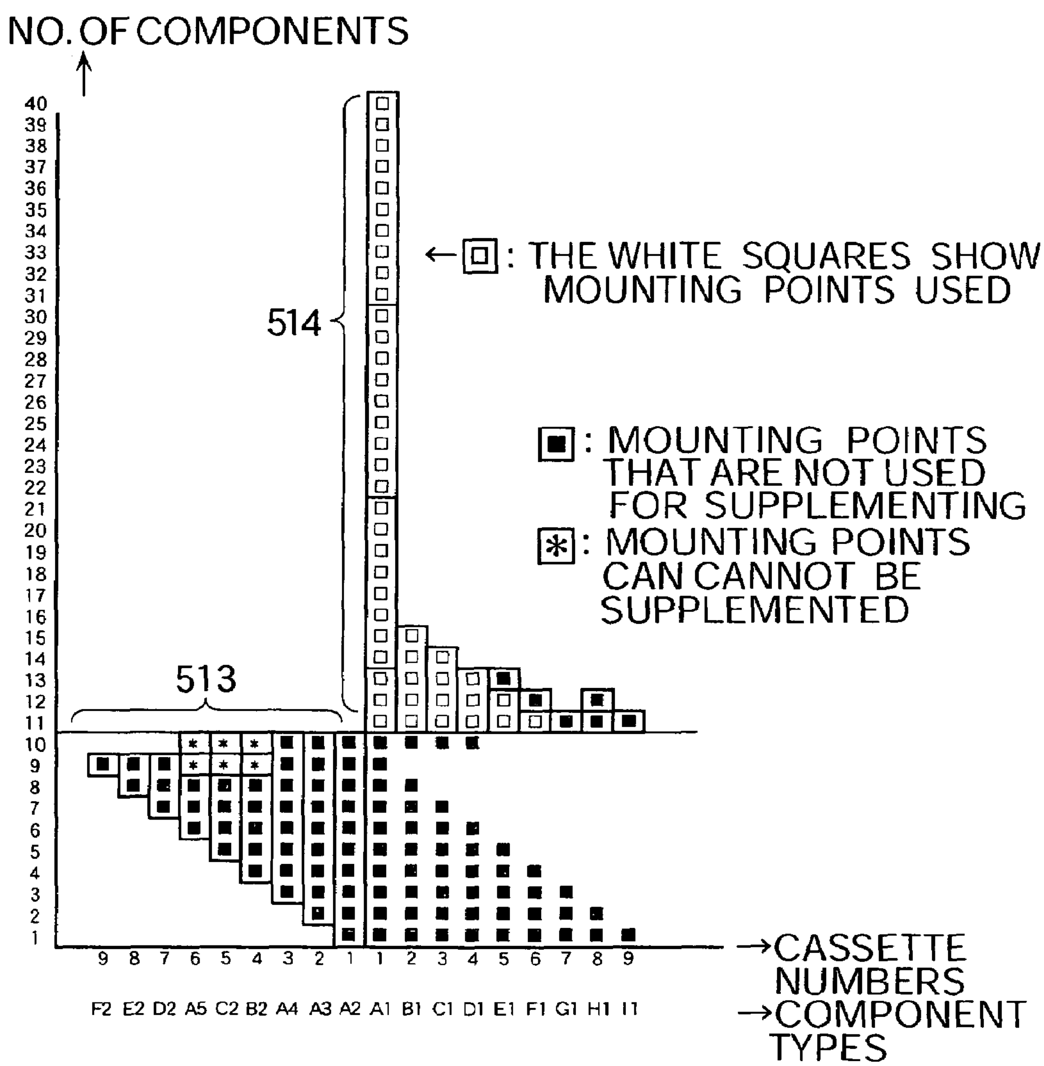
FIG. 53 is a component histogram that is used to illustrate step (6) of the same procedure.

(6) The left side 513 of the template 512 is supplemented (see FIG. 53)

In FIG. 53, the white squares show the mounting points used for this supplementing, the black squares that are surrounded by frames show the mounting points that are not used for supplementing, and the asterisks surrounded by frames show the mounting points that cannot be supplemented.

Figure 54:
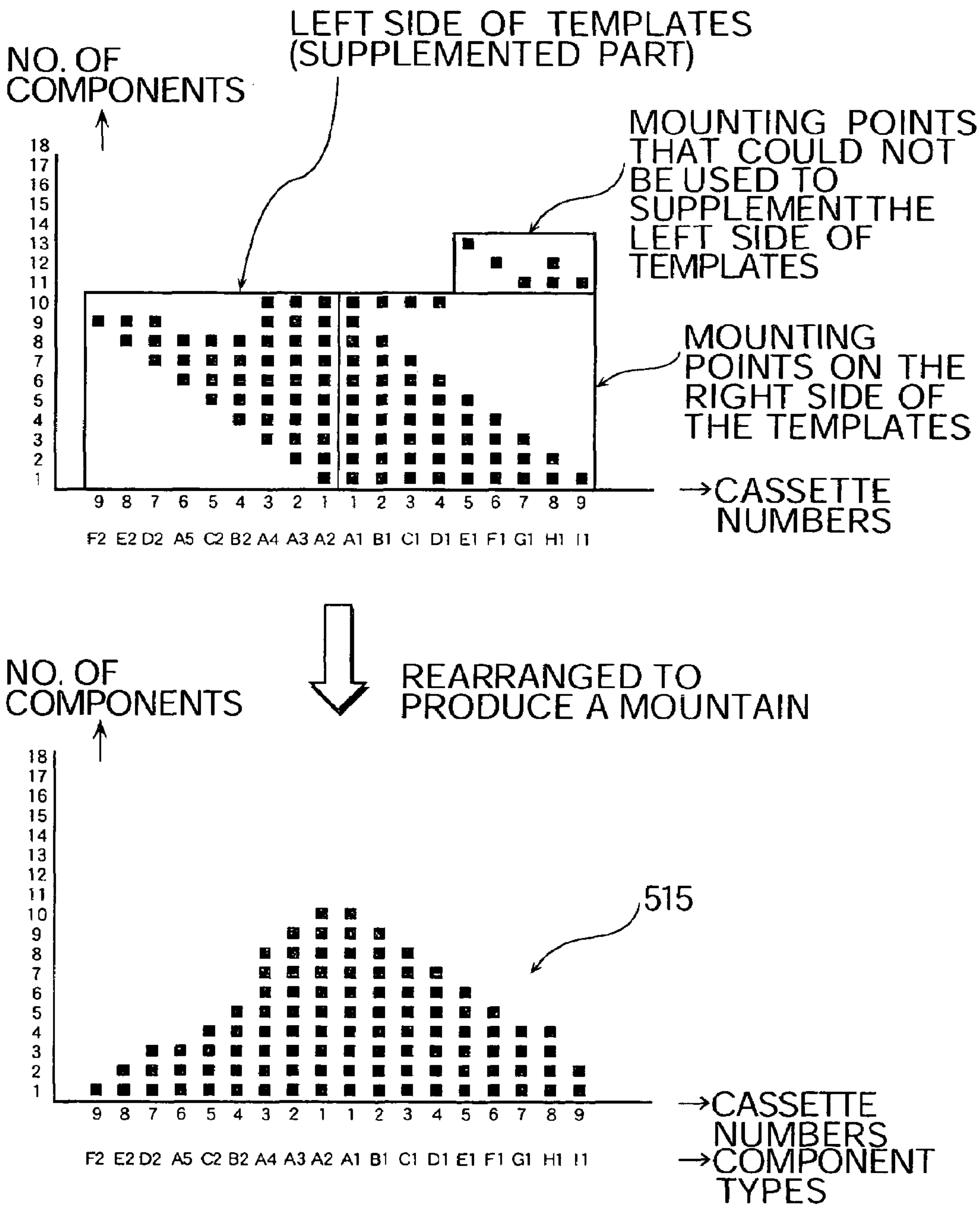
FIG. 54 is a component histogram that is used to illustrate step (7) of the same procedure.

(7) A mountain 515 is produced from the core part and the part supplemented by the template (see FIG. 54).

Figure 55:
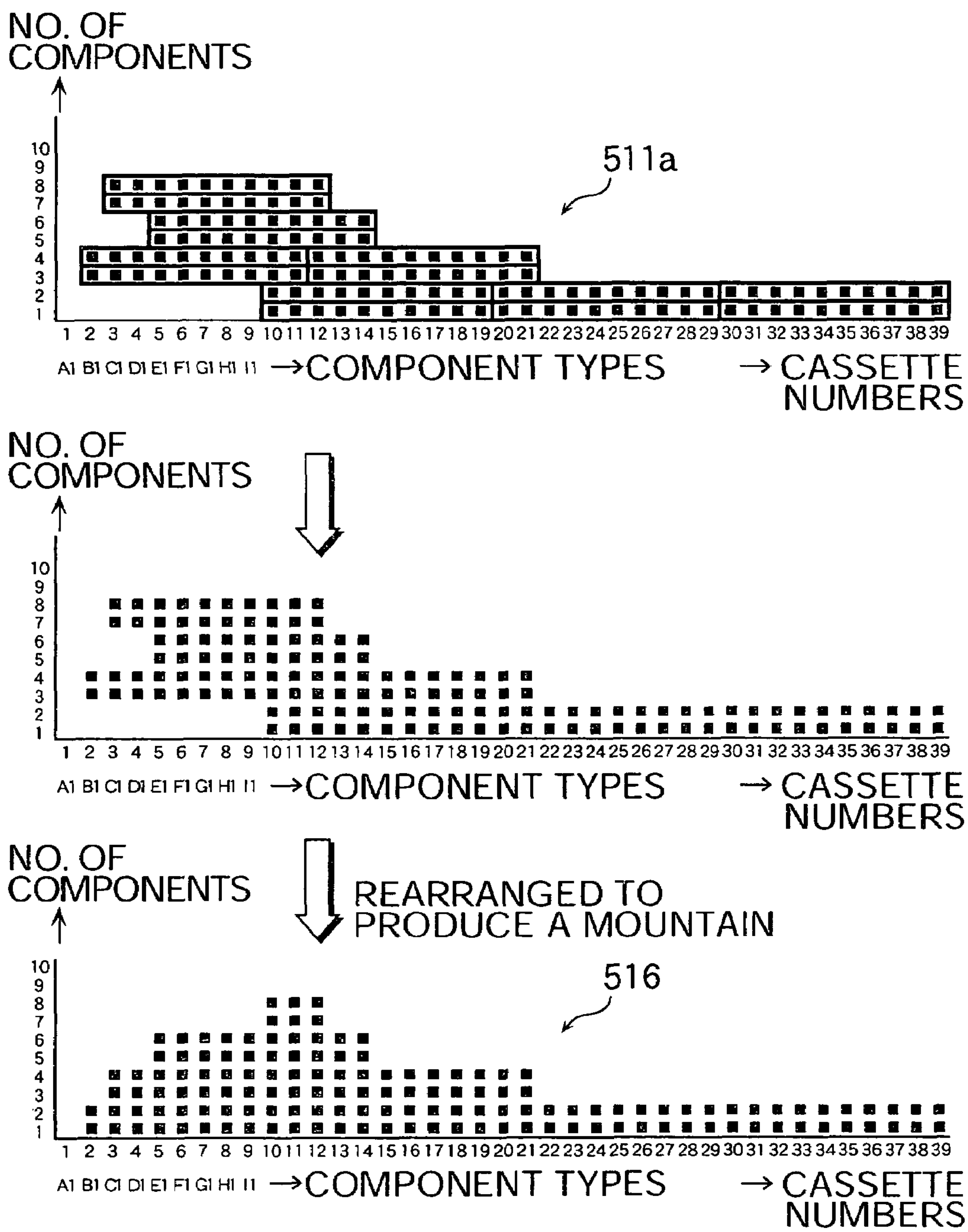
FIG. 55 is a component histogram that is used to illustrate step (8) of the same procedure.

(8) Another mountain 516 (see FIG. 55) is produced from the tasks 511*a* produced by the cut down process in process (2).

Figure 56:
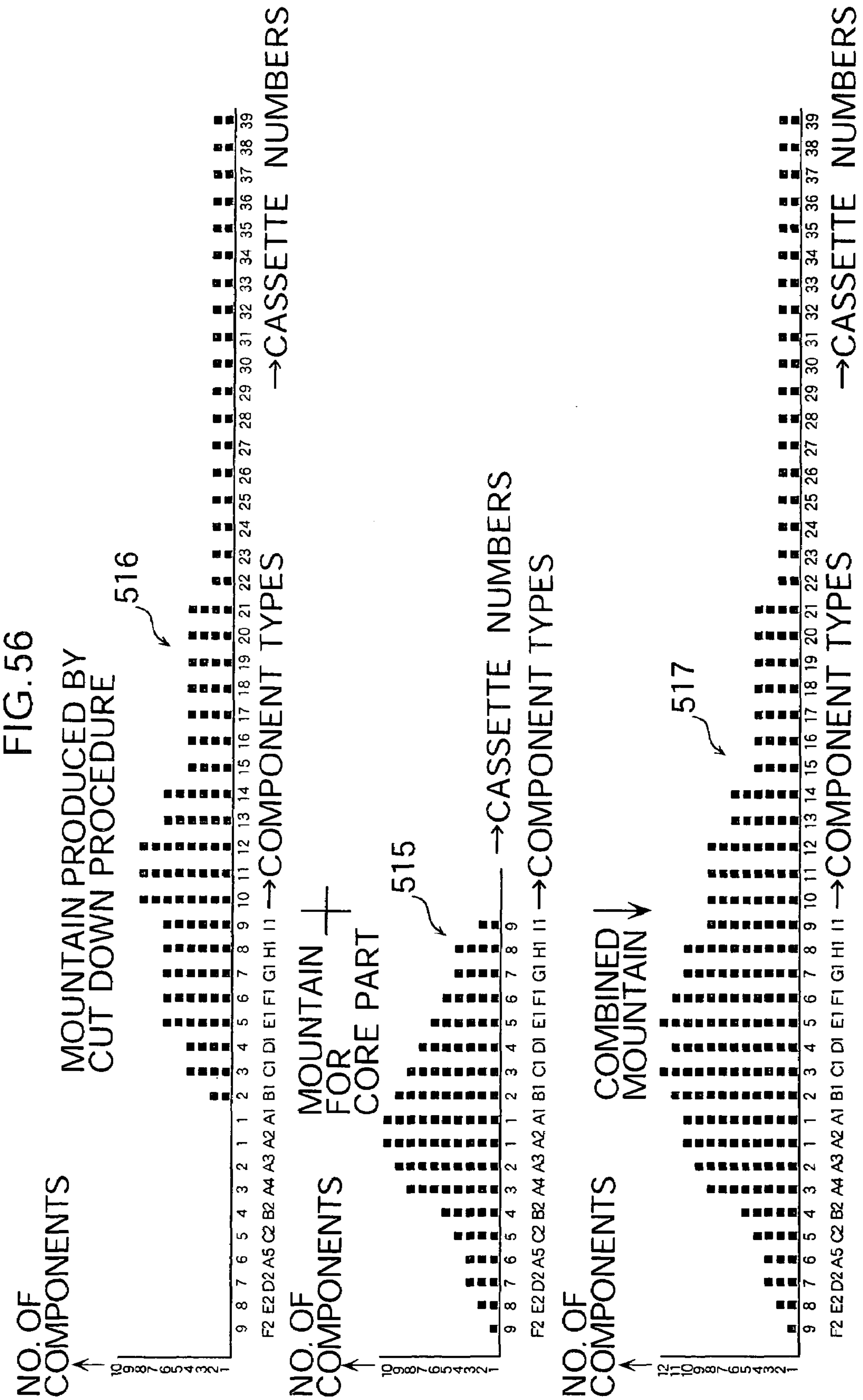
FIG. 56 is a component histogram that is used to illustrate step (9) of the same procedure.

(9) The mountain 516 produced from the cut down part and the mountain 515 produced from the core part are combined to produce the mountain 517 (see FIG. 56).

Figure 57:
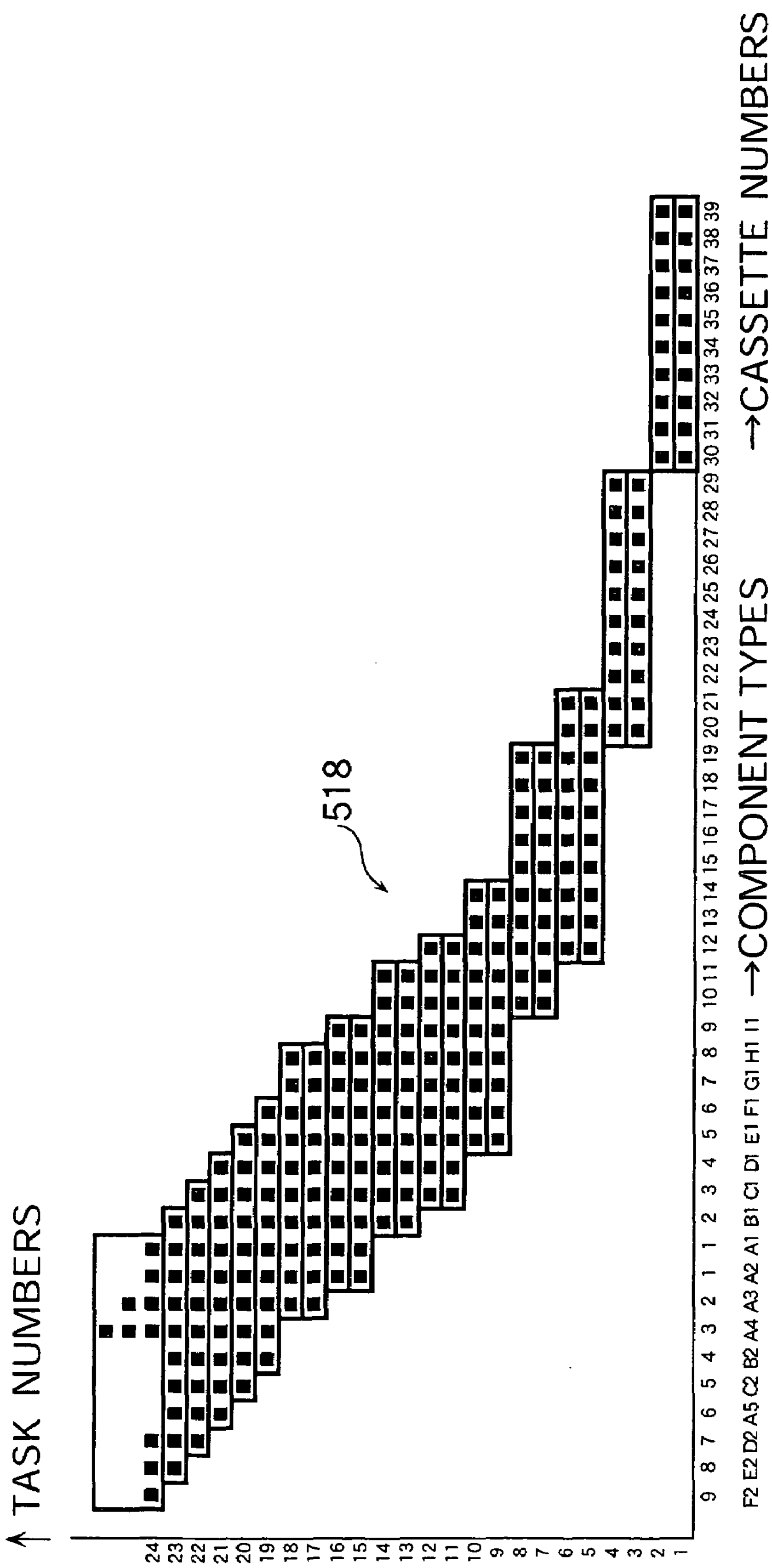
FIG. 57 is a component histogram that is used to illustrate step (10) of the same procedure.

(10) The cut down process is performed on the entire mountain 517 to produce the pickup patterns 518 (FIG. 57).

In FIG. 57, the 24$^{th}$ task (task number 24) is surrounded by a frame showing that during pickup the line gang pickup head has to make three nozzle strokes.

Figure 58:
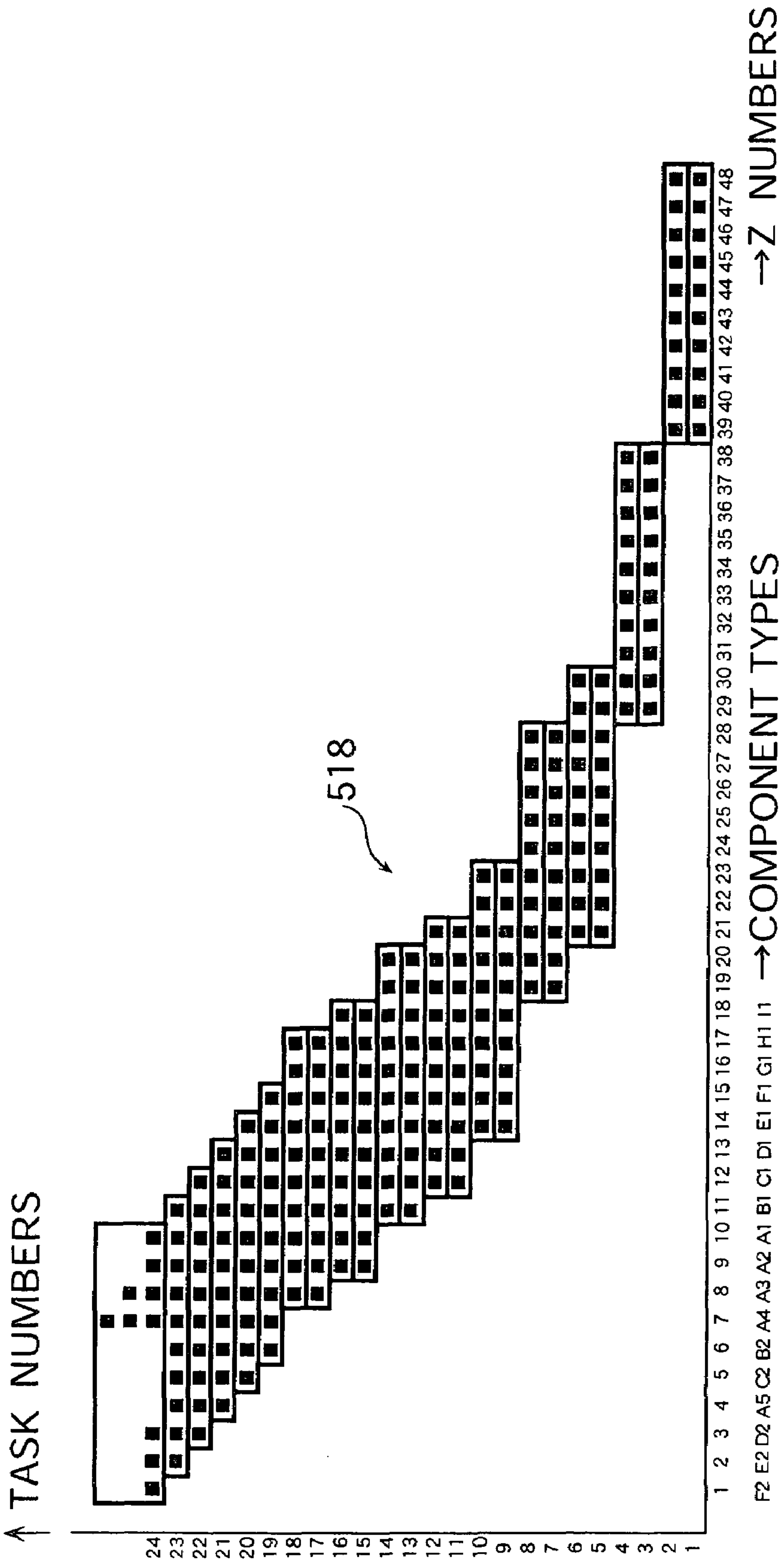
FIG. 58 is a component histogram that is used to illustrate step (11) of the same procedure.

(11) When there are no restrictions, the component tapes can be arranged as shown along the Z-axis (see FIG. 58).

Note that when restrictions need to be considered, the following processing (from process (12) onwards) is performed.

Figure 59:
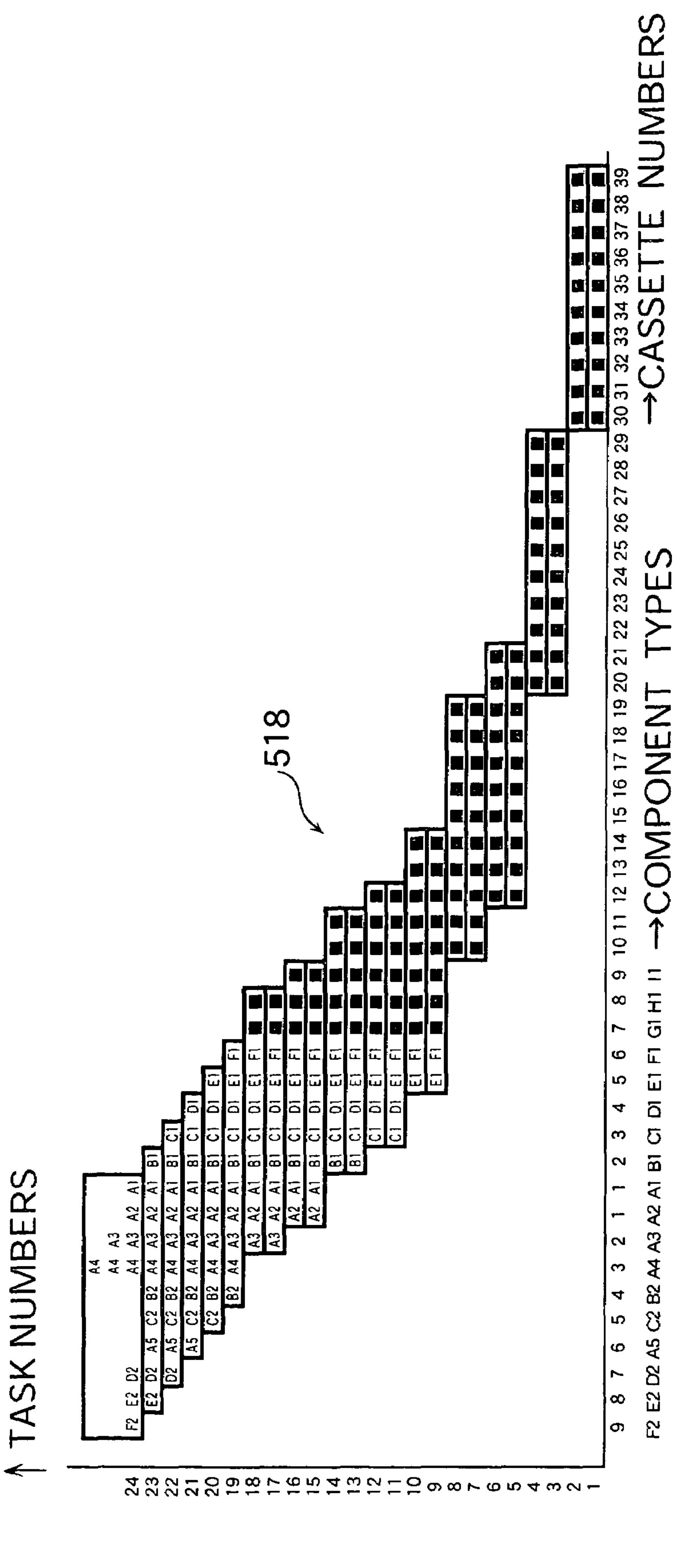
FIG. 59 is a component histogram that is used to illustrate step (12) of the same procedure.

(12) The cut down process is performed to generate tasks (the sets of components shown surrounded by frames)(see FIG. 59).

Here, processing for the core part is performed. However, at this stage, the maximum number of divisions, the feeder resources and the number of Z numbers that can be used are not considered.

In this example, the components are divided among the cassette numbers 1 to 6.

Cassette number 1: Component A

Cassette number 2: Component B

Cassette number 3: Component C

Cassette number 4: Component D

Cassette number 5: Component E

Cassette number 6: Component F

Here, the following notation is used. When component A is divided into five, the resulting components are called A1, A2, A3, A4, A5.

This is also the case for components B, C, D, E, and F. The other components have been shown in FIG. 59 using black squares.

Figure 60:
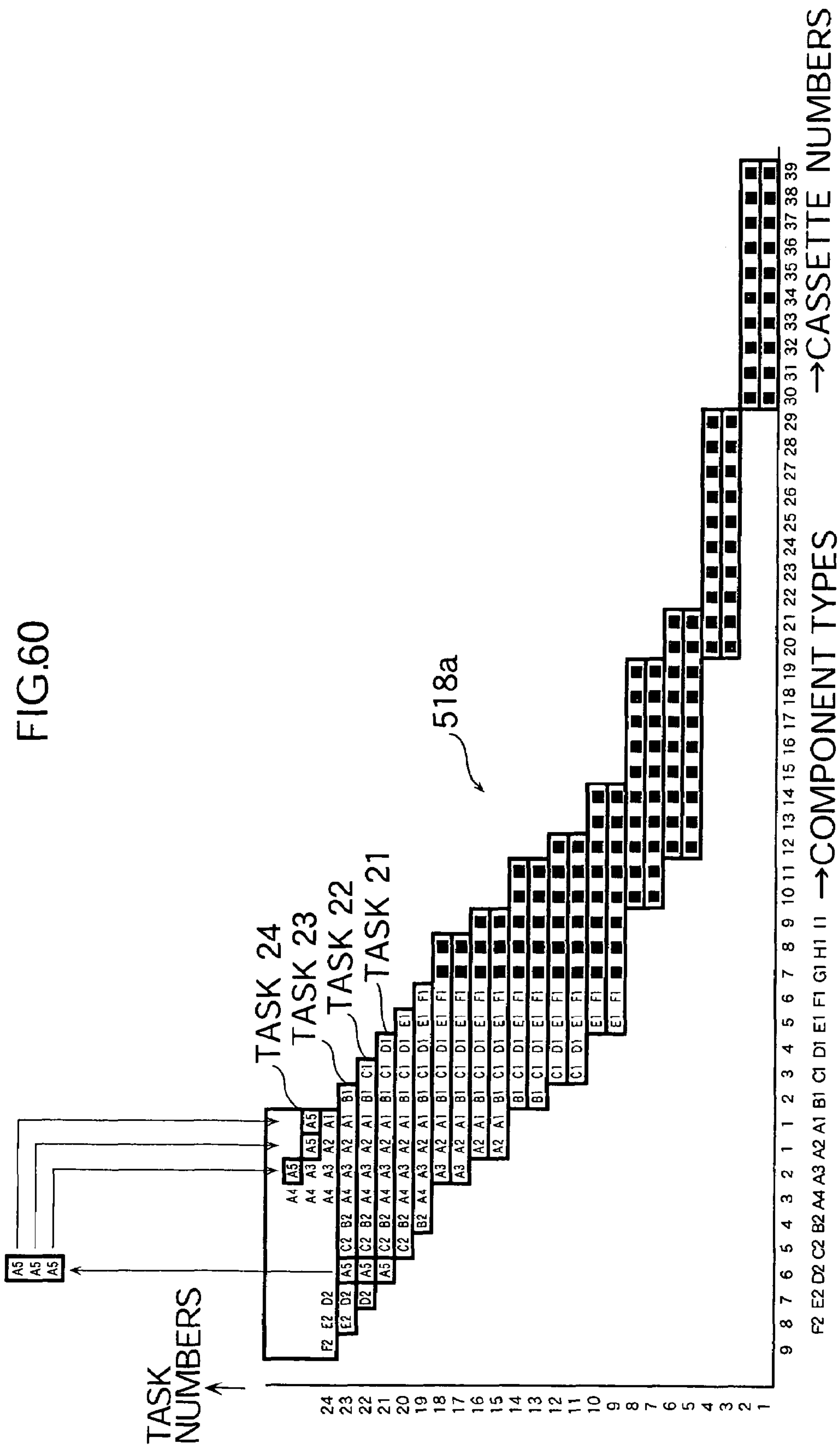
FIG. 60 is a component histogram that is used to illustrate step (13) of the same procedure.

(13) The number of cassettes is corrected in view of the maximum number of divisions (see FIG. 60).

Here, the number of cassettes is corrected for the example case where the maximum number of cassettes into which component A may be divided is four.

Since component A has been divided into five, one of A2 to A5 is combined with one of A1 to A5. When doing so, by selecting the component, out of components A2 to A5, with the lowest number of components, the effect on the number of tasks caused by this combining can be minimized.

In the illustrated example, component A5 has the lowest number (three) of components to be mounted, so that component A5 is selected and is distributed among A1 to A4. As a result, the position that was occupied by A5 becomes empty, so that the components located to the left of A5, i.e., F2, E2, and D2, are all moved one position to the right.

Figure 61:
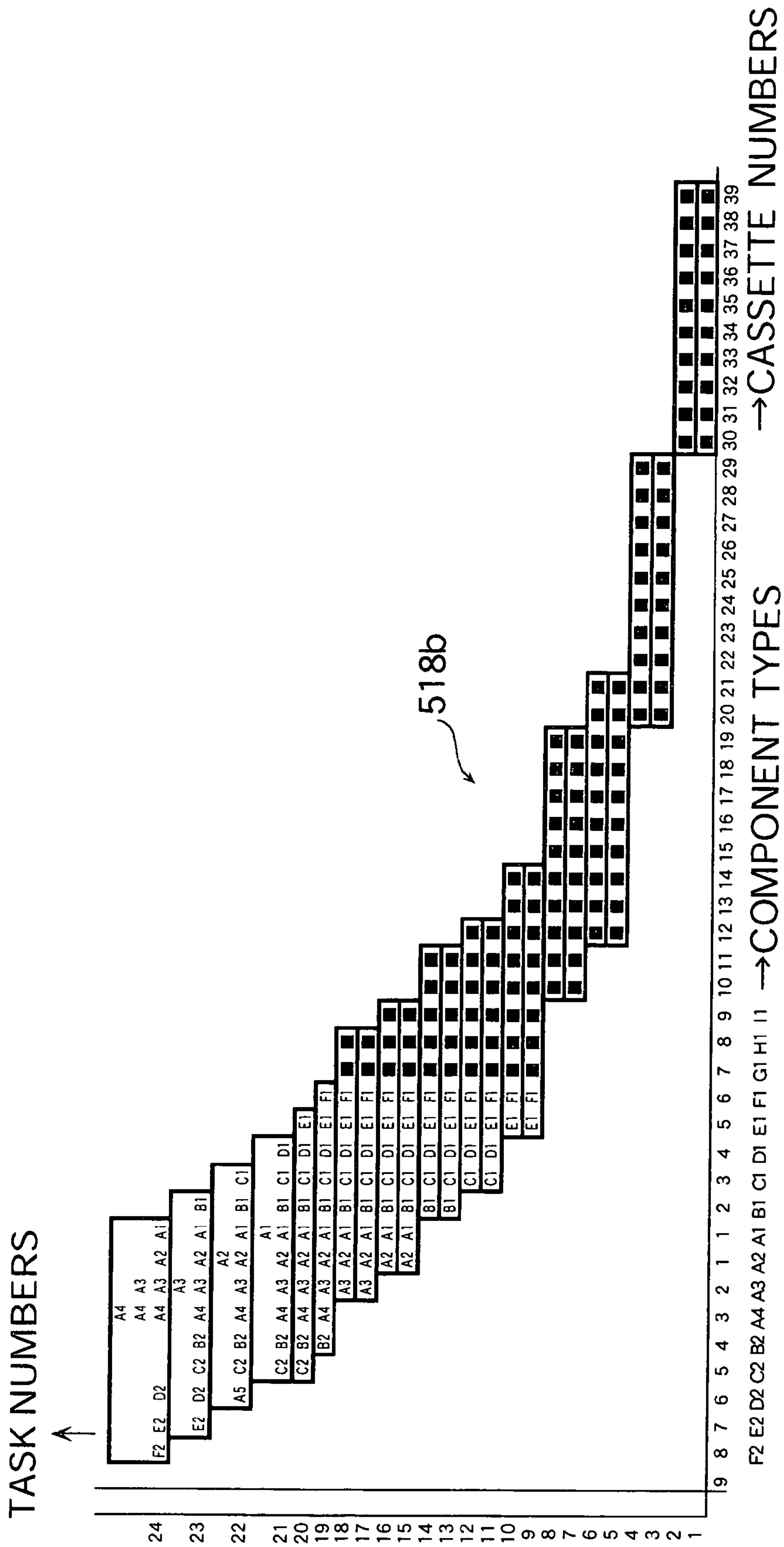
FIG. 61 is a component histogram that is used to illustrate step (14) of the same procedure.

(14) The arrangement of cassettes following this correction is as shown by the pickup patterns in FIG. 61.

In FIG. 61, task numbers 21 to 23 are surrounded by frames showing that during pickup the line gang pickup head has to make two nozzle strokes.

Figure 62:
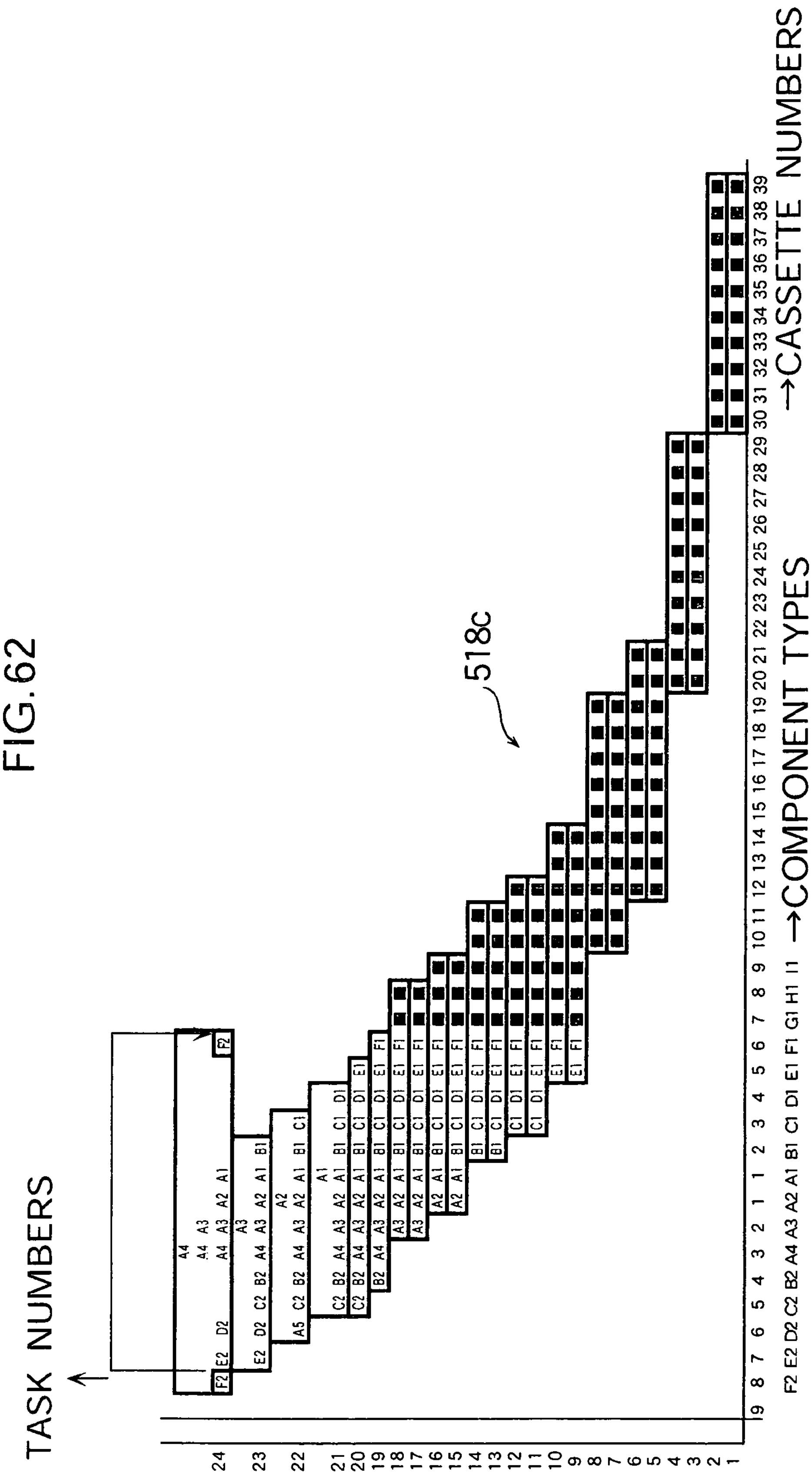
FIG. 62 is a component histogram that is used to illustrate step (15) of the same procedure.

(15) Next, as shown in diagram 518*c*, the number of used cassettes is corrected (see FIG. 62).

Here, it is assumed that the number of used cassettes is one more than the number of cassette resources.

The component, out of components A2 to A4, B2, C2, D2, E2, and F2, that has the lowest number of components to be mounted is selected and combined with other components. In the illustrated example, F2 has the lowest number (one) of components to be mounted and so is combined with F1.

Figure 63:
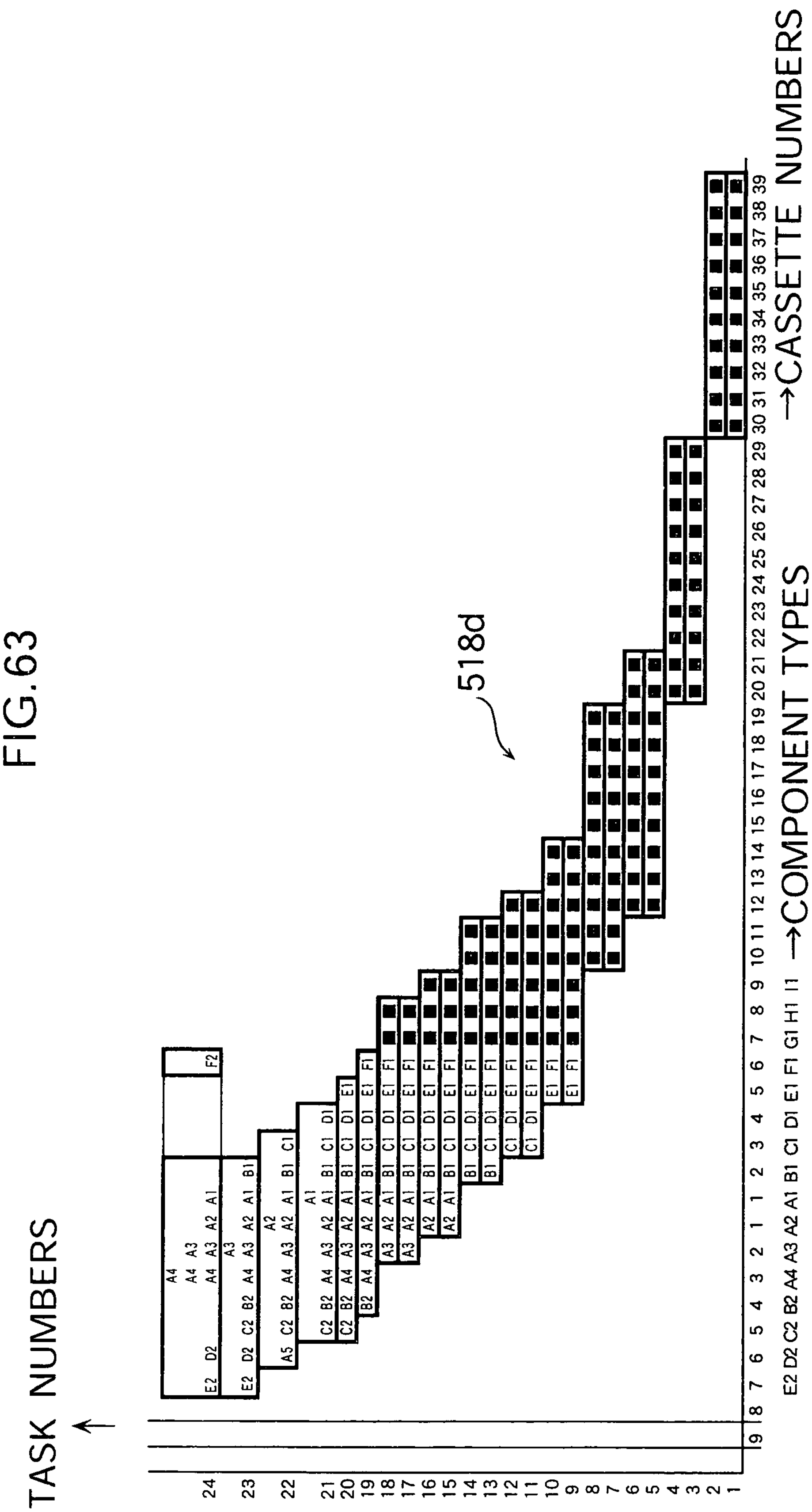
FIG. 63 is a component histogram that is used to illustrate step (16) of the same procedure.

(16) The arrangement of cassettes after this correction is shown by the pickup patterns 518*d* shown in FIG. 63.

As can be seen from FIG. 63, the number of cassettes has been reduced by one.

Figure 64:
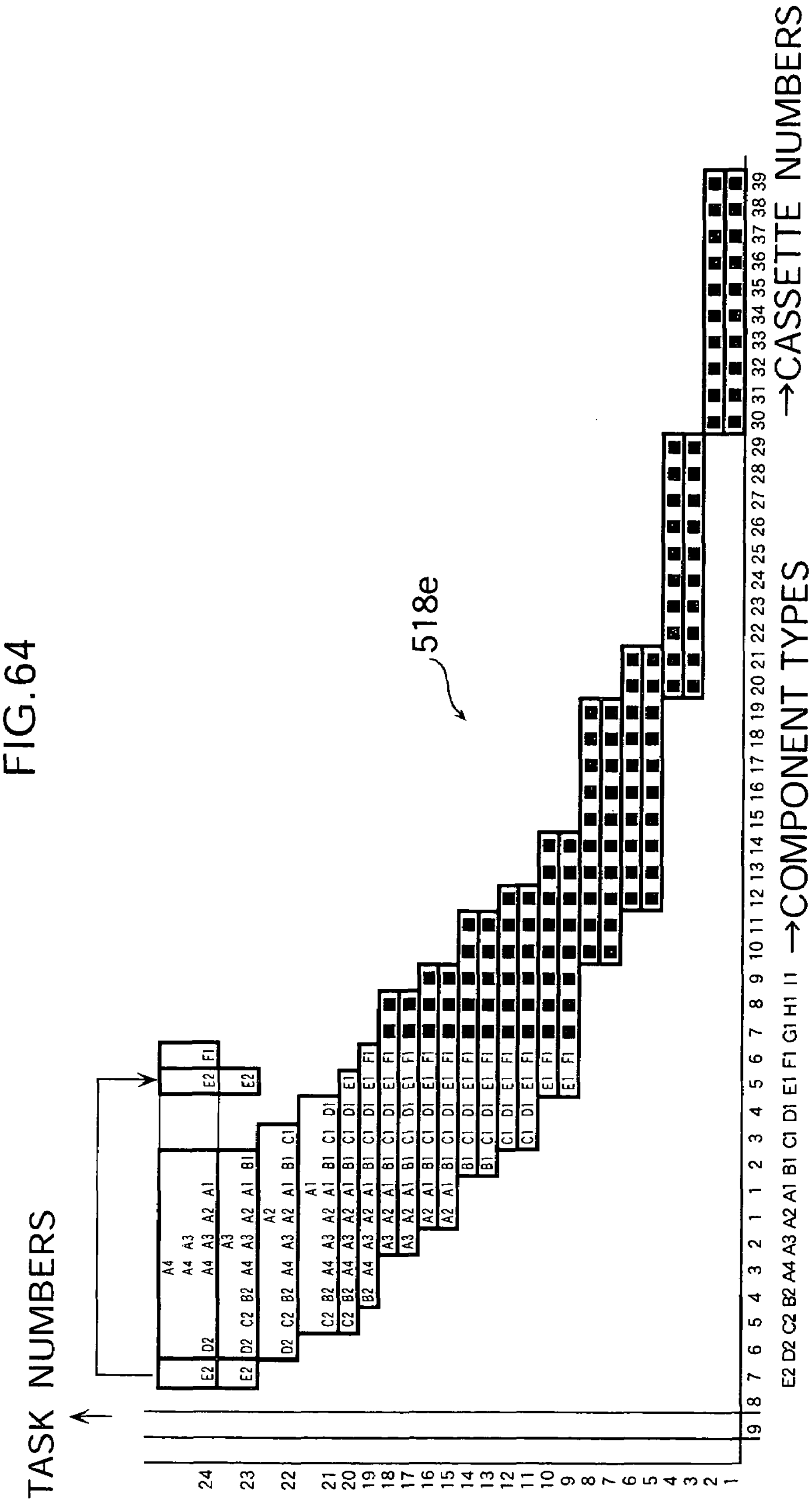
FIG. 64 is a component histogram that is used to illustrate step (17) of the same procedure.

(17) Next, as shown in diagram 518*e*, the occupation of positions on the Z-axis is corrected, which is to say, the usable range of the Z-axis is investigated (see FIG. 64).

Here, it is assumed that the number of used positions in the Z-axis is one greater than the space available on the Z-axis.

In this case, a component, out of components A2 to A4, B2, C2, D2, and E2, that has the lowest number of components to be mounted is selected and combined with another component. In the illustrated example, E2 has the lowest number (two) of components to be mounted and so is combined with El.

Figure 65:
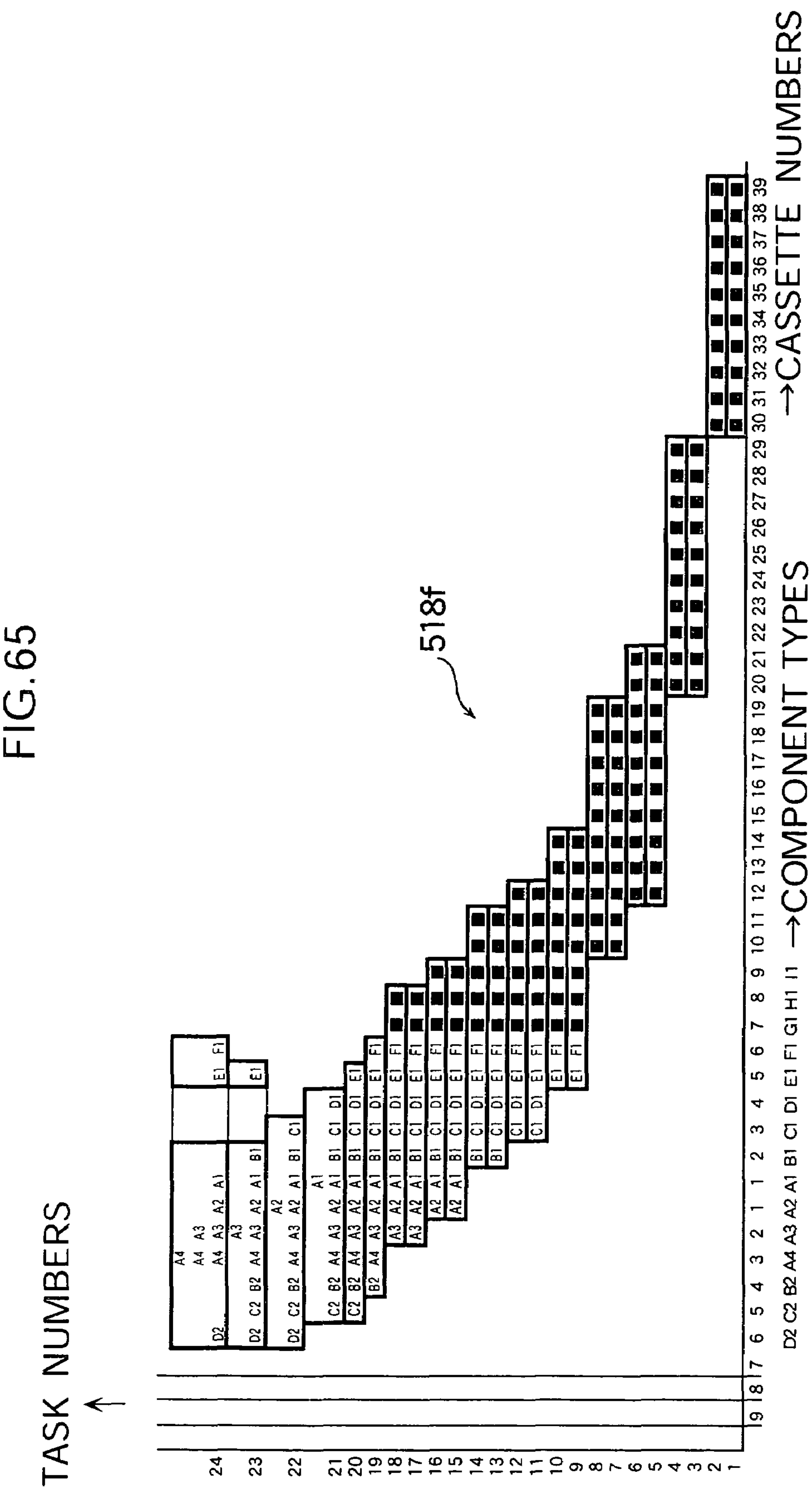
FIG. 65 is a component histogram that is used to illustrate step (18) of the same procedure.

(18) The arrangement of cassettes after this correction is shown by the pickup patterns 518*f* shown in FIG. 65.

As a result of the correction, the number of nozzle strokes to be made during pickup by the line gang pickup head is unchanged at four for task number 24 but has increased to three for task number 23.

(19) The components are arranged on the Z-axis.

Figure 66:
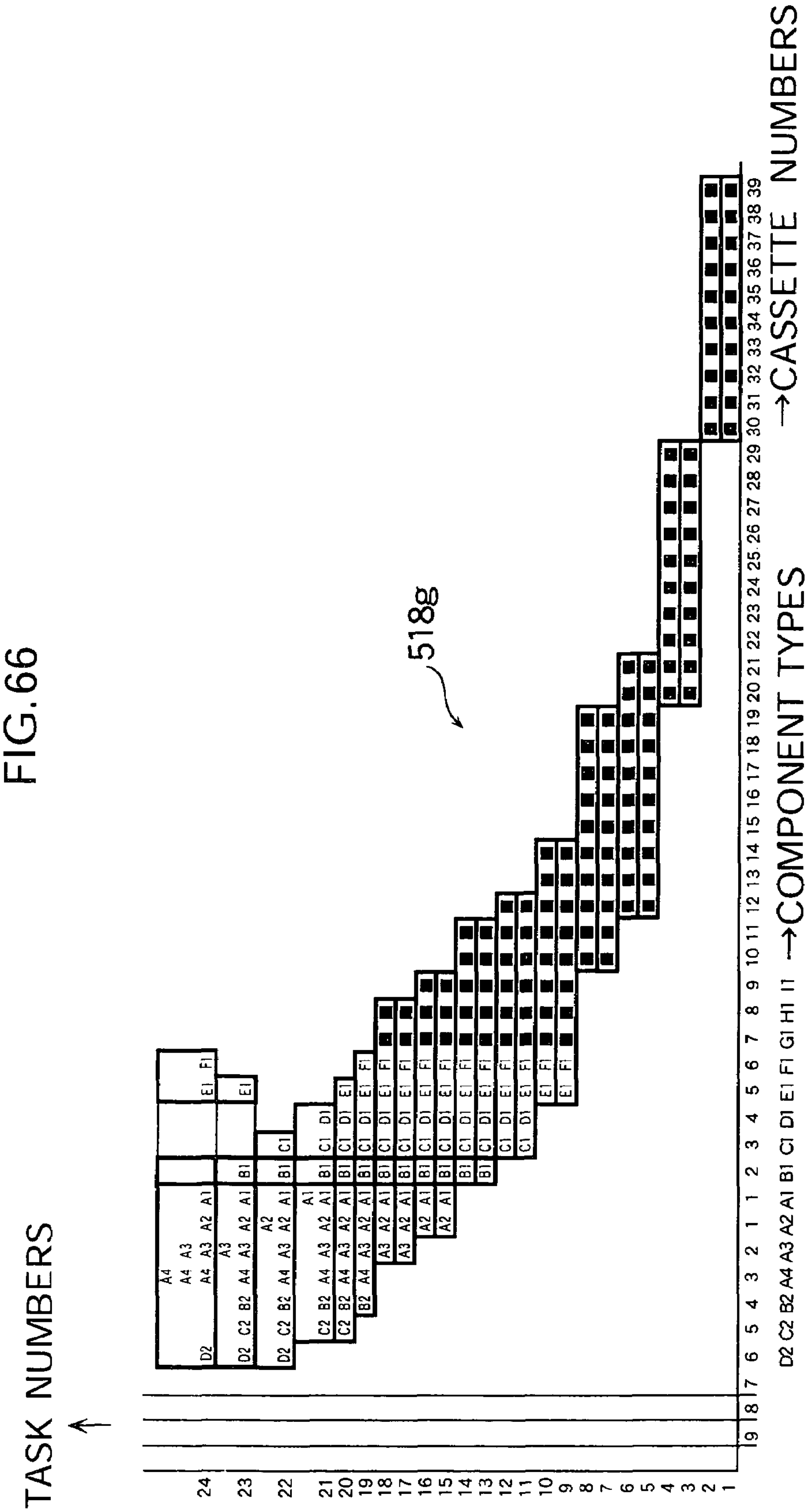
FIG. 66 is a component histogram that is used to illustrate step (19) of the same procedure.

Here, suppose that component B1 is fixed at the Z number "15" as shown by diagram 518*g* (see FIG. 66).

Figure 67:
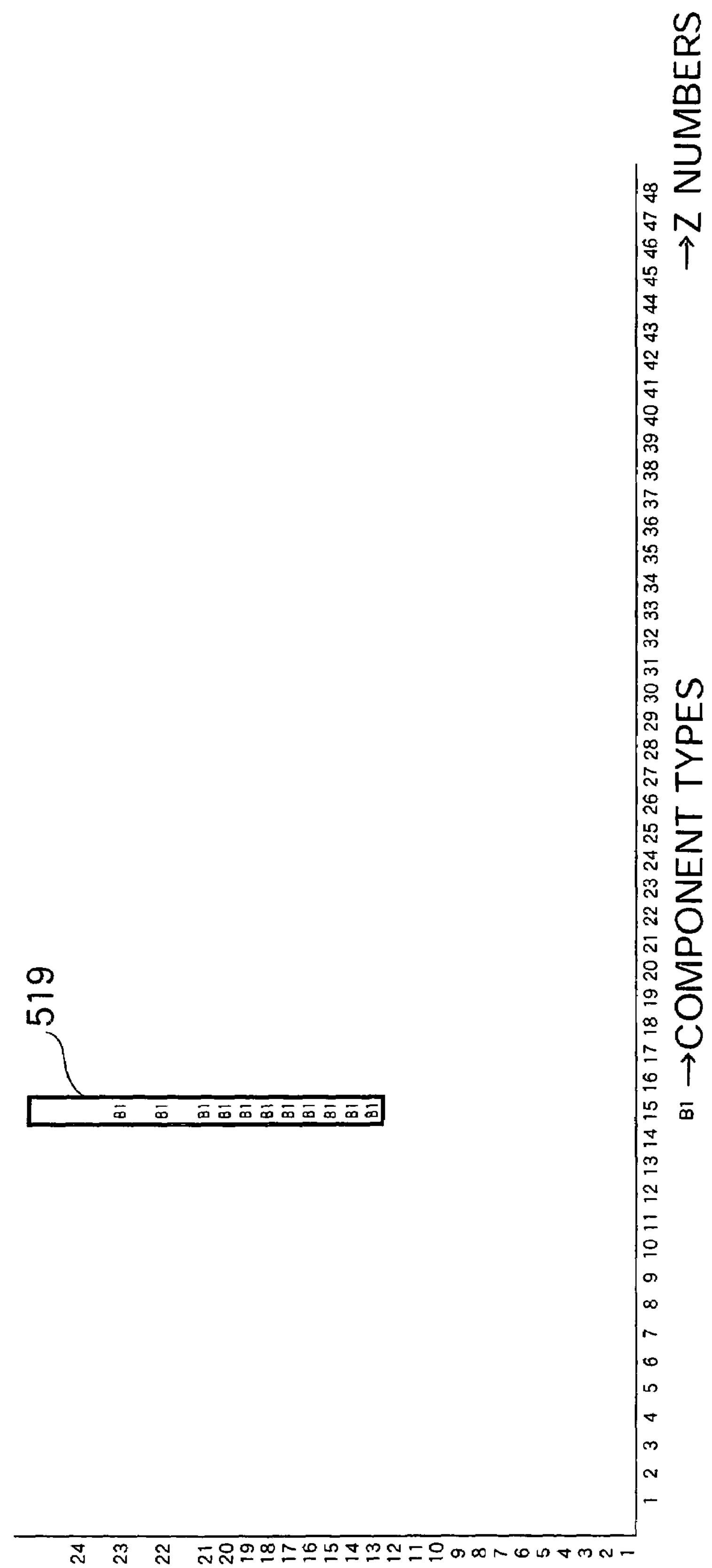
FIG. 67 is a component histogram that is used to illustrate step (20) of the same procedure.

(20) First, the fixed cassette 519 is arranged on the Z-axis (see FIG. 67).

Figure 68:
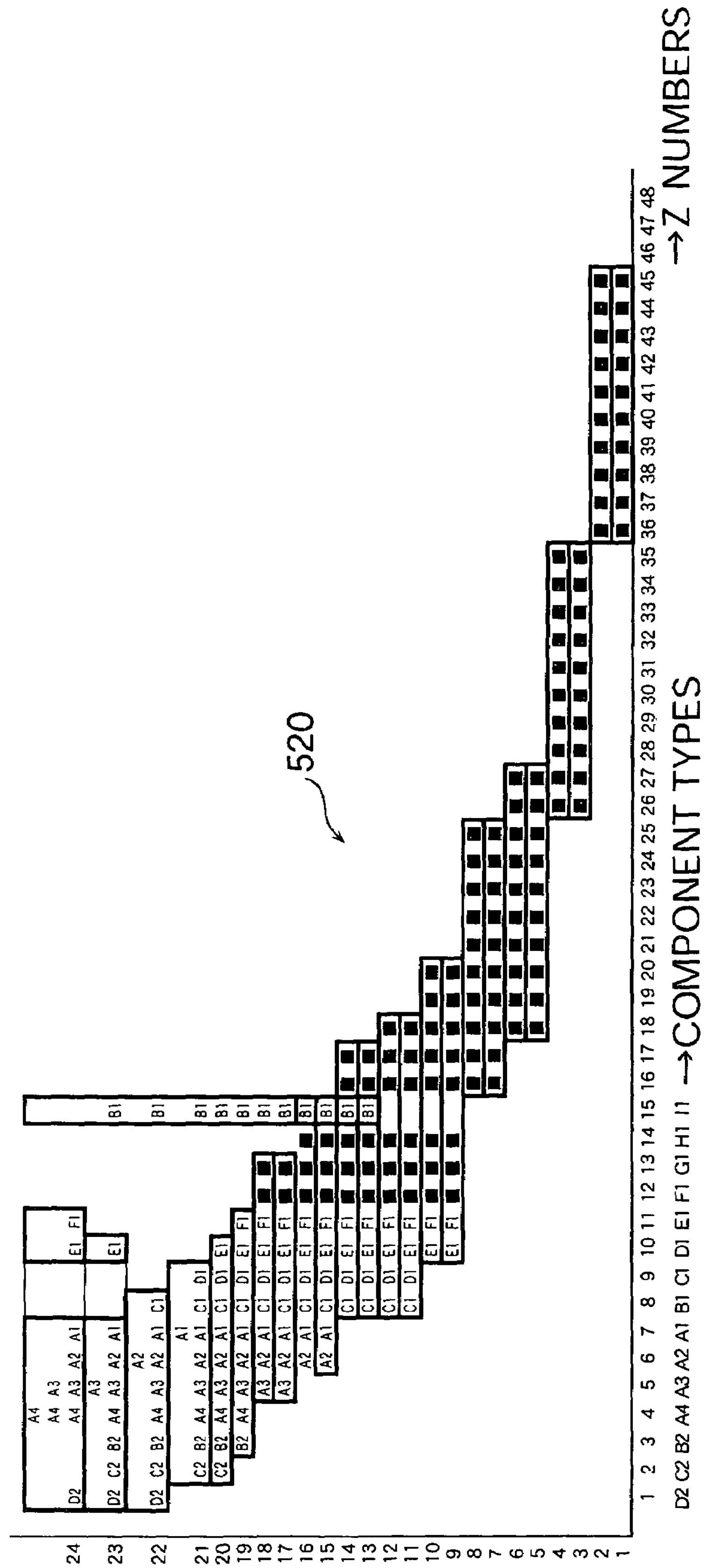
FIG. 68 is a component histogram that is used to illustrate step (21) of the same procedure.

(21) The non-fixed cassettes are arranged on the Z-axis. This results in the production of the pickup patterns 520 (see FIG. 68).

At this point, the non-fixed cassettes are arranged along the Z-axis in the order of cassettes determined in process (19) while avoiding the fixed cassettes.

Figure 69:
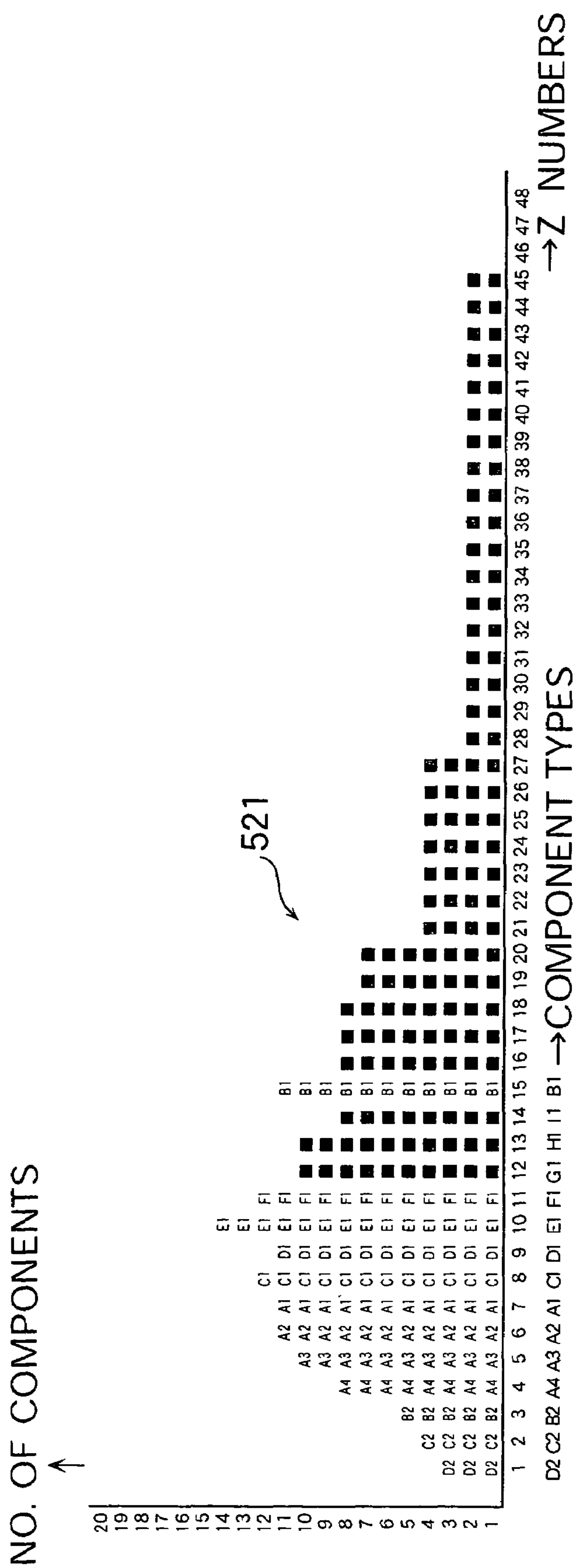
FIG. 69 is a component histogram that is used to illustrate step (22) of the same procedure.

(22) The components are regrouped in the shape of "mountain" 521 (see FIG. 69).

Figure 70:
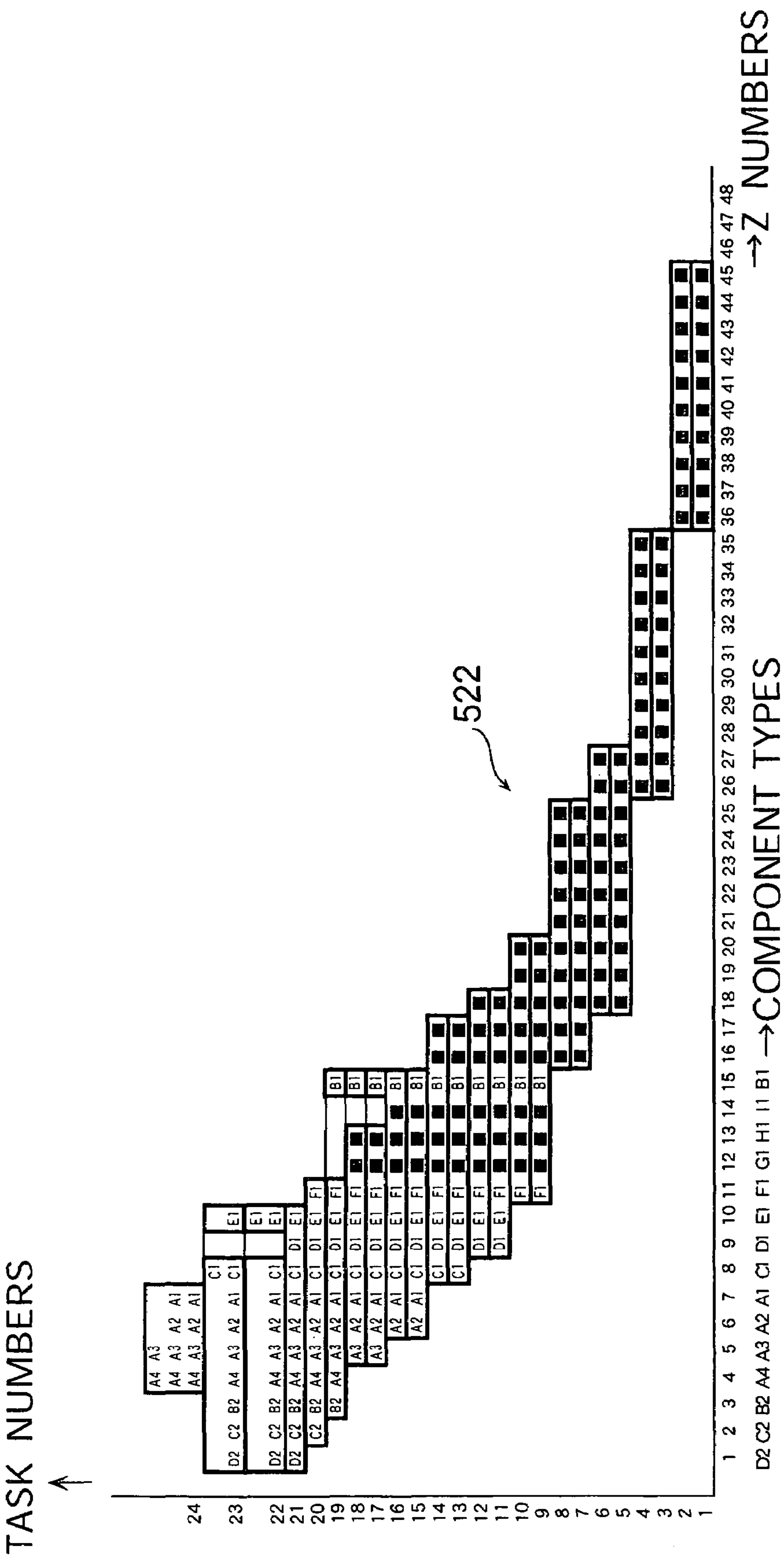
FIG. 70 is a component histogram that is used to illustrate step (23) of the same procedure.

(23) One again, tasks are generated using the cut down procedure to produce the pickup patterns 522 (see FIG. 70).

However, this time the core crush process is not performed. In this example, the line gang pickup head has to make three nozzle strokes to pick up the components in task number 24, two nozzle strokes to pick up the components in each of task numbers 22 and 23, and two nozzle strokes to pick up the components in each of task numbers 17 to 19.

3.9.2 Division of the Cassettes Using a Parallelogram

The following describes the division of the cassettes in the core part using a template in the shape of a parallelogram.

Figure 71:
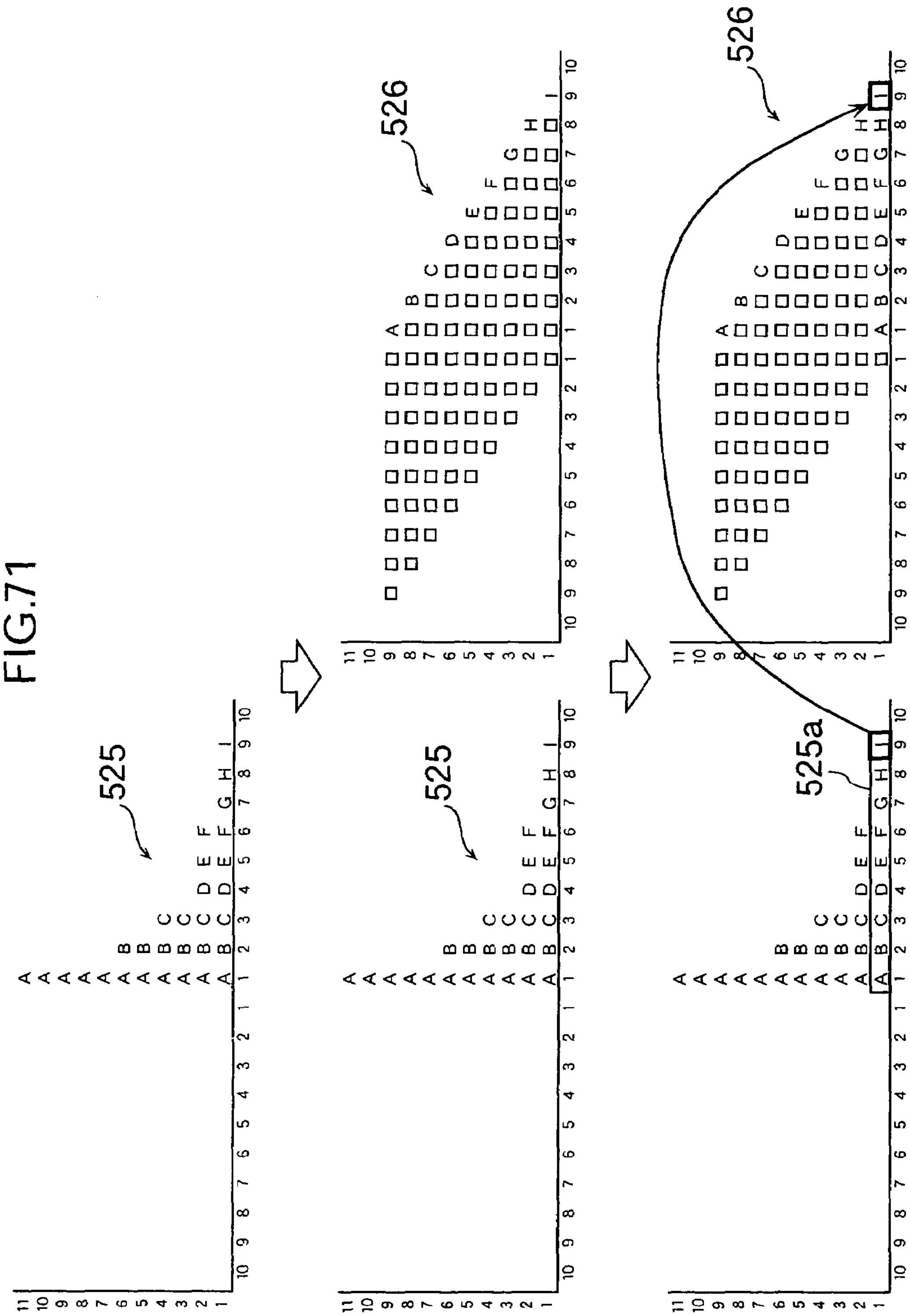
FIG. 71 is a component histogram that is used to illustrate steps (1) to (3) in the optimization procedure performed by dividing cassettes using a parallelogram-shaped template.

(1) In this example, it is assumed that the total number of components in the core part 525 is 30 (shown on the upper level in FIG. 71). As a result, the decision is made to produce three tasks in which ten components are simultaneously picked up.

(2) First, since there are 9 cassettes, a corresponding parallelogram (template) 526 (shown on the right side of the middle level in FIG. 71) is produced. It should be noted that when there are nine rows of ten components in the parallelogram, the letters A to I appended to the right side of the parallelogram 526 show the component types when components are allocated.

(3) Focusing on the first level (the lowest level) 525*a* in the core part 525, the component "I" is located at the rightmost position, so that this component is arranged on the level (in the illustrated example, the lowest level) of the parallelogram 526 that has the same letter "I" (see the lower level in FIG. 71).

Figure 72:
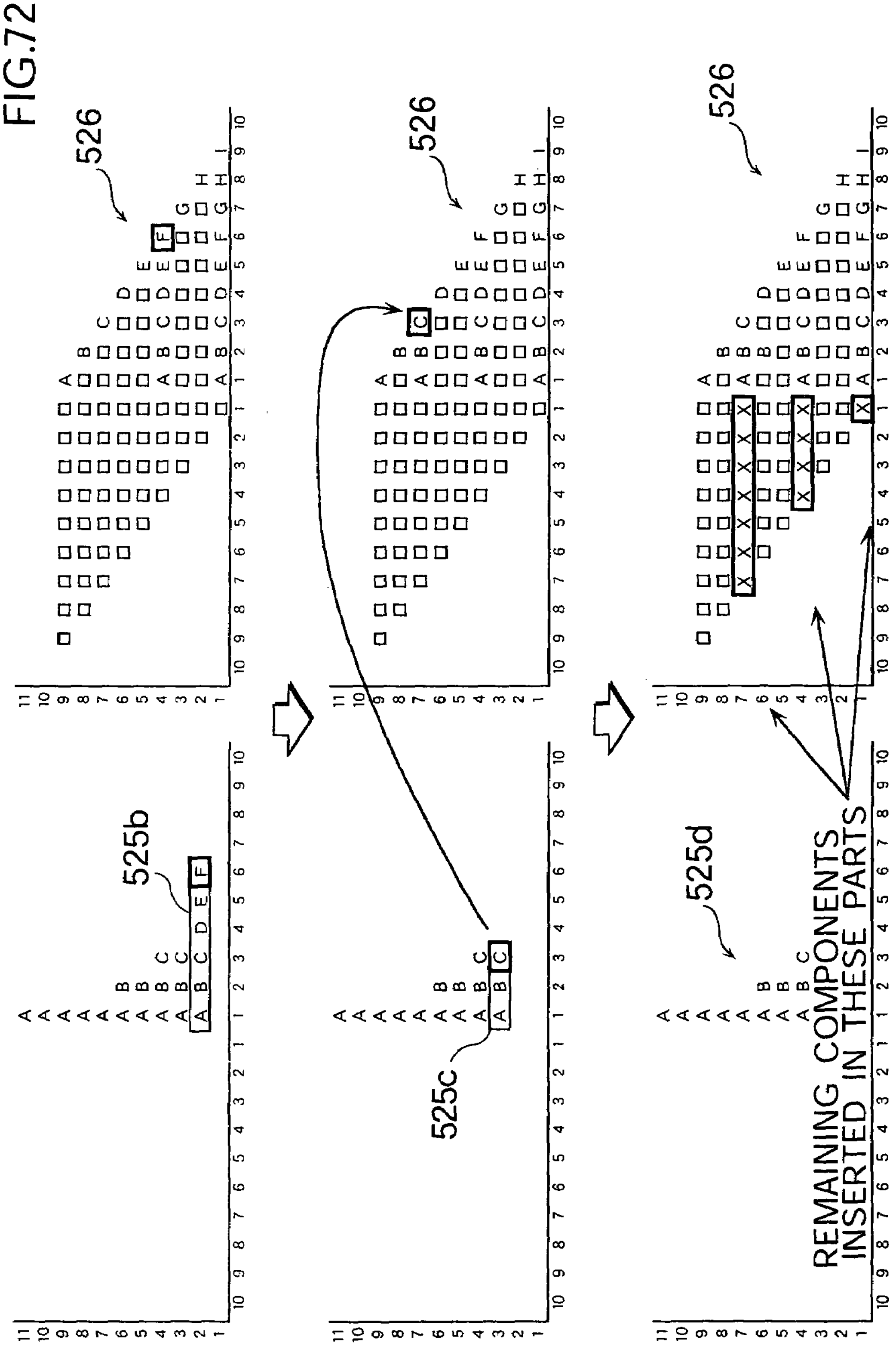
FIG. 72 is a component histogram that is used to illustrate steps (4) to (6) of the same procedure.

(4) Focusing on the second level 525*b* in the core part 525, the component "F" is located at the rightmost position, so that this component is arranged on the level (in the illustrated example, the fourth level) of the parallelogram 526 that has the same letter "F" (see the upper level in FIG. 72).

(5) Focusing on the third level 525*c* in the core part 525, the component "C" is located at the rightmost position, so that this component is arranged on the level (in the illustrated example, the seventh level) of the parallelogram 526 that has the same letter "C" (see the middle level in FIG. 72).

(6) Since there are no more levels where the letters at the rightmost position match, the remaining components 525*c* are arranged into the unused positions ("X") in the levels (first, fourth, and seventh) in which components have been arranged.

Figure 73:
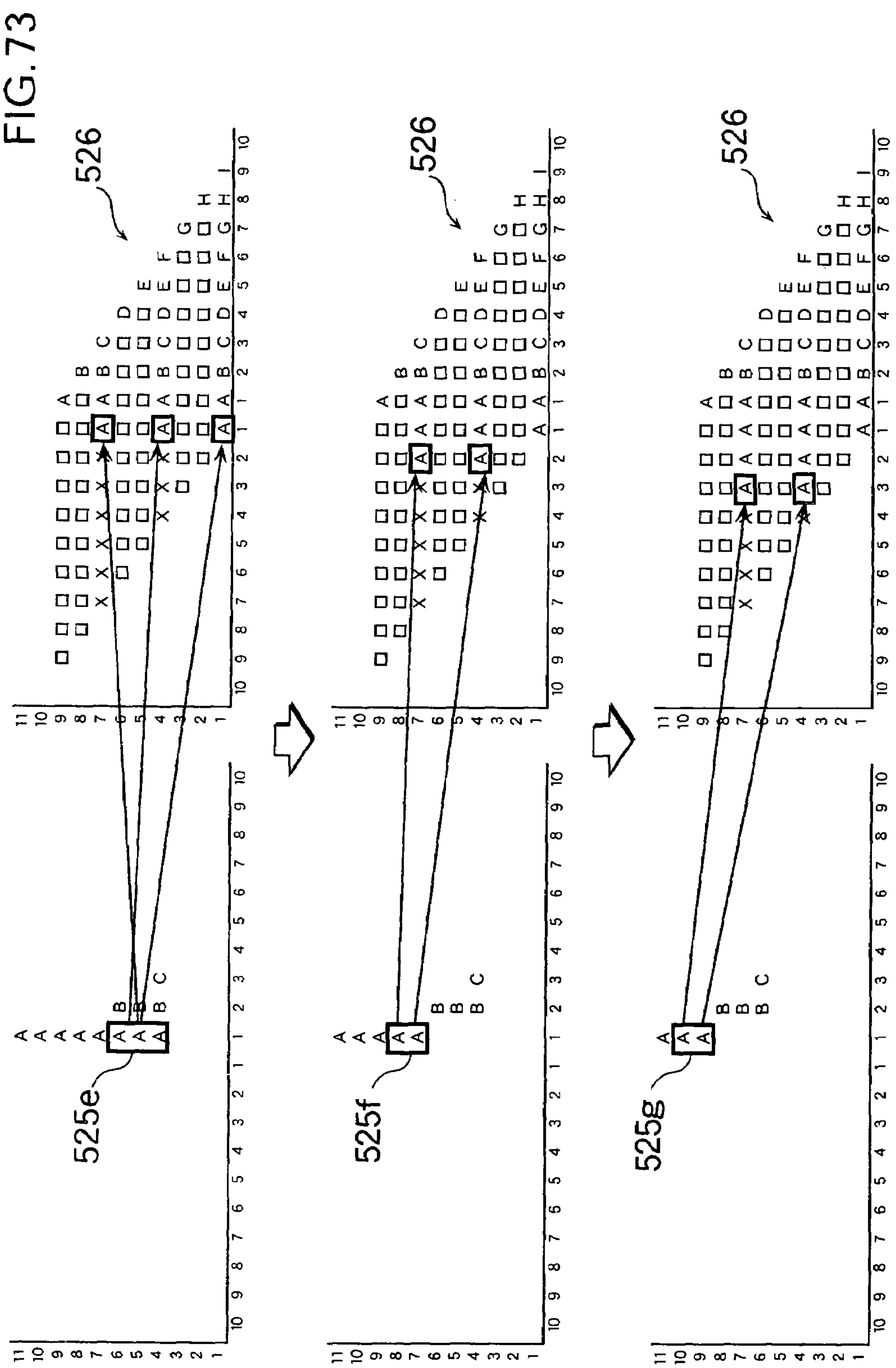
FIG. 73 is a component histogram that is used to illustrate steps (7) to (8) of the same procedure.

(7) At this point, the component types are assigned in descending order of the number of components to be mounted (525*e*, 525*f*) (see the upper and middle levels of FIG. 73).

(8) If the remaining number of components to be mounted is equal, then components are assigned in order of the assigned letters, so that components 525*g* are assigned first (see the lower level in FIG. 73).

Figure 74:
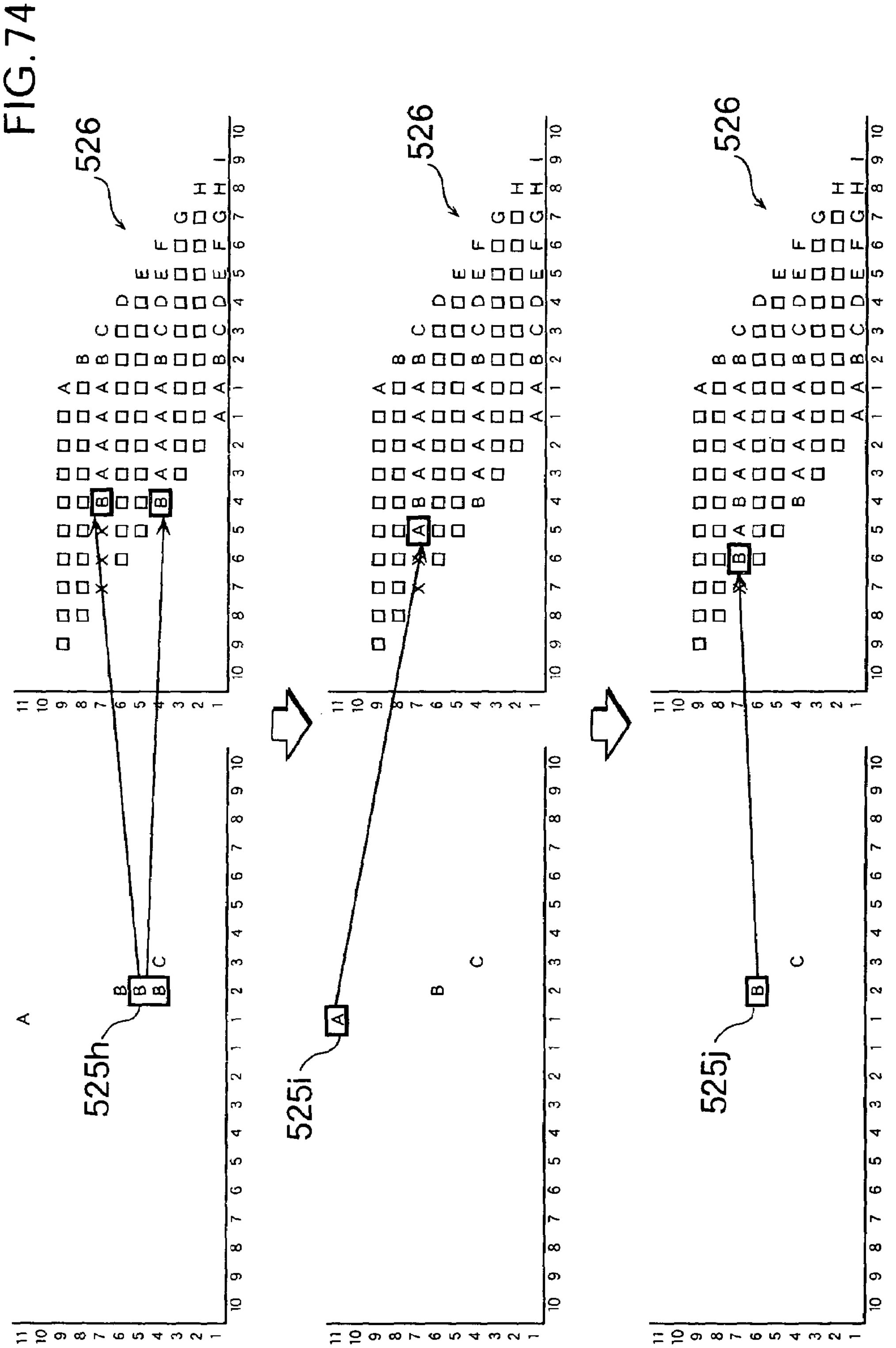
FIG. 74 is a component histogram that is used to illustrate part of step (9) of the same procedure.
Figure 75:
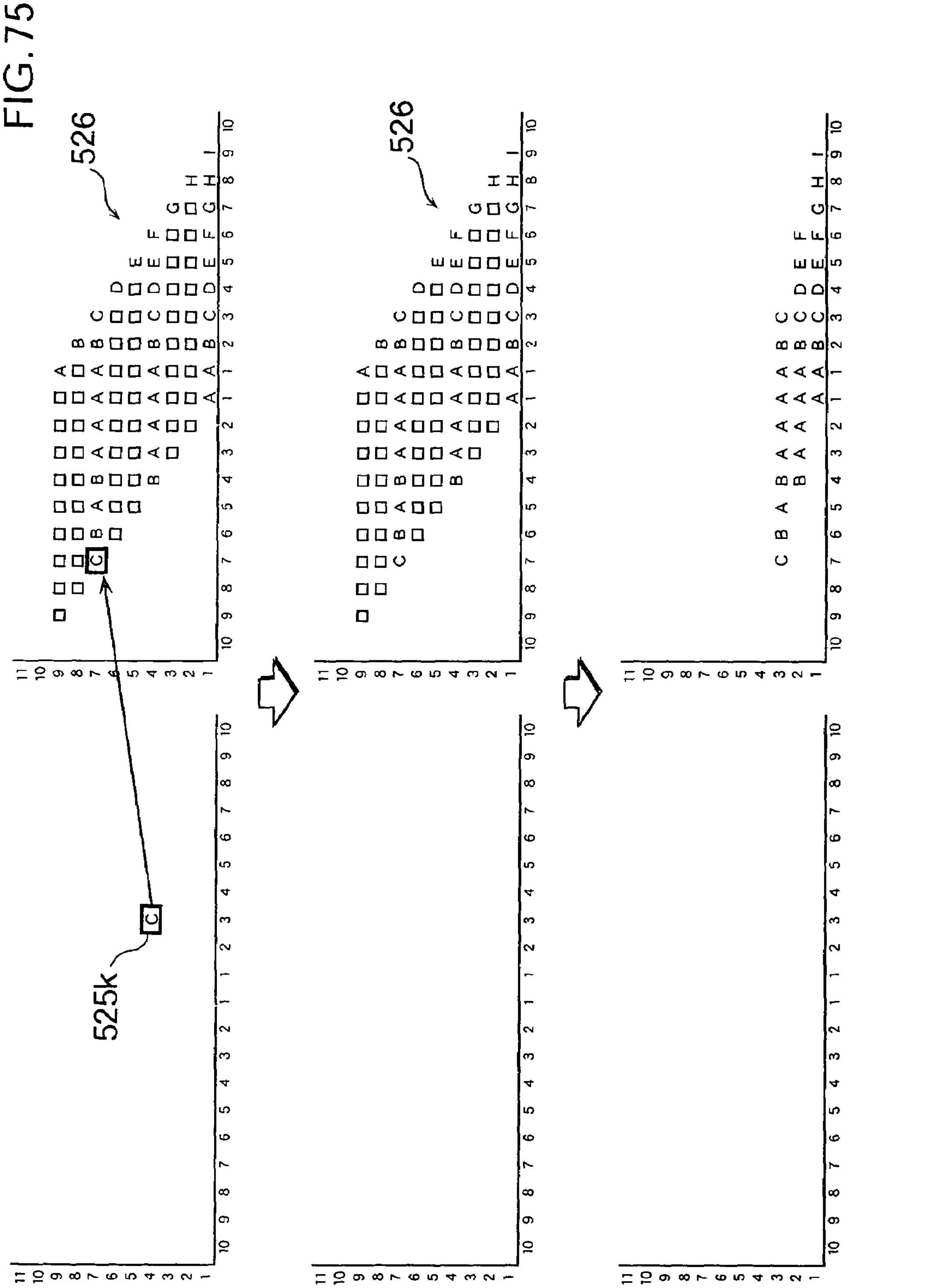
FIG. 75 is a component histogram that is used to illustrate the remaining part of step (9) and step (10) of the same procedure.

(9) The remaining components 525*h* to 525*k* are arranged into the template 526 in accordance with the above rules (see FIG. 74 and the upper level in FIG. 75).

(10) When all of the components have been arranged into the template 526, the first, fourth, and seventh levels will be full of components (see the middle level in FIG. 75), and by removing the gaps between the first, fourth, and seventh levels the division of the cassettes is completed (see the lower level in FIG. 75).

3.9.3 Division of the Cassettes Using a Rectangle

The following describes the division of the cassettes in the core part using a template in the shape of a rectangle.

Figure 76:
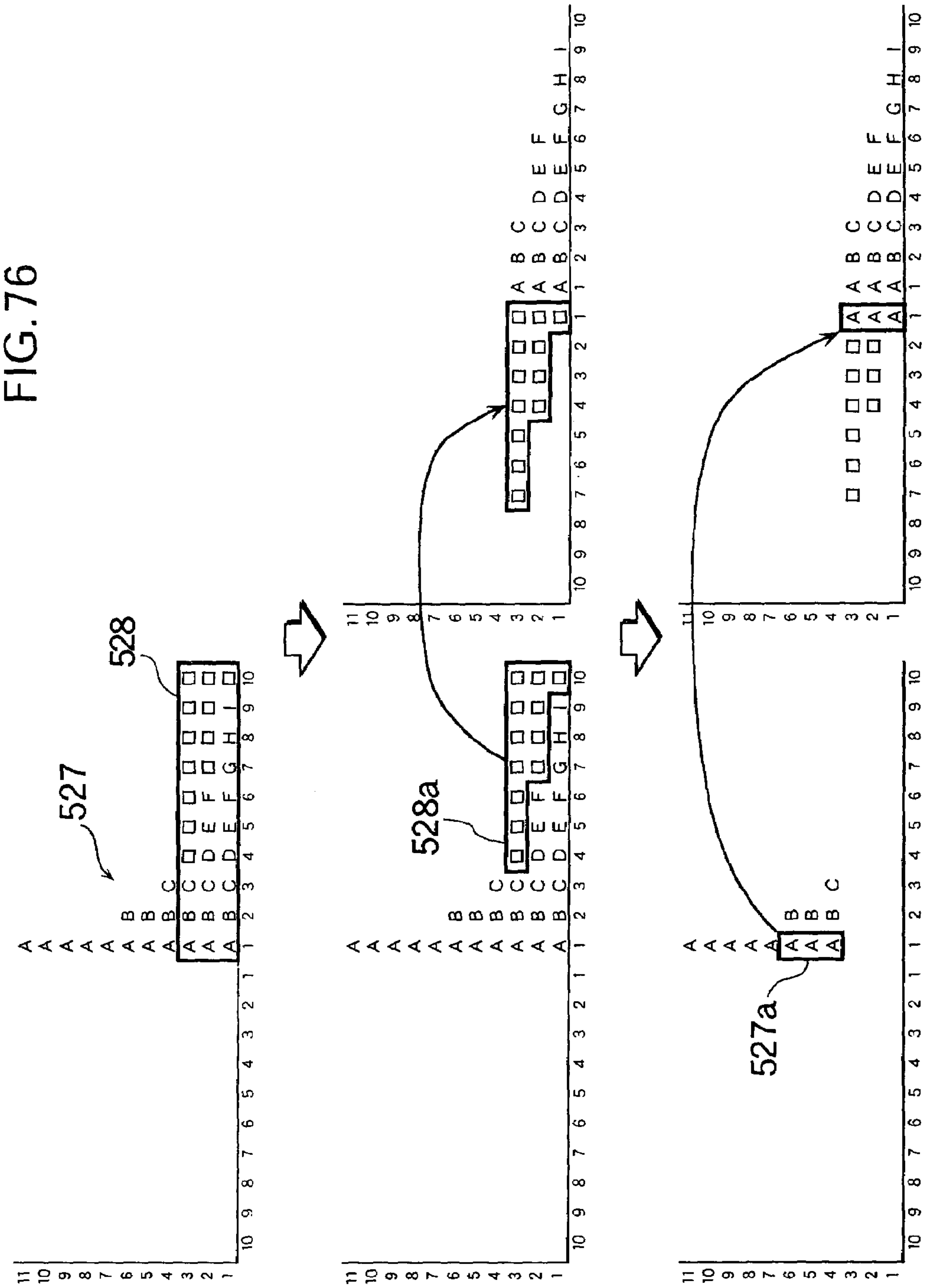
FIG. 76 is a component histogram that is used to illustrate steps (1) to (3) in the optimization procedure performed by dividing cassettes using a rectangle-shaped template.

(1) In this example, a template (in the present example, a template that is 10 components wide and 3 components high) 528 is placed over a core part 525 with a total of 30 components (see the upper level in FIG. 76).

(2) The region to be supplemented (indicated using white squares) 528*a* is placed to the left of the region covered by the template (see the middle level in FIG. 76).

(3) Components are transferred to the supplementary region 528*a* of the template (see the lower level of FIG. 76 and the upper level of FIG. 77), starting with the components 527*a* and 527*b* with the most remaining components to be mounted.

Figure 77:
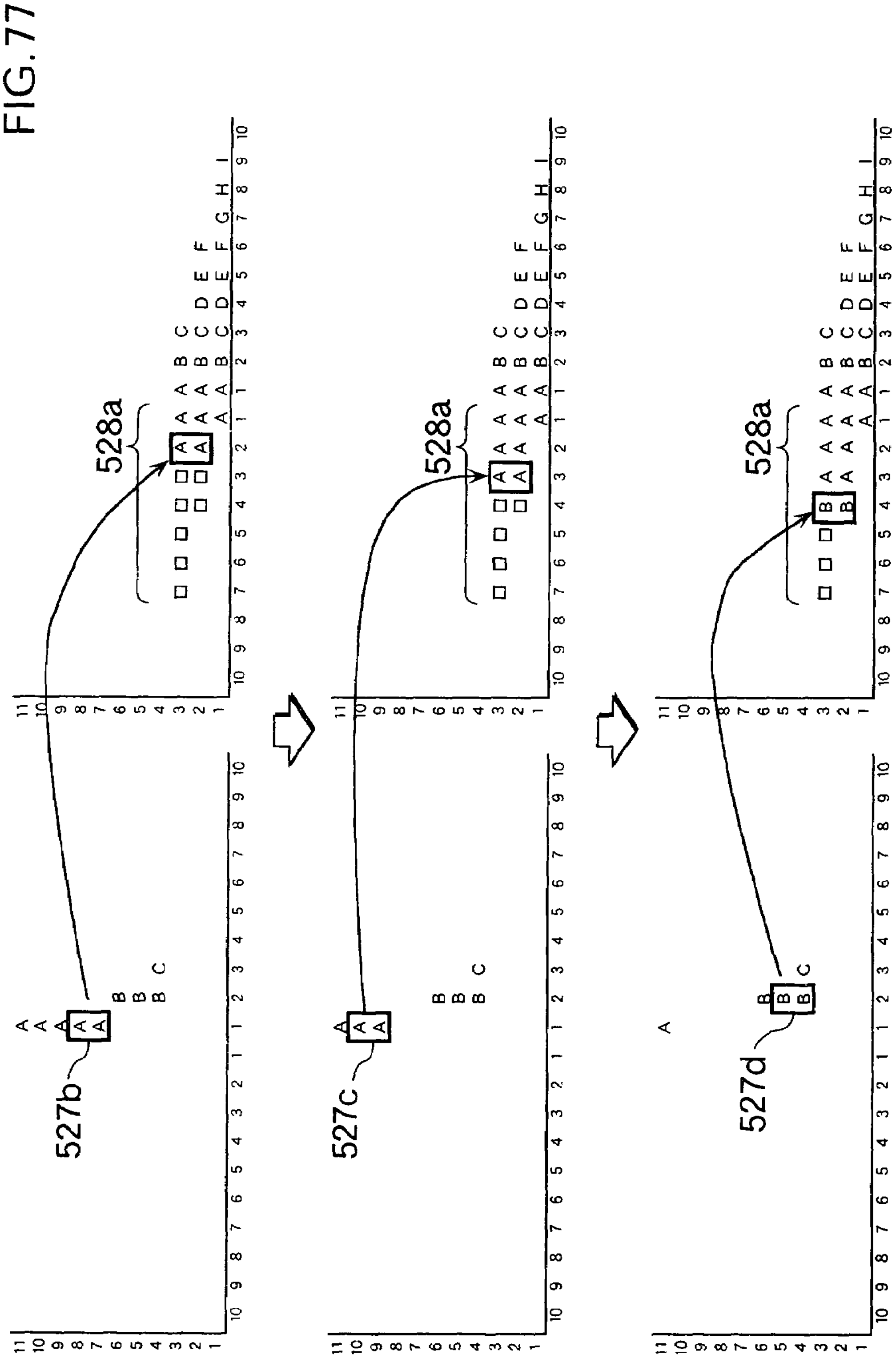
FIG. 77 is a component histogram that is used to illustrate steps (3) to (5) of the same procedure.

(4) If two component types have the same number of remaining components, then components are assigned in order of the letters, so that components 527*c* are assigned first (see the middle level in FIG. 77).

Figure 78:
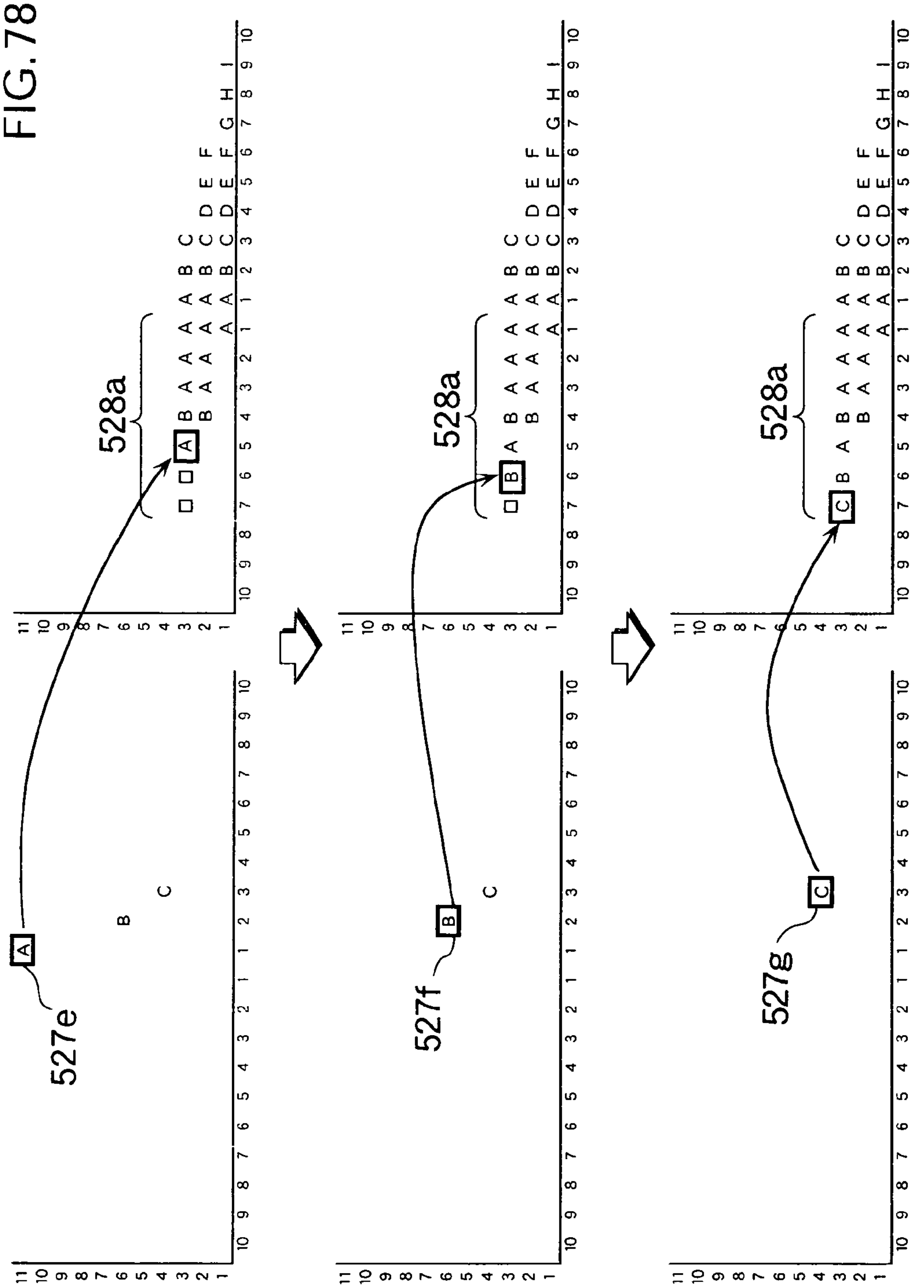
FIG. 78 is a component histogram that is used to illustrate part of step (5) of the same procedure.
Figure 79:
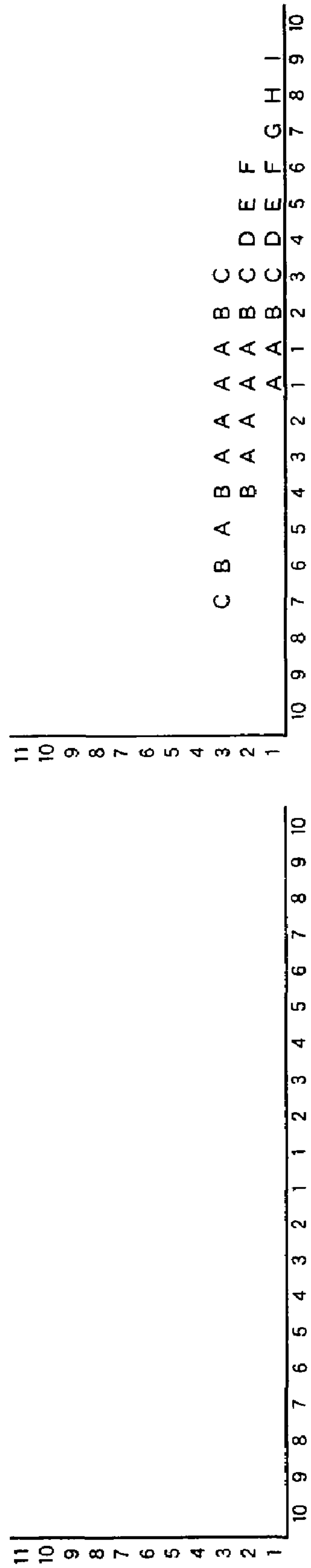
FIG. 79 is a component histogram that is used to illustrate the remaining part of step (5) of the same procedure.

(5) The remaining components 527*d* to 525*g* are arranged into the template 528*a* in accordance with the above rules (see FIGS. 78 and 79) and when all components have been arranged, the division of the cassettes is complete.

3.9.4 Core Crush Process for a Given Number of Cassettes

After performing the fundamental core crush processing and forming the ideal "mountain", the number of supplementary cassettes is suppressed to within the number allowed by the available cassette resources.

When performing the core crush processing, the following processing can be used to produce a number of supplementary cassettes that is equal to the available number of cassettes. First, numbers of components are assigned to supplementary cassettes, and the remaining components to be mounted for the component tapes that are left in the core part are evenly distributed among the same types of components.

For double cassettes, a core is left at odd-numbered Z positions, so that supplementary cassettes may be produced in the same way as in the core crush process for single cassettes. In this case, the supplementary cassettes are used in only the odd-numbered side of the double cassettes (the odd-numbered Z positions). The processing for suppressing the number of cassettes can be performed in the same way as with single cassettes.

In more detail, (1) Core crush processing is performed on the core part to produce an ideal "mountain".

(2) The number N of supplementary cassettes is found.

(3) The number N of supplementary cassettes is compared with the given number of cassettes M.

(4) If N≦M then the process ends.

Here the return value is assumed to be "N".

In the core crush processing, there are cases where it is not necessary to utilize the entire number of cassettes available, so that N is set as the return value.

Since the maximum number of supplementary cassettes is 9, this processing has no effect when there are 10 or more cassettes available Cassette resources are managed using the return value N.

(5) If N>M, then the number of cassettes is suppressed by one.

(5.1.) The cassette C with the lowest number of components to be mounted is found in the mountain.

(5.2) A cassette D with the same component type as cassette C is found in the mountain. Here, in some cases, a plurality of suitable cassettes D are present. Note that cassette C is not included in the number of cassettes D.

(5.3) The number of components to be mounted for cassette C are evenly distributed among the cassettes D. When this number cannot be distributed evenly, the components to be mounted are distributed in a manner that increases the number of components to be mounted near the center of the mountain.

As one example, when five components are to be mounted for cassette C and there are three cassettes D, the components are divided into 2 components, 2 components, and 1 component, and distributed as 2 components, 2 components, and 1 component to cassettes in order starting from the closest cassette to the center of the mountain.

(6) One is subtracted from the number of supplementary cassettes N.

(7) The processing returns to (3)

3.9.5 Task Generation Process for Small Components

This process determines which nozzle numbers should correspond to which Z numbers and generates a pickup pattern for each task.

The correspondence between nozzles and mounting points is decided according to the greedy method.

The apparatus scans the "mountain" starting from its "sides" and generates pickup patterns. When doing so, the heads and the scanning direction for the Z-axis are opposite for the left block situated on the left side of the mountain where the Z numbers are low and the right block situated on the right side of the mountain where the Z numbers are high, though fundamentally the same operation is performed.

In the case of double cassettes, components to be mounted for component tapes located in the odd-numbered Z positions are assigned to pickup patterns after all of the components to be mounted for component tapes located in the even-numbered Z positions have been assigned to pickup patterns. When the last task to be produced from the component tapes located in the even-numbered Z positions is composed of fewer that 10 components, the remaining spaces in the pickup pattern can be used to pick up components from component tapes located in odd-numbered Z positions.

Points to be Considered During Programming

In the processing described below, it is judged whether components should be picked up from a component tape arranged on the real Z-axis by judging whether this component tape belongs to the mountain that is being processed. To achieve this, a component tape is provided with information, such as a "mountain number" or the like showing which mountain it belongs to, as an attribute. Setting this attribute in advance facilitates the processing. In some cases, two or more mountains are produced from the same component group, so that it is preferable not to use the component group number to identify a mountain.

Case for the Left Block (A Mountain For Single Cassettes)

(8) The task number t is set at "1".

(9) The total number of mounting points for the component tapes composing this mountain is found and is set as the total number of mounting points.

(9.1) When the total number of mounting points is zero, the following processing is performed.

(9.1.1) Proceed to process (15)

A mountain with no mounting points does not exist, so the processing returns an error.

(10) The nozzle with the lowest nozzle number, out of the nozzles that are in the task with task number t and have not been associated with a Z number, is found and its nozzle number is set as Nvac.

Here, the nozzles are assumed to be numbered 1 to 10. When none of the nozzles has been associated with a Z number, Nvac is set at "1".

(10.1) When all of the nozzles have been associated with a Z number, the following processing is performed.

(10.1.1) Proceed to process (13)

The processing proceeds to the generation of the pickup pattern for the next task. The number of picked up components for the present task is 10.

(11) Out of the Z numbers of the component tapes that compose the mountain, the lowest Z number at which the nozzle number Nvac can pick up a component is found and set as Zvac.

For the front stage 110, these Z numbers are the odd numbers in the range 1 to 48.

For the rear stage 120, these Z numbers are the odd numbers in the range 97 to 144.

(11.1) The following processing is performed when no suitable Z number is found.

(11.1.1) Proceed to process (13)

The processing proceeds to the generation of the pickup pattern for the next task, with the number of picked up components for the present task being less than 10.

As one example, when a component tape is present only at the position Z=1, only nozzle 1 is capable of picking up a component. Since there are no component tapes from which nozzles 2 to 10 can pick up a component, the value Zvac cannot be set.

(12) When the total number of mounting points is a valid value and Nvac is 10 or below, the following processing is performed.

(12.1) The following processing is performed for the case where no Z number has been associated with the nozzle with the nozzle number Nvac and a component tape at the position Zvac belongs to the mountain.

(12.1.1) The nozzle with the nozzle number Nvac is associated with the position Zvac.

(12.1.2) The number of mounting points for the component tape at the position Zvac is reduced by one.

(12.1.3) The total number of mounting points is reduced by one.

As one example, when a first pickup operation is performed with one nozzle not picking up a component, there is no guarantee than in a second pickup operation, the adjacent nozzles will be able to pick up a component, which is why a judgement is performed as to whether no Z number has been associated with the nozzle with the nozzle number Nvac.

Also, since there is the possibility of a component tape (such as component tape subject to a fixed arrangement) that is unrelated to a present mountain appearing in the mountain, that this condition is checked (in the latter half of the processing).

(12.2) One is added to the value of Nvac.

(12.3) Two is added to the value of Zvac.

(12.4) The processing returns to process (12).

(13) One is added to the task number

(14) The processing returns to process (10)

(15) The pickup pattern generating procedure ends.

Case for the Right Block (A Mountain for Single Cassettes)

(16) The task number t is set at "1".

(17) The total number of mounting points for the component tapes composing this mountain is found and is set as the total number of mounting points.

(17.1) When the total number of mounting points is zero, the following processing is performed.

(17.1.1) Proceed to process (23)

A mountain with no mounting points does not exist, so the processing returns an error.

(18) The nozzle with the highest nozzle number, out of the nozzles that are in the task with task number t and have not been associated with a Z number, is found and its nozzle number is set as Nvac.

Here, the nozzles are assumed to be numbered 1 to 10. When none of the nozzles has been associated with a Z number, Nvac is set at "10".

(18.1) When all of the nozzles have been associated with a Z number, the following processing is performed.

(18.1.1) Proceed to process (21)

The processing proceeds to the generation of the pickup pattern for the next task. The number of picked up components for the present task is 10.

(19) Out of the Z numbers of the component tapes that compose the mountain, the highest Z number at which the nozzle number Nvac can pick up a component is found and set as Zvac.

For the front stage 110, these Z numbers are the odd numbers in the range 49 to 96.

For the rear stage 120, these Z numbers are the odd numbers in the range 145 to 192.

(19.1) The following processing is performed when no suitable Z number is found.

(19.1.1) Proceed to process (21)

The processing proceeds to the generation of the pickup pattern for the next task, with the number of picked up components for the present task being less than 10.

As one example, when a component tape is present only at the position Z=1, only nozzle 1 is capable of picking up a component. Since there are no component tapes from which nozzles 2 to 10 can pick up a component, the value Zvac cannot be set.

(20) When the total number of mounting points is a valid value and Nvac is 1 or above, the following processing is performed.

(20.1) The following processing is performed for the case where no Z number has been associated with the nozzle with the nozzle number Nvac and a component tape at the position Zvac belongs to the mountain.

(20.1.1) The nozzle with the nozzle number Nvac is associated with the position Zvac.

(20.1.2) The number of mounting points for the component tape at the position Zvac is reduced by one.

(20.1.3) The total number of mounting points is reduced by one.

As one example, when a first pickup operation is performed with one nozzle not picking up a component, there is no guarantee than in a second pickup operation, the adjacent nozzles will be able to pick up a component, which is why a judgement is performed as to whether no Z number has been associated with the nozzle with the nozzle number Nvac.

Also, since there is the possibility of a component tape (such as component tape subject to a fixed arrangement) that is unrelated to a present mountain appearing in the mountain, that this condition is checked (in the latter half of the processing).

(20.2) One is added to the value of Nvac.

(20.3) Two is added to the value of Zvac.

(20.4) The processing returns to process (20).

(21) One is added to the task number

(22) The processing returns to process (18)

(23) The pickup pattern generating procedure ends.

Case for the Left Block (A Mountain for Double Cassettes)

(24) Components are picked up from the even-numbered Z positions in double cassettes in the same way as in the case for the left block (a mountain for single cassettes) described above.

The process differs in that the pickup process is performed for even-numbered Z positions, not odd-numbered Z positions.

(25) When the last task to be produced from the component tapes located in the even-numbered Z positions is composed of fewer that 10 components, the task number of this task is set as the initial value to be used when picking up components from the odd-numbered Z positions in the double cassettes.

In this last task, components are picked up using the nozzles in order starting with nozzle 1, so that the unused nozzles have high nozzle numbers. If the pickup pattern of this task is used as the initial state for picking components from the odd-numbered Z positions, it will not be possible to pick up components from component tapes arranged at or around position Z=1, for example. Because of this, the mounting points that are already associated with nozzles are moved to nozzles with high nozzle numbers so as to free the nozzles with low nozzle numbers.

(26) Components are picked up from the odd-numbered Z positions in double cassettes in the same way as in the case for the right block (a mountain for single cassettes) described above.

The process differs in that the pickup process is performed for even-numbered Z positions, not odd-numbered Z positions.

That is, this process differs in that when, as a result of this process picking up components from the even-numbered Z positions in double cassettes, the last task is composed of less than ten components, this task is used as an initial state of the first task produced by picking up components from the odd-numbered Z positions in double cassettes.

Case for the Right Block (A Mountain for Double Cassettes)

(27) Components are picked up from the even-numbered Z positions in double cassettes in the same way as in the case for the right block (a mountain for single cassettes) described above.

The process differs in that the pickup process is performed for even-numbered Z positions, not odd-numbered Z positions.

(28) When the last task to be produced from the component tapes located in the even-numbered Z positions is composed of fewer that 10 components, the task number of this task is set as the initial value to be used when picking up components from the odd-numbered Z positions in the double cassettes.

In this last task, components are picked up using the nozzles in order starting with nozzle 10, so that the unused nozzles have low nozzle numbers. If the pickup pattern of this task is used as the initial state for picking components from the odd-numbered Z positions, it will not be possible to pick up components from component tapes arranged at or around position Z=96, for example. Because of this, the mounting points that are already associated with nozzles are moved to nozzles with low nozzle numbers so as to free the nozzles with high nozzle numbers.

(29) Components are picked up from the odd-numbered Z positions in double cassettes in the same way as in the case for the right block (a mountain for single cassettes) described above.

The process differs in that the pickup process is performed for even-numbered Z positions, not odd-numbered Z positions.

That is, this process differs in that when, as a result of this process picking up components from the even-numbered Z positions in double cassettes, the last task is composed of less than ten components, this task is used as an initial state of the first task produced by picking up components from the odd-numbered Z positions in double cassettes.

3.9.6 Intersection Disentanglement

"Intersection disentanglement" is an optimization algorithm for the assignment of mounting points that is performed after tasks have provisionally determined by assigning mounting points to pickup patterns using the greedy method and hill-climbing method.

Figure 80A:
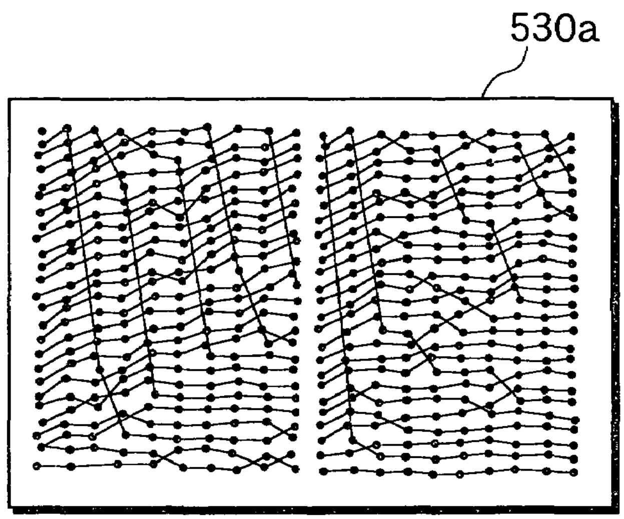
FIG. 80 shows mounting paths used to explain the optimization performed according to intersection disentanglement.
Figure 80B:
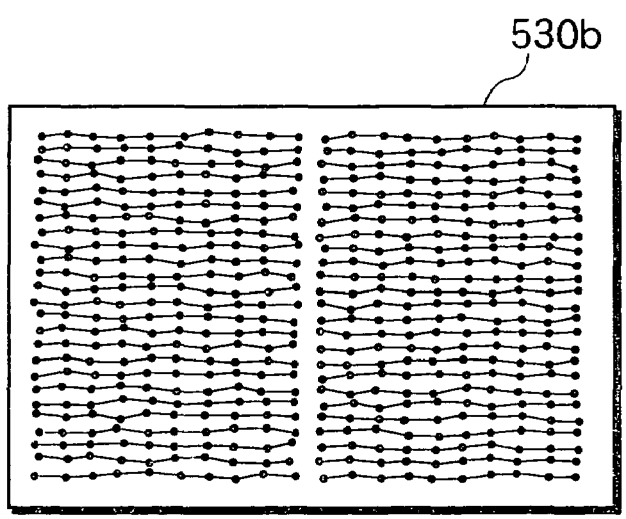

FIG. 80A shows example mounting paths 503*a* (that have been determined by the greedy method) before intersection disentanglement is performed, while FIG. 80B shows mounting paths 503*b* after intersection disentanglement has been performed. As shown in these drawings, the algorithm stops the mounting paths taken by the line gang pickup head unnecessarily crossing over one another.

It should be noted that when the mounting points of the tasks being processed are subject to the head restrictions for an LL or XL substrate, the intersection disentanglement algorithm can be used only if all the mounting points in the part tasks to be interchanged satisfy the expression where head1=head2. In other cases, there is an extremely high probability that use of the intersection disentanglement algorithm results in the head being unable to reach certain mounting points.

Figure 81A:
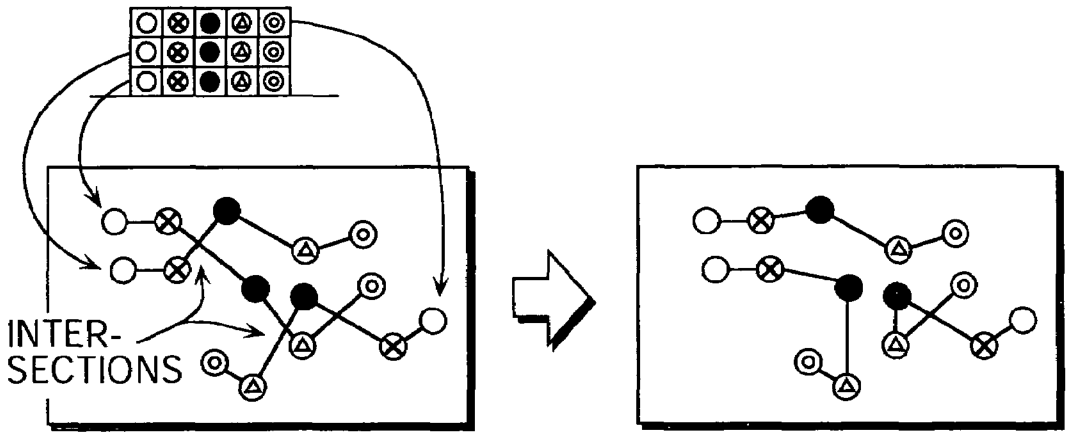
FIG. 81 shows mounting paths that illustrate the algorithm used for intersection disentanglement.
Figure 81B:
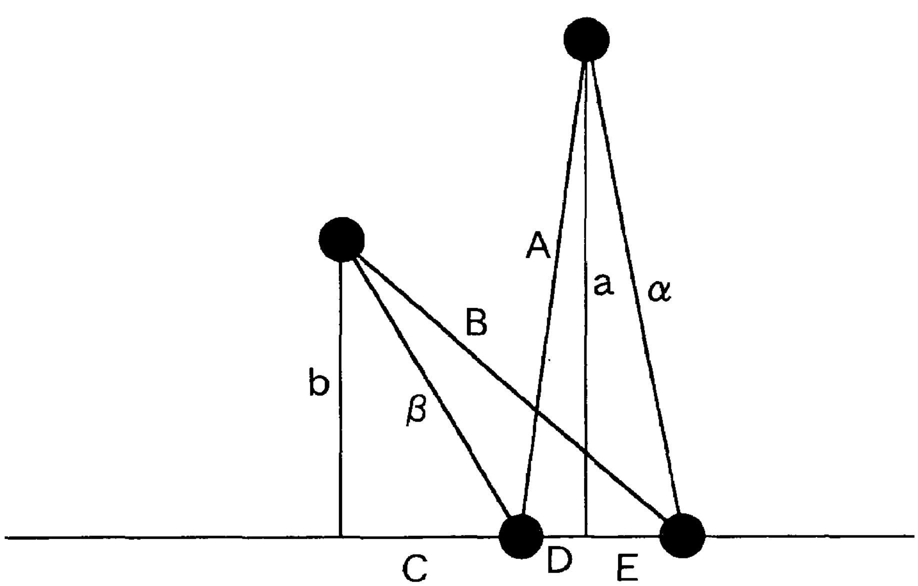

FIG. 81A shows some example mounting paths that are used to explain the intersection disentanglement algorithm. FIG. 81B shows an example where there is one intersection for the mounting points joining four mounting points. A specific example of an algorithm that can be used is described below.

(0) The distance moved by the line gang pickup head for the mounting points in each task is calculated, and the total for all tasks is found.

(1) The value "1" is substituted into the Z coordinate and cutpoints for which mounting points are to be interchanged.

(2) The value "1" is substituted into task1 for which mounting points are to be interchanged (task1=1).

(3) The value "task1+1" is substituted into task2 for which mounting points are to be interchanged task2=taskl+1.

(4) The head numbers (head1, head2) corresponding to the cutpoint are found for each task.

(5) Are the two head numbers appropriate?

(5.1) When the head numbers are inappropriate (i.e., there is no mounting point corresponding to the indicated Z number), the processing advances to process (13)

(5.2) When the head numbers are appropriate, the processing advances to process (6)

(6) The distance moved by the line gang pickup head for the mounting points in each task is calculated, and the total (olength) is found.

(7) The partial tasks to the left of the cutpoint are interchanged.

(8) The distance moved by the line gang pickup head for the mounting points in each task is calculated, and the total (nlengthL) is found.

(9) The partial tasks to the right of the cutpoint are interchanged.

(10) The distance moved by the line gang pickup head for the mounting points in each task is calculated, and the total (nlengthR) is found.

(11) The three totals olength, nlengthL, and nlengthR are compared to find the lowest total.

(12) The tasks that result in this lowest total are set as new tasks.

(13) Variable task2 is incremented. (task2=task2+1)

(14) Variable task2 is compared with the total number of tasks.

(14.1) When task2 does not exceed the number of tasks, the processing returns to process (4).

(14.2) When this is not the case, the processing advances to process (15).

(15) Variable tasks is incremented. (task1=task2+1)

(16) Variable tasks is compared with the total number of tasks.

(16.1) When tasks does not exceed the number of tasks, the processing returns to process (3).

(16.2) When this is not the case, the processing advances to process (17).

(17) The variable cutpoint is incremented (cutpoint=cutpoint+1)

(18) Variable cutpoint is compared with the total number of Z coordinates.

(18.1) When cutpoint does not exceed the number of Z coordinates, the processing returns to process (2).

(18.2) When this is not the case, the processing advances to process (19).

(19) The distance moved by the line gang pickup head for the mounting points in each task is calculated, and the total for all tasks is found.

(20) It is investigated whether the total distance moved by the line gang pickup head has been reduced.

(20.1) When the total has been reduced, the processing returns to process (0).

(20.2) When this is not the case, the processing ends.

Figure 82A:
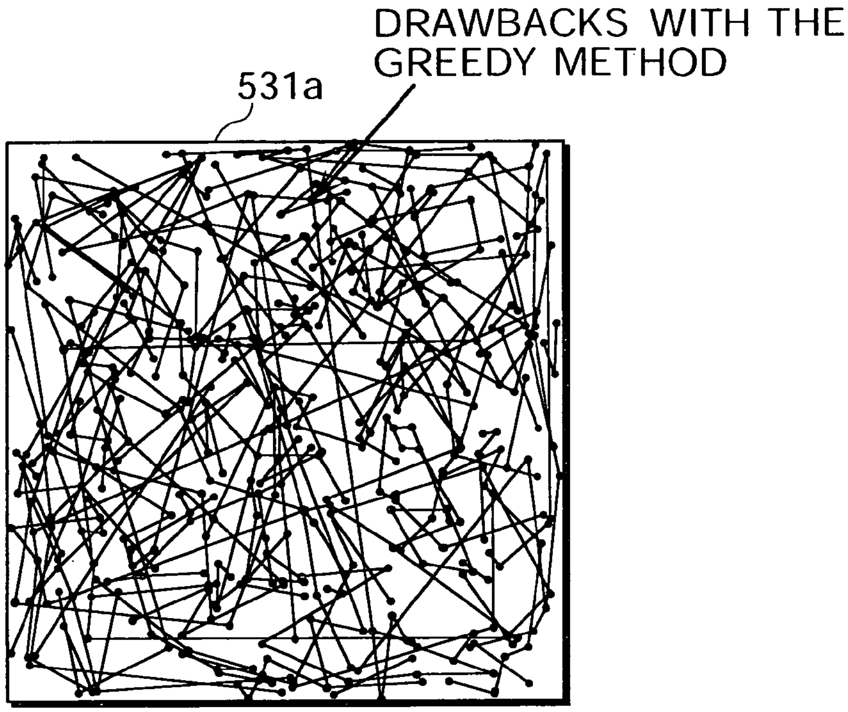
FIG. 82 shows mounting paths that illustrate an application of the algorithm used for intersection disentanglement.
Figure 82B:
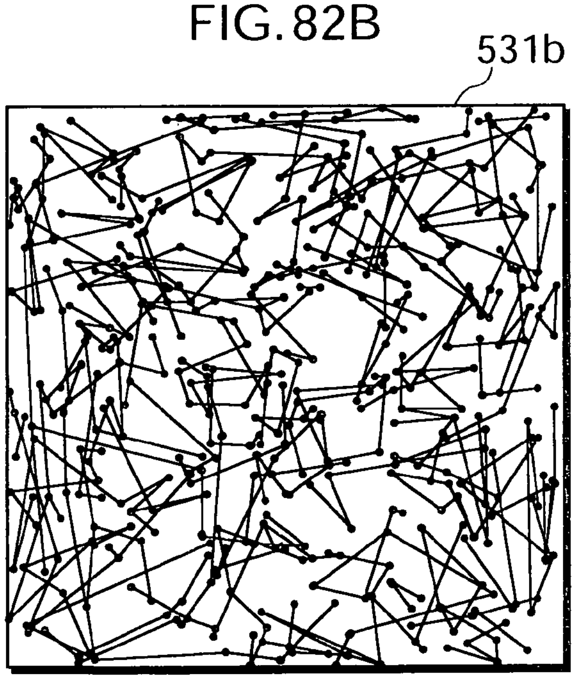

FIGS. 82A and 82B show one example of when mounting paths are subjected to intersection disentanglement using this kind of algorithm. FIG. 82A shows the mounting paths before intersection disentanglement (mounting paths produced by the greedy method), while FIG. 82B shows the mounting paths after intersection disentanglement. As can be seen from FIGS. 82A and 82B, the number of places where the mounting paths cross and the total length of the mounting paths are greatly reduced after the intersection disentanglement.

3.9.7 Return Optimization

Return optimization is an algorithm for optimizing the mounting paths for tasks after mounting points have been assigned to all of the tasks.

In detail, this algorithm is composed of the following processes.

[A] Algorithm for Determining an Initial Mounting Order for Tasks (0) The X coordinate of the final mounting point of each task is found.

(1) A task number list (up[ ]), in which tasks are arranged in descending order of highest X coordinate for the final mounting point, is produced.

(2) The highest Z coordinate for the component tapes of each task is found (the highest Z coordinate from which head number 10 picks up a component).

(3) A task number list (point[ ].task), in which tasks are arranged in descending order of highest Z coordinate, is produced.

(4) For each task, a pair of a present task (here referred to as the "former task") and a task (here referred to as the "latter task") that is mounted following the former task is formed.

(4.1) The variable a is set at "1".

(4.2) The $a^{th}$ task in task number list (up[ ]), in which tasks are arranged in descending order of highest X coordinate for the final mounting point, is assigned to the former task in the pair including the $a^{th}$ task.

(4.3) The $a^{th}$ task in the task number list (point[ ].task), in which tasks are arranged in descending order of highest Z coordinate, is assigned to the latter task in the pair including the $a^{th}$ task.

(4.4) The variable a is incremented by "1".

(4.5) The variable a is compared with the number of tasks.

(4.5.1) When the variable a does not exceed the number of tasks, the processing returns to process (4.1).

(4.5.2) When the variable a exceeds the number of tasks, the processing advances to (5).

(5) The mounting order number 1 is assigned to the task whose final mounting point has the highest X coordinate.

(6) The variable a is set at "1".

(7) A pair of tasks that has the task with the mounting order number a as the former task is found.

(8) The latter task in the above pair is found.

(9) It is investigated whether a mounting order number has already been assigned to the latter task.

(9.1) When a mounting order number has not been assigned to the latter task, the mounting order number (a+1) is assigned to the latter task.

(9.2) When a mounting order number has been assigned to the latter task, an investigation is performed to see whether there are any tasks that have not been assigned a mounting order number.

(9.2.1) When tasks that have not been assigned a mounting order number still remain, the mounting order number (a+1) is assigned to the task, out of the remaining tasks, whose final mounting point has the highest X coordinate.

(9.2.2) When all tasks have been assigned a mounting order number, the initialization is complete, and the processing advances to process (10).

(9.3) The variable a is incremented by "1".

(9.4) The processing returns to process (7) to find the next task to be processed.

[B] Search for the Optimal Mounting Order for Tasks by Interchanging Tasks.

(10) The distance moved by the line gang pickup head for the mounting points in each task is calculated, and the total P1 for all tasks is found.

(11) Two tasks are provisionally interchanged in the mounting order and the mounting order is updated if this results in the line gang pickup head moving by a shorter distance.

(11.1) The value 1 is substituted into the variable tasks that is used for interchanging tasks in the mounting order (task1=1).

(11.2) The value (task1+1) is substituted into the variable task2 that is also used for interchanging tasks in the mounting order (task2=task1+1).

(11.3) The distance moved by the line gang pickup head for the mounting points in each task is calculated, and the total (olength) is found.

(11.4) A new mounting order for tasks is produced by interchanging task1 and task2.

(11.5) The distance moved by the line gang pickup head for the mounting points in each task is calculated, and the total (nlength) is found.

(11.6) The two totals olength and nlength are compared to find the lower total.

(11.7) The mounting order that results in this lower total is set as the new mounting order.

(11.8) Variable task2 is incremented (task2=task2+1).

(11.9) Variable task2 is compared with the number of tasks.

(11.9.1) When task2 does not exceed the number of tasks, the processing returns to process (11.3).

(11.9.2) When this is not the case, the processing advances to process (11.10).

(11.10) Variable task1 is incremented (task1=task1+1).

(11.11) Variable task1 is compared with the number of tasks.

(11.11.1) When task1 does not exceed the number of tasks, the processing returns to process (11.2).

(11.11.2) When this is not the case, the processing advances to process (12).

(12) The distance moved by the line gang pickup head for the mounting points in each task is calculated for the mounting order in which tasks have been interchanged, and the total P2 for all tasks is found.

(13) It is investigated whether the total distance moved by the line gang pickup head has been reduced (i.e., whether P2<P1).

(23.1) When the total has been reduced, the value P2 is substituted into P1, and the processing returns to process (11).

(23.2) When this is not the case, the processing ends.

As can be understood from the above, this algorithm can be roughly divided into the following two parts Part 1

Figure 83:
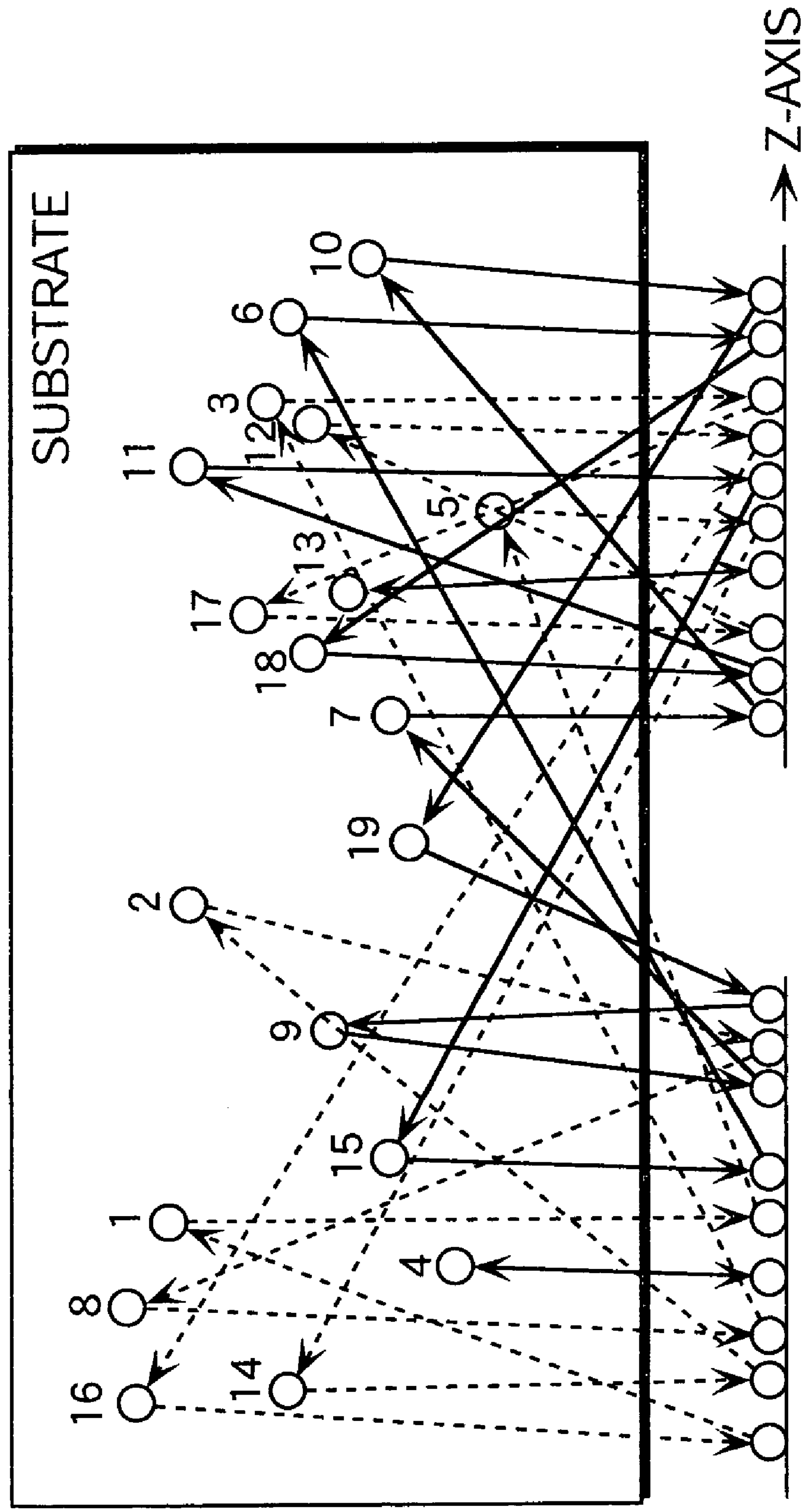
FIG. 83 shows mounting paths taken by the line gang pickup head to illustrate the concept of return optimization.

(i) As shown in FIG. 83, the pickup point (task) that is closest to the final mounting point of each task is found (shown by the arrows drawn with the solid lines). FIG. 83 illustrates the "return" operation that was shown in FIG. 44, and shows the final mounting positions (the circles shown in boxes) on the substrate and the positions (the circles 1 to 19 that have been arranged in a horizontal line) along the Z-axis of the component cassettes from which components should be taken next.

(ii) Mounting paths (the dotted lines in FIG. 83) are successively drawn starting from the number 1 pickup point.

(iii) When the path taken by the head returns to the number 1 pickup point, the path taken thusfar is set as shortest looped partial path 1.

(iv) A pickup position that is yet to be included in a shortest loop partial path generated so far is found. In the example shown in FIG. 83, the pickup position 4 is found.

(v) The processing returns to (ii).

As a result of this processing, five shortest loop partial paths are found for the example shown in FIG. 83.

Part 2

An investigation is performed to find out which pickup point should be handled first to optimize the mounting order of a plurality of shortest loop partial paths. Note that here, mounting may performed in order starting from the right, since there is no need to return to the first position.

Figure 84A:
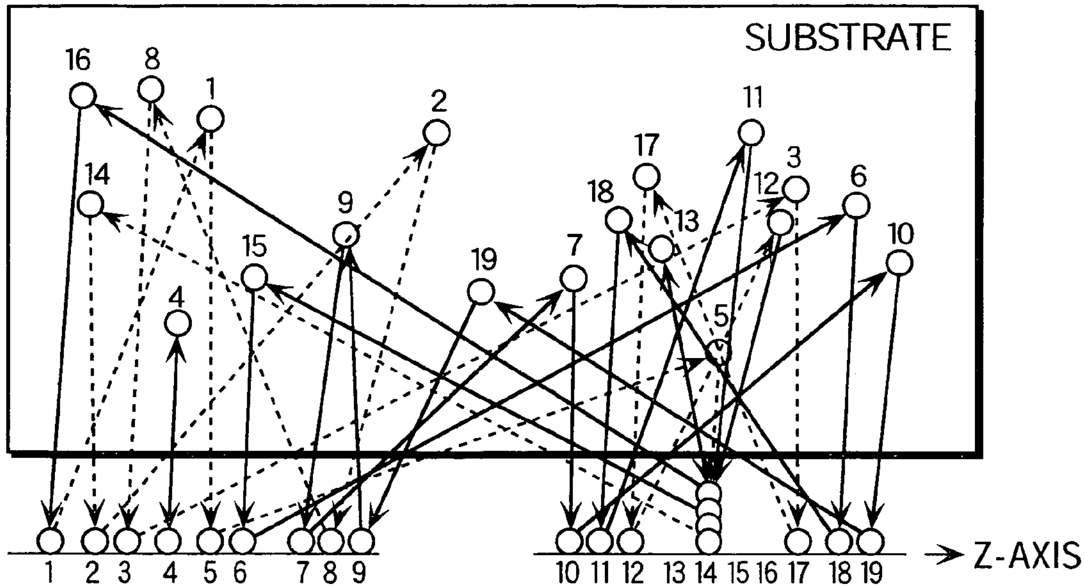
Figure 84B:
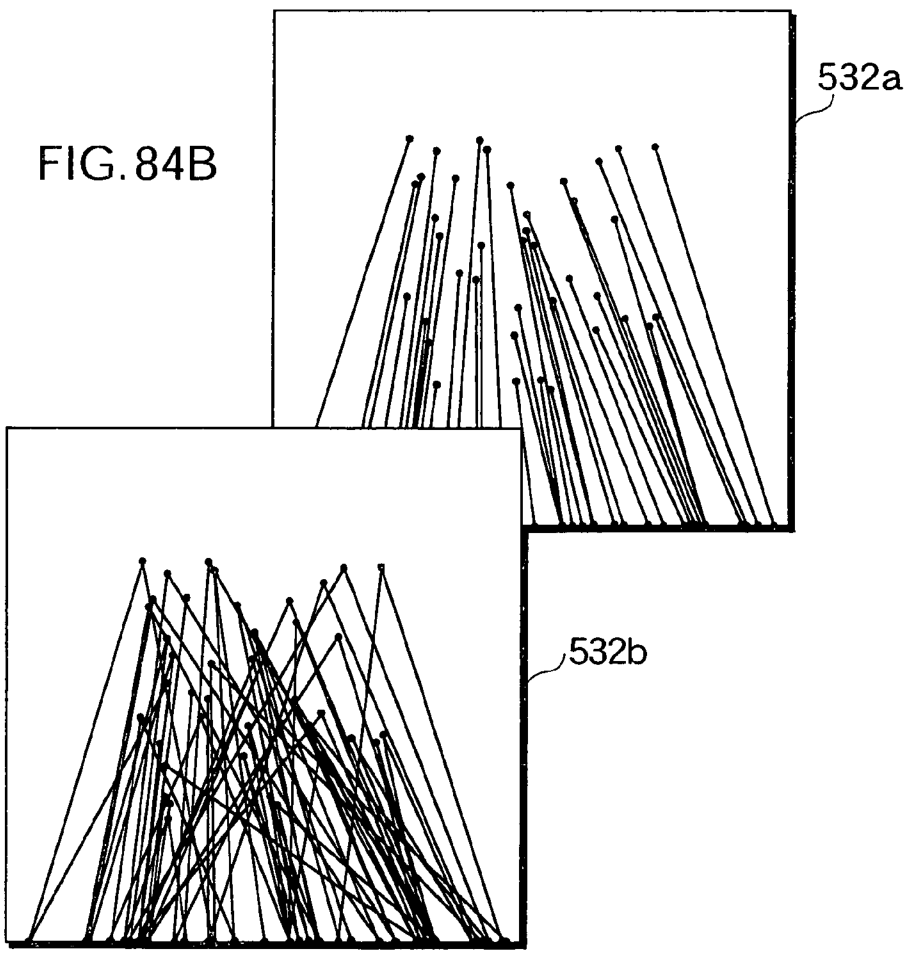
FIG. 84B shows the results of simulating the return paths of the line gang pickup head when using the return optimization algorithm.

FIG. 84A shows the "return" operation performed when there are a plurality of mounting points for the same component tape, while FIG. 84B shows the results of simulating the return paths of the line gang pickup head when using the return optimization algorithm. As can be seen from FIG. 84B, the movement paths 532*a* resulting from the application of the return optimization algorithm (shown in the left part of the drawing) include fewer unnecessary crossovers than the movement paths 532*b* before the application of the return optimization algorithm.

3.9.8 Entire Flow (Starting from the Histogram)

(1) Component groups are formed from the mounting point data.

(2) "Mountains" are formed from the component groups for small components.

(2.1) Component tapes are classified into the following three groups according to the cassettes used 1. Component tapes for use in single cassettes.

2. Component tapes for use in double cassettes (with a feed pitch of 2 mm).

3. Component tapes for use in double cassettes (with a feed pitch of 4 mm).

(2.2) A mountain is formed on a virtual Z-axis for the component tapes for use in single cassettes.

(2.2.1) A component histogram is generated on the virtual Z-axis.

Component tapes are arranged in descending order of the number of components to be mounted.

The component tape with the highest number of components to be mounted is arranged at the position Z=1.

(2.2.2) The number of component tapes forming the component histogram is set as N.

(2.2.3) The virtual Z-axis is converted into a real Z-axis.

The component tapes from the position Z=1 to the position Z=N on the virtual Z-axis are arranged at the odd-numbered Z positions on the real Z-axis in the range Z=1 to Z=2N.

(2.3) A mountain is formed on a virtual Z-axis for the component tapes for use in double cassettes with a feed pitch of 2 mm.

(2.3.1) A component histogram is generated on the virtual Z-axis.

Component tapes are arranged in descending order of the number of components to be mounted.

The component tape with the highest number of components to be mounted is arranged at the position Z=1.

(2.3.2) The number of component tapes forming the component histogram is set as N.

(2.3.3) A value given by dividing N by 2 (and rounding up any decimal part) is set as M.

(2.3.4) M double cassettes are prepared.

(2.3.5) A second virtual Z-axis is prepared.

(2.3.6) M double cassettes are arranged along the second virtual Z-axis at the positions Z=1 to Z=N without gaps in between them.

(2.3.7) The component tapes between the positions Z=1 to Z=M on the virtual Z-axis are arranged in the odd-numbered Z positions (Z−1, 3, 5, . . . , N−1) on the second virtual Z-axis.

In this way, component tapes are arranged into the odd-numbered positions in the double cassettes.

(2.3.8) The component tapes arranged on the virtual Z-axis in the positions Z=(M+1) to N are arranged in the even-numbered Z positions (Z−1, 3, 5, . . . , N−1) on the second virtual Z-axis.

In this way, component tapes are arranged into the even-numbered positions in the double cassettes.

When N is an odd number, the even-numbered Z position in the double cassettes arranged at the position Z=(N−1,N) on the second virtual Z-axis is empty, but is left as it is.

(2.3.9) The second virtual Z-axis is set as the virtual Z-axis.

(2.4) A mountain is formed on a virtual Z-axis for the component tapes for use in double cassettes with a feed pitch of 4 mm.

Apart from the difference in feed pitch, the same processing as "(2.3) A mountain is formed on a virtual Z-axis for the component tapes that use double cassettes with a feed pitch of 2 mm" is performed.

(2.5) The component histograms for the double cassettes with feed pitches of 2 mm and 4 mm are combined.

(2.5.1) The mountain of double cassettes with a feed pitch of 2 mm is arranged on the same virtual Z-axis as the mountain of double cassettes with a feed pitch of 4 mm.

The mountain of double cassettes with a feed pitch of 2 mm is arranged at the position Z=1, with the mountain of double cassettes with a feed pitch of 4 mm following it.

The following process changes the arrangement of cassettes, so that the cassettes may be arranged in the opposite order at this stage.

(2.5.2) The double cassettes on the virtual Z-axis are rearranged in descending order of the number of components to be mounted for the component tapes located in the odd-numbered Z positions in the double cassettes.

The double cassette with the component tape that has the highest number of components to be mounted is arranged at the position Z=1.

The pair of component tapes in each double cassette is not changed.

A mountain is produced in which double cassettes whose feed pitch is 2 mm and double cassettes whose feed pitch is 4 mm are mixed up.

When looking at the number of components to be mounted for the component tapes with odd Z numbers, the resulting histogram exhibits a steady drop in the number of components to be mounted.

When looking at the number of components to be mounted for the component tapes with even Z numbers, there are cases where the histogram does not exhibit a steady drop in the number of components to be mounted.

(3) All of the mountains are "forcibly" arranged on the real Z-axis. The mountains are arranged with no gaps starting with the front stage 110, and it is investigated whether all the mountains will fit onto the real Z-axis.

One mountain is arranged at a time in order of the component groups.

Mountains that extend over into the rear stage 120 are divided, with the latter part being assigned to the rear stage 120.

For small components, each component group is divided into "a mountain using single cassettes" and "a mountain using double cassettes". Note that some component groups may only have one of such mountains.

When a component group of small components has been divided into "a mountain using single cassettes" and "a mountain using double cassettes", the resulting mountains are treated as being independent.

General components are arranged into mountains in units of component groups.

Here, it is assumed that the general components are divided in accordance with user indications.

Rules for Arrangement

Since both single cassettes and double cassettes are used for small components, the cassettes are arranged in the following order. In view of the conditions regarding adjacent cassettes, the cassettes are arranged in a way that makes it unlikely for single cassettes to be adjacent to double cassettes.

1. Double Cassettes are Arranged in the Front Stage 110

(i) A search is performed for empty Z positions starting from the Z numbers (47,48) in block A and moving towards the Z positions with lower Z numbers. Cassettes are arranged into the empty positions found in this way.

(ii) If there are no more empty Z positions in block A, a search is performed for empty Z positions starting from the Z numbers (95,96) in block B and moving towards the Z positions with lower Z numbers. Cassettes are arranged into the empty positions found in this way.

2. Single Cassettes are Arranged in the Front Stage 110

(i) A search is performed for empty Z positions starting from the Z number 49 in block B and moving towards the Z positions with higher Z numbers. Cassettes are arranged into the empty positions found in this way.

(ii) If there are no more empty Z positions in block B, a search is performed for empty Z positions starting from the Z number 1 in block A and moving towards the Z positions with higher Z numbers. Cassettes are arranged into the empty positions found in this way.

3. Double Cassettes are Arranged in the Rear Stage 120

(i) A search is performed for empty Z positions starting from the Z numbers (143,144) in block C and moving towards the Z positions with lower Z numbers. Cassettes are arranged into the empty positions found in this way.

(ii) If there are no more empty Z positions in block C, a search is performed for empty Z positions starting from the Z numbers (191,192) in block D and moving towards the Z positions with lower Z numbers. Cassettes are arranged into the empty positions found in this way.

4. Single Cassettes are Arranged in the Rear Stage 120

(i) A search is performed for empty Z positions starting from the Z number 145 in block D and moving towards the Z positions with higher Z numbers. Cassettes are arranged into the empty positions found in this way.

(ii) If there are no more empty Z positions in block D, a search is performed for empty Z positions starting from the Z number 97 in block A and moving towards the Z positions with higher Z numbers. Cassettes are arranged into the empty positions found in this way.

When there are component tapes whose arrangement has been fixed, these component tapes are arranged at the Z numbers given by the fixed arrangement before the other (i.e., non-fixed) component tapes are arranged.

The processing performed when there is a fixed arrangement of double cassettes is described later in the "Fixed Arrangement Of Double Cassettes" section.

(3.1) The variable n is used to indicate a component group number, and is set at n=0.

(3.2) When the value of n is higher than the highest component group number, the processing advances to process (3.7).

(3.3) When there is a mountain of single cassettes belonging to the component group n, the following processing is performed.

(3.3.1) Component tapes are arranged in the front stage 110.

(3.3.2) When there are component tapes that cannot be arranged in the front stage 110, the mountain is divided in units of component tapes, and the component tapes that cannot be arranged in the front stage 110 are arranged in the rear stage 120.

(3.3.3) When there are component tapes that cannot be arranged in the rear stage 120, the processing returns an error.

The rules for arrangement described above are used when arranged a mountain of small components.

(3.4) When there is a mountain of double cassettes belonging to the component group n, the following processing is performed.

(3.4.1) Component cassettes are arranged in the front stage 110.

(3.4.2) When there are component tapes that cannot be arranged in the front stage 110, the mountain is divided in units of component tapes, and the component tapes that cannot be arranged in the front stage 110 are arranged in the rear stage 120.

(3.4.3) When there are component tapes that cannot be arranged in the rear stage 120, the processing returns an error.

The rules for arrangement described above are used when arranged a mountain of small components.

(3.5) The variable n is incremented by 1.

(3.6) The processing returns to process (3.2).

(3.7) The state of the mountains for the front stage 110 and the rear stage 120 is stored.

In this processing all of the mountains are arranged by packing them as compactly as possible.

(4) Mountains are arranged by packing them with no spaces, starting with the front stage 110.

An initial state for the arrangement of mountains is produced when adjusting the balance between the front stage 110 and the rear stage 120 based on estimated tact time.

The initial state for the arrangement of the mountains is produced by arranging the mountains, in ascending order of the size of component groups, with no gaps into the stages in the order "front stage 110→rear stage 120".

When there are component tapes whose arrangement have been fixed, these component tapes are arranged at the Z numbers given by the fixed arrangement before the other (i.e., non-fixed) component tapes are arranged.

When the component tapes subject to a fixed arrangement and the mountain to which these tapes belong are arranged in the same block, these are treated as a single mountain, which is then subjected to the cut down procedure.

When the component tapes subject to a fixed arrangement and the mountain to which these tapes belong are arranged in different blocks, these are treated as separate mountains, which are separately subjected to the cut down procedure.

(4.1) The variable n is used to indicate a component group number, and is set at n=0.

(4.2) When the value of n is higher than the highest component group number, the processing advances to process (4.8).

(4.3) When there is a mountain of single cassettes belonging to the component group n, the following processing is performed.

(4.3.1) Component tapes are arranged in the front stage 110.

(4.3.2) When there are component tapes that cannot be arranged in the front stage 110, the mountain is divided in units of component tapes, and the component tapes that cannot be arranged in the front stage 110 are arranged in the rear stage 120.

(4.3.3) When there are component tapes that cannot be arranged in the rear stage 120, the processing returns an error.

The mountain is arranged into the block, out of the left and right blocks, that has the most empty Z positions.

When the left and right blocks have the same number of empty Z positions, the mountain is arranged in the right block.

When there are empty positions in the left block, but the mountain will not fit in the left block, the mountain is divided in two in units of component tapes and these are arranged in the left and right blocks.

(4.4) When there is a mountain of double cassettes belonging to the component group n, the following processing is performed.

(4.4.1) Component cassettes are arranged in the front stage 110.

(4.4.2) When there are component tapes that cannot be arranged in the front stage 110, the mountain is divided in units of component tapes, and the component tapes that cannot be arranged in the front stage 110 are arranged in the rear stage 120.

(4.4.3) When there are component tapes that cannot be arranged in the rear stage 120, the processing returns an error.

The mountain is arranged into the block, out of the left and right blocks, that has the most empty Z positions.

When the left and right blocks have the same number of empty Z positions, the mountain is arranged in the right block.

When there are empty positions in the left block, but the mountain will not fit in the left block, the mountain is divided in two in units of component tapes and these are arranged in the left and right blocks.

(4.5) A rearranging is performed, based on the estimated tact times of the mountains that have been assigned to the front stage 110 and the rear stage 120.

For each block, mountains are rearranged in order of estimated tact time so that mountains with a high tact time are located close to the component recognizing camera.

(4.6) The variable n is incremented by 1.

(4.7) The processing returns to process (4.2).

(4.7) The state of the mountains for the front stage 110 and the rear stage 120 is stored.

(5) The balance between the front and rear stages is adjusted based on estimated tact time.

(5.1) The "Estimated Tact Time Balance Adjusting Process (In Units Of Mountains)" is performed This is described in detail in the "Estimated Tact Time Balance Adjusting Process (In Units Of Mountains)" section.

In the "Estimated Tact Time Balance Adjusting Process (In Units Of Mountains)", the adjusting of the estimated tact time balance is finally performed in units of mounting points.

(6) The cut down procedure is performed for the small components.

(6.1) The cut down procedure is performed for each mountain, leaving core parts.

(6.1.1) For mountains of component tapes in single cassettes, the cut down process is performed in descending order of odd-numbered Z positions.

The cut down process ends when it is no longer to pick up ten components simultaneously.

(6.1.2) For mountains of component tapes in double cassettes, the cut down process is performed in descending order of even-numbered Z positions and then in descending order of odd-numbered Z positions.

If there is at least one component left at an even-numbered Z position, the cut down process is performed starting from this position.

As one example, if only one component can be picked up from an even-numbered Z position, the remaining nine components are picked up from odd-numbered Z positions.

The cut down process ends when it is no longer to pick up ten components simultaneously from odd-numbered Z positions.

A core part is left in the odd-numbered Z positions.

(6.2) A flag is set for each mountain.

The initial setting of each flag is "true".

(6.3) The state of the mountains for the front stage 110 and the rear stage 120 is stored.

(6.4) The state of the cassette resources is stored.

(6.5) Out of the mountains for which the flag is "true", the highest mountain M in the core part is found.

(6.5.1) When the mountain M is found, the processing advances to process (7).

This means that the core crush process has been performed on all of the mountains.

(6.6) It is investigated whether a cassette of the same type as the cassette type K used by the mountain M is left among the cassette resources.

(6.7) When a cassette of the same type is left, the following processing is performed.

(6.7.1) One cassette of the cassette type K is added to the number of cassettes used by the mountain M, and the core crush process is performed.

This is described in the "Core Crush Processing For The Available Number Of Cassettes" section.

(6.7.2) If there is no change in the height of the core part, the processing returns to process (6.6).

(6.7.3) If there is the height of the core part has been reduced, the processing advances to process (6.9).

(6.8) When no cassette of the same type is left, the following processing is performed.

(6.8.1) The state of the mountains for the front stage 110 and the rear stage 120 is restored to the immediately preceding state.

(6.8.2) The state of the cassette resources is restored to the immediately preceding state.

(6.8.3) The flag of the mountain M is set at "false".

(6.8.4) The processing returns to process (6.3).

The following processing is performed to find the next highest mountain in the core part.

(6.9) All of the mountains are arranged along the real Z-axis.

(6.10) When all of the mountains can be arranged, the processing returns to process (6.1).

(6.11) When this is not possible, the following processing is performed.

(6.11.1) The state of the mountains for the front stage 110 and the rear stage 120 is restored to the immediately preceding state.

(6.11.2) The state of the cassette resources is restored to the immediately preceding state.

(6.11.3) The flag of the mountain M is set at "false".

(6.11.4) The processing returns to process (6.3).

(7) Tasks are generated for the small components.

(7.1) The "Task Generation Process For Small Components" is performed.

This is described in detail in the "Task Generation Process For Small Components" section that appears later in this specification.

(8) Optimization is performed for the general components (9) The balance between the front stage 110 and the rear stage 120 is adjusted based on mounting time.

(9.1) The "process moving a mountain from the front stage 110 to the rear stage 120" is performed.

This is described in detail in the "Process Moving A Mountain From The Front Stage 110 To The Rear Stage 120" section that appears later in this specification.

3.9.9 Arrangement of Fixed Components and Mountains within a Cassette Block

The mountains on a virtual Z-axis are composed of component tapes whose arrangement is fixed and component tapes whose arrangement is not fixed.

Here, component tapes whose arrangement is fixed are called "fixed component tapes" and component tapes whose arrangement is not fixed are called "non-fixed component tapes"

Cassette blocks are also simply referred to at times as "blocks".

The left cassette block is referred to as the "left block" and the right cassette block is referred to as the "right block" The Z numbers at which fixed component tapes are arranged are called "fixed positions".

When division is performed for a certain component tape (a component type) to produce a plurality of component tapes, the resulting component tapes are placed into a "cassette" and this cassette is arranged on the Z-axis.

When division is not performed for a certain component tape, the number of divisions is thought of as being "1", so that in effect, one component tape has been "produced" by dividing this component tape.

(10) The number of fixed positions in the right block is counted and set as NR.

Here, only the fixed positions that are related to fixed component tapes belonging to the present mountain are counted.

In some cases several fixed component tapes belonging to the present mountain are present.

Also, in some cases, a single component tape has several fixed positions.

(11) The number of fixed positions in the left block is counted and set as NL.

As with the right block, the number of fixed positions is counted.

(12) When NR>NL, the following processing is performed.

This corresponds to the case where the number of fixed positions is higher in the right block.

(12.1) The present mountain is arranged in the right block.

The process for arranging the mountain in this block is described below.

This process is described in detail in the "fixed arrangement: judging whether a fixed position is usable" section later in this specification.

(12.2) When the mountain cannot be arranged in the right block, it is arranged in the left block.

In some cases, other mountains have already been arranged in the right block, so that there is insufficient space on the Z-axis to arrange the present mountain.

As a result, fixed component tapes end up in the right block and a mountain ends up in the left block, though pickup operations that cross the boundary between the left and right blocks are not performed. The fixed component tapes in the right block and the mountain in the left block are treated as separate mountains.

(12.2.1) When the mountain cannot be arranged in the left block, the mountain is divided into two in units of component tapes and the resulting divisions are arranged in the left and right blocks.

Since a mountain is divided in two, a mountain that belongs to the same block as the fixed component tapes and a mountain that belongs to a different block as the fixed component tapes can be produced.

When a mountain belongs to the same block as the fixed component tapes, the mountain and fixed component tapes are treated as a single mountain (histogram) on the virtual Z-axis when the cut down procedure is performed.

(13) The following processing is performed when NR=NL

This is the case where the number of fixed positions is equal for the left and right blocks.

(13.1) The present mountain is arranged in the block, out of the left and right blocks, with the higher number of empty Z positions.

(13.2) When the number of empty Z positions is equal for the left and right blocks, the mountain is arranged in the right block.

(13.3) When the mountain cannot be arranged in the right block, the mountain is arranged in the left block.

In some cases, other mountains have already been arranged in the right block, so that there is insufficient space on the Z-axis to arrange the present mountain.

As a result, fixed component tapes end up in the right block and a mountain ends up in the left block, though pickup operations that cross the boundary between the left and right blocks are not performed. The fixed component tapes in the right block and the mountain in the left block are treated as separate mountains.

(13.3.1) When the mountain cannot be arranged in the left block, the mountain is divided into two in units of component tapes and the resulting divisions are arranged in the left and right blocks.

Since a mountain is divided in two, a mountain that belongs to the same block as the fixed component tapes and a mountain that belongs to a different block as the fixed component tapes can be produced.

When a mountain belongs to the same block as the fixed component tapes, the mountain and fixed component tapes are treated as a single mountain (histogram) on the virtual Z-axis when the cut down procedure is performed.

(14) The following processing is performed when NR<NL

This is the case where there are more fixed positions in the left block than in the right block.

(14.1) The present mountain is arranged in the left block.

(14.2) When the mountain cannot be arranged in the left block, it is arranged in the right block.

In some cases, other mountains have already been arranged in the left block, so that there is insufficient space on the Z-axis to arrange the present mountain.

As a result, fixed component tapes end up in the left block and a mountain ends up in the right block, though pickup operations that cross the boundary between the left and right blocks are not performed. The fixed component tapes in the left block and the mountain in the right block are treated as separate mountains.

(14.2.1) When the mountain cannot be arranged in the right block, the mountain is divided into two in units of component tapes and the resulting divisions are arranged in the left and right blocks.

Since a mountain is divided in two, a mountain that belongs to the same block as the fixed component tapes and a mountain that belongs to a different block as the fixed component tapes can be produced.

When a mountain belongs to the same block as the fixed component tapes, the mountain and fixed component tapes are treated as a single mountain (histogram) on the virtual Z-axis when the cut down procedure is performed.

3.9.10 Fixed Arrangement: Judging Whether a Fixed Position is Usable

The largest number of divisions into which a component tape used as a fixed component tape may be divided is referred to as ND.

The number of component tapes produced from such a component tape during the cut down procedure (core crush process) referred to as NT. Here, the condition NT≦ND is definitely valid.

The number of fixed positions in the block related to this component tapes is referred to as NZ.

In more detail, the following processes are performed.

(1) The following processes are performed for the component tapes forming a mountain in order starting at one side of the mountain.

(1.1) One component tape is selected.

(1.2) When NT≦(ND−NZ) for this component tape, the following processes are performed.

(1.2.1) The NT component tapes forming the mountain are arranged on the Z-axis without using any of the fixed positions for this component tape.

Here, component tapes are arranged in accordance with the shape of the mountain.

As a result, in some cases component tapes are arranged at the fixed positions, though this is not a problem.

(1.2.2) Component tapes are arranged at the fixed positions.

Component tapes are arranged in accordance with the user indications. Components are not picked up from these fixed positions when mounting is performed for substrates subjected to optimization, but are picked up when mounting is performed for other substrates.

(1.3) When NT>(ND−NZ) for the selected component tape, the following processing is performed.

(1.3.1) Out of the component tapes composing the mountain including the selected component tape, NT−(ND−NZ) component tapes are arranged at fixed positions starting from the component tape with the lowest number of components to be mounted.

Here, fixed positions that are close to the mountain on the real Z-axis are selected as the fixed positions for the component tapes.

(1.3.2) The remaining component tapes are arranged on the Z-axis without using any of the fixed positions for the selected component tape.

As a result, in some cases component tapes are arranged at the fixed positions, though this is not a problem.

(1.4) The processing returns to (1.1).

3.9.11 Fixed Arrangement of Double Cassettes

Optimization is performed as follows with regard to the restrictions caused by a fixed arrangement of double cassettes.

Figure 85:
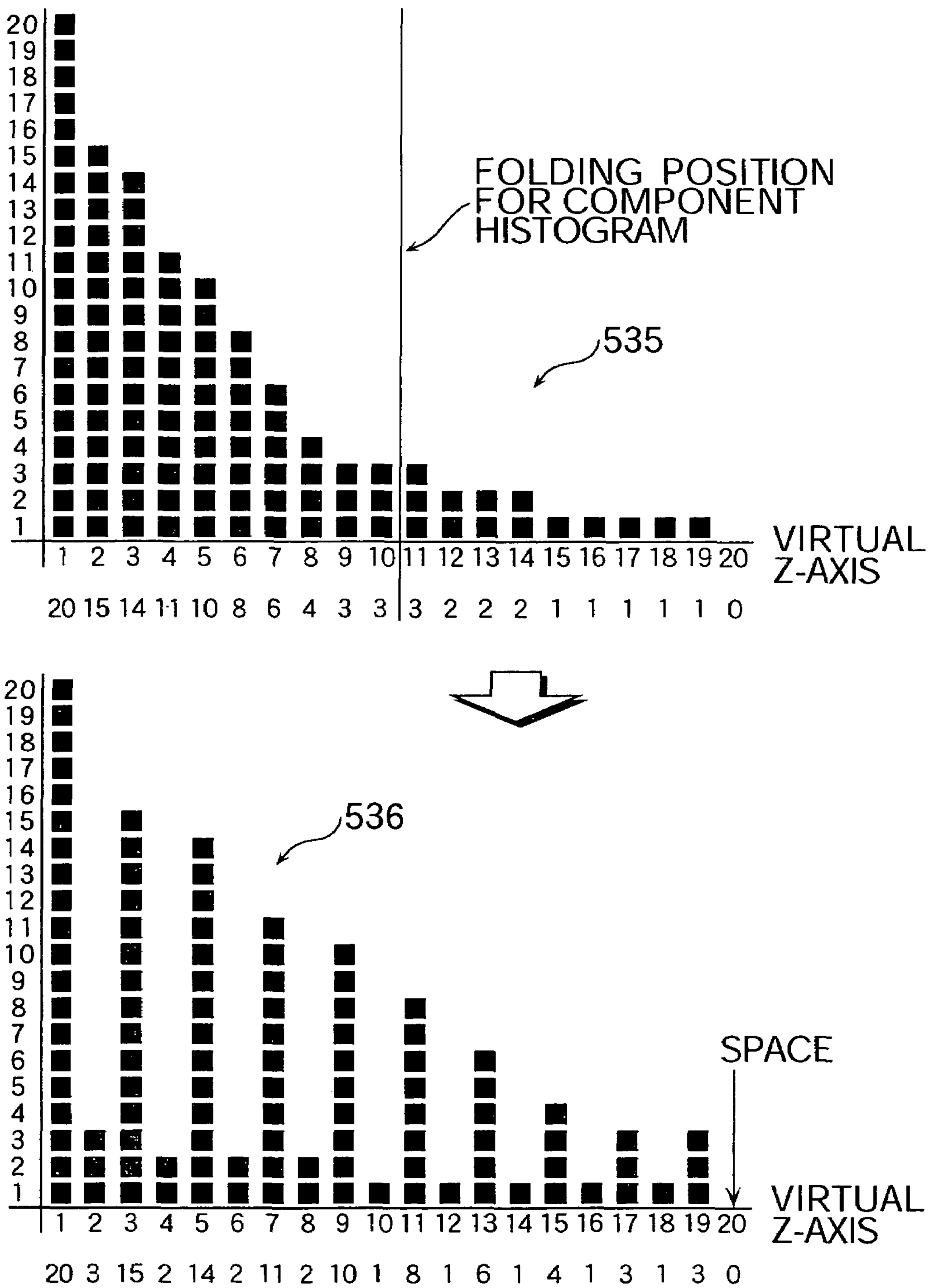
FIG. 85 is a component histogram that is used to illustrate part of step (1) of the optimization performed in the presence of restrictions whereby there is a fixed arrangement of double cassettes.

(1) Component tapes that are held in double cassettes with a feed pitch of 2 mm are arranged to form a mountain on a virtual Z-axis (see FIG. 85). As shown in FIG. 85, a component histogram 535 in which the component tapes are arranged in order of the number of components to be mounted is divided at its midpoint, folded (here, meaning that the second half is slid back to coincide with the first half), and the two overlapping halves are combined with component tapes from the former and latter halves in alternating positions, resulting in the component histogram 536 (where pairs of component tapes have been produced by the folding).

Figure 86:
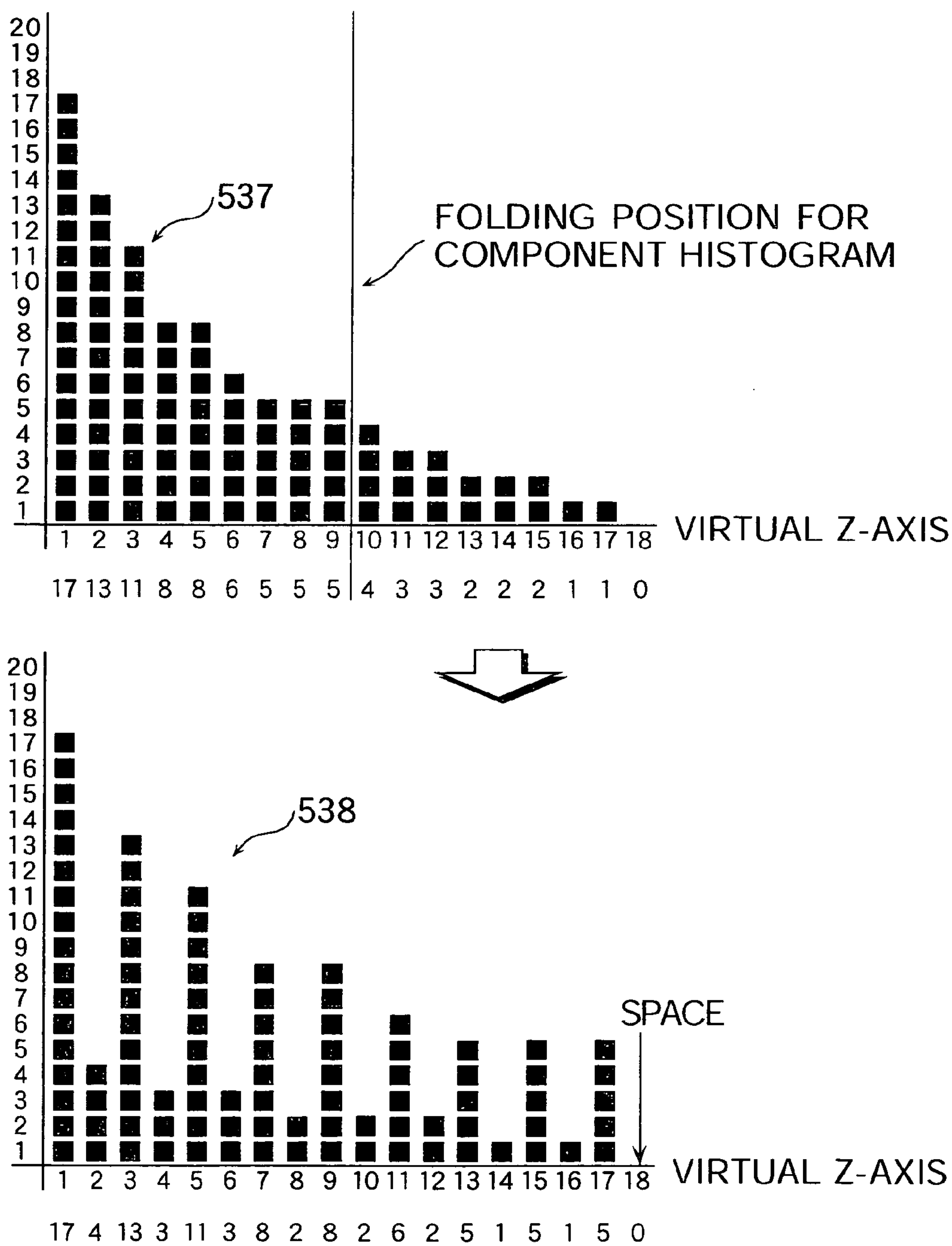
FIG. 86 is a component histogram that is used to illustrate step (2) of the same procedure.

(2) In the same way, component tapes that are held in double cassettes with a feed pitch of 4 mm are arranged to form a mountain on a virtual Z-axis (see FIG. 86). As shown in FIG. 86, a component histogram 537 in which the component tapes are arranged in order of the number of components to be mounted is divided at its midpoint, folded, and the two overlapping halves are combined with component tapes from the former and latter halves in alternating positions, resulting in the component histogram 538 (where pairs of component tapes have been produced by the folding).

Figure 87:
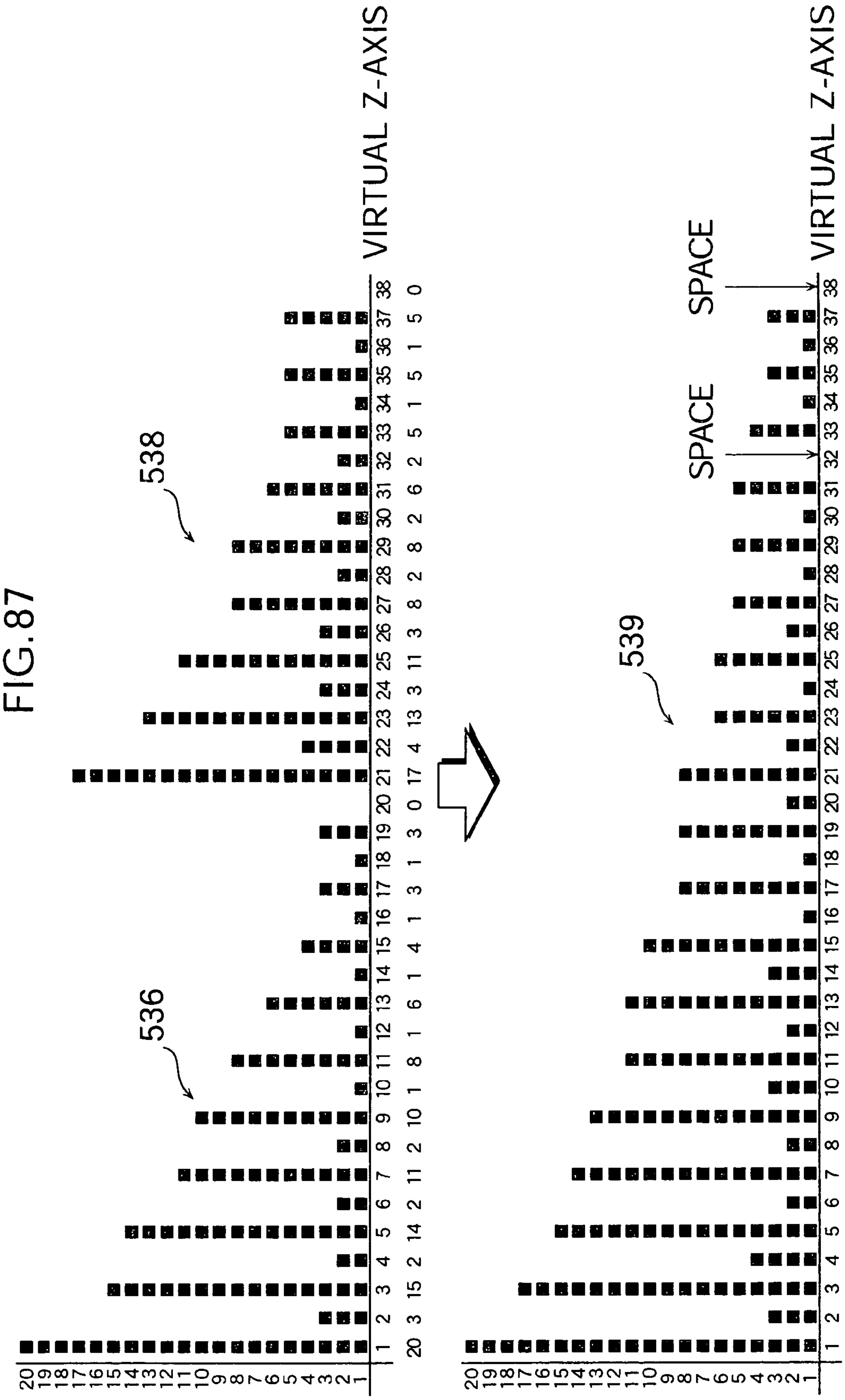
FIG. 87 is a component histogram that is used to illustrate step (3) of the same procedure.

(3) The component histograms 536 and 538 for the component cassettes with the respective feed pitches of 2 mm and 4 mm are combined to produce a component histogram 539 (see FIG. 87). In other words, the double cassettes are arranged in descending order of the number of components to mounted for the tapes arranged in the odd-numbered Z positions, without breaking up the pairs of component tapes in each double cassette.

Figure 88A:
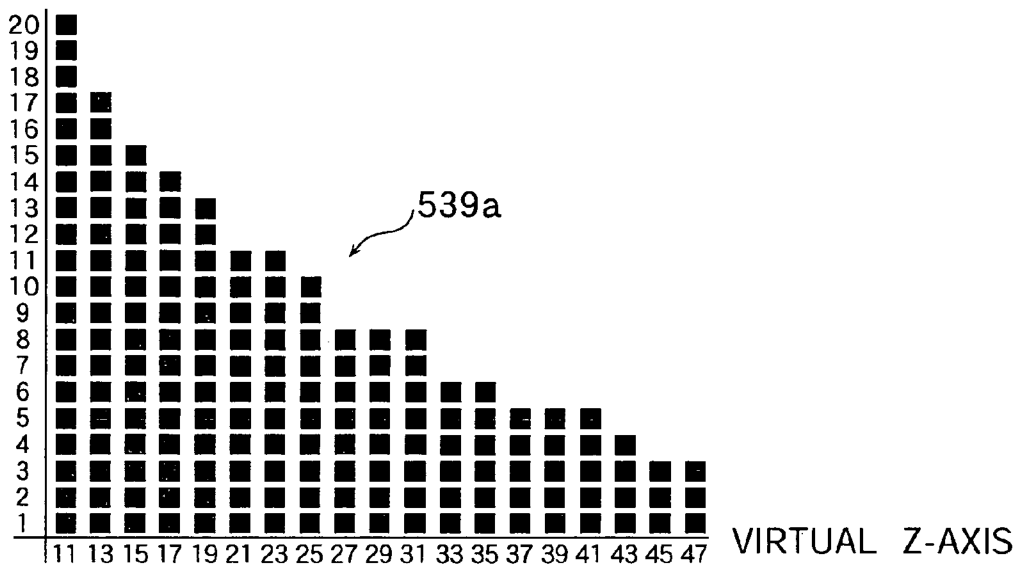
FIG. 88 is a component histogram that is used to illustrate step (4) of the same procedure.
Figure 88B:
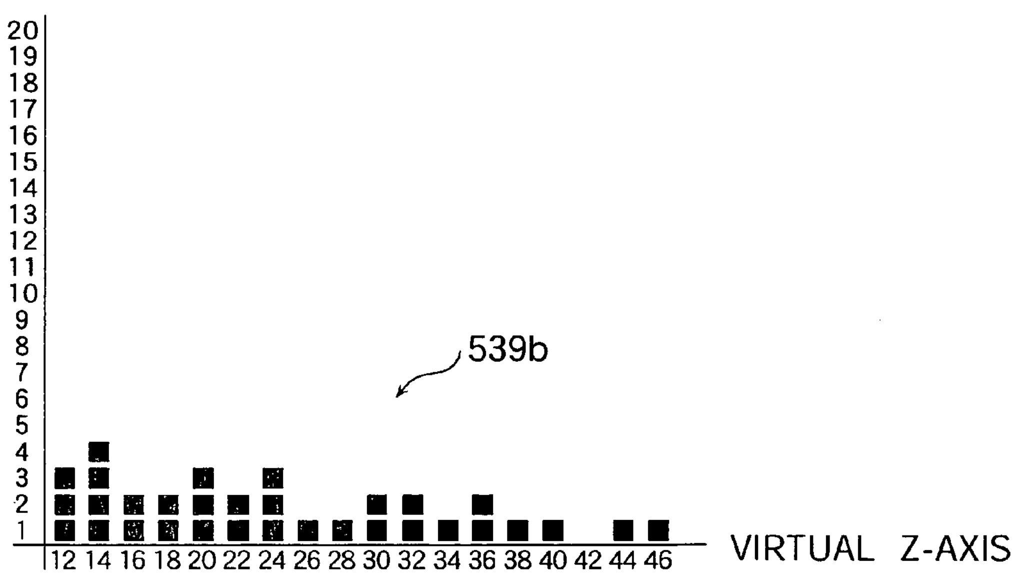

(4) The component histogram 339 is split into a component histogram 539*a* (see FIG. 88A) containing the odd-numbered Z positions and a component histogram 539*b* (see FIG. 88B) containing the even-numbered Z positions.

Figure 89A:
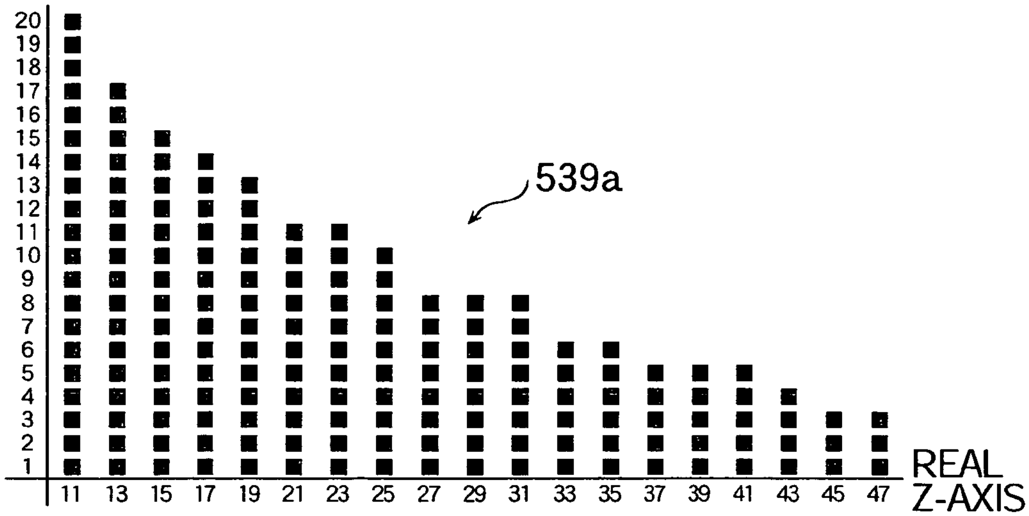
FIG. 89 is a component histogram that is used to illustrate step (5) of the same procedure.
Figure 89B:
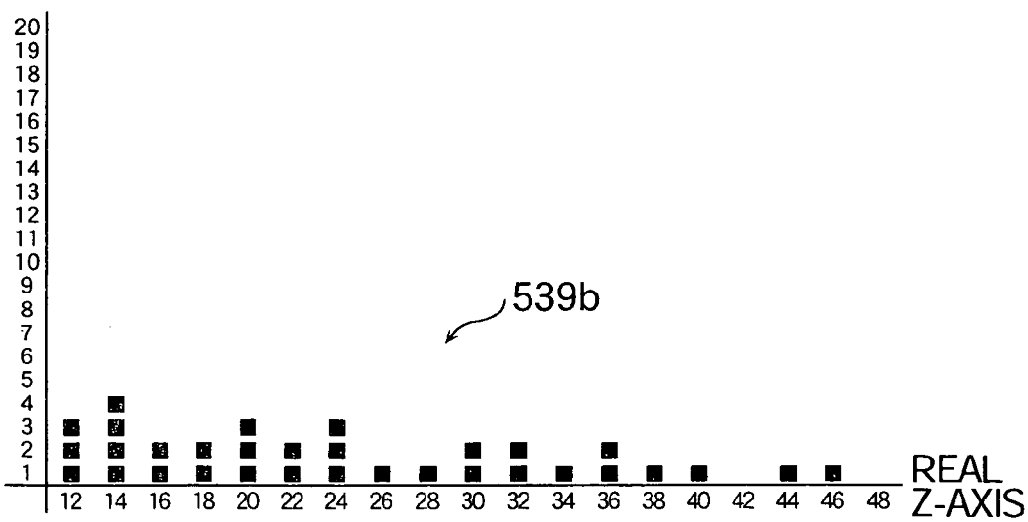

(5) When there are no restrictions due to a fixed arrangement, these component histograms 539*a* and 539*b* may be arranged on a real Z-axis as they are (see FIGS. 89A and 89B).

Figure 90A:
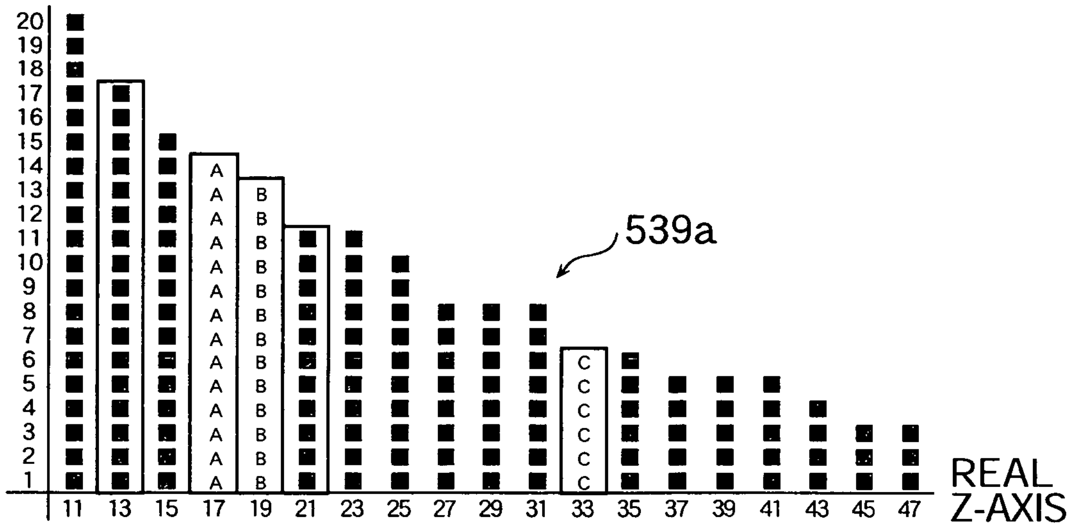
FIG. 90 is a component histogram that is used to illustrate step (6) of the same procedure.
Figure 90B:
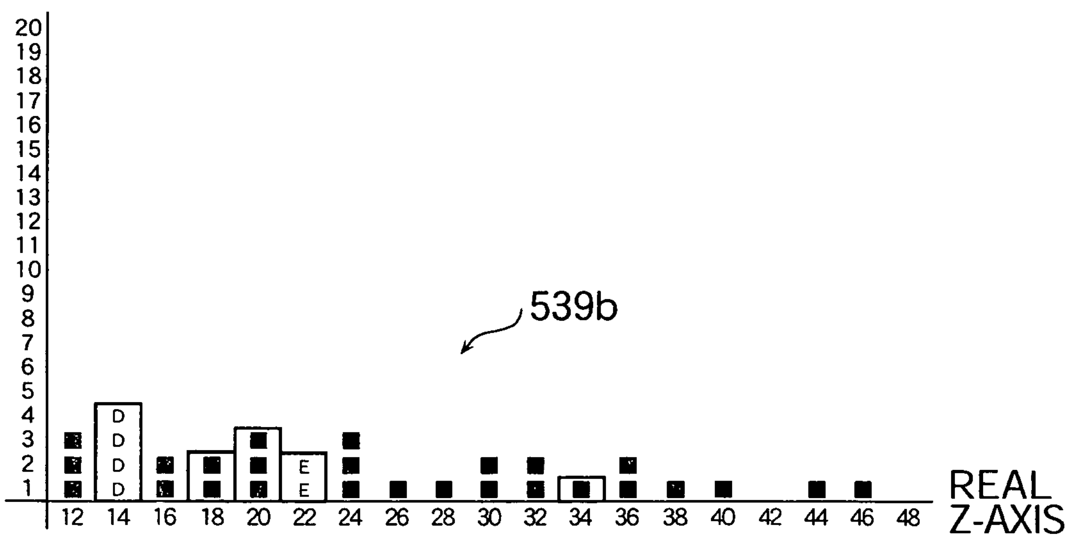

(6) When there are restrictions due to a fixed arrangement, the following processing is performed. In the illustrated example, the fixed arrangement is for the components A to C with the odd-numbered Z positions shown in FIG. 90A and the components D and E with the even-numbered Z positions shown in FIG. 90B.

Figure 91A:
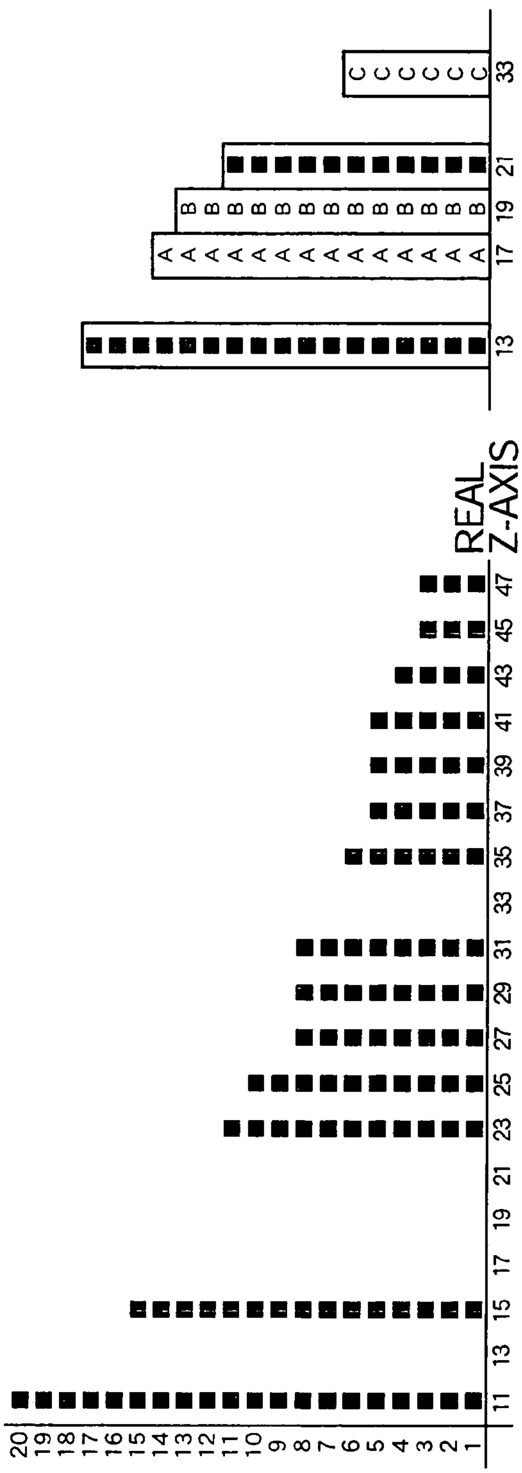
FIG. 91 is a component histogram that is used to illustrate step (7) of the same procedure.
Figure 91B:
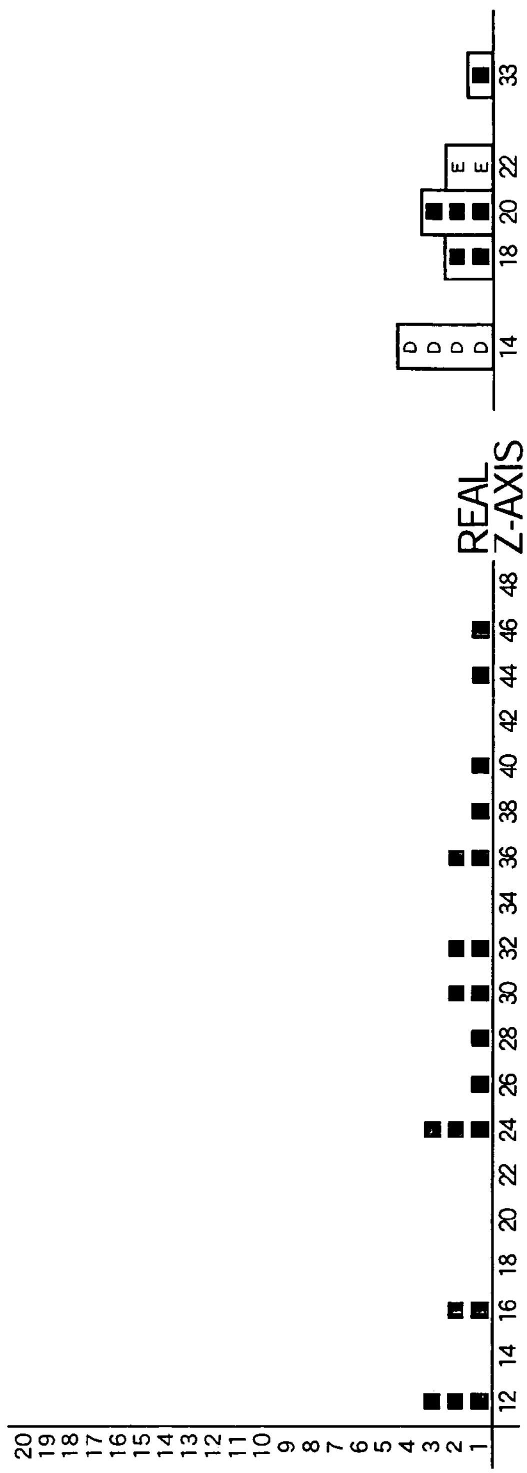

(7) The double cassettes that hold the components subject to the fixed arrangement are taken from the odd-numbered Z positions and even-numbered Z positions and are arranged on the right of the respective histograms (see FIGS. 91A and 91B).

Figure 92A:
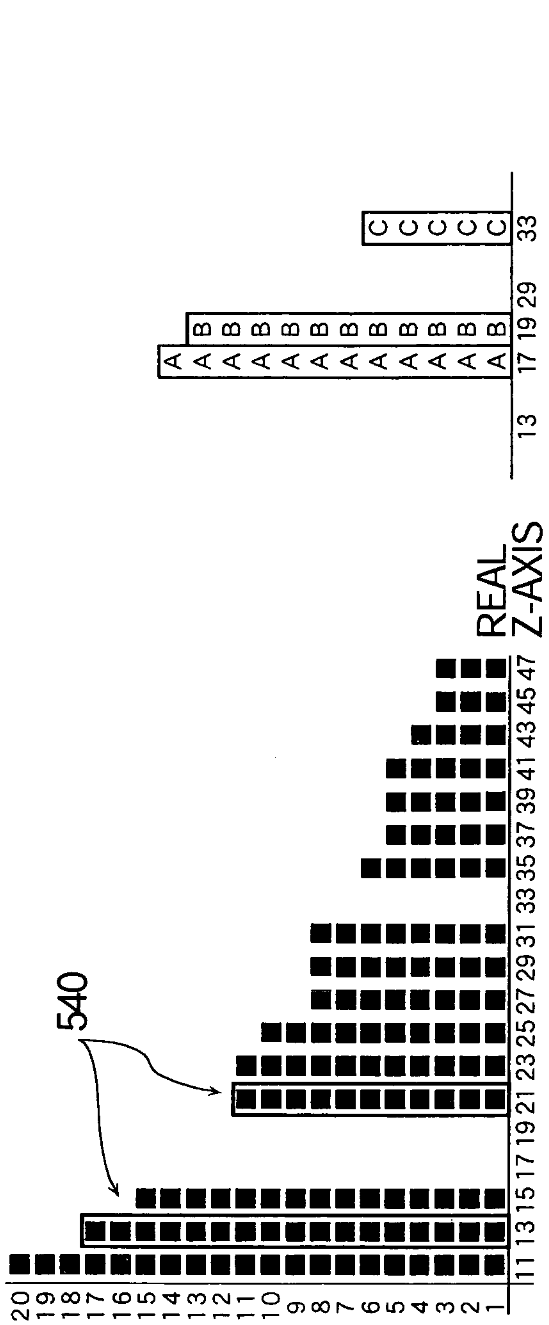
FIG. 92 is a component histogram that is used to illustrate step (8) of the same procedure.
Figure 92B:
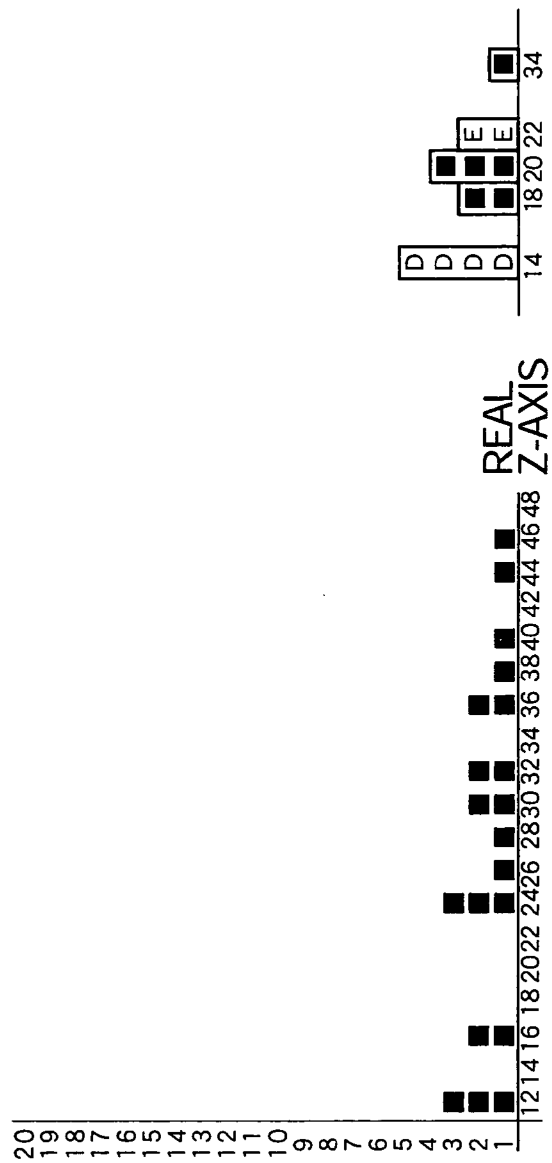

(8) For odd-numbered component tapes only, the component tapes 540 that are not subject to the fixed arrangement are returned to the real Z-axis (see FIG. 92A). The even-number component tapes are left as they are (see FIG. 92B).

Figure 93A:
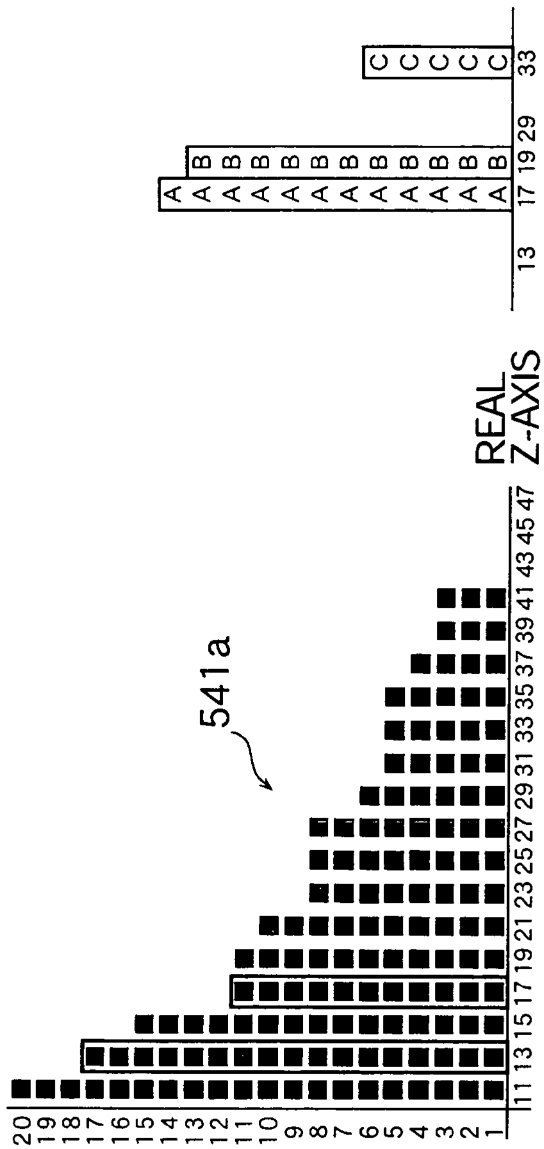
FIG. 93 is a component histogram that is used to illustrate step (9) of the same procedure.
Figure 93B:
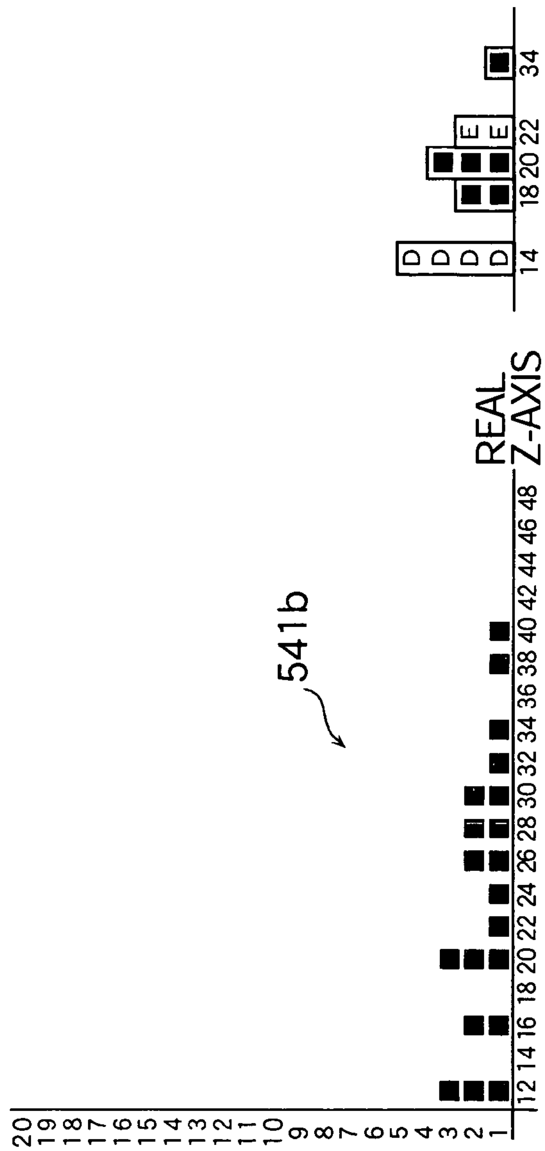

(9) Component tapes in the mountains are moved to the left to fill the gaps in the mountains, thereby producing component histograms 541*a* and 542*b* (see FIGS. 93A and 93B).

When doing so, the gaps in the mountain in the odd-numbered Z positions may be filled in units of double cassettes (see FIG. 93A), though since the gaps in the mountain in the even-numbered Z positions are filled by combining this mountain with the mountain 541 in the odd-numbered Z positions, there are cases where gaps remain (see FIG. 93B).

Figure 94A:
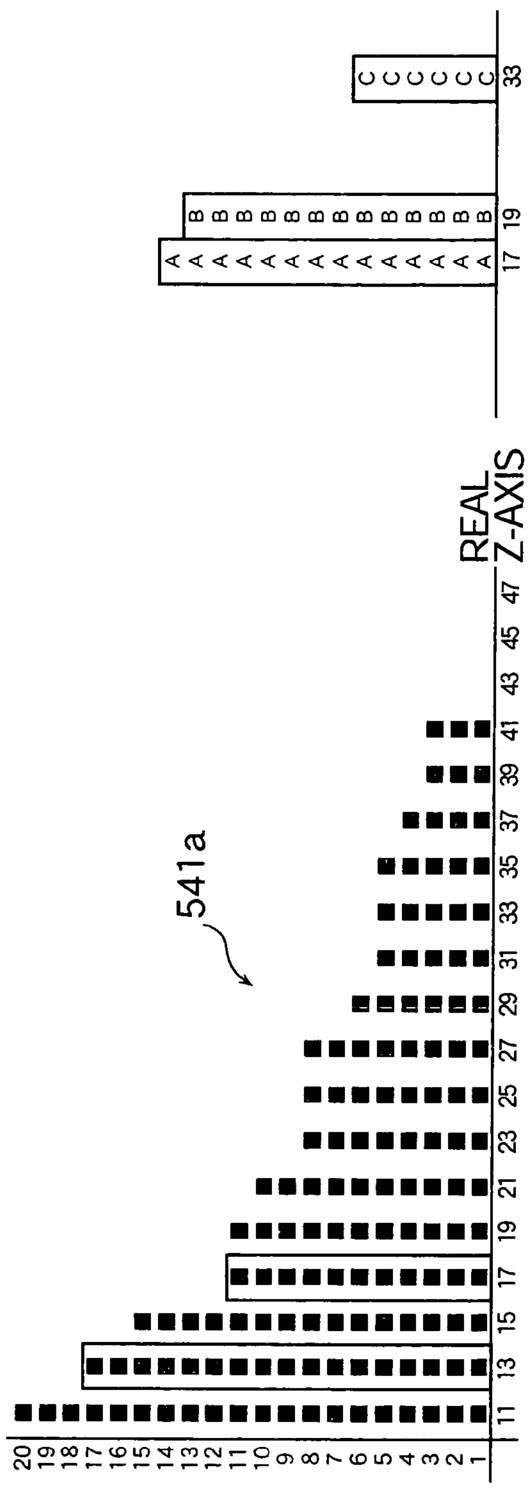
FIG. 94 is a component histogram that is used to illustrate step (10) of the same procedure.
Figure 94B:
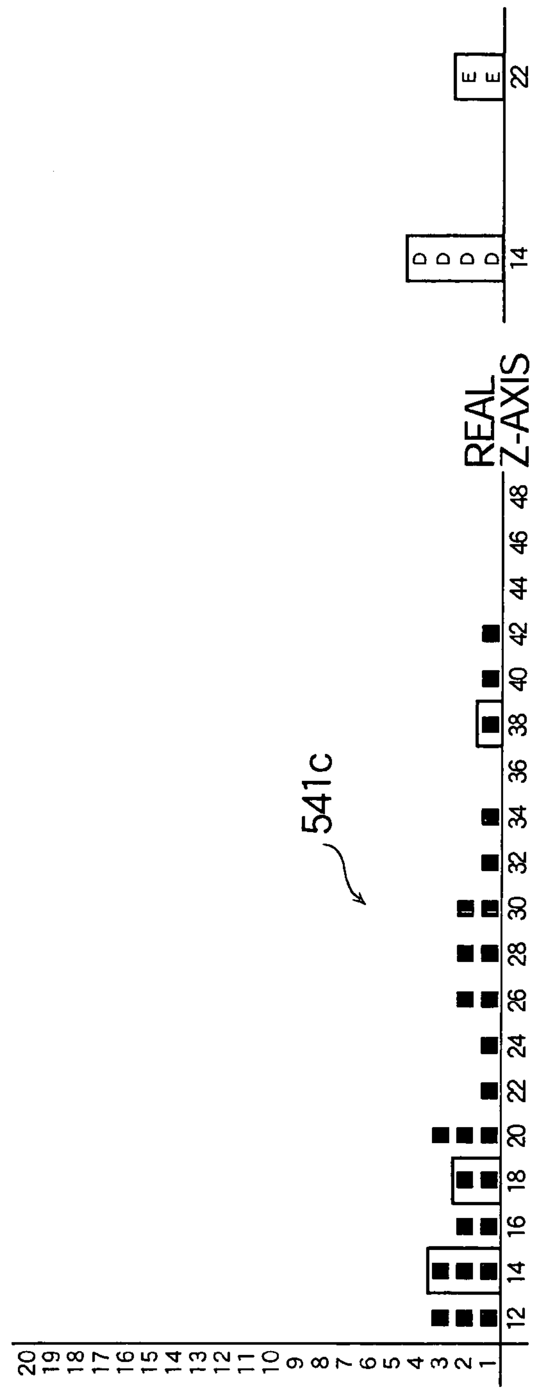

(10) The component tapes in even-numbered Z positions are reordered based on feed pitch, which produces component histogram 541*c* (see FIG. 94B). The component tapes in odd-numbered Z positions are left as they are (see FIG. 94A).

In more detail, the component tapes that have even-numbered Z positions and a feed pitch of 2 mm are combined with the component tapes that are present on the real Z-axis and the component tapes that are not subject to the fixed arrangement but were taken from the Z-axis together with the component tapes that are subject to the fixed arrangement. These tapes are then rearranged in descending order of the number of components to be mounted, and are placed into the even-numbered Z positions in double cassettes with a feed pitch of 2 mm.

The same processing is performed for the component tapes that have even-numbered Z positions and a feed pitch of 4 mm.

As a result, the double cassettes (43,44), (45,46), and (47,48) are no longer needed.

3.9.12 LL Restrictions: Changes to the Pickup Method (1)

(2) A number of flags equal to the number of Z positions is provided and each flag is associated with a different Z number.

(3) The following processing is performed for the mounting points in the left block.

(3.1) The following processing is performed for the component tapes arranged at each Z position.

When no component tape is arranged at a Z position, the flag for that Z position is set at "false".

When the component tape arranged at a Z position does not have a mounting point located in the LL-restricted region, the flag for that Z position is set at "false".

When the component tape arranged at a Z position has a mounting point located in the LL-restricted region, the flag for that Z position is set at "true".

(3.2) The number of mounting points that are not located in the LL-restricted region and is set at Nf (where "f" stands for "free").

(3.3) The number of mounting points that are located in the LL-restricted region and is set at Nr (where "r" stands for "restricted").

(3.4) When at least one of Nf and Nr is not zero, the following processing is repeated.

(3.4.1) When neither Nf nor Nr is zero.

(i) The cut down process is performed on the mounting points that are not located in the LL-restricted region to produce sets of 6 picked-up components, with the cut down Z numbers being assigned in order to the heads 1 to 6.

The number of components picked up is set as Pf.

The picking up operation is performed several times to occupy the heads 1 to 6.

The highest Z number, out of the Z numbers for the positions from which components are picked up, is set as Zmax.

(ii) Pf is subtracted from Nf.

(iii) The cut down process is performed on the mounting points that have higher Z numbers than Z max and are located in the LL-restricted region to produce sets of 4 picked-up components. The cut down Z numbers are assigned in order to the heads 7 to 10.

The number of components picked up is set as Pr.

The picking up operation is performed several times to occupy the heads 7 to 10.

(iv) Pr is subtracted from Nr.

(3.4.2) When Nr is zero and Nf is not zero (i) The cut down process is performed for all of the mounting points to produce sets of 10 picked-up components, with the cut down Z numbers being assigned in order to the heads 1 to 10.

The number of components picked up is set as Pf.

The picking up operation is performed several times to occupy the heads 1 to 10.

(ii) The number of components picked up Pf is subtracted from Nf.

(3.4.3) When Nf is zero and Nr is not zero (ii) The cut down process is performed for all of the mounting points to produce sets of 4 picked-up components, with the cut down Z numbers being assigned in order to the heads 7 to 10.

The number of components picked up is set as Pr.

The picking up operation is performed several times to occupy the heads 7 to 10.

Heads 1 to 6 are not used to pick up components.

(ii) The number of components picked up Pr is subtracted from Nr.

(3.4.4) When both Nf and Nr are zero

The processing ends for the left block.

(4) The following processing is performed for the mounting points in the right block.

(4.1) The following processing is performed for the component tapes arranged at each Z position.

When no component tape is arranged at a Z position, the flag for that Z position is set at "false".

When the component tape arranged at a Z position does not have a mounting point located in the LL-restricted region, the flag for that Z position is set at "false".

When the component tape arranged at a Z position has a mounting point located in the LL-restricted region, the flag for that Z position is set at "true".

(4.2) The number of mounting points that are not located in the LL-restricted region and is set at Nf (where "f" stands for "free").

(4.3) The number of mounting points that are located in the LL-restricted region and is set at Nr (where "r" stands for "restricted").

(4.4) When at least one of Nf and Nr is not zero, the following processing is repeated.

(4.4.1) When neither Nf nor Nr is zero.

(i) The cut down process is performed for the mounting points located in the LL-restricted region to produce sets of 4 picked-up components, with the cut down Z numbers being assigned in order to the heads 7 to 10.

The number of components picked up is set as Pr.

The picking up operation is performed several times to occupy the heads 7 to 10.

The lowest Z number, out of the Z numbers for the positions from which components are picked up, is set as Zmin.

(ii) Pr is subtracted from Nr.

(iii) The cut down process is performed on the mounting points that have lower Z numbers than Zmin and are not located in the LL-restricted region to produce sets of 6 picked-up components. The cut down Z numbers are assigned in order to the heads 1 to 6.

The number of components picked up is set as Pf.

The picking up operation is performed several times to occupy the heads 1 to 6.

(iv) Pf is subtracted from Nf.

(4.4.2) When Nr is zero and Nf is not zero (i) The cut down process is performed for all of the mounting points to produce sets of 10 picked-up components, with the cut down Z numbers being assigned in order to the heads 1 to 10.

The number of components picked up is set as Pf.

The picking up operation is performed several times to occupy the heads 1 to 10.

(ii) The number of components picked up Pf is subtracted from Nf.

(4.4.3) When Nf is zero and Nr is not zero (ii) The cut down process is performed for all of the mounting points to produce sets of 4 picked-up components, with the cut down Z numbers being assigned in order to the heads 7 to 10.

The number of components picked up is set as Pr.

The picking up operation is performed several times to occupy the heads 7 to 10.

Heads 1 to 6 are not used to pick up components.

(ii) The number of components picked up Pr is subtracted from Nr.

(4.4.4) When both Nf and Nr are zero

The processing ends for the right block.

(5) Processing ends.

3.9.13 LL Restrictions: Changes to the Pickup Method (2)

(1) A number of flags equal to the number of Z positions is provided and each flag is associated with a different Z number (2) The following processing is performed for the mounting points in the left block.

(2.1) The following processing is performed for the component tapes arranged at each Z position.

When no component tape is arranged at a Z position, the flag for that Z position is set at "false".

When the component tape arranged at a Z position does not have a mounting point located in the LL-restricted region, the flag for that Z position is set at "false".

When the component tape arranged at a Z position has a mounting point located in the LL-restricted region, the flag for that Z position is set at "true".

(2.2) The number of mounting points that are not located in the LL-restricted region and is set at Nf (where "f" stands for "free").

(2.3) The number of mounting points that are located in the LL-restricted region and is set at Nr (where "r" stands for "restricted").

(2.4) When at least one of Nf and Nr is not zero, the following processing is repeated.

(2.4.1) When neither Nf nor Nr is zero.

(i) The cut down process is performed on the mounting points that are not located in the LL-restricted region to produce sets of 6 picked-up components, with the cut down Z numbers being assigned in order to the heads 1 to 6.

The number of components picked up is set as Pf.

The picking up operation is performed several times to occupy the heads 1 to 6.

The lowest Z number, out of the Z numbers for the positions from which components are picked up, is set as Zf.

(ii) Pf is subtracted from Nf.

(iii) The cut down process is performed on the mounting points that are located in the LL-restricted region to produce sets of 4 picked-up components. The cut down Z numbers are assigned in order to the heads 7 to 10.

The number of components picked up is set as Pr.

The picking up operation is performed several times to occupy the heads 7 to 10.

The lowest Z number, out of the Z numbers for the positions from which components are picked up, is set as Zr.

(iv) Pr is subtracted from Nr.

(v) If $Zf \leqq Zr$, the NC data is arranged in the order heads 1 to 6, then heads 7 to 10.

Components are picked up in the order heads 1 to 6, then heads 7 to 10.

Here, the pickup order matches the mounting order, with the mounting order being the order of the NC data.

(vi) If $Zf > Zr$, the NC data is arranged in the order heads 7 to 10, then heads 1 to 6.

Components are picked up in the order heads 7 to 10, then heads 1 to 6.

Here, the pickup order matches the mounting order, with the mounting order being the order of the NC data.

(2.4.2) When Nr is zero and Nf is not zero (i) The cut down process is performed for all of the mounting points to produce sets of 10 picked-up components, with the cut down Z numbers being assigned in order to the heads 1 to 10.

The number of components picked up is set as Pf.

The picking up operation is performed several times to occupy the heads 1 to 10.

(ii) The number of components picked up Pf is subtracted from Nf.

(4.4.3) When Nf is zero and Nr is not zero (i) The cut down process is performed for all of the mounting points to produce sets of 4 picked-up components, with the cut down Z numbers being assigned in order to the heads 7 to 10.

The number of components picked up is set as Pr.

The picking up operation is performed several times to occupy the heads 7 to 10.

In some cases, this produces a large number of tasks composed of 4 components.

(ii) The number of components picked up Pr is subtracted from Nr (4.4.4) When both Nf and Nr are zero The processing ends for the left block.

(3) The following processing is performed for the mounting points in the right block.

(3.1) The following processing is performed for the component tapes arranged at each Z position.

When no component tape is arranged at a Z position, the flag for that Z position is set at "false".

When the component tape arranged at a Z position does not have a mounting point located in the LL-restricted region, the flag for that Z position is set at "false".

When the component tape arranged at a Z position has a mounting point located in the LL-restricted region, the flag for that Z position is set at "true".

(3.2) The number of mounting points that are not located in the LL-restricted region and is set at Nf (where "f" stands for "free").

(3.3) The number of mounting points that are located in the LL-restricted region and is set at Nr (where "r" stands for "restricted").

(3.4) When at least one of Nf and Nr is not zero, the following processing is repeated.

(3.4.1) When neither Nf nor Nr is zero.

(i) The cut down process is performed for the mounting points located in the LL-restricted region to produce sets of 4 picked-up components, with the cut down Z numbers being assigned in order to the heads 7 to 10.

The number of components picked up is set as Pr.

The picking up operation is performed several times to occupy the heads 7 to 10.

The lowest Z number, out of the Z numbers for the positions from which components are picked up, is set as Zr.

(ii) Pr is subtracted from Nr.

(iii) The cut down process is performed on the mounting points that are not located in the LL-restricted region to produce sets of 6 picked-up components. The cut down Z numbers are assigned in order to the heads 1 to 6.

The number of components picked up is set as Pf.

The picking up operation is performed several times to occupy the heads 1 to 6.

The lowest Z number, out of the Z numbers for the positions from which components are picked up, is set as Zf.

(iv) Pf is subtracted from Nf.

(v) If Zf≦Zr, the NC data is arranged in the order heads 7 to 10, then heads 1 to 6.

Components are picked up in the order heads 7 to 10, then heads 1 to 6.

Here, the pickup order matches the mounting order, with the mounting order being the order of the NC data.

(vi) If Zf>Zr, the NC data is arranged in the order heads 1 to 6, then heads 7 to 10.

Components are picked up in the order heads 1 to 6, then heads 7 to 10.

Here, the pickup order matches the mounting order, with the mounting order being the order of the NC data.

(3.4.2) When Nr is zero and Nf is not zero (i) The cut down process is performed for all of the mounting points to produce sets of 10 picked-up components, with the cut down Z numbers being assigned in order to the heads 1 to 10.

The number of components picked up is set as Pf.

The picking up operation is performed several times to occupy the heads 1 to 10.

(ii) The number of components picked up Pf is subtracted from Nf.

(3.4.3) When Nf is zero and Nr is not zero (i) The cut down process is performed for all of the mounting points to produce sets of 4 picked-up components, with the cut down Z numbers being assigned in order to the heads 7 to 10.

The number of components picked up is set as Pr.

The picking up operation is performed several times to occupy the heads 7 to 10.

In some cases, this produces a large number of tasks composed of 4 components.

(ii) The number of components picked up Pr is subtracted from Nr (3.4.4) When both Nf and Nr are zero The processing ends for the right block.

(4) Processing ends.

3.9.14 LL Restrictions: Interchanging Component Tapes on the Z-Axis (1)

(1) It is assumed that prior to this stage, the cut down procedure has been performed to determine all of the mountains.

(2) For block A, the following process is performed for the positions Z=1 to 11.

(2.1) The component tape located at the position Z is set as component tape K, and the highest X coordinate of the mounting points for the component tape K is set as Xmax.

When no component tape is located at the position Z, Xmax=0 is set for the position Z.

(2.2) The following processing is performed when Xmax≦400.0 [mm] (i.e., when component tape K does not have a mounting point that is located in the LL-restricted region).

(2.2.1) No rearranging is performed. This is because the highest X coordinate for mounting points where mounting by nozzle 1 is possible is 400.0 [mm].

(2.3) The following processing is performed when Xmax>400.0 [mm] (i.e., when component tape K has a mounting point that is located in the LL-restricted region).

(2.3.1) Out of the component tapes that (a) form the mountain M containing the component tape K and (b) have a Z number that is 12 or above, a component tape that does not have a mounting point in the LL-restricted region and has a similar number of components to be mounted to the component tape K is found, and is interchanged with the component tape K.

When these component tapes are held in double cassettes, the feed pitch needs to be the same.

(2.3.2) When no such component tape is found, a component tape that has the lowest number of points to be mounted is found out of the component tapes that (a) are in block A, (b) form part of a different mountain to mountain M, (c) have a Z number that is 12 or above, and (d) don't have a mounting point in the LL-restricted region. This component tape is interchanged with the component tape K.

In some cases, the component tape K is interchanged with a component tape in a different component group.

When these component tapes are held in double cassettes, the feed pitch needs to be the same.

(2.3.3) When no such component tape is found, a component tape that has the lowest number of points to be mounted is found out of the component tapes that (a)

form a mountain in block B and (b) don't have a mounting point in the LL-restricted region. This component tape is then interchanged with the component tape K.

In some cases, the component tape K is interchanged with a component tape in a different component group.

Also, in some cases, components are picked up from block A and block B in the same task.

When these component tapes are held in double cassettes, the feed pitch needs to be the same.

(2.3.4) When no such component tape is found, mounting is judged to be impossible for component tape K.

(3) The processing ends.

3.9.15 LL Restrictions: Interchanging Component Tapes on the Z-Axis (2)

(1) It is assumed that prior to this stage, the cut down procedure has been performed to determine all of the mountains.

(2) Tasks are generated.

(3) The correspondence between the head numbers and Z positions in each task is investigated, and the lowest head number that is used for picking up a component is found for each Z position.

(4) The following processing is performed for the positions Z=1 to Z=11 in block A.

(4.1) The component tape located at the position Z is set as component tape K, and the highest X coordinate of the mounting points for the component tape K is set as Xmax.

When no component tape is located at the position Z, Xmax=0 is set for the position Z.

(4.2) The highest X coordinate at which a head (that has the lowest head number which is used to pick up a component from the position Z) can mount a component is set as Xh.

(4.3) The following processing is performed when $Xmax \leqq Xh$ (i.e., when component tape K does not have a mounting point that is located in the LL-restricted region).

(4.3.1) No rearranging is performed.

(4.4) The following processing is performed when $Xmax > Xh$ (i.e., when component tape K has a mounting point that is located in the LL-restricted region).

(4.4.1) Out of the component tapes that (a) form the mountain M containing the component tape K and (b) have a Z number that is 12 or above, a component tape that does not have a mounting point in the LL-restricted region and has a similar number of components to be mounted to the component tape K is found, and is interchanged with the component tape K.

When these component tapes are held in double cassettes, the feed pitch needs to be the same.

(4.4.2) When no such component tape is found, a component tape that has the lowest number of points to be mounted is found out of the component tapes that (a) are in block A, (b) form part of a different mountain to mountain M, (c) have a Z number that is 12 or above, and (d) don't have a mounting point in the LL-restricted region. This component tape is then interchanged with the component tape K.

In some cases, the component tape K is interchanged with a component tape in a different component group.

When these component tapes are held in double cassettes, the feed pitch needs to be the same.

(4.4.3) When no such component tape is found, a component tape that has the lowest number of points to be mounted is found out of the component tapes that (a) form a mountain in block B and (b) don't have a mounting point in the LL-restricted region. This component tape is then interchanged with the component tape K.

In some cases, the component tape K is interchanged with a component tape in a different component group.

Also, in some cases, components are picked up from block A and block B in the same task.

When these component tapes are held in double cassettes, the feed pitch needs to be the same.

(4.4.4) When no such component tape is found, mounting is judged to be impossible for component tape K.

(5) The processing ends.

3.9.16 Processing to Handle XL-Sized Substrates (XL Restrictions)

The following describes the method used to avoid the restrictions that arise for an XL-sized substrate.

(1) Mounting points are assigned to the front stage 110 and rear stage 120 based on the coordinates of the mounting points.

(2) Component tapes are divided based on the coordinates of the mounting points.

(3) An initial assignment is made for the region for which mounting is possible for both the front stage 110 and the rear stage 120.

(4) The LL-restrictions are avoided.

In more detail, the following processes are performed.

(1) Mounting points are assigned to the front stage 110 and rear stage 120 based on the coordinates of the mounting points.

The assignment to the front stage 110 and rear stage 120 based on the coordinates of mounting points is assumed to be as shown by the table in FIG. 46.

(2) Component tapes are divided based on the coordinates of the mounting points.

(2.1) The following three patterns are used, based on the coordinates of the mounting points of the component tapes.

(i) Component tapes are assigned to the front stage 110

(ii) Component tapes are assigned to the rear stage 120

(iii) Component tapes are divided and the resulting divisions are assigned to the front stage 110 and rear stage 120.

(2.2) When pattern (iii) is used, it is necessary to divide a component tape. Rather that distribute the number of components to be mounted between the front stage 110 and rear stage 120, the mounting points themselves are distributed between the front stage 110 and rear stage 120.

(3) An initial assignment is made for the region for which mounting is possible for both the front stage 110 and the rear stage 120.

(3.1) The component tapes corresponding to the components in areas (1) and (2) shown in FIG. 46 are assigned to the front stage 110

(3.1.1) The estimated tact time for each of the component tapes corresponding to the areas (1) and (2) is calculated and the total is set as the estimated tact time of the front stage 110.

(3.2) The component tapes corresponding to the components in areas (6) and (7) shown in FIG. 46 are assigned to the rear stage 120.

(3.2.1) The estimated tact time for each of the component tapes corresponding to the areas (6) and (7) is calculated and the total is set as the estimated tact time of the rear stage 120.

(3.3) The component tapes corresponding to the components in areas (4), (5), and (6) are assigned in order of the component groups, and in descending order of the number of components to be mounted, to the front stage 110 so long as there is space still available.

(3.3.1) The estimated tact time for the component tapes arranged in this way is calculated and the total is added to the estimated tact time of the front stage 110.

(3.4) The component tapes, out of the component tapes corresponding to the components in areas (4), (5), and (6) that were not arranged in the front stage 110, are arranged in the rear stage 120.

(3.4.1) The estimated tact time for the component tapes arranged in this way is calculated and the total is added to the estimated tact time of the rear stage 120.

When these component tapes cannot be arranged in the rear stage 120, the processing returns an error.

(3.5) The following processing is performed when the estimated tact time of the front stage 110<the estimated tact time of the rear stage 120.

(3.5.1) There is no chance of any further improvements being made to the balance, so the processing ends.

(3.6) The following processing is repeated when the estimated tact time of the front stage 110>the estimated tact time of the rear stage 120.

(3.6.1) A component tape, out of the tapes corresponding to the components in areas (4), (5), and (6) that were arranged in the front stage 110, that has the lowest number of components to be mounted is moved over to the rear stage 120.

If component tapes can no longer be moved over into the rear stage 120 (i.e., there are no more free Z positions in the rear stage 120), there is no chance of any further improvements being made to the balance, so the processing ends.

(3.6.2) The estimated tact time of the front stage 110 and the estimated tact time of the rear stage 120 are recalculated.

(4) The LL-restrictions are avoided.

(4.1) Areas (2) and (5) in the front stage 110 correspond to the LL-restricted region, so that suitable processing for the LL-restrictions is performed.

(4.2) Areas (3) and (6) in the rear stage 120 correspond to the LL-restricted region, so that suitable processing for the LL-restrictions is performed.

3.9.17 Estimated Tact Time Balance Adjusting Process (In Units of Mountains).

The characteristics of this processing are as follows.

(i) When in the initial state, the estimated tact time for the front stage 110 is longer than that for the rear stage 120, component tapes are moved from the front stage 110 to the rear stage 120 in units of mountains to adjust the estimated tact time balance.

(ii) For a mountain present at the balance point, the estimated tact time balance is adjusted in units of component tapes. This is described in detail in the "Estimated Tact Time Balance Adjusting Process (In Units Of Component Tapes)" section later in this specification.

The specific processes used are as follows.

(1) Each mountain is provided with a flag. The initial state of each flag is set at "true".

(2) When all of the flags of the mountains arranged in the front stage 110 are "false", the following processing is performed.

(2.1) Advance to process (15).

This corresponds to the case where all of the mountains that were arranged in the front stage 110 have been moved to the rear stage 120. This case cannot occur in reality.

(3) The present arrangement of mountains in the front stage 0.110 and the rear stage 120 is stored.

(4) The following processing is performed to select the mountain M to be moved.

(4.1) The highest component group number, out of the component tapes forming the mountains arranged in the front stage 110, is found and set as PGMax.

(4.2) When the flags for all of the mountains formed from single cassettes or double cassettes including component tapes for the component group number PGMax are set as "false", the following processing is formed.

(4.2.1) The processing for moving mountains from the front stage 110 to the rear stage 120 ends.

Since the mountains to be moved have already been moved, the processing for moving mountains from the front stage 110 to the rear stage 120 ends.

This does not depend on whether the tact time has been balanced.

(4.3) The following processing is performed when a mountain is formed of single cassettes including the component tape with the component number PGMax and a mountain is formed of double cassettes including the component tape with the component number PGMax are both present.

(4.3.1) The mountain is formed of single cassettes is set as mountain M.

(4.4) The following processing is performed when only one of a mountain is formed of single cassettes including the component tape with the component number PGMax and a mountain is formed of double cassettes including the component tape with the component number PGMax is present.

(4.4.1) The mountain is set as mountain M.

(5) The mountain M is taken from the mountains arranged in the front stage 110 and the remaining mountains are rearranged.

(6) The mountain M is added to the mountains arranged in the rear stage 120 and these mountains are rearranged.

(7) When the restrictions for the nozzles cannot be satisfied for the front stage 110 or rear stage 120, the following processing is performed.

(7.1) The arrangement of the mountains in the front stage 110 and the rear stage 120 is restored to the stored state.

(7.2) The flag of mountain M is set at "false".

Hereafter mountain M is not treated as a mountain that can be moved.

(7.3) The processing advances to process (14).

(8) When a mountain cannot fit on the Z-axis in the front stage 110 or the rear stage 120, the following processing is performed.

(8.1) The arrangement of the mountains in the front stage 110 and the rear stage 120 is restored to the stored state.

(8.2) The processing advances to process (15).

Since the only mountain that can be moved is mountain M, the mountain M is divided in units of component tapes, and the resulting divisions are assigned to the front stage 110 and the rear stage 120 in an attempt to improve the tact time balance.

Mountain M is not necessarily positioned at the balance point, so that even if the tact time balance can be improved, there are cases when the tact times of the stages cannot be perfectly balanced.

(9) The estimated tact time for the front stage 110 is calculated.

(9.1) The estimated tact time is calculated for small components.

(9.2) The estimated tact time is calculated for general components.

(9.3) The estimated tact times of small components and general components are added to produce the estimated tact time of the front stage 110.

(10) The estimated tact time for the rear stage 120 is calculated.

(10.1) The estimated tact time is calculated for small components.

(10.2) The estimated tact time is calculated for general components.

(10.3) The estimated tact times of small components and general components are added to produce the estimated tact time of the rear stage 120.

(11) When the estimated tact time of the front stage 110 matches that of the rear stage 120, the following processing is performed.

(11.1) The processing advances to process (15).

The corresponds to when the balancing of the estimated tact time between the front stage 110 and the rear stage 120 has been completed.

(12) When the estimated tact time of the front stage 110 is shorter than that of the rear stage 120, the following processing is performed.

(12.1) The arrangement of the mountains in the front stage 110 and the rear stage 120 is restored to the stored state.

(12.2) The "Estimated Tact Time Balance Adjusting Process (In Units Of Component Tapes)" is performed for the mountain M.

For a mountain present at the balance point, the estimated tact time balance is adjusted in units of component tapes. This is described in detail in the "Estimated Tact Time Balance Adjusting Process (In Units Of Component Tapes) (A)" section later in this specification.

(12.3) The processing advances to process (15).

The mountain M is ends up situated at the point where the line is balanced.

The mountain M is restored to the state where it is arranged in the front stage 110.

Hereafter, the mountain M is divided in units of component tapes and the resulting divisions are assigned to the front stage 110 and the rear stage 120 in an attempt to improve the estimated tact time balance.

(13) When the estimated tact time of the front stage 110 is longer than the estimated tact time of the rear stage 120, the following processing is performed.

(13.1) The flag of mountain M is set at "false".

Hereafter mountain M is treated as a mountain that has been moved.

(13.2) The processing advances to process (14).

Movement is once again performed in units of mountains.

(14) The processing returns to process (2).

(15) The "Estimated Tact Time Balance Adjusting Process (In Units Of Mountains)" ends. 3.9.18 Estimated Tact Time Balance Adjusting Process (In Units of Component Tapes)

The characteristics of this processing are as follows.

(i) When in the initial state, the estimated tact time for the front stage 110 is longer than that for the rear stage 120, component tapes are moved from the front stage 110 to the rear stage 120 in units of component tapes to adjust the estimated tact time balance.

(ii) Since the accuracy of the estimated tact time is not so high, the estimated tact time of the stages is not balanced in units of mounting points.

The specific processes used are as follows.

(1) Each component tape forming the mountain M is provided with a flag. The initial state of each flag is set at "true".

(2) A list of component types is produced for the mountain M.

(3) When the flag for each component tape in the component list is set at "false", the following processing is performed.

(3.1) The processing advances to process (13).

The "Estimated Tact Time Balance Adjusting Process (In Units Of Component Tapes)" ends.

(4) The present arrangement of mountains in the front stage 110 and the rear stage 120 is stored.

(5) Out of the component tapes that are in the component list and have a flag set at "true", the component tape with the lowest number of components to be mounted is found and selected as the component tape K.

(6) Component tape K is assigned to the rear stage 120.

(7) Component tapes that are left in the component list, have a flag set at "true" and have not been assigned to either the front stage 110 or the rear stage 120 are assigned to the front stage 110.

As a result, a mountain that is not mountain M is assigned to the front stage 110 or the rear stage 120.

(8) The estimated tact time is calculated for the front stage 110.

(8.1) The estimated tact time is calculated for small components.

(8.2) The estimated tact time is calculated for general components.

(8.3) The estimated tact times of small components and general components are added to produce the estimated tact time of the front stage 110.

(9) The estimated tact time for the rear stage 120 is calculated.

(9.1) The estimated tact time is calculated for small components.

(9.2) The estimated tact time is calculated for general components.

(9.3) The estimated tact times of small components and general components are added to produce the estimated tact time of the rear stage 120.

(10) When the estimated tact time of the front stage 110 matches that of the rear stage 120, the following processing is performed.

(10.1) The processing advances to process (13).

The corresponds to when the balancing of the estimated tact time between the front stage 110 and the rear stage 120 has been completed.

(11) When the estimated tact time of the front stage 110 is shorter than that of the rear stage 120, the following processing is performed.

(11.1) The flag for the component tape K is set at "false". This shows that the component tape K has been moved.

(11.2) The processing advances to process (13).

By moving the component tape K from the front stage 110 to rear stage 120, the estimated tact time of the rear stage 120 is raised above the front stage 110. After adjusting the estimated tact time in units of component tapes, the estimated tact time balance adjustment process ends.

(12) When the estimated tact time of the front stage 110 is longer than the estimated tact time of the rear stage 120, the following processing is performed.

(12.1) The flag of the component tape K is set at "false".

Hereafter component tape K is treated as a component tape that has been moved.

(12.2) The processing returns to process (3).

Movement is once again performed in units of component tapes.

(13) The "Estimated Tact Time Balance Adjusting Process (In Units Of Component Tapes)" ends.

3.9.19 Processing Moving a Mountain from the Front Stage 110 to the Rear Stage 120

(1) Each mountain is provided with a flag. The initial state of each flag is set at "true".

(2) When all of the flags of the mountains arranged in the front stage 110 are "false", the following processing is performed.

(2.1) Advance to process (16).

This corresponds to the case where all of the mountains that were arranged in the front stage 110 have been moved to the rear stage 120. This case cannot occur in reality.

(3) The present arrangement of mountains in the front stage 110 and the rear stage 120 is stored.

(4) The following processing is performed to select the mountain M to be moved.

(4.1) The highest component group number, out of the component tapes forming the mountains arranged in the front stage 110, is found and set as PGMax.

(4.2) When the flags for all of the mountains formed from single cassettes or double cassettes including component tapes for the component group number PGMax are set as "false", the following processing is formed.

(4.2.1) The processing for moving mountains from the front stage 110 to the rear stage 120 ends.

Since the mountains to be moved have already been moved, the processing for moving mountains from the front stage 110 to the rear stage 120 ends.

This does not depend on whether the tact time has been balanced.

(4.3) The following processing is performed when a mountain is formed of single cassettes including the component tape with the component number PGMax and a mountain is formed of double cassettes including the component tape with the component number PGMax are both present.

(4.3.1) The mountain is formed of single cassettes is set as mountain M.

(4.4) The following processing is performed when only one of a mountain is formed of single cassettes including the component tape with the component number PGMax and a mountain is formed of double cassettes including the component tape with the component number PGMax is present.

(4.4.1) The mountain is set as mountain M.

(5) The mountain M is taken from the mountains arranged in the front stage 110 and the remaining mountains are rearranged.

(6) The mountain M is added to the mountains arranged in the rear stage 120 and these mountains are rearranged.

(7) When the restrictions for the nozzles cannot be satisfied for the front stage 110 or rear stage 120, the following processing is performed.

(7.1) The arrangement of the mountains in the front stage 110 and the rear stage 120 is restored to the stored state.

(7.2) The flag of mountain M is set at "false".

Hereafter mountain M is not treated as a mountain that can be moved.

(7.3) The processing advances to process (15).

(8) When a mountain cannot fit on the Z-axis in the front stage 110 or the rear stage 120, the following processing is performed.

(8.1) The arrangement of the mountains in the front stage 110 and the rear stage 120 is restored to the stored state.

(8.2) The processing advances to process (16).

Since the only mountain that can be moved is mountain M, the mountain M is divided in units of component tapes, and the resulting divisions are assigned to the front stage 110 and the rear stage 120 in an attempt to improve the tact time balance.

Mountain M is not necessarily positioned at the balance point, so that even if the tact time balance can be improved, there are cases when the tact times of the stages cannot be perfectly balanced.

(9) Tasks are generated for the front stage 110.

(9.1) Tasks are generated for small components.

(9.2) Tasks are generated for general components.

(10) Tasks are generated for the rear stage 120.

(10.1) Tasks are generated for small components.

(10.2) Tasks are generated for general components.

(11) The mounting time is calculated for the front stage 110 and for the rear stage 120.

In some cases, mountains are arranged in both the front stage 110 and the rear stage 120.

(12) When the mounting time of the front stage 110 matches that of the rear stage 120, the following processing is performed.

(12.1) The processing advances to process (16).

The corresponds to when the mounting times of the front stage 110 and the rear stage 120 are perfectly balanced.

(13) When the mounting time of the front stage 110 is shorter than that of the rear stage 120, the following processing is performed.

(13.1) The arrangement of the mountains in the front stage 110 and the rear stage 120 is restored to the stored state.

(13.2) The "Processing Moving A Component Tape From The Front Stage 110 To The Rear Stage 120" is performed for the mountain M.

(13.3) The processing advances to process (16).

The mountain M is ends up situated at the point where the line is balanced.

The mountain M is restored to the state where it is arranged in the front stage 110.

After this, the mountain M is divided in units of component tapes, and the resulting divisions are assigned to the front stage 110 and the rear stage 120 in an attempt to improve the tact time balance.

(14) When the mounting time of the front stage 110 is longer than that of the rear stage 120, the following processing is performed.

(14.1) The flag of mountain M is set at "false".

(14.2) The processing advances to process (15).

There are cases where is necessary to move another mountain from the front stage 110 to the rear stage 120.

(15) The processing returns to process (2).

(16) The "Processing Moving A Mountain From The Front Stage 110 To The Rear Stage 120" ends.

3.9.20 Processing Moving a Component Tape from the Front Stage 110 to the Rear Stage 120

The characteristics of this processing are as follows.

(i) When in the initial state, the mounting time for the front stage 110 is longer than that for the rear stage 120, mounting points are moved from the front stage 110 to the rear stage 120 in units of component tapes to adjust the balance in the mounting times.

(ii) In some cases, many tapes are moved to the rear stage 120.

In some cases, component tapes are divided and are arranged in both the front stage 110 and the rear stage 120.

(iii) The resulting balance in mounting times is favorable.

The specific processes used are as follows.

(1) Each component tape forming the mountain M is provided with a flag.

The initial state of each flag is set at "true".

(2) A list of component types is produced for the mountain M.

(3) When the flag for each component tape in the component list is set at "false", the following processing is performed.

(3.1) The processing advances to process (14).

The "Processing Moving A Component Tape From The Front Stage 110 To The Rear Stage 120" ends.

(4) The present arrangement of mountains in the front stage 110 and the rear stage 120 is stored.

(5) Out of the component tapes that are in the component list and have a flag set at "true", the component tape with the lowest number of components to be mounted is found and selected as the component tape K.

(6) Component tape K is assigned to the rear stage 120.

(7) Component tapes that are left in the component list, have a flag set at "true" and have not been assigned to either the front stage 110 or the rear stage 120 are assigned to the front stage 110.

Mountains aside from mountain M are assigned to either the front stage 110 or the rear stage 120.

(8) Tasks are generated for the front stage 110.

(8.1) Tasks are generated for small components.

Component tapes are divided by performing the core crush processing.

(8.2) Tasks are generated for general components.

Component tapes are divided in accordance with user instructions.

(9) Tasks are generated for the rear stage 120.

(9.1) Tasks are generated for small components.

Component tapes are divided by performing the core crush process.

(9.2) Tasks are generated for general components.

Component tapes are divided in accordance with user instructions.

(10) The mounting time is calculated for the front stage 110 and for the rear stage 120.

(11) When the mounting time of the front stage 110 matches that of the rear stage 120, the following processing is performed.

(11.1) The processing advances to process (14).

This corresponds to when the mounting times of the front stage 110 and the rear stage 120 are perfectly balanced.

(12) When the mounting time of the front stage 110 is shorter than that of the rear stage 120, the following processing is performed.

(12.1) The flag of component tape K is set at "false".

This indicates that the component tape K has been moved.

(12.2) The "Processing Moving Mounting Points From The Front Stage 110 To The Rear Stage 120" is performed for the component tape K.

When the component tape K is moved from the front stage 110 to the rear stage 120, the mounting time of the rear stage 120 becomes longer than that of the front stage 110, so that the component tape K is divided and the mounting points for the component tape K are assigned to the front stage 110 and the rear stage 120 to improve the balance in tact time between the stages.

(12.3) The processing advances to process (14).

(13) When the mounting time of the front stage 110 is longer than that of the rear stage 120, the following processing is performed.

(13.1) The flag of component tape K is set at "false".

This indicates that the component tape K has been moved.

(13.2) The processing returns to process (3).

Mounting points are moved once again in units of component tapes.

(14) The "Processing Moving A Component Tape From The Front Stage 110 To The Rear Stage 120" ends.

3.9.21 Processing Moving Mounting Points from the Front Stage 110 to the Rear Stage 120

The component tape K is divided in units of mounting points, and the resulting divisions are assigned to the front stage 110 and the rear stage 120.

(1) The mounting points are arranged in ascending order of their Y coordinates.

(1.1) Mounting points with the same Y coordinate are arranged in ascending order of their X coordinates.

The result is called the "mounting point list".

When the component tape K is divided into two in units of mounting points and the resulting divisions have been assigned to the front stage 110 and the rear stage 120, there is the possibility of only one component tape K being assigned to the front stage 110 or the rear stage 120. In this case, it is probably better to assign a set of mounting points that are close to one another, which is why the mounting points are arranged in order of their coordinates.

If the greedy method is applied to the same component tapes in the front stage 110 and the rear stage 120, this kind of rearranging is unnecessary. However, if the greedy method is applied separately to the front stage 110 and the rear stage 120, such rearranging is effective.

(2) The variable n showing the number of mounting points assigned to the front stage 110 is set at 1.

(3) When n is larger than the number of mounting points for the component tape K, the following processing is performed.

(3.1) The processing advances to process (12).

As a result, the "Processing Moving Mounting Points From The Front Stage 110 To The Rear Stage 120" ends (4) The first to $n^{th}$ mounting points in the mounting point list are assigned to the front stage 110.

(5) The ($n+1^{th}$) to last mounting points in the mounting point list are assigned to the rear stage 120.

(6) Tasks are generated for the front stage 110.

(6.1) Tasks are generated for small components.

Component tapes are divided by performing the core crush process.

(6.2) Tasks are generated for general components.

Component tapes are divided in accordance with user instructions.

(7) Tasks are generated for the rear stage 120.

(7.1) Tasks are generated for small components.

Component tapes are divided by performing the core crush process.

(7.2) Tasks are generated for general components.

Component tapes are divided in accordance with user instructions.

(8) The mounting time is calculated for the front stage 110 and for the rear stage 120.

(9) When the mounting time of the front stage 110 matches that of the rear stage 120, the following processing is performed.

(9.1) The processing advances to process (12).

As a result, the "Processing Moving Mounting Points From The Front Stage 110 To The Rear Stage 120" ends.

This corresponds to when the mounting times of the front stage 110 and the rear stage 120 are perfectly balanced.

(10) When the mounting time of the front stage 110 is shorter than that of the rear stage 120, the following processing is performed.

(10.1) The processing advances to process (12).

As a result, the "Processing Moving Mounting Points From The Front Stage 110 To The Rear Stage 120" ends.

This corresponds to when the mounting times of the front stage 110 and the rear stage 120 are well balanced, though not exactly equal.

(11) When the mounting time of the front stage 110 is longer than that of the rear stage 120, the following processing is performed.

(11.1) The variable n is incremented by 1.

(11.2) The processing returns to process (3).

Mounting points are moved from the front stage 110 to the rear stage 120 once again.

(12) The "Processing Moving Mounting Points From The Front Stage 110 To The Rear Stage 120" ends.

3.9.22 Swapping Performed When Adjusting the Tact Time Balance

The following describes the tact time balancing processing (swap processing) performed when there is no free space on the Z-axis into which component tapes can be moved. In this description, the processing is compared to the case when free space is available on the Z-axis.

Figure 95B:
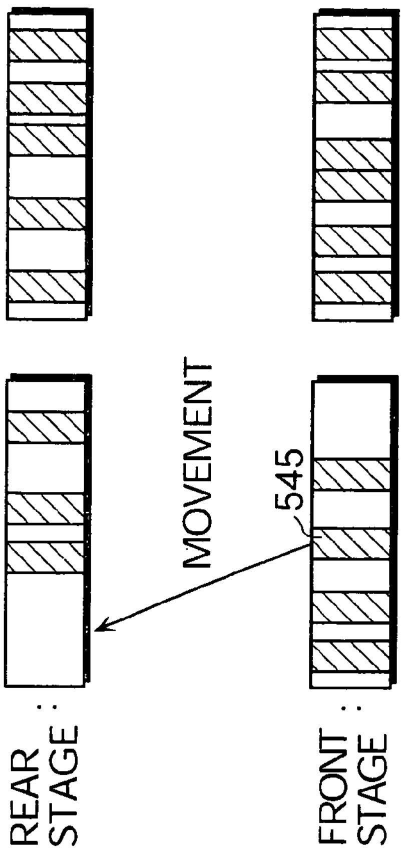
FIGS. 95A and 95B show examples of the mounting times for the front stage and the rear stage when space is available on the Z-axis, as well as the tact time balancing processing performed in this case.
Figure 95A:
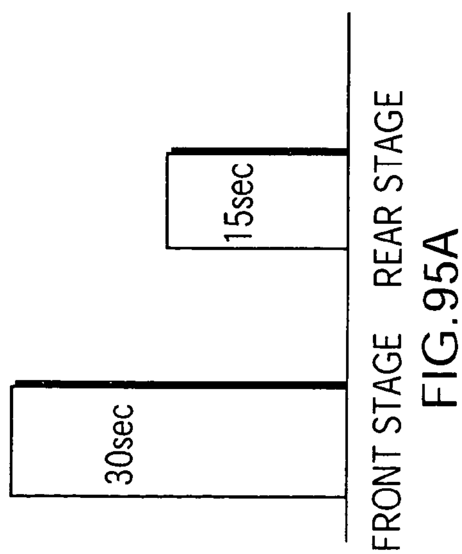
Figure 95D:
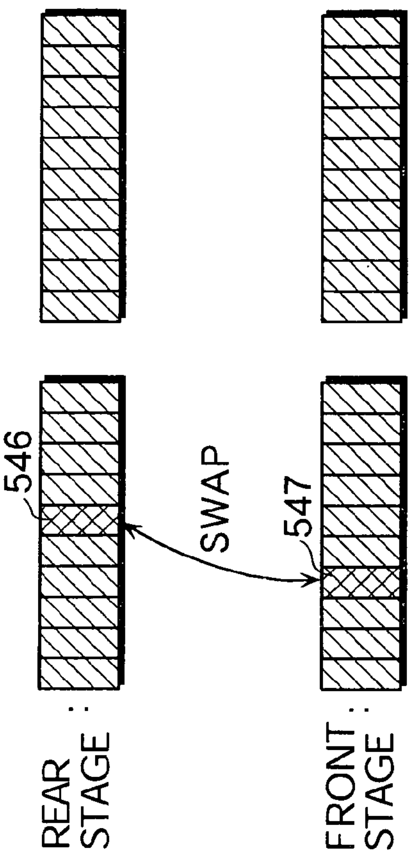
FIGS. 95C and 95D show examples of the mounting times for the front stage and the rear stage when no space is available on the Z-axis, as well as the tact time balancing processing (swapping) performed in this case.
Figure 95C:
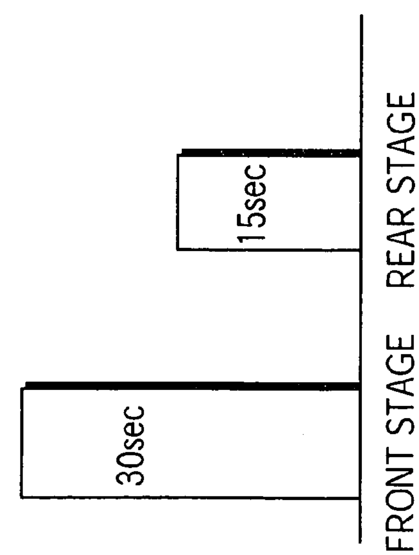

FIGS. 95A and 95B show examples of the mounting times for the front stage 110 and the rear stage 120 when space is available on the Z-axis, as well as the tact time balancing processing performed in this case. FIGS. 95C and 95D show examples of the mounting times for the front stage 110 and the rear stage 120 when no space is available on the Z-axis, as well as the tact time balancing processing (swapping) performed in this case.

As shown in FIGS. 95A and 95B, when free space is available on the Z-axis, the processes 3.9.19 to 3.9.21 described above are performed to move mounting points to eradicate the difference in mounting times between the stages. In the illustrated example, a number of components 545 with a total mounting time of 7.5 seconds are moved from the front stage 110 to the rear stage 120, thereby balancing the mounting times of the stages.

On the other hand, when, as shown in FIGS. 95C and 95D, there is no free space is available on the Z-axis, the component tape 547 that is assigned to the front stage 110 and has a large number of components to be mounted and the component tape 546 that is assigned to the rear stage 120 and has a small number of components to be mounted are swapped in units of component cassettes. As a result, the mounting time corresponding to the difference in the number of components to be mounted is moved from the front stage 110 to the rear stage 120, evening out the mounting times of the stages.

3.9.23 Cut Down Procedure Performed for Double Cassettes

The following describes the cut down process performed for double cassettes.

Figure 96:
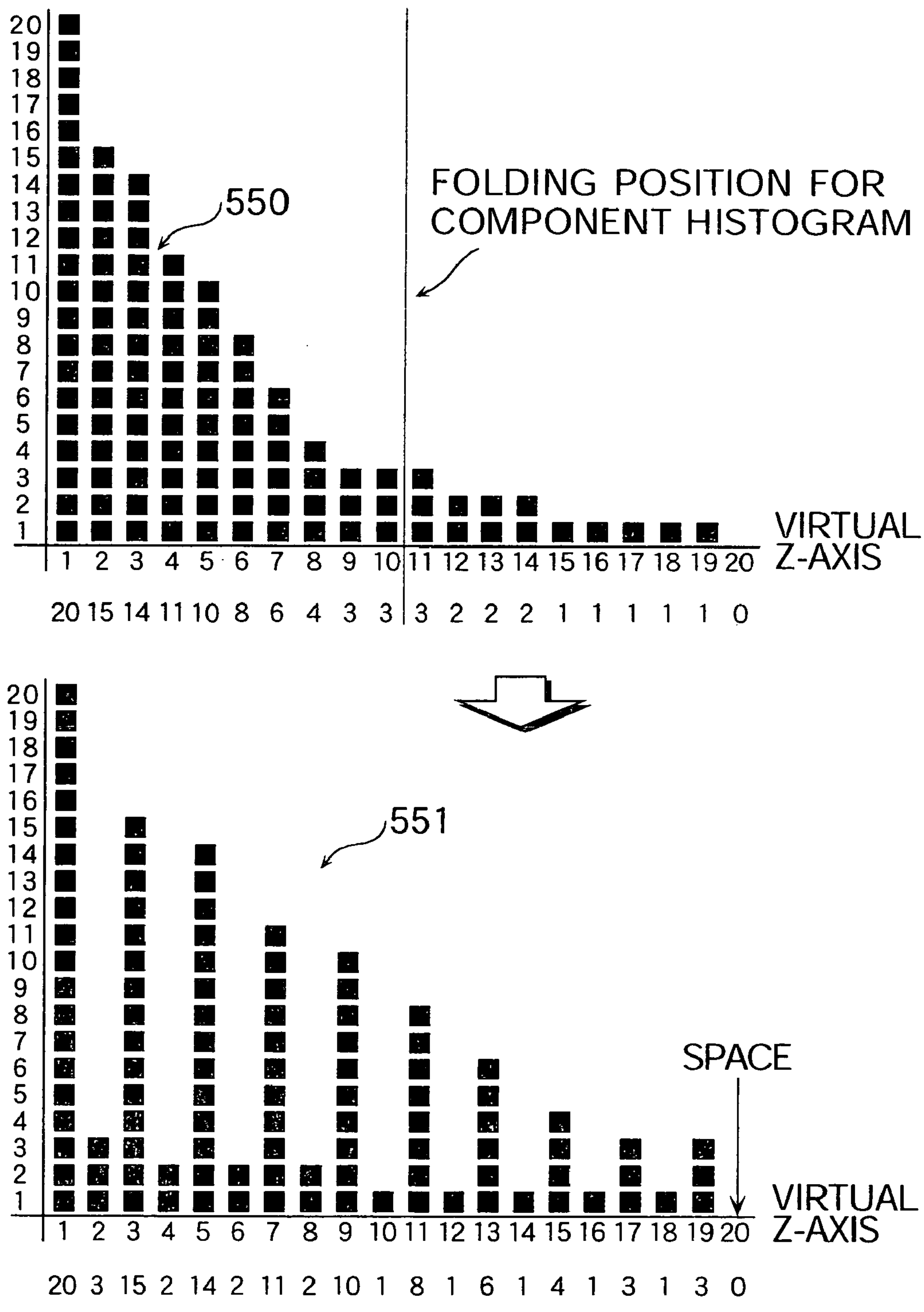
FIG. 96 is a component histogram that is used to illustrate step (1) of the optimization performed by the cut down procedure on double cassettes.

(1) The component tapes that are held in double cassettes with a feed pitch of 2 mm are arranged to form a mountain on a virtual Z-axis (see FIG. 96). To do so, a component histogram 550 in which component tapes are arranged in descending order of the number of components to be mounted is divided at its midpoint (also referred to as the "folding point") and is folded upon itself. The two overlapping halves are then combined with component tapes from the former and latter halves in alternating positions, resulting in the component histogram 551 (where pairs of component tapes have been produced by the folding).

Figure 97:
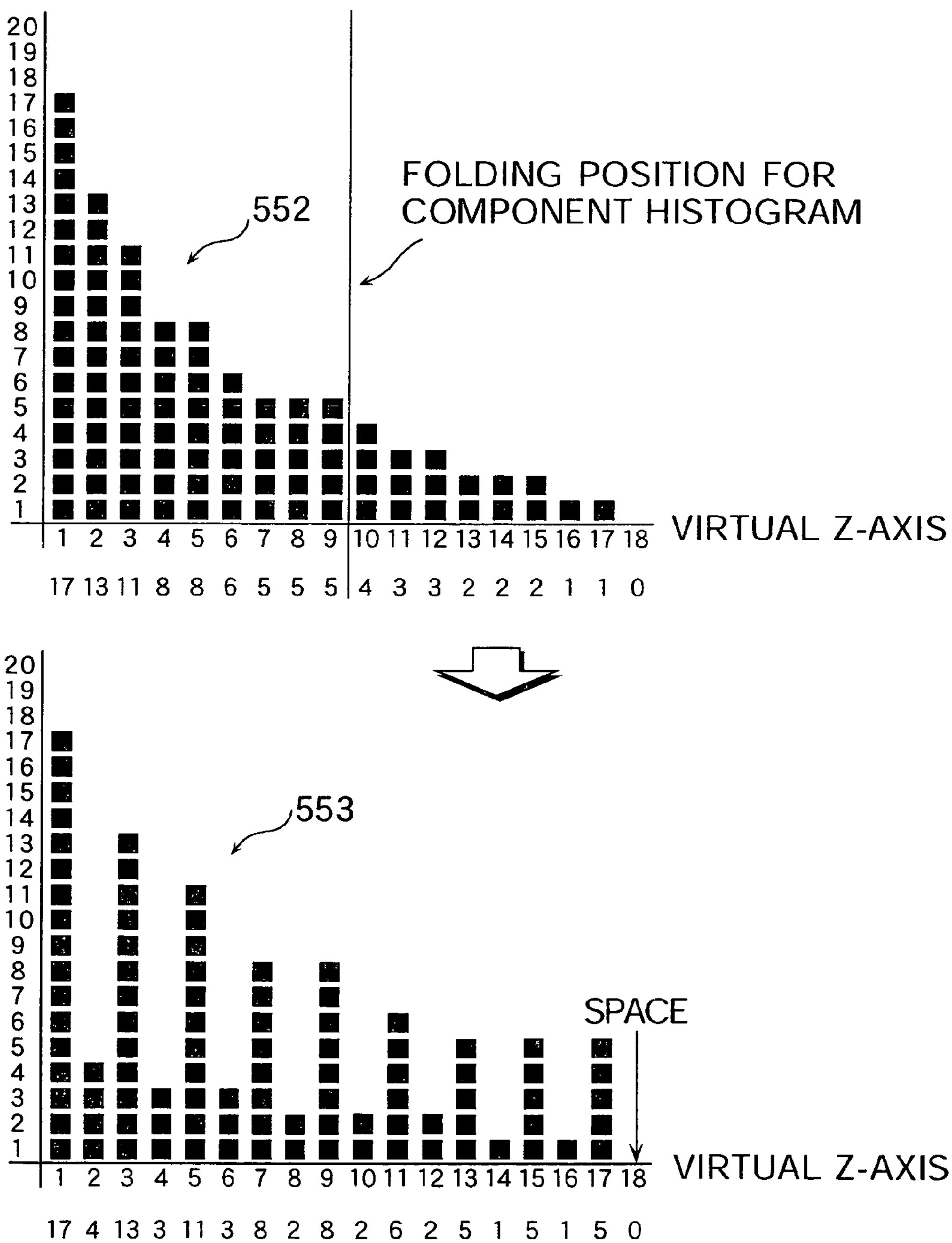
FIG. 97 is a component histogram that is used to illustrate step (2) of the same procedure.

(2) In the same way, component tapes that are held in double cassettes with a feed pitch of 4 mm are arranged to form a mountain on a virtual Z-axis (see FIG. 97). To do so, a component histogram 537 in which the component tapes are arranged in descending order of the number of components to be mounted is divided at its midpoint, folded upon itself, and the two overlapping halves are combined with component tapes from the former and latter halves in alternating positions, resulting in the component histogram 553 (where pairs of component tapes have been produced by the folding).

Figure 98:
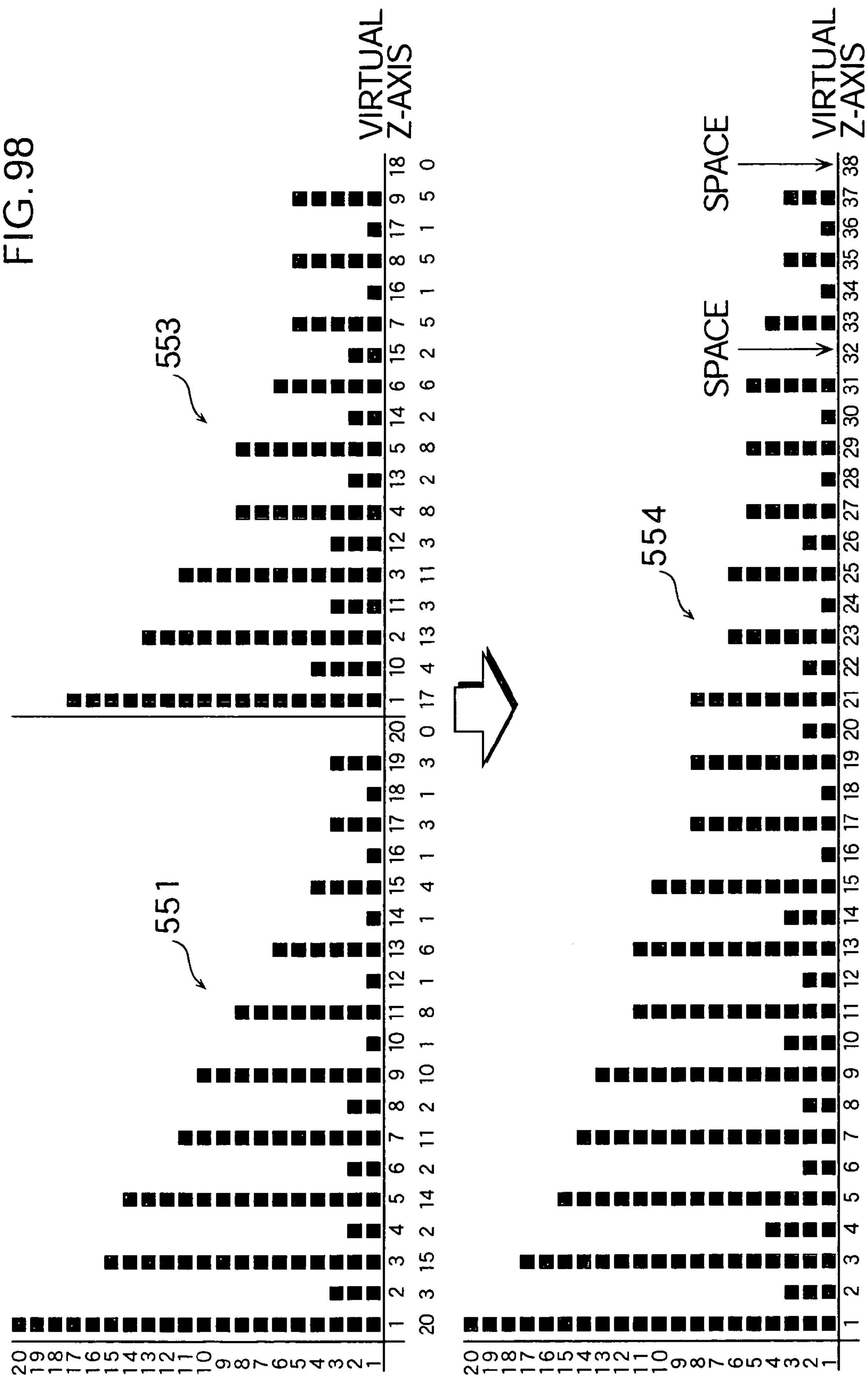
FIG. 98 is a component histogram that is used to illustrate step (3) of the same procedure.

(3) The component histograms 551 and 553 for the component cassettes with the respective feed pitches of 2 mm and 4 mm are combined to produce a component histogram 554 (see FIG. 98). In other words, the double cassettes are arranged in descending order of the number of components to mounted for the tapes arranged in the odd-numbered Z positions, without breaking up the pairs of component tapes in each double cassette.

Figure 99A:
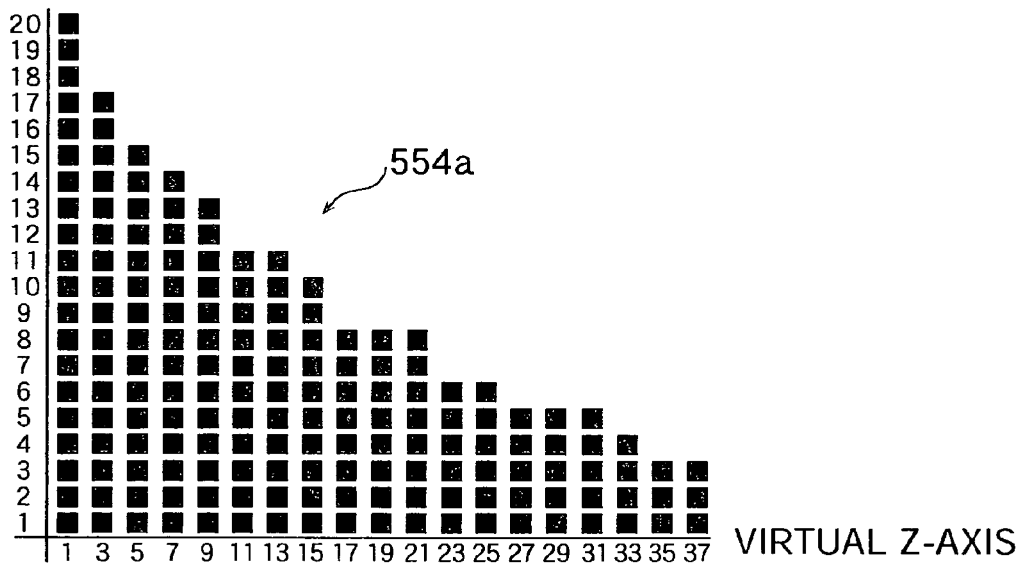
FIG. 99 is a component histogram that is used to illustrate step (4) of the same procedure.
Figure 99B:
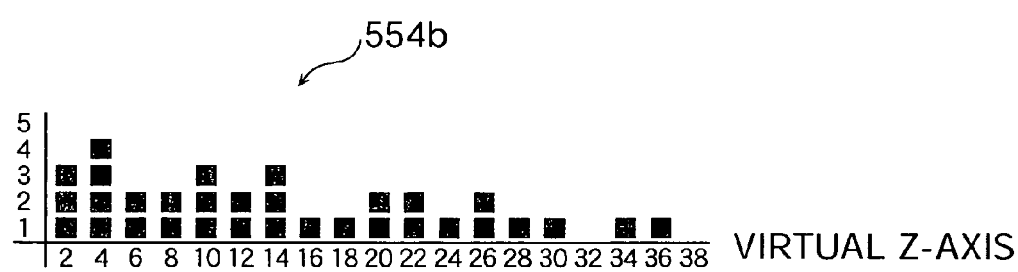

(4) The component histogram 554 is split into a component histogram 554*a* (see FIG. 99A) containing the odd-numbered Z positions and a component histogram 554*b* (see FIG. 99B) containing the even-numbered Z positions.

Figure 100A:
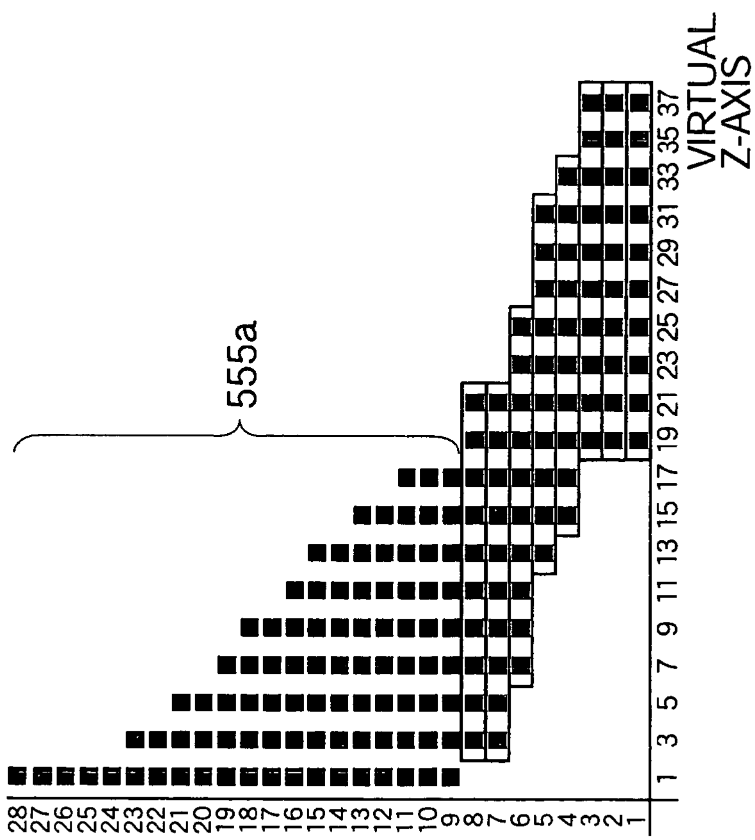
FIG. 100 is a component histogram that is used to illustrate step (5) of the same procedure.
Figure 100B:
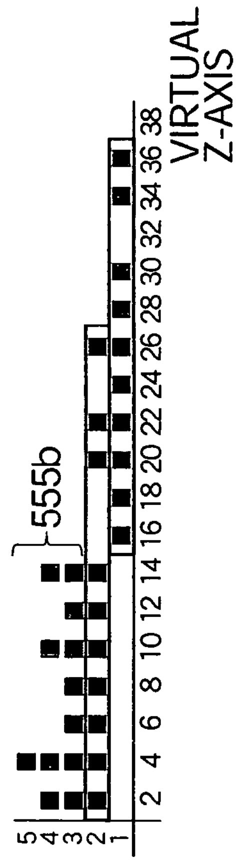

(5) The cut down process is performed for the component histograms 554*a* and 554*b*, starting from the component tapes with few components to be mounted, to produce pickup patterns in which 10 components are simultaneously picked up (see FIGS. 100A and 100B). As a result, the core parts 555*a* and 555*b* remain in the respective component histograms 554*a* and 554*b*.

Figure 101A:
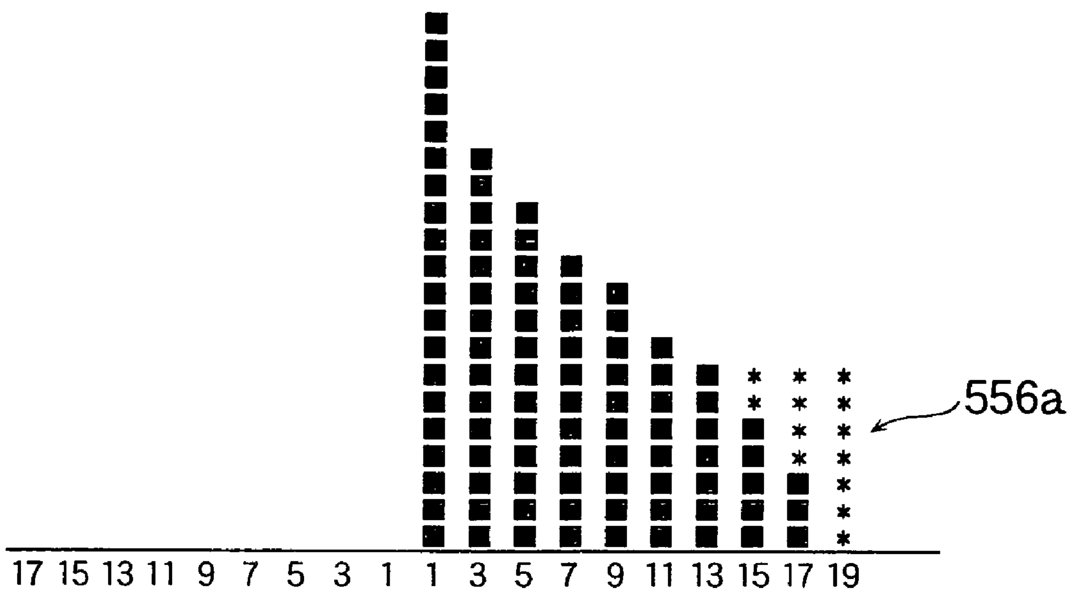
FIG. 101 is a component histogram that is used to illustrate step (6) of the same procedure.
Figure 101B:
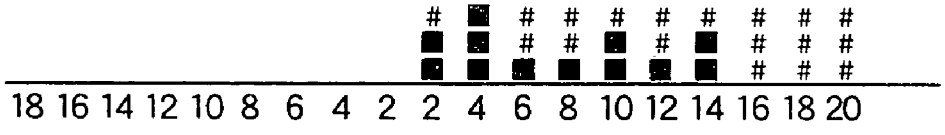

(6) Supplementary patterns 556*a* and 556*b* are respectively produced for the odd-numbered core part 555*a* and the even-numbered core part 555*b* (see FIGS. 101A, 101B). In the illustrated example, there are 92 mounting points in the odd-numbered core part 555*a* and 12 mounting points in the even-numbered core part 555*b*, making a total of 104 mounting points. As a result, 10 tasks of 10 components are produced, leaving a single task of 4 components.

Since the highest number of components to be mounted for the component tapes in the even-numbered core part 555*b* is 3, three tasks for 10 components are produced on the even-numbered side, and the remaining tasks are produced on the odd-numbered side.

Figure 102A:
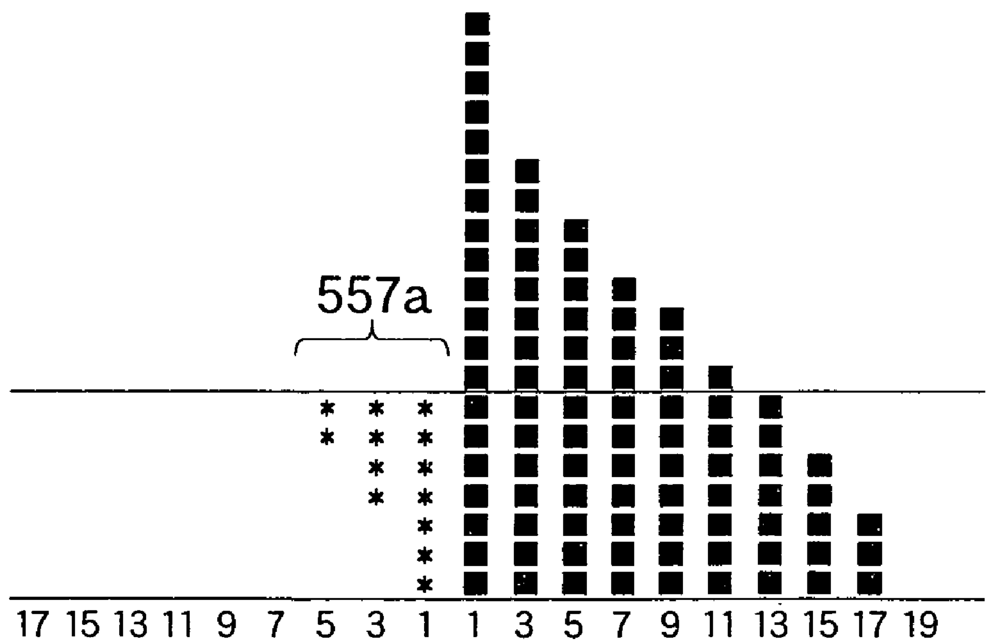
FIG. 102 is a component histogram that is used to illustrate step (7) of the same procedure.
Figure 102B:
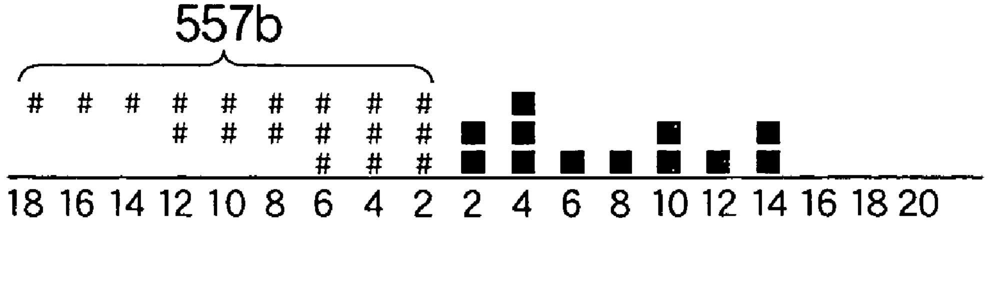

(7) The supplementary component tapes 557*a* and 557*b* for the odd-numbered and even-numbered sides are arranged in order (see FIGS. 102A and 102B). In these drawings, the supplementary component tapes are indicated using asterisks on the odd-numbered side and hash marks on the even-numbered side.

Note that as shown in FIGS. 102A and 102B, there are cases where the number of supplementary component tapes is not equal on the odd-numbered and even-numbered sides.

Figure 103A:
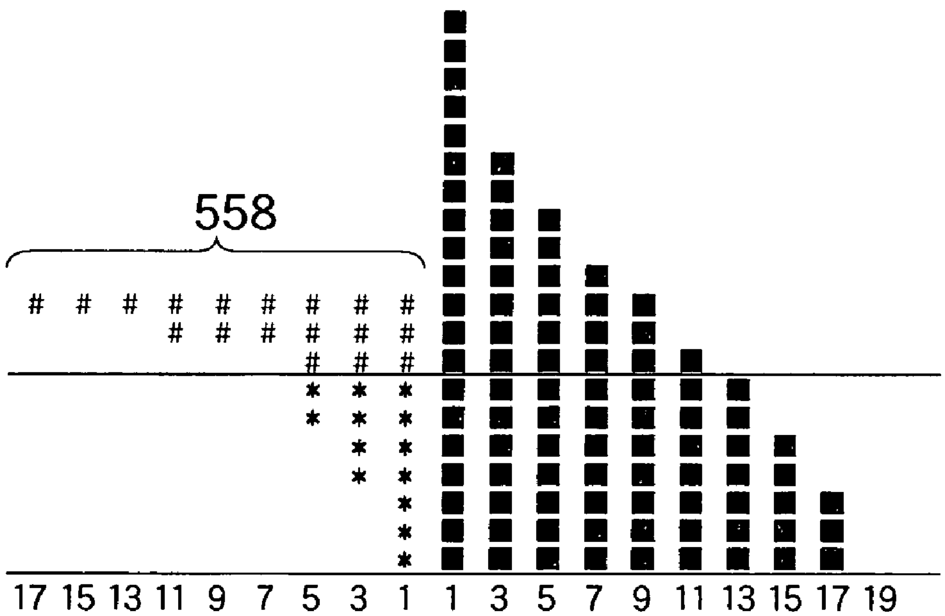
FIG. 103 is a component histogram that is used to illustrate step (8) of the same procedure.
Figure 103B:
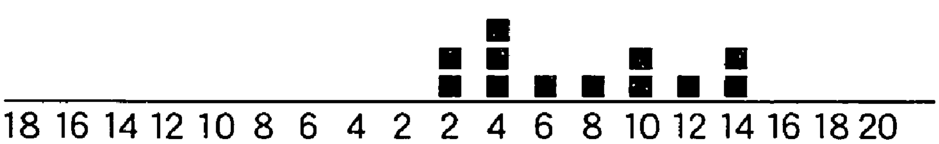

(8) The even-numbered supplementary component tapes 557*b* are placed over the odd-numbered supplementary component tapes 557*a* to produce a single group of supplementary component tapes 558 (see FIGS. 103A and 103B).

Figure 104A:
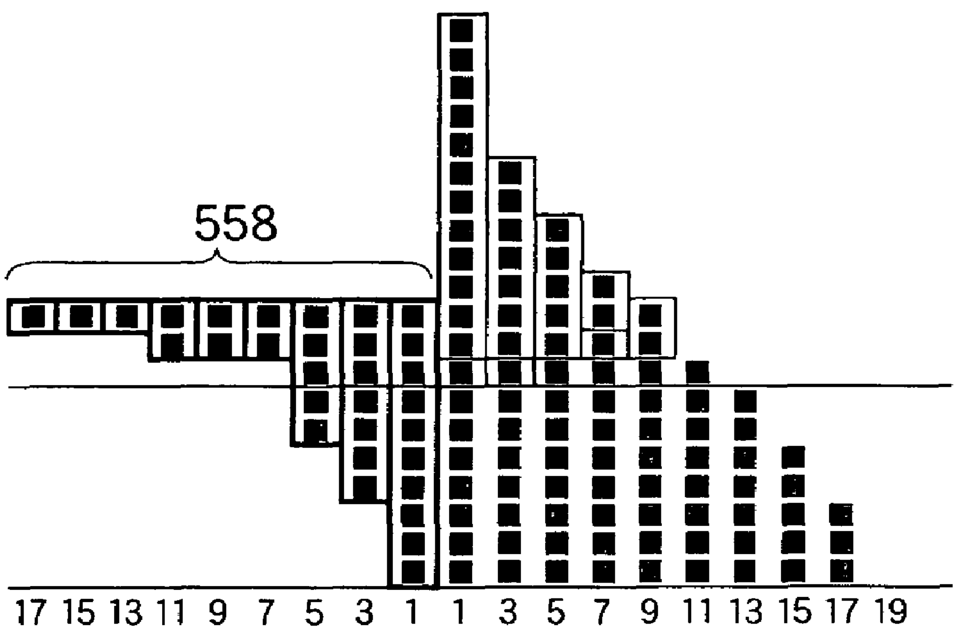
FIG. 104 is a component histogram that is used to illustrate step (9) of the same procedure.
Figure 104B:
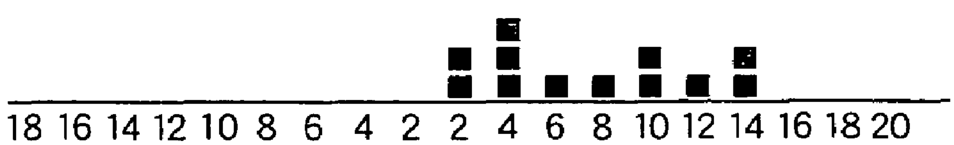

(9) Mounting points are assigned to the combined supplementary component tapes 558 (see FIGS. 104A and 104B).

At this point, the supplementary component tapes produced by combining the supplementary component tapes on the odd-numbered and even-numbered sides are formed of single component tapes. Therefore, when the combined component tapes are split into the tapes on the odd-numbered and even-numbered sides, the feed pitch is always the same for the resulting tapes, meaning that these tapes can be placed as pairs into double cassettes.

Figure 105A:
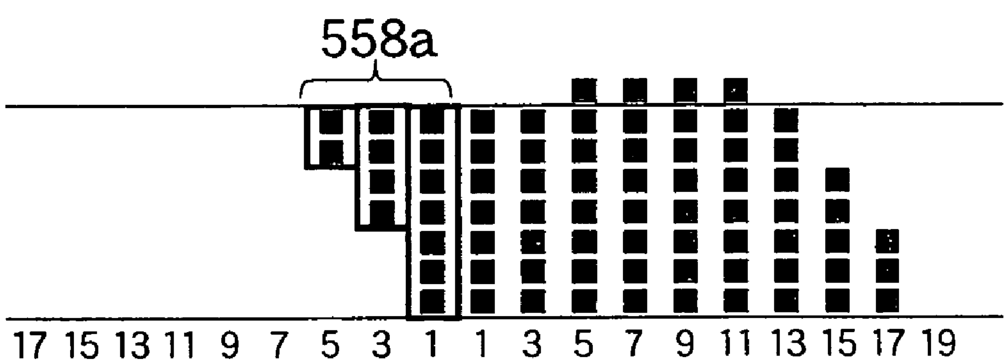
FIG. 105 is a component histogram that is used to illustrate step (10) of the same procedure.
Figure 105B:
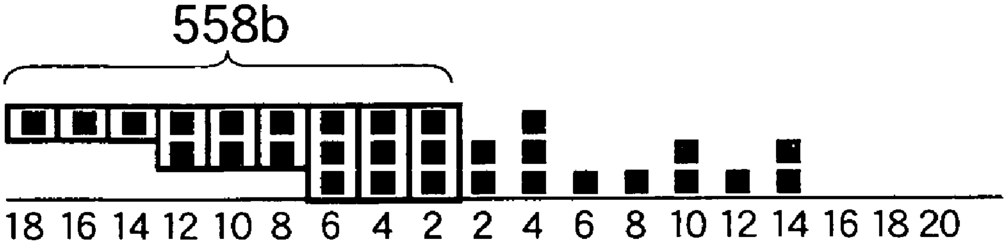

(10) The combined supplementary component tapes are divided into odd-numbered component tapes 558*a* and an even-numbered component tapes 558*b* (see FIG. 105A and FIG. 105B).

Figure 106A:
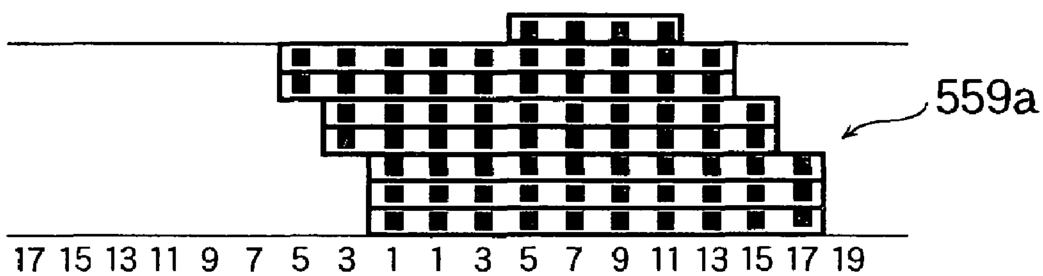
FIG. 106 is a component histogram that is used to illustrate step (11) of the same procedure.
Figure 106B:
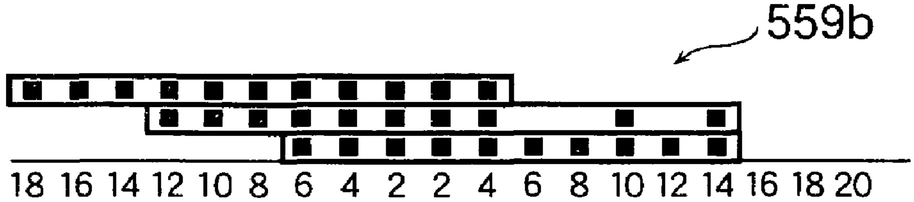

(11) The pickup patterns 559*a* and 559*b* are respectively produced for the odd-numbered and even-numbered component histograms (see FIGS. 106A and 106B).

As a result, when arranging pairs of component tapes into double cassettes, the restriction that only component tapes with the same feed pitch can be placed in the same double cassette is fulfilled and the lowest possible number of pickup patterns can be used (i.e., the frequency with which components can be picked up simultaneously is high).

3.9.24 Nozzle Interchanging Algorithm

As shown in FIG. 11, only certain types of nozzles can be used to pick up certain types of components. As a result, when picking up components, the line gang pickup head 112 needs to be equipped in advance with the right nozzles for picking up components from the present component tapes. This is performed by interchanging the nozzles on the line gang pickup head 112 at the nozzle station 119.

During optimization, therefore, it is necessary to arrange the component tapes so as to minimize the frequency with which nozzles are interchanged. An algorithm (the "nozzle interchanging algorithm") for doing this is described below.

Figures 107A, 107B:
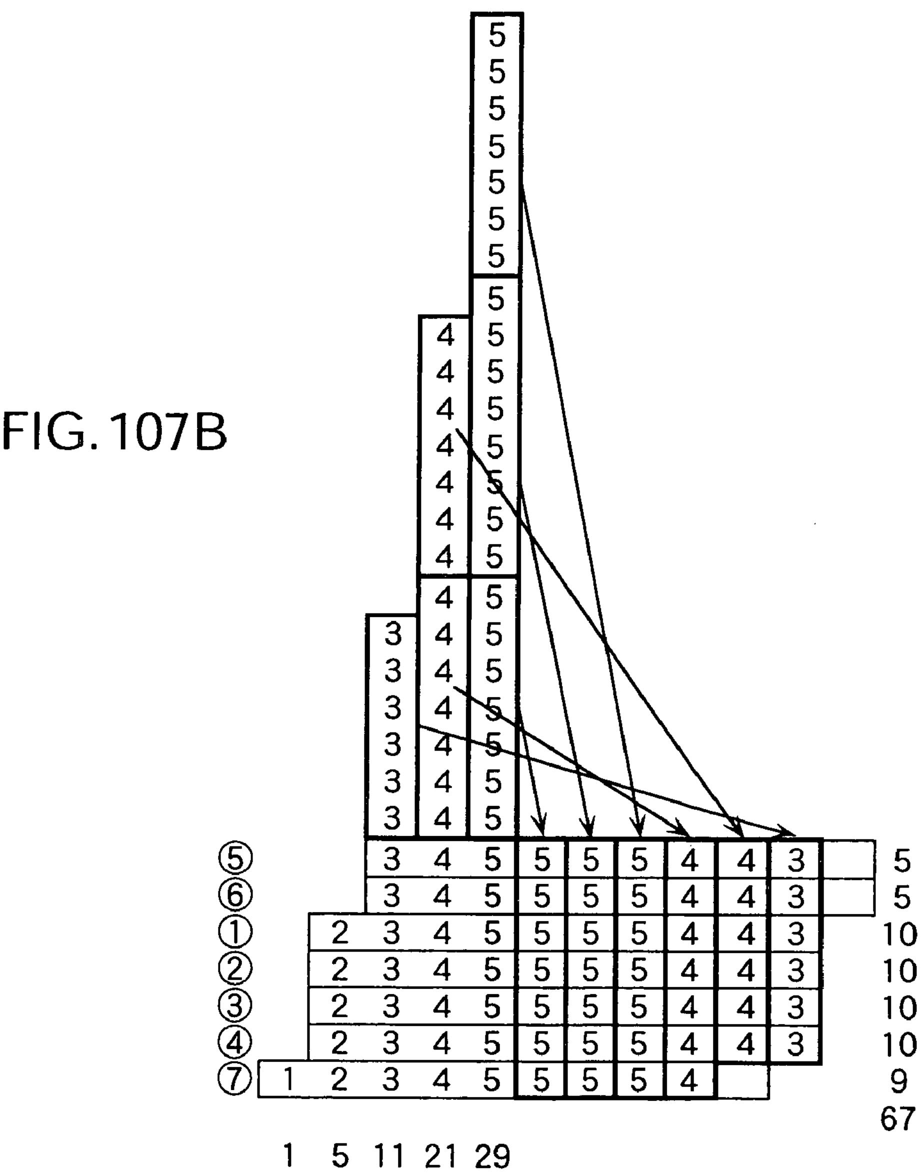
FIGS. 107A and 107B are used to explain the nozzle interchanging algorithm.

FIGS. 107A and 107B are used to explain the nozzle interchanging algorithm. FIG. 107A is a table showing the types of component to be mounted (the number of the nozzle that can be used) and the number of components to be mounted for each type. FIG. 107B is a component histogram showing the operation performed. In FIG. 107B, the numbers appended to the components in the component histogram are nozzle numbers, the arrows show how pickup patterns are produced by divided the components up, and the circled numbers show the pickup patterns. In this example, the tasks are produced using the cut down procedure. This is described in detail below.

(1) First, large components for which the generation of 10-component pickup patterns is not possible due to the "conditions for adjacent components" are excluded from the components being processed. Here, the "conditions for adjacent components" relate to the spatial clearance that needs to be maintained when the heads pick up, transport and mount components. This clearance is an amount of space that ensures that adjacent components do not come into contact during mounting.

(2) The mounting points are arranged in units of nozzles and in ascending order of the number of mounting points. In the illustrated example, the types of component to be mounted (the number of the nozzle that can be used) and the number of components to be mounted for each component type are shown in FIG. 107A, while the first five columns in FIG. 107B show the result of this ordering.

(3) A number of frames are produced in task units, based on the total number of components to be mounted. In the illustrated example, 67 components are to be mounted, so that 70 frames (equivalent to seven 10-component tasks) are produced.

(4) In order to produce tasks that use all ten nozzles, the mountain is cut down starting from the nozzle type with the most components to be mounted.

In more detail, the following rules are used.

The upper part of the mountain is divided in a suitable way for the production of 10-component tasks, starting with the component type with the most components to be mounted (in the illustrated example, component number 5). When doing so, it is necessary to respect similar restrictions to the restrictions on the maximum number of divisions for a component tape. These restrictions are based on the number of available nozzles, and ensure that the number of available nozzles is not exceeded during this dividing process.

(5) The resulting divisions are used to fill the frames. By doing so, the number of tasks kept to the lowest possible number of tasks.

(6) In the above procedure, optimization is performed with regard to the composition of the nozzles on the line gang pickup head 112, so that next it is necessary to review the arrangement of the nozzles and the order of the tasks, as well as the compositions to be used for large components.

In more detail, large components are handled by inserting them in between the task compositions described above.

(7) In the illustrated example, reconsidering the order of tasks results in only one interchanging of nozzles being required (between tasks (6) and (7).

3.10 Example Screen Displays

The following describes the user interface function of the optimization apparatus 300. This explanation focuses (1) on the example screen displays that the calculation control unit 301 displays, based on an optimization program stored in the optimization program storing unit 305, on the display unit 302 to allow the user to interact with the optimization apparatus 300 and (2) on the parameters obtained from the user via an input unit 303.

3.10.1 Main Screen

Figure 108:
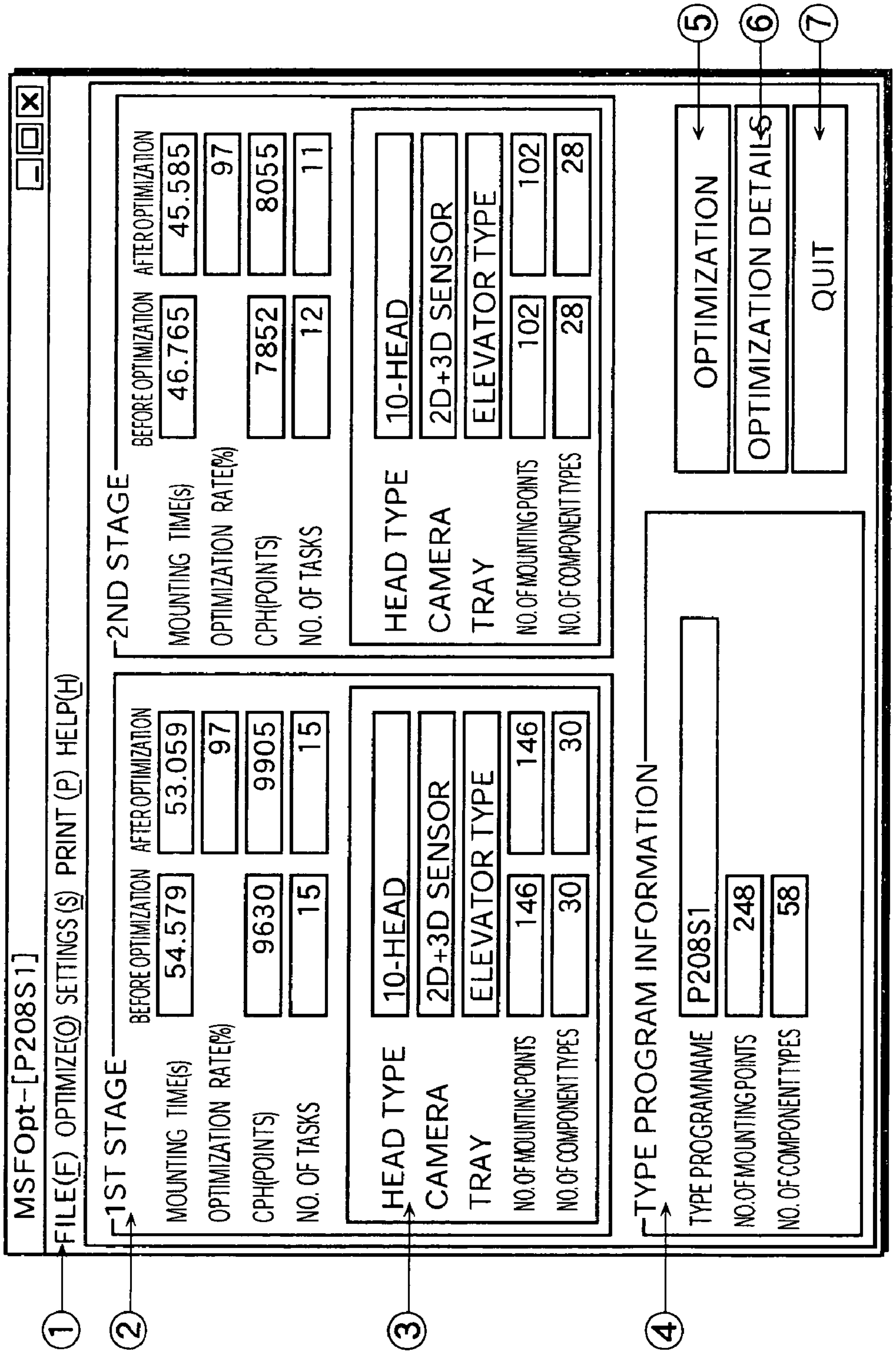
FIG. 108 shows an example display of the "main screen".

As shown in FIG. 108, this screen is used by the optimization apparatus 300 to display information on the state of optimization and the type program. The following describes the various display items (shown in square brackets) and the meanings (the process performed by the optimization apparatus 300) of the items (shown with asterisks) that can be selected from the pop-up menus that are displayed when these display items are selected.

(1) Menu

[File]

*Open

The optimization apparatus 300 obtains a user selection of a type program (here, defined to mean the mounting point data 307*a* etc., to be optimized) or a library (the component library 307*b*, etc.) and loads the selected type program. The result of this loading operation (the type program name, the number of mounting points, the component types, the equipment information, optimization information) is displayed in the main window.

*Save

When the user presses "yes" in response to a confirm save operation, the optimization apparatus 300 saves the optimized type program by overwriting the existing type program.

*Save as

The optimization apparatus 300 displays the "save as" screen, and saves the optimized program using a file name inputted by the user.

*Close

The optimization apparatus 300 closes the type program that is currently selected.

*Quit

The optimization apparatus 300 terminates the application.

[Optimize]

*Optimize

The optimization apparatus 300 optimizes the loaded type program information, executes a simulation for the optimization result, and display the result in the main window. This enables the user to make settings for the various resources and optimization conditions before optimization is performed.

*Stop

The optimization apparatus 300 stops the optimization.

*Optimization Details

The optimization apparatus 300 displays the "optimization details" screen.

[Settings]

This menu allows the user to make settings for the optimization resources and the optimization conditions.

Resources

*Set Number of Cassettes

The optimization apparatus 300 displays the "Set No. Of Cassettes" screen. This enables the user to input the number of cassettes that can be used by the present equipment.

*Set Component Division Number

The optimization apparatus 300 displays the "Set Component Division Numbers" screen. This enables the user to indicate the number of divisions that can be made when rearranging components for simultaneous pickup.

*Set Number of Nozzles

The optimization apparatus 300 displays the "Set No. Of Nozzles" screen. This enables the user to indicate the number of nozzles that can be used by the present equipment.

*Select Nozzle Station

The optimization apparatus 300 displays the "Select Nozzle Station" screen. This enables the user to input the plate ID of the nozzle station that can be used by the present equipment.

Optimization Conditions

*Set Options

The optimization apparatus 300 displays the "Options" screen. This enables the user to set the options of the present equipment and the optimization conditions.

*Z-Axis Information

The optimization apparatus 300 displays the "Z-Axis Information" screen. This screen shows the characteristics of the components arranged on the Z-axis.

*Nozzle Station Information

The optimization apparatus 300 displays the "Nozzle Station Information" screen. This shows information on the nozzle station of the present equipment.

[Print]

The optimization apparatus 300 prints the optimization information, resource information, etc., using a printer with which it is equipped.

*Optimization Details

The optimization apparatus 300 prints the optimization details.

*Z-Axis Information

The optimization apparatus 300 prints the Z-axis information.

*Nozzle Station Information

The optimization apparatus 300 prints the nozzle station information.

*No. of Cassettes Information

The optimization apparatus 300 prints the number of cassettes information.

*Component Division Number Information

The optimization apparatus 300 prints the component division number information.

*Number of Nozzles Information

The optimization apparatus 300 prints the number of nozzles information.

*Nozzle Station Selection Information

The optimization apparatus 300 prints the nozzle station selection information.

[Help]

The optimization apparatus 300 manages the version information for the screens and help screens.

*Help

The optimization apparatus 300 launches the help function.

*Version Information

The optimization apparatus 300 displays the version information.

(2) Optimization Information

The optimization apparatus 300 displays information for before and after optimization for each stage (in the illustrated example, the "1$^{st}$ stage" and the "2$^{nd}$ stage").

*Mounting Time (Seconds)

The optimization apparatus 300 displays the results of simulating the states before and after optimization.

*Optimization Rate %

The optimization apparatus 300 displays the mounting time of the states after optimization as a percentage of the mounting time of the states before optimization.

Equation used: (mounting time after optimization/mounting time before optimization)*100

*CPH (Points)

The optimization apparatus 300 displays the number of mounting points processed in one hour.

Equation used: (number of mounting points/mounting time)*3600(seconds)

*No. of Tasks

The optimization apparatus 300 displays the number of tasks.

(3) Equipment Information

The optimization apparatus 300 displays information on the equipment in each stage (in the illustrated example, the "1$^{st}$ stage" and the "2$^{nd}$ stage").

*Head Type

The optimization apparatus 300 displays the head types of the front and rear stages (both line gang pickup heads with 10 heads).

*Camera

The optimization apparatus 300 displays camera information for the front and rear stages (a 2D sensor, a 2D+3D sensor, etc.).

*Tray

The optimization apparatus 300 displays tray information for the front and rear stages (showing manual trays, elevator trays, etc.).

*No. of Mounting Points

The optimization apparatus 300 displays the number of mounting points for the front and rear stages in the type program.

*No. of Component Types

The optimization apparatus 300 displays the number of component types for the front and rear stages in the type program.

(4) Type Program Information

The optimization apparatus 300 displays information on the type program that is currently selected.

*Type Program Name

The optimization apparatus 300 displays the name of the type program that is currently selected.

*No. of Mounting Points

The optimization apparatus 300 displays the number of mounting points in the type program.

*No. of Component Types

The optimization apparatus 300 displays the number of component types in the type program.

(5) Optimization Button

The optimization apparatus 300 optimizes the type program information that has been loaded, performs a simulation for the result of the optimization, and displays the result in the main screen. However, before performing optimization, the various resources and optimization conditions need to be set.

(6) Optimization Details Button

The optimization apparatus 300 displays the optimization details screen.

(7) Quit Button

The optimization apparatus 300 quits the application.

3.10.2 Open Screen

Figure 109:
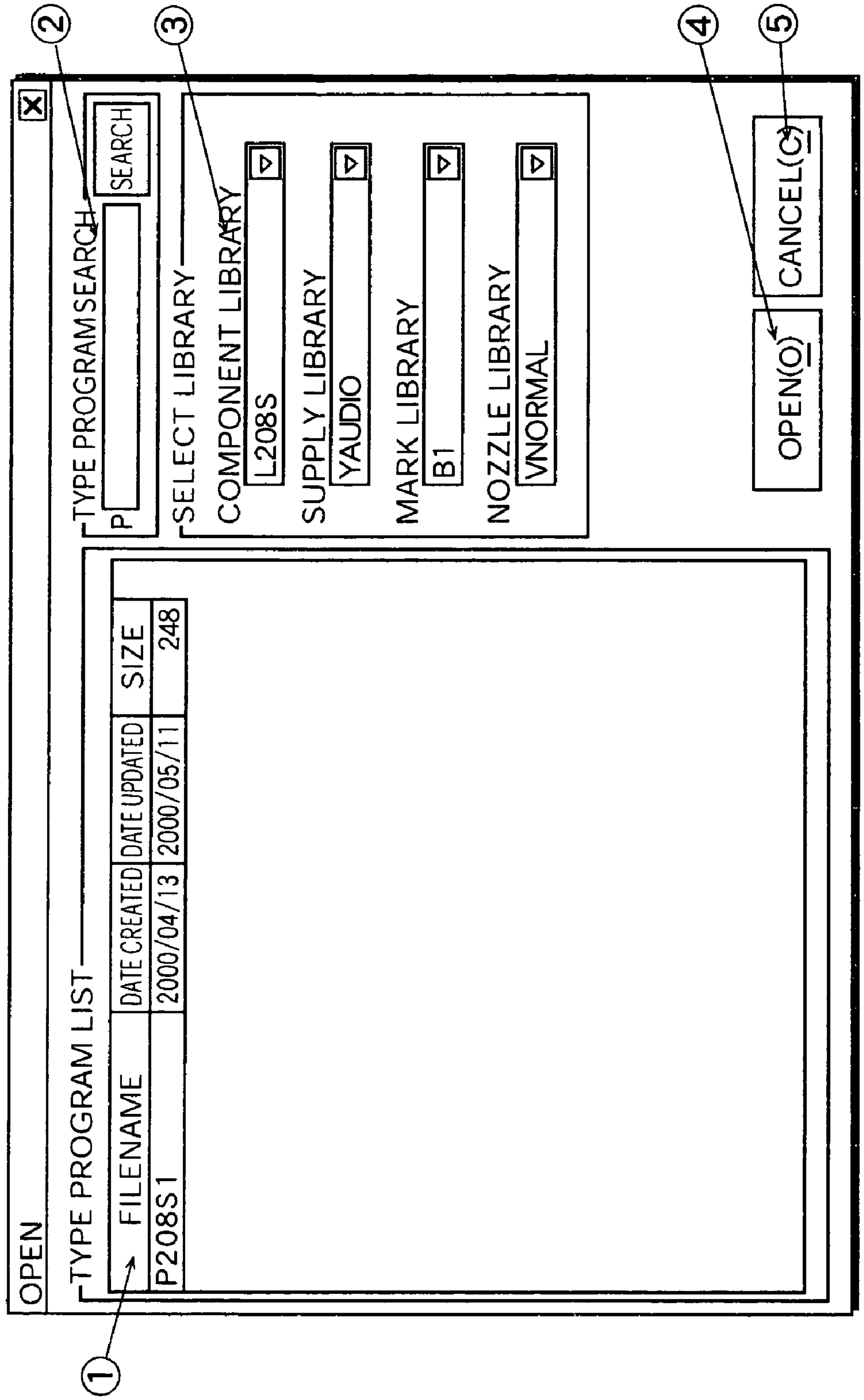
FIG. 109 shows an example display of the "open" screen.

As shown in FIG. 109, the optimization apparatus 300 uses this screen to allow the user to select a type program or various kinds of libraries and to have the optimization apparatus 300 open a type program.

(1) Type Program List

The optimization apparatus 300 displays a list of type programs (the filename, date created, date updated, and size of each type program is shown).

(2) Type Program Search

After the user has inputted a string corresponding to the name (minus the "P" at the start) of a type program and pressed the search button, the optimization apparatus 300 searches for a matching type program. It should be noted that the search attempts to match the inputted string against the first characters of the type program names, so that the user does not have to input the entire program name.

(3) Select Library

The optimization apparatus 300 displays the various libraries that have been registered.

*Component Library

The optimization apparatus 300 displays the names of the registered component libraries. Note that these names all start with the letter "L". These libraries correspond to the component library 307*b* shown in FIG. 9.

*Supply Library

The optimization apparatus 300 displays the names of the registered supply libraries. Note that these names all start with the letter "Y". These supply libraries are form part of the mounter information 307*c* shown in FIG. 9, and store information relating to the specifications of the part supplying units 115*a* and 115*b*, the component feeders, the tray supplying unit 117, and the trays.

*Mark Library

The optimization apparatus 300 displays the names of the registered mark libraries. Note that these names all start with the letter "B". These mark libraries form part of the mounter information 307*c* shown in FIG. 9, and store information relating to the shapes of recognition marks that are printed on substrates for use when aligning the line gang pickup head 112 relative to the substrates, for example.

*Nozzle Library

The optimization apparatus 300 displays the names of the registered nozzle libraries. Note that these names all start with the letter "V". These mark libraries form part of the mounter information 307*c* shown in FIG. 9, and store information relating to the shapes of the various nozzles, for example.

(4) Open Button

The optimization apparatus 300 opens the indicated type program using the selected libraries. It should be noted that when the user double clicks the type program list, the same processing is performed as when the open button is pressed.

(5) Cancel Button

The display returns to the main screen 3.10.3 Optimization Details Screen

Figure 110:
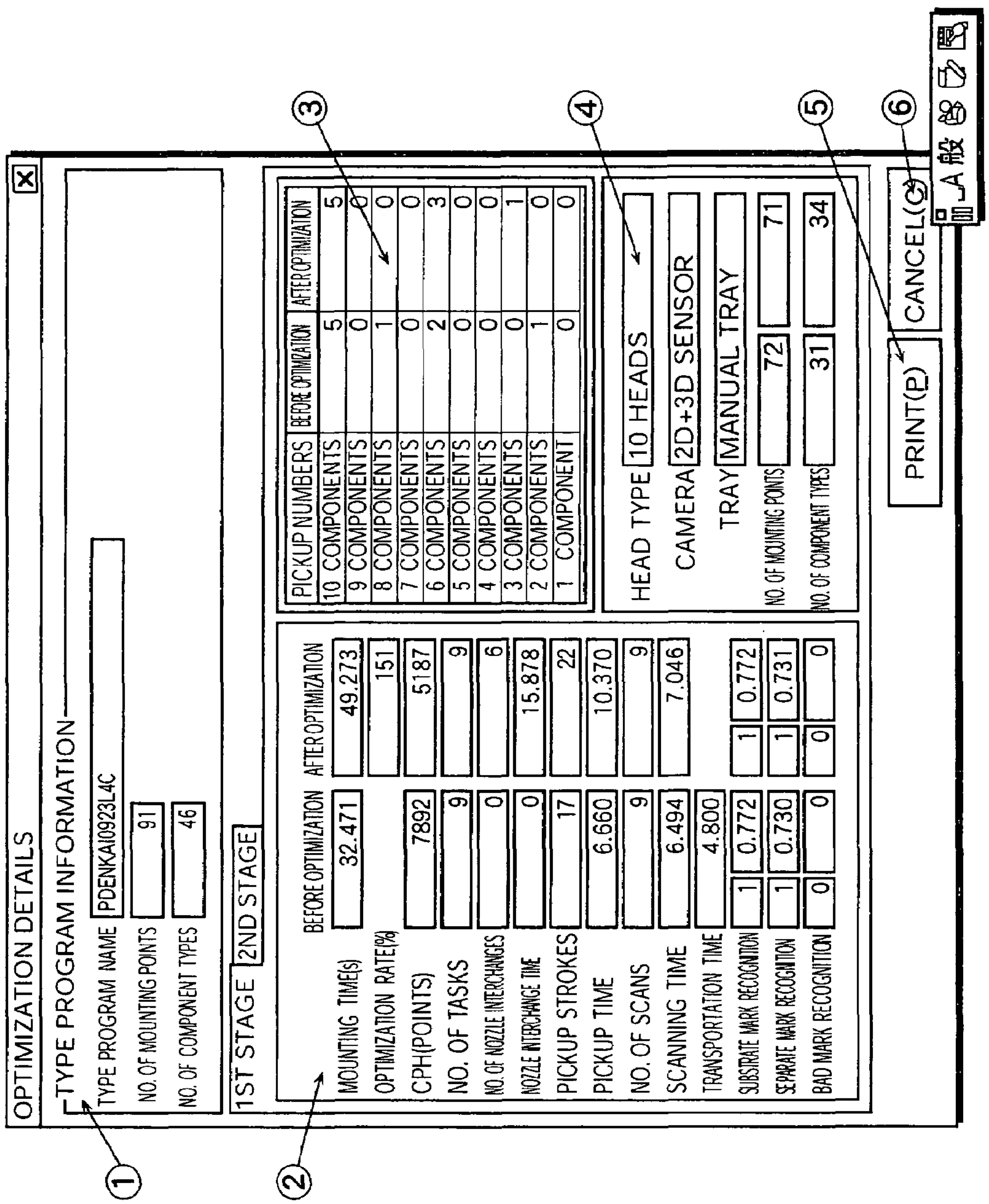
FIG. 110 shows an example display of the "optimization details" screen.

As shown in FIG. 110, the optimization apparatus 300 displays an optimization details for each stage (in the illustrated example, the "$1^{st}$ stage" and the "$2^{nd}$ stage").

(1) Type Program Information

The optimization apparatus 300 displays information for the type program currently selected.

*Type Program Name

The optimization apparatus 300 displays the name of the type program that is currently selected.

*No. of Mounting Points

The optimization apparatus 300 displays the number of mounting points in the type program.

*No. of Component Types

The optimization apparatus 300 displays the number of component types in the type program.

(2) Optimization Information

The optimization apparatus 300 displays information for before and after optimization for each stage (in the illustrated example, the "$1^{st}$ stage" and the "$2^{nd}$ stage").

*Mounting Time (Seconds)

The optimization apparatus 300 displays the results of simulating the states before and after optimization.

*Optimization Rate %

The optimization apparatus 300 displays the mounting time of the states after optimization as a percentage of the mounting time of the states before optimization.

Equation used: (mounting time after optimization/mounting time before optimization)*100

*CPH (Points)

The optimization apparatus 300 displays the number of mounting points processed in one hour.

Equation used: (number of mounting points/mounting time)*3600(seconds)

*No. of Tasks

The optimization apparatus 300 displays the number of tasks.

*No. of Nozzle Interchanges

The optimization apparatus 300 displays the number of nozzle interchanges performed.

*Nozzle Interchange Time

The optimization apparatus 300 displays the total time taken by nozzle interchanges.

*No. of Pickups

The optimization apparatus 300 displays the number of pickup operations performed.

*Pickup Time

The optimization apparatus 300 displays the total time taken by pickup operations.

*No. of Scans

The optimization apparatus 300 displays the number of scans.

*Scanning Time

The optimization apparatus 300 displays the total time taken by scans.

(3) Number of Pickups Information

The optimization apparatus 300 displays, for each stage (in the illustrated example, the "1$^{st}$ stage" and the "2$^{nd}$ stage"), the number of times 1 to 10 tasks are picked up before and after optimization.

(4) Equipment Information

The optimization apparatus 300 displays information on the equipment in each stage (in the illustrated example, the "1$^{st}$ stage" and the "2$^{nd}$ stage").

*Head Type

The optimization apparatus 300 displays the head types of the front and rear stages (both line gang pickup heads with 10 heads).

*Camera

The optimization apparatus 300 displays camera information for the front and rear stages (a 2D sensor, a 2D+3D sensor, etc.).

*Tray

The optimization apparatus 300 displays tray information for the front and rear stages (showing manual trays, elevator trays, etc.).

*No. of Mounting Points

The optimization apparatus 300 displays the number of mounting points for the front and rear stages in the type program.

*No. of Component Types

The optimization apparatus 300 displays the number of component types for the front and rear stages in the type program.

(5) Print Button

The optimization apparatus 300 prints the optimization details.

(6) Cancel Button

The optimization apparatus 300 ends the display of the optimization details screen and returns to the main screen.

3.10.4 Set No. of Cassettes Screen

Figure 111:
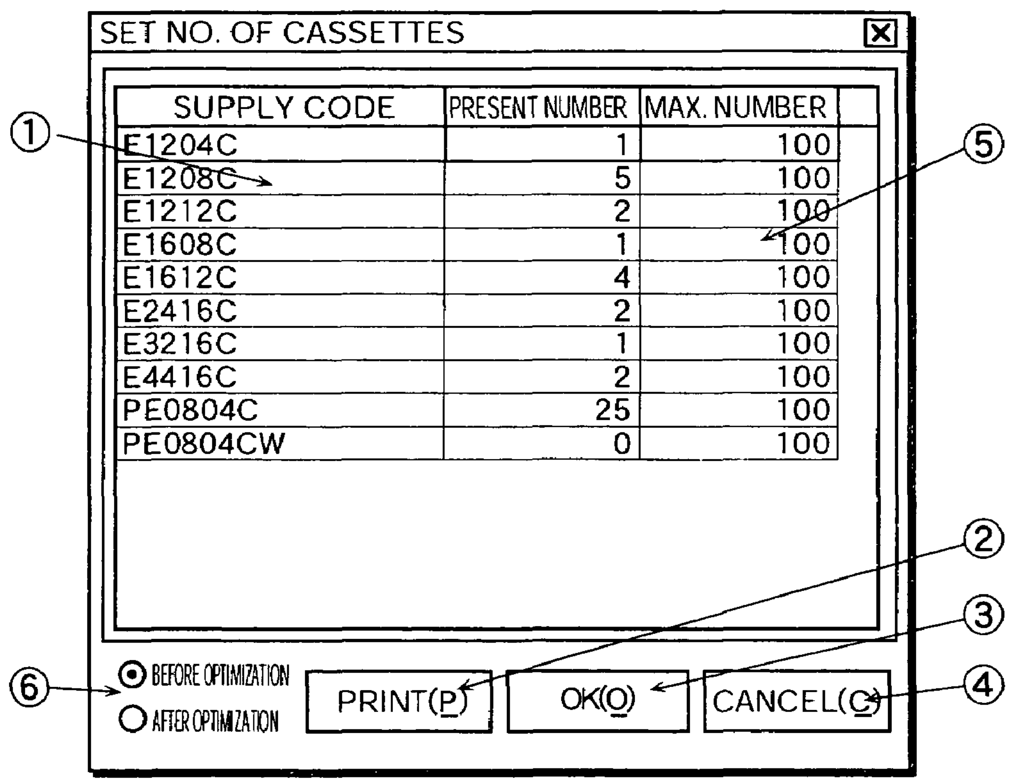
FIG. 111 shows an example display of the "set no. of cassettes" screen.

As shown in FIG. 111, the optimization apparatus 300 displays number of cassettes information and sets the maximum number of cassettes in accordance with user instructions.

(1) No. of Cassettes Information

The optimization apparatus 300 displays the number of cassettes information. In order to confirm the adjacency conditions for cassettes, the user sets the supply code for a component library.

*Supply Code

The optimization apparatus 300 displays the supply codes for cassettes.

| Example Meaning of Codes: | |
|---|---|
| 1$^{st}$ letter | Type (E = embossed P = Paper) |
| 2$^{nd}$ and 3$^{rd}$ letters | Cassette width (08 = 8 mm) |
| 4$^{th}$ and 5 letters | Feed pitch (04 = 4 mm) |
| 6$^{th}$ letter | Driving method (C = cylinder) |
| 7$^{th}$ letter | Cassette type (W = double cassette) |

*Present Number

The optimization apparatus 300 displays the number of cassettes that are currently used.

*Maximum Number

The optimization apparatus 300 displays the maximum number of cassettes that can be used for the present equipment.

(2) Print Button

The optimization apparatus 300 prints the number of cassettes information.

(3) OK Button

The optimization apparatus 300 stores the maximum number of cassettes that is presently displayed, and ends the display of the number of cassettes setting screen.

(4) Cancel Button

The optimization apparatus 300 ends the display of the set no. of cassettes screen, and returns to the main screen. However, the maximum number of cassettes is not stored.

(5) Maximum Number Input Area

After double clicking the maximum number area, the user can input the maximum number of cassettes.

3.10.5 Set Component Division Numbers Screen

Figure 112:
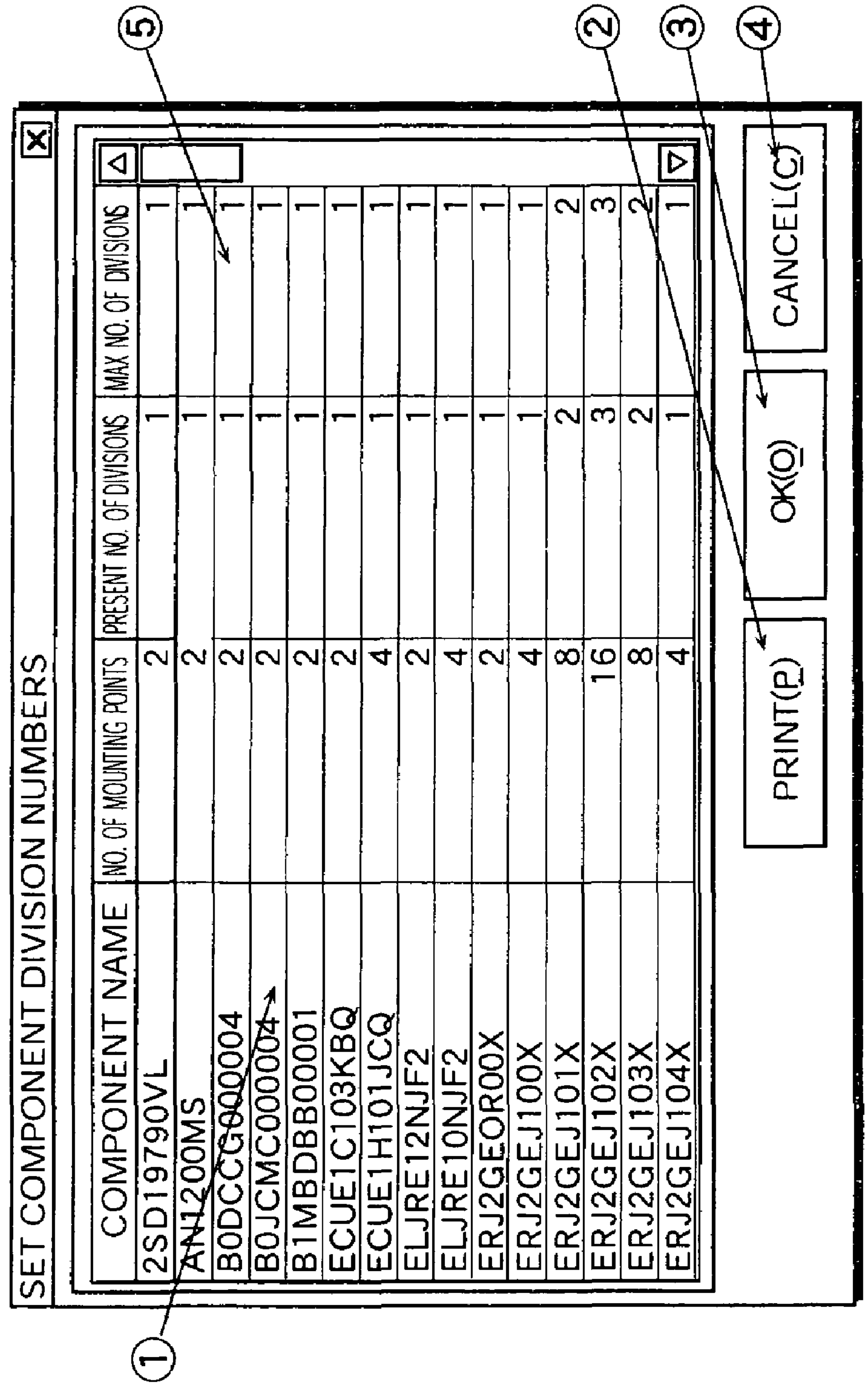
FIG. 112 shows an example display of the "set component division numbers" screen.

As shown in FIG. 112, in this screen the optimization apparatus 300 displays the component division information and sets the maximum number of divisions in accordance with user instructions.

(1) Component Division Number Information

The optimization apparatus 300 displays the component division number information.

*Component Name

The optimization apparatus 300 displays the names of the components used in the type program. To perform the component division efficiently, the user is allowed to input the component names in the type program.

*No. of Mounting Points

The optimization apparatus 300 displays the number of mounting points for each component.

*Present No. of Divisions

The optimization apparatus 300 displays the number of divisions for each component.

*Maximum No. of Divisions

The optimization apparatus 300 displays the maximum number of divisions for each component. It should be noted that when the application is launched, the present number of divisions is displayed as the default value for maximum number (2) Print Button The optimization apparatus 300 prints the component division numbers information.

(3) OK Button

The optimization apparatus 300 stores the maximum numbers of divisions that are presently displayed, and ends the display of the component division numbers setting screen.

(4) Cancel Button

The optimization apparatus 300 ends the display of the set component division numbers screen, and returns to the main screen. However, the maximum numbers of divisions are not stored.

(5) Maximum Division Number Input Area

After double clicking the maximum division number area, the user can input a maximum division number Note that the maximum division numbers are only valid while the application is running. When the application is launched again, the present number of divisions is displayed as the default for the maximum number of divisions.

Sort Display

When the user double clicks on a component name or the number of mounting points, the component names or numbers of mounting points are sorted (their display orders are changed).

3.10.6 Set No. of Nozzles Screen

Figure 113:
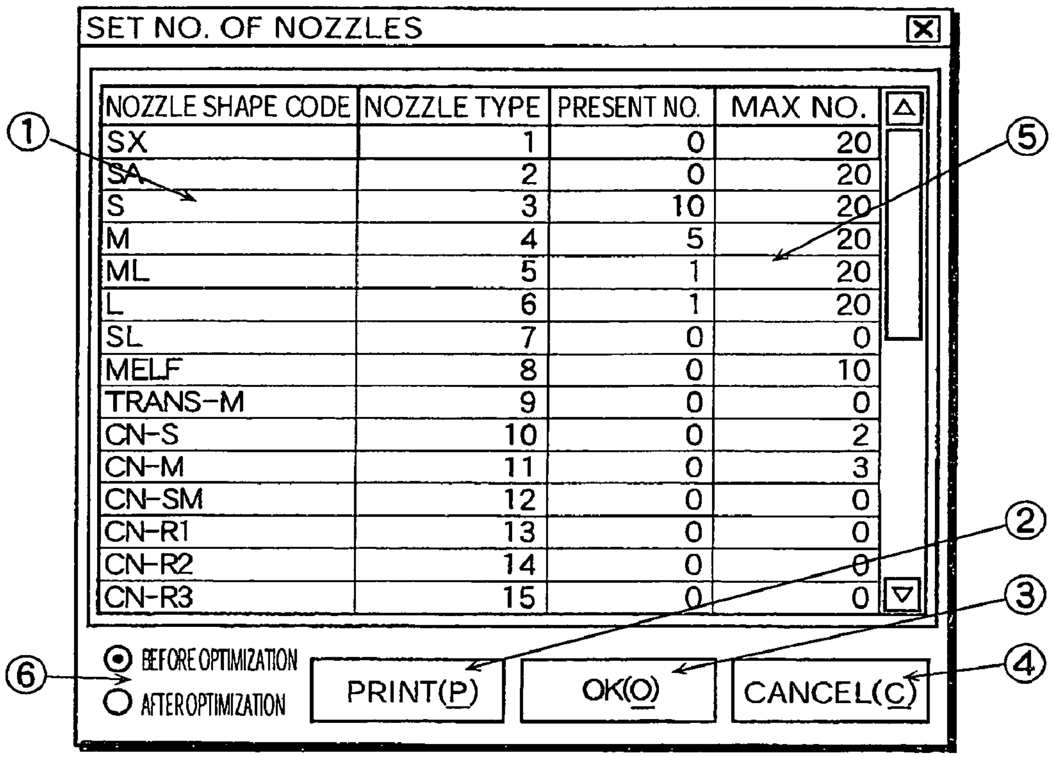
FIG. 113 shows an example display of the "set no. of nozzles" screen.

As shown in FIG. 113, in this screen the optimization apparatus 300 displays the number of nozzles information and sets the maximum number of nozzles in accordance with user instructions.

(1) Number of Nozzles Information

The optimization apparatus 300 displays the number of nozzles information.

*Nozzle Shape Code

The optimization apparatus 300 displays all of the nozzle shape codes in the nozzle library.

*Nozzle Type

The optimization apparatus 300 displays the nozzle library numbers (1 to 99).

*Present No.

The optimization apparatus 300 displays the present number of nozzles used.

*Maximum No.

The optimization apparatus 300 displays the maximum number of nozzles that can be used.

(2) Print Button

The optimization apparatus 300 prints the number of nozzles information.

(3) OK Button

The optimization apparatus 300 stores the maximum numbers of nozzles that are currently displayed and ends the display of the number of nozzles setting screen.

(4) Cancel Button

The optimization apparatus 300 ends the display of the set no. of nozzles screen, and returns to the main screen. However the maximum numbers of nozzles are not stored.

(5) Maximum Number Input Area

After double clicking the maximum number input area, the user can input a maximum number of nozzles.

3.10.7 Select Nozzle Station Screen

Figure 114:
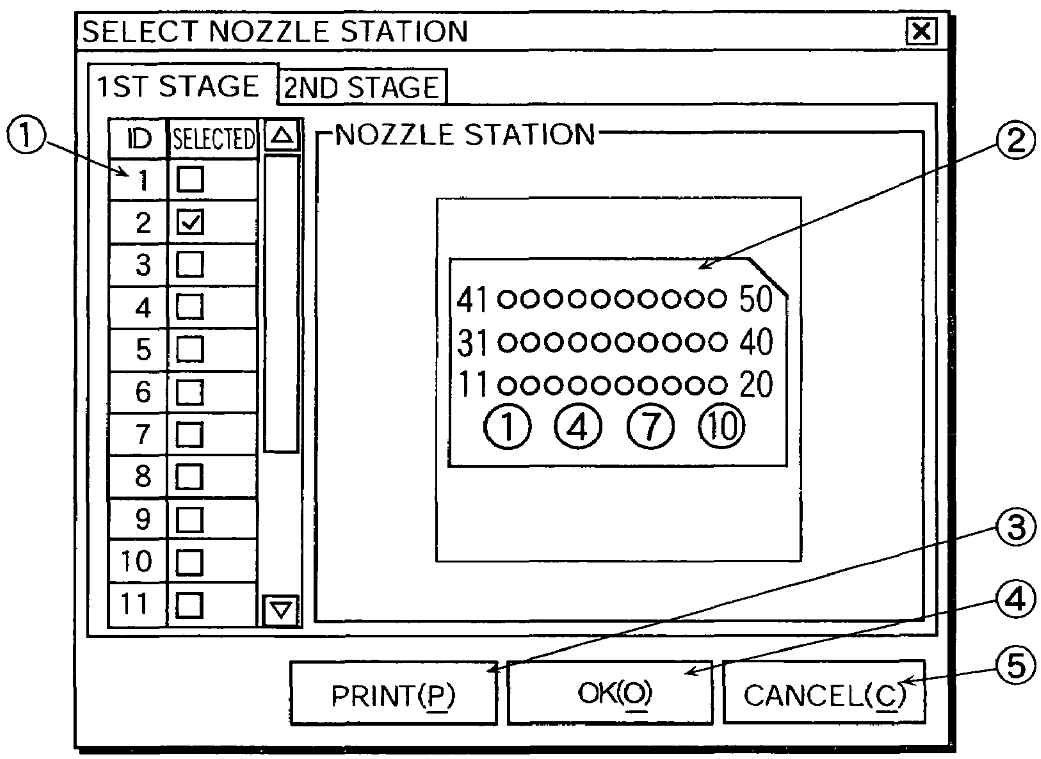
FIG. 114 shows an example display of the "select nozzle station" screen.

As shown in FIG. 114, in this screen the optimization apparatus 300 displays the nozzle station selection information and selects the nozzle station in accordance with user instructions.

(1) Nozzle Plate ID

The optimization apparatus 300 allows the user to set whether each nozzle plate ID is valid or invalid separately for each stage (in the illustrated example, the "$1^{st}$ stage" and the "$2^{nd}$ stage"). Any number of IDs that are not shown grayed out can be selected.

An image of a nozzle station is displayed for the nozzle station ID is currently indicated by the cursor. By moving the cursor, the user can have the display switch between images of different nozzle stations.

(2) Nozzle Station Image

The optimization apparatus 300 displays an image of a nozzle station whose ID is currently indicated by the cursor.

(3) Print Button

The optimization apparatus 300 prints the nozzle station selection information.

(4) OK Button

The optimization apparatus 300 stores the selected nozzle plate IDs and ends the display of the select nozzle station screen.

(5) Cancel Button

The optimization apparatus 300 ends the display of the select nozzle station screen and returns to the main screen. However, the nozzle plate IDs are not stored.

3.10.8 Options Screen

Figure 115:
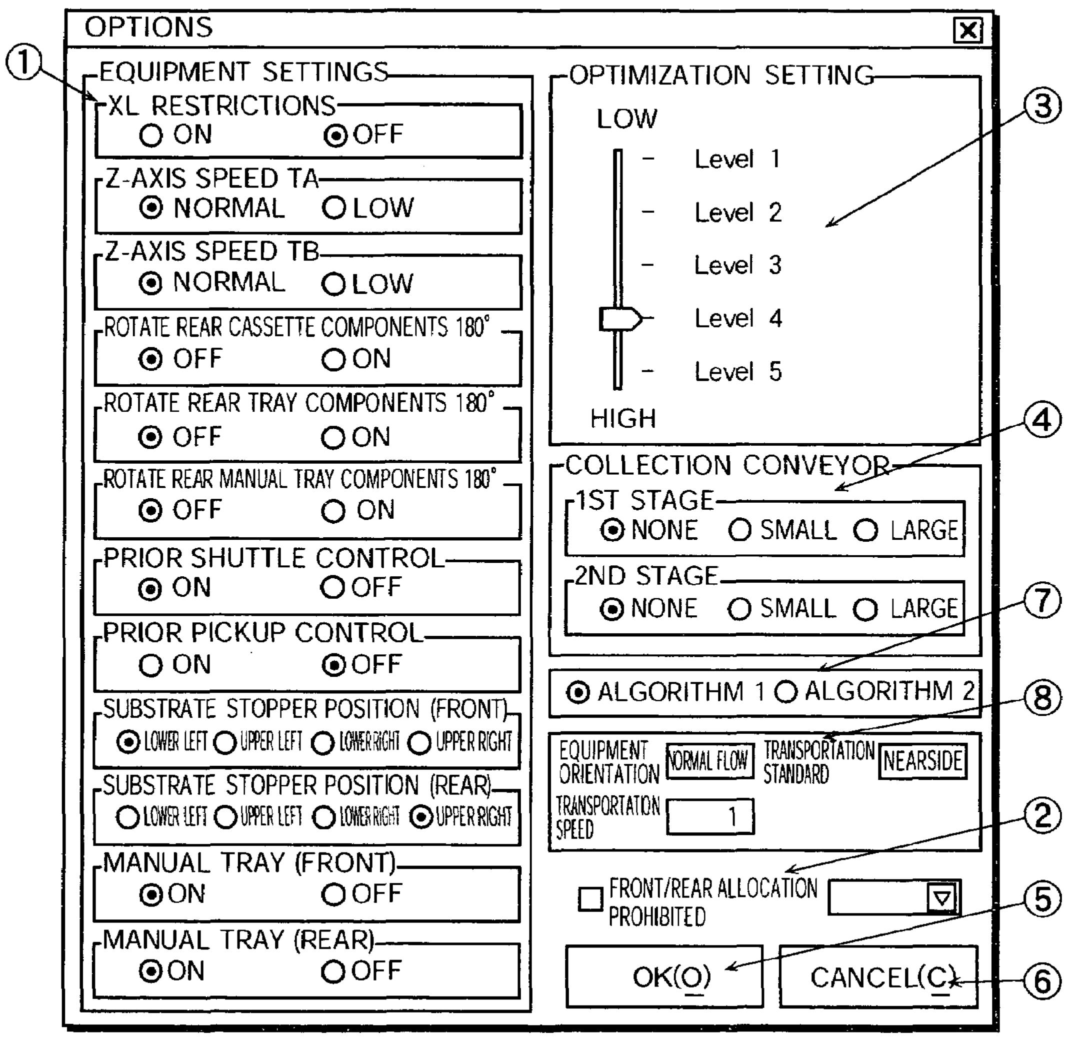
FIG. 115 shows an example display of the "options" screen.

As shown in FIG. 115, in this screen the optimization apparatus 300 displays the equipment options and selects optimization level in accordance with user instructions.

(1) Equipment Settings

The optimization apparatus 300 allows the user to set the equipment options.

XL Restrictions

The optimization apparatus 300 allows the user to set whether the XL restrictions are valid or invalid.

Z-Axis Speed TA

The optimization apparatus 300 allows the user to set the speed of the Z-axis TA ("normal" or "slow").

Z-Axis Speed TB

The optimization apparatus 300 allows the user to set the speed of the Z-axis TB ("normal" or "slow").

Rear Cassette Components 180° Rotation

The optimization apparatus 300 allows the user to set whether the rear cassette components are rotated by 180° ("valid" or "invalid").

Rear Tray Components 180° Rotation

The optimization apparatus 300 allows the user to set whether the rear tray components are rotated by 180° ("valid" or "invalid").

Rear Manual Tray 180° Rotation

The optimization apparatus 300 allows the user to set whether the latter manual trays are rotated by 180° ("valid" or "invalid").

Prior Shuttle Control

The optimization apparatus 300 allows the user to set whether forward shuttle control is used ("valid" or "invalid").

Prior Pickup Control

The optimization apparatus 300 allows the user to set whether forward pickup control is used ("valid" or "invalid").

Substrate Stopper Position (Front)

The optimization apparatus 300 allows the user to set the substrate stopper position for the front stage 110 ("lower left" "upper left", "lower right", or "upper right").

Substrate Stopper Position (Rear)

The optimization apparatus 300 allows the user to set the substrate stopper position for the rear stage 120 ("lower left", "upper left", "lower right" or "upper right").

Manual Tray (Front)

The optimization apparatus 300 allows the user to set whether a manual tray is used for the front stage 110 ("valid" or "invalid").

Manual Tray (Rear)

The optimization apparatus 300 allows the user to set whether a manual tray is used for the rear stage 120 ("valid" or "invalid").

(2) Front/Rear Allocation Prohibited

By checking this item, the user can prohibit a front/rear allocation.

Front

The optimization apparatus 300 performs optimization for the front stage 110 only.

Rear

The optimization apparatus 300 performs optimization for the rear stage 120 only.

Both

The optimization apparatus 300 performs optimization for the front stage 110 and the rear stage 120. When front/rear assigning is prohibited, the user can set of the F/R allocations using the Z-Axis Information screen.

(3) Optimization Level Setting

The optimization apparatus 300 allows the user to set the execution level for the optimization in a range of 1 to 5 (representing "simple" to "complex"). The default level is 4.

(4) Collection Conveyor Settings

The optimization apparatus 300 allows the user to make the collection conveyor settings for the first and second stages.

No setting: None

Collection conveyor (small): Small

Collection conveyor (large): Large (5) OK Button

The optimization apparatus 300 stores the options (equipment options, optimization level, front/rear allocation prohibited, collection conveyor) that are presently set, and ends the display of the options screen.

(6) Cancel Button

The optimization apparatus 300 ends the display of the options screen and returns to the main screen. However, the equipment options, optimization level, front/rear assigning, and collection compare are not stored.

(7) Algorithm Setting

The optimization apparatus 300 allows the user to set the optimization algorithm ("1" or "2").

Algorithm 1

Optimization is performed using an algorithm for small components.

Algorithm 2

Small components are optimized using an algorithm for general components.

(8) Equipment Information

The optimization apparatus 300 displays the equipment information

Equipment Orientation

The optimization apparatus 300 displays the equipment orientation ("normal flow" or "reverse flow").

Transportation Standard

The optimization apparatus 300 displays the transportation standard ("nearside" or "deep").

Transportation Speed

The optimization apparatus 300 displays the transportation speed.

3.10.9 Z-Axis Information Screen

Figure 116:
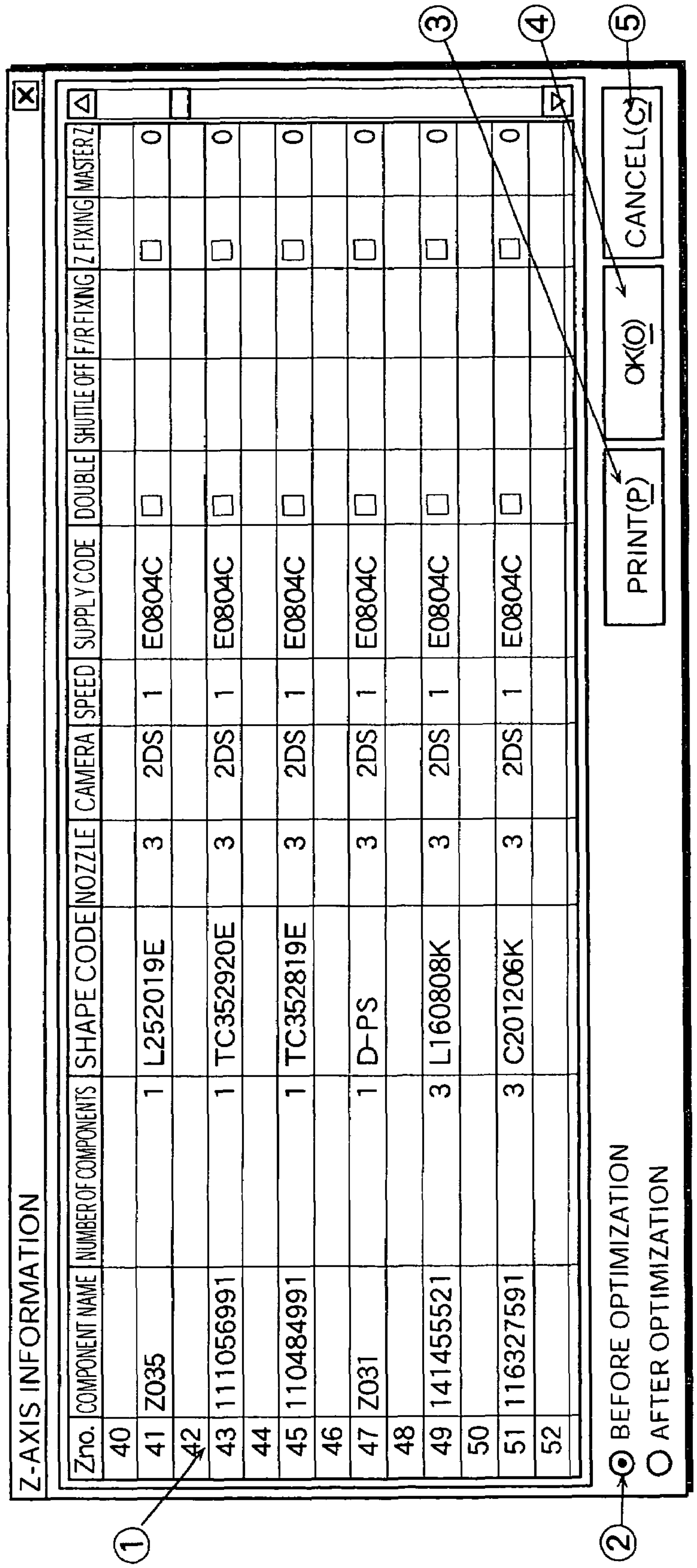
FIG. 116 shows an example display of the "Z-axis information" screen.

As shown in FIG. 116, in this screen the optimization apparatus 300 displays, in accordance with user instructions, information on components that are set on the Z-axis.

(1) Z-Axis Information

The optimization apparatus 300 displays the Z-axis information.

*Component Name

The optimization apparatus 300 displays the component names of the components that are set at different Z numbers.

*Number Of Components

The optimization apparatus 300 displays the number of components (mounting points) that are set at different Z numbers.

*Shape Code

The optimization apparatus 300 displays shape codes for the components that set at different Z numbers.

*Nozzle

The optimization apparatus 300 displays the used nozzle numbers (the same numbers as the nozzle types shown in the number of nozzles setting screen) for the components set at different Z numbers.

*Camera

The optimization apparatus 300 shows which component recognizing camera (2DS, 2DL, 3DS, 3DL) is used for the components set at different Z numbers.

*Speed

The optimization apparatus 300 displays the head speed XY (a value in the range 1 to 8) for the components set at different Z numbers.

*Supply Code

The optimization apparatus 300 displays the supply codes for the components set at different Z numbers.

*Double

The user needs to specify whether each component type is to placed into single (S) or double (W) cassettes.

*Shuttle Off

When shuttle supplying of tray components is not possible for a component set at a Z number, the user can set "not possible" (=not performed) for that component. It should be noted that a check box is not displayed for tray components for which shuttle supplying is not possible.

*F/R Fixing

The optimization apparatus 300 allows the user to set whether it is prohibited for the optimization to move components set at different Z numbers between the front and rear stage. It should be noted that that this setting can be made only when the assigning prohibited checkbox in the option setting screen is checked.

When no data displayed corresponding to a Z number, this indicates that no component has been set at that Z number.

(2) Switch Between Pre- and Post-Optimization States

The optimization apparatus 300 switches between the Z-axis information before optimization and the Z-axis information after optimization. However, when optimization has not be performed, Z-axis information after optimization cannot be displayed.

(3) Print Button

The optimization apparatus 300 prints the Z-axis information.

(4) OK Button

The optimization apparatus 300 stores the Z-axis information (Double indication, shuttle off), and ends the display of the Z-axis information screen. However, when the Z-axis information cannot be edited after optimization, the OK button is displayed grayed-out.

(5) Cancel Button

The optimization apparatus 300 ends the display of the Z-axis information screen and returns to the main screen. However, the Z-axis information is not stored.

3.10.10 Nozzle Station Information Screen

Figure 117:
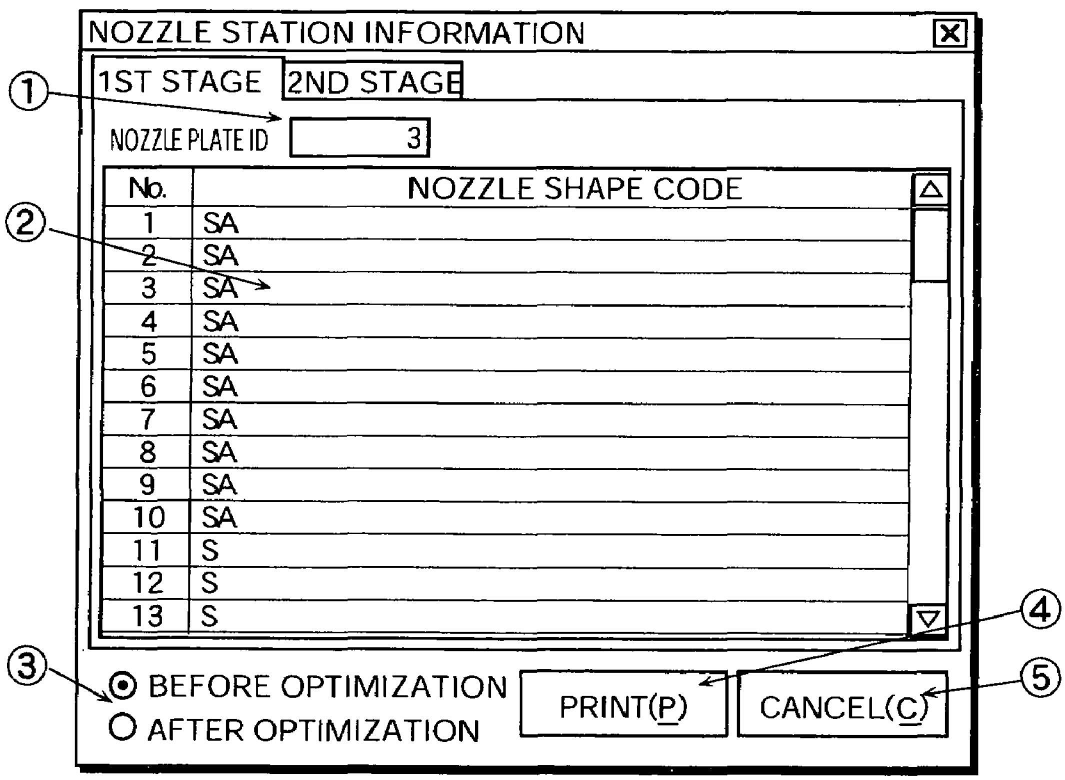
FIG. 117 shows an example display of the "nozzle station information" screen.

As shown in FIG. 117, in this screen the optimization apparatus 300 displays, in accordance with user instructions, the nozzle station information for the present equipment.

(1) Nozzle Plate ID

The optimization apparatus 300 displays the nozzle plate ID for each stage (in the illustrated example, the "1$^{st}$ stage" and the "2$^{nd}$ stage").

(2) Nozzle Station Information

The optimization apparatus 300 displays the nozzle station information.

*Number

The optimization apparatus 300 displays the station number.

*Nozzle Shape Code

The optimization apparatus 300 displays nozzle shape codes for the nozzles on the nozzle station.

(3) Switch Between Pre- and Post-Optimization States

The optimization apparatus 300 switches between the nozzle station information before optimization and the nozzle station information after optimization. However, when optimization has not be performed, Z-axis information after optimization cannot be displayed.

(4) Print Button

The optimization apparatus 300 prints the nozzle station information.

(5) Cancel Button

The optimization apparatus 300 ends the display of the nozzle station information screen and returns to the main screen.

4 Operation of the Optimization Apparatus (Application)

The following describes the operation of the optimization apparatus 300 in applied use. In other words, the following describes the improvements made to the optimization algorithm described above, and an expansion of its functioning.

4.1 Optimization of Small Components 4.1.1 Optimization of the Z-Axis Arrangement Without Dividing Components The pickup patterns 504 shown FIG. 42 are optimized pickup patterns that maximize productivity, though this depends on the condition that component tapes are divided and placed in several cassettes. As one example, 5 component tapes (the five columns of black squares in FIG. 42) have to be provided for component number 1. This increases the number of supplies that are used, and in some cases cannot be tolerated by users. When the user only wants to use one component tape for each type of component, the illustrated pickup patterns cannot be used.

Due to the above situation, an algorithm that determines pickup patterns when component division is not possible needs to be used. Such algorithm is described below.

Figure 118:
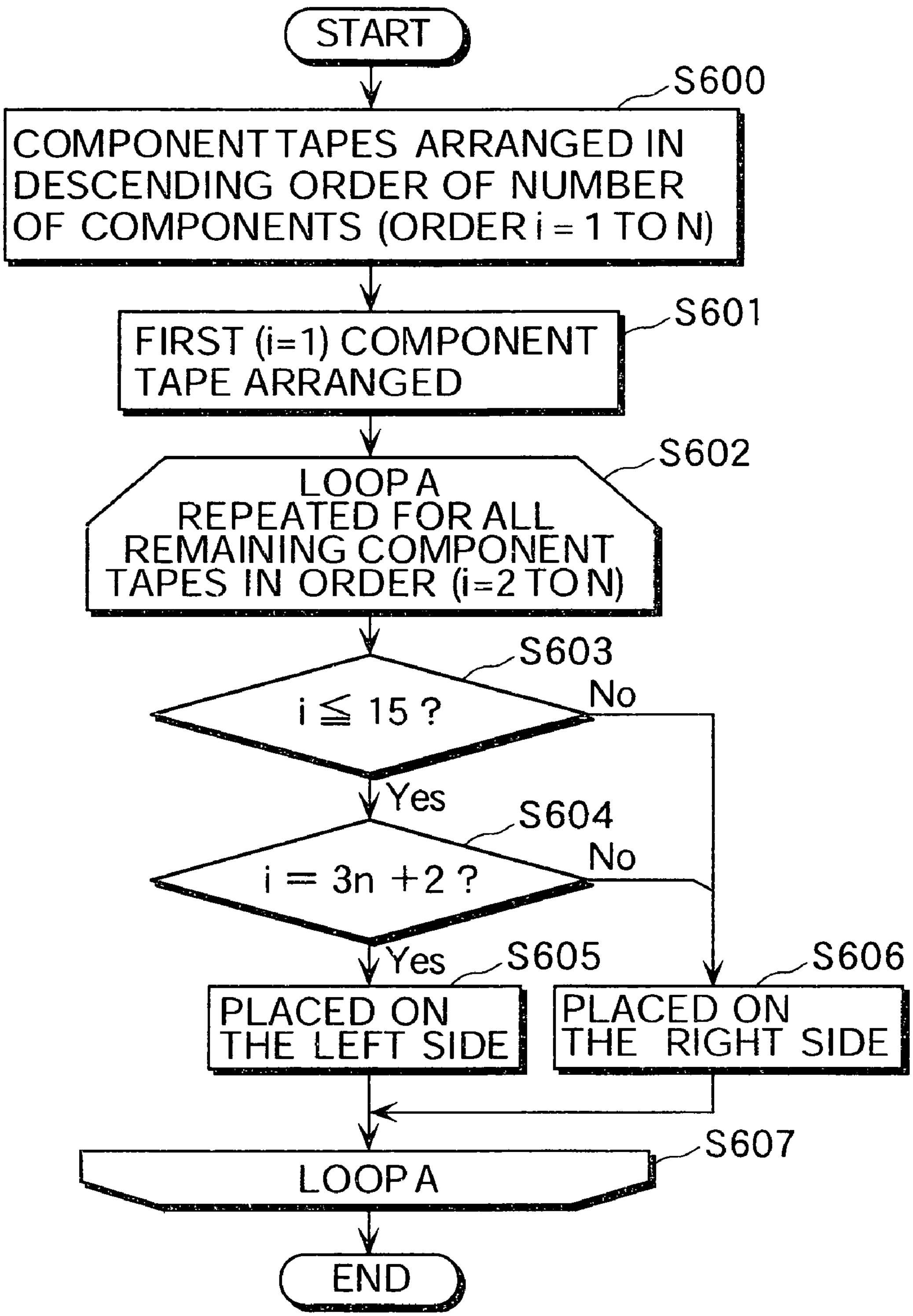
FIG. 118 is a flowchart showing the procedure of the algorithm that determines efficient pickup patterns (a Z-axis arrangement) without dividing components.

FIG. 118 is an flowchart showing the procedure used by an algorithm that determines efficient pickup patterns (a Z-axis arrangement) without dividing components.

First, all of the component tapes are arranged in descending order of the number of components to be mounted, and the numbers i (i=1 to N) are assigned starting with the component tapes with the highest number of components to be mounted (S600). After this, the component tapes are taken in this descending order and rearranged as described below (S601 to S607).

First, the component tape for component number 1 is taken and placed on the Z-axis (S601). Next, processing where the component tapes for component numbers 2 onwards (i=2 to N) are taken one after the other and placed on the Z-axis at either the right or left side of the component tape 1 is repeated (S602 to S607). In other words, the component tapes for the components 2 to 15 (S605:Yes) are arranged (S604 to S606) on the Z-axis in the order right side, left side, right side . . . Component tapes for components 16 onwards (S605:Yes) are arranged (S605:No) on the Z-axis on the right side of component tape 1.

This reordering produces the preferred arranged for the Z-axis, which is to say, pickup patterns with a low number of nozzle strokes.

Figure 119:
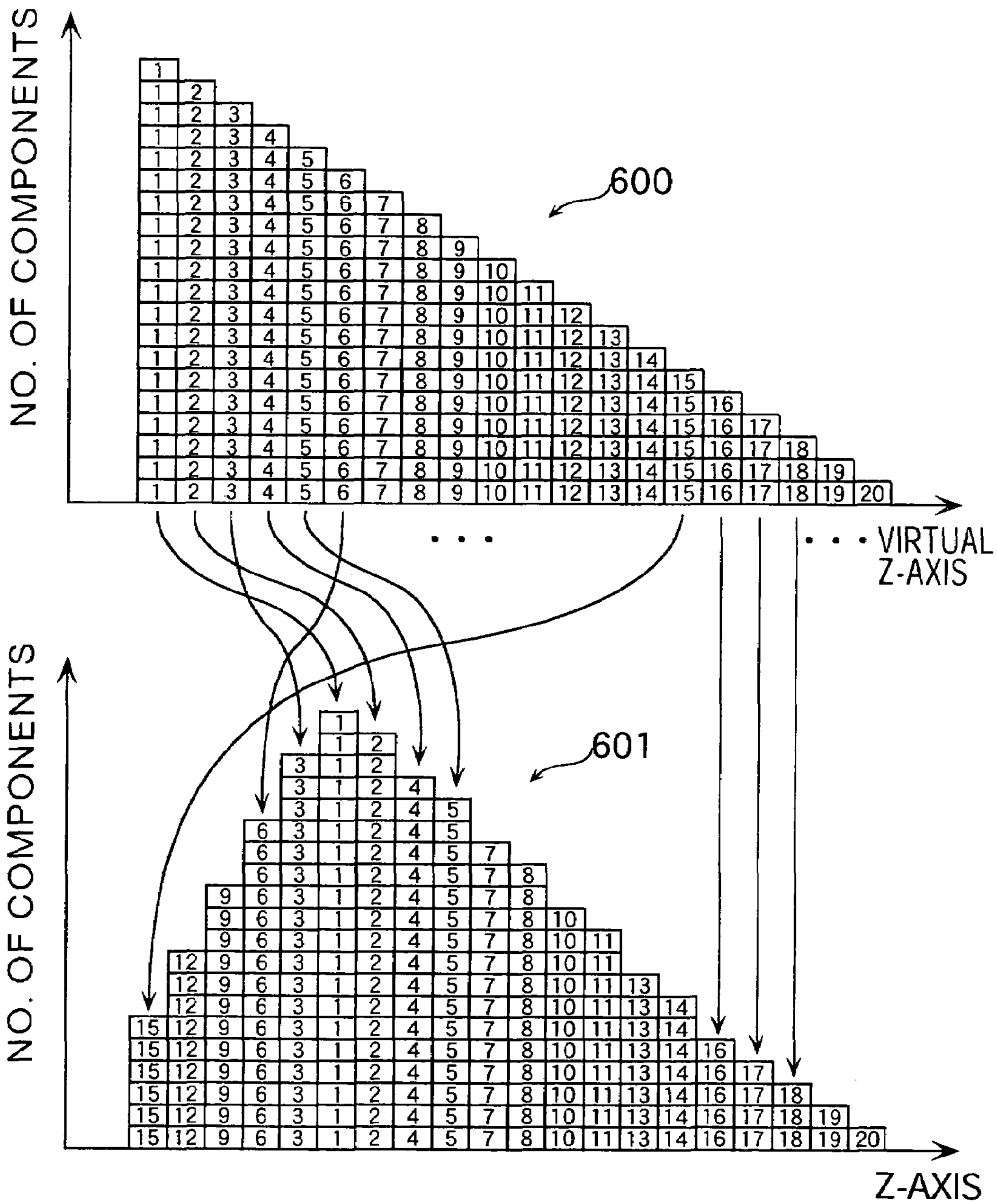
FIG. 119 shows an arrangement of component tapes that illustrates the procedure shown by the flowchart in FIG. 118.

FIG. 119 show an arrangement of component tapes that is used to explain the processing performed by the flowchart shown in FIG. 18. In more detail, the upper diagram shows an arrangement 600 of component tapes after the component tapes have been arranged in descending order of the number of components to be mounted, and the lower diagram shows the arrangement 601 produced by taking the component tapes from the arrangement 600 in this descending order and rearranging them on the Z-axis. Component tapes for component numbers 2 to 15 are arranged in the order right side, left side, right side, left side . . . , and the component tapes for component numbers 16 onwards are arranged on the right side.

Figure 120:
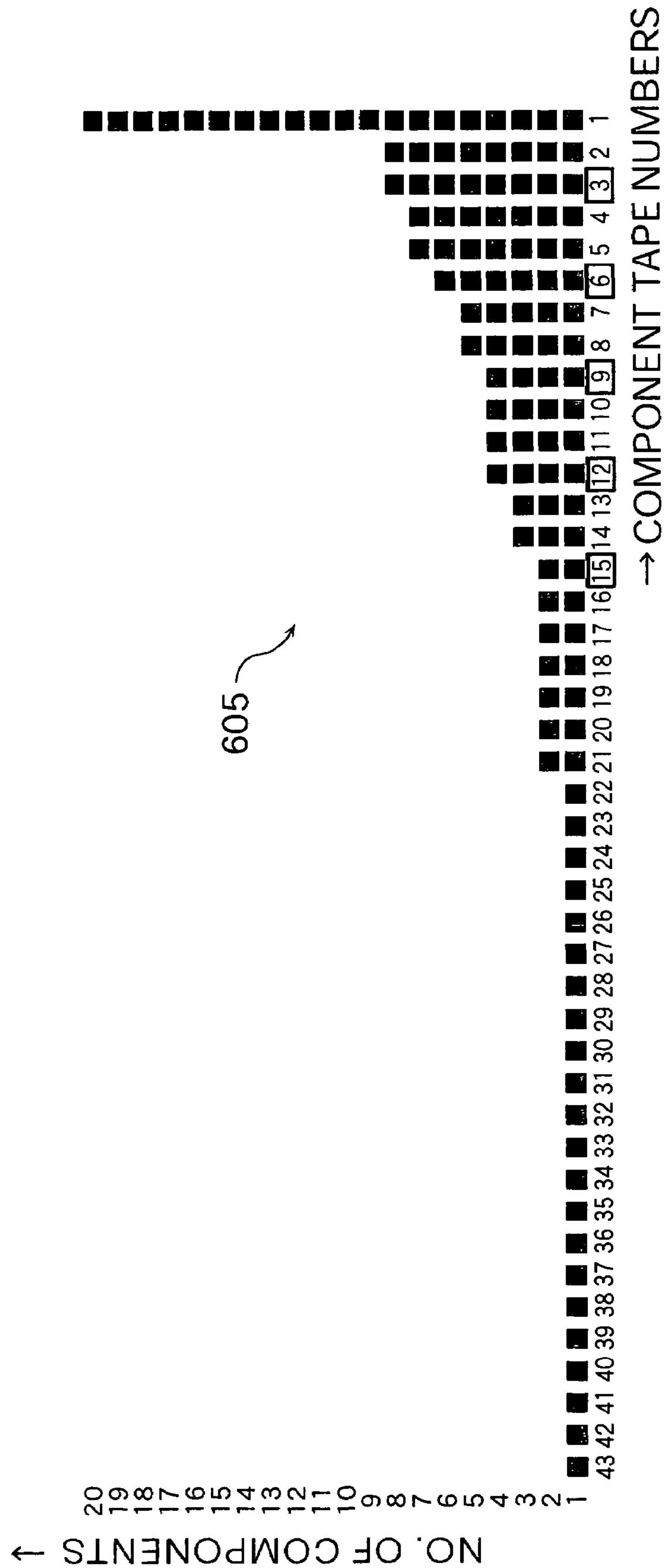
Figure 121:
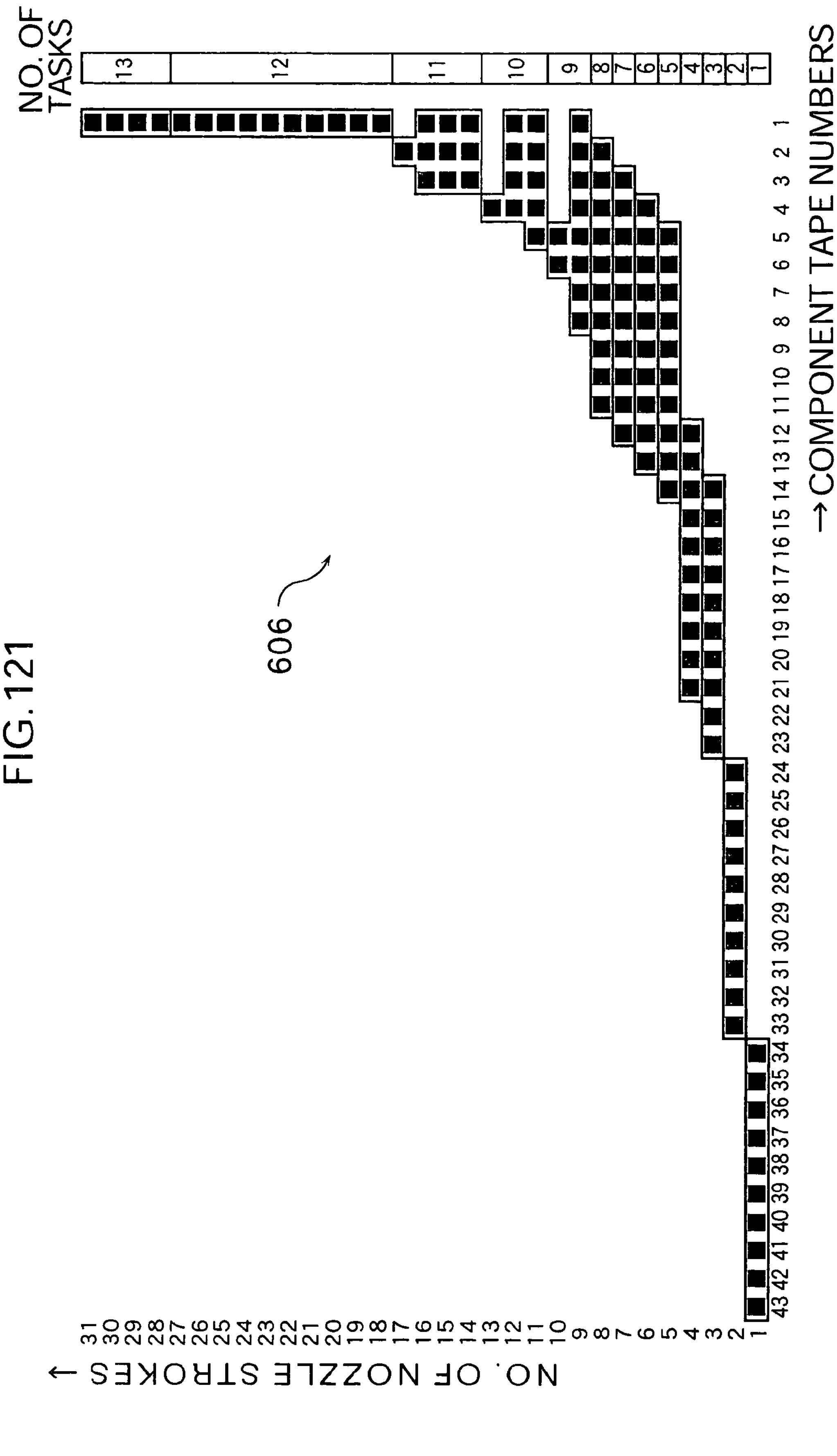
Figure 122:
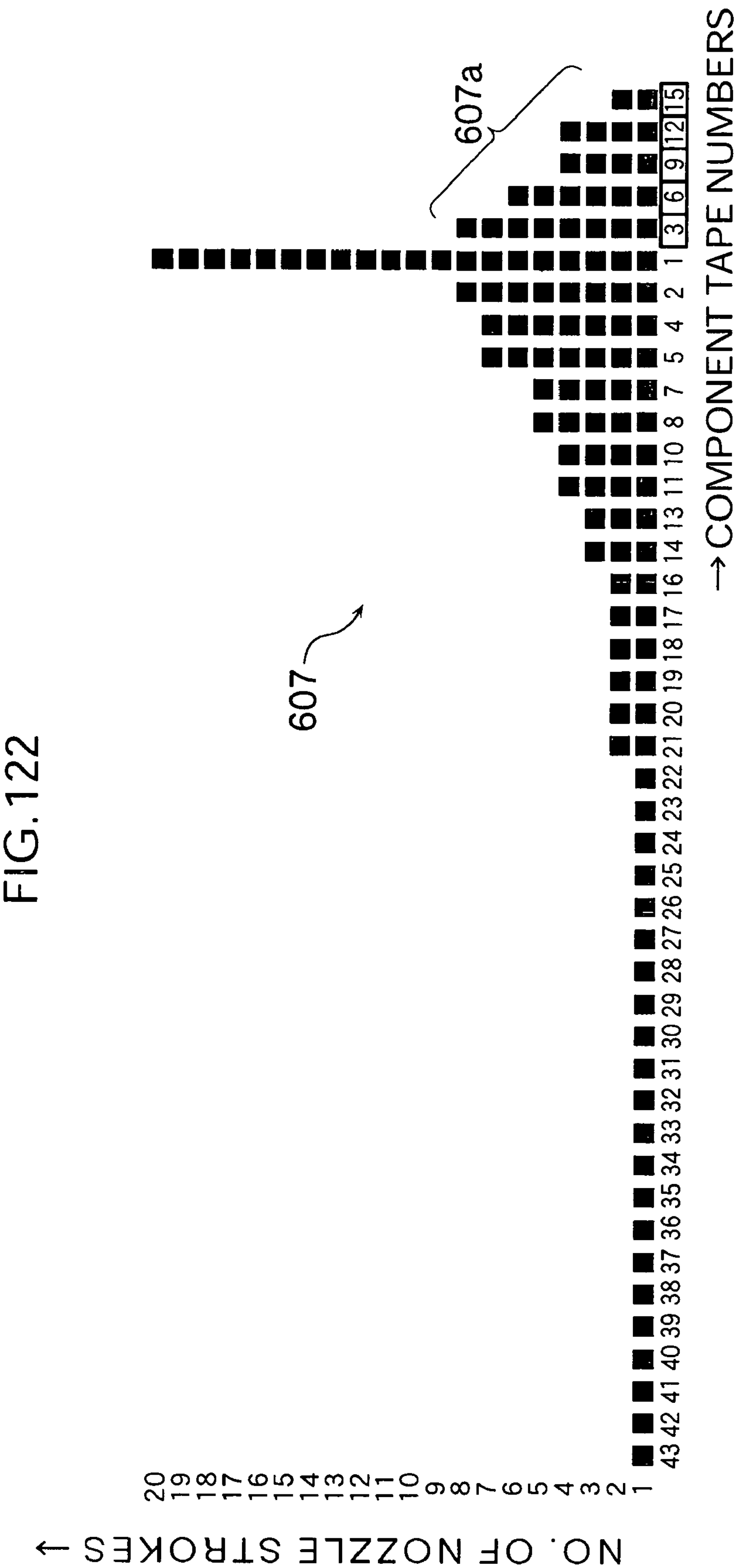
Figure 123:

FIGS. 120 to 123 are used to explain the optimization level of this optimization algorithm. FIG. 120 is a component histogram 605 in which the component tapes have been arranged simply in descending order (from right to left) of the number of components to be mounted. FIG. 121, meanwhile, shows nozzle stroke number patterns 606 produced when the component histogram 605 is subjected to the cut down process. FIG. 122 shows a component histogram 607 produced by rearranging the component histogram 605 in accordance with the procedure shown in FIG. 118. Finally, FIG. 123 shows the nozzle stroke number patterns 608 produced when the component histogram 607 is subjected to the cut down process.

It should be noted that in FIGS. 121 and 123, the horizontal axis represents the arrangement of component tapes (on a virtual or real Z-axis), the vertical axis on the left side represents the number of nozzle strokes, and the vertical axis on the right side represents the number of tasks. In these drawings, each set of components shown in a rectangular frame represents a task (a set of components that are simultaneously picked up).

As can be understood by comparing the nozzle stroke number patterns shown in FIGS. 121 and 123, the reordering performed by the present optimization algorithm does not change the number of tasks (constant at 13), but the number of nozzle strokes is reduced from 31 to 25. This is due to the procedure shown in FIG. 118 rearranging the component tapes, resulting in components (the component tapes for component numbers 3, 6, 9, 12, and 15) of the component histogram 605 shown in FIG. 120 being moved to positions in the component histogram 607*a* shown in FIG. 122.

The component histogram 607 shown in FIG. 122 is in the form of a mountain where the gradient differs on the two sides (one side is steeper than the other). The form is close to the ideal form (as one example, the histogram produced when the component histogram 504 shown in FIG. 42 is rearranged by moving all of the mounting points downwards) left after optimization has been performed using the core crush processing. As a result, the arrangement of component tapes produced by the present optimization algorithm can be said to have a higher optimization level than the component histogram 605 shown in FIG. 120.

4.1.2 Optimization Through Assigning to the Left And Right Blocks

In the initial assigning process, component tapes are first assigned to the front stage 110 and the rear stage 120. After this, for each of the stages, component tapes are assigned to the left block 115*a* or the right block 115*b* of the component supplying units, based on the component groups to which the component tapes belong.

At this point, the procedure described thusfar arranges component cassettes, for the component tapes assigned to the left block 115*a* or the right block 115*b*, in one of the blocks with no gaps. As a result, component tapes are not divided, even though there may be free space available in other blocks. In some cases, there is the undesirable result of no core crush processing being performed for the component histogram. This increases the number of nozzle strokes, and so increases the tact time.

Consider the following example. Component cassettes are arranged with no gaps in the right block 115*b* regardless of whether there is enough free space in the left block 115*a*, resulting in none of the component tapes in the right block 115*b* being divided. This is especially likely for the case where there is a component histogram that has many component tapes in both the left block 115*a* and the right block 115*b*.

In this situation, the optimization apparatus 300 searches for the mountain with the lowest priority out of the mountains that have been assigned to the block with no free space, and assigns the component cassettes in this mountain to the other block. This creates a new space in the original block, so that core crush process can now be performed for the mountains in this block.

Figure 124:
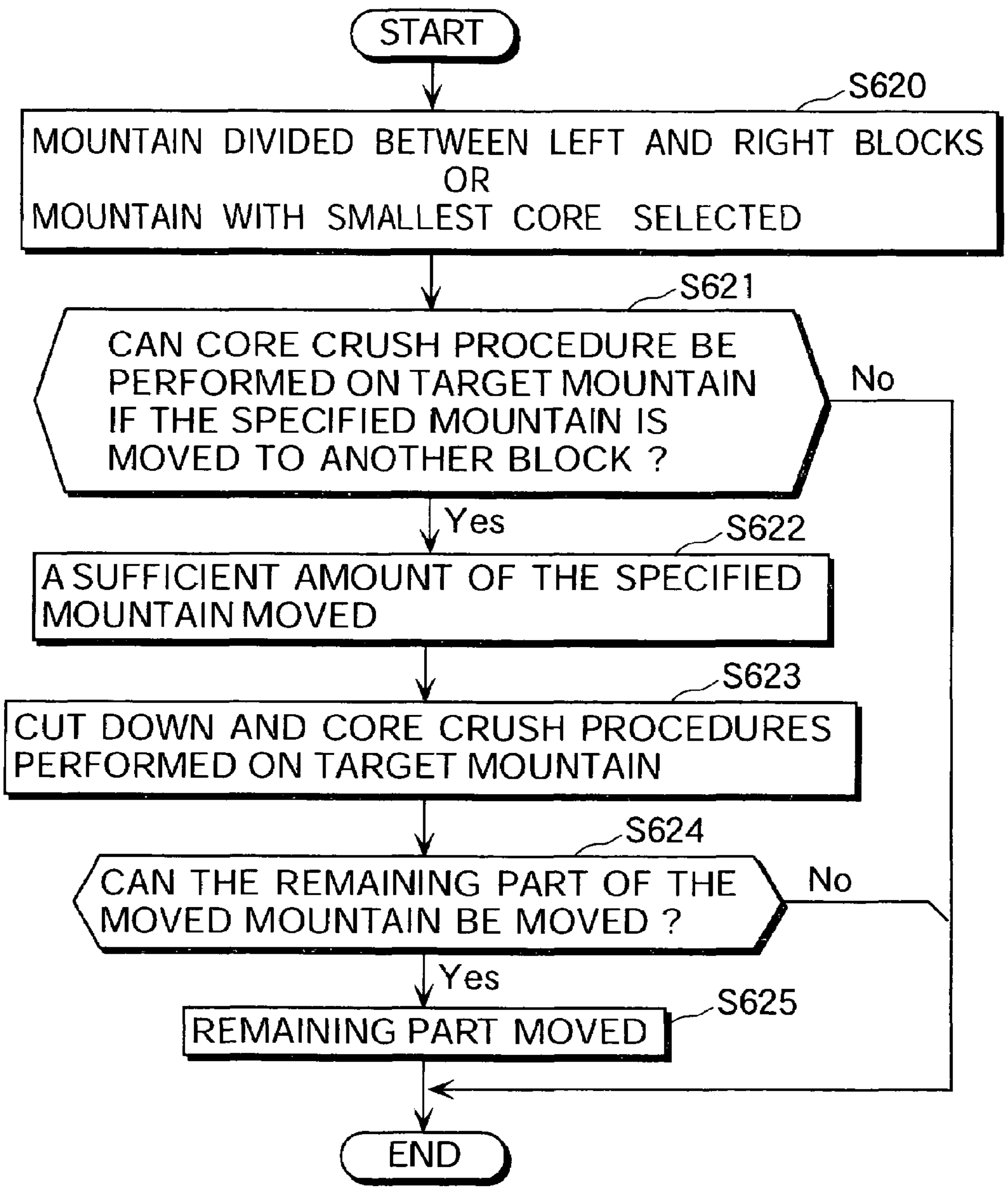

FIG. 124 is a flowchart that shows the procedure which assigns mountains to the left block 115*a* and the right block 115*b*. Here, it is assumed that in an original state, a block to which a certain mountain has been assigned does not have enough free cassettes, resulting in an inability to perform the core crush process. This situation is hereafter referred to as a "block overflow".

Out of the mountains that have been assigned to the left block 115*a* and the right block 115*b*, the optimization apparatus 300 specifies, as a mountain with low priority, a mountain that has been divided and assigned to the left block 115*a* and the right block 115*b* ("spanning the left block 115*a* and the right block 115*b*"), or a mountain whose core part is the lowest (i.e., a mountain whose most numerous component tape has the lowest number of components to be mounted) (S620).

Out of the component tapes forming the mountain that is currently specified, the optimization apparatus 300 focuses on the component tapes that are placed in the block with the block overflow. The optimization apparatus 300 judges whether the core crush process becomes possible for the mountains assigned to this block when the component tapes in focus are moved one at a time to another block in ascending order of the number of components to be mounted (S621).

When the core crush processing is judged to have become possible, the optimization apparatus 300 moves the required number of component tapes (S622) and then performs the cut down process and the core crush process on the mountains for which the core crush process has become possible (S623).

Finally, for the mountain from which the component tapes have been moved, the optimization apparatus 300 judges whether there are any component tapes left to be moved and whether these component tapes can be moved to another block (S624). When such movement is possible, the optimization apparatus 300 moves the remaining component tapes to another block (S625).

FIGS. 125A to 125D show the movement of mountains between blocks according to the processing in the flowchart shown in FIG. 124. In the illustrated example, mountains 620, 621, 622*a*, and 622*b* that are divided and assigned to the left block 115*a* and the right block 115*b* are moved.

In FIGS. 125A to 125D, the mountains 620, 621, 622*a*, and 622*b* are depicted using the appearances of their component histograms. The reason that the inner sides of the mountains 620, 621, 622*a*, and 622*b* are high is that the component recognizing camera 116 is located near the center of FIGS. 125A to 125D, with the line gang pickup head 112 that picks up the components having to pass in front of the component recognizing camera 116. To minimize the total distance moved by the line gang pickup head 112, component tapes are arranged so that tapes with the highest numbers of components to be mounted are near the center.

Figures 125A, 125B, 125C, 125D:
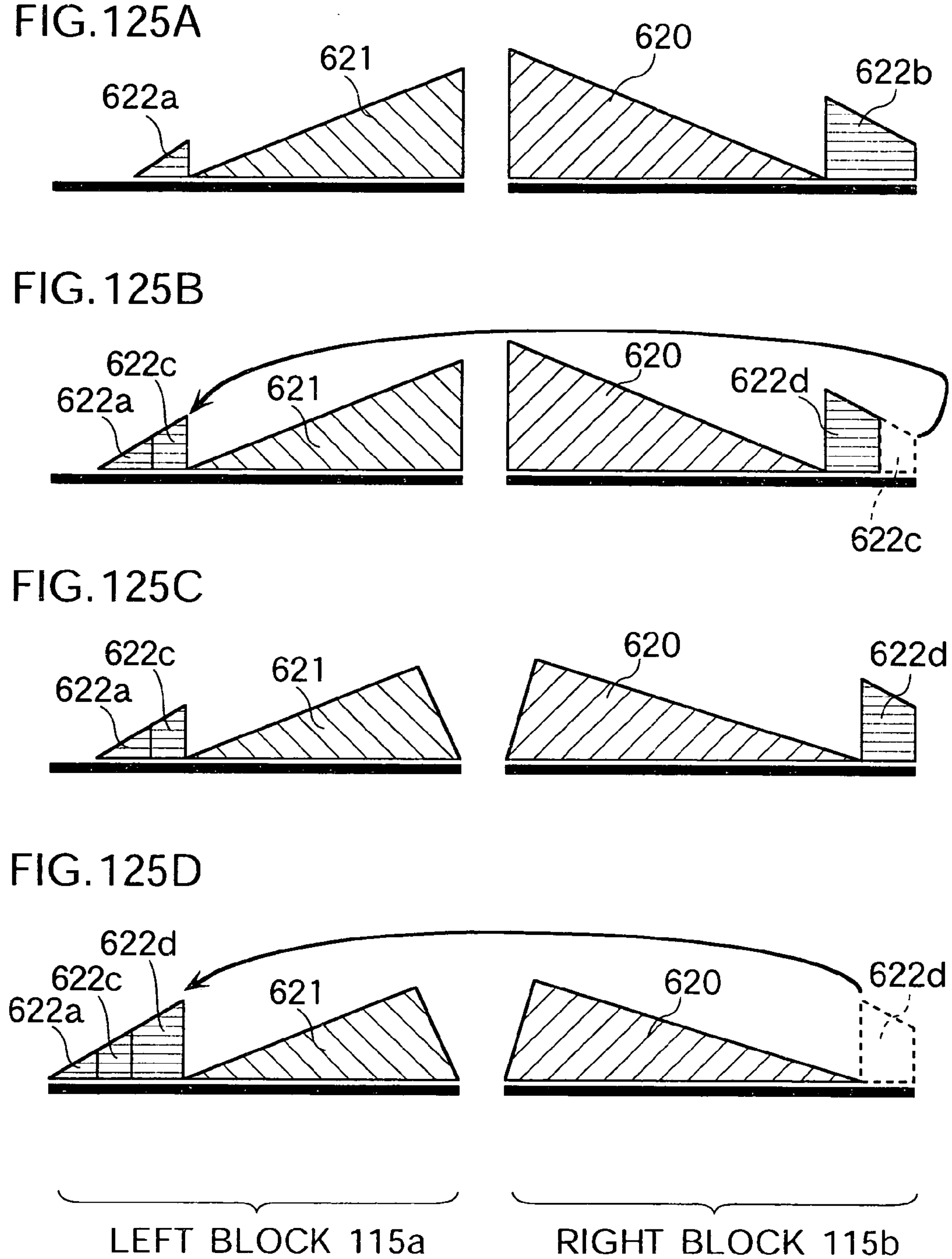

FIG. 125A shows a state where three mountains 620, 621, 622*a*, and 622*b* that have been assigned to a stage have been initially distributed to the left block 115*a* and the right block 115*b*. The right block 115*b* suffers from a block overflow, with the mountain 620 and one part (622*b*) of the mountain 622 that is divided between the left block 115*a* and the right block 115*b* being assigned to the right block 115*b*. On the other hand, the left block 115*a* does not suffer from a block overflow and has the mountain 621 and the other part (622*a*) of the mountain 622 assigned to it.

FIG. 125B shows how one part (622*c*) of the mountain 622*b* is moved from the right block 115*b* to the left block 115*a* in order to free enough space to perform the core crush process on the mountain 620.

FIG. 125C shows the state after the cut down process and the core crush process have been executed on the mountains 620 and 621. The shapes of these mountains 620 and 621 are changed so that the mountains have one side with a steep gradient and one side with a gradual gradient.

FIG. 125D shows the state after the remaining part 622*d* of the mountain that was divided has been moved from the right block 115*b* to the left block 115*a*.

Figure 126A:
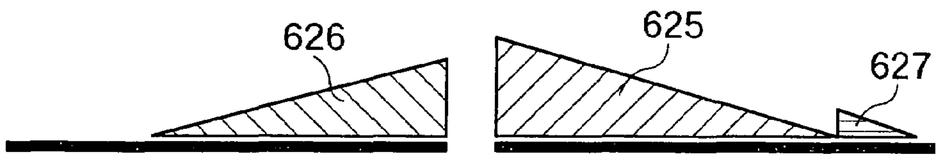
Figure 126B:
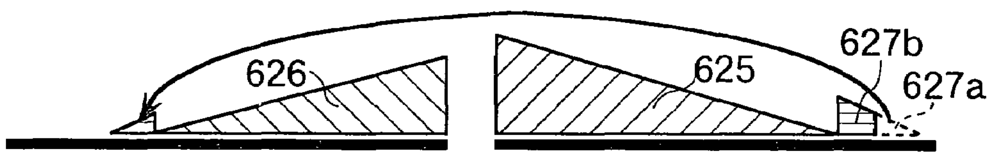
Figure 126C:
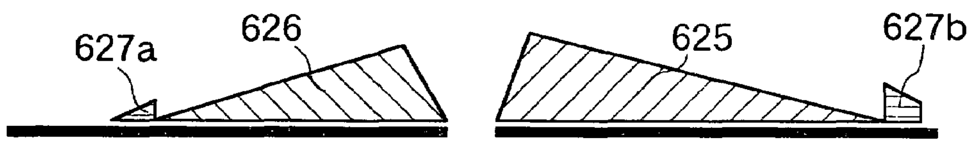
Figure 126D:
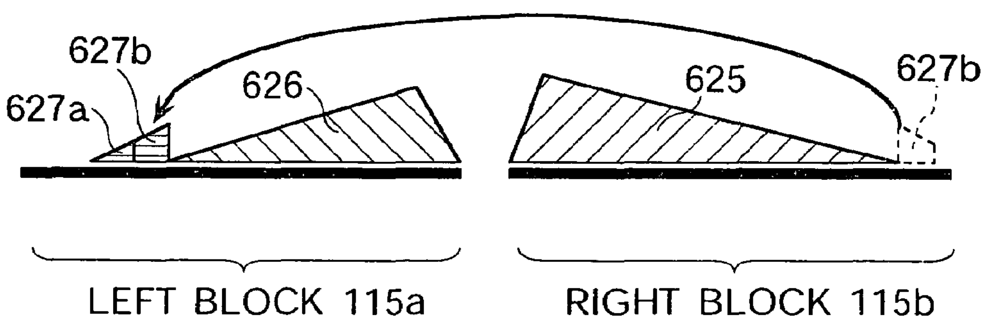

FIGS. 126A to 126D show another example of the processing performed by the flowchart in FIG. 124. In this case, the mountain with the lowest core part is moved. With the exception of the mountain subjected to movement, the processing is the same as that shown in FIGS. 125A to 125D. In more detail, one part (627*a*) of the mountain 627 with the lowest core part out of the three mountains 625, 626, and 627 in FIG. 126A is moved from the right block 115*b* to the left block 115*a* (see FIG. 126B). After this, the cut down process and the core crush process are performed on the mountains 625 and 626 (see FIG. 126C), and finally the remaining part 627*b* of the mountain 627 that was moved is moved from the right block 115*b* to the left block 115*a* and combined with the mountain 627*a* (see FIG. 126D).

As described above, moving component cassettes (component tapes) from a first block with no space on the Z-axis to another block with space available creates space in the first block that can be used to perform the core crush process. This makes it possible to perform component division that was hitherto impossible. In other words, by reviewing whether component tapes can be moved out of a block, core crush processing can be made possible, resulting the generation of ideal pickup patterns and the likelihood of a reduction in the number of nozzle strokes.

4.1.3 Estimating the Number of Double-Cassette Feeders

When the core crush process has ended for one component group (a "mountain" of component tapes) to be mounted, the component tapes are arranged on the Z-axis (arranged into component feeders). This is also the case where two tapes are arranged in double-cassette feeders that are capable of holding two component tapes. However, when double-cassette feeders are used, it is not always possible to divide up all the component tapes into pairs that can be held in double-cassette feeders, and there are cases where some of the component tapes in the pairs are subject to a fixed arrangement. As a result, it is unclear how many double-cassette feeders are required when arranging the component tapes.

When arranging all of the component tapes forming a mountain onto the Z-axis for the case where double-cassette feeders are used, it is possible to conceive a method for calculating (estimating) the required number of double-cassette feeders beforehand, based on the number of sets of NC data.

Figure 127:
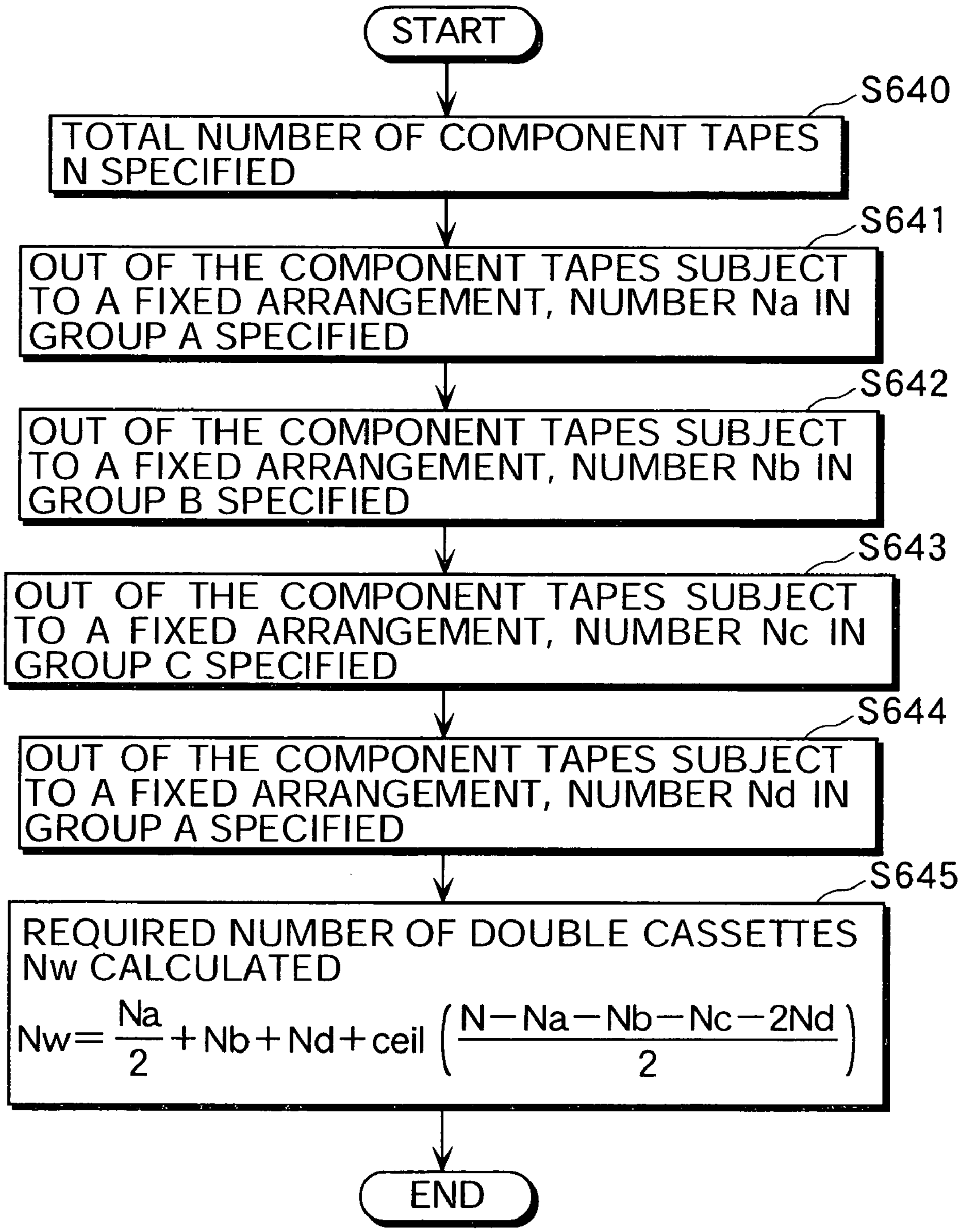

FIG. 127 is a flowchart showing the procedure used by the algorithm that estimates the number of double-cassette feeders used in the arrangement.

First, the optimization apparatus 300 specifies the total number N of component tapes to be arranged (S640).

Next, the optimization apparatus 300 sorts all of the component tapes to be arranged into the four groups A to D shown in FIG. 128 and specifies the numbers of component tapes Na, Nb, Nc, and Nd that belong to each group (S641 to S644). In more detail, the optimization apparatus 300 calculates the following.

(i) Number of Component Tapes Na in Group A

This is the number Na of component tapes that are paired with a component tape in the same component group. Na is always an even number (ii) Number of Component Tapes Nb in Group B This is the number Nb of component tapes that are (a) paired with a component tape in a different component group and (b) have a component group number that is lower than the component group number of the different component group. Note the component group numbers are consecutive numbers that are assigned to identify each component group.

(ii) Number of Component Tapes Nc in Group C

This is the number Nc of component tapes that are (a) paired with a component tape in a different component group and (b) have a component group number that is higher than the component group number of the different component group.

(iv) Number of Component Tapes Nd in Group D

This is the number Nd of component tapes that have not been paired with another component tape.

Finally, the optimization apparatus 300 calculates the estimated number (Nw) of double-cassette feeders using the following equation.

$$Nw=Na/2+Nb+Nd+\text{ceil}((N-Na-Nb-Nc-2Nd)/2)$$

where ceil (x) refers to the smallest integer that is no less than the actual value (x).

The rationale for this equation is as follows.

The right side of the above equation is the total of the number of double-cassette feeders required for holding component tapes subject to a fixed arrangement (items 1 to 3) and the number of double-cassette feeders required for holding component tapes not subject to a fixed arrangement (item 4).

The first item "Na/2" on the right side is the number of double-cassette feeders required to hold the component tapes in group A.

The second item "Nb" is the number of double-cassette feeders required to hold the component tapes in group B and the component tapes in other component groups (component groups with a higher component number) that are paired with component tapes in group B. When component tapes in different component groups are held in the same double-cassette feeder in this way, the number of double-cassette feeders required is calculated by double counting the component group with the lower group number, so that the number of double cassettes Nc required to hold the component tapes in group C is not added (i.e., is not present on the right side of the above equation).

The third item "Nd" is the number of double-cassette feeders required to hold the component tapes in group D (and the non-fixed component tapes paired with these component tapes).

The fourth item "(N−Na−Nb−Nc−2Nd)/2" is the number of double-cassette feeders required to hold the non-fixed component tapes for the case where some (a number Nd) of the non-fixed component tapes are paired with component tapes in group D and arranged in double-cassette feeders. Note that when these Nd non-fixed component tapes are not paired with the component tapes in group D, the fourth item on the right side becomes "(N−Na−Nb−Nc−Nd)/2".

By calculating the above, the required number of double-cassette feeders is given as the total of the first to fourth items on the right side of the calculation.

FIGS. 129A to D show one example of the calculation of the required number of double-cassette feeders. FIG. 129A shows the arrangement a to z of component tapes to be arranged. FIG. 129B shows the details for these component tapes. FIG. 129C shows these component tapes once they have been arranged in double-cassette feeders. FIG. 129D shows the calculation of the required number of double-cassette feeders.

As can be understood from FIG. 129, the present calculation can calculate the required number of double-cassette feeders for all kinds of arrangements of component tapes.

Note that the above equation can be rearranged and simplified as shown below.

$$\begin{aligned} Nw &= Na/2 + Nb + Nd + ceil((N - Na - Nb - Nc - 2Nd)/2) \\ &= ceil(Na/2 + Nb + Nd + (N - Na - Nb - Nc - 2Nd)/2) \end{aligned}$$

-continued $$= ceil((N + Nb - Nc)/2)$$

4.1.4 Fixing the Pairs of Component Tapes for Double-Cassette Feeders

Double-cassette feeders are capable of holding two component tapes that are both 8 mm wide. However, both tapes are ejected with the same feed pitch (2 mm or 4 mm, for example), so that component tapes that have different feed pitches cannot be arranged in the same double-cassette feeder. As a result, when optimization is performed for small components that are to be arranged in double-cassette feeders, component histograms that are produced separately for different feed pitches are produced and then folded upon themselves at the halfway point of the number of component tapes to produce pairs of component tapes. The resulting pairs are then arranged into double-cassette feeders with the suitable feed pitch.

However, due to the actualities at a production facility, there are cases where component tapes cannot be freely paired off and arranged into double-cassette feeders, which is to say, the component tapes that are paired together are fixed. As a result, there is the problem of how to arrange the component tapes into double-cassette feeders when there are component tapes that form fixed pairs and component tapes that have different feed pitches.

As a result, an algorithm that can perform optimization (i.e., can determine a Z-axis arrangement of component tapes that is suited to the cut down process) while respecting the restrictions on the pairing of component tapes is required.

FIG. 130 is a flowchart showing the procedure used by an optimization algorithm that optimizes the Z-axis arrangement while respecting the restrictions on the pairing of component tapes for double-cassette feeders. Here, it is assumed that the component tapes include component tapes that are used in double-cassette feeders with feed pitches of 2 mm and 4 mm.

First, the optimization apparatus 300 takes out the component tapes subject to a fixed pairing. In more detail, the optimization apparatus 300 sorts the component tapes of the same feed pitch into component tapes that are not subject to a fixed pairing and component tapes that are subject to a fixed pairing.

Next, the optimization apparatus 300 produces, from the component tapes that are used in double-cassette feeders with a feed pitch of 2 mm, a mountain of the component tapes on a virtual Z-axis (S661). In more detail, the optimization apparatus 300 forms pairs of the component tapes that are not subject to a fixing pairing using the algorithm (the method for folding a component histogram back on itself) that was described earlier, and leaves the pairs of the component tapes that are subject to fixing pairings as they are.

In the same way, the optimization apparatus 300 produces, from the component tapes that are used in double-cassette feeders with a feed pitch of 4 mm, a mountain of the component tapes on a virtual Z-axis (S662). In more detail, the optimization apparatus 300 forms pairs of the component tapes that are not subject to a fixing pairing using the algorithm that was described earlier, and leaves the pairs of the component tapes that are subject to fixing pairings as they are.

Finally, the optimization apparatus 300 combines the component histogram for the double-cassette feeders with a feed pitch of 2 mm with the component histogram for the double-cassette feeders with a feed pitch of 4 mm (S663). When doing so, the combined double-cassette feeders include double-cassette feeders that have fixed pairings of component tapes. In more detail, the optimization apparatus 300 treats the double-cassette feeders produced in steps S661 and S662 as a single group, and rearranges the double-cassette feeders in descending order of the number of components to be mounted for the cassettes in the odd-numbered sides of the double-cassette feeders.

FIGS. 131A to 134 show a specific example of the processing performed in steps S660 to S663.

Figures 131A, 131B:
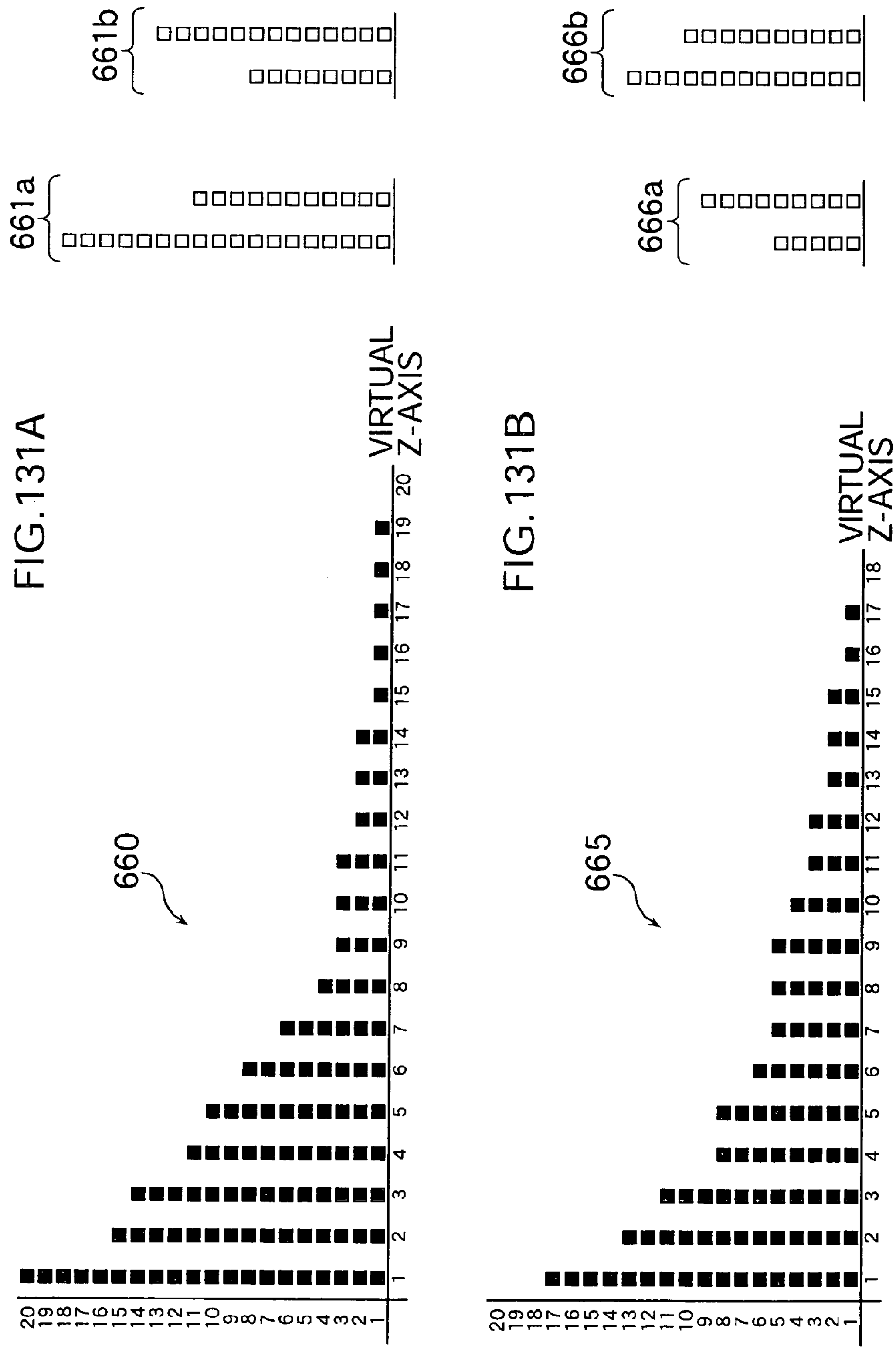

FIGS. 131A and 131B shows the processing performed in step S660. In FIG. 131A, the component tapes with a feed pitch of 2 mm are divided into a component histogram 660 made up of component tapes that are not subject to a fixed pairing and component tapes 661*a* and 661*b* that are subject to a fixed pairing. In the same way, FIG. 131B, the component tapes with a feed pitch of 4 mm are divided into a component histogram 665 made up of component tapes that are not subject to a fixed pairing and component tapes 666*a* and 666*b* that are subject to a fixed pairing.

FIGS. 132A and 142B show the processing in step S661 of FIG. 130. In FIG. 132A, the component histogram 660 is shown with its folding position (the dotted line) 661*c*. FIG. 132B show a component histogram 662 produced by folding the component histogram 660 back on itself at this folding position. Note that "folding" here refers to a process where a former half and latter half that are separated by the folding position are combined with no change in the order of their constituent components but with tapes from both halves in alternating positions.

FIGS. 133A and 133B show the processing showing in step S662. In FIG. 133B, the component histogram 665 is shown with its folding position (the dotted line) 665*c*. FIG. 133B show a component histogram 667 produced by folding the component histogram 665 back on itself at this folding position.

FIGS. 134A and 134B show the processing in step S663 of FIG. 130. FIG. 134A shows how the component tapes are arranged on a virtual Z-axis by step S662 and S663 in FIG. 130. This drawing shows the following arranged on a virtual Z-axis: the component histogram 662 of components that have a feed pitch of 2 mm and are not subject to a fixed pairing; the component histograms 661*a* and 661*b* of components that have a feed pitch of 2 mm and are subject to a fixed pairing; the component histogram 667 of components that have a feed pitch of 4 mm and are not subject to a fixed pairing; and the component histograms 666*a* and 666*b* of components that have a feed pitch of 4 mm and are subject to a fixed pairing. FIG. 134B shows the double-cassette feeders after they have been rearranged in descending order of the number of components to be mounted for the cassettes in the odd-numbered sides of the double-cassette feeders, with the pairs of component tapes in the double-cassette feeders shown in FIG. 134A being maintained.

As can be seen from the arrangement on the Z-axis in FIG. 134B, the order of the component tapes has the fixed pairings maintained within double-cassette feeders and has the component tapes in an arrangement that is suited to the cut down process. When focusing on only the odd-numbered Z positions (or alternatively only on the even-numbered Z positions) from which the line gang pickup head 112 picks up components in one nozzle stroke, the component tapes are arranged in descending order of the number of components to be mounted.

4.1.5 Optimization Algorithm for the Case Where There is a Defective Head

During the operation of the mounter 100, there are cases where heads become defective. It is necessary to minimize the effect of such defective heads, while continuing to mount components on substrates. Here, the expression "defective head" refers to a mounting head that can no longer pick up a component.

The mounter 100 operates under the following premises.

(i) During operation, even if a head becomes defective, the arrangement of the component cassettes (the component tapes) on the Z-axis is not changed.

(ii) Pickup operations are performed without using the defective head, so that the pickup patterns are changed.

(iii) Mounting is performed for all mounting points except for mounting points where components can only be mounted by the mounting head with the head number of the head that has become defective.

As a result, a method that generates pickup patterns that exclude the defective head and only use the normal heads has been conceived. Note the "head numbers" are numbers (1 to 10 starting from the left) that are used to identify the separate mounting heads that compose the line gang pickup head 112.

In more detail, the following procedure is used to deal with the defective head. An arrangement (mountain) of component tapes is produced on the assumption that none of the heads is defective, and the mountain is subjected to the cut down process without picking up components from the component tape corresponding to the position of the defective head to produce pickup patterns.

At this point, even if the number of nozzle strokes per task is two or more, priority is given to maximizing the number of components per task. This means that the line gang pickup head 112 makes as many nozzle strokes as are necessary until the line gang pickup head 112 is full (a state in which every normal head is holding a component), before mounting the picked-up components on a substrate.

FIG. 135 is a flowchart showing the procedure used by the optimization algorithm that considers the presence of defective heads.

First, by making a single nozzle stroke, the highest possible number of components are picked up from the given component histogram using all of the normal mounting heads but not the defective head (S680). When, as a result, the line gang pickup head 112 does not become full and there are still components to be picked up (S68:No), the line gang pickup head 112 is moved so as to perform more nozzle strokes (S680) to pick up components using the mounting heads that are yet to be used (S680, S681) until the line gang pickup head 112 becomes full or there are no more components to be picked up.

When the line gang pickup head 112 has become full, or all of the components have been picked up (S681:Yes), the pickup operation for one task ends, and the line gang pickup head 112 moves towards the circuit board 20 to mount the components (S682).

The above processing (S680 to S682) is repeated until there are no more components to be mounted (S683). As a result, pickup patterns can be produced giving priority making full use of the line gang pickup head 112 even when there is a defective head on the line gang pickup head 112. Consequently, the mounting of components can be performed with a low number of tasks.

FIGS. 136 to 138 are used to compare the pickup patterns for the case where there are no defective heads and the case where there is a defective head. FIG. 136 shows a component histogram 680 for the components to be picked up in this example.

FIG. 137 shows the pickup patterns 681 produced (by the cut down process and core crush process) from the component histogram 680 shown in FIG. 136 when there are no defective heads. On the other hand, FIG. 137 shows the pickup patterns 685 produced from the component histogram 680 shown in FIG. 136 when the mounting head H2 with the head number 2 is defective.

It should be noted that the pickup patterns 681 and 685 shown in FIGS. 137 and 138 are produced when the component tapes A, B, and C are divided during the core crush process performed on the component histogram 680 shown in FIG. 136. In these drawings, the left vertical axis shows the number of nozzle strokes (accumulatively), and the right vertical axis shows the number of tasks. However, in FIG. 138, the second and ninth tasks are divided into the two rectangular frames 687*a* and 687*b*, and 688*a* and 688*b*, respectively.

In FIG. 138, the second task, for example, includes a first nozzle stroke 687*a* where the mounting heads H1 and H10 pick up a total of two components and a second nozzle stroke 687*b* where the mounting heads H3 to H9 pick up a total of seven components. As a result, the line gang pickup head 112 becomes full with all nine normal heads holding a component, making a total of nine components with the defective head H2 not being used.

By comparing FIGS. 137 and 138, it can be seen that when the defective head is considered, there is a large increase in the number of nozzle strokes over the case where no defective heads are present. However, there is only the merest increase in the number of tasks from 13 to 14. This means that the pickup patterns have been successfully optimized for the case where a defective head is present.

It should be noted that when the substrate is LL sized or larger, there is a region where components can only be mounted by heads 7 to 10, making the optimization for the case where there is a defective head problematic. The optimization algorithm described earlier divides the heads 1 to 10 into two groups respectively composed of heads 1 to 6 and heads 7 to 10 and generates separate pickup patterns for these two groups of heads. In this case, when picking up components without using a defective head in either group, the method described in this section may be used. However, when there are Z numbers at which only a particular mounting head can perform mounting, the component cassettes have to be rearranged.

4.2 Simultaneous Optimization of Several Sets of NC Data

In some cases, the user of the mounter 100 wants to produce a plurality of substrates in a short time without changing the positions or order of the component cassettes that have been set in the mounter 100. In such cases, it is necessary to determine an optimal order of component cassettes etc., that can be used when mounting components on each of the substrates and can reduce the total time required to completed the mounting for all of the substrates. In other words, an optimization algorithm for the order of component mounting of a plurality of sets of NC data is required. One such algorithm is described below.

The fundamental principle behind this optimization algorithm is as follows. In order for the cut down process to operate as expected, the component cassettes need to be arranged in order of the number of components to be mounted. Consequently, the coefficient of correlation between the order of the number of components to be mounted and different arrangements of the component cassettes are calculated for each substrate, and the arrangement of component cassettes that maximizes the correlation is found. Other than this, optimization is performed in accordance with the methods described earlier.

FIG. 139 is a flowchart showing the entire procedure used to optimize a number of simultaneous sets of NC data. First, for the provided plurality of sets of NC data (S700), the optimization apparatus 300 judges whether there are any sets of NC data that have a predetermined resemblance (S701). When there is resemblance, the optimization apparatus 300 combines the mounting points of the sets of NC data to produce new NC data (S702). This processing is repeated for all sets of NC data (S700 to S703).

The judgement of whether there is resemblance is performed by expressing each set of NC data using vectors that have the number of components to be mounted for each component type as its elements. These vectors have the component types as the base elements and the number of components to be mounted for each as the magnitude of the base elements. The optimization apparatus 300 judges that there is resemblance when the cosine (cos θ) of the angle between two vectors is larger than a predetermined threshold.

In other words, when cos θ>threshold value, it is assumed that there is a resemblance between two sets of NC data.

It should be noted that this cosine is thought to represent an index showing the degree to which two sets of NC data include the same component types.

For the one or more sets of NC data left after the combining described above, the optimization apparatus 300 optimizes the Z-axis arrangement for one set of NC data at a time in descending order of the number of substrates to be produced for each set of NC data (S704). At this point, when the NC data being optimized includes component tapes whose Z-axis arrangement has already been decided, the optimization apparatus 300 leaves out these component tapes and determines the Z-axis arrangement using the cut down process and other processes as normal.

In this way, when sets of NC data include many common component types, optimization can be performed by treating the sets of NC data as a single set of NC data. When there are not many common component types, optimization is performed separately for different sets of NC data.

The following describes a specific algorithm that can optimize a plurality of sets of NC data as a single set of NC data, which is to say, an algorithm that can simultaneously optimize a plurality of sets of NC data.

This optimization aims to optimize the Z-axis arrangement. In this specification, the following are the three main items subjected to optimization: (i) the Z-axis arrangement; (ii) the mounting paths within tasks; and (iii) the order of tasks. When simultaneously optimizing a plurality of sets of NC data, however, a common Z-axis arrangement is required, so that the optimization of the Z-axis arrangement is the most important of the three. The remaining two items can be optimized for the tasks produced by performing the cut down process on the optimized Z-axis arrangement.

A common Z-axis arrangement that enables the cut down process to be successfully performed for the separate sets of NC data needs to have the component tapes arranged on the Z-axis in descending order of the number of components to be mounted. As a result, the optimization algorithm used here determines a Z-axis arrangement that is as close as possible to this ideal kind of arrangement for the separate sets of NC data.

FIG. 140 is a flowchart showing the procedure used when optimizing a Z-axis arrangement that is used for several sets of NC data. First, an initial Z-axis arrangement is determined by arranging component tapes in accordance with one of the "ranking", a "total number of components", and "number of substrates" (S740).

When component tapes are arranged according to "ranking", component tapes are arranged in descending order of the average ranking of each component tape within each set of NC data, the component tapes having been arranged in descending order of the number of components to be mounted within each set of NC data.

When component tapes are arranged according to "total number of components", component tapes are arranged in descending order of the total number of components to be mounted in all sets of NC data.

When component tapes are arranged according to "number of substrates", component tapes are arranged giving priority to the set of NC data with the highest number of substrates to be produced, with the component tapes for other sets of NC data being arranged according to the "total number of components".

Note that the decision as to which of the above three methods should be used is taken based on standards that are established in advance from the results of simulation. As one example of such a standard, when there are less than five sets of NC data, the "number of substrates" method is used.

After determining the initial Z-axis arrangement, the optimization apparatus 300 performs optimization using a probability-based search (S711). In other words, the optimization apparatus 300 randomly changes the Z-axis arrangement, and accepts the new Z-axis arrangement if there is an increase in the average number of components picked up simultaneously. If not, the optimization apparatus 300 rejects the new Z-axis arrangement and returns to the previous Z-axis arrangement. This process is then repeated. As one example, the optimization apparatus 300 may (i) remove one component tape from the Z-axis arrangement, (ii) move up the component tapes on the right to fill the resulting gap, and (iii) insert the removed component tape at a different position. When this operation results in an increase in the optimization level, the new arrangement is accepted. By repeating this process where slight changes are made and the result is evaluated, gradual improvements can be made to the optimization level.

FIGS. 141A and 141B show a specific example that is used to describe the three methods of determining the initial Z-axis arrangement. For ease of explanation, this example is for the case where an initial Z-axis arrangement is determined for three sets of NC data that include all or some of the five component tapes A to E.

FIG. 141A is a table that shows, for each of the sets of NC data 1 to 3, the numbers of components to be mounted for each component tape used in the NC data, a ranking of each component tape in descending order of this number of components (the numbers shown in parenthesis), and the number produced of each substrate corresponding to each set of NC data. The table also shows the average ranking of each component tape and the total number of components to be mounted for each component tape.

FIG. 141B shows the initial Z-axis arrangements that are produced for the three sets of NC data 1 to 3 shown in FIG. 141A based on "ranking", "total number of components", and "number of substrates", respectively.

When the initial Z-axis is produced based on "ranking", the optimization apparatus 300 (i) determines the ranking of each component tape in each set of NC data, (ii) finds the average ranking of each component tape, and (iii) arranges the component tapes in descending order of average ranking to produce the initial Z-axis arrangement. As a result, when the component tapes are arranged using the average rankings shown in FIG. 141A, the initial arrangement becomes "CABED", as shown in FIG. 141B.

When the initial Z-axis is produced based on "total number of components", the optimization apparatus 300 (i) finds the total number of components for each component tape, and (ii) arranges the component tapes in descending order of the total numbers of components to produce the initial Z-axis arrangement. As a result, when the component tapes are arranged using the numbers of components shown in FIG. 141A, the initial arrangement becomes "ACBDE", as shown in FIG. 141B.

When the initial Z-axis is produced based on "number of substrates", the optimization apparatus 300 (i) specifies the NC data with the highest number of manufactured substrates (ii) fixes the arrangement of component tapes on the Z-axis as the arrangement that is optimal for the component tapes used in the specified NC data, and (iii) arranges the other component tapes in the remaining space on the Z-axis based on the total number of components mounted for each component tape in the other sets of NC data to produce the initial Z-axis arrangement. As a result, when the component tapes are arranged using the numbers of substrate shown in FIG. 141A, the arrangement "CAB" is determined for the specified NC data (NC data 2) and the arrangement for the other component tapes is determined as "DE" based on the total numbers of components, resulting in the initial arrangement "CABDE", as shown in FIG. 141B.

The following describes the result of the evaluation based on simulation by the optimization algorithm that simultaneously optimizes a plurality of sets of NC data.

It should be noted that in this simulation, the distribution in the numbers of components is such that many small components are mounted and there is a gradual decrease in the number of components mounted as components size increases. The following distribution was used in view of the normal properties of NC data.

The average number of components mounted for the component type "part" is set as $$n(\text{part})=C/\text{part}$$

where "part" is a component tape number and C is a constant. Note that component tape numbers are assigned consecutively to component tapes.

In each set of NC data A, a degree of noise is added to the above equation so that $$n(\text{part},A)=(C/\text{random number for the width of "part"})\pm((C/3)/\text{random number for the width of "part"})$$

The number of sets of NC data was set as a random number between 1 and 20.

The simulation is performed as follows.

(i) The number of sets of NC data to be optimized is set using a random number.

(ii) The number of components to be mounted in each set of NC data is determined.

(iii) The initial Z-axis arrangements are found using the three methods described above.

(iv) A probability-based search is performed for an optimal Z-axis arrangement that minimizes the pickup operations is found using the trial-and-error method described above.

When simulation was performed using the above method, the following results were apparent.

(i) For each of the three methods for determining the initial Z-axis arrangement, it was found that as the number of sets of NC data increases, the number of components that can be simultaneously picked up gradually decreases.

(ii) When there are few sets of NC data, the number of components that can be simultaneously picked up is high for an initial Z-axis arrangement based on the "number of substrates" method, but as the number of sets of NC data increases, more components can be simultaneously picked up when the "total number of components" method is used.

(iii) When optimization is performed by making one thousand "trial-and-error" rearrangements, an improvement of over 10% was observed in the number of nozzle strokes (i.e., the number of nozzle strokes decreased by 10%).

From the results of the above simulation, it is believed that the "number of substrates" method is best for cases where there are less than five sets of NC data and the "total number of components" method is best for cases where there are five or more sets of NC data.

4.3 Optimization for General Components (Introduction of the Rule Base)

As described in the "2.9 Optimization For General Components" section earlier in this specification, the optimization algorithm for general components that is described earlier is based on a probability-based search. In other words, since general components are subject to restrictions as to which nozzles can pick up which components, "states" in which the arrangement of component tapes on the Z-axis and the composition of tasks are used as parameters are evaluated based on mounting time. A search for states with shorter mounting times is performed by varying the states based on probability.

However, when optimization is performed using this kind of probability-based search, there is a tendency for the optimization process to take an extremely long time when the initial state before optimization is poor. In fact, with the algorithms described above, it cannot be said that the tasks generated as the initial state produce an initial state that is favorable for the pickup operation. As one example, even though 10 components can be picked up at once by arranging component tapes one after the other along the Z-axis, there are cases where in the initial state is based on a mounting order where 10 nozzle strokes are performed to pick up ten components from the same component tape (i.e., a component tape located at one Z position).

In order to speed up the optimization performed for general components, it is better to use an algorithm which considers the nozzle restrictions and is based on predetermined rules. This algorithm generates an optimal initial state and optimizes the nozzle exchange operations. This optimization algorithm is described below in terms of the four methods it uses. These methods are "appropriation". "task division", "task combining", and "task interchanging".

4.3.1 Appropriation

"Appropriation" refers to an algorithm that generates initial tasks (a sets of tasks corresponding to an initial state) that are to be optimized by the optimization algorithm that uses a probability-based search. As its name suggests, this method searches the Z-axis for components that can be picked up and resembles the cut down process developed as the optimization algorithm for small components.

FIG. 142 is a flowchart showing the procedure used by the algorithm that creates initial tasks by appropriation. This procedure can be roughly divided into a former half that arranges component tapes on the Z-axis (S720 to S722) and a latter half that repeatedly generates tasks (S723 to S726).

In more detail, in the former half, the optimization apparatus 300 generates a component histogram for general components in which the component tapes in each component group are arranged in descending order of the number of components to be mounted (S720).

Next, the optimization apparatus 300 divides the component histogram produced in S720 into separate component histograms for each nozzle type (S721). In more detail, the optimization apparatus 300 takes all of the component tapes from which components can be picked up by the same nozzle type out of the component histogram it has generated for each component group and arranges the component tapes it has taken in descending order of the number of components to be mounted. This is repeated for every nozzle type with a component included in the component histogram.

After this, the component histograms that have been produced for each nozzle type are arranged one at a time onto the Z-axis, starting from the inner sides of the left block 115*a* and the right block 115*b* (S722).

In the latter half of the procedure, the optimization apparatus 300 performs the following processing on the component histograms produced in the former half of the procedure. First, for each component group (S723 to S726), the optimization apparatus 300 scans the Z-axis and removes ("appropriates") components to produce tasks (S724). This process is performed starting from the lower edge of each component histogram moving towards the upper part, and is repeated until no more components are left (S725). The resulting tasks are the initial tasks for the optimization process.

It should be noted that in the order for scanning the component histograms, priority is given to nozzles where the nozzle resources are scarce. Even when there are different types of nozzles, priority is given to producing tasks with the highest possible number of components. As one example, when the line gang pickup head 112 is fitted with two type M nozzles and eight type S nozzles, two components are removed from the component histogram for components requiring nozzle type M before eight components are removed from the component histogram for components requiring nozzle type S to complete the task.

FIGS. 143A to 143C show a specific example of the former half (S720 to S722) of the processing in the flowchart shown in FIG. 142.

FIG. 143A shows the component histograms that are generated in units of component group in step S720 of FIG. 142. In the present example, two component histograms 720 and 721 are shown.

FIG. 143B shows the component histograms that are generated in units of nozzle types in step S721 of FIG. 142. In the present example, component histogram 720 is divided into component histograms 720*a* and 720*b*, and component histograms 721 is divided into component histograms 721*a* and 721*b*.

FIG. 143C shows the component histograms arranged on the Z-axis in step S722 of FIG. 142. In the present example, the component histograms 720*a* and 721*a* are arranged in the right block 115*b* and the component histograms 720*b* and 721*b* are arranged in the left block 115*a*.

FIGS. 144A to 144E show specific examples of the latter half (S723 to S726) of the processing in the flowchart shown in FIG. 142.

Figure 144A:
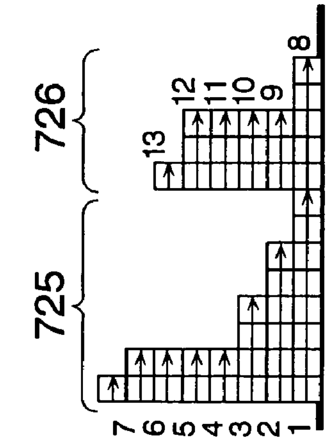

FIG. 144A shows the scanning direction and the order (numbers 1 to 13) of the scans in step S724 of FIG. 142. In the present example, two component histograms, i.e., the component histogram 725 for nozzle type S and the component histogram 726 for nozzle type M are shown. Note that it is assumed that neither type of nozzle is subject to restrictions on the availability of nozzle resources.

Figure 144B:
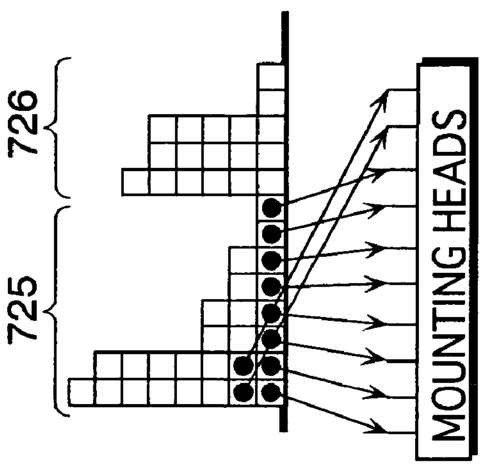

FIG. 144B shows the generation of tasks in step S724 of FIG. 142. In the present example, a task is generated by removing 8 components that are positioned at the base of the component histogram 725 and 2 components that are positioned on the second bottom row of the component histogram 725.

Figure 144C:
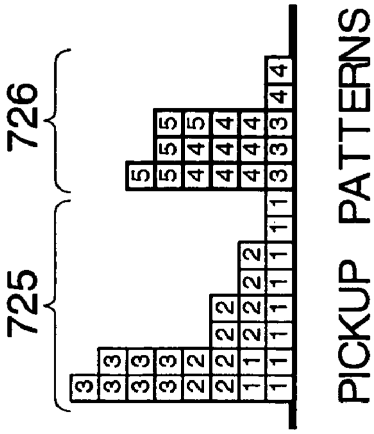

FIG. 144C shows the tasks (pickup patterns 1 to 5) that are generated one after the other by the repeated processing in the latter half (S723 to S726) of FIG. 142. The numbers written inside the components (illustrated using squares) composing the component histograms 725 and 726 in FIG. 144C are the tasks numbers that are assigned to the tasks in order. In the present example, task 3 with the task number 3 includes both components belonging the component histogram 725 and components belonging the component histogram 726. This means that different types of nozzles are used by this task.

Figure 144D:
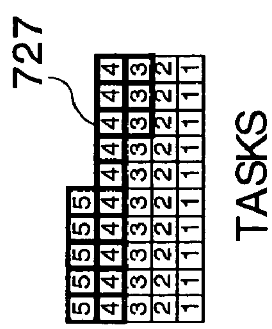

FIG. 144D shows the initial tasks 727 that are finally produced in the latter half (S723 to S726) of FIG. 142. Note that in FIG. 144D, the components belonging to the component histogram 725 are surrounded by a thin line, while the components belonging to the component histogram 726 are surrounded by a thick line. The first of the generated tasks (i.e., the first task to be mounted) is task 1 that is at the bottom.

Figure 144E:
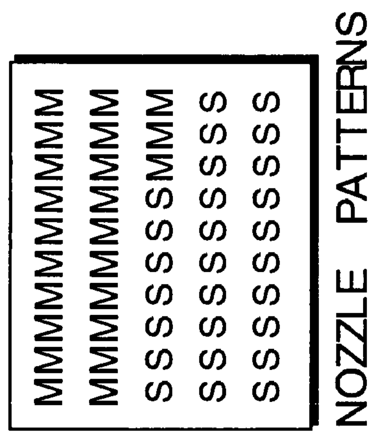

FIG. 144E shows the nozzle patterns for the initial tasks 727 shown in FIG. 144D. Here, a "nozzle pattern" is a pattern in which the nozzle types used to pick up components are shown corresponding to the positions of the mounting heads (i.e., positions at which nozzles are fitted onto the line gang pickup head 112). In the present example, the nozzle pattern for the third task includes both type S and type M nozzles.

FIG. 145 shows the effect of this "appropriation" using an example which, for ease of explanation, only includes one component histogram 730. The number of nozzle strokes are shown for the case where the initial tasks 731 are generated by the algorithm described earlier in this specification and for the case where the initial tasks 732 are generated using "appropriation".

It should be noted that the components that are surrounded by thick lines belong to the same task, and that the numbers written inside the squares representing the tasks show the number of the mounting head used to pick up that component.

The conventional method is shown in the upper part of FIG. 145. The component histogram 730 is composed of four tasks 731, 732*a* and 732*b*, 733*a* and 733*b*, and 734, so that a total of 40 nozzle strokes are required. The "appropriation" method is shown in the lower part of FIG. 145. The component histogram 730 is composed of four tasks 735 to 738, so that a total of only 14 nozzle strokes are required.

4.3.2 Task Division

The mounting time for general components can be greatly reduced by optimizing the interchanging of nozzles. However, nozzle interchanging cannot be directly controlled using NC data, since the mounter 100 automatically interchanges the nozzles in accordance with the types of components given in the NC data. As a result, to optimize the nozzle interchanging operations performed when nozzle are changed, it is necessary to perform an indirect optimization that changes the component types that compose tasks. This means that optimization of tasks and optimization of the nozzle interchanging operations have to be performed simultaneously, which is not realistically possible.

Because of this, the composition of tasks is decided in a way which reduces the required number of nozzle interchanges, with the aim of reducing the overall mounting time.

One method for composing tasks is "task division". In more detail, the nozzle pattern is investigated for each of the initial tasks, focus is placed on tasks before or after which nozzles are interchanged, such tasks are divided into tasks composed of component types that can be picked up by the nozzle pattern being nozzles are interchanged and component types that can be picked up by the nozzle pattern after nozzles are interchanged, and the tasks are recomposed so that unnecessary interchanges of nozzles are avoided.

FIG. 146 is a flowchart showing the procedure used by an optimization algorithm for optimizing the nozzle interchanging operations based on "task division". First, the optimization apparatus 300 investigates the nozzle patterns for the tasks (or initial tasks) to be optimized, and judges whether there are any tasks that use two or more types of nozzles (S740).

When there are no such tasks (S740:No), the optimization apparatus 300 judges that "task division" is unnecessary and the procedure ends.

On the other hand, when there is such a task (S740:Yes), this task the task is split into tasks where there is only one nozzle type (S741). After this, one of the tasks produced by this splitting (the tasks that uses different nozzles to the immediately preceding task) is moved to the end of a set of tasks that use the same nozzles (S742). Hereafter, a set of tasks that use the same nozzles is referred to as a "task set".

As a result, tasks where there are different types of nozzles are eliminated, so that tasks are only composed of components that use the same type of nozzles.

FIGS. 147A to 147D show a specific example of the flowchart shown in FIG. 146. In this example, task division is performed on initial tasks that have been generated using appropriation.

Figure 147A:
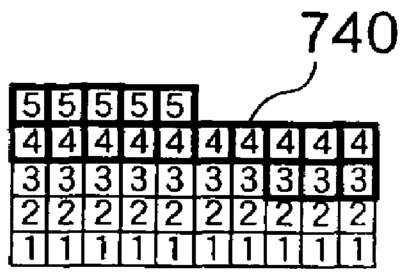

FIG. 147A shows the tasks 740 that are to be subjected to task division. These tasks are the same as the tasks 727 shown in FIG. 144D. In this example, task 3 out of the tasks 740 has components that use two types of nozzles. As a result, nozzle interchanging is necessary before and after task 3. In other words, type S nozzles have to be replaced with type M nozzles both before task 3 is executed following task 2 and after task 3 is executed prior to task 4.

Figure 147B:
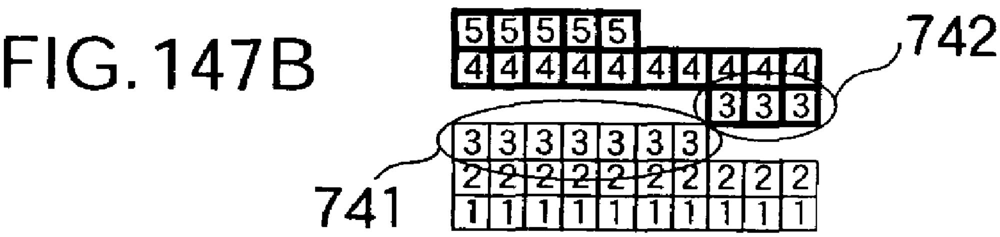

FIG. 147B shows the splitting of the tasks in step S741 of FIG. 146. In the present example, task 3 is divided into the task 741 that includes only nozzle type S and task 742 that includes only nozzle type M.

Figure 147C:
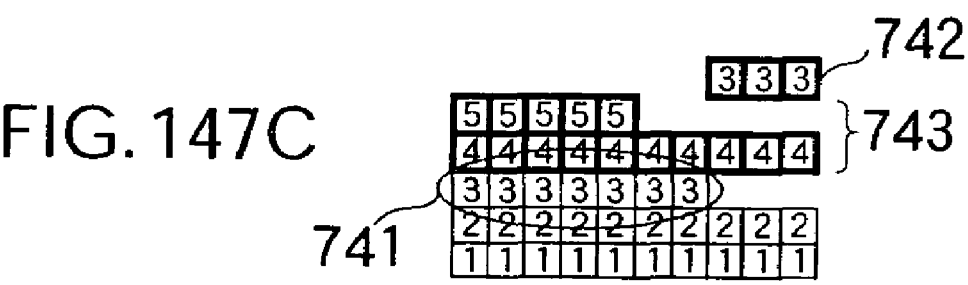

FIG. 147C shows the movement of tasks in step S742 of FIG. 146. In the present example, task 742 that was generated by splitting task 3 is moved to the end of the task set 743.

Figure 147D:
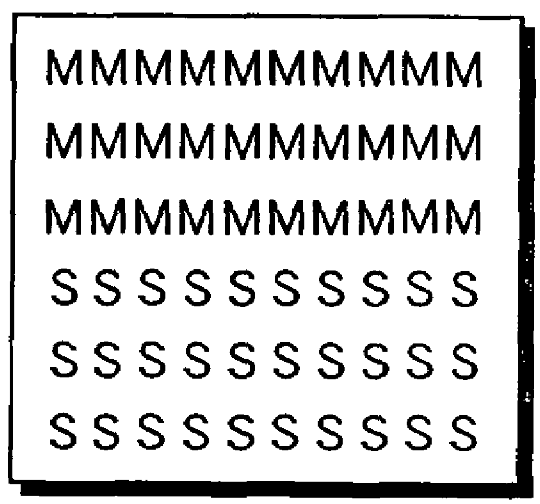

FIG. 147D shows the nozzle patterns corresponding to the tasks shown in FIG. 147C. As can be seen from the drawing, all of the tasks with different nozzle types have been removed, and the initial tasks have been recomposed to form three tasks that include only nozzle type S and three tasks that include only nozzle type M.

As can be understood from the nozzle patterns that are produced by task division, nozzle interchanging (from type S to type M) only needs to be performed when task 4 is executed following task 3. This means that using these nozzle patterns reduces the number of nozzle interchanging operations from two to one.

4.3.3 Task Combining

While task division reduces the number of nozzle interchanging operations, there is an increase in the number of tasks. As a result, there can be cases where the overall optimization level is still insufficient.

For this reason, task combining is performed to suppress the increase in the number of tasks by combining the increased tasks with other tasks.

FIG. 148 is a flowchart showing the procedure used by an optimization algorithm based on "task combining". First, the optimization apparatus 300 judges whether there are any pairs of tasks that can be combined in each task set in the tasks to be optimized, or in other words, judges whether there are any pairs of tasks where there is no coincidence between the mounting heads used to pick up components (S750). In more detail, the optimization apparatus 300 takes a logical AND for whether each mounting head (i.e., coinciding positions on the line gang pickup head 112) is used in two tasks (the tasks being expressed using logic values where "1" shows that the nozzle is used and "0" that the nozzle is not used) to find pairs of task where the result "0" is given for all nozzles.

When there is no such pair of tasks (S750:No), the optimization apparatus 300 judges that task combining is not possible, and this procedure ends.

On the other hand, when a pair of tasks is found (S750: Yes), the optimization apparatus 300 combines the tasks (S751). In more detail, the tasks are linked with the present nozzle positions being maintained to produce a single new task.

FIGS. 149A to 149C shows a specific example of the processing performed by the flowchart shown in FIG. 148. In this example, task combining is performed for the tasks generated by the task division shown in FIGS. 147A to 147D.

FIG. 149A shows the tasks that are to be subjected to task combining. These tasks are the same as those shown in FIG. 147C. In this example, task 5 and task 742 belong to the same task set and include only components that correspond to non-coinciding positions on the line gang pickup head 112. As a result, the optimization apparatus 300 judges that task 5 and task 742 can be combined.

FIG. 149B shows the combining of tasks in step S751 of FIG. 148. In the present example, task 5 and task 742 are combined with the positions of their constituent components being maintained.

FIG. 149C shows the nozzle patterns corresponding to the tasks shown in FIG. 149B. As can be understood by comparing these nozzle patterns with the nozzle patterns in FIG. 147D, the nozzle patterns in FIG. 149C include one less task composed of all type M nozzles. This means that the overall number of tasks is reduced without increasing the number of nozzle interchanges, thereby further increasing the optimization level. As a result of both processes, the required number of nozzle interchanges is reduced from two to one.

4.3.4 Task Interchanging

By performing task division and task combining as described above, the nozzle interchanging operations can be optimized, though this optimization only focuses on one set of tasks (when there are many sets of tasks, one component group) at a time. In other words, there can be cases where unnecessary nozzle interchanging operations occur due to the relationship of a present set of tasks with the preceding or succeeding set of tasks.

FIG. 150 shows a specific example of this situation. This example shows two component groups 1 and 2 and two nozzle patterns 760 and 761 where the nozzle interchanging operations have been optimized in units of component groups by performing task division and/or task combining. The nozzle pattern 760 for component group 1 is composed of a task set 760*a* for nozzle type S and a task set 760*b* for nozzle type M that are arranged in this order Similarly, the nozzle pattern 761 for component group 2 is composed of a task set 760*a* for nozzle type M and a task set 760*b* for nozzle type S that are arranged in this order.

As can be understood from the nozzle patterns shown in FIG. 150, an unnecessary nozzle interchanging operation is performed between the component groups. Focusing on type S nozzles, for example, these nozzles are fitted onto the line gang pickup head 112 to execute the task set 760*a*, the nozzles are then removed so that the line gang pickup head 112 can execute the task set 760*b*, and then are fitted back onto the line gang pickup head 112 to execute the task set 761*a*, thereby involving an unnecessary nozzle interchanging operation. Since the nozzle types on the line gang pickup head 112 change from S to M to S to M, a total of three nozzle interchanging operations are required.

To remedy this situation, task interchanging, that reorders the tasks in the task sets belonging to each component group is performed to eliminate unnecessary nozzle interchanging operations that are performed in between component groups.

FIG. 151 is a flowchart showing the procedure used by an optimization algorithm that uses task interchanging. This process determines an optimal arrangement of task sets using a "round-robin" method.

In more detail, the optimization apparatus 300 first specifies all of the possible orders for the task sets in each of the component groups being optimized (S760). When doing so, the optimization apparatus 300 only investigates whether task sets can be moved within component groups, and do not consider changing the order of the component groups themselves.

After this, the optimization apparatus 300 calculates the number of nozzle interchanging operations in the nozzle patterns for each of the orders found in step S760 (S761 to S763). The optimization apparatus 300 then finds which nozzle pattern (order of task sets) results in the lowest number of nozzle interchanging operations and sets this as the optimal solution (S764).

FIG. 152 shows the nozzle pattern obtained by performing optimization though task interchanging. This nozzle pattern is obtained by performing task interchanging on the nozzle pattern shown in FIG. 150, and is characterized by the order of the two task sets 760*a* and 760*b* composing component group 1 having been reversed.

With the nozzle pattern shown in FIG. 152, the nozzle types on the line gang pickup head 112 change from M to S to M, making a total of only two nozzle interchanging operations. In other words, task interchanging has resulted in the number of nozzle interchanging operations falling from three to two.

4.4 Optimization with Respect to the Nozzle Restrictions

The following describes the procedure used when the positions of nozzles in the nozzle station 119 are fixed and an optimization method for small components when the number of nozzles used is less than ten.

4.4.1 Procedure Performed When the Arrangement of Nozzles in the Nozzle Station is Fixed When optimizing a plurality of sets of NC data simultaneously, it is not possible to change the arrangement of nozzles in the nozzle station 119 for each set of NC data, so that the arrangement of nozzles in the nozzle station 119 ends up being fixed, making this a restriction for the optimization processing performed.

When the arrangement of the nozzles in the nozzle station 119 is fixed, the restrictions on the construction of the mounter 100 (i.e., the movable range of the line gang pickup head 112 above the nozzle station 119 and the component supplying units 115*a* and 115*b*) mean that there can be cases where it is not possible to pick up certain components using the specified nozzles.

For this reason, when provided with a nozzle arrangement for the nozzle station 119, the optimization apparatus 300 checks whether this arrangement can be used (i.e., judges whether the existence of a possible order of component mounting is likely). In other words, when provided with an arrangement of nozzles in the nozzle station 119 and a Z-axis arrangement of component tapes, the optimization apparatus 300 judges whether it appears likely that each of the components can be picked up with the appropriate nozzle.

FIG. 153 is used to show the restrictions present in this kind of situation. In the drawing, the nozzle restrictions are caused by the limited range of movement of the line gang pickup head 112 above the nozzle station 119. From the top, FIG. 153 shows (1) the positional relationship between the line gang pickup head 112 and the nozzle station 119 (a front elevation of the line gang pickup head 112 and the nozzle station 119) when the line gang pickup head 112 is positioned at its rightmost-position, (2) an overhead view of the nozzle station 119, and (3) a table 770 shows the relationship between the nozzle positions and the mounting heads, with circles indicating that a nozzle can be fitted onto a mounting head.

It should be noted that in the illustrated example, the line gang pickup head 112 can move past the nozzle station 119 on the left side, so that there are no restrictions as to which nozzles can be fitted on the line gang pickup head 112.

As can be understood from FIG. 153, the nozzles n1 to n4 positioned in the first to fourth columns counting from the left side of the nozzle station 119 can be fitted to the mounting heads H1 to H10, so that no restrictions apply for these nozzles. However, the remaining nozzles n5 to n10 are subject to restrictions. The nozzle n5 positioned in the fifth column can only be fitted to the mounting heads H2 to H10, the nozzle n6 positioned in the sixth column can only be fitted to the mounting heads H3 to H10, . . . , and the nozzle n10 positioned in the tenth column can only be fitted to the mounting heads H7 to H10.

FIGS. 154A to 154C show another example of a restriction. In this example, restrictions are placed on the pickup of components due to the range of movement of the line gang pickup head 112 over the component supplying units 115*a* and 115*b*. These drawings correspond to FIGS. 5A and 5B, though, the detailed content is different.

FIG. 154A shows the relative positional relationship between the line gang pickup head 112 and the component supplying unit 115*a* when the line gang pickup head 112 has been moved to its leftmost position. The consecutive numbers that are written on the component supplying unit 115*a* are the Z numbers. FIG. 154B shows the relative positional relationship between the line gang pickup head 112 and the component supplying unit 115*b* when the line gang pickup head 112 has been moved to its rightmost position. FIG.

154C shows the mounting heads that can access a given Z number using circles and the mounting heads that can access a given Z number using crosses.

As can be understood from FIGS. 154A to 154C, the component tapes at the Z numbers 1 to 17 and 86 to 96 cannot be accessed by every mounting head. In more detail, only mounting head H1 can assess a component tape at Z number 1, only mounting heads H1 and H2 can assess a component tape at Z number 2, . . . and only mounting heads H1 to H9 can assess a component tape at Z number 17. In the same way, only mounting heads H2 to H10 can assess a component tape at Z number 86, . . . , and only mounting heads H7 to H10 can assess a component tape at Z number 96.

It should be noted that this kind of access restriction occurs near the left and right ends of the Z-axis due to the design of the mounter 100. When designing the mounter 100, more priority is given to maximizing the number of components tapes that can be set in the component supplying units 115*a* and 115*b* than to avoiding these kinds of access restrictions.

As can be seen from FIG. 153 and FIG. 154A to 154C, the optimization apparatus 300 can check whether a given nozzle arrangement in the nozzle station 119 may be used by examining whether the mounting heads can access components arranged near the left edge of the Z-axis. Only mounting heads with low head numbers are capable of accessing positions near the left edge of the Z-axis (see FIG. 154C), though such mounting heads with low head numbers cannot be fitted with all of the nozzles in the nozzle station 119 (see FIG. 153C).

On the other hand, this kind of investigation does not need to be performed for the right edge of the Z-axis. The mounting head H10, at least, can be fitted with every nozzle on the nozzle station 119 (see FIG. 153) so that at a maximum of 96 numbered positions on the Z-axis can be accessed (see FIG. 154C), so that there are no restrictions on the arrangement of nozzles in the nozzle station 119.

FIG. 155 is a flowchart showing the procedure that checks whether an arrangement of nozzles in the nozzle station can be used.

First, the optimization apparatus 300 specifies the lowest Z number PZmin(Ntype,Z arrangement) for each nozzle type "Ntype" in a provided Z-axis arrangement of component tapes (S780). As one example, the optimization apparatus 300 specifies the Z number of the component tape located at the left edge of the Z-axis, out of the component tapes that use the nozzle type S.

Next, the optimization apparatus 300 repeats the following processing for each nozzle type Ntype in the provided nozzle arrangement NP in the nozzle station 119 (S781 to S785).

First, the optimization apparatus 300 specifies the lowest head number Hmin(Ntype,NP) that is capable of being fitted with the nozzle type Ntype (S782). As one example, when type S nozzles are located in the sixth column counting from the left of the nozzle station 119, head number "3" is specified from the table in FIG. 153 as the lowest head number that is capable of being fitted with a type S nozzle.

Next, the optimization apparatus 300 specifies the lowest Z coordinate NZmin(Ntype,NP) that can be reached by a nozzle of nozzle type Ntype when fitted on the mounting head with the specified head number Hmin(Ntype,NP) (S783). As one example, when the specified head number Hmin(Ntype,NP) is "3", it can be seen from the table in FIG. 154C that the lowest Z coordinate NZmin(Ntype,NP) that can be reached by this mounting head is "4".

After this, the optimization apparatus 300 judges whether the lowest Z coordinate NZmin(Ntype,NP) is no greater than the Z number PZmin(Ntype,Z arrangement) that was specified for the nozzle type N-type in step S780 (S784). In other words, the optimization apparatus 300 judges whether the relationship $$NZ\min(N\text{type},P) \leq PZ\min(N\text{type},Z\ \text{arrangement})$$

is established for the present nozzle type N-type.

In this way, the optimization apparatus 300 judges whether the lowest Z coordinate NZmin (Ntype,NP) that can be accessed by a nozzle of the nozzle type Ntype due to the arrangement of the nozzles in the nozzle station 119 is equal to or lower than the lowest Z number PZmin(Ntype,Z arrangement) that is determined by the Z-axis arrangement provided. In simpler terms, the optimization apparatus 300 judges whether this nozzle can pick up all of the components it is supposed to pick up when the line gang pickup head 112 is moved to the left.

When positive judgements are made for every nozzle type Ntype in step S784, the optimization apparatus 300 judges that the nozzle arrangement provided can be used for the present Z-axis arrangement (S786). If not, the optimization apparatus 300 judges that the nozzle arrangement provided cannot be used (S787).

By checking that the nozzle arrangement can be used when composing the initial tasks or updating a state, optimization can be performed with due consideration to the influence of the fixed arrangement of nozzles in the nozzle station.

4.4.2 Optimization for Small Components When Less Than 10 Nozzles are Used

While the line gang pickup head 112 is able to pick up a maximum of ten components simultaneously, the performance of such efficient pickup operations rests on the premise that ten nozzles have been fitted onto the line gang pickup head 112. At a production facility, however, there are cases where there are less than ten nozzles that can be used by a particular mounter 100. In such cases, the line gang pickup head 112 can perform a nozzle interchanging operation at the nozzle station 119 and change the positions of the mounted nozzles, so that in theory, if there is at least one of each of the required types of nozzles, components that are positioned anywhere on the Z-axis can be picked up, thereby enabling all of the components to be mounted.

However, nozzle interchanging is a time-consuming operation, so that especially for small components where the number of mounting points is high, a mounting order that suppresses the number of nozzle interchanging operations is desired.

Optimization for small components when the number of used nozzles is below ten is based on the small components algorithm described earlier that includes the cut down process and other processes, and includes the following processes so as to minimize the number of nozzle interchanging operations.

When the number of used nozzles is set as n (<10), the following two nozzle patterns are provided and all of the small components are mounted using these two nozzle patterns (in some cases, using only one of these nozzle patterns).

(i) Nozzle Pattern 1

This is a pattern in which nozzles are fitted onto the head numbers 1 to n.

(ii) Nozzle Pattern 2

This is a pattern in which nozzles are mounted onto the head numbers (10−n+1) to 10.

FIG. 156 shows one example of the two nozzle patterns that are provided when the number of used nozzles is 6. In this case, nozzle pattern 1 only mounts components using nozzles that are fitted onto the six mounting heads with the head numbers 1 to 6, while nozzle pattern 2 only mounts components using nozzles that are fitted onto the six mounting heads with the head numbers 5 to 10.

FIG. 157 is a flowchart showing the timing at which nozzle interchanging is performed. This processing determines (a) which of the two nozzle patterns 1 and 2 is used in accordance with the position (left/right block, Z numbers) in the provided arrangement of component tapes on the Z-axis, and (b) at what point switching is performed between the nozzle patterns.

The following processing is performed for the component tapes positioned in the left block (S800:Left). When at least one component tape is located at any of the Z positions 1 to 17 (S801:Yes), nozzle pattern 1 is used and components are picked up in the direction Z number 1 to 48 (S802). As soon as there are no more components to be picked up from the Z numbers 1 to 17 (S801:No), the nozzle pattern to be used for the line gang pickup head 112 is switched from nozzle pattern 1 to nozzle pattern 2, and the remaining components are picked up in order from the Z numbers 18 to 48 (S803).

On the other hand, when no component tapes are arranged at any of the Z numbers 1 to 17 in the left block (S801:No), nozzle pattern 2 is used from the start and components are picked up in order from the Z numbers 18 to 48 (S803).

For the component tapes arranged in the right block (S800: Right), nozzle pattern 2 is used from the start and is used to pick up all of the components in order (S804).

The following is the reason why this timing is used for interchanging the nozzles. As can be understood from the head numbers of the mounting heads that can access each Z number in FIG. 154C, the mounting head H10 with the head number 10 can access the Z numbers 18 to 96. Accordingly, so long as the number of used nozzles n is 1 or above, the component tapes with the Z numbers 18 to 96 can definitely be picked up using nozzle pattern 2. On the other hand, the component tapes with the Z numbers 1 to 17 can be accessed with at least the mounting head H1 with the head number 1, so that so long as the number of used nozzles n is 1 or above, the component tapes with the Z numbers 1 to 17 can definitely be picked up using nozzle pattern 1. Here, the nozzle pattern 2 that can access many Z numbers is given priority. As a result, every different Z-axis arrangement can be handled using only two different nozzle patterns and a low number of nozzle interchanging operations.

It should be noted that pickup patterns can be generated by performing the cut down process in units of n components instead of 10 components on the component histogram provided.

This completes the explanation of the optimization of the order of component mounting according to the above embodiment of the present invention. However, the invention is not limited to above embodiment.

In the above explanation, the optimization apparatus 300 is used to generate optimal NC data that is downloaded in the mounters 100 and 200. However, the optimization apparatus 300 does not have to be used in this way. It should be obvious that the optimization apparatus 300 can be used to determine the composition of a production line that is necessary to fulfill the production requirements. The optimization apparatus 300 may be provided with mounter information for a virtual electrical component mounting system produced by modeling mounting point data for the substrate to be produced, with the optimization apparatus 300 judging whether the produced optimized state (estimated tact time) fulfills the production requirements.

In more detail, the optimization apparatus is capable of (i) to (iii) below.

(i) The optimization apparatus 300 may make the following variations to find the most efficient (i.e., productive) design for the head or other components of the mounter. As examples, the number of nozzles on the line gang pickup head 112 may be changed from four nozzle heads to ten nozzle heads to eight nozzle heads, the nozzle pitch may be changed from 21.5 mm to 22 mm, and the pitch of the component cassettes (the pitch of the Z-axis) may be changed.

(ii) The optimization apparatus may determine which production line (or mounter) out of a plurality of production lines should be used to manufacture the intended substrate.

(iii) The optimization apparatus 300 may be used as a sales tool to calculate the productivity (number of substrates that can be produced per hour) for mounters that can be equipped with various options (different numbers and types of component cassettes and nozzles).

The optimization apparatus 300 was described as being a separate apparatus to the mounters 100 and 200, though the optimization apparatus may be internally provided in the mounters 100 and 200.

The state optimizing part 316 was described as optimizing the small components belonging to component groups G[1] to G[5] and the general components belonging to component groups G[6] to G[9] separately using different approaches for finding an optimal solution. However, the present invention is not limited to this classification of components or these approaches.

Intersection disentanglement was described as optimizing the order of mounting by judging whether the tact time is reduced when mounting points in two tasks are interchanged so as to remove intersections between lines drawn between the mounting points composing each task. However, mounting points that are joined by non-intersecting lines may also be interchanged. This is because reductions in tact time can also be achieved by reorganizing the paths for tasks where there are no intersections.

5 Glossary

The following explains the main terminology used above when describing an embodiment of the present invention.

Component Mounting System

A system composed of an optimization apparatus and one or more mounters.

Optimization Apparatus

An apparatus for optimizing the order of mounting components. In order to reduce the tact time (time taken by mounting) taken when manufacturing substrates, the optimization apparatus determines various factors, such as an optimal arrangement of component cassettes for each mounter (what component tapes should be placed in which component feeders and at what positions (on the Z-axis) such component feeders should be arranged in the mounters) and the order in which a line gang pickup head should pick up and mount components (from which component feeders components should be picked up and at which mounting points on a substrate these components should be mounted).

Mounter

A mounter is a manufacturing robot that picks up components from component feeders using a line gang pickup head and mounts them on a substrate, in accordance with optimized NC data.

Stage

An apparatus (mounting unit) that is equipped with a single line gang pickup head and a plurality of component feeders and mounts components onto a substrate independent of (and in parallel with) another stage.

Single Cassette Feeder

A type of component feeder that holds one component tape.

Double Cassette Feeder

A type of component feeder that can hold a maximum of two component tapes. However, both component tapes need to have the same feed pitch.

Z-Axis

A coordinate axis (and coordinate values on this axis) that specifies positions in an arrangement of component feeders that can be arranged in each mounter (or stage when a mounter is equipped with stages).

Component Type

A type of electrical components, such as resistors or capacitors. Each component type is associated with component information (such as electrical characteristics, shape, number of components, maximum number of divisions, and cassette type).

Component Tapes

A plurality of components of the same component type that are lined up on a tape. During the optimization process, the expression "component tape" is used to specify a group of components of the same component type (on the assumption that these components are lined up on a virtual tape). In the process referred to a "component division", there are cases where a group of components of the same component type (or one component tape) is divided into a plurality of component tapes. The number of component tapes resulting from this division is called the "number of divisions".

Mounting Points

Mounting points are coordinate positions on a substrate at which components are to mounted. In some cases, the same component is mounted at more than one mounting point. The total number of components that are lined up on a component tape for components of the same component type (also referred to as "mounting points") matches the number of components for that component type (the total number of components to be mounted).

Component Histogram

A component histogram is a bar chart produced with the component tapes (component types) on the horizontal axis and the number of components to be mounted on the vertical axis. During optimization, the final arrangement of component feeders is mapped using a component histogram.

Core

When a component histogram in which component tapes are arranged in descending order of the number of components to be mounted is subjected to the cut down procedure, the core is the part of the component histogram that is left after pickup patterns in which n components are simultaneously picked up have been cut down from the component histogram. The component tapes that includes components in the core are referred to as the "core component tapes", and the corresponding component cassettes are referred to as the "core cassettes".

Cut Down Process

The cut down process is a process performed on a component histogram in which component tapes are arranged in descending order of the number of components to be mounted. Starting from the component tapes with few components to be mounted, pickup patterns in which n components are simultaneously picked up are cut away from the component histogram.

Task

A task is a series of mounting operations in which a line gang pickup head picks up, transports, and mounts components onto a substrate. The line gang pickup head repeatedly executes tasks to mount all of the required components.

Pickup Pattern

A pickup pattern is a figure showing how components are simultaneously picked up by the line gang pickup head in one or more tasks, and also refers to the components picked up in this way.

Task Group

A task group is a collection of tasks that are related in view of the ability to simultaneously pick up components. A task group can be produced by gathering n component tapes with the same number of components to be mounted and then generating tasks where n components are simultaneously picked up by taking one component from each of the n component tapes. An optimization method that determines the arrangement of component tapes by producing a task group in this way is referred to as the "task group generation method".

Mountain

A mountain is a collection of component tapes whose arrangement has been determined by optimization, or a component histogram corresponding to the arrangement of these component tapes. A component histogram that has been subjected to optimization using the "cut down procedure" is in the form of a "mountain" with one steeply inclined side and one gradually inclined side. In some cases, the resulting mountain is again subjected to optimization.

Estimated Tact Time Balance

The estimated tact time balance reflects the degree to which the distribution of the tact times for each mounter (or stage in the case where a mounter is equipped with stages) is even. The process that determines the order of component mounting so as to even out the distribution of tact times is called the "estimated tact time balancing process".

INDUSTRIAL APPLICABILITY

The order of component mounting optimization method of the present invention can be used by an optimization apparatus that optimizes the order of component mounting for a mounter that mounts electronic components onto a printed circuit board. This optimization method can also be used by a controller of mounters that form a production line, and, before a production line is assembled, by a simulation/evaluation tool that is used to make predictions as to the relationship between the construction/specification of planned mounting equipment and the time taken to mount components.

The invention claimed is:

1. An optimizing method of optimizing, using a computer, a component mounting order in which a production line composed of at least two mounters arranged in a line mounts a plurality of components on a substrate, the optimizing method comprising:

classifying the plurality of components into component groups by setting groupings of components whose heights are equal or within a predetermined range as the component groups; and determining a mounting order for each component group so that components belonging to component groups of components with low heights are mounted on the substrate first, said determining of the mounting order comprising assigning the components, in units of the component groups, in order starting with the component groups of components with low heights and proceeding in a direction from an upstream mounter on the production line toward a downstream mounter on the production line.

2. An optimizing method according to claim 1, wherein said classifying of the components comprises classifying components, out of the plurality of components, that are no higher than a predetermined height into a component group for components with a lowest height.

3. An optimizing method according to claim 1, wherein each mounter is equipped with a mounting head operable to pick up at least two components from an arrangement of component cassettes that store components, and operable to mount the components on a substrate, the optimizing method further comprising determining a mounting order for components so that when the mounting head picks up the at least two components, components having low heights are mounted on the substrate first.

4. An optimizing method according to claim 1, wherein said classifying comprises classifying all components whose heights are no greater than a predetermined height into a small component group and all other components into a general component group.

5. An optimizing apparatus for optimizing a component mounting order in which a production line composed of at least two mounters arranaed in a line mounts a plurality of components on a substrate, the optimizing apparatus comprising a computer including:

a classifying component for classifying the plurality of components into component groups by setting groupings of components whose heights are equal or within a predetermined range as the component groups; and a sorting component for determining a mounting order for each component group so that components belonging to component groups of components with low heights are mounted on the substrate first, and for assigning the components, in units of the component groups, in order starting with the component groups of components with low heights and proceeding in a direction from an upstream mounter on the production line toward a downstream mounter on the production line.

6. A computer program embodied on a computer-readable storage medium for optimizing a component mounting order in which a production line composed of at least two mounters arranged in a line mounts a plurality of components on a substrate, the computer program on the computer-readable storage medium being operable to control a computer to:

classify the plurality of components into component groups by setting groupings of components whose heights are equal or within a predetermined range as the component groups; and determine a mounting order for each component group so that components belonging to component groups of components with low heights are mounted on the substrate first, said determining of the mounting order comprising assigning the components, in units of the component groups, in order starting with the component groups of components with low heights and proceeding in a direction from an upstream mounter on the production line toward a downstream mounter on the production line.

7. An optimizing method of optimizing, using a computer, a component mounting order in which a production line composed of at least one mounter mounts a plurality of components on a substrate, the optimizing method comprising:

classifying the plurality of components into component groups by setting groupings of components whose heights are within a predetermined range as the component groups; and assigning each of the plurality of components to one of the mounters so that each mounter mounts components belonging to component groups of components that are no higher than components belonging to component groups that are assigned to a mounter positioned downstream on the production line.

8. An optimizing method according to claim 7, wherein the plurality of component groups are each composed of at least one task group, a task group being a grouping of components whose positions in a mounting order may be interchanged, and said assianing includes assignina components to mounters in units of task groups.

9. An optimizing method according to claim 8, wherein said assigninbg of the components further includes:

assigning the task groups in ascending order of the height of the components composing the groups to the mounters starting with a most upstream mounter and moving downstream along the production line, and changing a pattern in which task groups have been assigned during said assigning of the task groups by reassigning at least one task group that has been assigned to an arbitrary mounter to an adjacent mounter on an upstream or downstream side of the arbitrary mounter.

10. An optimizing method according to claim 8, wherein said changing of the pattern includes:

specifying, out of all of the mounters, a mounter for which a total time taken to mount all components assigned to the mounter is the longest and a mounter for which a total time taken to mount all components assigned to the mounter is the shortest, and reassigning task groups by moving task groups between adjacent mounters within a part of the production line from one of the two specified mounters to another of the two specified mounters, in a direction moving from the mounter with the longest total time towards the mounter with the shortest total time.

11. An optimizing method according to claim 10, wherein said changing of the pattern includes reassigning a task group to an adjacent mounter only if after reassignment a time taken to mount all of the task groups assigned to the adjacent mounter to which the task group is reassigned is shorter than the total time, before reassignment, of the mounter specified as having the longest total time.

12. An optimizing method according to claim 9, wherein said assigning of the components further includes:

changing a pattern in which components have been assigned during said assigning of the task groups and said changing of the pattern by reassigning components in units of component tapes, a component tape being a group of components of a same type, from an arbitrary mounter to an adjacent mounter on an upstream or downstream side of the arbitrary mounter.

13. An optimizing apparatus for optimizing a component mounting order in which a plurality of components are mounted on a substrate by a production line composed of a plurality of mounters, the optimizing apparatus comprising a computer including:

a classifying component for classifying the plurality of components into component groups by setting groupings of components whose heights are within a predetermined range as the component groups; and an assigning component for assigning each of the plurality of components to one of the mounters so that each mounter mounts components belonging to component groups of components that are no higher than components belonging to component groups that are assigned to a mounter positioned downstream on the production line.

14. A computer program embodied on a computer-readable storage medium for optimizing a component mounting order in which a production line composed of at least one mounter mounts a plurality of components on a substrate, the computer program on the computer-readable storage medium being operable to control a computer to:

classify the plurality of components into component groups by setting groupings of components whose heights are within a predetermined range as the component groups; and assign each of the plurality of components to one of the mounters so that each mounter mounts components belonging to component groups of components that are no higher than components belonging to component groups that are assigned to a mounter positioned downstream on the production line.

15. An optimizing method of optimizing, using a computer, a component mounting order in which a production line composed of at least two mounters mounts a plurality of components on a substrate, said optimizing method comprising:

classifying the plurality of components into component groups by setting groupings of components whose heights are equal or within a predetermined range as the component groups; and assigning the components to each mounter, in units of component groups, in an order starting with the component groups of components having low heights and proceeding in a direction from a mounter positioned upstream on the production line towards a mounter positioned downstream on the production line;

wherein the component groups are each composed of at least one task group, a task group being a grouping of components transported between mounters to achieve a balance of tact time between the mounters, said assigning including assigning the components in units of task groups.

* * * * *

UNITED STATES PATENT AND TRADEMARK OFFICE

CERTIFICATE OF CORRECTION

PATENT NO. : 6,996,440 B2
APPLICATION NO. : 10/343736
DATED : February 7, 2006
INVENTOR(S) : Yasuhiro Maenishi et al.

It is certified that error appears in the above-identified patent and that said Letters Patent is hereby corrected as shown below:

IN THE CLAIMS

In column 135, line 44, Claim 1:

Please replace “arranaed” with --arranged--.

In column 136, line 35, Claim 8:

Please replaced “assianing includes assignina” with --assigning includes assigning--.

In column 136, line 38, Claim 9:

Please replaced “assigninbg” with --assigning--.

Signed and Sealed this

Twenty-second Day of August, 2006

JON W. DUDAS
*Director of the United States Patent and Trademark Office*